US008101020B2

(12) United States Patent
Sarayama et al.

(10) Patent No.: US 8,101,020 B2
(45) Date of Patent: Jan. 24, 2012

(54) CRYSTAL GROWTH APPARATUS AND MANUFACTURING METHOD OF GROUP III NITRIDE CRYSTAL

(75) Inventors: Seiji Sarayama, Miyagi (JP); Hirokazu Iwata, Miyagi (JP); Akihiro Fuse, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 1397 days.

(21) Appl. No.: 11/546,989

(22) Filed: Oct. 13, 2006

(65) Prior Publication Data

US 2007/0084399 A1 Apr. 19, 2007

(30) Foreign Application Priority Data

| | | | |
|---|---|---|---|
| Oct. 14, 2005 | (JP) | ................................ | 2005-300446 |
| Oct. 14, 2005 | (JP) | ................................ | 2005-300550 |
| Nov. 21, 2005 | (JP) | ................................ | 2005-335108 |
| Nov. 21, 2005 | (JP) | ................................ | 2005-335170 |
| Nov. 21, 2005 | (JP) | ................................ | 2005-335430 |
| Dec. 14, 2005 | (JP) | ................................ | 2005-360174 |

(51) Int. Cl.
*C30B 9/00* (2006.01)
*C30B 11/00* (2006.01)

(52) U.S. Cl. ................ 117/81; 117/82; 117/83; 117/84; 117/85

(58) Field of Classification Search ............... 117/81–85
See application file for complete search history.

(56) References Cited

U.S. PATENT DOCUMENTS

| | | | | |
|---|---|---|---|---|
| 4,340,576 | A * | 7/1982 | Strong | 423/446 |
| 5,868,837 | A | 2/1999 | DiSalvo et al. | |
| 6,592,663 | B1 * | 7/2003 | Sarayama et al. | 117/68 |
| 6,780,239 | B2 * | 8/2004 | Sarayama et al. | 117/36 |
| 6,939,731 | B2 * | 9/2005 | Ishizaki | 438/22 |
| 6,949,140 | B2 * | 9/2005 | Sarayama et al. | 117/81 |
| 7,001,457 | B2 * | 2/2006 | Sarayama et al. | 117/74 |
| 7,220,311 | B2 * | 5/2007 | Iwata et al. | 117/73 |
| 7,344,595 | B2 * | 3/2008 | Kandler et al. | 117/81 |
| 7,462,238 | B2 * | 12/2008 | Sarayama et al. | 117/74 |
| 2002/0046695 | A1 * | 4/2002 | Sarayama et al. | 117/84 |
| 2002/0175338 | A1 * | 11/2002 | Sarayama et al. | 257/95 |
| 2003/0164138 | A1 * | 9/2003 | Sarayama et al. | 117/84 |
| 2004/0031437 | A1 * | 2/2004 | Sarayama et al. | 117/36 |
| 2004/0104392 | A1 * | 6/2004 | Ishizaki | 257/79 |
| 2004/0134413 | A1 * | 7/2004 | Iwata et al. | 117/2 |

(Continued)

FOREIGN PATENT DOCUMENTS

| | | |
|---|---|---|
| JP | 2000-12900 | 1/2000 |
| JP | 2001-58900 | 3/2001 |
| JP | 2002-128586 | 5/2002 |
| JP | 2003-238296 | 8/2003 |
| JP | 2003-286098 | 10/2003 |
| JP | 2003-313098 | 11/2003 |

(Continued)

OTHER PUBLICATIONS

U.S. Appl. No. 11/498,841, filed Aug. 4, 2006, Sarayama et al.

(Continued)

*Primary Examiner* — Bob M Kunemund
*Assistant Examiner* — G. Nagesh Rao
(74) *Attorney, Agent, or Firm* — Oblon, Spivak, McCelland, Maier & Neustadt, L.L.P.

(57) ABSTRACT

A crystal growth apparatus comprises a reaction vessel holding a melt mixture containing an alkali metal and a group III metal, a gas supplying apparatus supplying a nitrogen source gas to a vessel space exposed to the melt mixture inside the reaction vessel, a heating unit heating the melt mixture to a crystal growth temperature, and a support unit supporting a seed crystal of a group III nitride crystal inside the melt mixture.

48 Claims, 130 Drawing Sheets

U.S. PATENT DOCUMENTS

| | | | | |
|---|---|---|---|---|
| 2004/0226503 | A1 | 11/2004 | Iwata et al. | |
| 2004/0237879 | A1 * | 12/2004 | Kaneko et al. | 117/2 |
| 2004/0262630 | A1 * | 12/2004 | Kitaoka et al. | 257/189 |
| 2005/0026318 | A1 * | 2/2005 | Sarayama et al. | 438/22 |
| 2005/0098090 | A1 * | 5/2005 | Hirota et al. | 117/2 |
| 2005/0178316 | A1 * | 8/2005 | Kandler et al. | 117/13 |
| 2006/0130739 | A1 | 6/2006 | Sarayama et al. | |
| 2007/0034143 | A1 * | 2/2007 | Sarayama et al. | 117/89 |
| 2007/0084399 | A1 * | 4/2007 | Sarayama et al. | 117/73 |
| 2007/0128746 | A1 * | 6/2007 | Iwata et al. | 438/22 |
| 2007/0194408 | A1 * | 8/2007 | Iwata et al. | 257/613 |
| 2007/0215033 | A1 * | 9/2007 | Imaeda et al. | 117/13 |
| 2007/0272941 | A1 * | 11/2007 | Minemoto et al. | 257/103 |
| 2008/0264331 | A1 * | 10/2008 | Iwata et al. | 117/13 |
| 2009/0199763 | A1 * | 8/2009 | Dadgar et al. | 117/88 |
| 2009/0249997 | A1 * | 10/2009 | Sarayama et al. | 117/73 |

FOREIGN PATENT DOCUMENTS

| | | |
|---|---|---|
| JP | 2004-189549 | 7/2004 |
| JP | 3631724 | 12/2004 |
| JP | 2005-225681 | 8/2005 |

OTHER PUBLICATIONS

U.S. Appl. No. 11/408,656, Sarayama et al.

U.S. Appl. No. 11/684,724, filed Mar. 12, 2007, Iwata et al.

Office Action issued Oct. 5, 2010, in Japanese Patent Application No. JP 2005-300446, filed Oct. 14, 2005.

Office Action issued Oct. 19, 2010, in Japanese Patent Application No. JP 2005-335108, filed Nov. 21, 2005.

* cited by examiner

5100C

CRYSTAL GROWTH APPARATUS AND MANUFACTURING METHOD OF GROUP III NITRIDE CRYSTAL

BACKGROUND OF THE INVENTION

The present invention relates to a crystal growth apparatus growing a group III nitride crystal and a method of manufacturing a group III nitride crystal. Particularly, the present invention relates to a manufacturing method of a GaN crystal.

These days, most of the InGaAlN (a group III nitride semiconductor) devices used for ultraviolet, purple, blue and green optical sources are formed on a substrate of sapphire or silicon carbide (SiC) by conducting thereon an MOCVD process (metal-organic chemical vapor deposition process) or MBE process (molecular beam epitaxy process).

In the case sapphire or silicon carbide is used for the substrate, however, there are formed a large number of crystal defects in the group III nitride semiconductor layers grown thereon in view of the fact that there exists a large difference in the thermal expansion coefficient and in the lattice constant between the substrate and the group III nitride semiconductor layers. Such crystal defects invite deterioration of device performance and are related directly to the drawbacks such as short lifetime, large operational power, and the like, in the case a light-emitting device is formed on such a substrate.

Further, because a sapphire substrate is an insulator, it is impossible to provide an electrode directly on the substrate contrary to conventional light-emitting devices constructed on a semiconductor substrate. This means that is necessary to provide an electrode on one of the group III nitride semiconductor layers. However, such a construction necessitates large device area for formation of the electrodes and the cost of the device is increased inevitably. In addition, there is caused a problem of warp of the substrate because of the use of different materials such as sapphire substrate in combination with the group III nitride semiconductor layers. This problem of warp becomes a serious problem particularly when the device area is increased.

Further, with the group III nitride semiconductor devices constructed on a sapphire substrate, chip separation by way of cleaving process is difficult, and it is not easy to obtain an optical cavity edge surface, which is required in laser diodes (LD). Because of this, it has been practiced in the art, when to form an optical cavity edge surface, to conduct a separation process similar to a cleaving process after reducing the thickness of the sapphire substrate to 100 μm or less by conducting a dry etching process or polishing process. Thus, it has been difficult to conduct formation of optical cavity edge surface and chip separation with a single step, contrary to the production process of conventional laser diodes, and there has been a problem of increased cost because of the complexity of the fabrication process of light-emitting devices.

In order to solve these problems, there has been made a proposal for reducing the crystal defects by conducting selective growth process of the group III nitride semiconductor layers on the sapphire substrate in a lateral direction. With this approach, it has become possible to reduce the crystal defects successfully, while there still remain problems of insulating nature of the sapphire substrate and difficulty of cleaving a sapphire substrate with such a construction.

In order to solve these problems, use of a gallium nitride (GaN) substrate of generally the same composition to the crystalline materials grown thereon is preferable. Thus, various attempts have been made for growing a bulk GaN crystal by vapor phase growth process or melt growth process. However, GaN substrate of high quality and practical size is not yet realized.

As one approach of realizing a GaN bulk crystal substrate, there is proposed a GaN crystal growth process that uses sodium (Na) for the flux (Patent Reference 1). According to this method, sodium azide ($NaN_3$) and metal Ga are confined in a reaction vessel of stainless steel (vessel dimension: inner diameter=7.5 mm; length=100 mm) as the source material, together with a nitrogen gas, and a GaN crystal is grown by holding the reaction vessel at a temperature of 600-800° C. for 24-100 hours.

According to this method, it has become possible to carry out the crystal growth at relatively low temperature of600-800° C. while maintaining the pressure inside the vessel to a relatively low pressure of 100 kg/cm$^2$ or less. This means that crystal growth can be conducted under a practical condition.

Further, there is realized a high quality group III nitride crystal by causing a reaction between a group V source material including nitrogen and a melt mixture of an alkali metal and a group III metal (Patent Reference 2)

Patent Reference 1 U.S. Pat. No. 5,868,837

Patent Reference 2 Japanese Laid-Open Patent Application 2001-58900

SUMMARY OF THE INVENTION

However, with such a conventional method that causes growth of a group III nitride crystal by causing to react the melt mixture of alkali metal and group III metal with a nitrogen gas, there has been a problem in that the alkali metal causes evaporation from the melt mixture and escapes to the outside in the form of vapor. As a result, the amount of nitrogen dissolved into the melt mixture is decreased and there arises a problem that growth of the group III nitride crystal is retarded.

The present invention is made for solving the foregoing problems and has an object of providing a crystal growth apparatus capable of eliminating the diffusion of the alkali metal to the outside positively.

Another object of the present invention is to provide a manufacturing method for manufacturing a group III nitride crystal while preventing the diffusion of the alkali metal to the outside positively.

Further, with the conventional method that causes crystal growth of a group III nitride crystal by reacting the melt mixture of alkali metal and the group III metal with a nitrogen source including nitrogen, there arises a problem that it is difficult to maintain the temperature of the apparatus to a crystal growth temperature during the growth of the group III nitride crystal.

Accordingly, the present invention has been made to solve these problems and has its object of providing a crystal growth apparatus growing a group III nitride crystal while maintaining the temperature generally constant.

Another object of the present invention is to provide a manufacturing method of a group III nitride crystal while maintaining the temperature generally constant.

Further, with the crystal growth apparatus having an inner reaction vessel holding therein a melt mixture of metal Na and metal Ga and an outer reaction vessel surrounding the inner reaction vessel and causing crystal growth of a GaN crystal by reacting a melt mixture of metal Na and metal Ga with a nitrogen source material including nitrogen, the crystal growth of the GaN crystal is conducted in the state in which the inner reaction vessel and the outer reaction vessel are pressurized to a pressure higher than the atmospheric pressure. Thus, when there appears a large pressure difference between the inner reaction vessel and the outer reaction vessel, the state of the inner reaction vessel is changed and it becomes difficult to conduct crystal growth of the group III nitride crystal stably.

Thus, in the case the pressure inside the inner reaction vessel is higher than the pressure of the outer reaction vessel, the nitrogen source gas and the metal Na vapor existing in the space inside the inner reaction vessel may cause leakage to the outer reaction vessel, while such leakage invites decrease of pressure inside the inner reaction vessel. Thus, incorporation of the nitrogen source gas into the melt mixture becomes unstable and it becomes difficult to cause stable crystal growth of the GaN crystal.

Further, in the case the pressure inside the outer reaction vessel is higher than the pressure of the inner reaction vessel, there is a possibility that impurities may invade into the inner reaction vessel from the outer reaction vessel, and stable crystal growth of high-purity GaN crystal becomes difficult.

Thus the present invention has been made for solving these problems and has an object of providing a method for manufacturing a GaN crystal stably.

Further, with the crystal growth apparatus having an inner reaction vessel holding therein a melt mixture of an alkali metal and a group III metal and an outer reaction vessel surrounding the inner reaction vessel and causing crystal growth of a GaN crystal by reacting a melt mixture of the alkali metal and the group III metal with a group V source material including nitrogen, the crystal growth of the GaN crystal is conducted in the state in which the inner reaction vessel and the outer reaction vessel are pressurized to a pressure higher than the atmospheric pressure. Thus, when there appears a large pressure difference between the inner reaction vessel and the outer reaction vessel, the state of the inner reaction vessel is changed and it becomes difficult to conduct crystal growth of the GaN crystal stably.

Thus, in the case the pressure inside the inner reaction vessel is higher than the pressure of the outer reaction vessel, the nitrogen source gas and the alkali metal vapor existing in the space inside the inner reaction vessel may cause leakage to the outer reaction vessel, while such leakage invites decrease of pressure inside the inner reaction vessel. Thus, incorporation of the nitrogen source gas into the melt mixture becomes unstable and it becomes difficult to cause stable crystal growth of the GaN crystal.

Further, in the case the pressure inside the outer reaction vessel is higher than the pressure of the inner reaction vessel, there is a possibility that impurities may invade into the inner reaction vessel from the outer reaction vessel, the nitrogen source gas is not incorporated into the melt mixture stably in the inner reaction vessel, and stable crystal growth of a GaN crystal is difficult.

Thus the present invention has been made for solving these problems and has an object of providing a crystal growth apparatus for growing a group III nitride crystal stably.

Another object of the present invention is to provide a manufacturing method for manicuring a group III nitride crystal stably.

With the method for growing a GaN crystal by causing to react a melt mixture of an alkali metal and a group III metal with a group V source material including nitrogen, the crystal growth is conducted without using a substrate, and associated with this, there occurs extensive nucleation on the bottom surface and sidewall surface of the reaction vessel. Thereby crystal growth takes place from a particular nucleus among the large number of nuclei thus formed. As a result, other nuclei function to retard the crystal growth of the group III nitride crystal growing preferentially from the foregoing particular nucleus, and there is caused the problem that the group III nitride crystal thus obtained has a small crystal size.

Accordingly, the present invention has been made to solve these problems and has its object of providing a crystal growth apparatus growing a group III nitride crystal of large crystal size.

Another object of the present invention is to provide a manufacturing method of a group III nitride crystal of large crystal size.

In the crystal growth method for growing a GaN crystal by reacting a melt mixture of an alkali metal and a group III metal with a group V source material including nitrogen, growth is made without using a substrate, and associated with this, there occurs extensive nucleation on the bottom surface and side wall surface of the reaction vessel, wherein crystal growth takes place from a particular nucleus among the large number of nuclei thus formed. As a result, other nuclei function to retard the crystal growth of the group III nitride crystal growing preferentially from the foregoing particular nucleus, and there is caused the problem that the group III nitride crystal thus obtained has a small crystal size.

Accordingly, the present invention has been made to solve these problems and has its object of providing a crystal growth apparatus growing a group III nitride crystal of large crystal size.

Another object of the present invention is to provide a manufacturing method of a group III nitride crystal of large crystal size.

According to a first aspect of the present invention, there is provided a crystal growth apparatus having a crucible, a reaction vessel, an alkali metal melt, a gas supplying unit and a heating unit. The crucible holds a melt mixture containing an alkali metal and a group III metal. The reaction vessel surrounds the crucible. The alkali metal melt exists between a vessel space exposed to the melt mixture and outside thereof at a temperature equal to or higher than a melting temperature of the alkali metal. The gas supplying unit supplies a nitrogen source gas to the vessel space via the alkali metal melt. The heating unit heats the crucible and the reaction vessel to a crystal growth temperature.

In a preferred embodiment, there holds a relation $M1>M2$ where M1 stands for the amount of the alkali metal loaded between the vessel space and the outside while M2 stands for the amount of the alkali metal existing in the vessel space in the form of vapor.

In a preferred embodiment, the gas supplying unit comprises a conduit and a stopper/inlet member. The conduit is connected to the reaction vessel. The stopper/inlet member is provided inside the conduit and suppresses the diffusion of the alkali metal melt to the outside. Further, the stopper/inlet member introduces the nitrogen source gas into the vessel space via the alkali metal melt. Further, there holds a relationship $M1-M2>M3$, where M3 stands for the amount of the alkali metal adhered to the stopper/inlet member in the form of liquid or solid.

In a preferred embodiment, there holds a relationship $M1-M2-M4>0$, where M1 stands for the amount of the alkali metal loaded between the vessel space and the outside, M2 stands for the amount of the alkali metal existing in the vessel space in the form of vapor, and M4 stands for the amount of the alkali metal adhered to a low temperature region exposed to the vessel space in the form of liquid or solid.

In a preferred embodiment, the gas supplying unit comprises a conduit and a stopper/inlet member. The conduit is connected to the reaction vessel. The stopper/inlet member is provided inside the conduit and suppresses the diffusion of the alkali metal melt to the outside. Further, the stopper/inlet member introduces the nitrogen source gas into the vessel space via the alkali metal melt. Further, there holds a relationship M1–M2–M4>M3, where M3 stands for the amount of the alkali metal adhered to the stopper/inlet member in the form of liquid or solid.

In a preferred embodiment, the alkali metal melt exists between the crucible and the reaction vessel.

In a preferred embodiment, a location of an interface between the melt mixture and the vessel space coincides generally to a location of an interface between the alkali metal melt and the vessel space.

In another aspect, the present invention provides a method for manufacturing a group III nitride crystal by using a crystal growth apparatus, the crystal growth apparatus comprising a crucible for holding a melt mixture containing an alkali metal and a group III metal and a reaction vessel surrounding the crucible, the method comprising: a first step of introducing the alkali metal and the group III metal into the reaction vessel in an ambient of inert gas or nitrogen gas; a second step of loading the alkali metal between the vessel space exposed to the melt mixture and an outside thereof with an amount such that the alkali metal can exist between the vessel space and the exterior at a temperature equal to or higher than the melting temperature of the alkali metal; a third step of filling the vessel space with a nitrogen source gas; a fourth step of heating the crucible and the reaction vessel to a crystal growth temperature; a fifth step of holding the crucible and the reaction vessel at the crystal growth temperature for a predetermined duration; and a sixth step of supplying the nitrogen source gas to the vessel space such that an interior of the vessel space is maintained at a predetermined pressure.

In a preferred embodiment, the second step is conducted so as to load the alkali metal between the vessel space and the outside with an amount larger than the amount of the alkali metal existing in the vessel space at the temperature equal to or higher than the melting temperature of the alkali metal.

In a preferred embodiment, the crystal growth apparatus further comprises a conduit and a stopper/inlet member. The conduit is connected to the reaction vessel. The stopper/inlet member is provided inside the conduit and suppresses the diffusion of the alkali metal melt to the outside. Further, the stopper/inlet member introduces the nitrogen source gas into the vessel space via the alkali metal melt. Further, with the second step of the manufacturing method, the alkali metal is loaded between the vessel space and the outside with an amount larger than a sum of the alkali metal adhered to the stopper/inlet member in the form of liquid or solid and the amount of the alkali metal existing in the vessel space in the form of vapor.

In a preferred embodiment, the second step is conducted so as to load the alkali metal between the vessel space and the outside with an amount larger than a sum of the amount of the alkali metal existing in the vessel space at the temperature equal to or higher than the melting temperature of the alkali metal and the amount of the alkali metal adhered to the low temperature region adjacent to the vessel space in the form of liquid or solid.

In a preferred embodiment, the crystal growth apparatus further comprises a conduit and a stopper/inlet member. The conduit is connected to the reaction vessel. The stopper/inlet member is provided inside the conduit and suppresses the diffusion of the alkali metal melt to the outside. Further, the stopper/inlet member introduces the nitrogen source gas into the vessel space via the alkali metal melt. Further, with the second step of the manufacturing method, the alkali metal is loaded between the vessel space and the outside with an amount larger than a sum of the alkali metal adhered to the stopper/inlet member in the form of liquid or solid, the amount of the alkali metal existing in the vessel space in the form of vapor, and the amount of the alkali metal adhered to the low temperature region adjacent to the vessel space in the form of liquid or solid.

In a preferred embodiment, the second step is conducted such that the alkali metal is loaded between the crucible and the reaction vessel in an ambient of inert gas or nitrogen gas with an amount such that the alkali metal can exist between the crucible and the reaction vessel at a temperature equal to or higher than the melting temperature of the alkali metal.

In a preferred embodiment, there is formed an interface between the alkali metal melt existing between the crucible and the reaction vessel and the vessel space at a first interface location, and there is formed another interface between the melt mixture and the vessel space at a second interface location, wherein the alkali metal is located in the second step between the crucible and the reaction vessel with an amount such that the first interface generally coincides with the second interface at a temperature equal to or higher than the melting temperature of the alkali metal.

With the present invention, manufacturing of the group III nitride crystal is attained by loading the alkali metal between the vessel space and the outside with an amount such that the alkali metal can exist between the vessel space exposed to the melt mixture and the exterior at the temperature equal to or higher than the melting temperature of the alkali melt. Thus, the group III nitride crystal is manufactured in the state in which a liquid of the alkali metal exists between the melt mixture and the outside and in the state in which the vapor of the alkali metal evaporated from the melt mixture is confined between the melt mixture and the alkali metal melt.

Thus, according to the present invention, it becomes possible to block the diffusion of the alkali metal to the outside positively. As a result, it becomes possible to facilitate incorporation of the nitrogen source gas into the melt mixture and manufacturing of a group III nitride crystal of large size is attained.

According to another aspect of the present invention, there is provided a crystal growth apparatus having a reaction vessel, a crucible, a gas supplying unit, a heating unit, and a heat blanket unit. The crucible is disposed inside the reaction vessel and holds a melt mixture containing an alkali metal and a group III metal. The gas supplying unit supplies a nitrogen source gas to a vessel space exposed to the melt mixture inside the crucible. The heating unit heats the crucible and the reaction vessel to a crystal growth temperature. The heat blanket unit provides heat blanket to the crucible and the reaction vessel.

In a preferred embodiment, the heat blanket unit includes a shielding member surrounding the reaction vessel and interrupting a flow of gas in a direction away from the reaction vessel.

In a preferred embodiment, the shielding member comprises a first shielding member and a second shielding member. The first shielding member covers a sidewall of the reaction vessel. The second shielding member covers a lid of the reaction vessel disposed at a top part of the crucible and is disposed so as to surround the first shielding member.

In a preferred embodiment, the shielding member comprises first through third shielding members. The first shielding member covers a sidewall of the reaction vessel. The second shielding member covers a lid of the reaction vessel disposed at a top part of the crucible and is disposed so as to surround the first shielding member. The third shielding member surrounds the second shielding member.

In a preferred embodiment, the crystal growth apparatus further comprises a bellows and a support unit. The bellows is connected to the lid of the reaction vessel disposed over the crucible. The support unit has an end inserted into the vessel space via the bellows and holds a seed crystal thereon. In a preferred embodiment, the shielding member comprises a first shielding member and a second shielding member. The first shielding member covers a sidewall of the reaction vessel. The second shielding member covers the lid of the reaction vessel except for the connection part of the lid and the bellows and is disposed so as to surround the first shielding member.

In a preferred embodiment, the shielding member further comprises a third shielding member. The third shielding member covers the bellows and the second shielding member.

In a preferred embodiment, the heating unit comprises a heater. The heater is disposed so as to face the sidewall of the reaction vessel. The heat blanket unit further includes a filling material. The filling material is provided at least between the heater and the first metal member.

In a preferred embodiment, the crystal growth apparatus further comprises an outer reaction vessel. The outer reaction vessel accommodates therein the reaction vessel and the heat shielding member and is set to a pressure higher than an atmospheric pressure. The heat shielding member is disposed in a space between the reaction vessel and the outer reaction vessel.

Further, according to another aspect of the present invention, there is provided a manufacturing method of a group III nitride crystal by using a crystal growth apparatus, the crystal growth apparatus including a crucible holding a melt mixture of an alkali metal and a group III metal, and a reaction vessel accommodating therein the crucible, the method comprising a first step of introducing the alkali metal and the group III metal into the reaction vessel in an ambient of inert gas or nitrogen gas; a second step of filling a vessel space exposed to the melt mixture in the crucible with a nitrogen source gas; and crowing a group III nitride crystal while thermally blanketing the crucible and the reaction vessel.

In a preferred embodiment, the group III nitride crystal is grown in the third step while preventing escaping of heat from the crucible and the reaction vessel by way of convection.

In a preferred embodiment, the crystal growth apparatus further comprises first and second heaters and a shielding member. The first heater is disposed so as to face the sidewall of the reaction vessel. The second heater is disposed so as to face the bottom of the reaction vessel. The shielding member is provided at least around the first heater and blocks the flow of gas away from the reaction vessel.

The third step comprises a first sub-step of heating the crucible and the reaction vessel to the crystal growth temperature by using the first and second heaters, a second sub-step of holding the crucible and the reaction vessel at the crystal growth temperature for a predetermined duration, and a third sub-step of supplying the nitrogen source gas into the reaction vessel such that the pressure inside the reaction vessel is maintained at a predetermined pressure.

In a preferred embodiment, the shielding member includes a first shielding member and a second shielding member. The first shielding member is disposed so as to face the first heater. The second shielding member covers a lid of the reaction vessel disposed at a top part of the crucible and further the first shielding member.

In a preferred embodiment, the shielding member further comprises a third shielding member. The third shielding member surrounds the second shielding member.

In a preferred embodiment, the crystal growth apparatus further comprises a bellows and a support unit. The bellows is connected to the lid of the reaction vessel disposed over the crucible. The support unit has an end inserted into the vessel space via the bellows and holds a seed crystal thereon. In a preferred embodiment, the shielding member comprises a first shielding member and a second shielding member. The first shielding member is disposed so as to face the first heater. The second shielding member covers the lid of the reaction vessel except for the connection part of the lid and the bellows and is disposed so as to surround the first shielding member. The manufacturing method further comprises a fourth step for holding the seed crystal at the interface between the vessel space and the melt mixture or inside the melt mixture.

In a preferred embodiment, the crystal growth apparatus further includes a third shielding member such that the third shielding member covers the bellows and the second shielding member.

In a preferred embodiment, the crystal growth apparatus further comprises a filling material. The filling material is provided at least between the first heater and the first shielding member.

In a preferred embodiment, the crystal growth apparatus further comprises an outer reaction vessel. The outer reaction vessel accommodates therein the reaction vessel and the heat shielding lo member and is set to a pressure higher than an atmospheric pressure. The heat shielding member is disposed in a space between the reaction vessel and the outer reaction vessel.

With the present invention, the group III nitride crystal is grown in the state in which the crucible and the reaction vessel are thermally blanketed. Thus, with a preferred embodiment of the present invention, the crucible and the reaction vessel are thermally blanketed by preventing escaping of heat by way of convection, by providing the shielding member.

Thus, according to the present invention, it becomes possible to manufacture a group III nitride crystal in the state in which the temperature inside the crucible is maintained generally constant.

In another aspect, there is provided a manufacturing method of a GaN crystal by using a crystal growth apparatus, the crystal growth apparatus comprising: a crucible holding a melt mixture containing metal Na and metal Ga; an internal reaction vessel surrounding the crucible; and an outer reaction vessel surrounding the inner reaction vessel, the method comprising: a first step of loading the metal Na and the metal Ga into the crucible in an ambient of inert gas or nitrogen gas while preventing reaction therebetween; a second step of setting the reaction vessel accommodating therein the crucible in the crystal growth apparatus in a state in which an interior space of the inner reaction vessel is disconnected from outside, the second step further including the step of connecting a gas supply source of the nitrogen gas source with the inner reaction vessel; a third step of purging a part between the gas supply source and the inner reaction vessel in a state in which the inner space of the inner reaction vessel is disconnected from outside; a fourth step of filling a nitrogen source gas in the inner reaction vessel and the outer reaction vessel while maintaining a pressure difference between a first pressure inside the inner reaction vessel and a second pressure inside the outer reaction vessel to be equal to or smaller than a first reference value; and a fifth step of growing a GaN crystal while maintaining a mixing ratio of metal Na and metal Ga in the melt mixture generally constant.

In a preferred embodiment, the nitrogen source gas is filled into the inner reaction vessel and the outer reaction vessel in the fourth step while maintaining the first pressure and the second pressure generally the same.

In a preferred embodiment, the crystal growth apparatus further comprises: a conduit having an end connected to the inner reaction vessel and another end connected to a gas supply source; a metal Na melt held in the conduit; and a stopper/inlet member disposed in the reaction vessel, the stopper/inlet member holding the metal Na melt at least within the conduit and supplying the nitrogen source gas supplied from the gas supply source to the vessel space exposed to the melt mixture via the metal Na melt. Further, the manufacturing method includes a sixth step of loading metal Na into the conduit in an ambient of inert gas or nitrogen gas, wherein the second through fifth steps are conducted after the first and sixth steps.

In a preferred embodiment, the fifth step comprises a first sub-step of heating the crucible and the inner reaction vessel to the crystal growth temperature while maintaining a pressure difference between a third pressure applied to the stopper/inlet member from a side of the inner reaction vessel and a fourth pressure applied to the stopper/inlet member from a side of the gas supply source, to be equal to or lower than a second reference value, the first sub-step further setting a pressure of the vessel space to a crystal growth pressure; and a second sub-step of holding the crystal growth temperature and the crystal growth pressure.

In a preferred embodiment, the fifth step further comprises a third sub-step of replenishing the nitrogen source gas to the vessel space via the stopper/inlet member and the metal Na melt while holding a pressure difference between the third pressure and the fourth pressure to be equal to or smaller than the second reference value, such that the pressure of the vessel space is held generally to the crystal growth pressure.

In a preferred embodiment, the second reference value is one of a withstand pressure of the inner reaction vessel and a withstand pressure of the stopper/inlet member, whichever is the smallest.

In a preferred embodiment, the crystal growth apparatus further comprises: a conduit having an end connected to the inner reaction vessel and another end connected to a gas supply source; a metal Na melt held in the conduit; and a check valve disposed in the conduit, the check valve holding the metal Na melt at least within the conduit and supplying the nitrogen source gas supplied from the gas supply source to the vessel space exposed to the melt mixture via the metal Na melt. Further, the manufacturing method includes a sixth step of loading metal Na into the conduit in an ambient of inert gas or nitrogen gas, wherein the second through fifth steps are conducted after the first and sixth steps.

In a preferred embodiment, the fifth step comprises a first sub-step of heating the crucible and the inner reaction vessel to the crystal growth temperature and setting the pressure of the vessel space to the crystal growth pressure and a second sub-step of holding the crystal growth temperature and the crystal growth pressure.

In a preferred embodiment, the fifth step further comprises a third sub-step of supplying the nitrogen source gas to the vessel space via the check valve and the metal Na melt such that the pressure of the reaction vessel is held generally t the crystal growth pressure.

In a preferred embodiment, the fifth step comprises a fourth sub-step of setting the stopper/inlet member or the check valve to a temperature at which a first vapor pressure of the metal Na evaporating from the metal Na melt is generally coincident to a second vapor pressure of the metal Na evaporating from the melt mixture.

In a preferred embodiment, the fifth step further includes a fifth sub-step, after the first and second sub-steps, of causing the seed crystal of GaN with an interface between the melt mixture and the vessel space or dipping the seed crystal of GaN into the melt mixture.

In a preferred embodiment, the fifth step further includes a sixth sub-step of setting a temperature of the seed crystal to be a temperature lower than the temperature of the melt mixture.

In a preferred embodiment, the sixth sub-step is conducted such that a temperature difference between the melt mixture and the seed crystal is increased with progress of crystal growth of the GaN crystal from the seed crystal.

In a preferred embodiment, the method further comprises, after the fifth step, of a seventh step of lowering the temperature of the crucible and the inner reaction vessel from the crystal growth temperature to a predetermined temperature while maintaining a pressure difference between the third pressure and the fourth pressure to be equal to or smaller than the second reference value.

In a preferred embodiment, the manufacturing method further includes an eighth step of holding the temperature of the stopper/inlet member or the check valve generally at the predetermined temperature during the interval in which the temperature of the crucible and the inner reaction vessel is lowered from the crystal growth temperature to the predetermined temperature.

In a preferred embodiment, the crystal growth apparatus further includes a communication valve communicating the vessel space and a space inside the outer reaction vessel. In another aspect, the manufacturing method further includes a ninth step of opening the communication valve during the interval of lowering the temperature when the temperature of the crucible and the inner reaction valve has reached a predetermined temperature.

In a preferred embodiment, the tenth step further comprises the step of cooling the crucible and the inner reaction vessel naturally.

Further, in a preferred embodiment, the tenth step further includes the step of cooling the stopper/inlet member or the check valve naturally.

In the present invention, growth of the GaN crystal is achieved by filling a nitrogen gas in the inner reaction vessel and the outer reaction vessel while maintaining a pressure difference between the first pressure of the inner reaction vessel and the second pressure of the outer reaction vessel to be equal to or smaller than the first reaction vessel and while maintaining the mixing ratio of the metal Na and the metal Ga in the melt mixture generally constant. As a result, running out of the nitrogen gas and metal Na vapor from the inner reaction vessel to the outer reaction vessel and inflow of gas from the outer reaction vessel to the inner reaction vessel is suppressed, and growth of the GaN crystal is achieved while maintaining the ambient of the vessel space exposed to the melt mixture generally constant.

Thus, according to the present invention, manufacturing of a GaN crystal is achieved stably.

According to another aspect of the present invention, there is provided a crystal growth apparatus having an inner reaction vessel, an outer reaction vessel, a gas supplying unit, a heating unit, and a pressure holding unit. The inner reaction vessel holds a melt mixture containing an alkali metal and a group III metal. The outer reaction vessel surrounds the inner reaction vessel. The gas supplying unit supplies a nitrogen source gas to a first vessel space exposed to the melt mixture inside the inner reaction vessel. The heating unit heats the inner reaction vessel to a crystal growth temperature. The pressure holding unit holds the pressure difference between a first pressure inside the inner reaction vessel and a second pressure of the outer reaction vessel to a suitable pressure difference at the time when the inner reaction vessel has been heated to the crystal growth temperature. Thereby, it should be noted that the suitable pressure difference is a pressure difference that causes substantial disconnection of the first vessel space from the second vessel space formed between the inner reaction vessel and the outer reaction vessel when the inner reaction vessel has been heated to the crystal growth temperature.

In a preferred embodiment, the pressure holding unit holds the pressure difference to a value smaller than a predetermined value at which it is judged that the crystal growth apparatus is in an anomalous state.

In a preferred embodiment, the pressure holding unit comprises first and second pressure sensors and a pressure regulator. The first pressure sensor detects the first pressure. The second pressure sensor detects the second pressure. The pressure regulator controls the second pressure based on the first and second pressures detected respectively by the first and second pressure sensors such that the pressure difference takes a value smaller than the predetermined value.

In a preferred embodiment, the pressure regulator increases the second pressure in the event the pressure difference is equal to or larger than the predetermined value and when the first pressure is higher than the second pressure, such that the pressure difference takes a value smaller than the predetermined value. Further, the pressure regulator lowers the second pressure in the event the pressure difference is equal to or larger than the predetermined value and when the first pressure is lower than the second pressure, such that the pressure difference takes a value smaller than the predetermined value.

In a preferred embodiment, the pressure regulator maintains the detected first pressure.

In a preferred embodiment, the crystal growth apparatus further comprises a crucible and a melt support member. The crucible is disposed inside the inner reaction vessel and holds the melt mixture. The melt mixture support member holds a metal melt between a first vessel space and an outer space. The first pressure sensor detects a hydrostatic pressure of the metal melt and detects the first pressure, which is the pressure inside the first vessel space, based on the detected hydrostatic pressure.

In a preferred embodiment, the crystal growth apparatus further comprises a conduit connected to the inner reaction vessel. Further, the melt support member is disposed in a temperature region where there is caused no substantial evaporation in the metal melt inside the conduit, wherein the melt support member holds the metal melt between the crucible and the inner reaction vessel and in the conduit by the surface tension of the metal melt. The first pressure detector detects a hydrostatic pressure of the metal melt held in the vicinity of the melt support member.

In a preferred embodiment, the melt support member comprises a porous member.

In a preferred embodiment, the metal melt is different from the melt mixture.

In a preferred embodiment, the metal melt is an alkali metal melt, which is a melt of an alkali metal.

In another aspect, there is provided a method for manufacturing a group III nitride crystal by using a crystal growth apparatus, the crystal growth apparatus comprising an inner reaction vessel holding a melt mixture containing an alkali metal and a group III metal and an outer reaction vessel surrounding the inner reaction vessel, the method comprising: a first step of loading the alkali metal and the group III metal to the inner reaction vessel in an ambient of inert gas or nitrogen gas; a second step of filling a nitrogen source gas in a first vessel space exposed to the melt mixture in the inner reaction vessel; a third step of heating the inner reaction vessel to a crystal growth temperature; a fourth step of holding the inner reaction vessel at the crystal growth temperature for a predetermined duration; and a fifth step of maintaining a pressure difference between a first pressure inside the inner reaction vessel and a second pressure inside the outer reaction vessel for the case when the inner reaction vessel is heated to the crystal growth temperature, to be a suitable pressure difference. Thereby, it should be noted that the suitable pressure difference is a pressure difference that causes substantial disconnection of the first vessel space from a second vessel space formed between the inner reaction vessel and the outer reaction vessel when the inner reaction vessel has been heated to the crystal growth temperature.

In a preferred embodiment, the fifth step holds the pressure difference to a value smaller than a predetermined value at which it is judged that the crystal growth apparatus is in an anomalous state.

In a preferred embodiment, the fifth step comprises a first sub-step of detecting the first and second pressures and a second sub-step of adjusting the second pressure based on the detected first and second pressures such that the pressure difference takes a value smaller than the predetermined value.

In a preferred embodiment, the second sub-step comprises: a step of calculating the pressure difference from the detected first and second pressures; a step of increasing the second pressure when the calculated pressure difference is larger than the predetermined value and when the first pressure is higher than the second pressure, such that the pressure difference becomes smaller than the predetermined value; and a step of decreasing the second pressure when the calculated pressure difference is larger than the predetermined value and when the first pressure is lower than the second pressure, such that the pressure difference becomes smaller than the predetermined value.

In a preferred embodiment, the fifth step further includes a third sub-step of holding the detected first pressure.

In a preferred embodiment, the crystal growth apparatus is disposed inside the inner reaction vessel and includes a crucible holding the melt mixture and a melt support member holding a metal melt between the first vessel space and the outer space. In the manicuring method, the first sub-step detects a hydrostatic pressure of the metal melt and detects the first pressure, which is the pressure inside the first vessel space, based on the detected hydrostatic pressure.

In a preferred embodiment, the crystal growth apparatus further comprises a conduit connected to the inner reaction vessel. Further, the melt support member is disposed in a temperature region where there is caused no substantial evaporation in the metal melt inside the conduit, wherein the melt support member holds the metal melt between the crucible and the inner reaction vessel and in the conduit by the surface tension of the metal melt. The first SUB-STEP detects a hydrostatic pressure of the metal melt held in the vicinity of the melt support member.

In a preferred embodiment, the melt support member comprises a porous member.

In a preferred embodiment, the metal melt is different from the melt mixture.

In a preferred embodiment, the metal melt is an alkali metal melt, which is a melt of an alkali metal.

According to the present invention, the group III nitride crystal is grown in the inner reaction vessel in a state in which the pressure difference between the first pressure inside the inner reaction vessel and the second pressure inside the outer reaction vessel is maintained to a suitable pressure difference in which the first vessel space exposed to the melt mixture in the inner reaction vessel is disconnected substantially from the second vessel space between the inner reaction vessel and the outer reaction vessel. As a result, the crystal growth of the group III nitride crystal is carried out while suppressing leakage of the nitrogen source gas and the melt mixture inside the inner reaction vessel from the inner reaction vessel to the outside and further suppressing invasion of impurities from the second vessel space into the first vessel space. Thus, the growth of the group III nitride crystal is achieved while maintaining the state of the nitrogen source gas and the melt mixture in the inner reaction vessel.

Thus, according to the present invention, manufacturing of a group III nitride crystal is achieved stably. Further, according to the present invention, it becomes possible to detect the pressure in the region of low temperature by detecting the pressure of the inner reaction vessel in the form of the metal hydrostatic pressure, and as a result, the accuracy of pressure detection is increased. Thereby, the degree of disconnection is improved.

According to another aspect of the present invention, there is provided a crystal growth apparatus having a reaction vessel, a gas supplying unit, a heating unit, a support unit, an etching unit, and a moving unit. The reaction unit holds a melt mixture containing an alkali metal and a group III metal. The gas supplying unit supplies a nitrogen source gas to a vessel space exposed to the melt mixture inside the reaction vessel. The heating unit heats the reaction vessel to a crystal growth temperature. The support unit supports a seed crystal of a group III nitride crystal. The etching unit etches the seed crystal. The moving unit moves the support unit such that the etched seed crystal is supported at the interface between the vessel space and the melt mixture or inside the melt mixture.

In a preferred embodiment, the etching unit etches the seed crystal by the melt mixture.

In a preferred embodiment, the etching unit conducts the etching of the seed crystal while holding the pressure of the nitrogen source gas in the vessel space and the temperature of the melt mixture to a value such that there is caused dissolution of the seed crystal.

In a preferred embodiment, the etching unit etches the seed crystal by a metal melt different from the melt mixture.

In a preferred embodiment, the melt mixture comprises an alkali metal melt.

In a preferred embodiment, the etching unit includes an outer reaction vessel connected to the vessel space and holds the metal melt. Further, the heating unit heats the reaction vessel and the outer reaction vessel to a crystal growth temperature.

In a preferred embodiment, the outer reaction vessel surrounds the reaction vessel and holds the metal melt between the outer reaction vessel and the reaction vessel.

In a preferred embodiment, the etching unit comprises an outer vessel connected to the vessel space and holds the metal melt and another heating unit heating the outer vessel to a temperature higher than the crystal growth temperature.

In another aspect, there is provided a method of manufacturing a group III nitride crystal by using a crystal growth apparatus, the crystal growth apparatus having a reaction vessel holding a melt mixture containing an alkali metal and a group III metal, the method comprising: a first step of loading the alkali metal and the group III metal to the reaction vessel in an ambient of inert gas or nitrogen gas; a second step of setting a seed crystal of a group III nitride crystal above the alkali metal and the group III metal in the reaction vessel; filling a vessel space inside the reaction vessel with a nitrogen source gas; a fourth step of heating the reaction vessel to a crystal growth temperature; a fifth step of etching the seed crystal; a sixth step of supporting the etched seed crystal at an interface between the vessel space and the melt mixture or inside the melt mixture; a seventh step of holding the reaction vessel at a crystal growth temperature for a predetermined duration; and an eighth step of supplying a nitrogen source gas to the reaction vessel such that a pressure inside the reaction vessel is maintained at a predetermined pressure.

In a preferred embodiment, the fifth step carries out the etching of the seed crystal by dipping the seed crystal in the melt mixture.

In a preferred embodiment, the fifth step conducts the etching of the seed crystal while holding the pressure of the nitrogen source gas in the vessel space and the temperature of the melt mixture to a value such that there is caused dissolution of the seed crystal.

In a preferred embodiment, the fifth step etches the seed crystal by a metal melt different from the melt mixture.

In a preferred embodiment, the fifth step etches the seed crystal by an alkali metal melt.

In a preferred embodiment, the crystal growth apparatus includes an outer reaction vessel connected to the vessel space and holds the metal melt. Further, in the manufacturing method, the fifth step includes: a first sub-step of holding the seed crystal in the vessel space; and a second sub-step of heating the outer vessel such that a vapor pressure of the metal melt is higher than a vapor pressure of the alkali metal in the vessel space.

In a preferred embodiment, the second sub-step heats the outer vessel to a temperature higher than the crystal growth temperature.

In the present invention, the group III nitride crystal is grown preferentially from a seed crystal of the group III nitride crystal by etching the seed crystal and by causing the etched seed crystal to make a contact with the melt mixture. With such a procedure, impurities adhered to the surface of the seed crystal are removed, and crystal growth of the group III nitride crystal occurring from the sites other than the seed crystal is suppressed Thus, according to the present invention, it becomes possible to manufacture a group III nitride crystal of large size.

Further, in a preferred embodiment, the seed crystal is etched by dipping into the melt mixture.

Thus, according to the present invention, it becomes possible to carry out the crystal growth of the GaN crystal continuously after etching of the seed crystal.

Further, according to a preferred embodiment, the seed crystal is etching by the metal vapor evaporated from the melt mixture or the metal vapor evaporated from the metal melt different from the melt mixture in the state that the seed crystal is held in the space inside the reaction vessel.

Thus, according to the present invention, it becomes possible to carry out crystal growth of the group III nitride crystal while suppressing contamination of the metal mixture by the impurities adhered to the surface of the seed crystal. As a result, a high-quality group III nitride crystal is manufactured.

Further, according to a preferred embodiment, the seed crystal is etched by the alkali metal vapor evaporated from the alkali metal melt held in an outer vessel different from the reaction vessel and has caused diffusion from the outer vessel into the reaction vessel in the state the seed crystal is held in the space inside the reaction vessel.

Thus, according to the present invention, it becomes possible to etch the seed crystal while maintaining the molar ratio between the alkali metal and the group III metal in the melt mixture.

According to another aspect of the present invention, there is provided a crystal growth apparatus having a reaction vessel, a gas supplying unit, a heating unit, and support unit. The reaction unit holds a melt mixture containing an alkali metal and a group III metal. The gas supplying unit supplies a nitrogen source gas to a vessel space exposed to the melt mixture inside the reaction vessel. The heating unit heats the reaction vessel to a crystal growth temperature. The support unit supports a seed crystal of a group III nitride crystal inside the melt mixture.

In a preferred embodiment, the crystal growth apparatus further comprises a temperature setting unit and a temperature control unit. The temperature setting unit set the temperature of the seed crystal to a predetermined temperature. The temperature control unit controls the heating unit and the temperature setting unit such that the temperate of the seed crystal is lower than the temperature of the melt mixture.

According to another aspect of the present invention, there is provided a crystal growth apparatus having a reaction vessel, a gas supplying unit, a heating unit, a support unit, a temperature setting unit, and a temperature control unit. The reaction unit holds a melt mixture containing an alkali metal and a group III metal. The gas supplying unit supplies a nitrogen source gas to a vessel space exposed to the melt mixture inside the reaction vessel. The heating unit heats the reaction vessel to a crystal growth temperature. The support unit supports a seed crystal of a group III nitride crystal at an interface between the vessel space and the melt mixture. The temperature setting unit set the temperature of the seed crystal to a predetermined temperature. The temperature control unit controls the heating unit and the temperature setting unit such that the temperate of the seed crystal is lower than the temperature of the melt mixture.

In a preferred embodiment, the crystal growth apparatus further comprises a concentration detection unit and a moving unit. The concentration detection unit detects a nitrogen concentration or a concentration of the group III nitride in the melt mixture. The moving unit moves the support unit, when the detected nitrogen concentration or the concentration of the group III nitride has reached a supersaturation state, such that the seed crystal makes a contact with the melt mixture or the seed crystal is dipped into the melt mixture.

In a preferred embodiment, the moving unit moves the support unit such that the seed crystal is held in the vessel space until the nitrogen concentration or the concentration of the group III nitride in the melt mixture has become the supersaturation state and moves the support unit, when the detected nitrogen concentration or the group III nitride concentration has reached the supersaturation state, such that the seed crystal makes a contact with the melt mixture.

In a preferred embodiment, the moving unit moves the support unit such that the seed crystal is dipped into the melt mixture until the nitrogen concentration or the concentration of the group III nitride in the melt mixture has become the supersaturation state and moves the support unit, when the detected nitrogen concentration or the group III nitride concentration has reached the supersaturation state, such that the seed crystal makes a contact with the melt mixture.

In a preferred embodiment, the temperature control unit controls the heating unit and the temperature setting unit such that the difference between the temperature of the melt mixture and the temperature of the seed crystal increases with growth of the group III nitride crystal.

In a preferred embodiment, the heating unit comprises a heater provided around the reaction vessel and heats the melt mixture to the crystal growth temperature. The temperature control unit controls the heating unit and the temperature setting unit such that the temperate of the seed crystal is lower than the temperature of the heater.

In a preferred embodiment, the temperature control unit controls the temperature setting unit alone such that the temperate of the seed crystal is lower than the temperature of the melt mixture. The temperature setting unit comprises a cooling device cooling the seed crystal.

In a preferred embodiment, the heating unit comprises a heater provided around the reaction vessel and heats the melt mixture to the crystal growth temperature. The temperature control unit controls solely the cooling device such that the temperate of the seed crystal is lower than the temperature of the heater.

In a preferred embodiment, the cooling device includes a cylindrical member having a closed end and a seed crystal is fixed to the closed end. With the cooling device, a cooling gas is caused to flow inside the cylindrical member.

In a preferred embodiment, the cooling device increases the cooling gas inside the cylindrical member with increasing flow rate with growth of the group III nitride crystal.

In a preferred embodiment, the moving unit comprises a vibration application unit, a vibration detection unit, and a moving unit. The vibration application unit applies a vibration to the support unit. The vibration detection unit detects a vibration signal indicative of the vibration of the support unit. The moving unit moves the support unit such that the detected vibration signal becomes a vibration signal of the state in which the seed crystal has contacted with the melt mixture.

In a preferred embodiment, the moving unit further moves the support unit such that the group III nitride crystal grown from the seed crystal makes a contact with the melt mixture during the growth of the group III nitride crystal.

In another aspect, there is provided a method of manufacturing a group III nitride crystal by using a crystal growth apparatus, the crystal growth apparatus having a reaction vessel holding a melt mixture containing an alkali metal and a group III metal, the method comprising: a first step of loading the alkali metal and the group III metal to the reaction vessel in an ambient of inert gas or nitrogen gas; a second step of setting a seed crystal of a group III nitride crystal above the alkali metal and the group III metal in the reaction vessel; filling a vessel space inside the reaction vessel with a nitrogen source gas; a fourth step of heating the reaction vessel to a crystal growth temperature; a fifth step of holding the reaction vessel at the crystal growth temperature for a predetermined duration; a sixth step of supporting the seed crystal inside the melt mixture; and a seventh step of supplying a nitrogen source gas to the reaction vessel such that a pressure inside the reaction vessel is maintained at a predetermined pressure.

In a preferred embodiment, the manufacturing method further includes an eighth step of setting a temperature of the seed crystal to be a temperature lower than the temperature of the melt mixture.

In another aspect, there is provided a method of manufacturing a group III nitride crystal by using a crystal growth apparatus, the crystal growth apparatus having a reaction vessel holding a melt mixture containing an alkali metal and a group III metal, the method comprising: a first step of loading the alkali metal and the group III metal to the reaction vessel in an ambient of inert gas or nitrogen gas; a second step of setting a seed crystal of a group III nitride crystal above the alkali metal and the group III metal in the reaction vessel; filling a vessel space inside the reaction vessel with a nitrogen source gas; a fourth step of heating the reaction vessel to a crystal growth temperature; a fifth step of holding the reaction vessel at the crystal growth temperature for a predetermined duration; a sixth step of supporting the seed crystal at the interface between the vessel space and the melt mixture; a seventh step of supplying a nitrogen source gas to the reaction vessel such that a pressure inside the reaction vessel is maintained at a predetermined pressure; and an eighth step of setting the temperate of the seed crystal to a temperature lower than the temperature of the seed crystal.

In a preferred embodiment, the method further comprises: a ninth step of detecting a nitrogen concentration or the concentration of the group III nitride in the melt mixture; and a tenth step of moving the support member, when the detected nitrogen concentration or the detected concentration of the group III nitride has become a supersaturation state, such that the seed crystal makes a contact with the melt mixture or such that the seed crystal is dipped into the melt mixture.

In a preferred embodiment, the crystal growth apparatus further comprises a support unit supporting the seed crystal. In the foregoing manufacturing method, the tenth step moves the support unit such that the seed crystal is held in the vessel space until the nitrogen concentration or the concentration of the group III nitride in the melt mixture has become the supersaturation state and moves the support unit, when the detected nitrogen concentration or the group III nitride concentration has reached the supersaturation state, such that the seed crystal makes a contact with the melt mixture.

In a preferred embodiment, the crystal growth apparatus further comprises a support unit supporting the seed crystal. In the foregoing manufacturing method, the tenth step moves the support unit such that the seed crystal is dipped into the melt mixture until the nitrogen concentration or the concentration of the group III nitride in the melt mixture has become the supersaturation state and moves the support unit, when the detected nitrogen concentration or the group III nitride concentration has reached the supersaturation state, such that the seed crystal makes a contact with the melt mixture.

In a preferred embodiment, the eight step sets the temperature of the seed crystal to be lower than the temperature of the melt mixture by cooling the seed crystal.

In a preferred embodiment, the cooling device includes a cylindrical member having a closed end and a seed crystal is fixed to the closed end. In the manufacturing method, the eighth step sets the temperature of the seed crystal to be lower than the temperature of the melt mixture by flowing a cooling gas to the interior of the cylindrical member.

In a preferred embodiment, the eighth step sets the temperature of the seed crystal to be lower than the temperature of the melt mixture by increasing the flow rate of the cooling gas supplied to the interior of the cylindrical member with growth of the group III nitride crystal.

In a preferred embodiment, the tenth step comprises a first sub-step of applying a vibration to the support unit and detects a vibration signal indicating of vibration of the support unit and a second sub-step of moving the support unit such that the detected vibration signal becomes a vibration signal of the state in which the seed crystal makes a contact with the melt mixture.

In a preferred embodiment, the tenth step further moves the support unit such that the group III nitride crystal grown from the seed crystal makes a contact with the melt mixture during the growth of the group III nitride crystal.

With the present invention, the group III nitride crystal is grown preferentially from the seed crystal by making a seed crystal of the group III nitride crystal with the melt mixture or by dipping the seed crystal into the melt mixture. With this, growth of the group III nitride crystal from the sites other than the seed crystal is suppressed.

Thus, according to the present invention, it becomes possible to manufacture a group III nitride crystal of large size.

Further, in a preferred embodiment, the crystal growth of the group III nitride crystal is achieved by setting the temperature of the seed crystal to a temperature lower than the temperature of the melt mixture. In other words, the crystal growth of the group III nitride crystal is carried out by increasing the degree of supersaturation of nitrogen or the group III nitride of the melt mixture in the vicinity of the seed crystal. As a result, crystal growth of the group III nitride crystal from the seed crystal is facilitated further.

Thus, according to the present invention, it becomes possible to manufacture a group III nitride crystal of large size.

Further, in a preferred embodiment, crystal growth of the group III nitride is attained by lowering the seed crystal in the direction toward the melt mixture with crystal growth of the group III nitride crystal. In other words, the crystal growth of the group III nitride crystal is attained while contacting the seed crystal with the melt mixture. As a result, crystal growth of the group III nitride crystal from the seed crystal is facilitated further.

Thus, according to the present invention, it becomes possible to manufacture a group III nitride crystal of large size.

Further, in a preferred embodiment, crystal growth of the group III nitride crystal is attained by setting the temperature of the seed crystal to be lower than the temperature of the melt mixture and by lowering the seed crystal in the direction toward the melt mixture with crystal growth of the group III nitride crystal. In other words, the crystal growth of the group III nitride crystal is carried out by increasing the degree of supersaturation of nitrogen or the group III nitride of the melt mixture in the vicinity of the seed crystal and while making the seed crystal to contact with the melt mixture at the same time. As a result, crystal growth of the group III nitride crystal from the seed crystal is facilitated further.

Thus, according to the present invention, it becomes possible to manufacture a group III nitride crystal of large size.

BRIEF DESCRIPTION OF THE DRAWINGS

FIGS. 120A and 120B are enlarged diagrams showing the construction of the support unit, conduit and the thermocouple shown in FIG. 117;

FIG. 121 is a schematic diagram showing the construction of the up/down mechanism shown in FIG. 117;

FIG. 122 is a timing chart showing the waveform of a vibration detection signal;

FIG. 123 is a timing chart showing the temperature of the reaction vessel and the outer reaction vessel;

FIG. 124 is a schematic diagram showing the state inside the reaction vessel and the outer reaction vessel during the interval between two timings t1 and t2 shown in FIG. 123;

FIG. 125 is a diagram showing the relationship between the temperature of the seed crystal and the flow rate of the nitrogen gas;

FIG. 126 is a diagram showing the relationship between the nitrogen gas pressure and the crystal growth temperature for the case of growing a GaN crystal;

FIG. 127 is a flowchart explaining the manufacturing method of a GaN crystal according to Embodiment 15 of the present invention;

FIG. 128 is a schematic diagram showing a state inside the crucible and the reaction vessel in the step S5009 shown in FIG. 127;

FIG. 129 is a schematic diagram showing a state inside the crucible and the reaction vessel in the step S5010 shown in FIG. 127;

FIG. 130 is a schematic cross-sectional diagram showing the construction of a crystal growth apparatus according to Embodiment 19 of the present invention;

FIG. 131 is a flowchart explaining the manufacturing method of a GaN crystal according to Embodiment 19 of the present invention;

Figure 132:
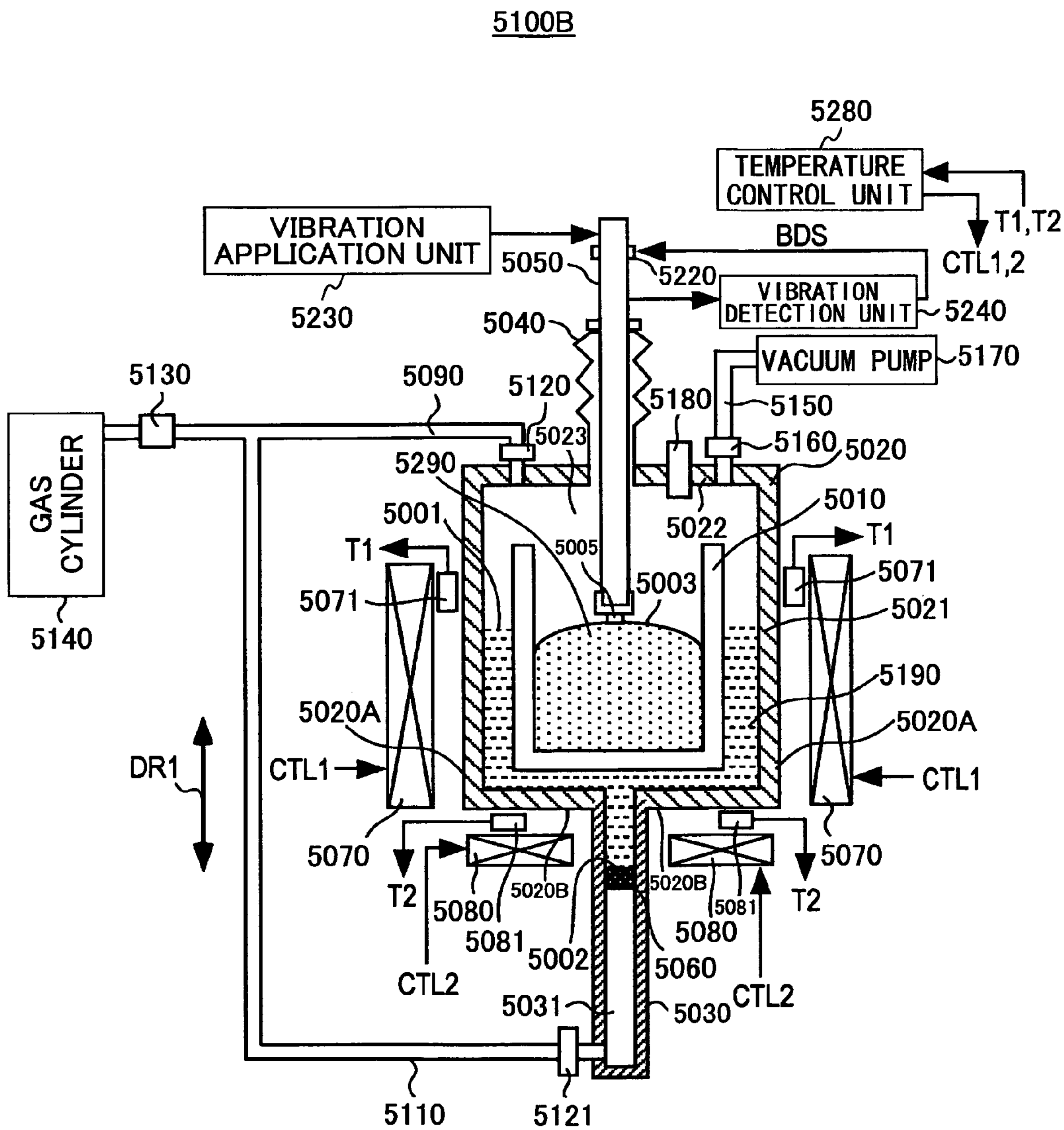
Figure 133:
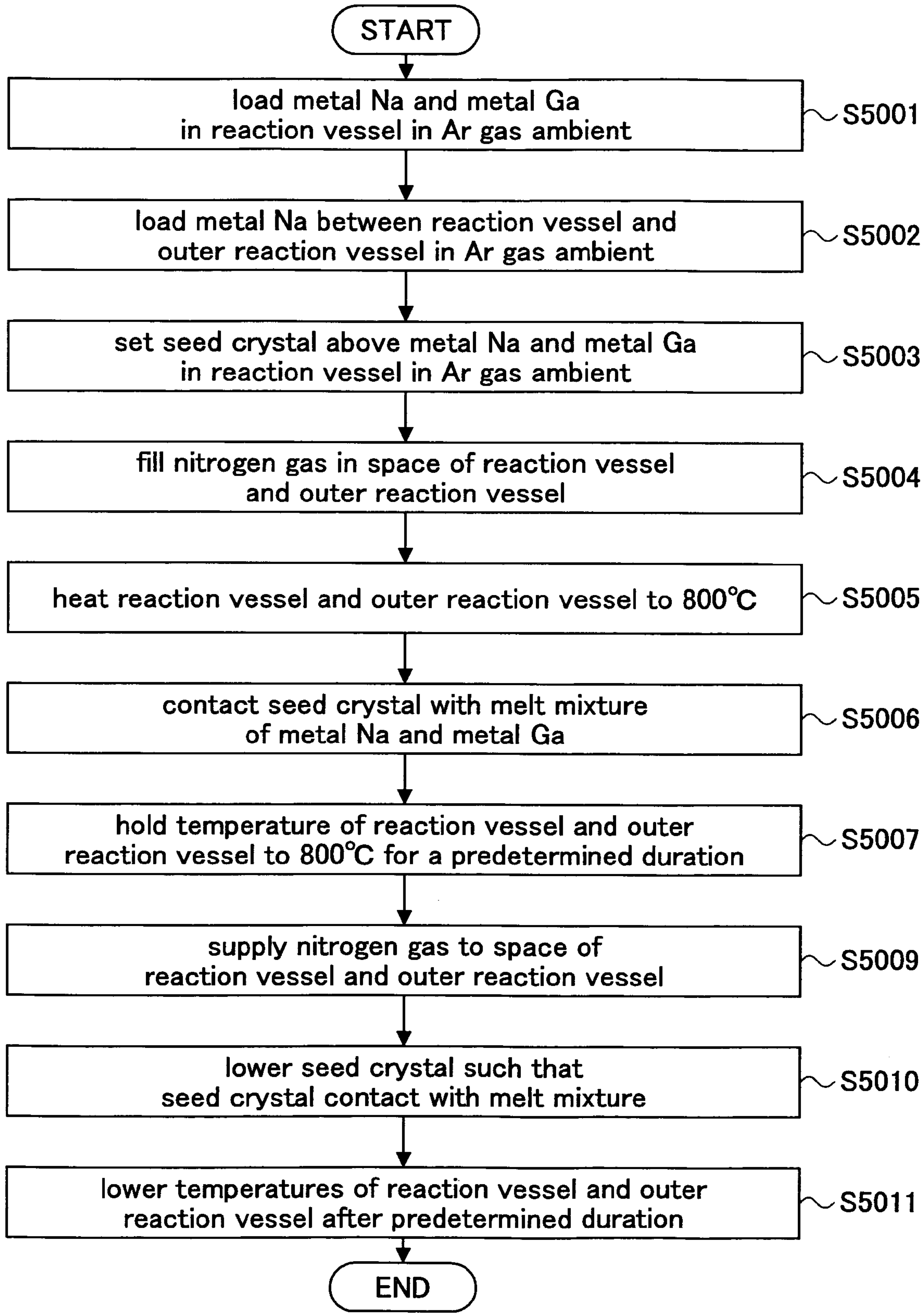
Figure 134:
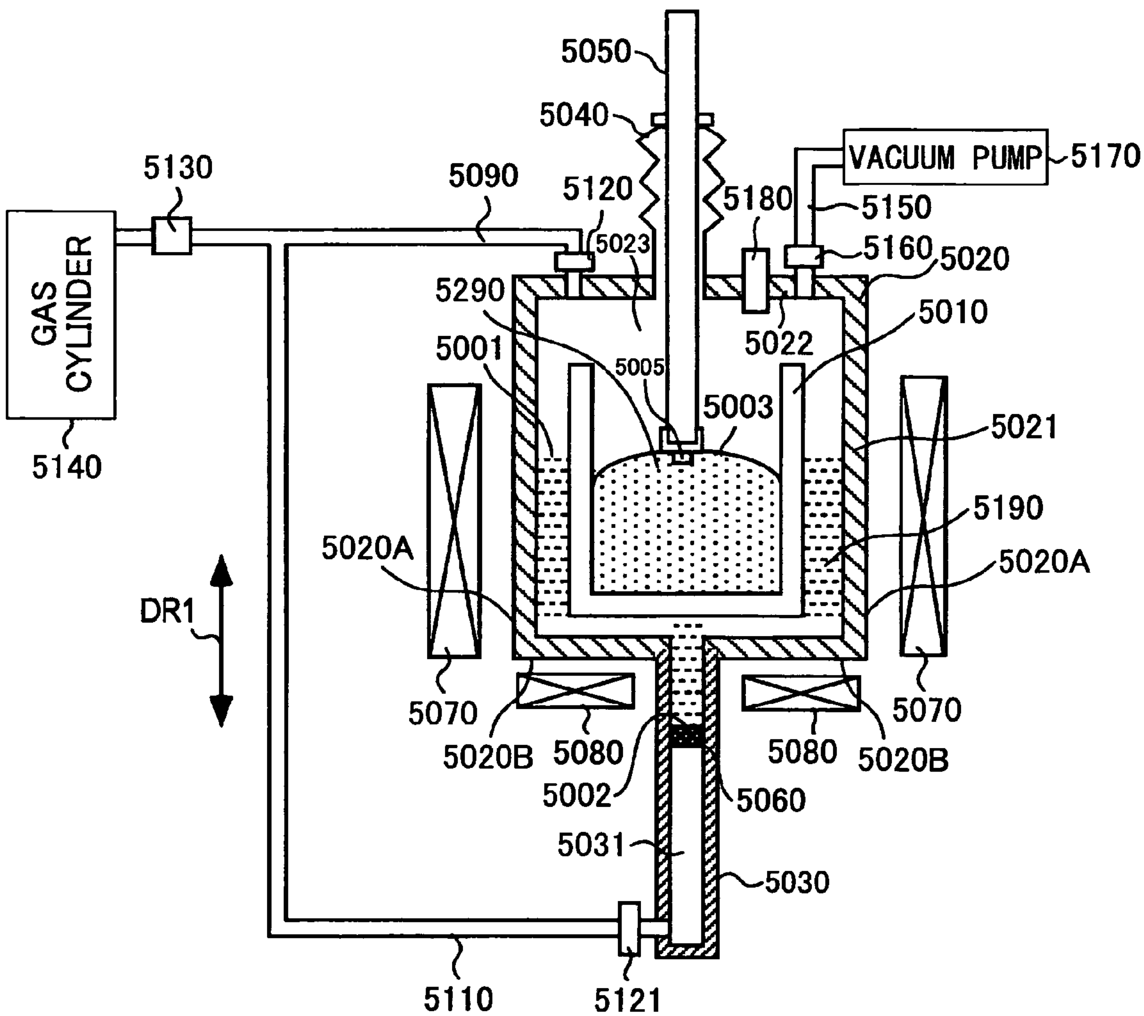
Figure 135:
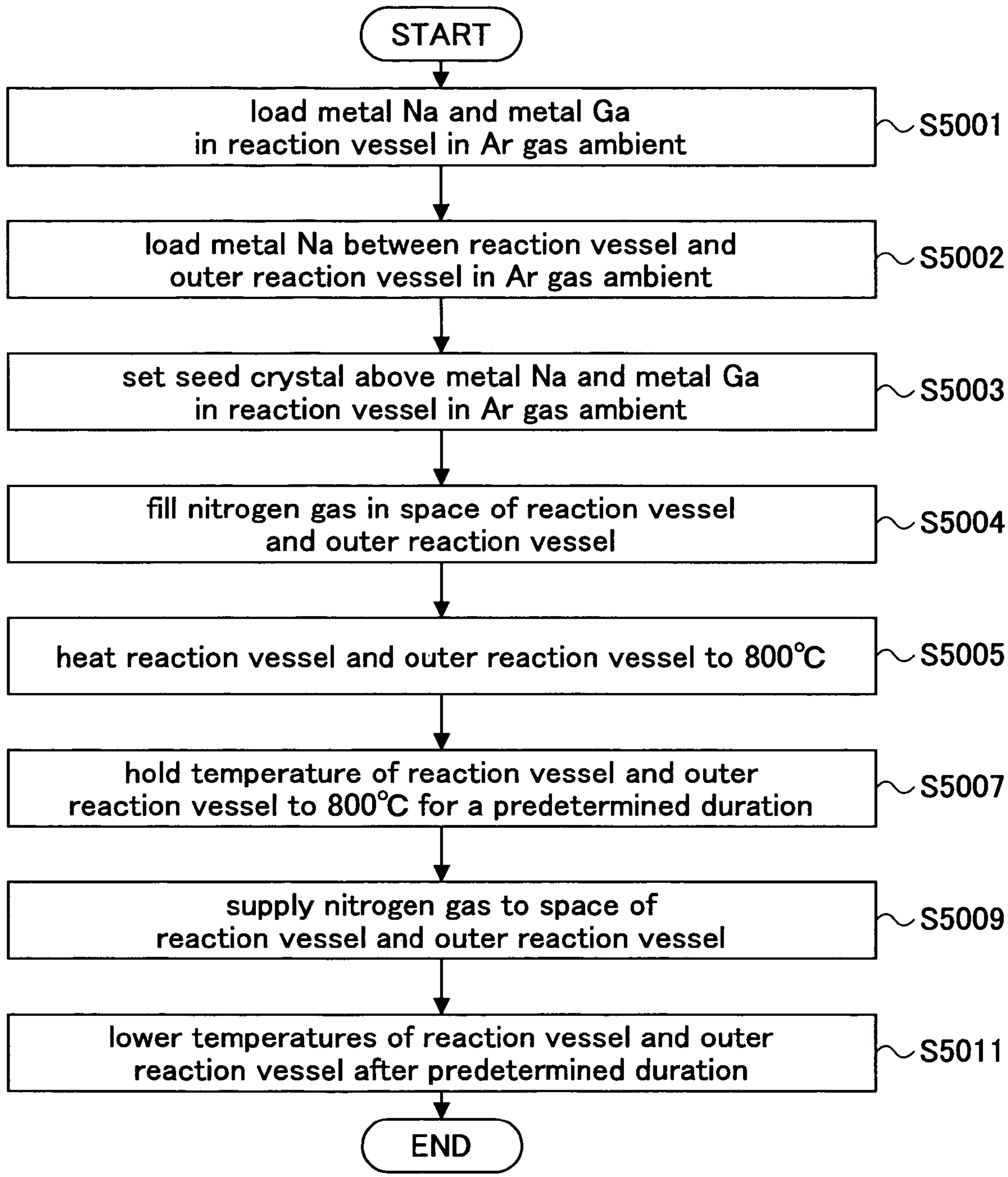
Figure 136:
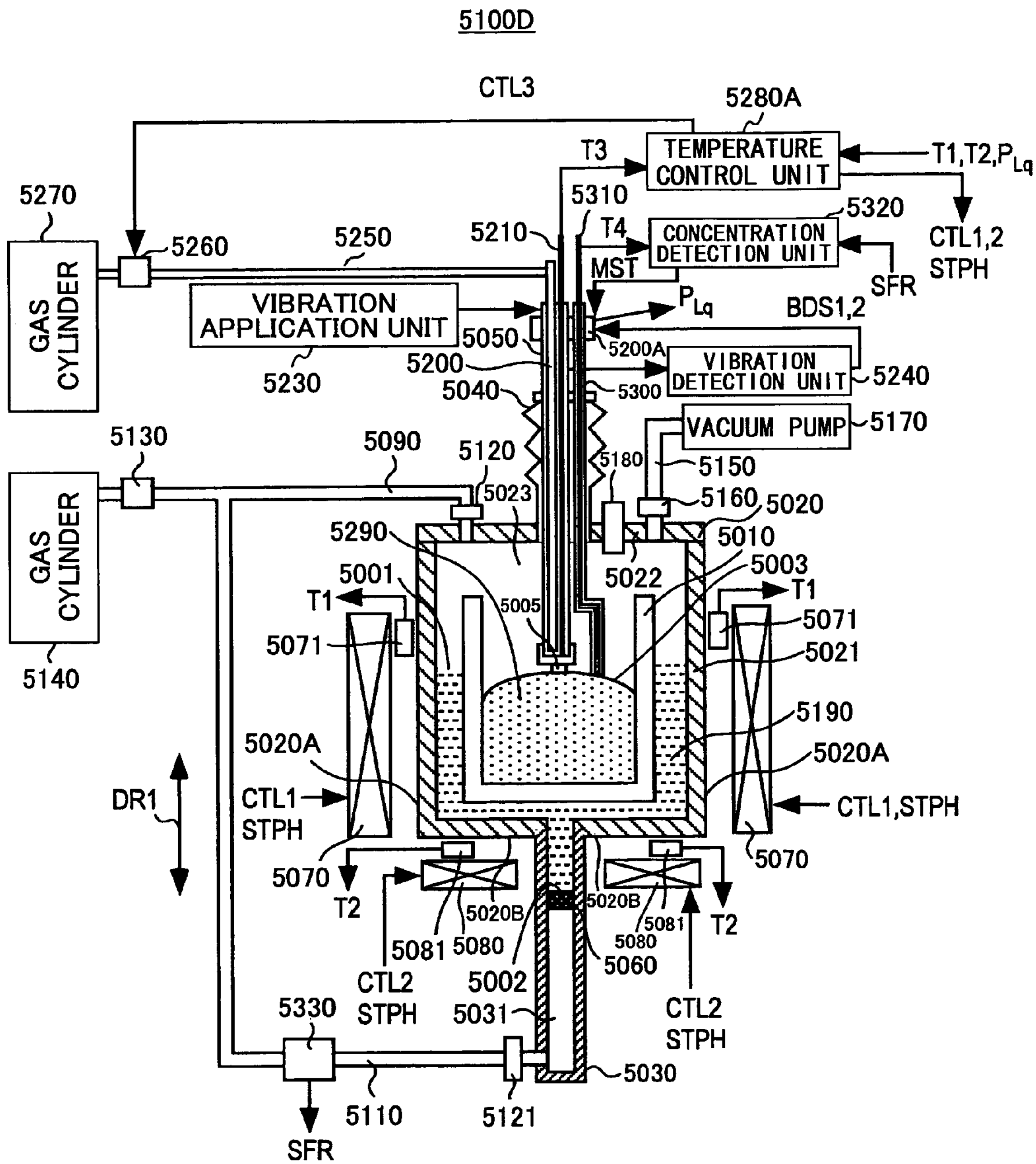
Figure 137:
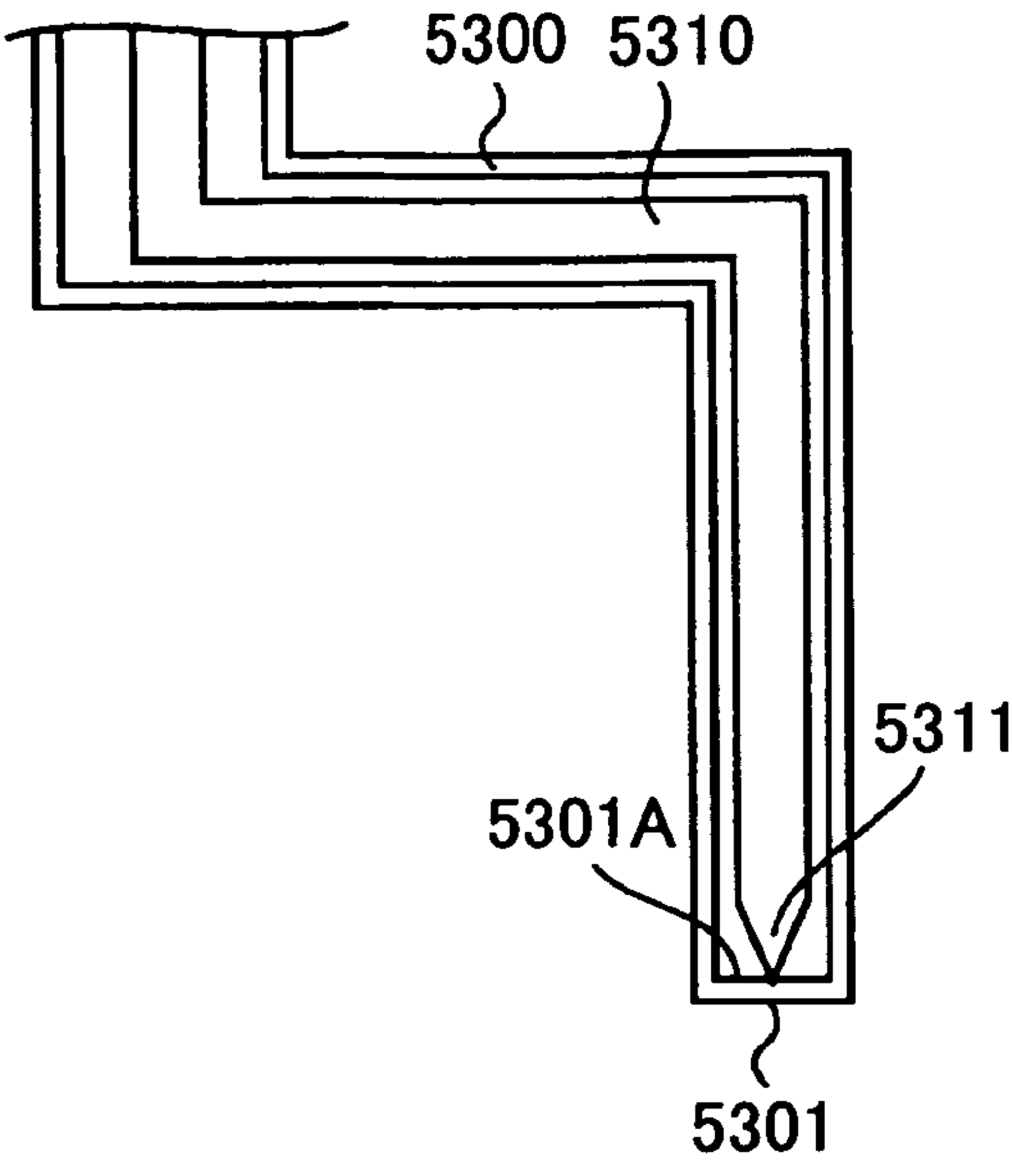
Figure 138:
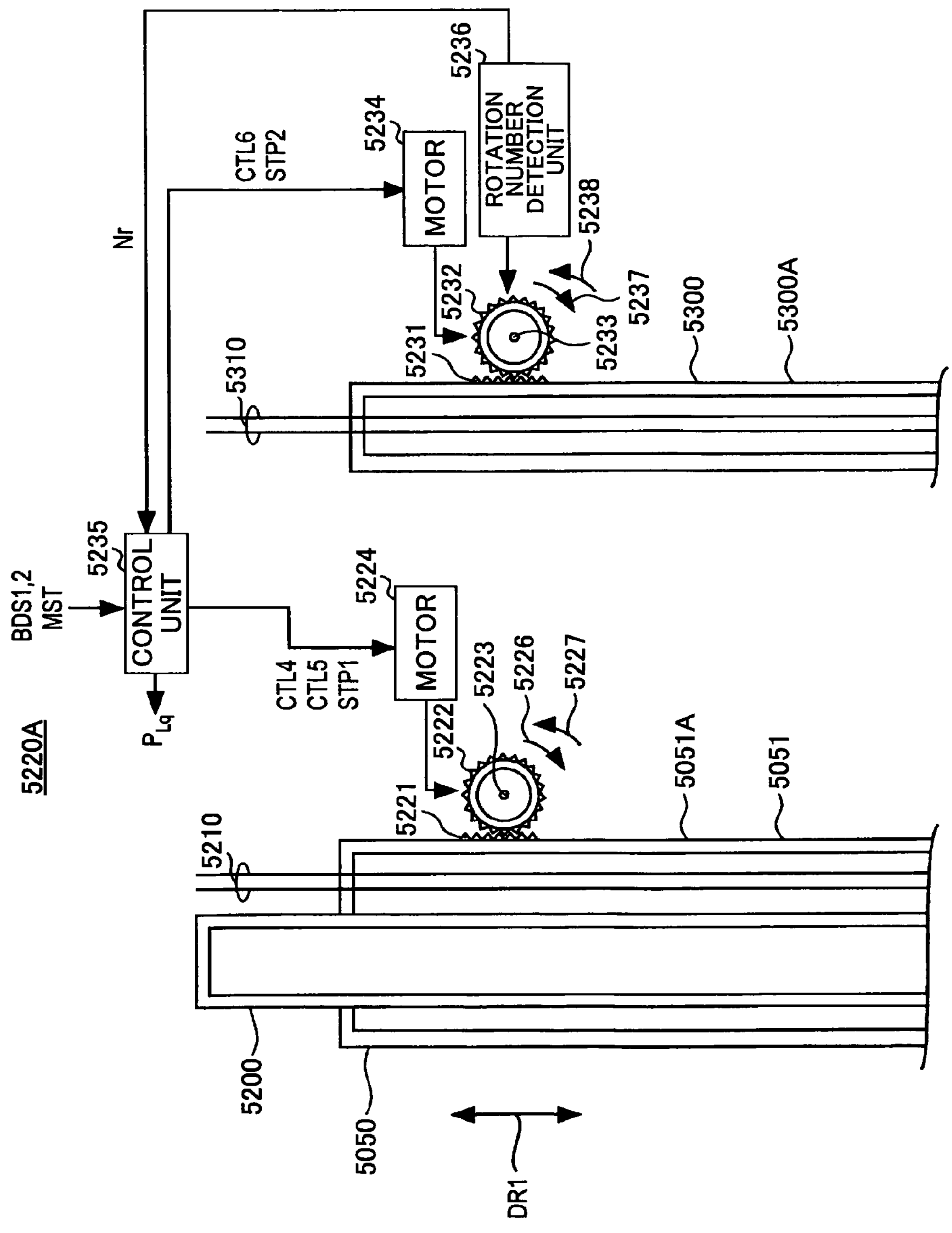
Figure 139A:
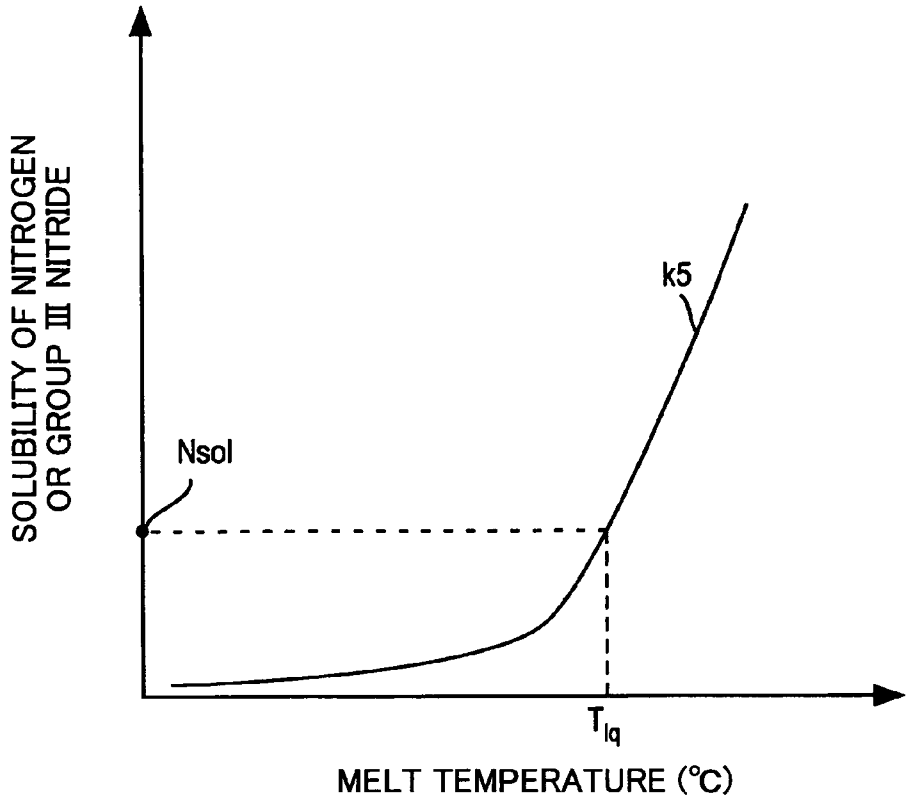
Figure 139B:
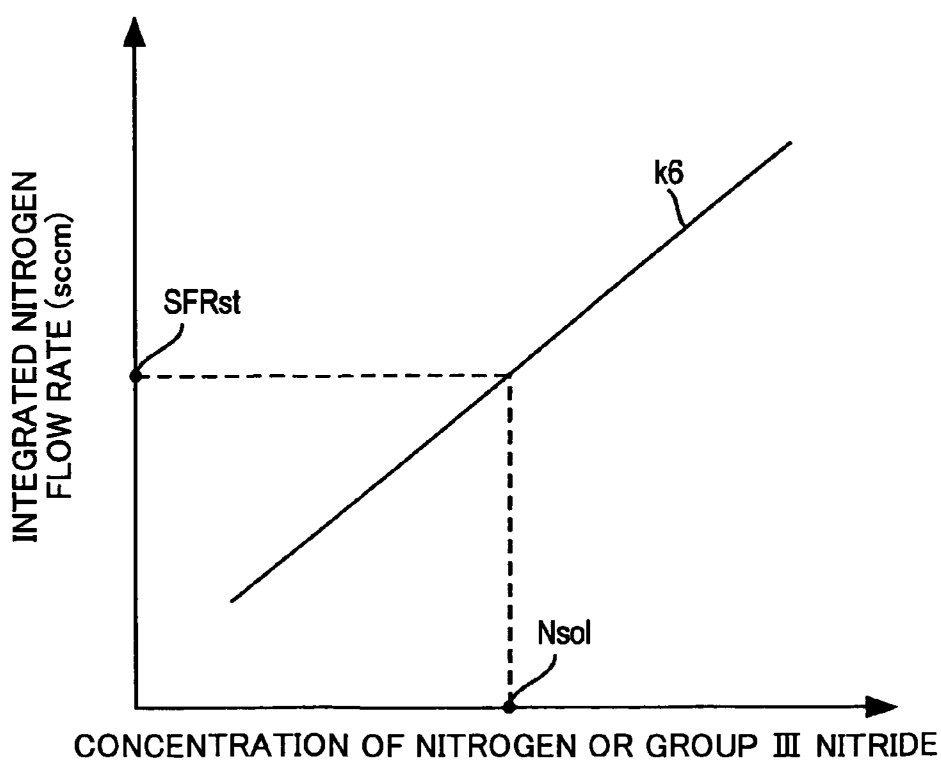
Figure 140:
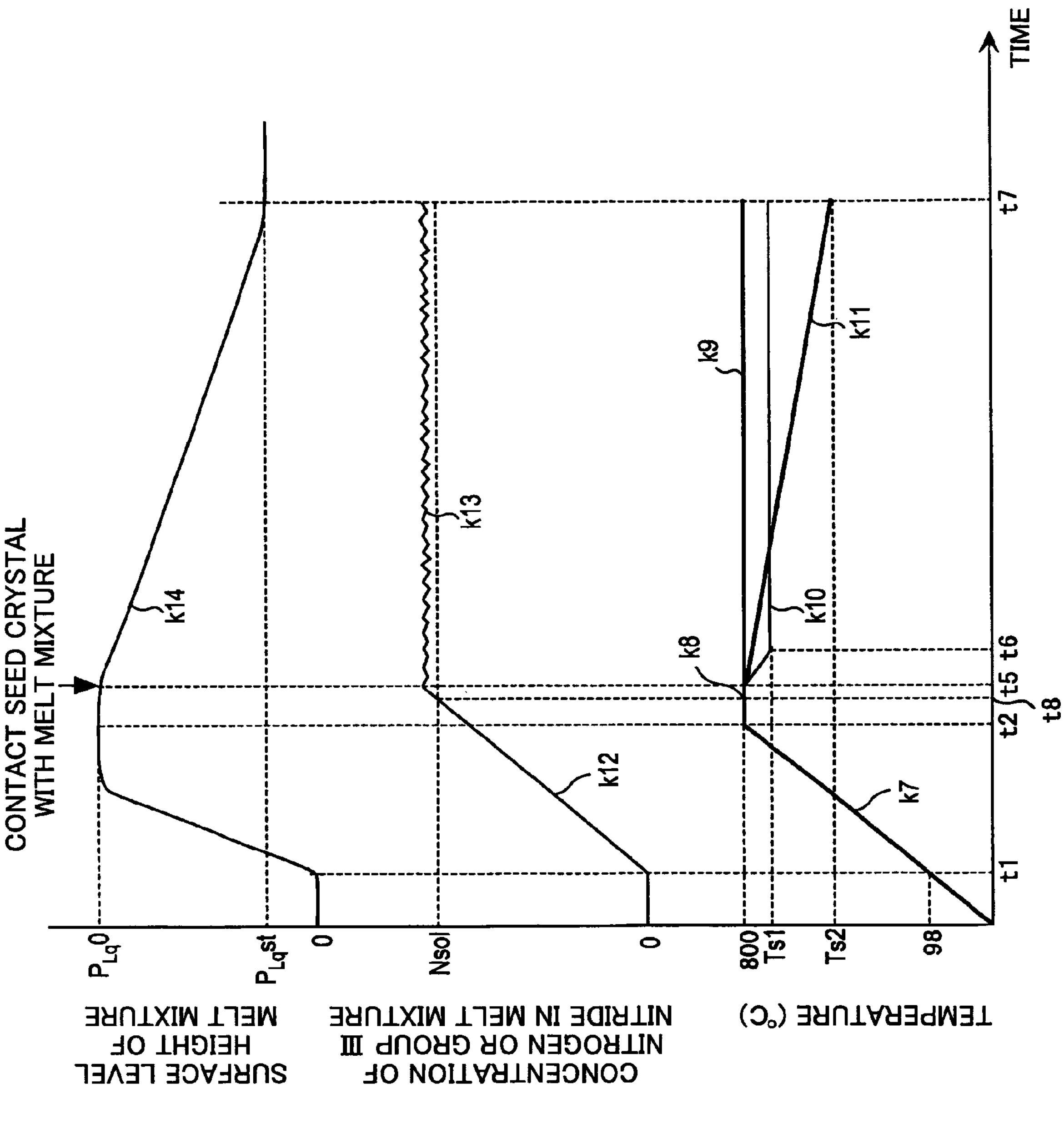
Figure 141B:
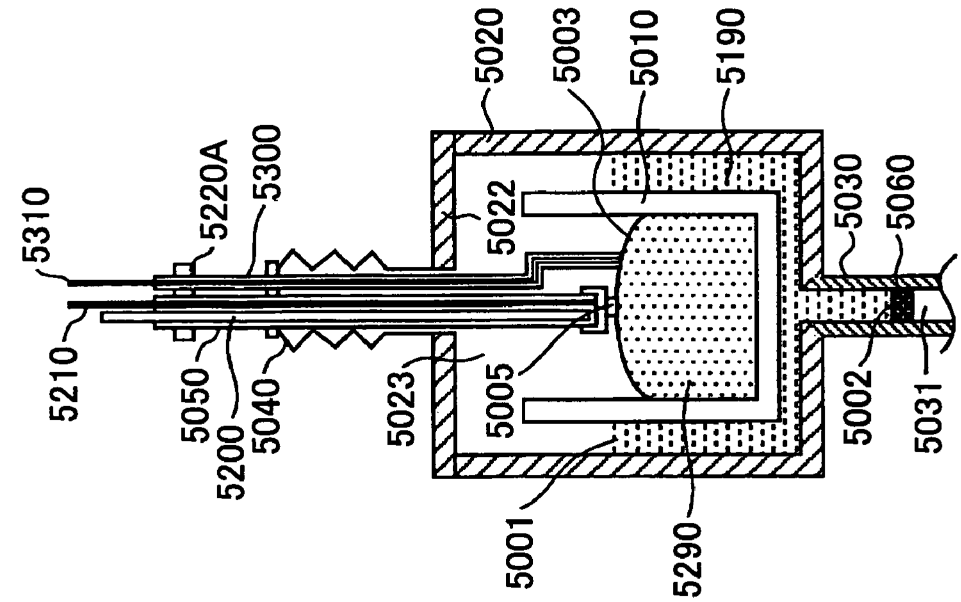
Figure 141A:
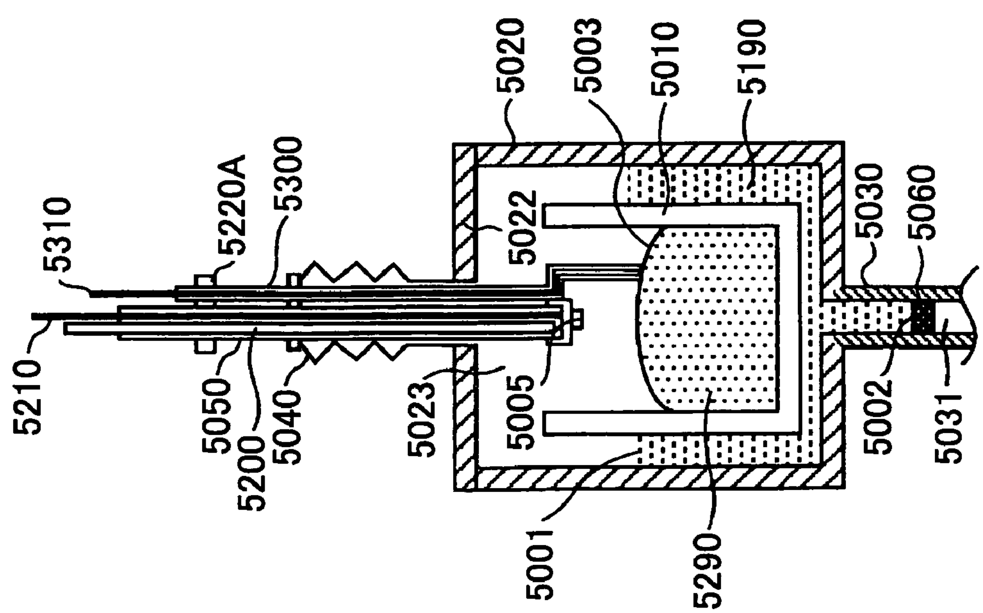
Figure 142B:
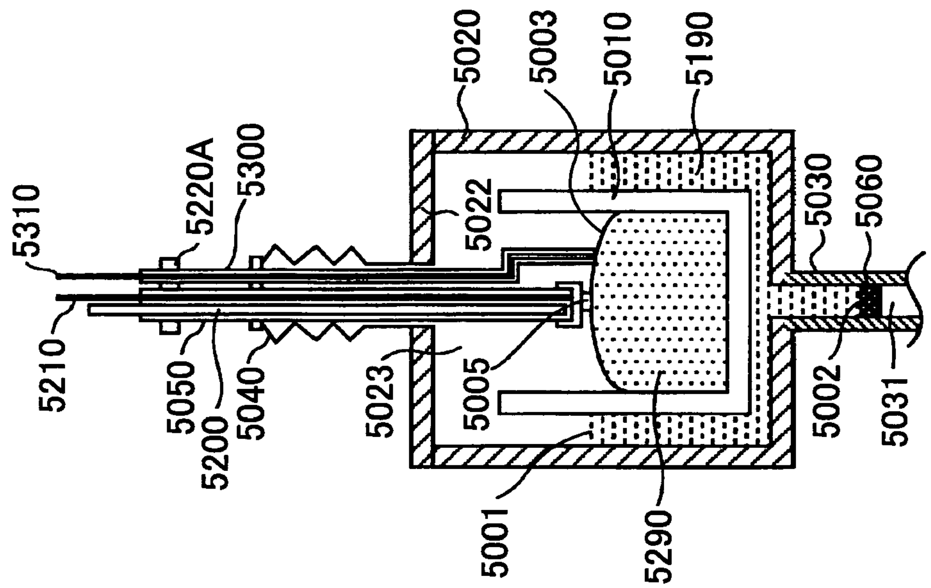
Figure 142A:
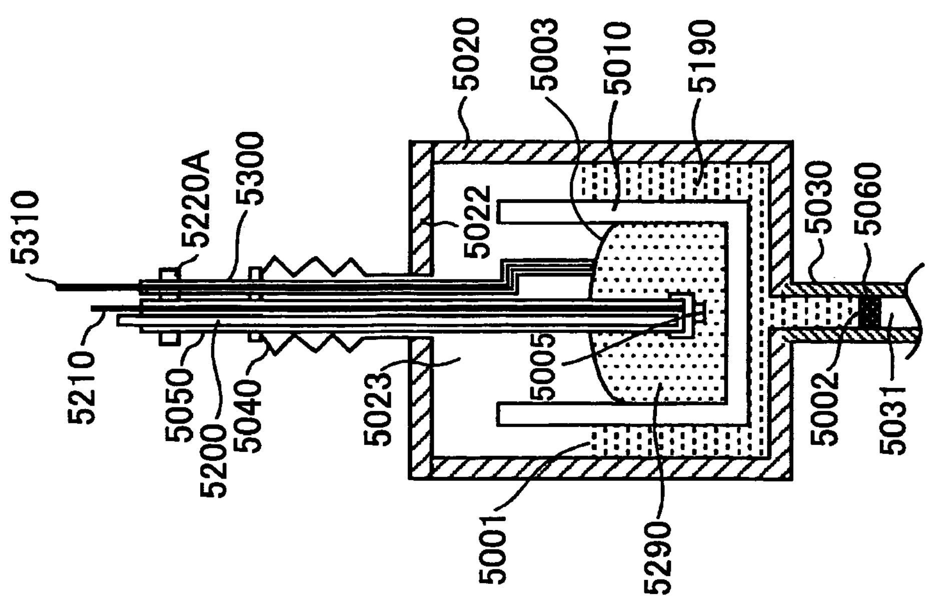
Figure 143:
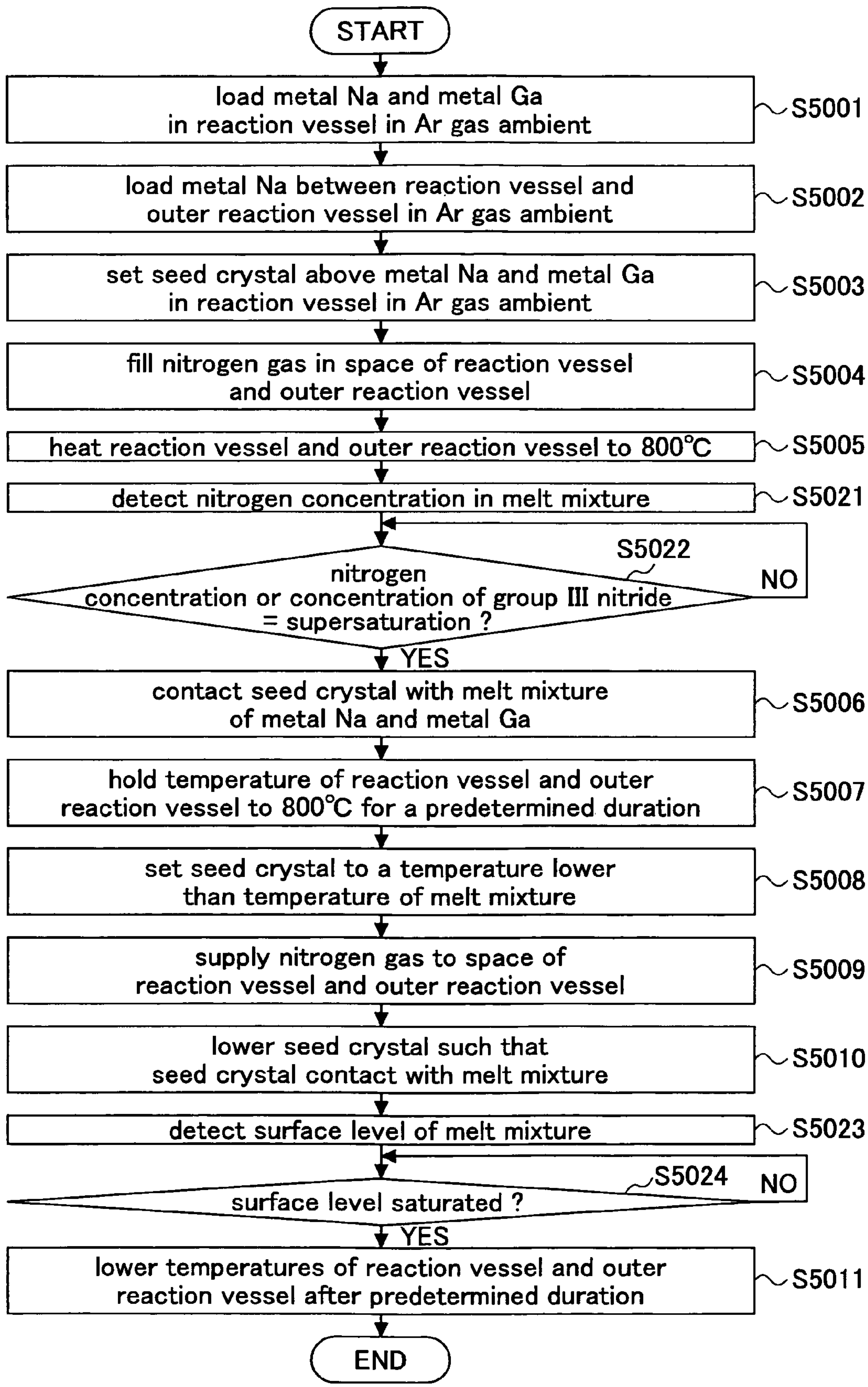
Figure 144:
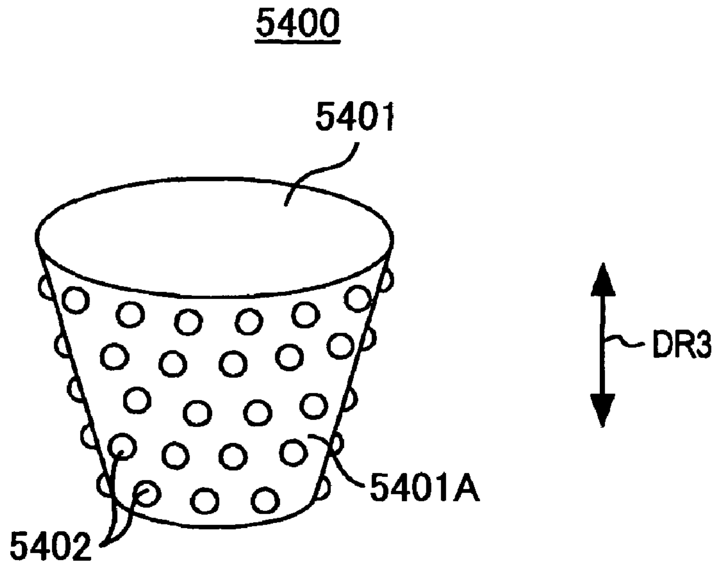
Figure 145:
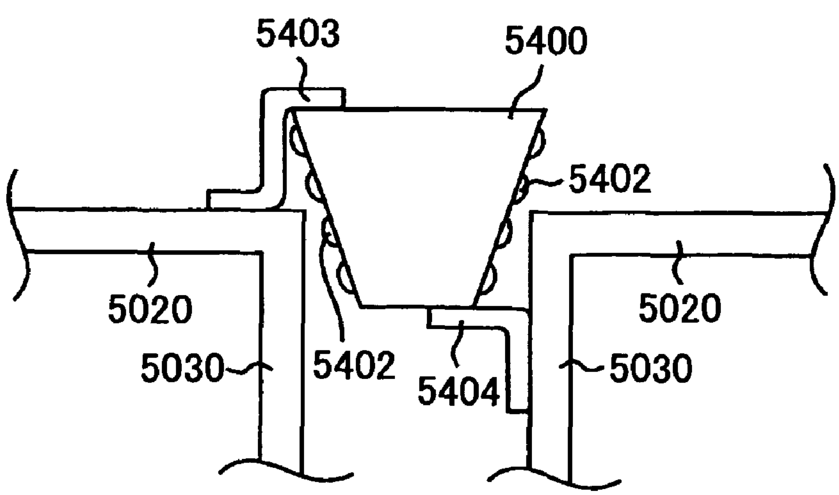
Figure 146A:
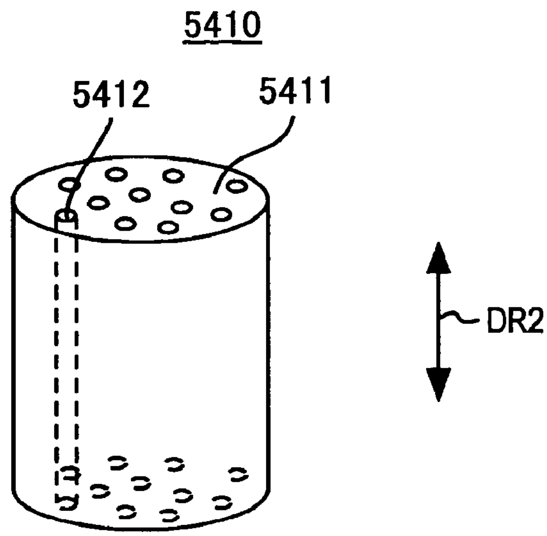
Figure 146B:
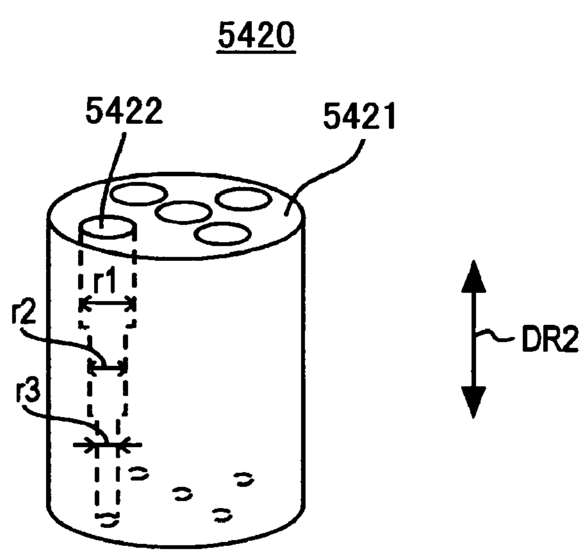

FIG. 132 is a schematic cross-sectional diagram showing the construction of a crystal growth apparatus according to Embodiment 20 of the present invention;

FIG. 133 is a flowchart explaining the manufacturing method of a GaN crystal according to Embodiment 20 of the present invention;

FIG. 134 is a schematic cross-sectional diagram showing the construction of a crystal growth apparatus according to Embodiment 21 of the present invention;

FIG. 135 is a flowchart explaining the manufacturing method of a GaN crystal according to Embodiment 21 of the present invention;

FIG. 136 is a schematic cross-sectional diagram showing the construction of a crystal growth apparatus according to Embodiment 22 of the present invention;

FIG. 137 is an enlarged diagram showing the construction of the cylindrical member and the thermocouple shown in FIG. 136;

FIG. 138 is a schematic diagram showing the construction of the up/down mechanism shown in FIG. 136;

FIGS. 139A and 139B are diagrams for explaining the method for detecting a nitrogen concentration or concentration of the group III nitride in the melt mixture;

FIG. 140 is a timing chart showing the temperature of the reaction vessel and the outer reaction vessel; the nitrogen concentration or the concentration of the group III nitride in the melt mixture; and the location of the interface of the melt mixture (=melt surface level);

FIGS. 141A and 141B are diagrams showing the state of the seed crystal in the interval from a timing t1 to a timing t5 shown in FIG. 140;

FIGS. 142A and 142B are further diagrams showing the state of the seed crystal in the interval from a timing t1 to a timing t5 shown in FIG. 140;

FIG. 143 is a flowchart explaining the manufacturing method of a GaN crystal according to Embodiment 22 of the present invention;

FIG. 144 is another oblique view diagram of the stopper/inlet plug according to the present invention;

FIG. 145 is a cross-sectional diagram showing the method for mounting the stopper/inlet plug shown in FIG. 144;

FIGS. 146A and 146B are further oblique view diagrams of the stopper/inlet plug according to the present invention.

DETAILED DESCRIPTION OF THE PREFERRED EMBODIMENT

Hereinafter, the present invention will be described for embodiments with reference to the drawings. In the drawings, those parts corresponding to the parts are designated by the same reference numerals and the description thereof will be not repeated.

Embodiment 1

Figure 1:
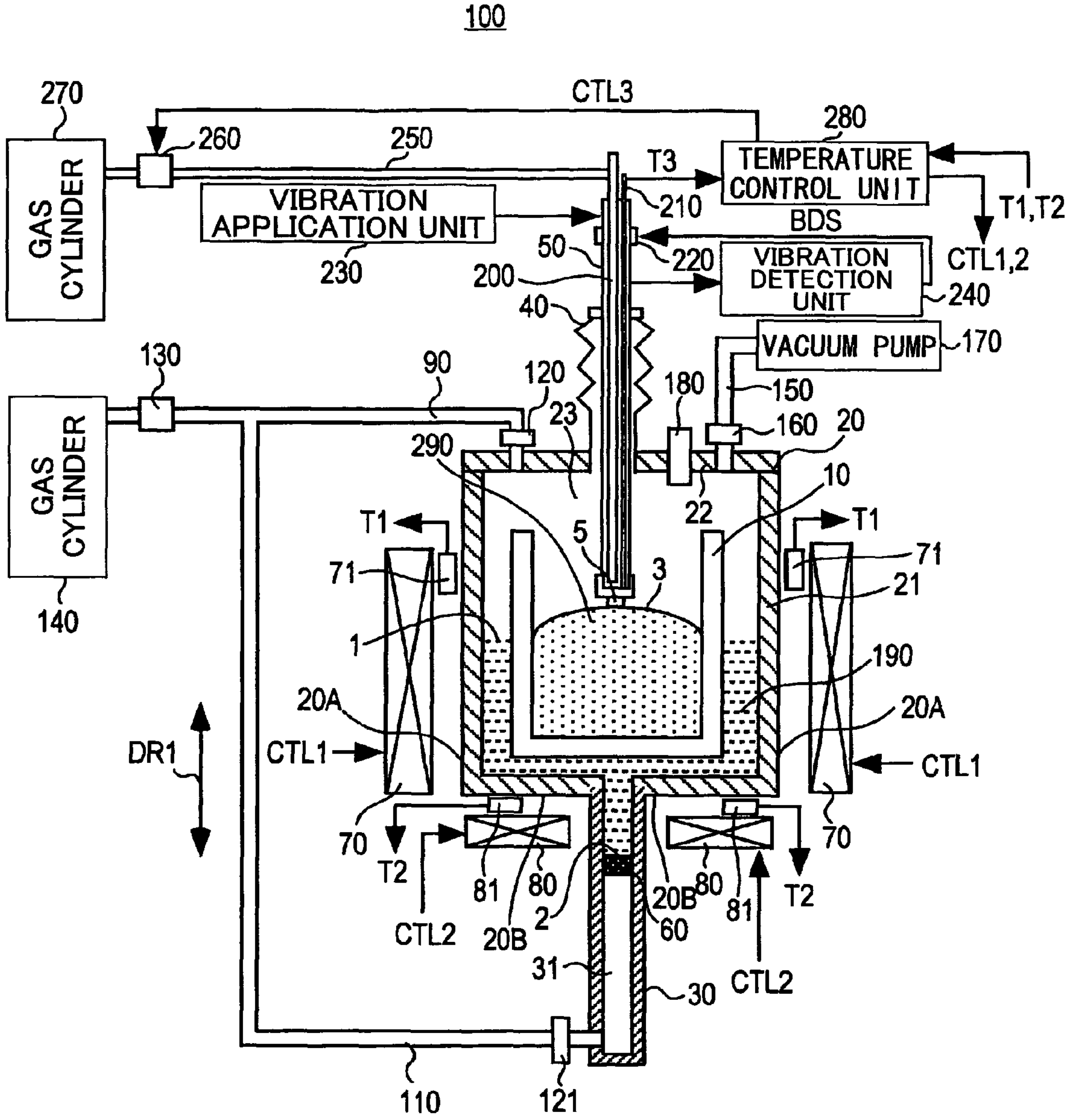
FIG. 1 is a schematic cross-sectional diagram showing the construction of a crystal growth apparatus according to Embodiment 1 of the present invention.

FIG. 1 is a schematic cross-sectional diagram showing the construction of a crystal growth apparatus according to Embodiment 1 of the present invention.

Referring to FIG. 1, a crystal growth apparatus 100 according to Embodiment 1 of the present invention comprises: a crucible 10; a reaction vessel 20; conduits 30 and 200; a bellows 40; a support unit 50; a stopper/inlet plug 60; heating units 70 and 80; temperature sensors 71 and 81; gas supply lines 90, 110, 250, valves 120, 121, 160; a pressure regulator 130; gas cylinders 140 and 270; an evacuation line 150; a vacuum pump 170; a pressure sensor 180; a metal melt 190; a thermocouple 210; an up/down mechanism 220; a vibration applying unit 230; a vibration detection unit 240; a flow meter 260; and a temperature control unit 280.

The crucible 10 has a generally cylindrical form and is formed of boron nitride (BN). The reaction vessel 20 is disposed around the crucible with a predetermined separation from the crucible 10. Further, the reaction vessel 20 is formed of a main part 21 and a lid 22. Each of the main part 21 and the lid 22 is formed of SUS316L stainless steel, wherein a metal seal ring is provided between the main part 21 and the lid 22 for sealing. Thus, there occurs no leakage of a melt mixture 290 to be described later to the outside.

The conduit 30 is connected to the reaction vessel 20 at the underside of the crucible 10 in terms of a gravitational direction DR1. The bellows 40 is connected to the reaction vessel 10 at the upper side of the crucible 10 in terms of a gravitational direction DR1. The support substrate 50 comprises a hollow cylindrical member and a part thereof is inserted into a space 23 inside the reaction vessel 20 via the bellows 40.

The stopper/inlet plug 60 may be formed of a metal, ceramic, or the like, for example, and is held inside the conduit 30 at a location lower than the connection part of the reaction vessel 20 and the conduit 30.

The heating unit 70 is disposed so as to surround the outer circumferential surface 20A of the reaction vessel 20. On the other hand, the heating unit 80 is disposed so as to face a bottom surface 20B of the reaction vessel 20. The temperature sensors 71 and 81 are disposed in the close proximity of the heating units 70 and 80, respectively.

The gas supply line 90 has an end connected to the reaction vessel 20 via the valve 120 and the other end connected to the gas cylinder 140 via the pressure regulator 130. The gas supply line 110 has an end connected to the conduit 30 via the valve 121 and the other end connected to the gas supply line 90.

The valve 120 is connected to the gas supply line 90 in the vicinity of the reaction vessel 20. The valve 121 is connected to the gas supply line 110 in the vicinity of the conduit 30. The pressure regulator 130 is connected to the gas supply line 90 in the vicinity of the gas cylinder 140. The gas cylinder 140 is connected to the gas supply line 90.

The evacuation line 150 has an end connected to the reaction vessel 20 via the valve 160 and the other end connected to the vacuum pump 170. The valve 160 is connected to the evacuation line 150 in the vicinity of the reaction vessel 20. The vacuum pump 170 is connected to the evacuation line 150.

The pressure sensor 180 is mounted to the reaction vessel 20. The metal melt 190 comprises a melt of metal sodium (metal Na) and is held between the crucible 10 and the reaction vessel 20 and inside the conduit 30.

The conduit 200 and the thermocouple 210 are inserted into the interior of the support unit 50. The up/down mechanism 220 is mounted upon the support unit 50 at the location above the bellows 40. The gas supply line 250 has an end connected to the conduit 200 and the other end connected to the gas cylinder 270 via the flow meter 260. The flow meter 260 is connected to the gas supply line 250 in the vicinity of the gas cylinder 270. The gas cylinder 270 is connected to the gas supply line 250.

The crucible 10 holds the melt mixture 290 containing metal Na and metal gallium (metal Ga). The reaction vessel 20 surrounds the crucible 10. The conduit 30 leads the nitrogen gas (N2 gas) supplied from the gas cylinder 140 via the gas supply lines 90 and 110 to the stopper/inlet plug 60.

The bellows 40 holds the support unit 50 and disconnects the interior of the reaction vessel 20 from outside. Further, the bellows 40 is capable of expanding and contracting in the gravitational direction DR1 with movement of the support unit 50 in the gravitational direction DR1. The support unit 50 supports a seed crystal 5 of a GaN crystal at a first end thereof inserted into the reaction vessel 20.

The stopper/inlet plug 60 has a dimple structure on the outer peripheral surface such that there are formed apertures of the size of several ten microns between the inner wall of the conduit 30 and the stopper/inlet plug 60. Thus, the stopper/inlet plug 60 allows the nitrogen gas in the conduit 30 to pass in the direction to the metal melt 190 and supplies the nitrogen gas to the space 23 via the metal melt 190. Further, the stopper/inlet plug 60 holds the metal melt 190 between the crucible 10 and the reaction vessel 20 and further inside the conduit 30 by the surface tension caused by the apertures of the size of several ten microns.

The heating unit 70 comprises a heater and a current source. Thus, the heating unit 70 supplies, in response to a control signal CTL1 from the temperature control unit 280, a current from the current source to the heater and heats the crucible 10 and the reaction vessel 20 to a crystal growth temperature from the outer peripheral surface 20A of the reaction vessel 20. The temperature sensor 71 detects a temperature of the heater of the heating unit 70 and outputs a detected temperature signal indicative of the detected temperature T1 to the temperature control unit 280.

The heating unit 80 also comprises a heater and a current source. Thus, the heating unit 80 supplies, in response to a control signal CTL2 from the temperature control unit 280, a current from the current source to the heater and heats the crucible 10 and the reaction vessel 20 to a crystal growth temperature from the bottom surface 20B of the reaction vessel 20. The temperature sensor 81 detects a temperature T2 of the heater of the heating unit 80 and outputs a temperature signal indicative of the detected temperature T2 to the temperature control unit 280.

The gas supply line 90 supplies the nitrogen gas supplied from the gas cylinder 140 via the pressure regulator 130 to the interior of the reaction vessel 20 via the valve 120. The gas supply line 110 supplies the nitrogen gas supplied from the gas cylinder 140 via the pressure regulator 130 to the interior of the conduit 30 via the valve 121.

The valve 120 supplies the nitrogen gas inside the gas supply line 90 to the interior of the reaction vessel 20 or interrupts the supply of the nitrogen gas to the interior of the reaction vessel 20. The valve 121 supplies the nitrogen gas inside the gas supply line 110 to the conduit 30 or interrupts the supply of the nitrogen gas to the conduit 30. The pressure regulator 130 supplies the nitrogen gas from the gas cylinder 140 to the gas supply lines 90 and 110 after setting the pressure to a predetermined pressure.

The gas cylinder 140 holds the nitrogen gas. The evacuation line 150 passes the gas inside the reaction vessel 20 to the vacuum pump 170. The valve 160 connects the interior of the reaction vessel 20 and the evacuation line 150 spatially or disconnects the interior of the reaction vessel 20 and the evacuation line 150 spatially. The vacuum pump 170 evacuates the interior of the reaction vessel 20 via the evacuation line 150 and the valve 160.

The pressure sensor 180 detects the pressure inside the reaction vessel 20. The metal melt 190 supplies the nitrogen gas introduced through the stopper/inlet plug 60 into the space 23.

The conduit 200 cools the seed crystal 5 by releasing the nitrogen gas supplied from the gas supply line 250 into the support unit 50 from the first end thereof. The thermocouple 210 detects a temperature T3 of the seed crystal 5 and outputs a temperature signal indicative of the detected temperature T3 to the temperature control unit 280.

The up/down mechanism 220 causes the support unit 50 to move up or down in response to a vibration detection signal BDS from the vibration detection unit 240 according to a method to be explained later, such that the seed crystal 5 makes a contact with a vapor-liquid interface 3 between the space 23 and the melt mixture 290.

The vibration application unit 230 comprises a piezoelectric element, for example, and applies a vibration of predetermined frequency to the support unit 50. The vibration detection unit 240 comprises an acceleration pickup, for example, and detects the vibration of the support unit 50 and outputs the vibration detection signal BDS indicative of the vibration of the support unit 50 to the up/down mechanism 220.

The gas supply line 250 supplies a nitrogen gas supplied from the gas cylinder 270 via the flow meter 260 to the conduit 200. The flow meter 260 supplies the nitrogen gas supplied from the gas cylinder 270 to the gas supply line 250 with flow rate adjustment in response to a control signal CTL3 from the temperature control unit 280. The gas cylinder 270 holds the nitrogen gas.

Figure 2:
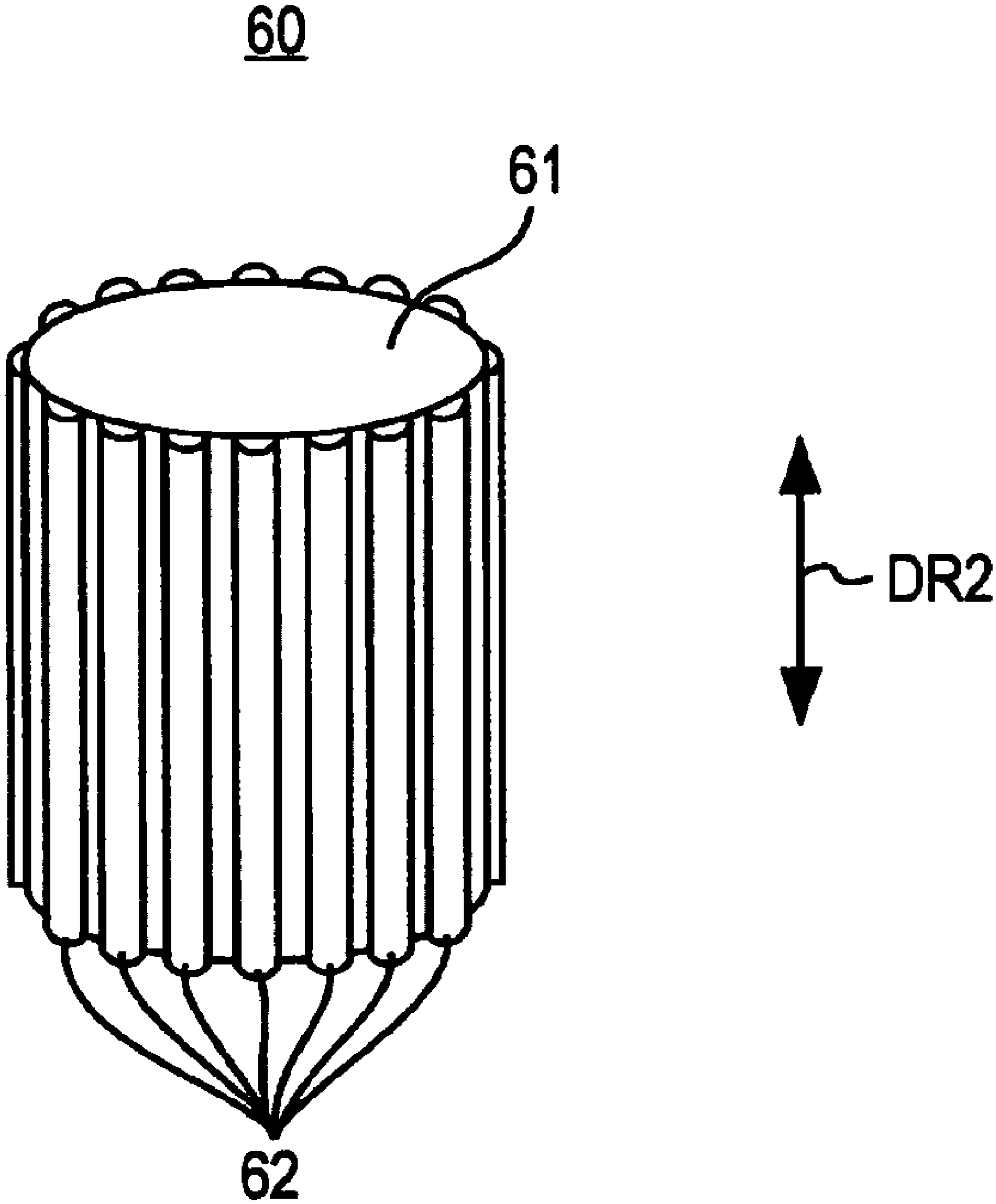
FIG. 2 is an oblique view diagram showing the construction of the stopper/inlet plug shown in FIG. 1.

FIG. 2 is an oblique view diagram showing the construction of the stopper/inlet plug 60 shown in FIG. 1.

Referring to FIG. 2, the stopper/inlet plug 60 includes a plug 61 and projections 62. The plug 61 has a generally cylindrical form. The projection 62 has a generally semi-circular cross-sectional shape and the projections 62 are formed on the outer peripheral surface of the plug 61 so as to extend in a length direction DR2.

Figure 3:
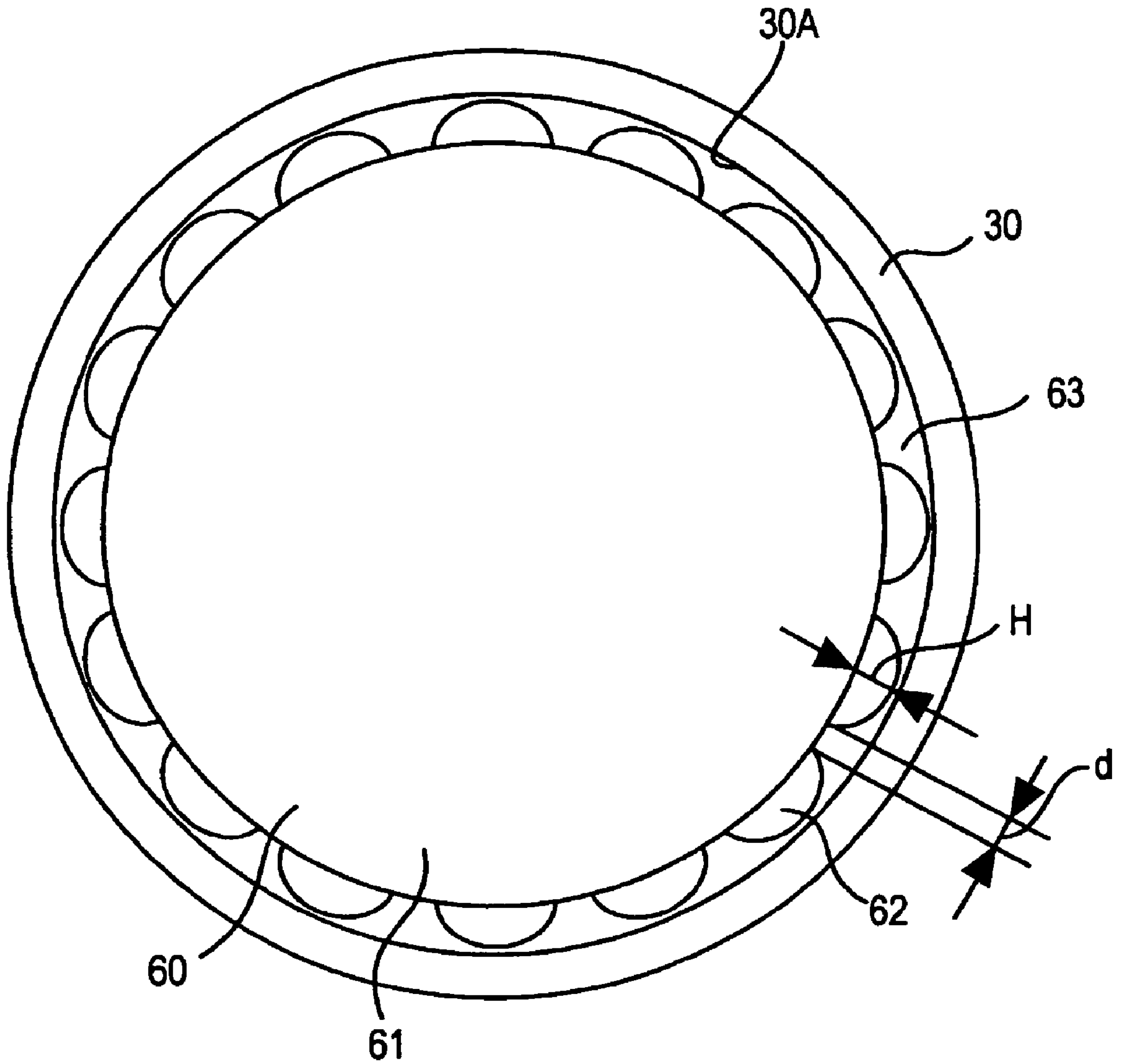
FIG. 3 is a plan view diagram showing the state of mounting the stopper/inlet plug to a conduit.

FIG. 3 is a plan view diagram showing the state of mounting the stopper/inlet plug 60 to the conduit 30.

Referring to FIG. 3, the projections 62 are formed with plural number in the circumferential direction of the plug 61 with an interval d of several ten microns. Further, each projection 62 has a height H of several ten microns. The plural projections 62 of the stopper/inlet plug 60 make a contact with the inner wall surface 30A of the conduit 30. With this, the stopper/inlet plug 60 is in engagement with the inner wall of the conduit 30.

Because the projections 62 have a height H of several ten microns and are formed on the outer peripheral surface of the plug 61 with the interval d of several ten microns, there are formed plural gaps 63 between the stopper/inlet plug 60 and the inner wall 30A of the conduit. 30 with a diameter of several ten microns in the state the stopper/inlet plug 60 is in engagement with the inner wall 30A of the conduit 30.

This gap 63 allows the nitrogen gas to pass in the length direction DR2 of the plug 61 and holds the metal melt 190 at the same time by the surface tension of the metal melt 190, and thus, the metal melt 190 is blocked from passing through the gap in the longitudinal direction DR2 of the plug 61.

Figure 4A:
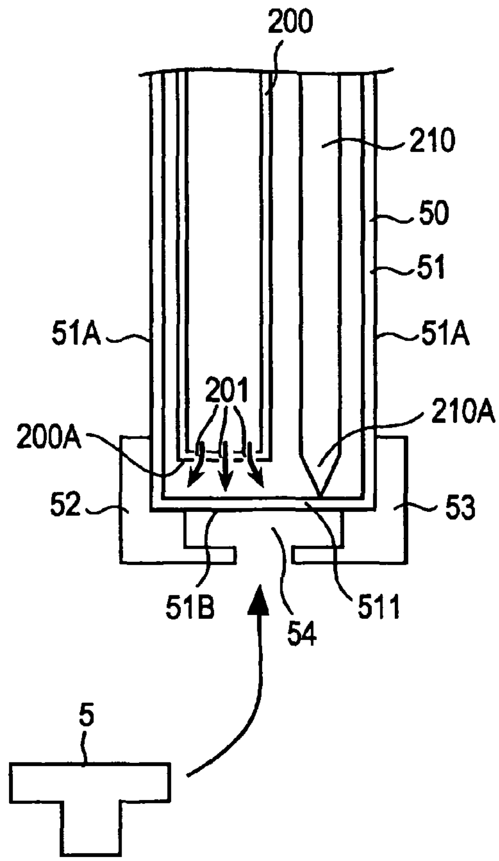
FIGS. 4A and 4B are enlarged diagrams showing the construction of the support unit, conduit and the thermocouple shown in FIG. 1.
Figure 4B:
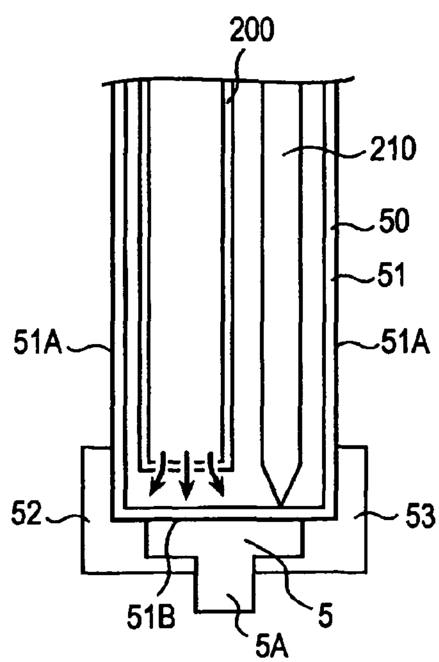

FIGS. 4A and 4B are enlarged diagrams of the support unit 50, the conduit 200 and the thermocouple 210 shown in FIG. 1.

Referring to FIGS. 4A and 4B, the support unit 50 includes a cylindrical member 51 and fixing members 52 and 53. The cylindrical member 51 has a generally circular cross-sectional form. The fixing member 52 has a generally L-shaped cross-sectional form and is fixed upon an outer peripheral surface 51A and a bottom surface 51B of the cylindrical member 51 at the side of a first end 511 of the cylindrical member 51. Further, the fixing member 53 has a generally L-shaped cross-sectional form and is fixed upon the outer peripheral surface 51A and the bottom surface 51B of the cylindrical member 51 at the side of a first end 511 of the cylindrical member 51 in symmetry with the fixing member 52. As a result, there is formed a space part 54 in the region surrounded by the cylindrical member 51 and the fixing members 52 and 53.

The conduit 200 has a generally circular cross-sectional form and is disposed inside the cylindrical member 51. In this case, the bottom surface 200A of the conduit 200 is disposed so as to face the bottom surface 51B of the cylindrical member 51. Further, plural apertures 201 are formed on the bottom surface 200A of the conduit 200. Thus, the nitrogen gas supplied to the conduit 200 hits the bottom surface 51B of the cylindrical member 51 via the plural apertures 201.

The thermocouple 210 is disposed inside the cylindrical member 51 such that a first end 210A thereof is adjacent to the bottom surface 51B of the cylindrical member 51. Reference should be made to FIG. 4A.

Further, the seed crystal 5 has a shape that fits the space 54 and is held by the support unit 50 by being fitted into the space 54. In the present case, the seed crystal 5 makes a contact with the bottom surface 51B of the cylindrical member 51. Reference should be made to FIG. 4B.

Thus, a high thermal conductivity is secured between the seed crystal 5 and the cylindrical member 51. As a result, it becomes possible to detect the temperature T3 of the seed crystal 5 by the thermocouple 210 and it becomes also possible to cool the seed crystal 5 easily by the nitrogen gas directed to the bottom surface 51B of the cylindrical member 51 from the conduit 200.

Figure 5:
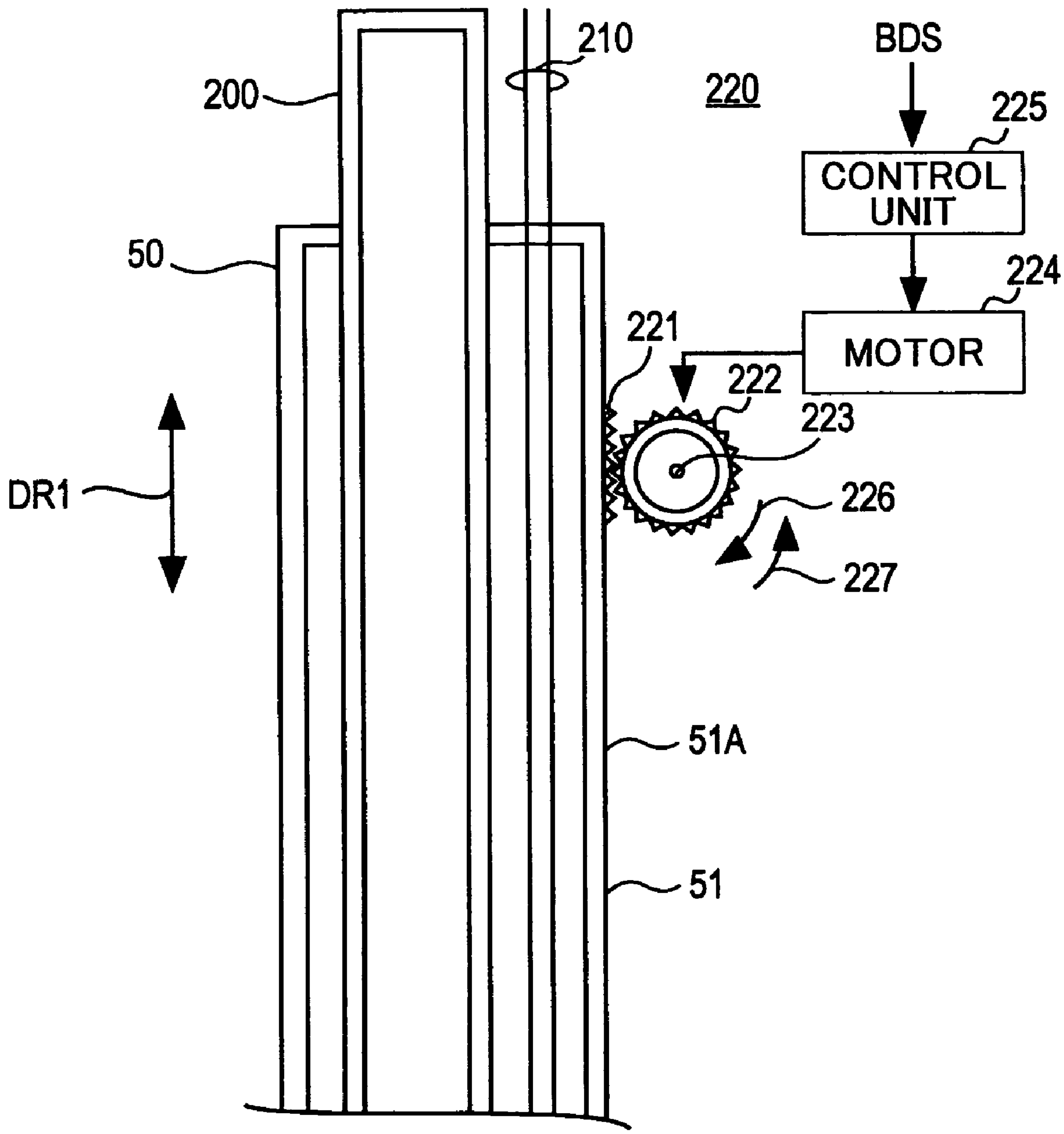
FIG. 5 is a schematic diagram showing the construction of the up/down mechanism shown in FIG. 1.

FIG. 5 is a schematic diagram showing the construction of the up/down mechanism 220 shown in FIG. 1.

Referring to FIG. 5, the up/down mechanism 220 comprises a toothed member 221, a gear 222, a shaft member 223, a motor 224 and a control unit 225.

The toothed member 221 has a generally triangular cross-sectional shape and is fixed upon the outer peripheral surface 51A of the cylindrical member 51. The gear 222 is fixed upon an end of the shaft member 223 and meshes with the toothed member 221. The shaft member 223 has the foregoing end connected to the gear 222 and the other end connected to a shaft (not shown) of the motor 224.

The motor 224 causes the gear 222 to rotate in the direction of an arrow 226 or an arrow 227 in response to control from the control unit 225. The control unit 225 controls the motor 224 based on the vibration detection signal BDS from the vibration detection unit 240 and causes the gear 222 to rotate in the direction of the arrow 226 or 227.

When the gear 222 is rotated in the direction of the arrow 226, the support unit 50 moves in the upward direction in terms of the gravitational direction DR1, while when the gear 222 is rotated in the direction of the arrow 227, the support unit 50 is moved downward in terms of the gravitational direction DR1.

Thus, rotation of the gear 222 in the direction of the arrow 226 or 227 corresponds to a movement of the support unit 50 up or down in terms of the gravitational direction DR1.

Figure 6:
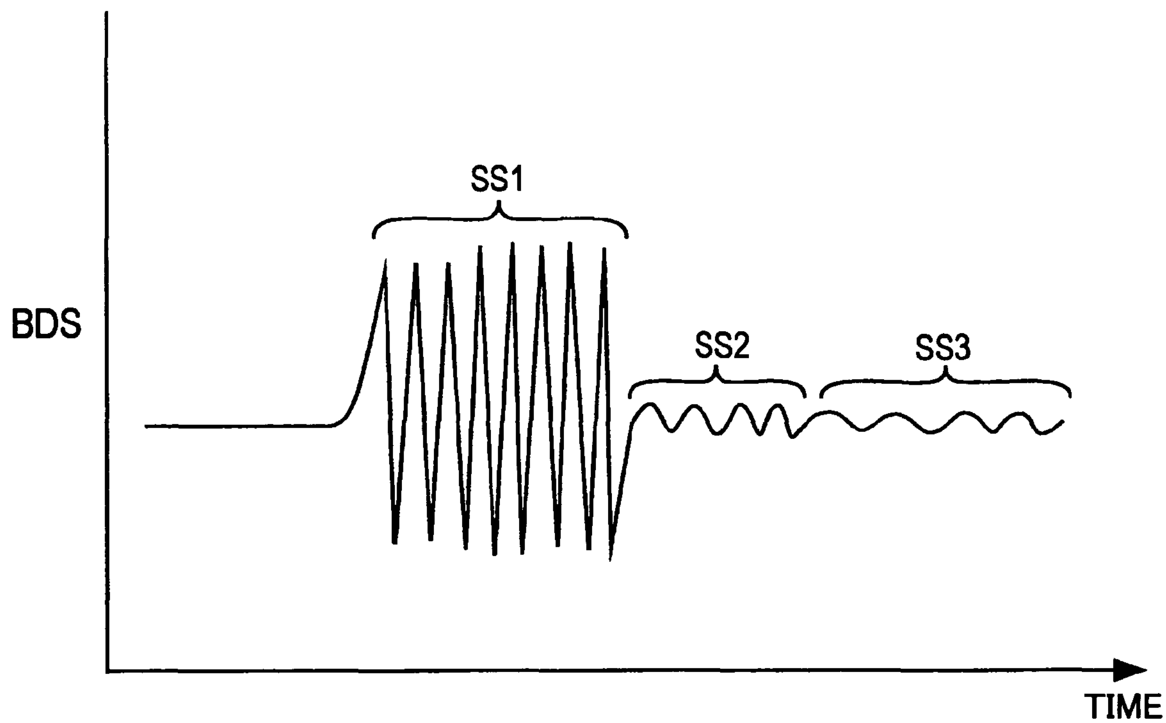
FIG. 6 is a timing chart showing the waveform of a vibration detection signal.

FIG. 6 is a timing chart of the vibration detection signal BDS.

Referring to FIG. 6, the vibration detection signal BDS detected by the vibration detection unit 240 comprises a signal component SS1 in the case the seed crystal 5 is not in contact with the melt mixture 290, while in the case the seed crystal 5 is in contact with the melt mixture 290, the vibration detection signal BDS is formed of a signal component SS2. Further, in the case the seed crystal 5 is dipped into the melt mixture 290, the vibration detection signal BDS is formed of a signal component SS3.

In the event the seed crystal 5 is not in contact with the melt mixture 290, the seed crystal 5 is vibrated vigorously by the the vibration applied by the vibration application unit 230 and the vibration detection signal BDS is formed of the signal component SS1 of relatively large amplitude. When the seed crystal 5 is in contact with the melt mixture 290, the seed crystal 5 cannot vibration vigorously even when the vibration is applied from the vibration application unit 230 because of viscosity of the melt mixture 290, and thus, the vibration detection signal BDS is formed of the signal component SS2 of relatively small amplitude. Further, when the seed crystal 5 is dipped into the melt mixture 290, vibration of the seed crystal 5 becomes more difficult because of the viscosity of the melt mixture 290, and the vibration detection signal BDS is formed of the signal component SS3 of further smaller amplitude than the signal component SS2.

Referring to FIG. 5, again, the control unit 225 detects, upon reception of the vibration detection signal from the vibration detection unit 240, the signal component in the vibration detection signal BDS. Thus, when the detected signal component is the signal component SS1, the control unit 225 controls the motor 224 such that the support unit 50 is lowered in the gravitational direction DR1, until the signal component SS2 is detected for the signal component of the vibration detection signal BDS.

More specifically, the control unit 225 controls the motor 224 such that the gear 222 is rotated in the direction of the arrow 227, and the motor 224 causes the gear 222 to rotate in the direction of the arrow 227 in response to the control from the control unit 225 via the shaft member 223. With this, the support member 50 moves in the downward direction in terms of the gravitational direction.

Further, the control unit 225 controls the motor 224 such that the rotation of the gear 222 is stopped when the signal component of the vibration detection signal BDS received from the vibration detection unit 240 has changed from the signal component SS1 to the signal component SS2, and the motor stops the rotation of the gear 222 in response to the control from the control unit 225. With this, the support unit 50 stops the movement thereof and the seed crystal 5 is held at the vapor-liquid interface 3.

On the other hand, the control Unit 225 controls the motor 224, when received the vibration detection signal BDS formed of the signal component SS2 from the vibration detection unit 240, such that the movement of the support unit 50 is stopped. In this case, the seed crystal 5 is already in contact with the melt mixture 290.

Thus, the up/down mechanism 220 moves the support unit 50 in the gravitational direction DR1 based on the vibration detection signal BDS detected by the vibration detection unit 240, such that the seed crystal 5 is in contact with the melt mixture 290.

Figure 7:
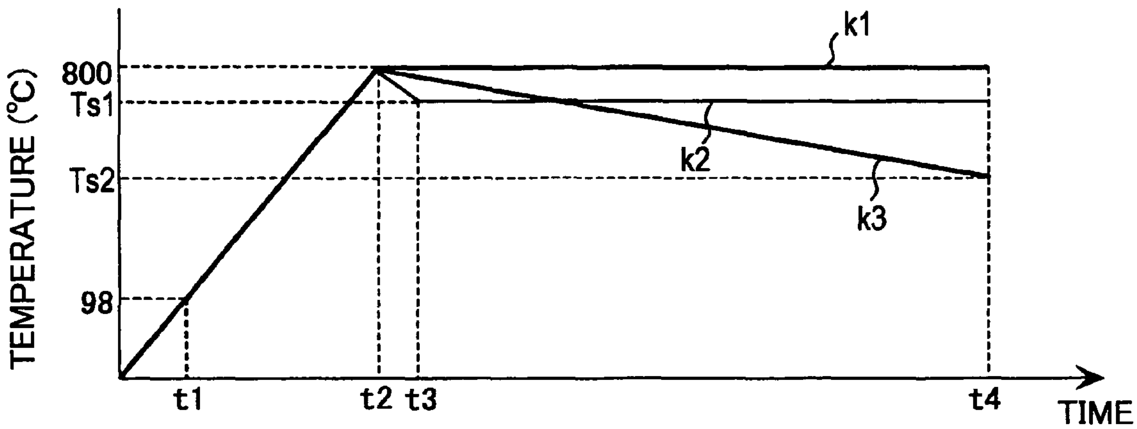
FIG. 7 is a timing chart showing the temperature of the reaction vessel and the outer reaction vessel.
Figure 8:
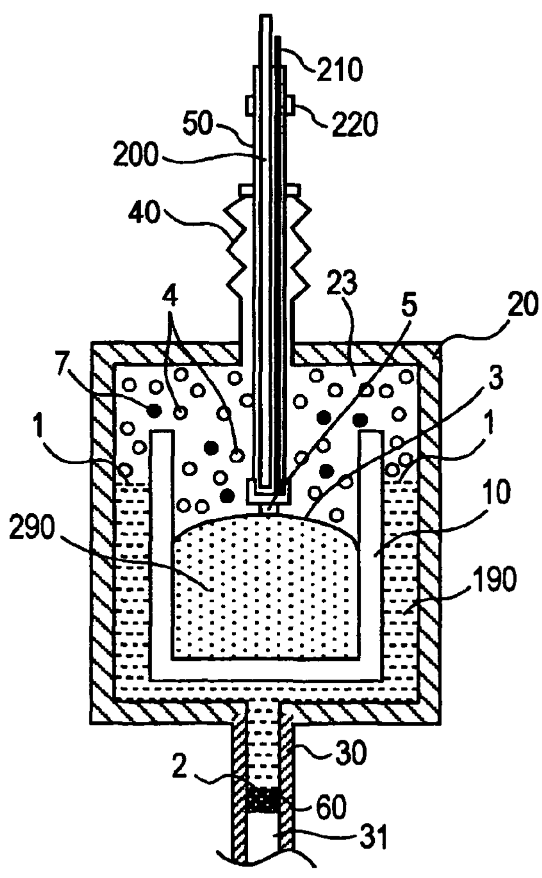
FIG. 8 is a schematic diagram showing the state inside the reaction vessel and the outer reaction vessel during the interval between two timings t1 and t2 shown in FIG. 7.
Figure 9:
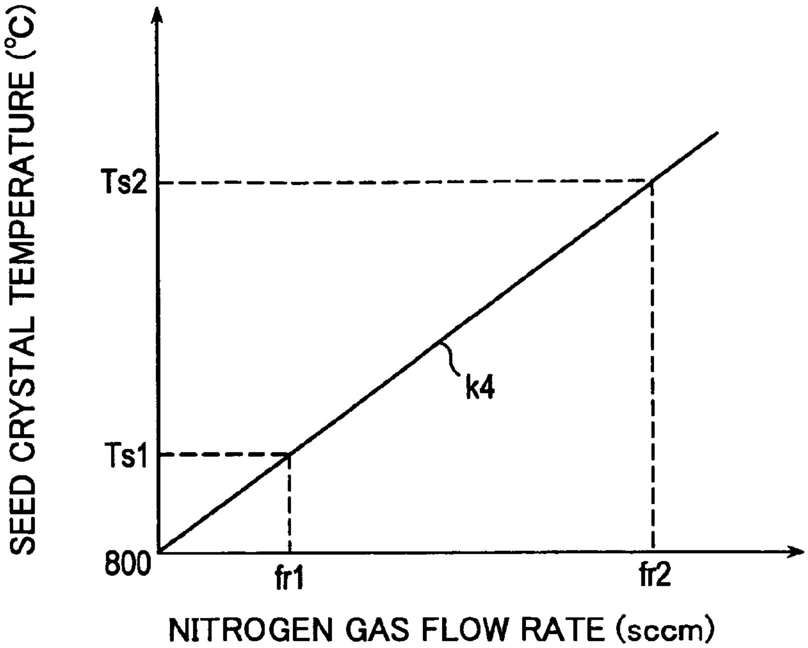
FIG. 9 is a diagram showing the relationship between the temperature of the seed crystal and the flow rate of the nitrogen gas.

FIG. 7 is a timing chart showing the temperature of the crucible 10 and the reaction vessel 20. Further, FIG. 8 is a schematic diagram showing the state inside the crucible 10 and the reaction vessel 20 during the interval between two timings t1 and t2 shown in FIG. 7. Further, FIG. 9 is a diagram showing the relationship between the temperature of the seed crystal 5 and the flow rate of the nitrogen gas.

In FIG. 7, it should be noted that the line k1 represents the temperatures of the crucible 10 and the reaction vessel 20 while the curve k2 and the line k3 represent the temperature of the seed crystal 5.

Referring to FIG. 7, the heating units 79 and 80 heat the crucible 10 and the reaction vessel 20 such that the temperatures thereof rise along the line k1 and is held at 800° C. When the heating units 70 and 80 start to heat the crucible 10 and the reaction vessel 20, the temperatures of the crucible 10 and the reaction vessel 20 start to rise and reach a temperature of 98° C. at the timing t1 and a temperate of 800° C. at the timing t2.

Thus, the metal Na held between the crucible 10 and the reaction vessel 20 undergoes melting, and the metal melt 190 (=melt of metal Na) is formed. Further, the metal Na and the metal Ga held in the crucible 10 also cause melting and the melt mixture 290 is formed. Further, with increase of the temperatures of the crucible 10 and the reaction vessel 20, there is caused evaporation of metal Na from the metal melt 190 and the melt mixture 290 to the space 23. As a result, the nitrogen gas 4 and the metal Na vapor 7 are mixed in the space 23, while it should be noted that the nitrogen gas 4 and the metal Na vapor 7 cannot escape to the space 31 inside the conduit 30 by way of diffusion through the metal melt 190 (=metal Na melt) and the stopper/inlet plug 60 and are confined in the space 23. Reference should be made to FIG. 8.

Further, during the interval from the timing t1 in which the temperatures of the crucible 10 and the reaction vessel 20 have reached 98° C. to the timing t2 in which the temperatures of the crucible 10 and the reaction vessel 20 have reached 800° C., it should be noted that the up/down mechanism 220 moves the support unit 50 up or down according to the method explained above in response to the vibration detection signal BDS from the vibration detection unit 240 and maintains the seed crystal 5 in contact with the melt mixture 290.

When the temperatures of the crucible 10 and the reaction vessel 20 have reached 800° C., the nitrogen gas 4 in the space 23 is incorporated into the melt mixture 290 via the meditating metal Na. In this case, it should be noted that the concentration of nitrogen or GaxNy (x, y are real numbers) in the melt mixture 290 takes the maximum value in the vicinity of the vapor-liquid interface 3 between the space 23 and the melt mixture 290, and thus, growth of the GaN crystal starts from the seed crystal 5 in contact with the vapor-liquid interface 3. Hereinafter, GaxNy will be designated as "group III nitride" and the concentration of GaxNy will be designated as "concentration of group III nitride". Further, in the present invention, it should be noted that "group III" means "group IIIB" as defined in a periodic table of IUPAC (International Union of Pure and Applied Chemistry).

In the case the nitrogen gas is not supplied to the conduit 200, the temperature T3 of the seed crystal 5 is 800° C. and equal to the temperature of the melt mixture 290, while in the present embodiment, the seed crystal 5 is cooled by supplying a nitrogen gas to the inside of the conduit 200 for increasing the degree of supersaturation of nitrogen in the melt mixture 290 in the vicinity of the seed crystal 5. Thus, the temperature T3 of the seed crystal 5 is set lower than the temperature of the melt mixture 290.

More specifically, the temperature T3 of the seed crystal 5 is set to a temperature Ts1 lower than 800° C. along the curve k2 after the timing t2. This temperature Ts1 may be a temperature of 790° C. Next, the method of setting the temperature T3 of the seed crystal 5 to the temperature Ts1 will be explained.

When the temperatures T1, T2 and T3 as measured by the temperature sensors 71 and 81 and the thermocouple 210 have reached 800° C., the temperature control unit 280 produces a control signal CTL3 for causing to flow a nitrogen gas with an amount such that the temperature T3 of the seed crystal 5 is set to the temperature Ts1, and supplies the control signal CTL3 to the flow meter 260.

With this, the flow meter causes to flow a nitrogen gas from the gas cylinder to the conduit 200 via the gas supply line 250 in response to the control signal CTL3 with a flow rate that sets the temperature T3 to the temperature Ts1. Thus, the temperature of the seed crystal 5 is lowered from 800° C. generally in proportion to the flow rate of the nitrogen gas, and the temperature T3 of the seed crystal 5 is set to the temperature Ts1 when the flow rate of the nitrogen gas has reaches a flow rate value fr1 (sccm). Reference should be made to FIG. 9.

Thus, the flow meter 260 causes the nitrogen gas to the conduit 200 with the flow rate value fr1. The nitrogen gas thus supplied to the conduit 200 hits the bottom surface 51B of the cylindrical member 51 via the plural apertures 201 of the conduit 200.

With this, the seed crystal 5 is cooled via the bottom surface 51B of the cylindrical member 51 and the temperature T3 of the seed crystal 5 is lowered to the temperature Ts1 with the timing t3. Thereafter, the seed crystal 5 is held at the temperature Ts1 until a timing t4.

Because the heater temperatures T1 and T2 of the heating units 70 and 80 have a predetermined temperature difference to the temperatures of the crucible 10 and the reaction vessel 20, the temperature control unit 280 controls the heating units 70 and 80, when the temperature T3 of the seed crystal 5 starts to go down from 800° C., by using the control signals CTL1 and CTL2 such that the temperatures T1 and T2 as measured by the temperature sensors 71 and 81 become the temperatures in which the crucible 10 and the reaction vessel 20 are set to 800° C.

Preferably, the temperature T3 of the seed crystal 5 is controlled, after the timing t2, such that the temperature is lowered along the line k3. Thus, the temperature T3 of the seed crystal 5 is lowered from 800° C. to the temperature Ts2 (<Ts1) during the interval from the timing t2 to the timing t4. In this case, the flow meter 260 increases the flow rate of the nitrogen gas supplied to the conduit 200 from 0 to a flow rate value fr2 along a line k4 based on the control signal CTL3 from the temperature control unit 280. When the flow rate of the nitrogen gas has become the flow rate value fr2, the temperature T3 of the seed crystal 5 is set to a temperature Ts2 lower than the temperature Ts1. The temperature Ts2 may be chosen to 750° C.

There are two reasons to increase the difference between the temperature of the melt mixture 290 (=800° C.) and the temperature T3 of the seed crystal 5.

The first reason is that it becomes difficult to set the temperature of the GaN crystal grown from the seed crystal 5 below the temperature of the melt mixture 290 because there occurs adhesion of GaN crystal on the seed crystal 5 with progress of crystal growth of the GaN crystal, unless the unless the temperature of the seed crystal 5 is lowered gradually.

The second reason is that Ga in the melt mixture 290 is consumed with progress of crystal growth of the GaN crystal and there occurs increase of a parameter $\gamma$ defined as $\gamma$=Na/(Na+Ga). Thereby, the nitrogen concentration or the concentration of the group III nitride in the melt mixture 290 becomes lower than a supersaturation concentration. Thus, unless the temperature of the seed crystal 5 is lowered gradually, it becomes difficult to maintain the melt mixture 290 in the supersaturation state with regard to the nitrogen concentration or the concentration of the group III nitride.

Thus, by lowering the temperature of the seed crystal 5 gradually with progress of growth of the GaN crystal, the state of supersaturation is maintained with regard to nitrogen or group III nitride in the melt mixture 290 at least in the vicinity of the seed crystal 5, and it becomes possible to maintain the growth rate of the GaN crystal. As a result, it becomes possible to increase the size of the GaN crystal.

In the case of growing a GaN crystal with the crystal growth apparatus 100, a GaN crystal grown in the crystal growth apparatus 100 without using the seed crystal 5 is used for the seed crystal 5.

Figure 10:
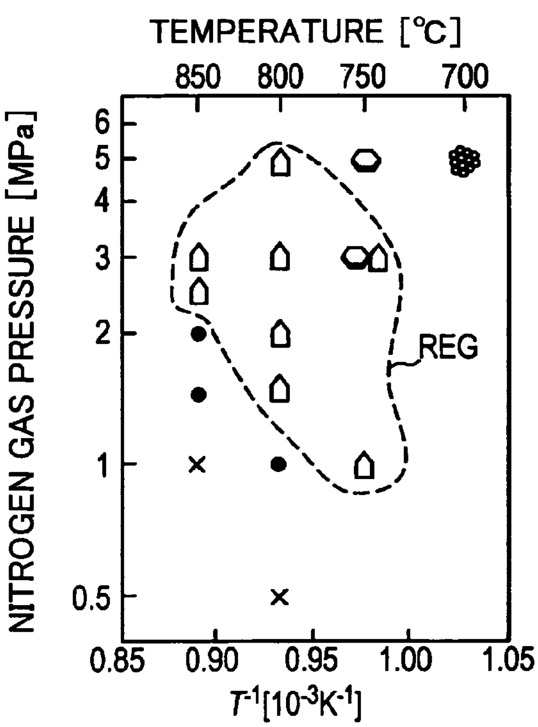
FIG. 10 is a diagram showing the relationship between the nitrogen gas pressure and the crystal growth temperature for the case of growing a GaN crystal.

FIG. 10 is a diagram showing the relationship between the nitrogen gas pressure and the crystal growth temperature for the case of growing a GaN crystal. In FIG. 10, the horizontal axis represents the crystal growth temperature while the vertical axis represents the nitrogen gas pressure. In FIG. 10, it should be noted that a region REG represents a region in which a columnar GaN crystal grown in a c-axis direction (<0001> direction) is obtained at the bottom surface and sidewall surface of the crucible 10 exposed to the melt mixture 290.

Thus, in the case of manufacturing the seed crystal 5, GaN crystals are grown by using the nitrogen gas pressure and crystal growth temperature of the region REG. In this case, numerous nuclei are formed on the bottom surface and sidewall surface of the crucible 10 and columnar GaN crystals grown in the c-axis direction are obtained.

Thus, the seed crystal 5 is formed by slicing out the GaN crystal of the shape shown in FIGS. 4A and 4B from numerous GaN crystals formed as a result of the crystal growth process. Thus, a projecting part 5A of the seed crystal shown in FIG. 4B is formed of a GaN crystal grown in the c-axis direction (<0001> direction).

The seed crystal 5 thus formed is fixed upon the support unit 50 by fitting into the space 54 of the support unit 50.

As explained above, the present invention has the feature of carrying out the growth of the GaN crystal while confining the nitrogen gas 4 and the metal Na vapor 7 in the space 23 of the crucible 10 and the reaction vessel 20 by the stopper/inlet plug 60 and the metal melt 190 (=metal Na melt).

Thus, the present invention has the feature of growing a GaN crystal by suppressing the diffusion of metal Na evaporated from the metal melt 190 and the melt mixture 290 to the outside by using the stopper/inlet plug 60 and the metal melt 190 (=metal Na melt).

Further, in order to maintain this feature during the interval of crystal growth of the GaN crystal, it is necessary that the metal melt 190 (=metal Na melt) is held between the crucible 10 and the reaction vessel 20 during the interval in which the temperatures of the crucible 10 and the reaction vessel 20 are raised to be equal to or higher than the melting temperature of the metal Na.

Thus, entire metal Na loaded between the crucible 10 and the reaction vessel 20 becomes the metal Na vapor 7, while it is necessary to block the metal Na vapor 7 evaporated from the melt mixture 290 from escaping to the outside by diffusion.

Thus, explanation will be made with regard to the amount of the metal Na necessary for the metal Na to exist between the crucible 10 and the reaction vessel 20 in the form of liquid during the interval in which the temperatures of the crucible 10 and the reaction vessel 20 are elevated to the melting temperature of the metal Na or higher.

Figure 11:
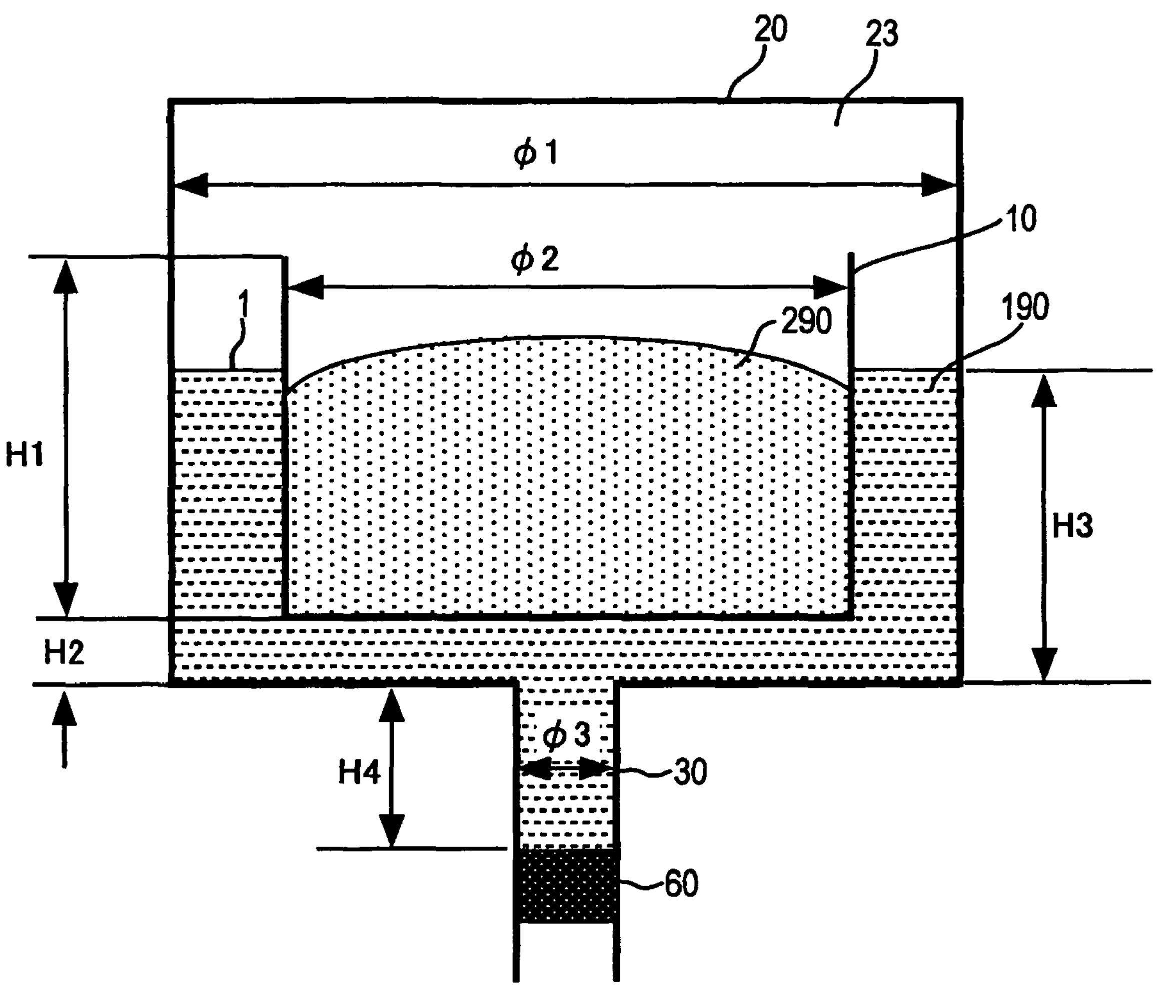
FIG. 11 is a diagram showing calculation of the amount of metal Na located into the crystal growth apparatus shown in FIG. 1 in Embodiment 1.

FIG. 11 is a diagram showing calculation of the amount of metal Na to be loaded into the crystal growth apparatus 100 shown in FIG. 1 in Embodiment 1.

Referring to FIG. 11, the volume V1 of the metal melt 190 held between the crucible 10 and the reaction vessel 20 and in the conduit 30 is represented by the equation below, where it should be noted that the volume of the reaction vessel 20 for the part thereof located underneath the vapor-liquid interface is designated as A; the volume of the crucible 10 is designated as B; and the volume inside the conduit 20 for the part located above the stopper/inlet plug 60 is designated as C.

$$V1=A-B+C \tag{1}$$

Thus, in the case the reaction vessel 20 has an inner diameter $\phi$1 of 11.6 cm, the conduit 30 has an inner diameter $\phi$3 of 0.94 cm, the crucible 10 has a height H1 of 10.0 cm, the metal melt 190 held underneath the crucible 10 has a heihg H2 of 0.5 cm, the metal melt 190 held in the reaction vessel 20 has a height H3 of 8.5 cm, the metal melt 190 held inside the reaction vessel 20 has a height H4 of 20.0 cm, and in the case the crucible 10 is filled with the melt mixture 290 up to 80% of the height H1 of the crucible 10 (=8.0 cm), the volume A becomes 898.3 $cm^3$, the volume B becomes 628.3 $cm^3$ and the volume C becomes 55.5 $cm^3$.

Thus, the volume V1 of the metal melt 190 is given from Equation (1) as V1=898.3−628.3+55.5=325.5 $cm^3$.

On the other hand, the volume V2 of the space 23 inside the reaction vessel 20 becomes V2=5.8×5.8π×6.5=686.9 $cm^3$ when the top edge of the crucible 10 is used for the reference.

Next, the maximum amount of metal Na that can exist in the space 23 in the case the temperature of the space 23 has become 850° C. is obtained.

It should be noted that the vapor pressure P of Na at 850° C. is given as P=0.744 (atm) while the value V2 of the space 23 is given as V=0.6869 (L). Thus, the molar number of Na is obtained as n=0.055 mol by substituting P=0.744 (atm), V=0.6869 (L) the gas constant R=0.08206 atm·L/K·mol and temperature T=850+273.15=1123.15K into PV=nRT.

Next, the molar number of Na occupying the volume of 325.5 $cm^3$ in the liquid state is obtained. Using the value of 0.777 $g/cm^3$ for the density of Na at the temperature of 1000K, the weight of Na having the value of 325.5 $cm^3$ is given as 325.5 $cm^3 \times 0.777$ $g/cm^3$=252.9 g. Thus, in view of the fact that Na has the atomic weight of 23, the molar number of Na occupying the volume of 325.5 $cm^3$ becomes 11 mol.

Therefore, in the case the crucible 10 has an outer diameter φ2 of 10.0 cm, 0.005%(=(0.0055 mol)/11 mol)×100) of the metal Na loaded into the reaction vessel 20 exists in the form of vapor.

From this result, it is concluded that 0.005% of metal Na evaporates to the space 23 in the form of metal Na vapor in the case the metal Na is loaded into the reaction vessel 20 in such a way that the metal melt 190 of 325.5 $cm^3$ is collected between the crucible 10 and the reaction vessel 20 and in the conduit 30. Thus, most of the metal Na loaded into the reaction vessel 20 remains between the crucible 10 and the reaction vessel 20 and inside the conduit 30 in the form of liquid.

The metal Na vapor 7 evaporated into the space 23 from the melt mixture 290 cannot cause diffusion to the outside via the stopper/inlet plug 60 in the case the metal melt 190 (=liquid Na) exists between the space 23 and the stopper/inlet plug 60.

Thus, in order that the metal Na vapor 7 evaporated to the space 23 from the melt mixture 290 does not cause diffusion to the outside, it is sufficient that there exists the relationship below, where M1 stands for the amount of the metal Na loaded into the reaction vessel 20 and M2 stands for the amount of the Na existing in the space 23 in the form of vapor at a temperature equal to or higher then the melting temperature of metal Na.

$$M1>M2 \quad (2)$$

When there holds Equation (2), the metal melt 190 (=liquid Na) exists between the crucible 10 and the reaction vessel 20 and in the conduit 30, and the metal Na vapor evaporated to the space 23 from the melt mixture 290 cannot cause diffusion to the outside.

Strictly speaking, a part of the liquid Na constituting the metal melt 190 solidifies and adheres to the stopper/inlet plug 60. Thus, designating the amount of the Na solidified and adhered to the stopper/inlet plug 60 as M3, the metal Na vapor 7 evaporated to the space 23 from the melt mixture 290 cannot cause diffusion to the outside when the relationship below holds.

$$M1-M2>M3 \quad (3)$$

Figure 12:
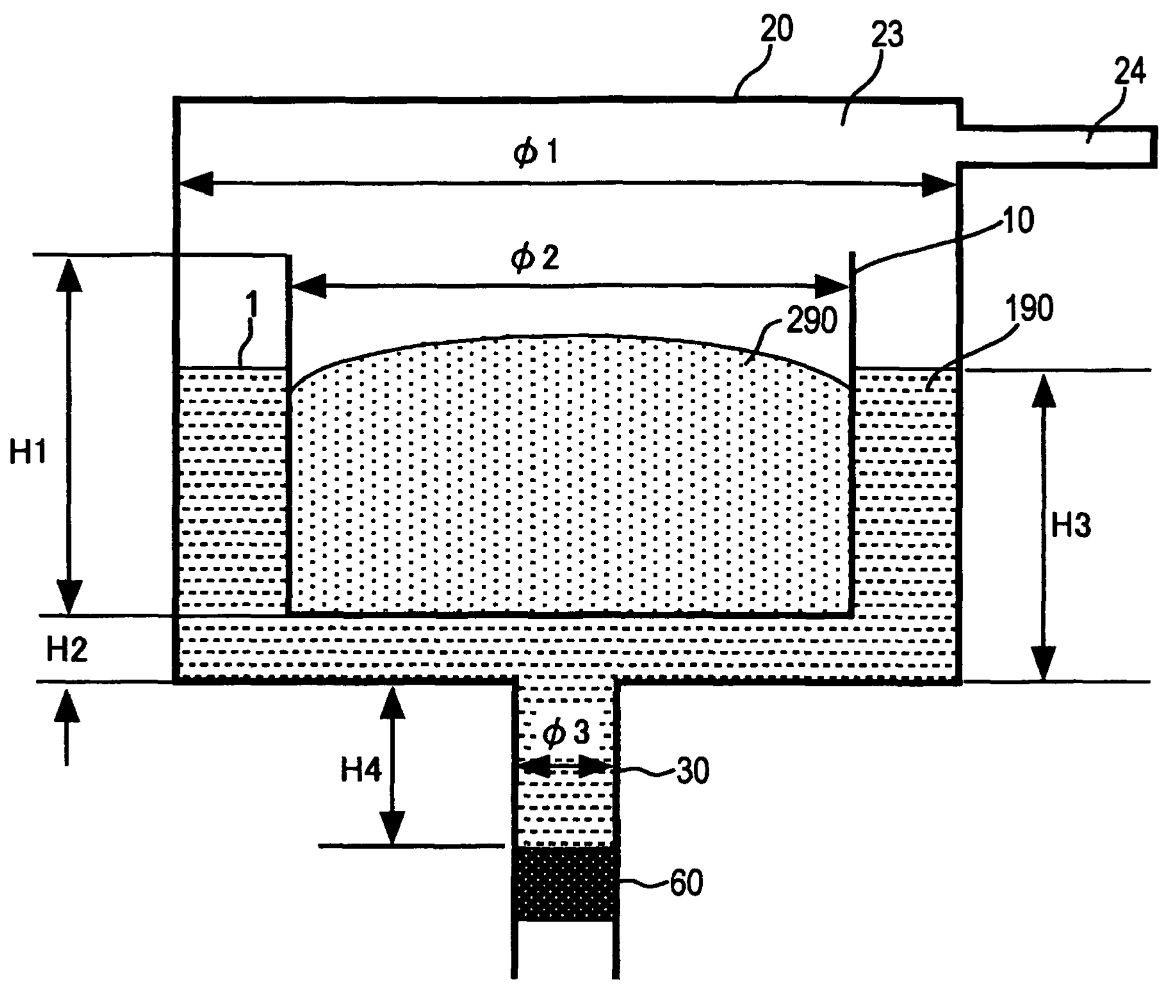
FIG. 12 is another diagram showing calculation of the amount of metal Na located into the crystal growth apparatus shown in FIG. 1 in Embodiment 1.

FIG. 12 is another diagram showing calculation of the amount of the metal Na to be loaded into the crystal growth apparatus 100 shown in FIG. 1 in Embodiment 1.

Referring to FIG. 12, there is a need, when there exists a low temperature region 24 where the metal Na vapor 7 is collected in the form of liquid adjacent to the space 23, to determine the amount of the metal Na to be loaded into the reaction vessel 20 by taking into consideration the volume V3 of the low temperature region 24 in addition to the volume V2 of the space 23.

Thus, the Na evaporated from the metal melt 190 is formed of the Na existing in the space 23 in the form of the metal Na vapor 7 and the Na collected in the low temperature region 24 in the form of liquid. Thus, designating the amount of the Na collected in the low temperature region 24 as M4, the metal Na vapor 7 evaporated from the melt mixture 290 to the space 23 cannot cause diffusion to the outside when the following relationship holds.

$$M1-M2>M4 \quad (4)$$

Further, in the case where there exists the low temperature region 24 and when the amount M3 of the Na solidified and adhered to the stopper/inlet plug 60 is taken into consideration, the metal Na vapor 7 evaporated to the space 23 from the melt mixture 290 cannot escape to the outside when the following relation ship holds.

$$M1-M2-M4>M3 \quad (5)$$

In the case of the crystal growth apparatus, it is a conduit (not shown) for mounting a release valve for lowering the pressure of the bellows 40 or the reaction vessel 20 which forms the low temperature region 24 adjacent to the space 23 Assuming that the bellows 40 has a form of a cylinder having an outer diameter of 2.8 cm and a height of 10 cm, the volume of the bellows 40 becomes 60 $cm^3$. Further, the volume of the conduit for mounting the release valve may be 0.6 $cm^3$ where it is assumed that the conduit has an inner diameter of 0.4 cm and a length of 5 cm.

Thus, the volume of the low temperature region 24 becomes 60+0.6=60.6 $cm^3$, and it is concluded that Na of the amount of 325.5 $cm^3$−60.6 $cm^3$=260 $cm^3$ exists between the crucible 10 and the reaction vessel 20 and in the conduit 30 even in the case the low temperature region 24 exists in the crystal growth apparatus 100.

With the present embodiment, crystal growth of GaN is achieved by loading metal Na into the reaction vessel 20 with the amount M1 having any of the relationships explained above with reference to Equations (2)-(5).

Figure 13:
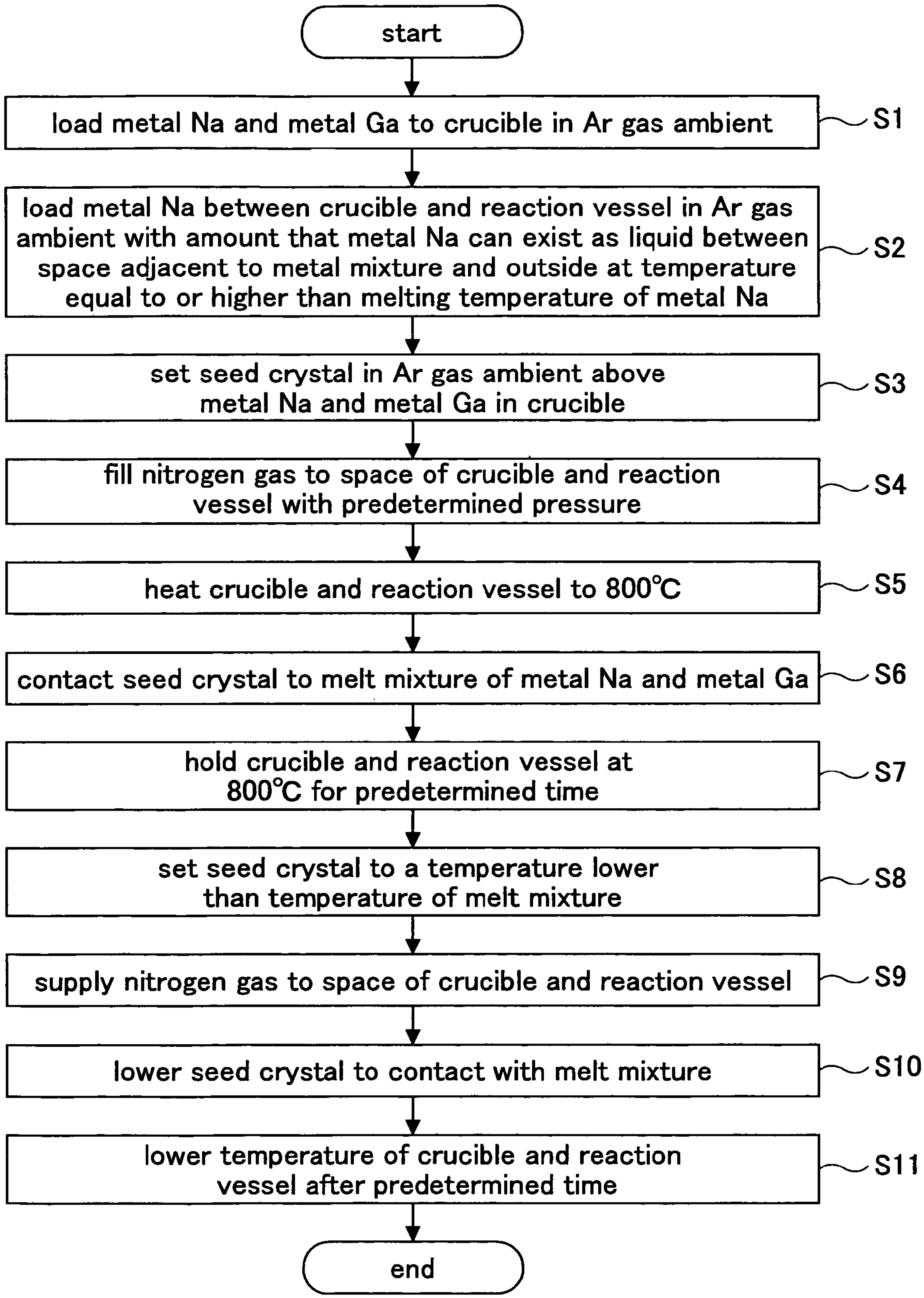
FIG. 13 is a flowchart explaining the manufacturing method of a GaN crystal according to Embodiment 1 of the present invention.

FIG. 13 is a flowchart explaining the manufacturing method of the GaN crystal according to Embodiment 1 of the present invention.

Referring to FIG. 13, the crucible 10 and the reaction vessel 20 are incorporated into a glove box filled with an Ar gas when a series of processes are started. Further, metal Na and metal Ga are loaded into the crucible 10 in an Ar gas ambient (Step S1). In the present case, the metal Na and the metal Ga are loaded into the crucible 10 with a molar ratio of 5:5. The Ar gas should be the one having a water content of 10 ppm or less and an oxygen content of 10 ppm or less (this applied throughout the present invention).

Thereafter, metal Na is loaded between the crucible 10 and the reaction vessel 20 in the Ar gas ambient with an amount such that metal Na can exist between the space 23 and the outside in the form of liquid at the temperature equal to or higher than the melting temperature of metal Na (Step S2).

More specifically, metal Na is loaded between the crucible 10 and the reaction vessel 20 with the amount M1, which is larger than the amount M2 of Na existing in the space 23 in the form of vapor at the temperature equal to or higher than the melting temperature of metal Na in the case Equation (2) explained above holds.

Further, in the case Equation (3) explained above holds, the metal Na is loaded between the crucible 10 and the reaction vessel 20 with the amount M1 larger than the sum of the amount M2 of Na existing in the space 23 in the form of vapor at the temperature equal to or higher than the melting temperature of metal Na and the amount M3 of Na solidified and adhered to the stopper/inlet plug 60.

Further, in the case Equation (4) explained above holds, the metal Na is loaded between the crucible 10 and the reaction vessel 20 with the amount M1 larger than the sum of the amount M2 of Na existing in the space 23 in the form of vapor at the temperature equal to or higher than the melting temperature of metal Na and the amount M4 of Na collected in the low temperature region 24 in the form of liquid.

Further, in the case Equation (5) explained above holds, the metal Na is loaded between the crucible 10 and the reaction vessel 20 with the amount M1 larger than the sum of the amount M2 of Na existing in the space 23 in the form of vapor at the temperature equal to or higher than the melting temperature of metal Na, the amount M3 of Na solidified and adhered to the stopper/inlet plug 60, and the amount M4 of Na collected in the low temperature region 24 in the form of liquid.

When the metal Na is loaded between the crucible 10 and the reaction vessel 20, the seed crystal 5 is set at a location above the metal Na and metal Ga in the crucible 10 in the Ar gas ambient (step S3). More specifically, the seed crystal 5 is set above the metal Na and metal Ga in the crucible 10 by fitting the seed crystal 5 to the space 54 formed at the end 511 of the support unit 50. Reference should be made to FIG. 4B.

Next, the crucible 10 and the reaction vessel 20 are set in the crystal growth apparatus 100 in the state that the crucible 10 and the reaction vessel 20 are filled with the Ar gas.

Next, the valve 160 is opened and the Ar gas filled in the crucible 10 and the reaction vessel 20 is evacuated by the vacuum pump 170. After evacuating the interior of the crucible 10 and the reaction vessel 20 to a predetermined pressure (0.133 Pa or lower) by the vacuum pump 170, the valve 160 is closed and the valves 120 and 121 are opened. Thereby, the crucible 10 and the reaction vessel 20 are filled with the nitrogen gas from the gas cylinder 140 via the gas supply lines 90 and 110. In this case, the nitrogen gas is supplied to the crucible 10 and the reaction vessel 20 via the pressure regulator 130 such that the pressure inside the crucible 10 and the reaction vessel 20 becomes about 0.1 MPa.

Further, when the pressure inside the reaction vessel 20 as detected by the pressure sensor 180 has reached about 0.1 MPa, the valves 120 and 121 are closed and the valve 160 is opened. With this the nitrogen gas filled in the crucible 10 and the reaction vessel 20 is evacuated by the vacuum pump 170. In this case, too, the interior of the crucible 10 and the reaction vessel 20 is evacuated to a predetermined pressure (0.133 Pa or less) by using the vacuum pump 170.

Further, this vacuum evacuation of the crucible 10 and the reaction vessel 20 and filling of the nitrogen to the crucible 10 and the reaction vessel 20 are repeated several times.

Thereafter, the interiors of the crucible 10 and the reaction vessel 20 are evacuated to a predetermined pressure by the vacuum pump 170, and the valve 160 is closed. Further, the valves 120 and 121 are opened and the nitrogen gas is filled into the crucible 10 and the reaction vessel 20 by the pressure regulator 130 such that the pressure of the crucible 10 and the reaction vessel 20 becomes the range of 1.01-5.05 MPa.

Because the metal Na between the crucible 10 and the reaction vessel 20 is solid in this state, the nitrogen gas is supplied to the space 23 inside the reaction vessel 20 also from the space 31 of the conduit 30 via the stopper/inlet plug 60. When the pressure of the space 23 as detected by the pressure sensor 180 has become 1.01-5.05 Pa, the valve 120 is closed.

Thereafter, the crucible 10 and the reaction vessel 20 are heated to 800° C. by the heating units 70 and 80 (step S5). In this process of heating the crucible 10 and the reaction vessel 20 to 800° C., the metal melt Na held between the crucible 10 and the reaction vessel 20 undergoes melting in view of the melting temperature of metal Na of about 98° C., and the metal melt 190 is formed. Thereby, two vapor-liquid interfaces 1 and 2 are formed. Reference should be made to FIG. 1. The vapor-liquid interface 1 is located at the interface between the metal melt 190 and the space 23 in the reaction vessel 20, while the vapor-liquid interface 2 is located at the interface between the metal melt 190 and the stopper/inlet plug 60.

Further, at the moment the temperatures of the crucible 10 and the reaction vessel 20 are raised to 800° C., the temperature of the stopper/inlet plug 60 becomes 150° C. This means that the vapor pressure of the metal melt 190 (=metal Na melt) at the vapor-liquid interface 2 is $7.6\times10^{-4}$ Pa, and thus, there is caused little evaporation of the metal melt 190 (=metal Na melt) through the gaps 63 of the stopper/inlet plug 60. As a result, there occurs little decrease of the metal melt 190 (=metal Na melt).

Even when the temperature of the stopper/inlet plug 60 is raised to 300° C. or 400° C., the vapor pressure of the metal melt 190 (=metal Na melt) is only 1.8 Pa and 47.5 Pa, respectively, and decrease of the metal melt 190 (=metal Na melt) by evaporation is almost ignorable with such a vapor pressure.

Thus, with the crystal growth apparatus 100, the temperature of the stopper/inlet member 60 is set to a temperature such that there occurs little decrease of the metal melt 190 (=metal Na melt) by way of evaporation.

Further, during the step in which the crucible 10 and the reaction vessel 20 are heated to 800° C., the metal Na and the metal Ga inside the crucible 10 also becomes a liquid, and the melt mixture 290 of metal Na and metal Ga is formed in the crucible 10. Next, the up/down mechanism 220 causes the seed crystal 5 to make a contact with the melt mixture 290 (step S6).

Further, when the temperatures of the crucible 10 and the reaction vessel 20 are elevated to 800° C., the nitrogen gas in the space 23 is incorporated into the melt mixture 290 via the metal Na in the melt mixture 290, and there starts the growth of GaN crystal from the seed crystal 5.

Thereafter, the temperatures of the crucible 10 and the reaction vessel 20 are held at 800° C. for a predetermined duration (several ten hours to several hundred hours) (step S7), and the temperature T3 of the seed crystal 5 is set to the temperature Ts1 (or Ts1) lower than the temperature of the melt mixture 290 (=800° C.) according to the method explained above (step S8).

Thus, with progress of crystal growth of the GaN crystal, the nitrogen gas in the space 23 is consumed and there is caused a decrease of the nitrogen gas in the space 23. Then the pressure P1 of the space 23 becomes lower than the pressure P2 of the space 31 inside the conduit 30 (P1<P2), and there is formed a differential pressure between the space 23 and the space 31. Thus, the nitrogen gas in the space 31 is supplied to the space 23 consecutively via the stopper/inlet plug 60 and the metal melt 190 (=metal Na melt) (step S9).

Thereafter, the seed crystal 5 is lowered so as to make a contact with the melt mixture 290 according to the method explained above (step S10). With this a GaN crystal of large size is grown.

After the predetermined time has elapsed, the temperatures of the crucible 10 and the reaction vessel 20 are lowered (step S11), and manufacturing of the GaN crystal is completed.

Figure 14:
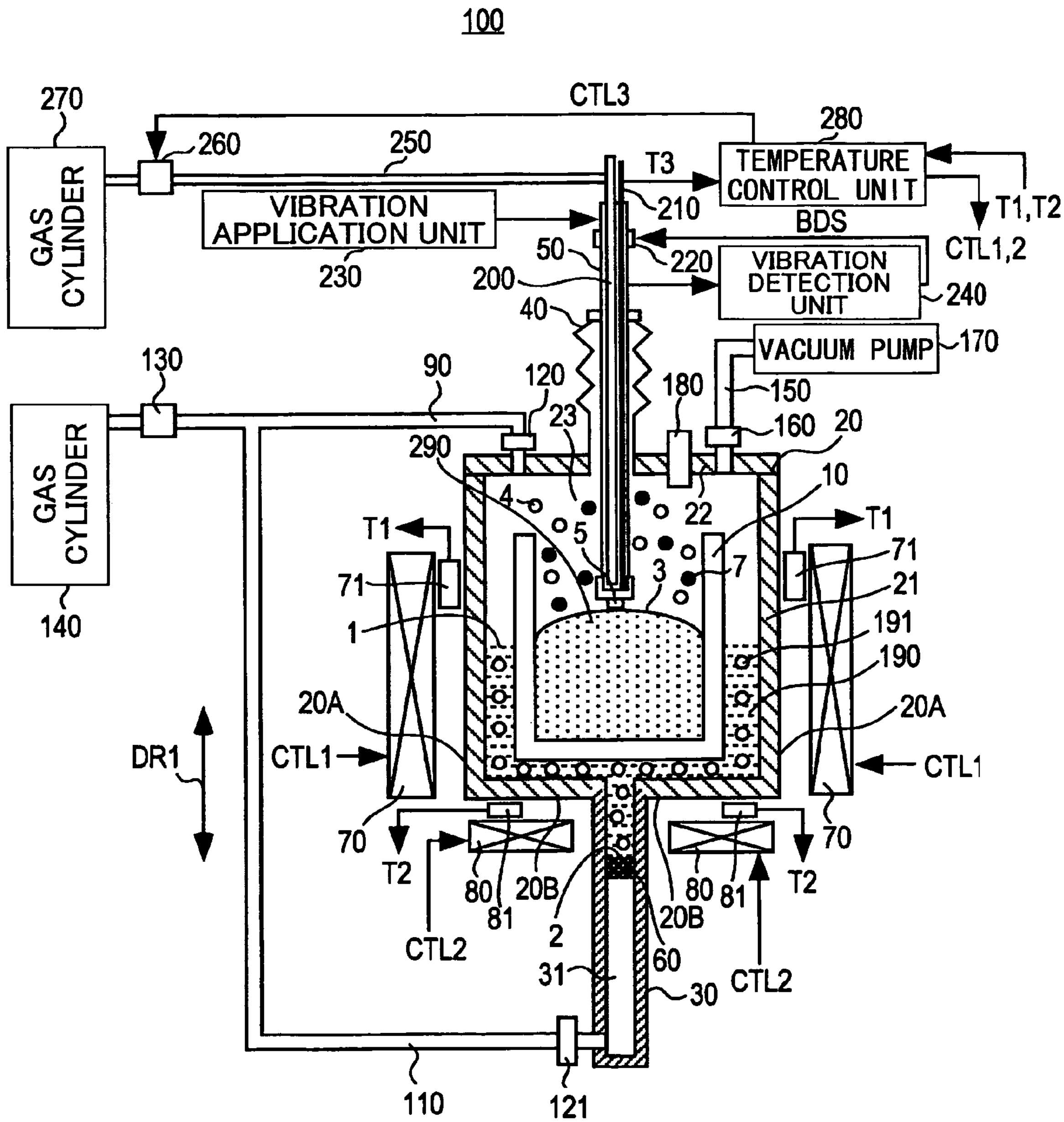
FIG. 14 is a schematic diagram showing a state inside the crucible and the reaction vessel in the step S9 shown in FIG. 13.

FIG. 14 is a schematic diagram showing the state inside the crucible 10 and the reaction vessel 20 in the step S9 shown in FIG. 13.

Referring to FIG. 14, the temperatures of the crucible 10 and the reaction vessel 20 are held at 800° C. during the interval from the timing t2 to the timing t4, and growth of the GaN crystal proceeds in the melt mixture 290. Further, with progress of growth of the GaN crystal, there occurs evaporation of metal Na from the metal melt 190 and the melt mixture 290, and thus, there exist a mixture of the nitrogen gas 4 and the metal Na vapor 7 in the space 23.

Further, with consumption of the nitrogen gas 4, the pressure P1 of the space 23 is lowered than the pressure P2 of the space 31 inside the conduit 30. Then the nitrogen gas is supplied from the space 31 of the conduit 30 to the metal melt 190 via the stopper/inlet plug 60 and moves through the metal melt 190 in the form of bubbles 191. Thus, the nitrogen gas is supplied to the space 23 through the vapor-liquid interface 1. Now, when the pressure P1 of the space 23 becomes generally equal to the pressure P2 inside the space 31, the supply of the nitrogen gas from the space 31 of the conduit 30 to the crucible 20 and the reaction vessel 20 via the stopper/inlet plug 60 and the metal melt 190 is stopped.

Thus, the stopper/inlet plug 60 holds the metal melt 190 (=metal Na melt) between the crucible 10 and the reaction vessel 20 and also inside the conduit 30 by the surface tension of the metal melt 190 and further supplies the nitrogen gas from the space 31 to the crucible 10 and the reaction vessel 20. Thus, the stopper/inlet plug 60 is formed of a structure that blocks passage of the metal melt 190 therethrough.

Figure 15:
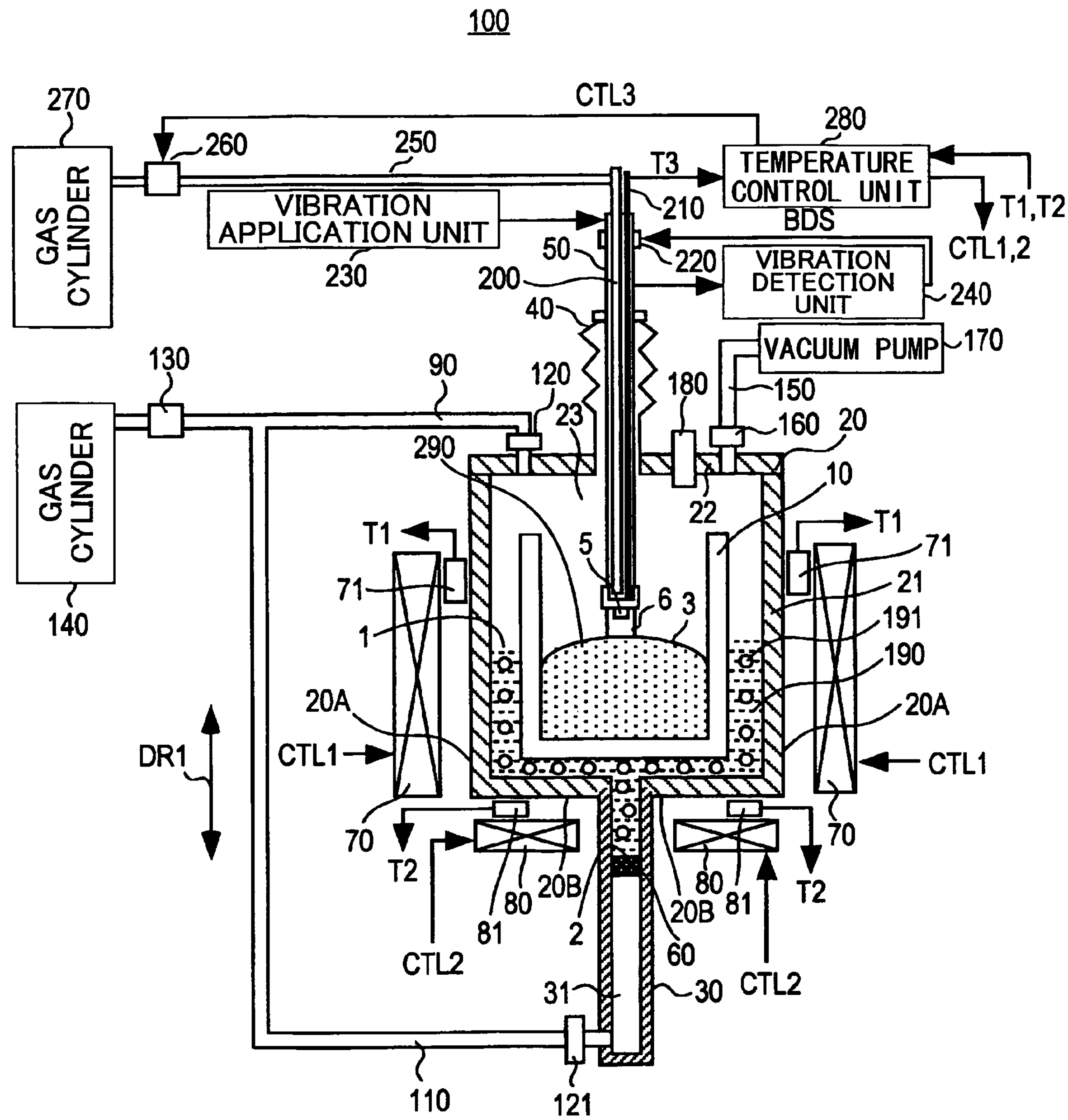
FIG. 15 is a schematic diagram showing a state inside the crucible and the reaction vessel in the step S10 shown in FIG. 13.

FIG. 15 is a schematic diagram showing the state inside the crucible 10 and the reaction vessel 20 in the step S10 shown in FIG. 13.

Referring to FIG. 15, there is caused lowering of the vapor-liquid interface 3 with progress of the growth of the GaN crystal and there is caused a decrease of the metal Ga in the melt mixture 290, while this leads to the situation in which the GaN crystal 6 grown from the seed crystal 5 may be detached from the melt mixture 290.

When this occurs, the vibration detection signal BDS is formed solely by the component SS1 (see FIG. 6), and thus, the up/down mechanism 220 lowers the support unit 50 in response to the vibration detection signal BDS such that the GaN crystal 6 makes a contact with the melt mixture 290. Thereby, the GaN crystal contacts with the metal mixture 290 again, and there occurs the preferential growth the GaN crystal 6.

Thus, with Embodiment 1, the seed crystal 5 or the GaN crystal 6 grown from the seed crystal 5 is made contact with the melt mixture 290 constantly during the growth of the GaN crystal. With this, it becomes possible to grow a GaN crystal of large size.

As explained above, the present invention can conduct growth of the GaN crystal in the state the metal Na vapor 7 is confined in the space 23, by loading the metal Na into the reaction vessel 20 with the amount M1 determined such that the metal Na of liquid state can exist between the crucible 10 and the reaction vessel 20 and in the conduit 30 at the temperature equal to or higher than the melting temperature of the metal Na (see the step S2). As a result, evaporation of the metal Na from the melt mixture 290 is suppressed and it becomes possible to manufacture a GaN crystal of large size. This GaN crystal is a defect-free crystal having a columnar shape grown in the c-axis direction (<0001> direction).

Preferably, the growth of the GaN crystal is conducted while loading the metal Na between the crucible 10 and the reaction vessel 20 with the amount M1 determined such that the metal melt 190 (=liquid Na) can be held between the crucible 10 and the reaction vessel 20 in the direction perpendicular to the gravitational direction DR1 shown in FIG. 1. With this, heat conduction of the reaction vessel 20 to the crucible 10 via the metal melt 190 (=liquid Na) is facilitated when heating the crucible 10 by the heating units 70 and 80, and the temperature of the crucible 10 is easily elevated.

Further, it is preferred to carry out the growth of the GaN crystal by loading the metal Na between the crucible 10 and the reaction vessel 20 with the amount M1 determined such that the location of the vapor-liquid interface 1 is coincident to the location of the vapor-liquid interface 3. With this, heat conduction of the reaction vessel 20 to the crucible 10 via the metal melt 190 (=liquid Na) is facilitated further when heating the crucible 10 by the heating units 70 and 80, and the temperature of the crucible 10 is easily elevated.

Further, with the manufacturing method of the GaN crystal of the present invention in which the growth of the GaN crystal is made while setting the temperature T3 of the seed crystal 5 to be lower than the crystal growth temperature (=800° C.), it becomes possible to increase the degree of supersaturation of nitrogen in the melt mixture in the vicinity of the seed crystal 5, and the GaN crystal is grown preferentially from the seed crystal. Further, it becomes possible to increase to the growth rate of the GaN crystal.

Further, because the seed crystal 5 is lowered by the up/down mechanism 220 with growth of the GaN crystal such that contact of the seed crystal to the melt mixture 290 is maintained, it becomes possible to maintain the state in which the growth of the GaN crystal occurs preferentially from the seed crystal 5. As a result, it becomes possible to grow a GaN crystal of large size.

Further, with the crystal growth apparatus 100, the temperature T4, which is the temperature of the vapor-liquid interface 1 between the space 23 inside the reaction vessel and the metal liquid 190 or the temperature near the vapor-liquid interface 1, and the temperature T5, which is the temperature of the vapor-liquid interface 3 between the space 23 and the melt mixture 290 or the temperature near the vapor-liquid interface 3, are set to the respective temperatures such that the vapor pressure of the metal Na evaporated from the metal melt 190 is generally identical with the vapor pressure of the metal Na evaporated from the melt mixture 290.

When these two temperatures are identical, the vapor pressure of the metal Na evaporated from the metal melt 190 becomes higher than the vapor pressure of the metal Na evaporated from the melt mixture 290, and thus, the temperature T4 is set to be lower than the temperature T5 such that the vapor pressure of the metal Na evaporated from the metal melt 190 becomes generally identical with the vapor pressure of the metal Na evaporated from the melt mixture 290.

As a result, migration of the metal Na from the metal melt 190 to the melt mixture 290 balances with migration of the metal Na from the melt mixture 290 to the metal melt 190, and it becomes possible to suppress the change of molar ratio of the metal Na and the metal Ga in the melt mixture 290 caused by the migration of the metal Na from the metal melt 190 to the melt mixture 290 or from the melt mixture 290 to the metal melt 190. Thereby, it becomes possible to manufacture a GaN crystal of large size stably.

In the flowchart shown FIG. 13, explanation was made such that the seed crystal 5 is contacted with the melt mixture 190 of the metal Na and the metal Ga when the crucible 10 and the reaction vessel 20 are heated to 800° C. (see steps S5 and S6), while the present embodiment is not limited to such an embodiment and it is also possible to hold the seed crystal 5 inside the melt mixture 290 containing the metal Na and the metal Ga in the step S6 when the crucible 10 and the reaction vessel 20 are heated to 800° C. (see step S5). Thus, when the crucible 10 and the reaction vessel 20 are heated to 800° C., it is possible to carry out the crystal growth of the GaN crystal from the seed crystal 5 by dipping the seed crystal 5 into the melt mixture 290.

It should be noted that the operation for making the seed crystal 5 to contact with the melt mixture 290 comprises the step A for applying a vibration to the support unit 50 by the vibration application unit 230 and detecting the vibration detection signal BDS indicative of the vibration of the support unit 50; and the step B of moving the support unit 50 by the up/down mechanism 220 such that the vibration detection signal changes to the state (component SS2 of the vibration detection signal BDS) corresponding to the situation where the seed crystal 5 has made contact with the melt mixture 290.

Further, it should be noted that the operation for holding the seed crystal 5 in the melt mixture 290 comprises the step A for applying a vibration to the support unit 50 by the vibration application unit 230 and detecting the vibration detection signal BDS indicative of the vibration of the support unit 50; and the step B of moving the support unit 50 by the up/down mechanism 220 such that the vibration detection signal changes to the state (component SS3 of the vibration detection signal BDS) corresponding to the situation where the seed crystal 5 been dipped into the melt mixture 290.

In the steps B and C, it should be noted that the support unit 50 is moved by the up/down mechanism 220 because there is caused variation of location for the melt surface (=interface 3) for the melt mixture 290 formed in the crucible 10 depending on the volume of the crucible 10 and the total amount of the metal Na and the metal Ga loaded into the crucible 10, as in the case of the seed crystal 5 being dipped into the melt mixture 290 at the moment when the melt mixture 290 is formed in the crucible 10 or the seed crystal 5 being held in the space 23, and thus there is a need of moving the seed crystal up or down in the gravitational direction DR1 in order that the seed crystal 5 makes a contact with the melt mixture 290 or the seed crystal 5 is dipped into the melt mixture 290.

Further, while explanation has been made with the step S10 of the flowchart shown in FIG. 13 that the seed crystal 5 is lowered such that the seed crystal 5 makes a contact with the melt mixture 290, it should be noted that the step S10 of the present invention shown in the flowchart shown in FIG. 13 generally comprises a step D shown in FIG. 13, wherein the step D moves the support unit 50 by the up/down mechanism 220 such that the GAN crystal grown from the seed crystal 5 makes a contact with the melt mixture 290 during the growth of the GaN crystal.

It should be noted that, while there occurs lowering of the liquid surface (=interface 3) of the melt mixture 290 because of consumption of Ga in the melt mixture 290 with progress of growth of the GaN crystal, there may be a case in which it is necessary to move the GaN crystal grown from seed crystal 5 in the upward direction or it is necessary to move the GaN crystal grown from the seed crystal 5 in the downward direction with progress of growth of the GaN crystal, depending on the relationship between the rate of lowering the liquid surface (=interface 3) and the growth rate of the GaN crystal.

Thus, in the case the rate of lowering of the liquid surface (=interface 3) is faster than the growth rate of the GaN crystal, the GaN crystal grown from the seed crystal 5 is moved downward for maintaining the contact of the GaN crystal with the liquid surface (=interface 3) of the melt mixture 290. On the other hand, in the case the rate of lowering of the liquid surface (=interface 3) is slower than the growth rate of the GaN crystal, the GaN crystal grown from the seed crystal 5 is moved upward for maintaining the contact of the GaN crystal with the liquid surface (=interface 3) of the melt mixture 290.

Thus, in view of the need of moving the GaN crystal grown from the seed crystal 5 up or down in the gravitational direction DR1 depending on the relationship between the lowering rate of the liquid surface (=interface 3), the step D is defined as "moving the support unit 50 by the up/down mechanism 220".

Further, it should be noted that the operation for making the GaN crystal grown from the seed crystal 5 to contact with the melt mixture 290 comprises the step A and the step B noted above.

Further, while it has been explained that the height H of the projection 62 of the stopper/inlet plug 60 and the separation d between the projections 62 are explained as several ten microns, it is possible that the height H of the projection 62 and the separation d between the projections 62 may be determined by the temperature of the stopper/inlet plug 60. More specifically, when the temperature of the stopper/inlet plug 60 is relatively high, the height H of the projection 62 is set relatively higher and the separation d between the projections 62 is set relatively smaller. Further, when the temperature of the stopper/inlet plug 60 is relatively low, the height H of the projection 62 is set relatively lower and the separation d between the projections 62 is set relatively larger. Thus, in the case the temperature of the stopper/inlet plug 60 is relatively high, the size of the gap 63 between the stopper/inlet plug 60 and the conduit 30 is set relatively small, while in the case the temperature of the stopper/inlet plug 60 is relatively high, the size of the gap 63 between the stopper/inlet plug 60 and the conduit 30 is set relatively larger.

It should be noted that the size of the cap 63 is determined by the height H of the projection 62 and the separation d between the projections 62, while the size of the gap 63 capable of holding the metal melt 190 by the surface tension changes depending on the temperature of the stopper/inlet plug 60. Thus, the height H of the projection 62 and the separation d between the projections 62 are changed depending on the temperature of the stopper/inlet plug 60 and with this, the metal melt 190 is held reliably by the surface tension.

The temperature control of the stopper/inlet valve 60 is achieved by the heating unit 80. Thus, when the stopper/inlet plug 60 is to be heated to a temperature higher than 150° C., the stopper/inlet plug 60 is heated by the heating unit 80.

Further, while the present embodiment has been explained for the case in which the support unit 50 is applied with vibration and the seed crystal 5 or the GaN crystal 6 is controlled to make a contact with the melt mixture 260 while detecting the vibration of the support unit 50, the present embodiment is not limited to such a construction and it is also possible to cause the seed crystal 5 or the GaN crystal 6 to make a contact with the melt mixture 290 by detecting the location of the vapor-liquid interface 3. In this case, an end of a conductor wire is connected to the reaction vessel 20 from the outside and the other end is dipped into the melt mixture 290. Further, an electric current is caused to flow through the conductor wire in this state and location of the vapor-liquid interface 3 is detected in terms of the length of the conductor wire in the reaction vessel 20 in which there has been noted a change of the current from Off to On.

Thus, when the other end of the conductor wire is dipped into the melt mixture 290, there is caused conduction of the current through the crucible 10, the metal melt 190 and the reaction vessel 20, while when the other end is not dipped into the melt mixture 290, no current flows through the conductor wire.

Thus, it is possible to detect the location of the vapor-liquid interface 3 by the length of the conductor wire inserted into the reaction vessel 20 for the case of causing the change of state of the electric current from Off to On. When the location of the vapor-liquid interface 3 is detected, the up/down mechanism 220 lowers the seed crystal 5 or the GaN crystal 6 to the location of the detected vapor-liquid interface 3.

Further, it is also possible to detect the location of the vapor-liquid interface 3 by emitting a sound to the vapor-liquid interface and measuring the time for the sound to go and back to and from the vapor-liquid interface 3.

Further, it is possible to insert a thermocouple into the crucible 10 from the reaction vessel 20 and detect the location of the vapor-liquid interface 3 from the length of the thermocouple inserted into the reaction vessel 20 at the moment when the detected temperature has been changed.

In the present invention, the metal melt 190 constitutes "the alkali metal melt".

Further, the gas cylinder 140, the pressure regulator 130, the gas supply lines 90 and 110, the conduit 30 and the stopper/inlet plug 60 form together the "gas supplying unit".

Embodiment 2

Figure 16:
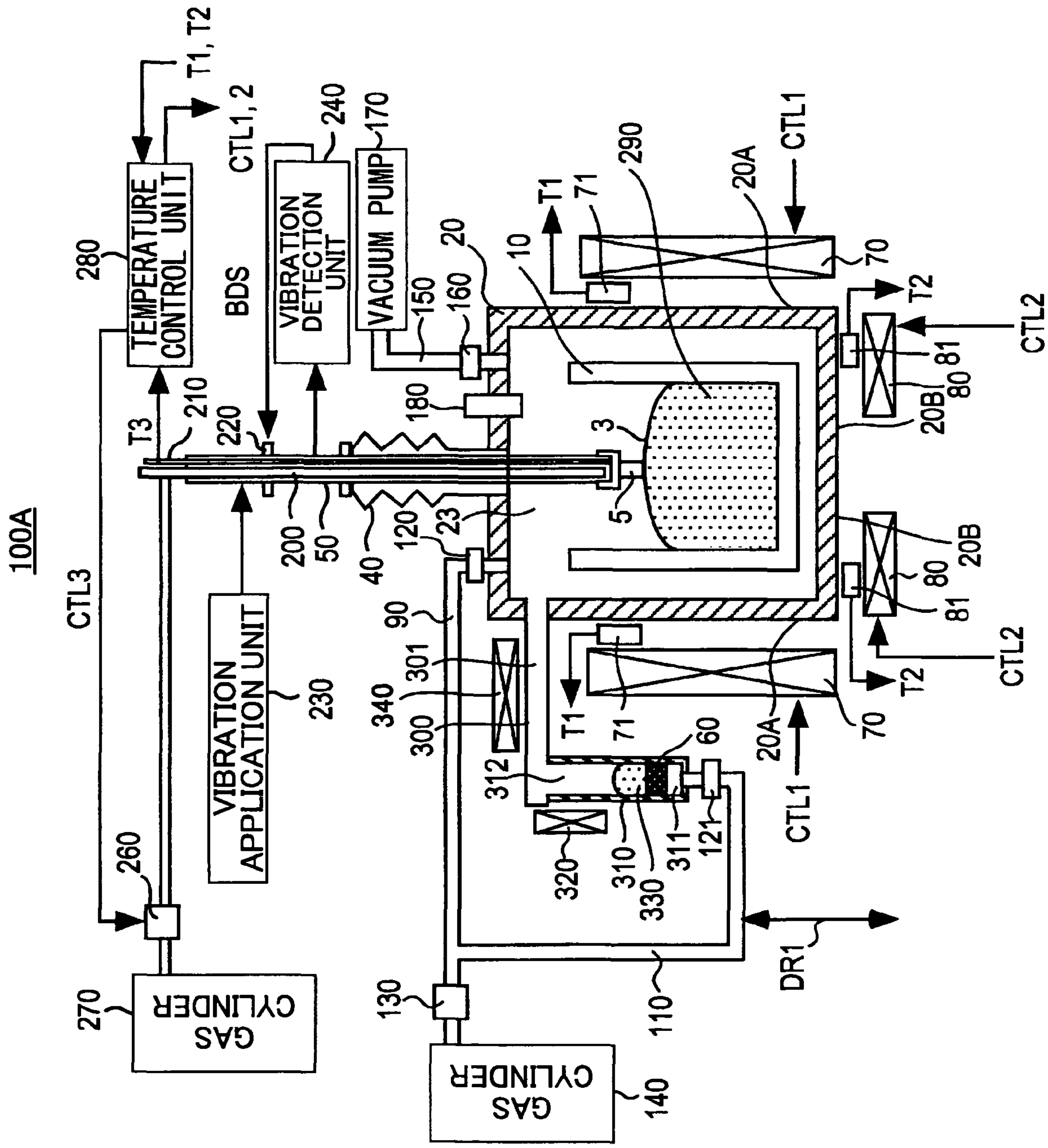
FIG. 16 is a schematic cross-sectional diagram showing the construction of a crystal growth apparatus according to Embodiment 2 of the present invention.

FIG. 16 is a schematic cross-sectional diagram showing the construction of a crystal growth apparatus according to Embodiment 2 of the present invention.

Referring to FIG. 16, the crystal growth apparatus 100A of Embodiment 2 has a construction similar to that of the crystal growth apparatus 100 except that the conduit 30 of the crystal growth apparatus 100 shown in FIG. 1 is changed to conduits 300 and 310, the metal melt 190 is changed to a metal melt 330, and heating units 320 and 340 are added.

The conduit 300 has an end connected to the reaction vessel 20. The conduit 310 has an end connected to the other end of the conduit 300 and the other end connected to the gas supply line 110. With the crystal growth apparatus 10A, the stopper/inlet plug 60 is disposed inside the conduit 310. Thereby, the metal melt 330 is held inside the conduit 310 by the stopper/inlet plug 60.

The heating unit 320 is provided so as to face the conduit 3000.

In the crystal growth apparatus 100A, the stopper/inlet plug 60 supplies the nitrogen gas supplied from the gas supply line 110 to the space 311 of the conduit 310 to the space 23 of the reaction vessel 20 via the metal melt 330 and via the space 301 of the conduit 300, and further holds the metal melt 330 inside the conduit 310 by the surface tension of the metal melt 330.

The heating unit 320 heats the conduit 310 to the crystal growth temperature. The metal melt 330 supplies the nitrogen gas supplied from the space 311 via the stopper/inlet plug 60 to the space 23 inside the reaction vessel 20 and further confines the nitrogen gas and the metal Na vapor into the spaces 23, 301 and 312. The heating unit 340 heats the space 301 of the conduit 300 to the crystal growth temperature.

Figure 17:
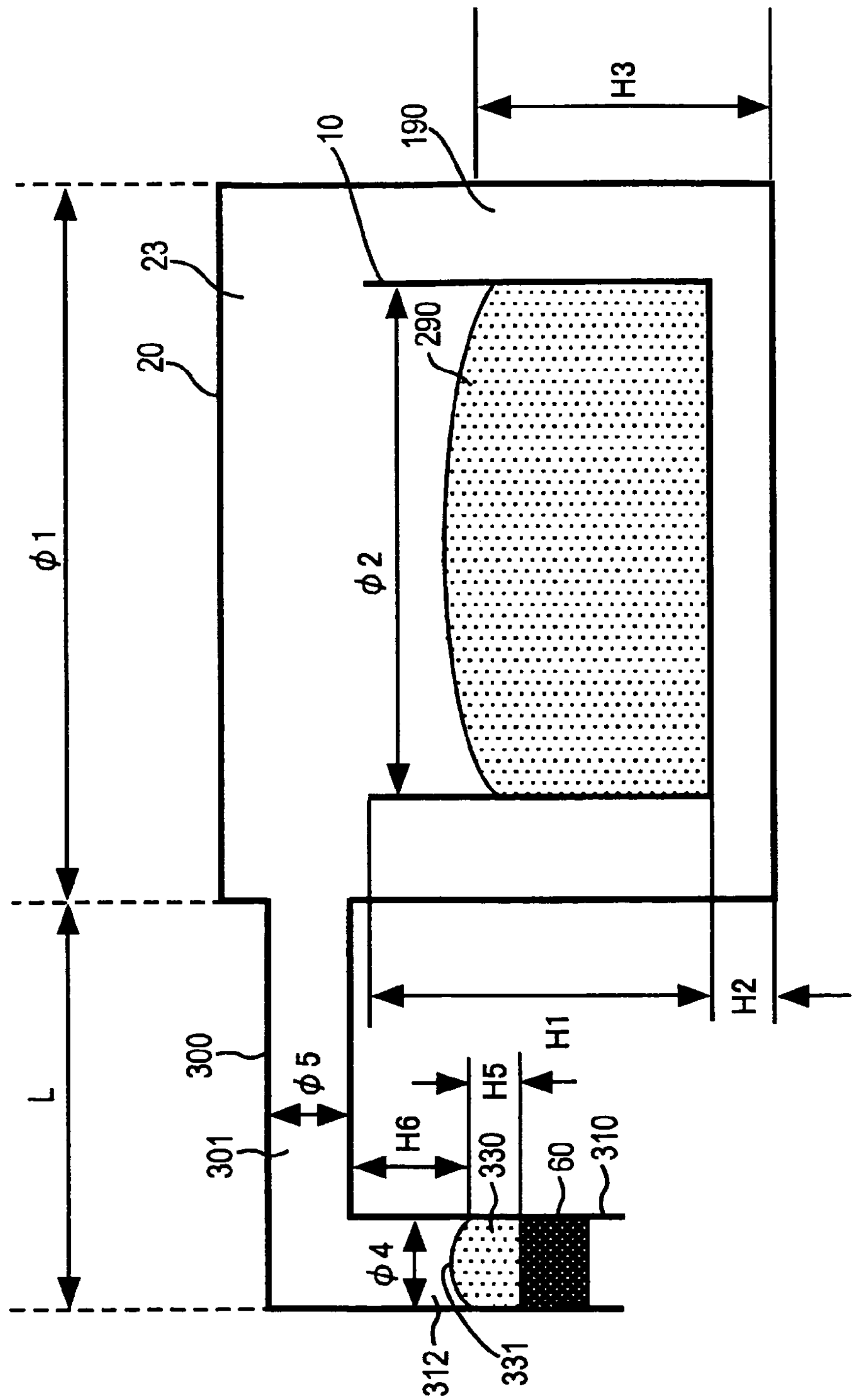
FIG. 17 is a diagram showing calculation of the amount of metal Na located into the crystal growth apparatus shown in FIG. 16 in Embodiment 2.

FIG. 17 is a diagram showing calculation of the amount of the metal Na to be loaded into the crystal growth apparatus 100A of Embodiment 2 shown in FIG. 16.

Referring to FIG. 17, the volume V4 of the metal melt 330 held in the conduit 310 is represented by the equation below where the inner diameter of the conduit 310 is designated as 94 and the height H5 of the metal melt 330 is designated as H5.

$$V4=(((\phi 4)/2)^2\pi(H5). \quad (6)$$

In the case where the inner diameter ϕ4 of the conduit 310 is 4.0 cm and the height H5 of the metal melt 330 is 5 cm, the volume V4 is obtained from Equation (6) as 62.8 $cm^3$. Using the value of 0.777 $g/cm^3$ for the density of Na at the temperature of 1000K, the weight of Na having the value of 3.5 $cm^3$ is given as 62.8 $cm^3$×0.777 $g/cm^3$48.8 g. Thus, in view of the fact that Na has the atomic weight of 23, the molar number of Na occupying the volume of 62.8 $cm^3$ becomes 2.1 mol.

On the other hand, the volume V5 of the space 23 inside the reaction vessel 20 is represented by the equation below by using the volume B of the crucible 10 explained above.

$$V5=V6-B \quad (7)$$

In the case the reaction vessel 20 has the inner diameter ϕ1 of 11.6 cm and the height of 21.5 cm, the volume V6 of the reaction vessel is given as V6=$(11.6/2)^2\pi\times21.5=2272.2$ $cm^3$. Further, the volume B has the value of 628.3 $cm^3$ as explained above.

Thus, the volume V1 of the space 23 in the crystal growth apparatus 100A is given from Equation (7) as V5=2272.2−628.3=1643.9 $cm^3$.

Further, in the case the conduit 300 has the inner diameter ϕ4 of 0.94 cm and the length L of 10 cm, the volume D of the space 301 of the conduit 300 is given as D=$(0.94/2)^2\pi\times10=6.9$ $cm^3$.

Further, in the case a space 312 of the conduit 310 has the height H6 of 6 cm, the volume E of the space 312 is given as E=$(4/2)^2\pi\times6=75.4$ $cm^3$.

Thus, in the crystal growth apparatus 100A, the volume V7 of the space between the conduit 290 and the metal melt 330 (space 23+space 301+space 312) is given as V7=V5+D+E=1643.9+6.9+75.4=1726.2 $cm^3$.

It should be noted that the vapor pressure P of Na at 850° C. is 0.744 (atm) and the volume V7 of the spaces 23, 301 and 312 is 1.726 (L). Thus, the maximum amount of metal Na that can exist in the spaces 23, 301 and 312 when the temperature of the spaces 73, 301 and 312 has become 850° C. is obtained in terms of the mole number n of Na, as n=0.014 mol, by substituting P=0.744 (atm), V=1.726 (L), a gas constant R=0.08206 atm/L/K·mol, and the temperature T=850+273.15=1123.15K into the state equation PV=nRT.

Therefore, in the case the crucible 10 has an outer diameter ϕ2 of 10.0 cm, 0.67.%(=(0.014 mol)/2.1 mol)×100) of the metal Na loaded into the reaction vessel 310 exists in the form of vapor.

From this result, it is concluded that 0.67% of metal Na evaporates to the spaces 23, 301, and 312 in the form of metal Na vapor in the case the metal Na is loaded into the conduit 310 in such a way that the metal melt 330 of 62.8 $cm^3$ is collected inside the conduit 310. This means that most of the metal Na loaded into the conduit 310 is collected in the conduit 310 in the form of liquid.

The metal Na vapor 7 evaporated into the spaces 23, 301 and 312 from the melt mixture 290 cannot cause diffusion to the outside via the stopper/inlet plug 60 in the case the metal melt 330 (=liquid Na) exists between the space 23 and the stopper/inlet plug 60.

Thus, in order that the metal Na vapor 7 evaporated to the spaces 23, 301 and 312 from the melt mixture 290 does not cause diffusion to the outside, it is sufficient that there exists the relationship below, where M5 stands for the amount of the metal Na loaded into the conduit 310 and M6 stands for the amount of Na existing in the spaces 23, 301 and 312 in the form of vapor at a temperature equal to or higher then the melting temperature of metal Na.

$$M5>M6 \quad (8)$$

When there holds Equation (8), the metal melt 330 (=liquid Na) exists in the conduit 310, and the metal Na vapor evaporated to the space 23 from the melt mixture 290 cannot cause diffusion to the outside.

Strictly speaking, a part of the liquid Na constituting the metal melt 330 solidifies and adheres to the stopper/inlet plug 60 also with the crystal growth apparatus 100A. Thus, designating the amount of the Na solidified and adhered to the stopper/inlet plug 60 as M3, the metal Na vapor 7 evaporated to the spaces 23, 301 and 312 from the melt mixture 290 cannot cause diffusion to the outside when the relationship below holds.

$$M5-M6>M3 \quad (9)$$

Figure 18:
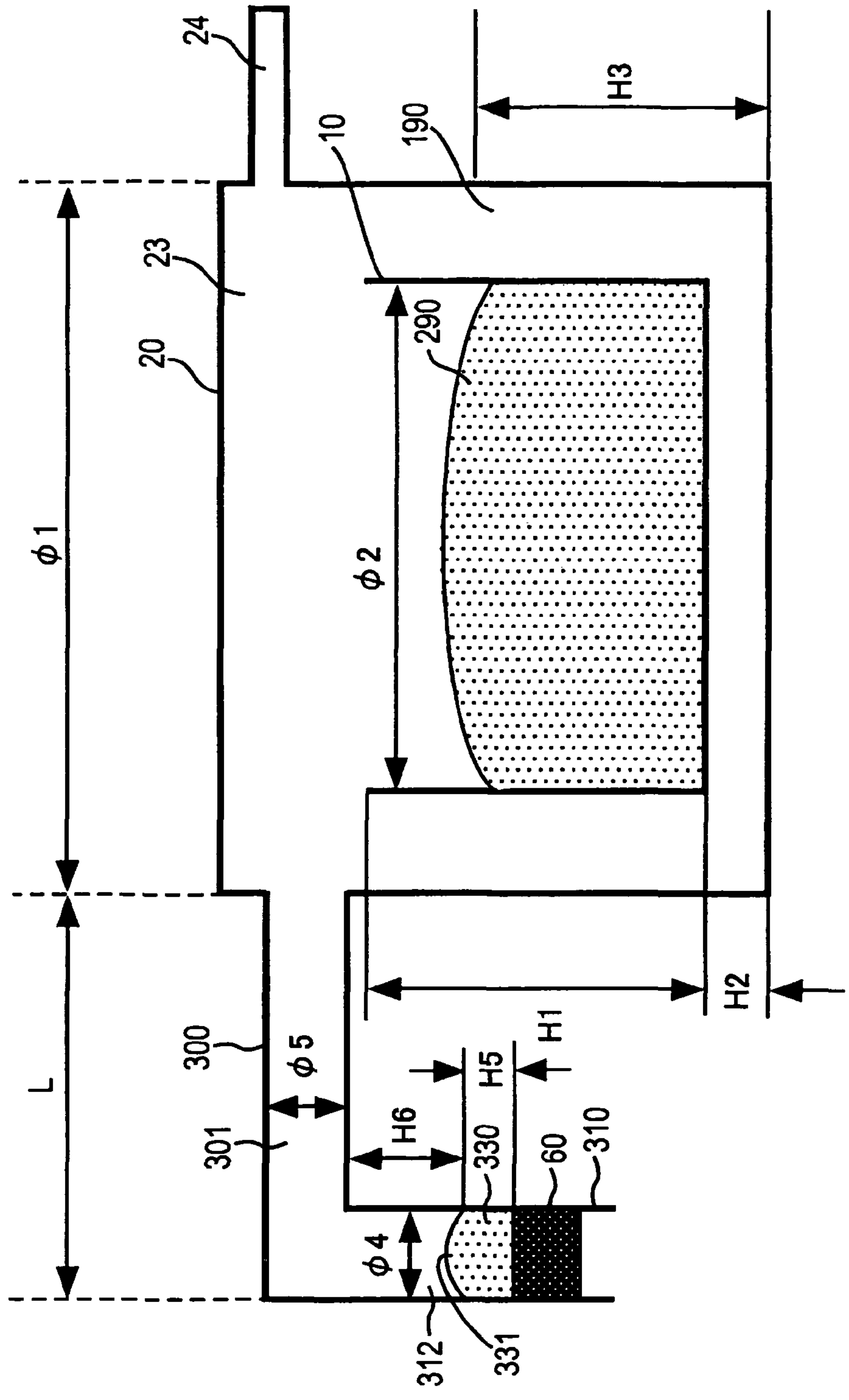
FIG. 18 is another diagram showing calculation of the amount of metal Na located into the crystal growth apparatus shown in FIG. 16 in Embodiment 2.

FIG. 18 is another diagram showing calculation of the amount of the metal Na to be loaded into the crystal growth apparatus 100A of Embodiment 2 shown in FIG. 16.

Referring to FIG. 18, there is a need, when there exists a low temperature region 24 where the metal Na vapor 7 is collected in the form of liquid exposed to the space 23, to determine the amount of the metal Na to be loaded into the conduit 310 by taking into consideration the volume V3 of the low temperature region 24 in addition to the volume V7 of the spaces 23, 301 and 312.

Thus, the Na evaporated from the metal melt 330 is formed of the Na existing in the spaces 23, 301 and 302 in the form of the metal Na vapor 7 and the Na collected in the low temperature region 24 in the form of liquid. Thus, designating the amount of the Na collected in the low temperature region 24 as M4, the metal Na vapor 7 evaporated from the melt mixture 290 to the space 23 cannot cause diffusion to the outside when the following relationship holds.

$$M5-M6>M4 \quad (10)$$

Further, in the case where there exists the low temperature region 24 and when the amount M3 of the Na solidified and adhered to the stopper/inlet plug 60 is taken into consideration, the metal Na vapor 7 evaporated to the space 23 from the melt mixture 290 cannot escape to the outside when the following relation ship holds.

$$M5-M6-M4>M3 \quad (11)$$

It should be noted that the low temperature region 24 exposed to the space 23 has the volume of 60.6 $cm^3$ as noted before. Thus, even in the case there exists the low temperature region 24 in the crystal growth apparatus 10A, Na of the amount of 62.8 $cm^3$−60.6 $cm^3$=2.2 $cm^3$ exists inside the conduit 310 in the form of liquid.

With Example 2, crystal growth of GaN is achieved by loading the metal Na into the conduit 310 with the amount M1 having any of the relationships explained above with reference to Equations (8)-(11).

Manufacturing the the GaN crystal with the crystal growth apparatus 100A is conducted according to the flowchart shown in FIG. 13. In this case, the metal Na is loaded into the conduit 310 with the amount M1 having any of the relationships explained above with reference to Equations (8)-(11) in the step S2. Further, in the step S5, the heating units 320 and 340 are used to heat the conduits 310 and 300 to 800° C. at the time of heating the crucible 10 and the reaction vessel 20 to 800° C. Further, in the step S11, the temperatures of the crucible 10, the reaction vessel 20 and the conduits 300 and 310 are lowered. Otherwise, the process is the same as explained with reference to FIG. 13.

Thus, it is also possible to maintain the metal melt 330 (=liquid Na) between the melt mixture 290 and the outside (=space 311 of the conduit 310) also in the crystal growth apparatus 100A in which the nitrogen gas is introduced into the space 23 adjacent to the melt mixture 290 from the lateral direction of the reaction vessel 20. As a result, it is also possible with the crystal growth apparatus to confine the metal Na vapor 7 evaporated from the melt mixture 290 into the spaces 23, 301 and 312.

With the crystal growth apparatus 100A, it is also possible to confine the metal Na vapor 7 evaporated from the melt mixture 290 into the space 23 within the space 23 even when the temperature of the conduit 300 heated by the heating unit 340 is lowered and metal melt (=liquid Na) is collected in the conduit 300. Thus, the crystal growth apparatus 100A of Embodiment 2 also includes the crystal growth apparatus in which the metal melt (=liquid Na) is collected. Thus, the crystal growth apparatus 100A of Embodiment 2 may be the one in which the metal melt (=liquid Na) is collected in the conduits 300 and 310.

Otherwise, the present embodiment is identical to Embodiment 1.

With the crystal growth apparatus 100 of Embodiment 1, metal Na of 252.9 g, and hence 11 mole of metal Na is loaded into the reaction vessel 20. Assuming that the metal melt 190 remains in the conduit 30 in contact with the stopper/inlet plug 60 inside the conduit 30 with a height of 1 cm, the liquid Na remaining in the conduit 30 becomes 0.54 g (=0.023 mol).

This means that Na of the amount of 11−0.023=10.977 mol undergoes evaporation into the space 23 in the form of the metal Na vapor 7. It should be noted that this space occupied by the Na of 10.977 mol has a volume of 1360000 $cm^3$, wherein this volume is obtained by substituting P=0.744 atm, n=10.977 mol, R=0.8206 atm—L/K·mol and temperature T=850+273.15=1123.15K into the state equation PV=nRT.

Assuming that the crucible 10 has a diameter of 75 cm and a height of 100 cm, the volume of the crucible 10 becomes 441786 $cm^3$. In the case the metal melt 190 (=liquid Na) exists on the stopper/inlet plug 60 with a height of 1 cm, the volume of the space 23 is given as the volume of the reaction vessel 20 subtracted by the volume of the crucible, and thus, the volume of the space 23 becomes 1360000 $cm^3$. Thereby, the volume of the reaction vessel 20 becomes 1360000+441786=1801786 $cm^3$.

Assuming that the reaction vessel 20 has a height of 150 cm in view of the height 100 cm of the crucible 10, the diameter of the reaction vessel 20 having the volume of 1801786 cm3 becomes 124 cm.

Thus, by loading metal Na of 252.9 g (=11 mol) between the crucible 10 and the reaction vessel 20, it becomes possible to form an ingot of GaN crystal having a diameter of about 60 cm and a length of about 80 cm in the crucible 10.

It should be noted that the foregoing calculation applies also to the crystal growth apparatus 100A.

Thus, the present embodiment is not limited to the case of using the crucible 10 of the diameter of 4 inches but is the crystal growth apparatuses 100 and 100A of the present embodiment include also a crystal growth apparatus that uses the crucible having the diameter of 30 inches.

Further, it should be noted that the crystal growth apparatus of the present invention may be the one in which the conduit 200, the thermocouple 210, the gas supply line 250, the flow meter 260 and the gas cylinder 270 are removed from the crystal growth apparatuses 100 and 100A explained above. Thus, the crystal growth apparatus of the present invention may be the one in which the function of setting the temperature of the seed crystal 5 to be lower than the temperature of the melt mixture 290 is removed from the crystal growth apparatus 100 or 100A.

Further, the crystal growth temperature of the present invention may be the one in which the up/down mechanism 220, the vibration application unit 230 and the vibration detection unit 240 are removed from the crystal growth apparatuses 100 and 100A. In other words, the crystal growth apparatus of the present invention may be the one in which the function of moving the seed crystal 5 up or down is removed from the crystal growth apparatus 100 or 100A.

Further, it should be noted that the crystal growth apparatus of the present invention may be the one in which the conduit 200, the thermocouple 210, the up/down mechanism 220, the vibration application unit 230, the vibration detection unit 240, the gas supply line 250, the flow meter 260 and the gas cylinder 270 are removed from the crystal growth apparatuses 100 and 100A explained above. Thus, the crystal growth apparatus of the present invention may be the one in which the function of setting the temperature of the seed crystal 5 to be lower than the temperature of the melt mixture 290 and the function of moving the seed crystal 5 up or down are removed from the crystal growth apparatus 100 or 100A.

Further, it should be noted that the crystal growth apparatus of the present invention may be the one in which the support unit 50, the conduit 200, the thermocouple 210, the up/down mechanism 220, the vibration application unit 230, the vibration detection unit 240, the gas supply line 250, the flow meter 260 and the gas cylinder 270 are removed from the crystal growth apparatuses 100 and 100A explained above. Thus, the crystal growth apparatus of the present invention may be the one in which the function of supporting the seed crystal from the top side of the crucible 10, the function of setting the temperature of the seed crystal 5 to be lower than the temperature of the melt mixture 290, the function of moving the seed crystal 5 up or down are removed from the crystal growth apparatus 100 or 100A. In this case, the seed crystal 5 is disposed at the bottom part of the crucible 10.

Thus, while the crystal growth apparatus of the present invention includes various modes of crystal growth apparatuses, the present invention generally includes a crystal growth apparatus that includes the metal melt 190 (or metal melt 330) between the space 23 (or spaces 23, 301 and 302) exposed to the melt mixture 290 and an outside of the space, and a gas supply unit that supplies the nitrogen gas via the metal melt 190 (or the metal melt 330).

Further, the present embodiment generally includes the manufacturing method for manufacturing a GaN crystal that includes the step of loading metal Na into the space 23 (or space 23, 301 and 312) in an ambient of Ar gas with an amount such that the metal Na exists between the space 23 (or space 23, 301, 312) and the outside in the form of liquid at the temperature higher than the melting temperature of the metal Na.

Figure 19:
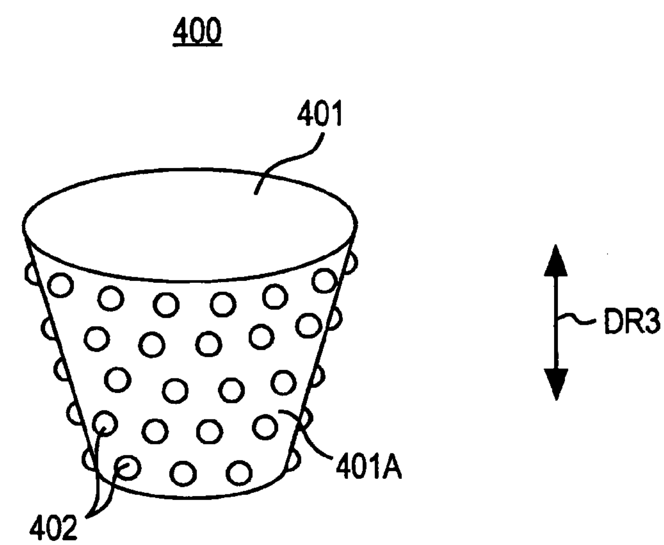
FIG. 19 is another oblique view diagram of the stopper/inlet plug according to the present invention.

FIG. 19 is another oblique view diagram of the stopper/inlet plug according to the present invention. Further, FIG. 20 is a cross-sectional diagram showing the method for mounting the stopper/inlet plug 400 shown in FIG. 19.

Referring to FIG. 19, the stopper/inlet plug 400 comprises a plug 401 and a plurality of projections 402. The plug 401 is formed of a cylindrical body that changes the diameter in a length direction DR3. Each of the projections 402 has a generally semispherical shape of the diameter of several ten microns. The projections 402 are formed on an outer peripheral surface 401A of the plug 401 in a random pattern. Thereby, the separation between adjacent two projections 402 is set to several ten microns.

Figure 20:
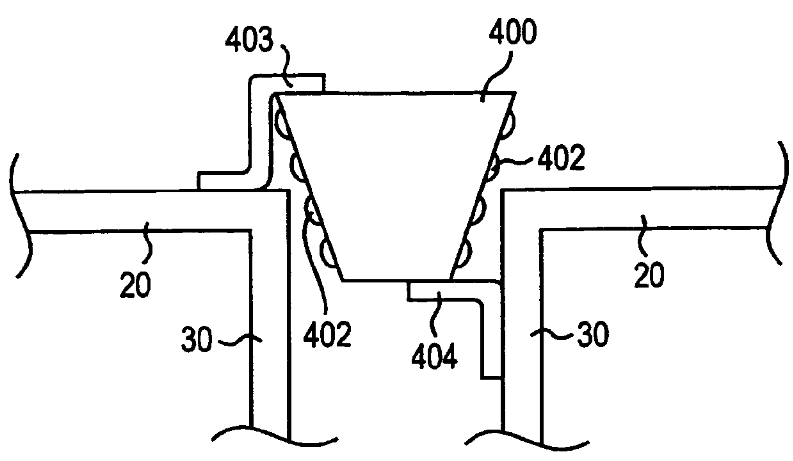
FIG. 20 is a cross-sectional diagram showing the method for mounting the stopper/inlet plug shown in FIG. 28.

Referring to FIG. 20, the stopper/inlet plug 400 is fixed to a connection part of the reaction vessel 20 and the conduit 30 by support members 403 and 403. More specifically, the stopper/inlet plug 400 is fixed by the support member 404 having one end fixed upon the reaction vessel 20 and by the support member 404 having one end fixed upon an inner wall surface of the conduit 30.

In the present case, the projections 402 may or may not contact with the reaction vessel 20 or the conduit 30. In the event the stopper/inlet plug 400 is fixed in the state in which the projections 402 do not contact with the reaction vessel 20 and the conduit 30, the separation between the projections and the reaction vessel 20 or the separation between the projections 402 and the conduit 30 is set such that the metal melt 190 can be held by the surface tension, and the stopper/inlet plug 400 is fixed in this state by the support members 403 and 404.

The metal Na held between the crucible 10 and the reaction vessel 20 takes a solid form before heating of the crucible 10 and the reaction vessel 20 is commenced, and thus, the nitrogen gas supplied from the gas cylinder 140 can cause diffusion between the space 23 inside the reaction vessel 20 and the space 31 inside the conduit 30 through the stopper/inlet plug 400.

When heating of the crucible 10 and the reaction vessel 20 is started and the temperatures of the crucible 10 and the reaction vessel 20 have been raised to 98° C. or higher, the metal Na held between the crucible 10 and the reaction vessel 20 undergoes melting to form the metal melt 190, while the metal melt 190 functions to confined the nitrogen gas to the space 23.

Further, the stopper/inlet plug 400 holds the metal melt 190 by the surface tension thereof such that the metal melt 190 does not flow out from the interior of the reaction vessel 30 to the space 31 of the conduit 30.

Further, with progress of the growth of the GaN crystal, the metal melt 190 and the stopper/inlet plug 400 confines the nitrogen gas and the metal Na vapor evaporated from the metal melt 190 and the melt mixture 290 into the space 23. As a result, evaporation of the metal Na from the melt mixture 290 is suppressed, and it becomes possible to stabilize the molar ratio of the metal Na and the metal Ga in the melt mixture 290. Further, when there is caused a decrease of nitrogen gas in the space 23 with progress of growth of the GaN crystal, the pressure P1 of the space 23 becomes lower than the pressure P2 of the space 31 inside the conduit 30, and the stopper/inlet plug 400 supplies the nitrogen gas in the space 31 via the metal melt 190 by causing to flow the nitrogen gas therethrough in the direction toward the reaction vessel 20.

Thus, the stopper/inlet plug 400 functions similarly to the stopper/inlet plug 60 explained before. The stopper/inlet plug 400 can be used in the crystal growth apparatuses 100 and 100A in place of the stopper/inlet plug 60.

While it has been explained that the stopper/inlet plug 400 has the projections 402, it is also possible that the stopper/inlet plug 400 does not have the projections 402. In this case, the stopper/inlet plug 400 is held by the support members such that the separation between the plug 401 and the reaction vessel 20 or the separation between the plug 401 and the conduit 30 becomes several ten microns.

Further, it is also possible to set the separation between the stopper/inlet plug 400 (including both of the cases in which the stopper/inlet plug 400 carries the projections 402 and the case in which the stopper/inlet plug 400 does not carry the projections 402) and the reaction vessel 20 and between the stopper/inlet plug 400 and the conduit 30 according to the temperature of the stopper/inlet plug 400. In this case, the separation between the stopper/inlet plug 400 and the reaction vessel 20 or the separation between the stopper/inlet plug 400 and the conduit 30 is set relatively narrow when the temperature of the stopper/inlet plug 40 is relatively high. When the temperature of the stopper/inlet plug 40 is relatively low, on the other hand, the separation between the stopper/ inlet plug 400 and the reaction vessel 20 or the separation between the stopper/inlet plug 400 and the conduit 30 is set relatively large.

It should be noted that the separation between the stopper/inlet plug 400 and the reaction vessel 20 or the separation between the stopper/inlet plug 400 and the conduit 30 that can hold the metal melt 190 changes depending on the temperature of the stopper/inlet plug 400. This, with this embodiment, the separation between the stopper/inlet plug 400 and the reaction vessel 20 or the separation between the stopper/inlet plug 400 and the conduit 30 is changed in response to the temperature of the stopper/inlet plug 400 such that the metal melt 190 is held securely by the surface tension.

The temperature control of the stopper/inlet valve 400 is achieved by the heating unit 80. Thus, when the stopper/inlet plug 400 is to be heated to a temperature higher than 150° C., the stopper/inlet plug 400 is heated by the heating unit 80.

In the case of using the stopper/inlet plug 400, the gas cylinder 140, the pressure regulator 130, the gas supply lines 90 and 110, the conduit 30 and the stopper/inlet plug 400 form together the "gas supplying unit".

Figure 21A:
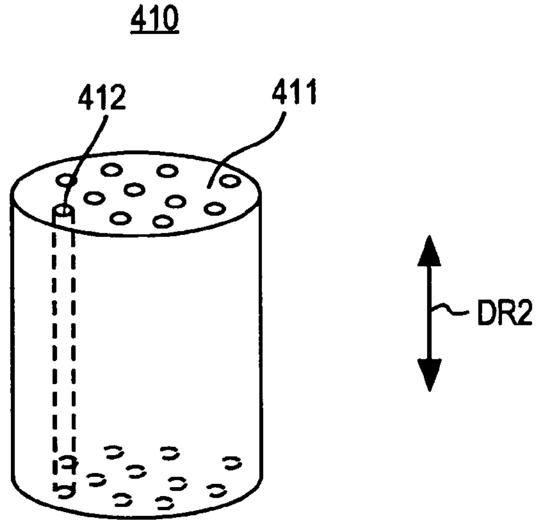
FIGS. 21A and 21B are further oblique view diagrams of the stopper/inlet plug according to the present invention.
Figure 21B:
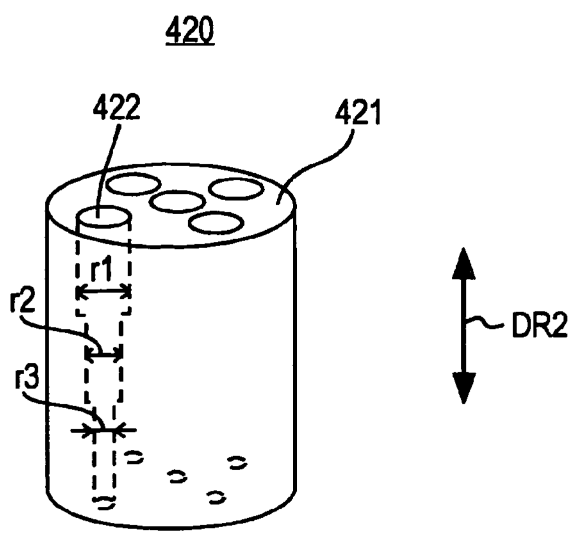

FIGS. 21A and 21B are further oblique view diagrams of the stopper/inlet plug according to the present embodiment.

Referring to FIG. 21A, the stopper/inlet plug 410 comprises a plug 411 formed with a plurality of penetrating holes 412. The plurality of penetrating holes 412 are formed in the length direction DR2 of the plug 411. Further, each of the plural penetrating holes 412 has a diameter of several ten microns (see FIG. 21A).

With the stopper/inlet plug 410, it is sufficient that there is formed at least one penetrating hole 412.

Further, the stopper/inlet plug 420 comprises a plug 421 formed with plural penetrating holes 422. The plurality of penetrating holes 422 are formed in the length direction DR2 of the plug 421. Each of the penetrating holes 422 have a diameter that changes stepwise from a diameter r1, r2 and r3 in the length direction DR2. Here, each of the diameters r1, r2 and r3 is determined in the range such as several microns to several ten microns in which the metal melt 190 can be held by the surface tension Reference should be made to FIG. 21B.

With the stopper/inlet plug 420, it is sufficient that there is formed at least one penetrating hole 422. Further, it is sufficient that the diameter of the penetrating hole 422 is changed at least in two steps. Alternatively, the diameter of the penetrating hole 422 may be changed continuously in the length direction DR2.

The stopper/inlet plug 410 or 420 can be used in the crystal growth apparatuses 100 and 100A in place of the stopper/inlet plug 60.

In the case the stopper/inlet plug 420 is used in the crystal growth apparatus 100 or 100A in place of the stopper/inlet plug 60, it becomes possible to hold the metal melt 190 by the surface tension thereof by one of the plural diameters that are changed stepwise, and it becomes possible to manufacture a GaN crystal of large size without conducting precise temperature control of the stopper/inlet plug 420.

In the case the metal melt 190 is to be held by the surface tension thereof at the location of the diameter r3, the amount M1 of the metal Na loaded into the reaction vessel 20 is determined by taking into account the amount of Na that invades into the stopper/inlet plug 420 to the location of the diameters r1 and r2.

In the case of using the stopper/inlet plug 410 or 420, the gas cylinder 140, the pressure regulator 130, the gas supply lines 90 and 110, the conduit 30 and the stopper/inlet plug 410 or 412 form together the "gas supplying unit".

Further, with the present invention, it is possible to use a porous plug or check valve in place of the stopper/inlet plug 60. The porous plug may be the one formed of a sintered body of stainless steel powders. Such a porous plug has a structure in which there are formed a large number of pores of several ten microns. Thus, the porous plug can hold the metal melt 190 by the surface tension thereof similarly to the stopper/inlet plug 60 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P1 of the space 31 and the pressure P2 of the space 23 for allowing the nitrogen gas in the space 31 to the space 23 through the metal melt 190 in the event the pressure P2 is higher than the pressure P1 and blocks the connection between the reaction vessel 20 and the conduit 20 by the self gravity when P1P2. Thus, this check valve can be used also in the high-temperature region.

While it has been described in Embodiments 1 and 2 that the seed crystal 5 is moved up or down depending on the relationship between the crystal growth rate of the GaN crystal and the lowering rate of the interface 3 for maintaining contact of the seed crystal 5 with the interface 3, it is also possible to move the support unit 210 up or down by the up/down mechanism 220 so as to maintain the contact of the GaN crystal 6 with the interface 3, by taking into consideration the effect of rising of the interface 3 caused by dipping of the GaN crystal 6 grown from the seed crystal 5 into the melt mixture 290 and the effect of the lowering of the interface caused by the movement of the GaN crystal 6 upward from the melt mixture 290.

Further, in the case the temperature of the metal melt 190 is equal to the temperature of the melt mixture 290, the vapor pressure of the metal Na evaporated from the metal melt 190 becomes higher than the vapor pressure of the metal Na evaporated from the melt mixture 290. Thus, in such a case, the metal Na migrates from the metal melt 190 to the melt mixture 290 and there is caused rising of the interface 3. Thus, in the event the temperature of the metal melt 190 and the temperature of the melt mixture 290 are set equal, it is possible to move the support unit 210 up or down by the up/down mechanism 220 such that the GaN crystal grown from the seed crystal 5 makes contact with the interface 3 while taking into consideration of the effect of rising of the interface 3 caused by the migration of the metal Na from the metal melt 190 to the melt mixture 290.

Further, with growth of the GaN crystal 6, the metal Ga in the melt mixture 290 is consumed while this consumption of the metal Ga invites lowering of the interface. Thus, it is also possible to move the support unit 210 up or down by the up/down mechanism 220 such that the GaN crystal grown from the seed crystal 5 makes contact with the interface 3 while taking into consideration the amount of consumption of the metal Ga.

Further, while it has been explained with Embodiments 1 and 2 that the crystal growth temperature is 800° C., the present embodiment is not limited to this specific crystal growth temperature. It is sufficient when the crystal growth temperature is equal to or higher than 600°. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the crucible 20 in the ambient of Ar gas and the metal Na is loaded between the crucible 10 and the reaction vessel 20 in the ambient of Ar gas, it is also possible to load the metal Na and the metal Ga into the crucible 10 and the metal Na between the crucible 10 and the reaction vessel 20 in the ambient of a gas other than the Ar gas, such as He, Ne, Kr, or the like, or in a nitrogen gas. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 290 by mixing an alkali metal such as lithium (Li), potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing nitrogen as a constituent element such as sodium azide, ammonia, or the like. These compounds constitute the nitrogen source gas.

Further, place of Ga, it is also possible to use a groupo III metal such as boron (B), aluminum (Al), indium (In), or the like.

Thus, the crystal growth apparatus and method of the present invention is generally applicable to the manufacturing of a group III nitride crystal while using a melt mixture of an alkali metal or an alkali earth melt and a group III metal (including boron).

The group III nitride crystal manufactured with the crystal growth apparatus or method of the present invention may be used for fabrication of group III nitride semiconductor devices including light-emitting diodes, laser diodes, photodiodes, transistors, and the like.

Further, it should be noted that the embodiments explained above are provided merely for the purpose of showing examples and should not be interpreted that the present invention is limited to such specific embodiments.

The present invention provides a crystal growth apparatus that can positively prevent diffusion of the alkali metal to the outside.

Further, the present invention is applied to the method for manufacturing a group III nitride crystal while preventing the diffusion of the alkali metal to the outside positively.

Embodiment 3

Figure 22:
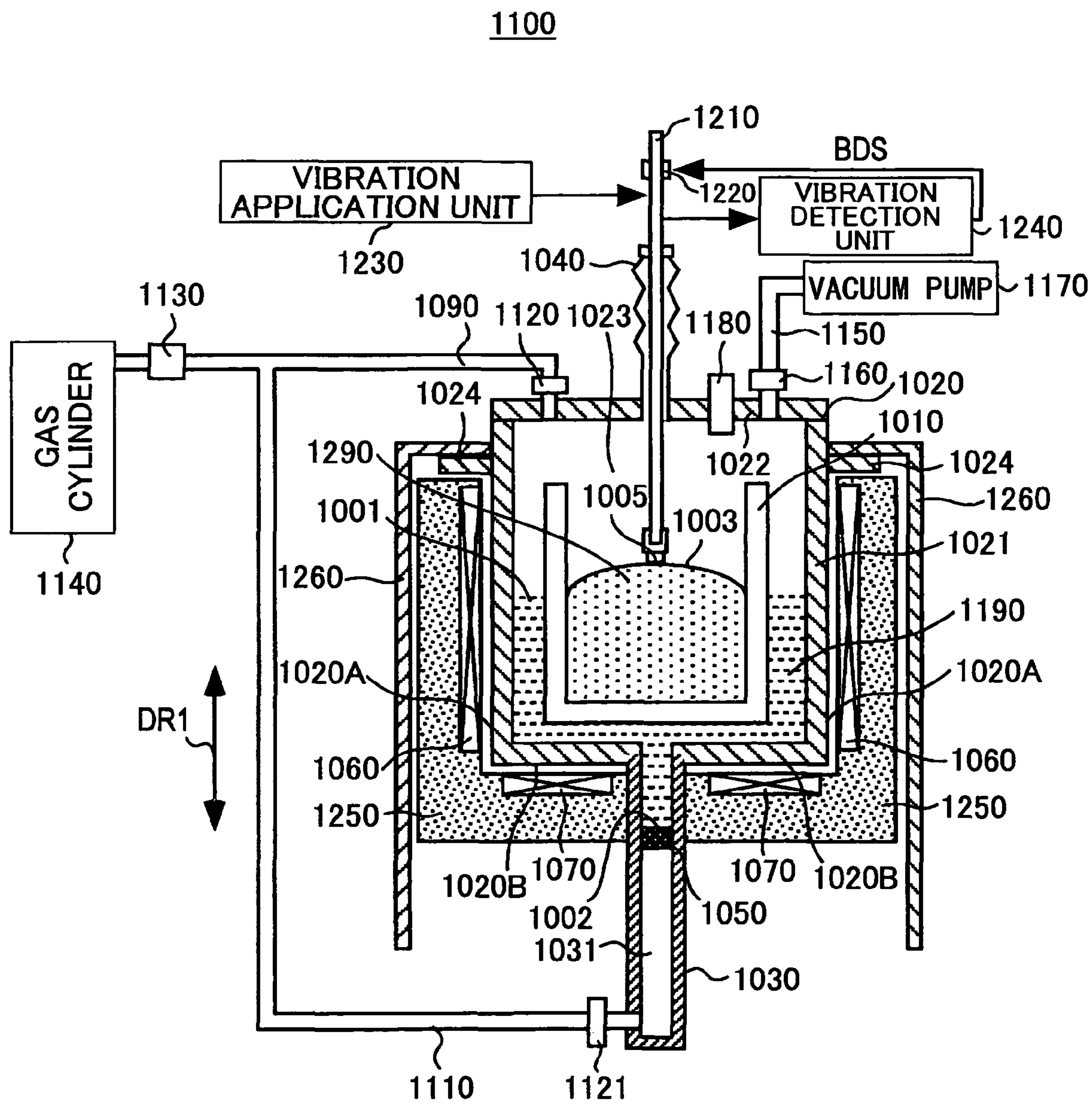
FIG. 22 is a schematic cross-sectional diagram showing the construction of a crystal growth apparatus according to Embodiment 3 of the present invention.

FIG. 22 is a schematic cross-sectional diagram showing the construction of a crystal growth apparatus according to Embodiment 3 of the present invention.

Referring to FIG. 22, the crystal growth apparatus 1100 according to Example 3 of the present invention includes: a crucible 1010; a reaction vessel 1020; a conduit 1030; a bellow 1040; a stopper/inlet plug 1050; heaters 1060 and 1070; a gas supply liens 1090 and 1110; valves 1120, 1121 and 1160; a pressure regulator 1130; a gas cylinder 1140; an evacuation line 1150; a vacuum pump 1170; a pressure sensor 1180; a metal melt 1190; a support unit 1210; an up/down mechanism 1220; a vibration application unit 1230; a vibration detection unit 1240; a filler 1250; and a metal member 1260.

The crucible 10 has a generally cylindrical form and is formed of boron nitride (BN). The reaction vessel 1020 is disposed around the crucible with a predetermined separation from the crucible 1010. Further, the reaction vessel 1020 is formed of a main part 1021, a lid 1022 and a support part 1024. Each of the main part 1021, the lid 1022 and the support part 1024 is formed of SUS316L stainless steel, wherein a metal seal ring is provided between the main part 1021 and the lid 1022 for sealing. Thus, there occurs no leakage of a melt mixture 1290 to be described later to the outside of the reaction vessel 1020. Further, the support part 1024 is provided on the outer peripheral surface 1021A of the main part 201 for the part close to the lid 1022.

The conduit 1030 is connected to the reaction vessel 1020 at the underside of the crucible 1010 in terms of a gravitational direction DR1. The bellows 1040 is connected to the reaction vessel 1020 at the upper side of the crucible 1010 in terms of a gravitational direction DR1.

The stopper/inlet plug 1050 may be formed of a metal, ceramic, or the like, for example, and is held inside the conduit 1030 at a location lower than the connection part of the reaction vessel 1020 and the conduit 1030.

The heater 1060 is disposed so as to surround the outer circumferential surface 1020A of the reaction vessel 1020. On the other hand, the heater 1070 is disposed so as to face a bottom surface 1020B of the reaction vessel 1020.

The gas supply line 1090 has an end connected to the reaction vessel 1020 via the valve 1120 and the other end connected to the gas cylinder 1140 via the pressure regulator 1130. The gas supply line 1110 has an end connected to the conduit 1030 via the valve 1121 and the other end connected to the gas supply line 1090.

The valve 1120 is connected to the gas supply line 1090 in the vicinity of the reaction vessel 1020. The valve 1121 is connected to the gas supply line 1110 in the vicinity of the conduit 1030. The pressure regulator 1130 is connected to the gas supply line 1090 in the vicinity of the gas cylinder 1140. The gas cylinder 1140 is connected to the gas supply line 1090.

The evacuation line 1150 has an end connected to the reaction vessel 1020 via the valve 1160 and the other end connected to the vacuum pump 1170. The valve 1160 is connected to the evacuation line 1150 in the vicinity of the reaction vessel 1020. The vacuum pump 1170 is connected to the evacuation line 1150.

The pressure sensor 1180 is mounted to the reaction vessel 1020. The metal melt 1190 comprises a melt of metal sodium (metal Na) and is held between the crucible 1010 and the reaction vessel 1020 and inside the conduit 1030.

The support substrate 1210 comprises a cylindrical member and a part thereof is inserted into a space 1023 inside the reaction vessel 1020 via the bellows 1040. The up/down mechanism 1220 is mounted upon the support unit 1210 at the location above the bellows 1040.

The filler 1250 is disposed at the outer side of the heaters 1060 and 1070. The metal member 1260 comprises SUS316L and has a hollow cylindrical form. Thereby, the metal member 1260 is disposed at the outer side of the filler 1250 in the state that an end thereof is supported by the support part 1024 while the other end of the metal member 1260 is opened. Thereby, the other end is located at a lower level of the heater 1070 and the filler 1250. As a result, the metal member 1260 surrounds the reaction vessel 1020, the heaters 1060 and 1070 and the filler 1250.

The metal member is formed of two members divided in the gravitational direction DR1 and is mounted by assembling the two members together from the radial direction of the reaction vessel 1020.

The crucible 1010 holds the melt mixture 1290 containing metal Na and metal gallium (metal Ga). The reaction vessel 1020 surrounds the crucible 1010. The conduit 1030 leads the nitrogen gas (N2 gas) supplied from the gas cylinder 1140 via the gas supply lines 1090 and 1110 to the stopper/inlet plug 1050.

The bellows 1040 holds the support unit 1210 and disconnects the interior of the reaction vessel 1020 from outside. Further, the bellows 1040 is capable of expanding and contracting in the gravitational direction DR1 with movement of the support unit 1210 in the gravitational direction DR1.

The stopper/inlet plug 1050 has a dimple structure on the outer peripheral surface such that there are formed apertures of the size of several ten microns between the inner wall of the conduit 1030 and the stopper/inlet plug 60. Thus, the stopper/inlet plug 60 allows the nitrogen gas in the conduit 1030 to pass in the direction to the metal melt 1190 and supplies the nitrogen gas to the space 1023 via the metal melt 1190. Further, the stopper/inlet plug 1050 holds the metal melt 1190 between the crucible 1010 and the reaction vessel 1020 and further inside the conduit 1030 by the surface tension caused by the apertures of the size of several ten microns.

The heater 1060 heats the crucible 1010 and the reaction vessel 1020 to the crystal growth temperature from the outer peripheral surface 1010A of the reaction vessel 1020. The heater 1070 heats the crucible 1010 and the reaction vessel 1020 to the crystal growth temperature from the bottom surface 1020B of the reaction vessel 1020.

The gas supply line 1090 supplies the nitrogen gas supplied from the gas cylinder 1140 via the pressure regulator 1130 to the interior of the reaction vessel 1020 via the valve 1120. The gas supply line 1110 supplies the nitrogen gas supplied from the gas cylinder 1140 via the pressure regulator 1130 to the interior of the conduit 1030 via the valve 1121.

The valve 1120 supplies the nitrogen gas inside the gas supply line 1090 to the interior of the reaction vessel 1020 or interrupts the supply of the nitrogen gas to the interior of the reaction vessel 1020. The valve 1121 supplies the nitrogen gas inside the gas supply line 1110 to the conduit 1030 or interrupts the supply of the nitrogen gas to the conduit 1030. The pressure regulator 1130 supplies the nitrogen gas from the gas cylinder 1140 to the gas supply lines 1090 and 1110 after setting the pressure to a predetermined pressure.

The gas cylinder 1140 holds the nitrogen gas. The evacuation line 1150 passes the gas inside the reaction vessel 1020 to the vacuum pump 1170. The valve 1160 connects the interior of the reaction vessel 1020 and the evacuation line 1150 spatially or disconnects the interior of the reaction vessel 1020 and the evacuation line 1150 spatially. The vacuum pump 1170 evacuates the interior of the reaction vessel 1020 via the evacuation line 1150 and the valve 1160.

The pressure sensor 1180 detects the pressure inside the reaction vessel 1020. The metal melt 1190 supplies the nitrogen gas introduced through the stopper/inlet plug 1050 into the space 1023.

The support unit 1210 supports a seed crystal 1005 of a GaN crystal at a first end thereof inserted into the reaction vessel 1020. The up/down mechanism 1220 causes the support unit 1210 to move up or down in response to a vibration detection signal BDS from the vibration detection unit 1240 according to a method to be explained later, such that the seed crystal 1005 makes a contact with a vapor-liquid interface 1003 between the space 1023 and the melt mixture 1290.

The vibration application unit 1230 comprises a piezoelectric element, for example, and applies a vibration of predetermined frequency to the support unit 1210. The vibration detection unit 1240 comprises an acceleration pickup, for example, and detects the vibration of the support unit 1210 and outputs the vibration detection signal BDS indicative of the vibration of the support unit 1210 to the up/down mechanism 1220.

The filler 1250 prevents escaping of heat from the reaction vessel 1020 and from the heaters 1060 and 1070 to the outside and further blocks inflow of heat from outside to the reaction vessel 1020. The metal member 1260 blocks escaping of heat from the crucible 1010 and the reaction vessel 1020 by way of convention.

Figure 23:
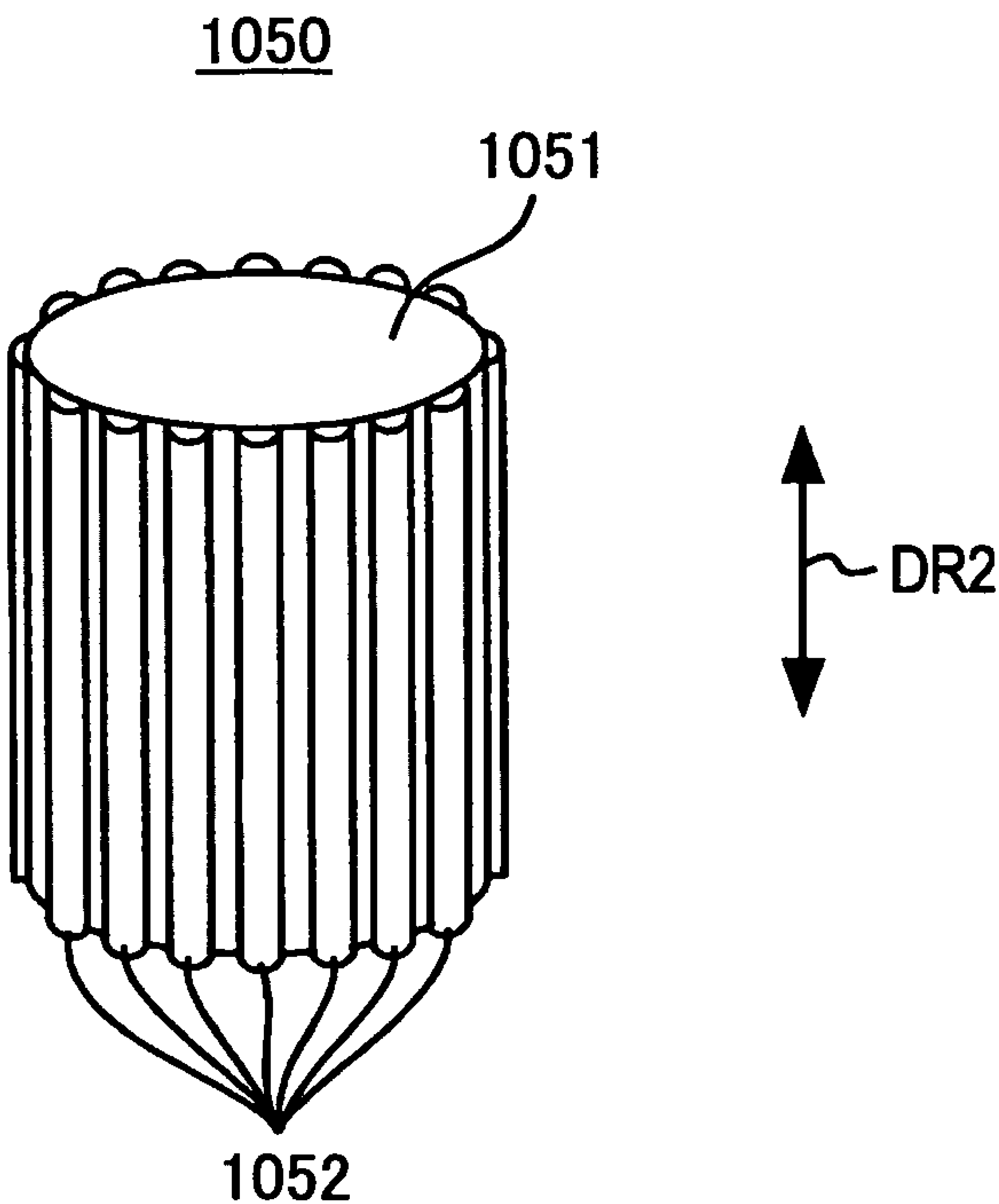
FIG. 23 is an oblique view diagram showing the construction of the stopper/inlet plug shown in FIG. 22.

FIG. 23 is an oblique view diagram showing the construction of the stopper/inlet plug 1050 shown in FIG. 22.

Referring to FIG. 23, the stopper/inlet plug 1050 includes a plug 1051 and projections 1052. The plug 1051 has a generally cylindrical form. Each of the projections 1052 has a generally semi-circular cross-sectional shape and the projections 1052 are formed on the outer peripheral surface of the plug 1051 so as to extend in a length direction DR2.

Figure 24:
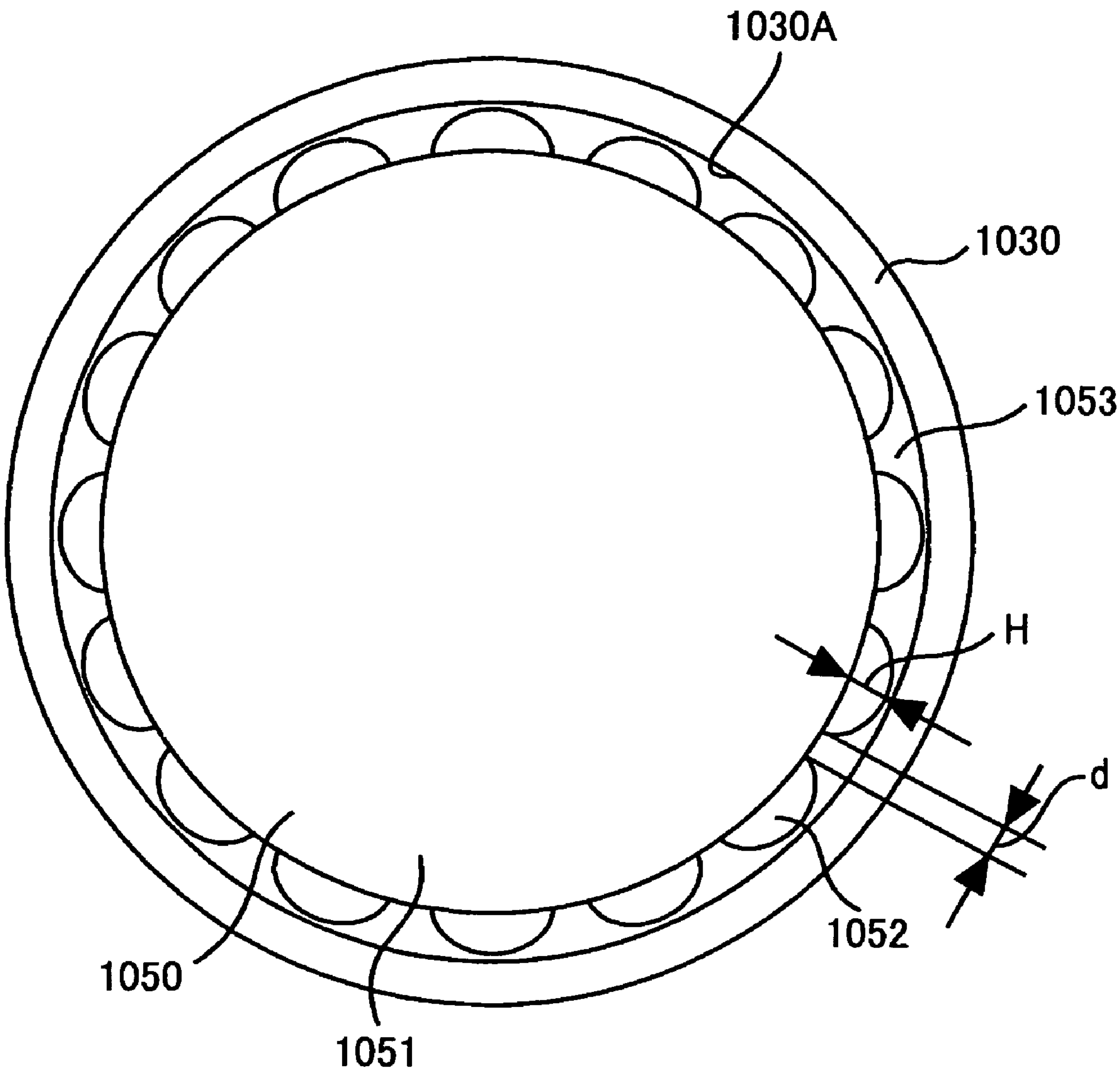
FIG. 24 is a plan view diagram showing the state of mounting the stopper/inlet plug to a conduit.

FIG. 24 is a plan view diagram showing the state of mounting the stopper/inlet plug 1050 to the conduit 1030.

Referring to FIG. 24, the projections 1052 are formed with plural number in the circumferential direction of the plug 1051 with an interval d of several ten microns. Further, each projection 1052 has a height H of several ten microns. The plural projections 1052 of the stopper/inlet plug 1050 make a contact with the inner wall surface 1030A of the conduit 1030. With this, the stopper/inlet plug 1050 is in engagement with the inner wall 1030A of the conduit 1030.

Because the projections 1052 have a height H of several ten microns and are formed on the outer peripheral surface of the plug 1051 with the interval d of several ten microns, there are formed plural gaps 1053 between the stopper/inlet plug 1050 and the inner wall 1030A of the conduit 1030 with a diameter of several ten microns in the state the stopper/inlet plug 1050 is in engagement with the inner wall 30A of the conduit 1030.

This gap 1053 allows the nitrogen gas to pass in the length direction DR2 of the plug 1051 and holds the metal melt 1190 at the same time by the surface tension of the metal melt 1190, and thus, the metal melt 1190 is blocked from passing through the gap in the longitudinal direction DR2 of the plug 1051.

Figure 25A:
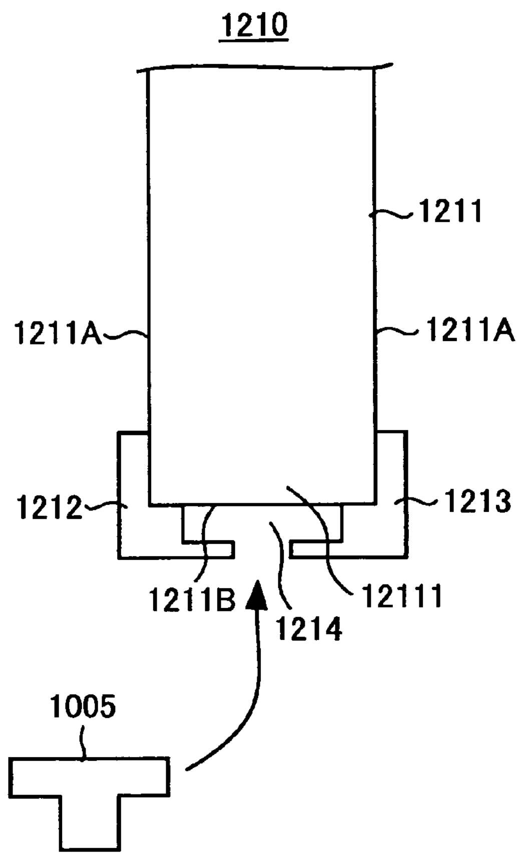
FIGS. 25A and 25B are enlarged diagrams showing the construction of the support unit shown in FIG. 22.
Figure 25B:
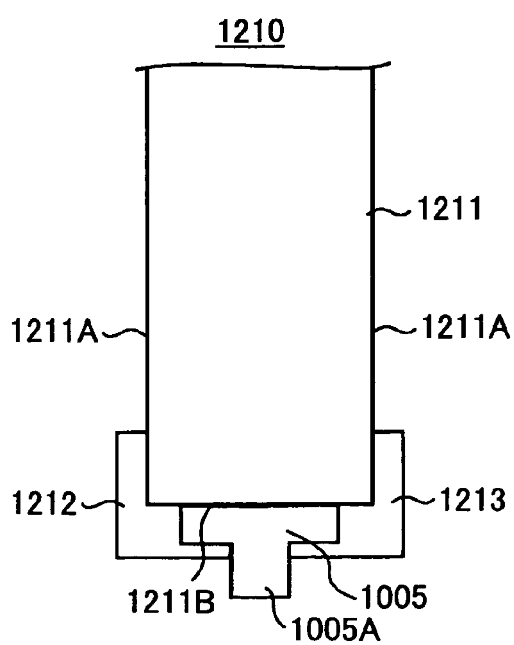

FIGS. 25A and 25B are enlarged diagrams showing the construction of the support unit shown in FIG. 22.

Referring to FIGS. 25A and 25B, the support unit 1210 includes a cylindrical member 1211 and fixing members 1212 and 1213. The cylindrical member 1211 has a generally circular cross-sectional form. The fixing member 1212 has a generally L-shaped cross-sectional form and is fixed upon an outer peripheral surface 1221A and a bottom surface 1221B of the cylindrical member 1211 at the side of a first end 12111 of the cylindrical member 1211. Further, the fixing member. 1213 has a generally L-shaped cross-sectional form and is fixed upon the outer peripheral surface 1221A and the bottom surface 1211B of the cylindrical member 1211 at the side of a first end 12111 of the cylindrical member 1211 in symmetry with the fixing member 1212. As a result, there is formed a space part 1214 in the region surrounded by the cylindrical member 1211 and the fixing members 1212 and 1213.

Further, the seed crystal 1005 has a shape that fits the space 1214 and is held by the support unit 1210 by being fitted into the space 1214. In the present case, the seed crystal 1005 makes a contact with the bottom surface 1211B of the cylindrical 5 member 1211. Reference should be made to FIG. 25B.

Figure 26:
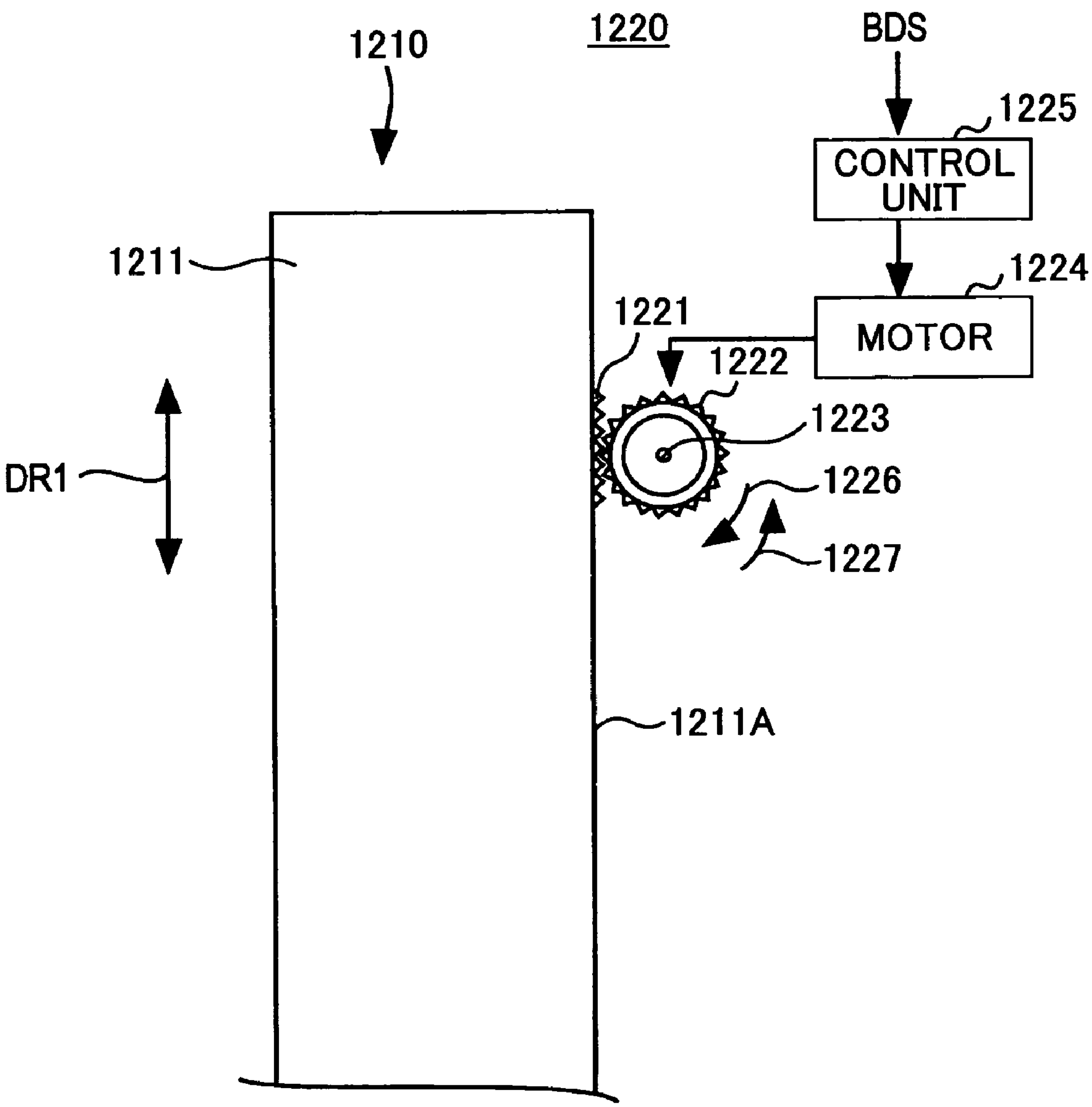
FIG. 26 is a schematic diagram showing the construction of an up/down mechanism shown in FIG. 22.

FIG. 26 is a schematic diagram showing the construction of the up/down mechanism 1220 shown in FIG. 22.

Referring to FIG. 26, the up/down lo mechanism 1220 comprises a toothed member 1221, a gear 1222, a shaft member 1223, a motor 1224 and a control unit 1225.

The toothed member 1221 has a generally triangular cross-sectional shape and is fixed upon 15 the outer peripheral surface 1211A of the cylindrical member 1211. The gear 1222 is fixed upon an end of the shaft member 1223 and meshes with the toothed member 1221. The shaft member 1223 has the foregoing end connected to the gear 1222 and the other end 20 connected to a shaft (not shown) of the motor 1224.

The motor 1224 causes the gear 1222 to rotate in the direction of an arrow 1226 or an arrow 227 in response to control from the control unit 1225.

The control unit 1225 controls the motor 1222 based 25 on the vibration detection signal BDS from the vibration detection unit 1240 and causes the gear 1224 to rotate in the direction of the arrow 1226 or 1227.

When the gear 1222 is rotated in the direction of the arrow 1226, the support unit 1210 moves in the upward direction in terms of the gravitational direction DR1, while when the gear is rotated in the direction of the arrow 1227, the support unit 1210 is moved downward in terms of the gravitational direction DR1.

Thus, rotation of the gear 1222 in the direction of the arrow 1226 or 1227 corresponds to a movement of the support unit 1210 up or down in terms of the gravitational direction DR1.

Figure 27:
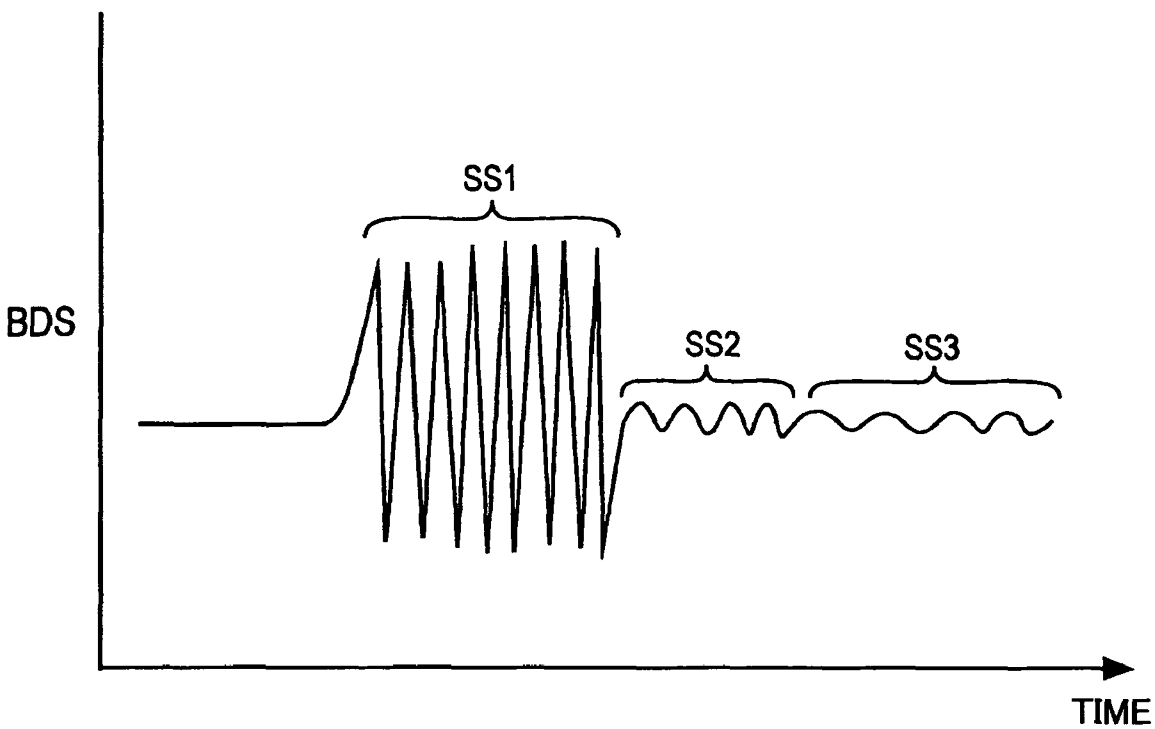
FIG. 27 is a timing chart showing the waveform of a vibration detection signal.

FIG. 27 is a timing chart of the vibration detection signal BDS.

Referring to FIG. 27, the vibration detection signal BDS detected by the vibration detection unit 1240 comprises a signal component SS1 in the case the seed crystal 1005 is not in contact with the melt mixture 1290, while in the case the seed crystal 1005 is in contact with the melt mixture 1290, the vibration detection signal BDS is formed of a signal component SS2. Further, in the case the seed crystal 1005 is dipped into the melt mixture 1290, the vibration detection signal BDS is formed of a signal component SS3.

In the event the seed crystal 1005 is not in contact with the melt mixture 1290, the seed crystal 1005 is vibrated vigorously by the vibration applied by the vibration application unit 1230 and the vibration detection signal BDS is formed of the signal component SS1 of relatively large amplitude. When the seed crystal 1005 is in contact with the melt mixture 1290, the seed crystal 1005 cannot vibration vigorously even when the vibration is applied from the vibration application unit 1230 because of viscosity of the melt mixture 1290, and thus, the vibration detection signal BDS is formed of the signal component SS2 of relatively small amplitude. Further, when the seed crystal 5 is dipped into the melt mixture 1290, vibration of the seed crystal 1005 becomes more difficult because of the viscosity of the melt mixture 1290, and the vibration detection signal BDS is formed of the signal component SS3 of further smaller amplitude than the signal component SS2.

Referring to FIG. 26, again, the control unit 1225 detects, upon reception of the vibration detection signal from the vibration detection unit 1240, the signal component in the vibration detection signal BDS. Thus, when the detected signal component is the signal component SS1, the control unit 1225 controls the motor 1224 such that the support unit 1210 is lowered in the gravitational direction DR1, until the signal component SS2 is detected for the signal component of the vibration detection signal BDS.

More specifically, the control unit 1225 controls the motor 1222 such that the gear 1222 is rotated in the direction of the arrow 1227, and the motor 1224 causes the gear 1222 in response to the control from the control unit 1225 to rotate in the direction of the arrow 1227 via the shaft member 1223. With this, the support member 1210 moves in the downward direction in terms of the gravitational direction.

Further, the control unit 1225 controls the motor 1224 such that the rotation of the gear 1222 is stopped when the signal component of the vibration detection signal BDS received from the vibration detection unit 1240 has changed from the signal component SS1 to the signal component SS2, and the motor 1224 stopps the rotation of the gear 1222 in response to the control from the control unit 1225. With this, the support unit 1210 stops the movement thereof and the seed crystal 1005 is held at the vapor-liquid interface 1003.

On the other hand, the control unit 1225 controls the motor 1224, when received the vibration detection signal BDS formed of the signal component SS2 from the vibration detection unit 1240, such that the movement of the support unit 1210 is stopped. In this case, the seed crystal 1005 is already in contact with the melt mixture 1290.

Thus, the up/down mechanism 1220 moves the support unit 1210 in the gravitational direction DR1 based on the vibration detection signal BDS detected by the vibration detection unit 1240, such that the seed crystal 1005 is in contact with the melt mixture 1290.

Figure 28:
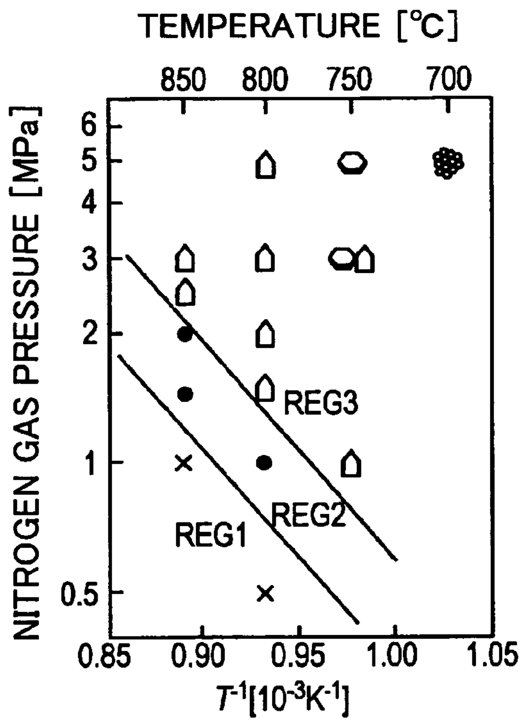
FIG. 28 is a diagram showing the relationship between the nitrogen gas pressure and the crystal growth temperature in the growth process of a GaN crystal.

FIG. 28 is a diagram showing the relationship between the nitrogen gas pressure and the crystal growth temperature in the growth process of a GaN crystal. In FIG. 28, the horizontal axis represents the crystal growth temperature while the vertical axis represents the nitrogen gas pressure.

Referring to FIG. 28, a region REG1 represents the region where dissolving of the GaN crystal takes place while the region REG2 represents the region where there occurs growth of the GaN crystal from the seed crystal while suppressing formation of new nuclei. Further, region REG3 represents a multiple nucleation region where there are formed large number of nuclei. Thus, the GaN crystal takes a form of pillar shape grown in the c-axis direction (<0001> direction) in the region REG2.

With the present embodiment, growth of the GaN crystal is made from the seed crystal while using the nitrogen gas pressure and the crystal growth temperature of the region REG2.

Further, the seed crystal comprises a GaN crystal grown in the crystal growth apparatus 1100 without using the seed crystal 1005. Thus, in the case of manufacturing the seed crystal 1005, a large number of GaN crystals are grown on the bottom surface and sidewall surface of the crucible 1010 by using the nitrogen gas pressure and crystal growth temperature of the region REG2.

Further, the seed crystal 5 is formed by slicing out the GaN crystal of the shape shown in FIGS. 25A and 25B from the numerous GaN crystals formed as a result of the crystal growth process. Thus, a projecting part 1005A of the seed crystal 1005 shown in FIG. 25B is formed of a GaN crystal grown in the c-axis direction (<0001> direction).

The seed crystal 1005 thus formed is fixed upon the support unit 1210 by fitting into the space 1214 of the support unit 1210.

Figure 29:
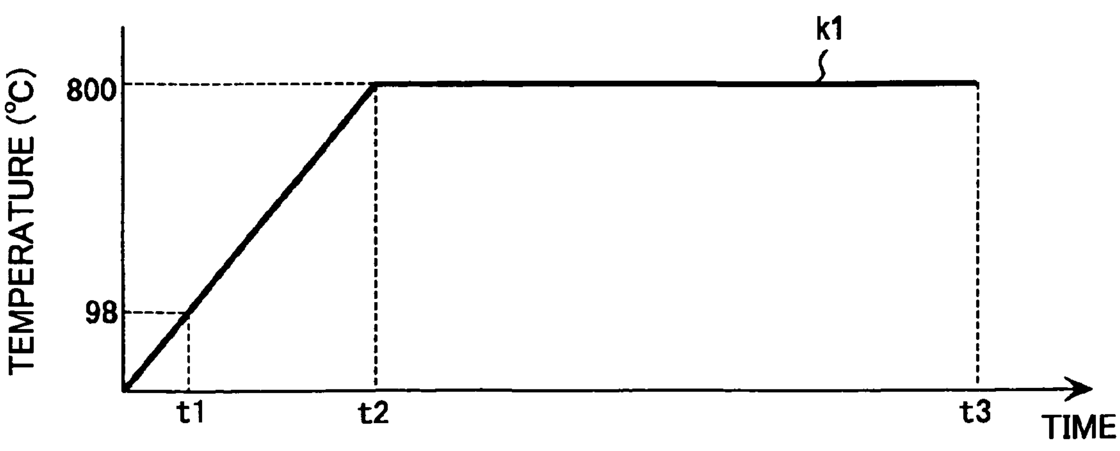
FIG. 29 is a timing chart showing the temperature of the reaction vessel and the outer reaction vessel.
Figure 30:
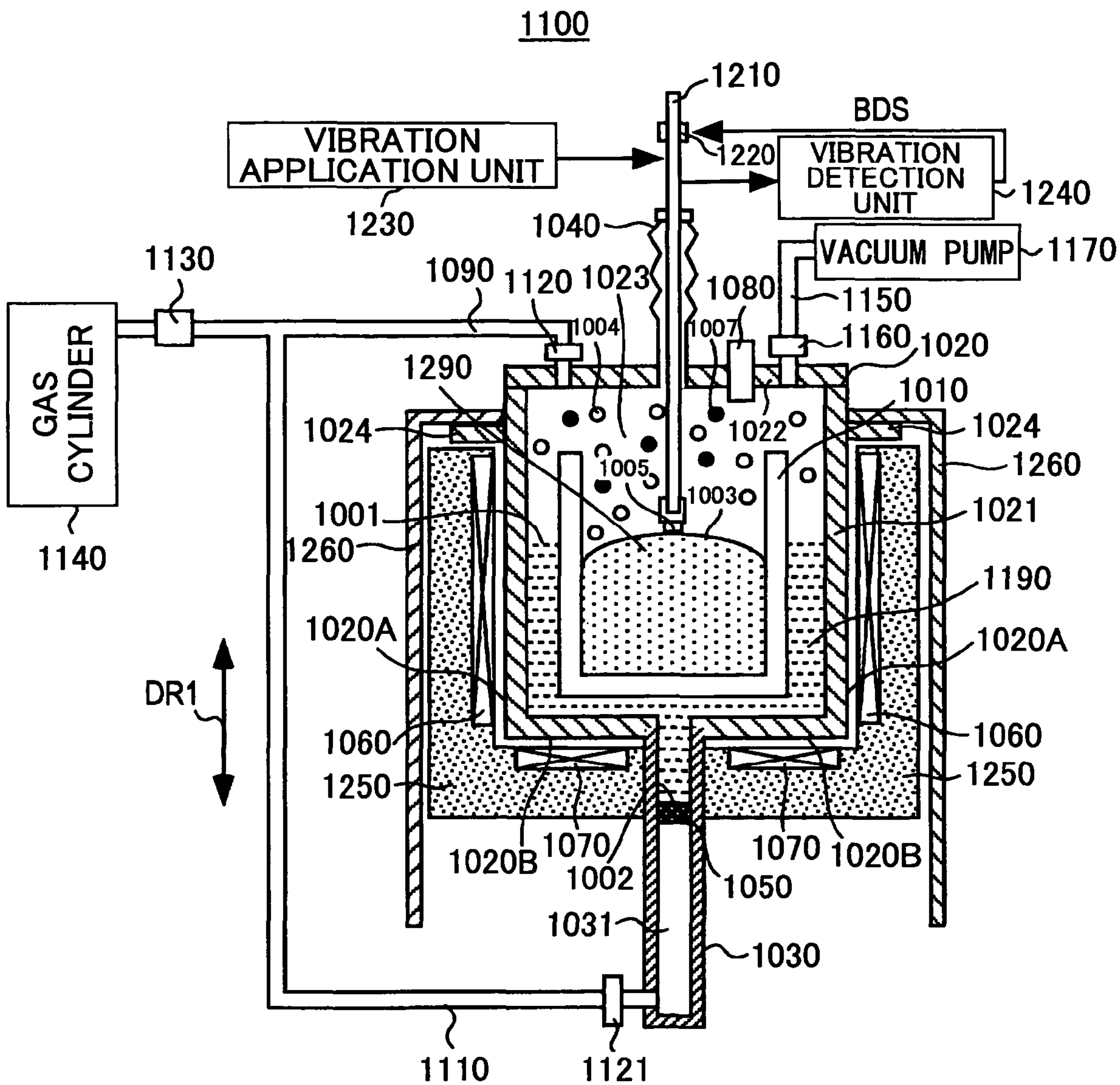
FIG. 30 is a schematic diagram showing the state inside the reaction vessel and the outer reaction vessel during the interval between two timings t1 and t2 shown in FIG. 29.
Figure 31:
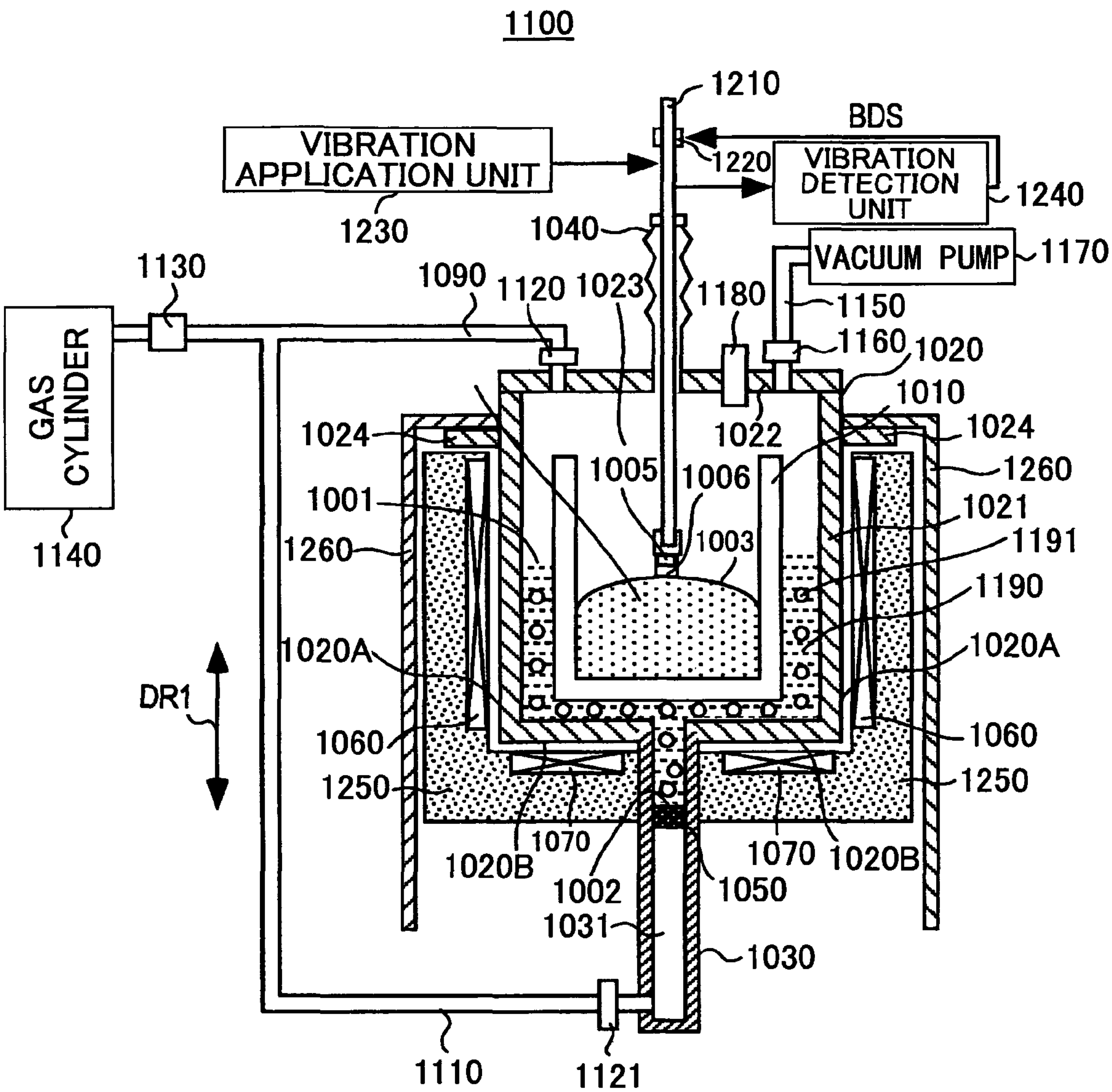
FIG. 31 is a schematic diagram showing the state inside the crucible and the reaction vessel during the interval between two timings t2 and t3 shown in FIG. 29.

FIG. 29 is a timing chart showing the temperature of the crucible 1010 and the reaction vessel 1020. Further, FIG. 30 is a schematic diagram showing the state inside the crucible 1010 and the reaction vessel 1020 during the interval between two timings t1 and t2 shown in FIG. 29. Further, FIG. 31 is a schematic diagram showing the state inside the crucible 1010 and the reaction vessel 1020 during the interval between two timings t2 and t3 shown in FIG. 29.

In FIG. 29, it should be noted that the line k1 represents the temperatures of the crucible 1010 and the reaction vessel 1020.

Referring to FIG. 29, the heaters 1060 and 1070 heat the crucible 1010 and the reaction vessel 1020 such that the temperatures thereof rise along the line k1 and are held at 800° C. When the heaters 1060 and 1070 start to heat the crucible 1010 and the reaction vessel 1020, the temperatures of the crucible 1010 and the reaction vessel 1020 start to rise and reach a temperature of 98° C. at the timing t1 and a temperate of 800° C. at the timing t2.

Thus, the metal Na held between the crucible 1010 and the reaction vessel 1020 undergoes melting, and the metal melt 1190 (=melt of metal Na) is formed. Further, the metal Na and the metal Ga held in the crucible 1010 also cause melting and the melt mixture 1290 is formed. Further, with increase of the temperatures of the crucible 1010 and the reaction vessel 1020, there is caused evaporation of metal Na from the metal melt 1190 and the melt mixture 1290 to the space 1023. As a result, the nitrogen gas 1004 and the metal Na vapor 1007 are mixed in the space 1023, while it should be noted that the nitrogen gas 1004 and the metal Na vapor 1007 cannot escape to the space 1031 inside the conduit 1030 by way of diffusion through the metal melt 1190 (=metal Na melt) and the stopper/inlet plug 1050 and are confined in the space 1023. Reference should be made to FIG. 30.

Further, during the interval from the timing t1 in which the temperatures of the crucible 1010 and the reaction vessel 1020 reach 98° C. to the timing t2 in which the temperatures of the crucible 1010 and the reaction vessel 1020 reach 800° C., it should be noted that the up/down mechanism 1220 moves the support unit 1210 up or down according to the method explained above in response to the vibration detection signal BDS from the vibration detection unit 1240 and maintains the seed crystal 1005 in contact with the melt mixture 1290.

When the temperatures of the crucible 1010 and the reaction vessel 1020 have reached 800° C., the nitrogen gas 1004 in the space 1023 is incorporated into the melt mixture 1290 via the metal Na existing in the melt mixture 1290. In this case, it should be noted that the concentration of nitrogen or GaxNy (x, y are real numbers) in the melt mixture 1290 takes the maximum value in the vicinity of the vapor-liquid interface 1003 between the space 1023 and the melt mixture 1290, and thus, growth of the GaN crystal starts from the seed crystal 1005 in contact with the vapor-liquid interface 1003. Hereinafter, GaxNy will be designated as “group III nitride” and the concentration of GaxNy will be designated as “concentration of group III nitride”. Further, in the present invention, it should be noted that “group III” means “group IIIB” as defined in a periodic table of IUPAC (International Union of Pure and Applied Chemistry).

When there is caused a decrease of the nitrogen gas in the space 1023 with progress of growth of the GaN crystal from the seed crystal, the pressure P1 inside the space 1023 becomes lower than the pressure P2 of the space 1031 inside the conduit 1030. Then, the stopper/inlet plug 1050 supplies the nitrogen gas in the space 1031 of the conduit 1030 to the metal melt 1190.

The nitrogen gas thus supplied to the metal melt 1190 migrates through the metal melt 1190 in the form of bubbles 1191 and is supplied to the space 1023. Further, when the pressure P1 of the space 1023 has become generally equal to the pressure P2 of the space 1031, the supply of the nitrogen gas to the space 1023 from the space 1031 is stopped.

Thus, the growth of the GaN crystal 1006 takes place from the seed crystal 1005 in the state that the nitrogen gas is supplied to the space 1023 through the metal melt 1191 and the pressure P1 of the space 1023 is held generally constant.

Further, with progress of the crystal growth from the seed crystal, there occurs a decrease of the metal Ga in the melt mixture 1290, while this causes lowering of the vapor-liquid interface 1003. When this occurs, the up/down mechanism 1220 lowers the support unit 1210 according to the process explained above such that the seed crystal 1005 or the GaN crystal 1006 grown from the seed crystal 1005 maintains the contact with the melt mixture 1290.

Further, during the interval from the timing t2 to the timing t3, in which the temperature of the crucible 1010 and the reaction vessel 1020 is held at 800° C., the filler 1250 interrupts the escaping of heat from the heating unit 1060 located at an inner side of the filler 1250 to the outside located at the outer side of the filler 1250, while the metal member 1260 blocks escaping of heat from the reaction vessel 1020 by way of convection. Thus, during the interval from the timing t2 to the timing t3, the crucible 1010 and the reaction vessel 1020 are thermally blanketed by the filler 1250 and the metal member 1260.

Thus, with the crystal growth apparatus 1100, the crystal growth of the GaN crystal is achieved in the state that the reaction vessel 1020, the heaters 1060 and 1070 and the filler 1250 are covered by the metal member 1260. Thus, in the crystal growth apparatus 1100, the crystal growth of the GaN crystal takes place in the state the escaping of heat from the crucible 1010 and the reaction vessel 1020 is blocked by the metal member 1260. Thus, the crystal growth apparatus 1100 grows the GaN crystal while blanketing the reaction vessel 1010 and the 1020 by the metal member 1260.

Thus, with the present invention, it becomes possible to maintain the temperatures of the crucible 1010 and the reaction vessel 1020 heated by the heaters 1060 and 1070 at the crystal growth temperature during the crystal growth of the GaN crystal. In high pressure environment as in the case of the flux process of the present invention, there has been a problem that extensive heat escaping takes place by way of convection when there is provided no metal member 1260 or heat shielding material, and it has been difficult to set the reaction vessel 20 to a uniform crystal growth temperature stably. The present invention successfully solved this problem.

Further, with the crystal growth apparatus 1100, growth of the GaN crystal is conducted while confining the nitrogen gas 1004 and the metal Na vapor 1007 in the crucible 1010 and in the space 1023 of the reaction vessel 1020 by the stopper/inlet plug 1050 and the metal melt 1190 (=metal Na melt).

Thus, the present invention grows a GaN crystal by suppressing the diffusion of metal Na evaporated from the metal melt 1190 and the melt mixture 1290 to the outside by using the stopper/inlet plug 1050 and the metal melt 1190 (=metal Na melt).

Thereby, it becomes possible to grown a GaN crystal of large size by suppressing the evaporation of the metal Na from the melt mixture 1290 to the space 123.

Figure 32:
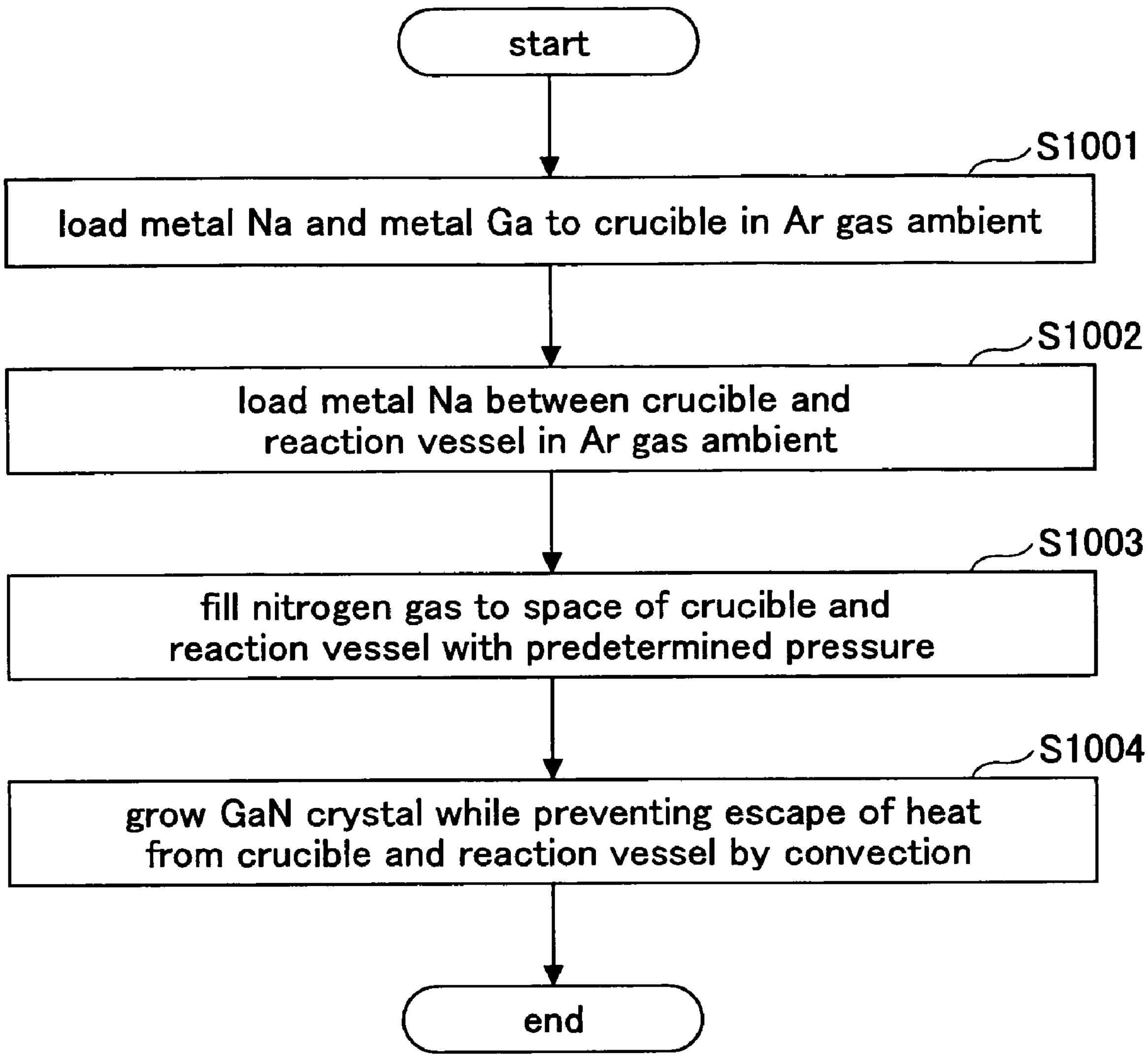
FIG. 32 is a flowchart explaining the manufacturing method of a GaN crystal according to Embodiment 3 of the present invention.

FIG. 32 is a flowchart explaining the manufacturing method of a GaN crystal according to Embodiment 3 of the present invention.

Referring to FIG. 32, the crucible 10 and the reaction vessel 1020 are incorporated into a glove box filled with an Ar gas when a series of processes are started. Further, metal Na and metal Ga are loaded into the crucible 1010 in an Ar gas ambient (Step S1001). In the present case, the metal Na and the metal Ga are loaded into the crucible 1010 with a molar ratio of 5:5. The Ar gas should be the one having a water content of 10 ppm or less and an oxygen content of 10 ppm or less (this applied throughout the present invention).

Further, the metal Na is loaded between the crucible 1010 and the reaction vessel 1020 in the ambient of an Ar gas (step S1002). Further, the seed crystal 1005 is set in the ambient of the Ar gas at a location above the metal Na and the metal Ga. More specifically, the seed crystal 1005 is set above the metal Na and metal Ga in the crucible 1010 by fitting the seed crystal 1005 to the space 1214 formed at the end 12111 of the support unit 1210. Reference should be made to FIG. 25B.

Next, the crucible 1010 and the reaction vessel 1020 are set in the crystal growth apparatus 1100 in the state that the crucible 1010 and the reaction vessel 1020 are filled with the Ar gas.

Next, the valve 1160 is opened and the Ar gas filled in the crucible 1010 and the reaction vessel 1020 is evacuated by the vacuum pump 1170. After evacuating the interiors of the crucible 1010 and the reaction vessel 1020 to a predetermined pressure (0.133 Pa or lower) by the vacuum pump 1170, the valve 1160 is closed and the valves 1120 and 1121 are opened. Thereby, the crucible 1010 and the reaction vessel 1020 are filled with the nitrogen gas from the gas cylinder 1140 via the gas supply lines 1090 and 1110. In this case, the nitrogen gas is supplied to the crucible 1010 and the reaction vessel 1020 via the pressure regulator 1130 such that the pressure inside the crucible 1010 and the reaction vessel 1020 becomes about 0.1 MPa.

Further, when the pressure inside the reaction vessel 1020 as detected by the pressure sensor 1180 has reached about 0.1 MPa, the valves 1120 and 1121 are closed and the valve 1160 is opened. With this the nitrogen gas filled in the crucible 1010 and the reaction vessel 1020 is evacuated by the vacuum pump 1170. In this case, too, the interior of the crucible 1010 and the reaction vessel 1020 is evacuated to a predetermined pressure (0.133 Pa or less) by using the vacuum pump 1170.

Further, this vacuum evacuation of the crucible 1010 and the reaction vessel 1020 and filling of the nitrogen to the crucible 1010 and the reaction vessel 1020 are repeated several times.

Thereafter, the interior of the crucible 1010 and the reaction vessel 1020 is evacuated to a predetermined pressure by the vacuum pump 1170, and the valve 1160 is closed. Further, the valves 1120 and 1121 are opened and the nitrogen gas is filled into the crucible 1010 and the reaction vessel 1020 by the pressure regulator 1130 such that the pressure of the crucible 1010 and the reaction vessel 1020 becomes the range of 1.01-5.05 MPa.

Because the metal Na between the crucible 1010 and the reaction vessel 1020 is solid in this state, the nitrogen gas is supplied to the space 1023 inside the reaction vessel 1020 also from the space 31 of the conduit 1030 via the stopper/inlet plug 1050. When the pressure of the space 1023 as detected by the pressure sensor 1180 has become 1.01-5.05 Pa, the valve 1120 is closed.

With this, growth of the GaN crystal is conducted while blocking the escaping of heat from the crucible 1010 and the reaction vessel 1020 by way of convection (step S1004). Further, a series of the steps are completed.

Figure 33:
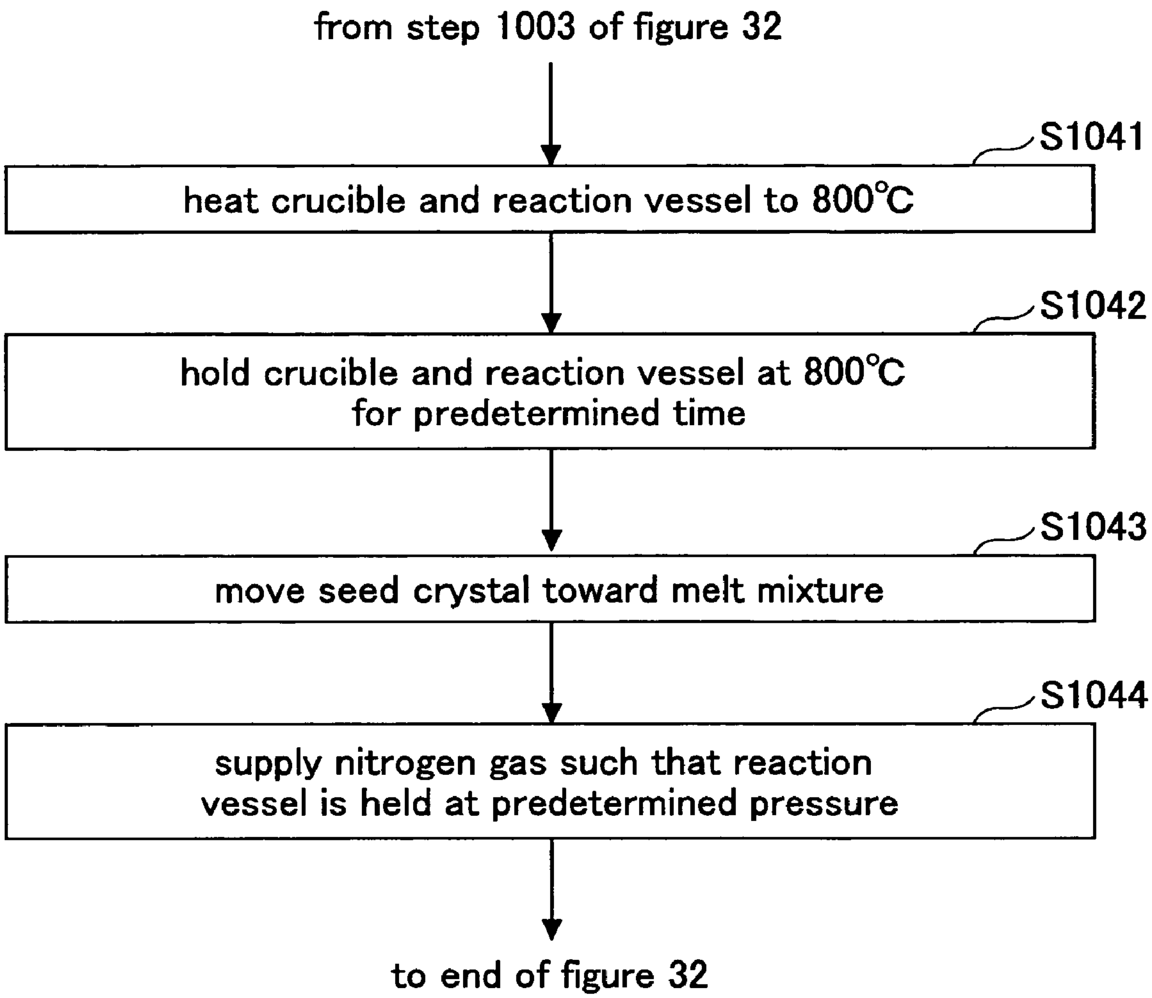
FIG. 33 is a flowchart explaining the detailed operation of the step S1004 in the flowchart shown in FIG. 32.

FIG. 33 is a flowchart explaining the detailed operation of the step S1004 in the flowchart shown in FIG. 32;

The detained operation of the step S1004 shown in FIG. 32 is achieved by conducting the following operations in the state in which the crucible 1010, the reaction vessel 1020, the heaters 1060 and 1070 and the filler 1250 are covered by the metal member 1260.

Thus, after the step S1003, the crucible 1010 and the reaction vessel 1020 are heated to 800° C. by using the heaters 1060 and 1070 (step S1041). In this process of heating the crucible 1010 and the reaction vessel 1020 to 800° C., the metal melt Na held between the crucible 1010 and the reaction vessel 1020 undergoes melting in view of the melting temperature of metal Na of about 98° C., and the metal melt 1190 is formed. Thereby, two vapor-liquid interfaces 1001 and 1002 are formed. Reference should be made to FIG. 22. The vapor-liquid interface 1001 is located at the interface between the metal melt 1190 and the space 1023 in the reaction vessel 1120, while the vapor-liquid interface 1002 is located at the interface between the metal melt 1190 and the stopper/inlet plug 1050.

At the moment the temperature of the crucible 1010 and the reaction vessel 1020 is raised to 800° C., the temperature of the stopper/inlet plug 1050 becomes 150° C. This means that the vapor pressure of the metal melt 1190 (=metal Na melt) at the vapor-liquid interface 2 is $7.6\times10^{-4}$ Pa, and thus, there is caused little evaporation of the metal melt 1190 (=metal Na melt) through the gaps 1053 of the stopper/inlet plug 1050. As a result, there occurs little decrease of the metal melt 1190 (=metal Na melt).

Further, even when the temperature of the stopper/inlet plug 1050 is raised to 300° C. or 400° C., the vapor pressure of the metal melt 1190 (=metal Na melt) is only 1.8 Pa and 47.5 Pa, respectively, and decrease of the metal melt 1190 (=metal Na melt) by evaporation is almost ignorable with such a vapor pressure.

Thus, with the crystal growth apparatus 1100, the temperature of the stopper/inlet member 1050 is set to a temperature such that there occurs little decrease of the metal melt 1190 (=metal Na melt) by way of evaporation.

Further, during the step in which the crucible 1010 and the reaction vessel 1020 are heated to 800° C., the metal Na and the metal Ga inside the crucible 1010 becomes a liquid, and the melt mixture 1290 of metal Na and metal Ga is formed in the crucible 1010. Next, the up/down mechanism 1220 causes the seed crystal 1005 to make a contact with the melt mixture 1290.

Further, when the temperature of the crucible 1010 and the reaction vessel 1020 is elevated to 800° C., the nitrogen gas in the space 1023 is incorporated into the melt mixture 1290 via the metal Na in the melt mixture 1290, and there starts the growth of GaN crystal from the seed crystal 1005.

Thereafter, the crucible 1010 and the reaction vessel 1020 are held at the temperature of 800° C. for a predetermined duration (several ten hours to several hundred hours) (step S1042).

Further, with progress of crystal growth from the seed crystal, there occurs a decrease of the metal Ga in the melt mixture 1290, while this causes lowering of the vapor-liquid interface 1003. When this occurs, the up/down mechanism 1220 lowers the support unit 1210 according to the process explained above such that the seed crystal 1005 or the GaN crystal 1006 grown from the seed crystal 1005 maintains the contact with the melt mixture 1290 (step S1043).

Further, with progress of the crystal growth of the GaN crystal, there occurs consumption of the nitrogen gas in the space 1023, while this leads to decrease of the nitrogen gas in the space 1023. Then the pressure P1 of the space 1023 becomes lower than the pressure P2 of the space 1031 inside the conduit 1030 (P1<P2), and there is formed a differential pressure between the space 1023 and the space 1031. Thus, the nitrogen gas in the space 1031 is supplied to the space 1023 consecutively via the stopper/inlet plug 1050 and the metal melt 1190 (=metal Na melt) (step S1044). With this, it becomes possible to maintain the nitrogen concentration or the concentration of the group III nitride in the melt mixture 1290 generally constant, and a GaN crystal of large size is grown.

After the predetermined time has elapsed, the temperatures of the crucible 1010 and the reaction vessel 1020 are lowered, and manufacturing of the GaN crystal is completed.

Figure 34:
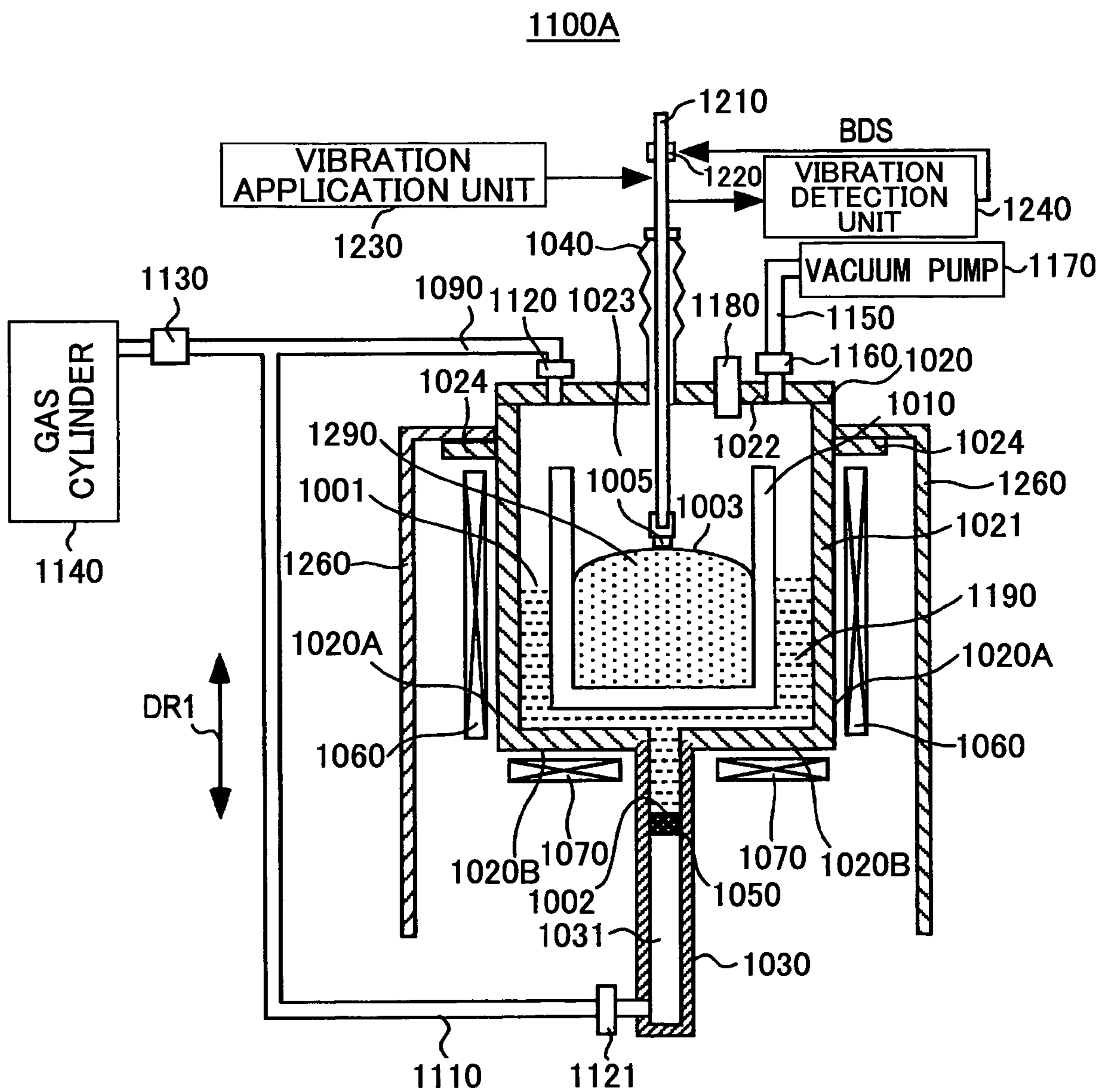
FIG. 34 is a schematic cross-sectional diagram showing the construction of a crystal growth apparatus according to Embodiment 3 of the present invention.

FIG. 34 is another schematic cross-sectional diagram showing the construction of the crystal growth apparatus according to Embodiment 3 of the present invention. It should be noted that the crystal growth apparatus of Embodiment 3 may be a crystal growth apparatus 1100A shown in FIG. 34.

Referring to FIG. 34, the crystal growth apparatus 1100A has a construction generally identical with the construction of the crystal growth apparatus 1100, except that the filler 1250 is removed from the crystal growth apparatus 1100.

Thus, with the crystal growth apparatus 1100A, the reaction vessel 1020 and the heaters 1060 and 1070 are surrounded by the metal member 1260. The metal member 1260 blocks the escaping of heat from the crucible 1010 and the reaction vessel 1020 by way of convention.

Thus, it is possible to prevent the escaping of heat from the crucible 1010 and the reaction vessel 1020 by convection even when there is provided no filler 1250, and the crucible 1010 and the reaction vessel 1020 are thermally blanketed successfully.

Manufacturing the GaN crystal with the crystal growth apparatus 1100A is conducted according to the flowchart shown in FIGS. 32 and 33.

Otherwise, the present embodiment is identical to the embodiment described previously.

As explained above, the crystal growth apparatuses 1100 and 1100A carries out crystal growth of a GaN crystal while preventing the escaping of heat from the crucible 1010 and the reaction vessel 1020 by convection, by means of the metal member 1260 provided so as to cover the reaction vessel 1020, the heaters 1060 and 1070 and further the filler 1250 (or alternatively the reaction vessel 1020 and the heaters 1060 and 1070). Thus, the present invention has the feature of growing the GaN crystal while blanketing the reaction vessel 1010 and the 1020 by the metal member 1260.

With this feature, it becomes possible to maintain the temperatures of the crucible 1010 and the reaction vessel 1020 at the crystal growth temperature during the growth of the GaN crystal. As a result, the crystal growth process of the GaN crystal from the seed crystal 1005 is stabilized and it becomes possible to manufacture a GaN crystal of large size. This GaN crystal is a defect-free crystal having a columnar shape grown in the c-axis direction (<0001> direction).

Further, with the crystal growth apparatus 1100 and 1100A, the temperature T1 of the vapor-liquid interface 1001 between the space 1023 inside the reaction vessel 1020 and the metal liquid 1190 or of the temperature near the vapor-liquid interface 1001, and the temperature T2 of the vapor-liquid interface 1003 between the space 1023 and the melt mixture 1290 or of the temperature near the vapor-liquid interface 1003, are set to the respective temperatures such that the vapor pressure of the metal Na evaporated from the metal melt 1190 is generally identical with the vapor pressure of the metal Na evaporated from the melt mixture 1290.

When these two temperatures are identical, the vapor pressure of the metal Na evaporated from the metal melt 1190 becomes higher than the vapor pressure of the metal Na evaporated from the melt mixture 1290, and thus, the temperature T1 is set to be lower than the temperature T2 such that the vapor pressure of the metal Na evaporated from the metal melt 1190 becomes generally identical with the vapor pressure of the metal Na evaporated from the melt mixture 1290.

As a result, migration of the metal Na from the metal melt 1190 to the melt mixture 1290 balances with migration of the metal Na from the melt mixture 1290 to the metal melt 1190 in the space 1023, and it becomes possible to suppress the change of molar ratio of the metal Na and the metal Ga in the melt mixture 1290 caused by the migration of the metal Na from the metal melt 1190 to the melt mixture 1290 or from the melt mixture 1290 to the metal melt 1190. Thereby, it becomes possible to manufacture a GaN crystal of large size stably.

While it was explained in the flowchart of FIG. 32 that the seed crystal 1005 is caused to make a contact with the melt mixture 1290 of the metal Na and the metal Ga when the crucible 1010 and the reaction vessel 1020 are heated to 800° C., the present embodiment is not limited to such a particular process and it is also possible to hold the seed crystal 5 in the melt mixture 1290 of the metal Na and the metal Ga when the crucible 1010 and the reaction vessel 1020 are heated to 800° C. Thus, when the crucible 1010 and the reaction vessel 1020 are heated to 800° C., it is possible to carry out the crystal growth of the GaN crystal from the seed crystal 1005 by dipping the seed crystal 1005 into the melt mixture 1290.

It should be noted that the operation for making the seed crystal 1005 to contact with the melt mixture 1290 comprises the step A for applying a vibration to the support unit 1210 by the vibration application unit 1230 and detecting the vibration detection signal BDS indicative of the vibration of the support unit 1210; and the step B of moving the support unit 1210 by the up/down mechanism 1220 such that the vibration detection signal changes to the state (component SS2 of the vibration detection signal BDS) corresponding to the situation where the seed crystal 5 has made contact with the melt mixture 290.

Further, it should be noted that the operation for holding the seed crystal 1005 in the melt mixture 1290 comprises the step A for applying a vibration to the support unit 1210 by the vibration application unit 1230 and detecting the vibration detection signal BDS indicative of the vibration of the support unit 1210; and the step B of moving the support unit 1210 by the up/down mechanism 1220 such that the vibration detection signal changes to the state (component SS3 of the vibration detection signal BDS) corresponding to the situation where the seed crystal 1005 been dipped into the melt mixture 1290.

In the steps B and C, it should be noted that the support unit 1210 is moved by the up/down mechanism 1220 because there is caused variation of location for the melt surface (=interface 1003) for the melt mixture 1290 formed in the crucible 1010 depending on the volume of the crucible 1010 and the total amount of the metal Na and the metal Ga loaded into the crucible 1010, as in the case of the seed crystal 1005 being dipped into the melt mixture 1290 at the moment when the melt mixture 1290 is formed in the crucible 1010 or the seed crystal 1005 being held in the space 1023, and thus there is a need of moving the seed crystal up or down in the gravitational direction DR1 in order that the seed crystal 1005 makes a contact with the melt mixture 1290 or the seed crystal 1005 is dipped into the melt mixture 1290.

Further, while it has been explained that the height H of the projection 1052 of the stopper/inlet plug 1050 and the separation d between the projections 52 are explained as several ten microns, it is possible that the height H of the projection 1052 and the separation d between the projections 52 may be determined by the temperature of the stopper/inlet plug 1050.

More specifically, when the temperature of the stopper/inlet plug 1050 is relatively high, the height H of the projection 1052 is set relatively higher and the separation d between the projections 1052 is set relatively smaller. Further, when the temperature of the stopper/inlet plug 1050 is relatively low, the height H of the projection 1052 is set relatively lower and the separation d between the projections 52 is set relatively larger. Thus, in the case the temperature of the stopper/inlet plug 50 is relatively high, the size of the gap 1053 between the stopper/inlet plug 1050 and the conduit 1030 is set relatively small, while in the case the temperature of the stopper/inlet plug 1050 is relatively high, the size of the gap 1053 between the stopper/inlet plug 1050 and the conduit 1030 is set relatively larger. It should be noted that the size of the cap 1053 is determined by the height H of the projection 1052 and the separation d between the projections 1052, while the size of the gap 1053 capable of holding the metal melt 1190 by the surface tension changes depending on the temperature of the stopper/inlet plug 1050. Thus, the height H of the projection 1052 and the separation d between the projections 1052 are changed depending on the temperature of the stopper/inlet plug 1050 and with this, the metal melt 1190 is held reliably by the surface tension.

Further, the temperature control of the stopper/inlet valve 1050 is achieved by the heater 1070. Thus, when the stopper/inlet plug 1050 is to be heated to a temperature higher than 150° C., the stopper/inlet plug 1050 is heated by the heater 1070.

Further, with the present embodiment, it is possible to use an oxide such as of alumina ($Al_2O_3$), ceramics, carbon, $Si_3N_4$, aluminum titanate, and the like, or nitride for the member that interrupts the gas flow in the direction away from the reaction vessel 1020 in place of the metal member 1260.

Further, with the present invention, the gas cylinder 1140, the gas supply lines 1090 and 1110, the conduit 1030, the stopper/inlet plug 1050 and the metal melt 1190 constitute the "gas supply unit".

Further, with the present invention, the heaters 1060 and 1070 constitute the "heating unit", wherein the heater 1060 constitutes the "first heater" and the heater 1070 constitutes the "second heater".

Further, with the present invention, the metal member 1260 constitutes the "shielding member".

Further, with the present invention, the metal member 1260 constitutes the "heat blanket unit".

Further, with the present invention, the filler 1250 and the metal member 1260 constitute the "heat blanket unit".

Embodiment 4

Figure 35:
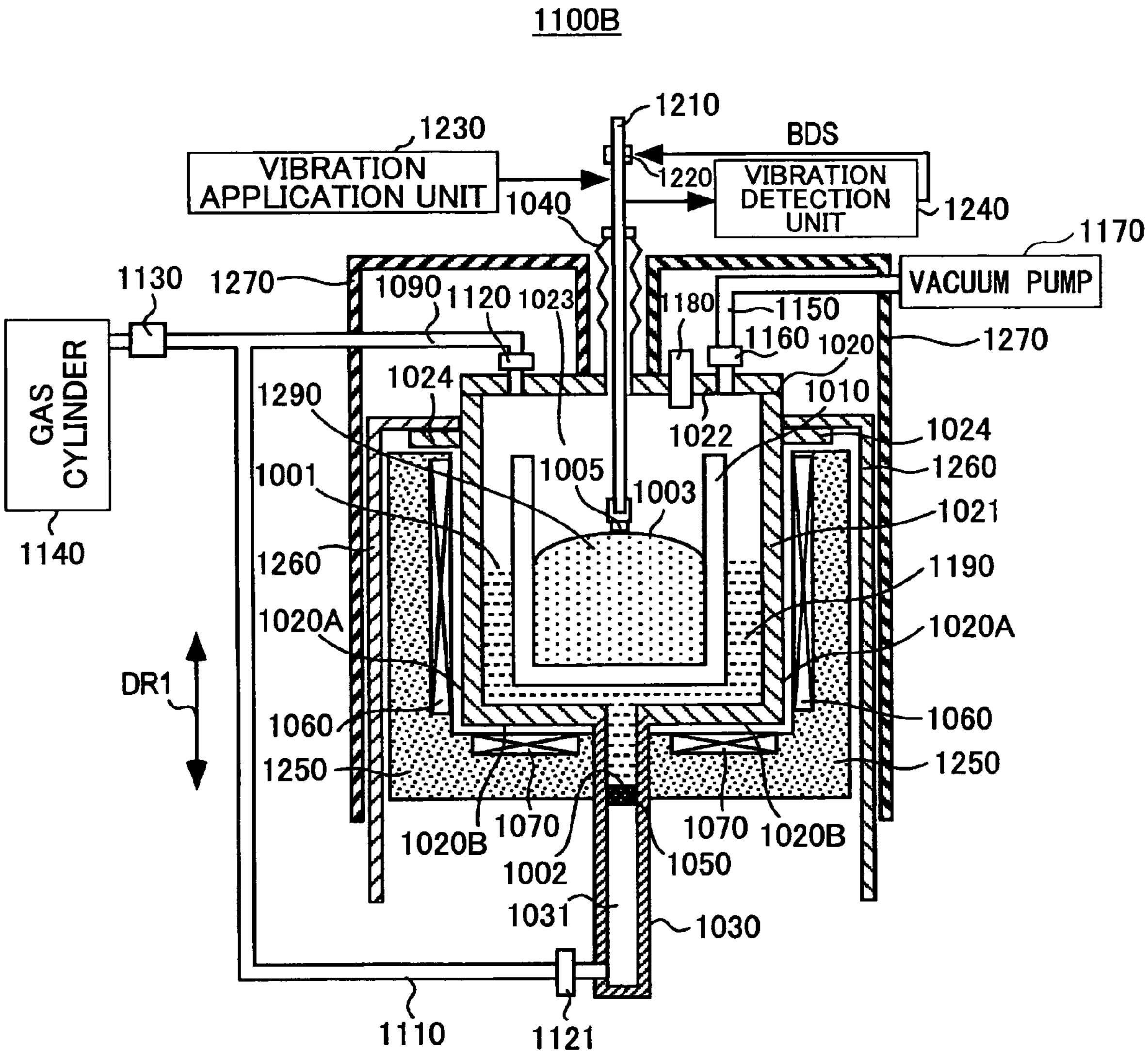
FIG. 35 is a schematic cross-sectional diagram showing the construction of a crystal growth apparatus according to Embodiment 4 of the present invention.

FIG. 35 is a schematic cross-sectional diagram showing the construction of a crystal growth apparatus according to Embodiment 4 of the present invention;

Referring to FIG. 35, the crystal growth apparatus 1100B has a construction generally identical with the construction of the crystal growth apparatus 1100, except that the metal member 1270 is added to the crystal growth apparatus 1100 shown in FIG. 22.

The metal member 1270 comprises SUS316L and has a hollow cylindrical form. Thereby, the metal member 1270 is disposed such that an end thereof is placed upon the lid 1022 of the reaction vessel except for a connection part connecting the lid 1022 of the reaction vessel 1020 and the bellows 1040 and such that the metal member 1270 covers the reaction vessel 1020, the heaters 1060 and 1070, the filler 1250 and the metal member 1260. It should be noted that the other end of the metal member 1270 is opened and is disposed at a location lower than the heater 1070.

By providing the metal member 1270 in addition to the metal member 1260, it becomes possible to block the escaping of heat from the crucible 1010 and the reaction vessel 1020 with further improved efficiency. More specifically, it should be noted that, with such a construction, the heat emitted from the outer peripheral surface 1020A of the reaction vessel 1020 has to pass through the metal member 1260, the space between the metal member 1260 and the metal member 1270 and further the metal member 1270, in order that the heat thus emitted reaches the region outside the metal member 1270. Further, because the metal member 1270 covers the lid 1022 of the reaction vessel 1020, escaping of heat from the lid 1022 of the reaction vessel 1020, which is adjacent to the space 1023, by way of convection can also be blocked.

As a result, it becomes possible to maintain the temperature of the crucible 1010 and the reaction vessel 1020 at the crystal growth temperature during the growth of the GaN crystal.

Manufacturing the GaN crystal with the crystal growth apparatus 1100B is conducted according to the flowchart shown in FIGS. 32 and 33.

Figure 36:
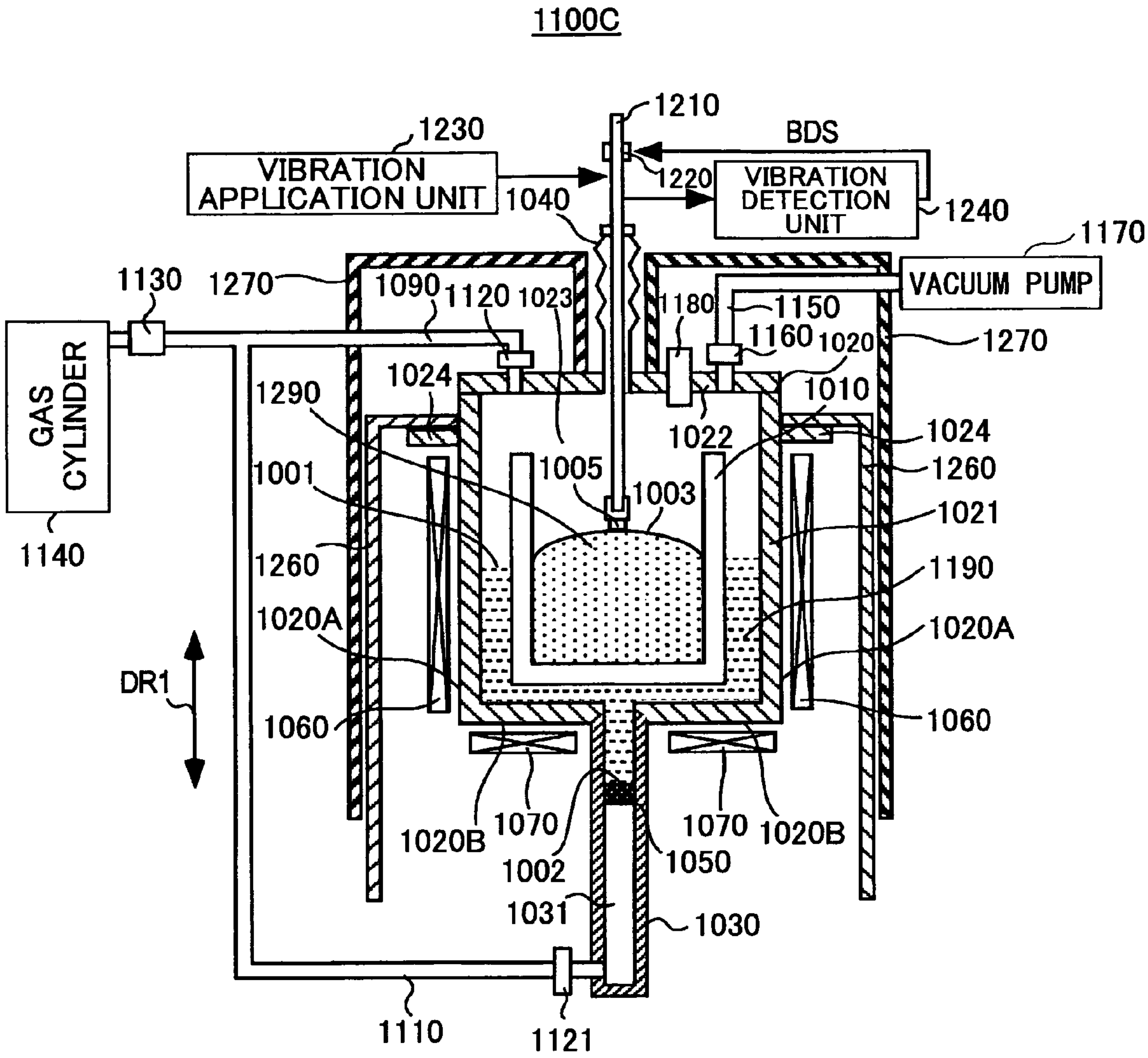
FIG. 36 is a schematic cross-sectional diagram showing the construction of a crystal growth apparatus according to Embodiment 4 of the present invention.

FIG. 36 is another schematic cross-sectional diagram showing the construction of the crystal growth apparatus according to Embodiment 4 of the present invention. It should be noted that the crystal growth apparatus of Embodiment 4 may be the crystal growth apparatus 1100C shown in FIG. 36.

Referring to FIG. 36, the crystal growth apparatus 1100C has a construction generally identical with the construction of the crystal growth apparatus 1100B shown in FIG. 35, except that the filler 1250 is removed.

Because the metal member 1260 covers the reaction vessel 1020 and the heaters 1060 and 1070 and because the metal member 1270 covers the lid 1022 of the reaction vessel 1020 and the metal member 1260, it becomes possible to prevent the escaping of heat from the crucible 1010 and the reaction vessel 1020 by way of convention, even when the filler 1250 is removed.

Manufacturing the GaN crystal with the crystal growth apparatus 1100C is conducted according to the flowchart shown in FIGS. 32 and 33.

Figure 37:
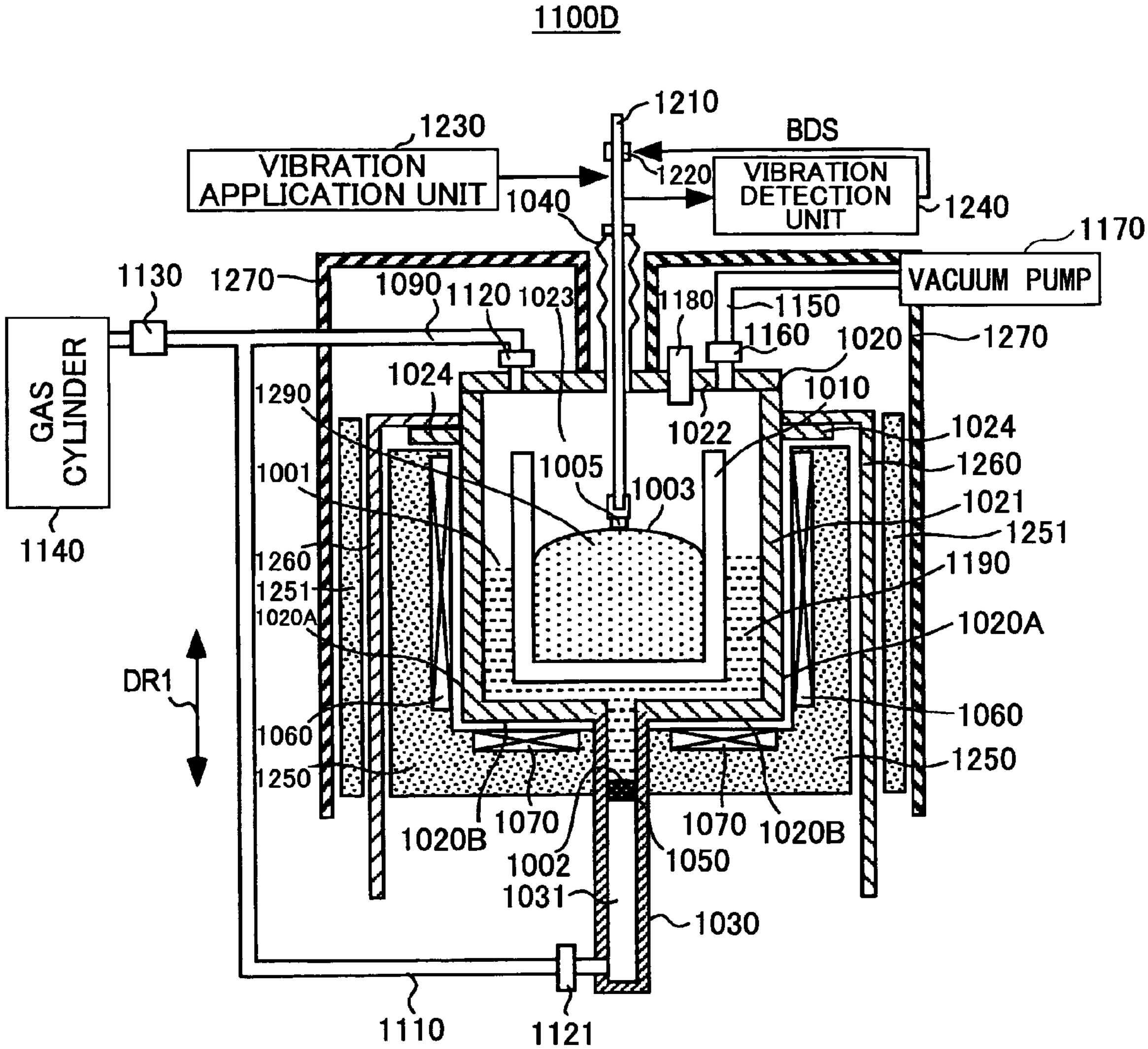
FIG. 37 is another schematic cross-sectional diagram showing the construction of the crystal growth apparatus according to Embodiment 4 of the present invention.

FIG. 37 is a further schematic cross-sectional diagram showing the construction of the crystal growth apparatus according to Embodiment 4 of the present invention. It should be noted that the crystal growth apparatus of Embodiment 4 may be a crystal growth apparatus 1100D shown in FIG. 37.

Referring to FIG. 37, the crystal growth apparatus 1100D has a construction generally identical with the construction of the crystal growth apparatus 1100B, except that the filler 1251 is added to the crystal growth apparatus 1100.

The filler 1251 is disposed between the metal member 1260 and the metal member 1270. By providing the filler 1251, it becomes possible to suppress the gas flow in the direction away from the reaction vessel 1020, and it becomes possible to thermally blanket the crucible 1010 and the reaction vessel 1020 with further improved efficiency.

Manufacturing the GaN crystal with the crystal growth apparatus 1100D is conducted according to the flowchart shown in FIGS. 32 and 33. It should be noted that the crystal growth apparatus of Embodiment 4 may also be the one in which the filler 1250 is removed from the crystal growth apparatus 110D shown in FIG. 37.

Further, while it has been explained in the description above that the metal members 1260 and 1270 are used, the present embodiment is not limited to such a specific construction and it is also possible to use an oxide such as of alumina ($Al_2O_3$), ceramics, carbon, $Si_3N_4$, aluminum titanate, and the like, or nitride for the member that interrupts the gas flow in the direction away from the reaction vessel 1020 in place of the metal member 1260 and 1270.

Otherwise, the present embodiment is identical to the embodiment described previously.

Further, with the present invention, the metal members 1260 and 1270 constitute the "shielding member".

Further, with the present invention, the metal members 1260 and 1270 constitute the "heat blanketing unit".

Further, with the present invention, the filler 1250 and the metal member 1260 constitute the "heat blanket unit".

Further, with the present invention, the fillers 1250 and 1251 and the metal members 1260 and 1270 constitute the "heat blanket unit".

Further, the metal member 1260 constitutes the "first shielding member", while the metal member 1270 constitutes the "second shielding member".

Otherwise, the present embodiment is identical to Embodiment 3.

Embodiment 5

Figure 38:
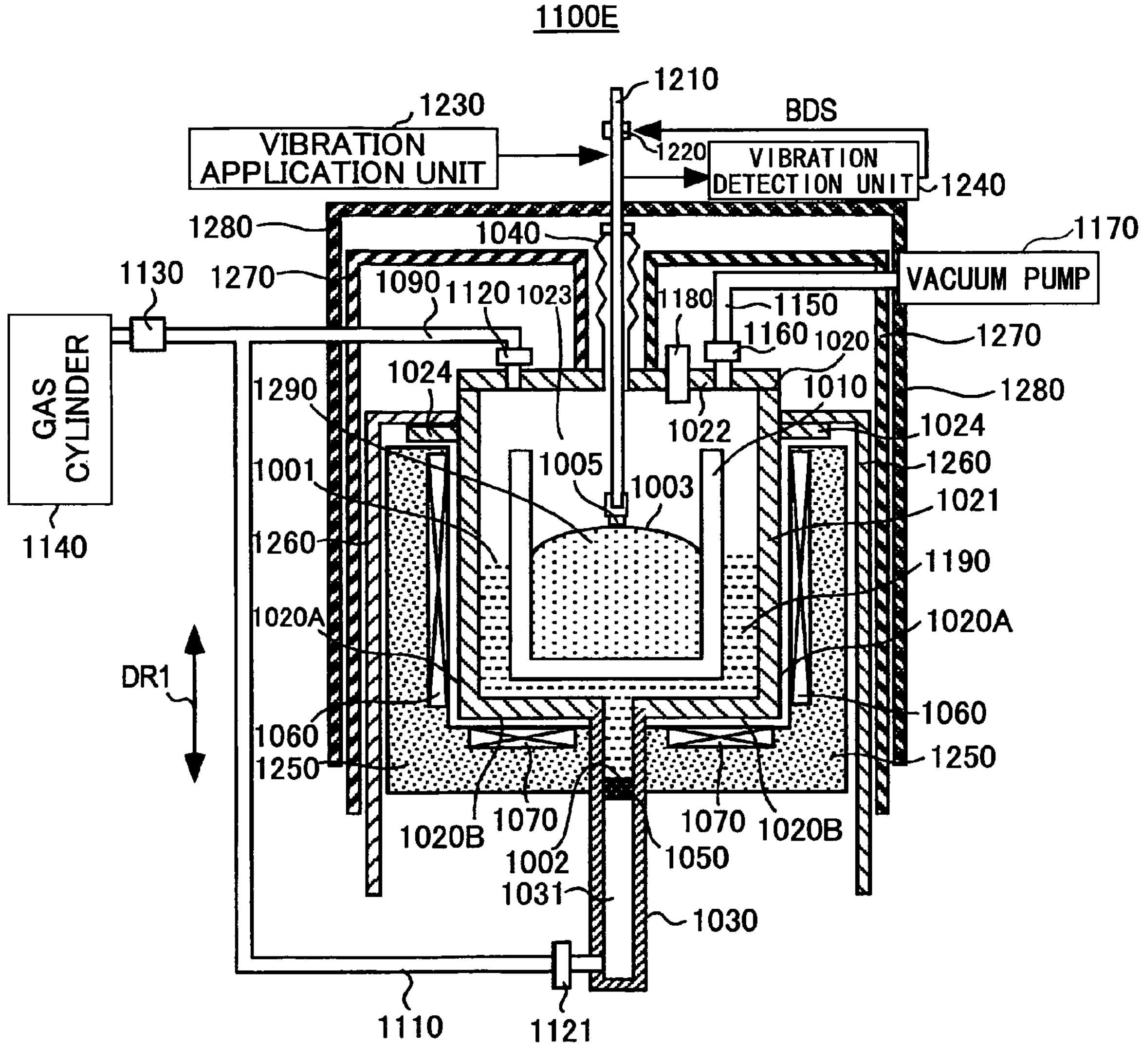
FIG. 38 is a schematic cross-sectional diagram showing the construction of a crystal growth apparatus according to Embodiment 5 of the present invention.

FIG. 38 is a schematic cross-sectional diagram showing a crystal growth apparatus according to Embodiment 5 of the present invention.

Referring to FIG. 38, a crystal growth apparatus 1100E has a construction generally identical with the construction of the crystal growth apparatus 1100B, except that the metal member 1280 is added to the crystal growth apparatus 1100B shown in FIG. 35.

The metal member 1280 comprises SUS316L and has a hollow cylindrical form. Thereby, the metal member 1280 covers the bellows 1040 and the metal member 1270. Further, it should be noted that the opened end of the metal member 1270 is disposed at a location lower than the heater 1070.

By providing the metal member 1280 in addition to the metal members 1260 and 1270, it becomes possible to block the escaping of heat from the crucible 1010 and the reaction vessel 1020 with further improved efficiency. More specifically, it should be noted that, with such a construction, the heat emitted from the outer peripheral surface 1020A of the reaction vessel 1020 has to pass through the metal member 1260, the space between the metal member 1260 and the metal member 1270 and further the metal member 1270, in order that the heat thus emitted reaches the region outside the metal member 1270. Further, the heat emitted from the lid 1022 of the reaction vessel 1020 has to travel through the metal member 1270 and the space between the metal member 1270 and the metal member 1280 and further through the metal member 1280 in order to reach the region outside the metal member 1280. Thus, it becomes possible to block the escaping of heat from the lid 1022 of the reaction vessel 1020 exposed to the space 1023 by convection with further improved efficiency.

As a result, it becomes possible to maintain the temperatures of the crucible 1010 and the reaction vessel 1020 at the crystal growth temperature during the growth of the GaN crystal.

Manufacturing the GaN crystal with the crystal growth apparatus 1100E is conducted according to the flowchart shown in FIGS. 32 and 33.

Figure 39:
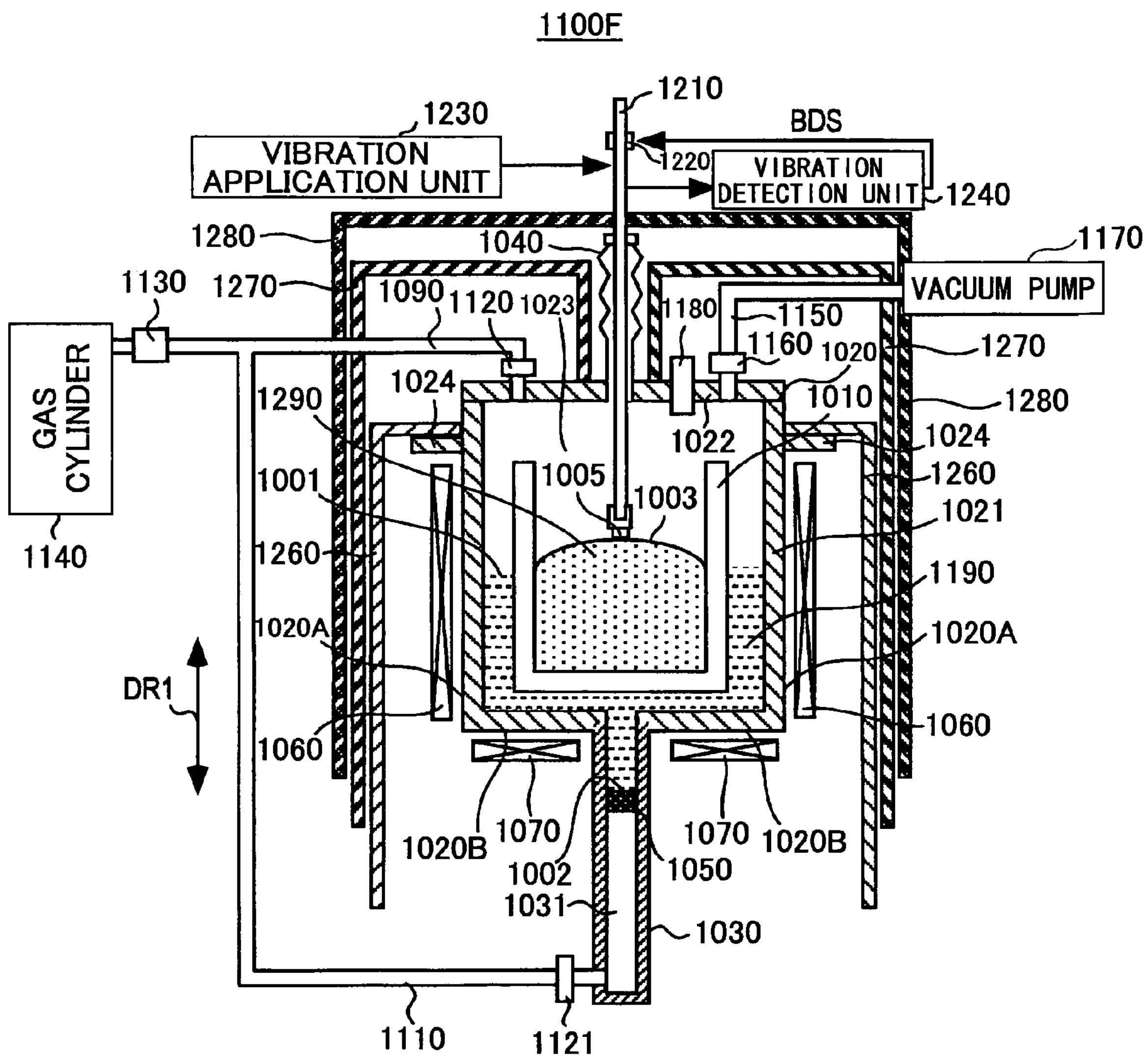
FIG. 39 is another schematic cross-sectional diagram showing the construction of the crystal growth apparatus according to Embodiment 5 of the present invention.

FIG. 39 is another schematic cross-sectional diagram showing the construction of the crystal growth apparatus according to Embodiment 5 of the present invention. It should be noted that the crystal growth apparatus of Embodiment 5 may be a crystal growth apparatus 1100A shown in FIG. 39.

Referring to FIG. 39, the crystal growth apparatus 1100F of Embodiment 5 has a construction generally identical with the construction of the crystal growth apparatus 1100E shown in FIG. 38, except that the filler 1250 is removed.

Because the metal member 1260 covers the reaction vessel 1020 and the heaters 1060 and 1070 and because the metal member 1270 covers the lid 1022 of the reaction vessel 1020 and the metal member 1260, and because the metal member 1280 covers the bellows 1040 and the metal member 1270, it becomes possible to prevent the escaping of heat from the crucible 1010 and the reaction vessel 1020 by way of convention, even when the filler 1250 is removed.

Manufacturing the GaN crystal with the crystal growth apparatus 1100F is conducted according to the flowchart shown in FIGS. 32 and 33.

Figure 40:
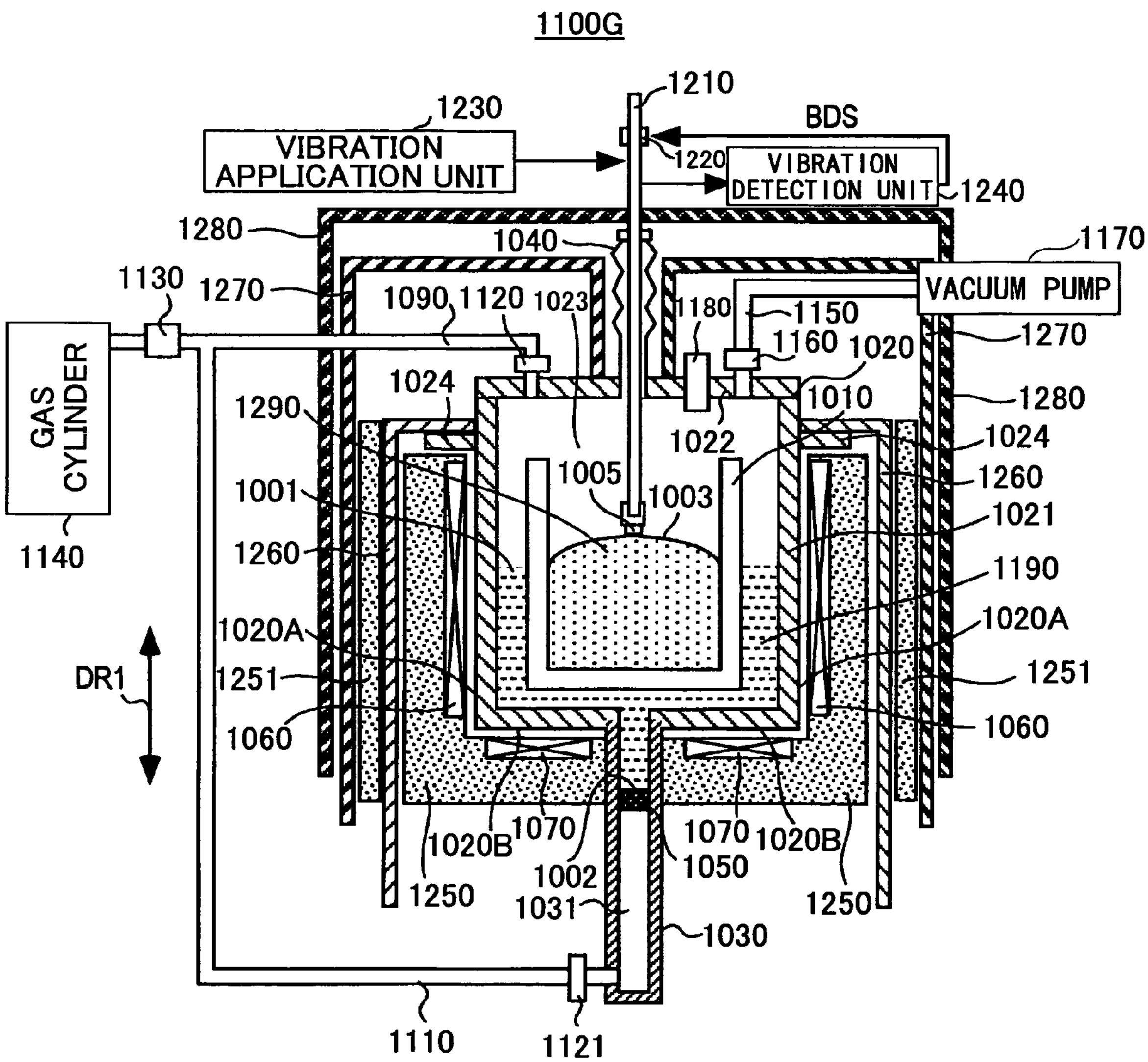
FIG. 40 is another schematic cross-sectional diagram showing the construction of the crystal growth apparatus according to Embodiment 5 of the present invention.

FIG. 40 is a further schematic cross-sectional diagram showing the construction of the crystal growth apparatus according to Embodiment 5 of the present invention. It should be noted that the crystal growth apparatus of Embodiment 5 may be a crystal growth apparatus 1100G shown in FIG. 40.

Referring to FIG. 40, the crystal growth apparatus 1100G has a construction generally identical with the construction of the crystal growth apparatus 1100E shown in FIG. 28, except that the filler 1251 is added to the crystal growth apparatus 1100E.

The filler 1251 is disposed between the metal member 1260 and the metal member 1270. By providing the filler 1251, it becomes possible to suppress the gas flow in the direction away from the reaction vessel 1020, and it becomes possible to thermally blanket the crucible 1010 and the reaction vessel 1020 with further improved efficiency.

Manufacturing the GaN crystal with the crystal growth apparatus 1100G is conducted according to the flowchart shown in FIGS. 32 and 33.

Figure 41:
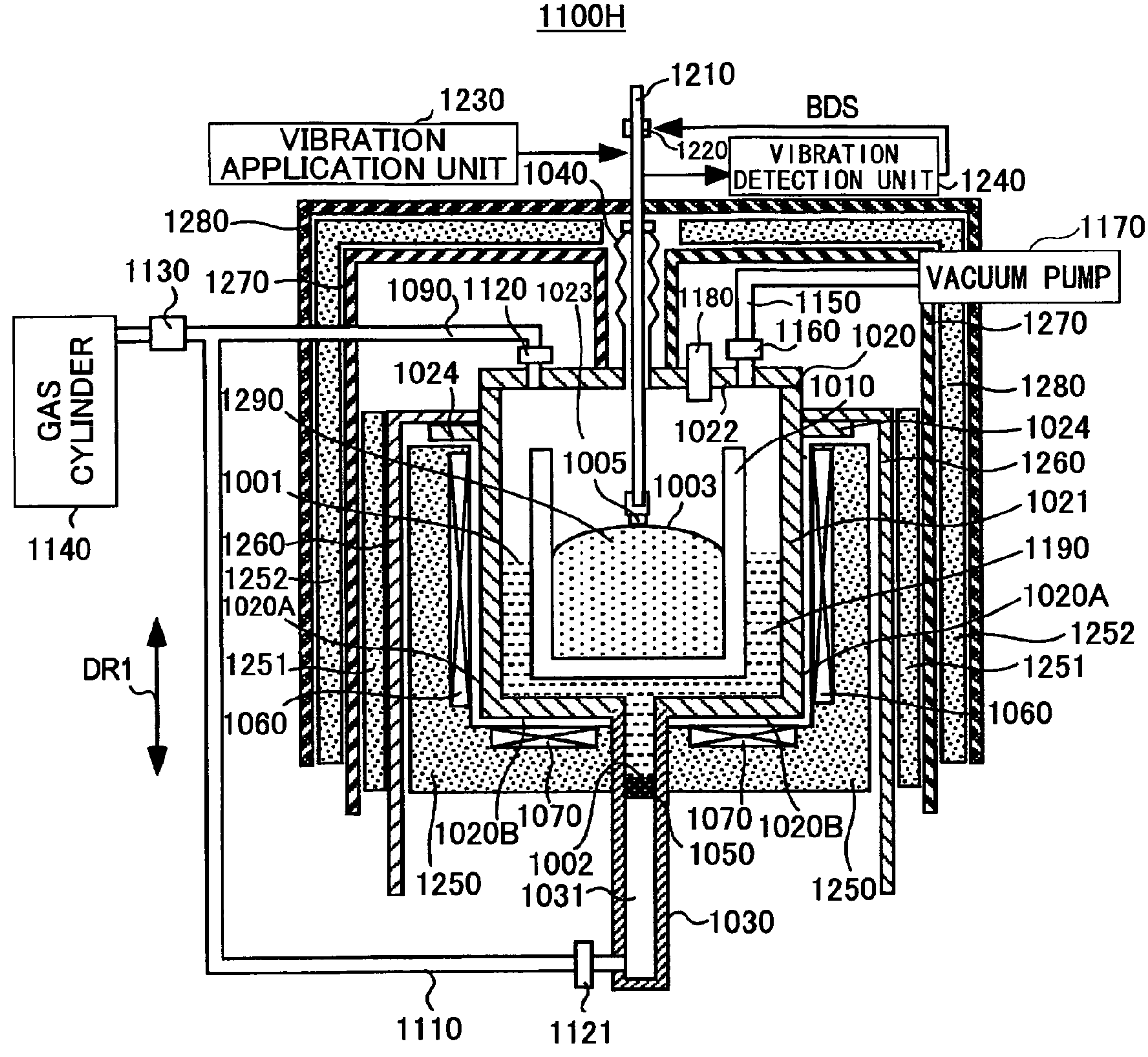
FIG. 41 is another schematic cross-sectional diagram showing the construction of the crystal growth apparatus according to Embodiment 5 of the present invention.

FIG. 41 is a further schematic cross-sectional diagram showing the construction of the crystal growth apparatus according to Embodiment 5 of the present invention. It should be noted that the crystal growth apparatus of Embodiment 5 may be a crystal growth apparatus 1100H shown in FIG. 41.

Referring to FIG. 41, the crystal growth apparatus 1100H has a construction generally identical with the construction of the crystal growth apparatus 1100G shown in FIG. 40, except that the filler 1252 is added to the crystal growth apparatus 1100G.

The filler 1252 is disposed between the metal member 1260 and the metal member 1270. By providing the filler 1252, it becomes possible to suppress the gas flow in the direction away from the reaction vessel 1020, and it becomes possible to thermally blanket the crucible 1010 and the reaction vessel 1020 with further improved efficiency.

Manufacturing the GaN crystal with the crystal growth apparatus 1100H is conducted according to the flowchart shown in FIGS. 32 and 33.

Further, the crystal growth apparatus of Embodiment 5 may also be the one in which the filler 1250 is removed from the crystal growth apparatus 1100G shown in FIG. 40 or may be the one in which the filler 1250 is removed from the crystal growth apparatus 1100H shown in FIG. 41, or may be the one in which the filler 1251 is removed from the crystal growth apparatus 1100H shown in FIG. 41, or may be the one in which the fillers 1250 and 1251 are removed from the crystal growth apparatus 1100H shown in FIG. 41.

Further, while it has been explained in the description above that the metal members 1260, 1270 and 1280 are used, the present embodiment is not limited to such a specific construction and it is also possible to use an oxide such as of alumina ($Al_2O_3$), ceramics, carbon, $Si_3N_4$, aluminum titanate, and the like, or nitride for the member that interrupts the gas flow in the direction away from the reaction vessel 1020 in place of the metal member 1260, 1270 and 1280.

Otherwise, the present embodiment is identical to the embodiment described previously.

Further, with the present invention, the metal members 1260, 1270 and 1280 constitute the "shielding member".

Further, with the present invention, the metal members 1260, 1270 and 1280 constitute the "heat blanketing unit".

Further, with the present invention, the filler 1250 and the metal members 1260, 1270 and 1280 constitute the "heat blanket unit".

Further, with the present invention, the filler 1251 and the metal members 1260, 1270 and 1280 constitute the "heat blanket unit".

Further, with the present invention, the filler 1252 and the metal members 1260, 1270 and 1280 constitute the "heat blanket unit".

Further, with the present invention, the fillers 1250 and 1251 and the metal members 1260, 1270 and 1280 constitute the "heat blanket unit".

Further, with the present invention, the fillers 1251 and 1252 and the metal members 1260, 1270 and 1280 constitute the "heat blanket unit".

Further, with the present invention, the fillers 1250 and 1252 and the metal members 1260, 1270 and 1280 constitute the "heat blanket unit".

Further, with the present invention, the fillers 1251-1253 and the metal members 1260, 1270 and 1280 constitute the "heat blanket unit".

Further, the metal member 1260 constitutes the "first shielding member", while the metal member 1280 constitutes the "second shielding member".

Otherwise, the present embodiment is identical to Embodiments 3 and 4.

Embodiment 6

Figure 42:
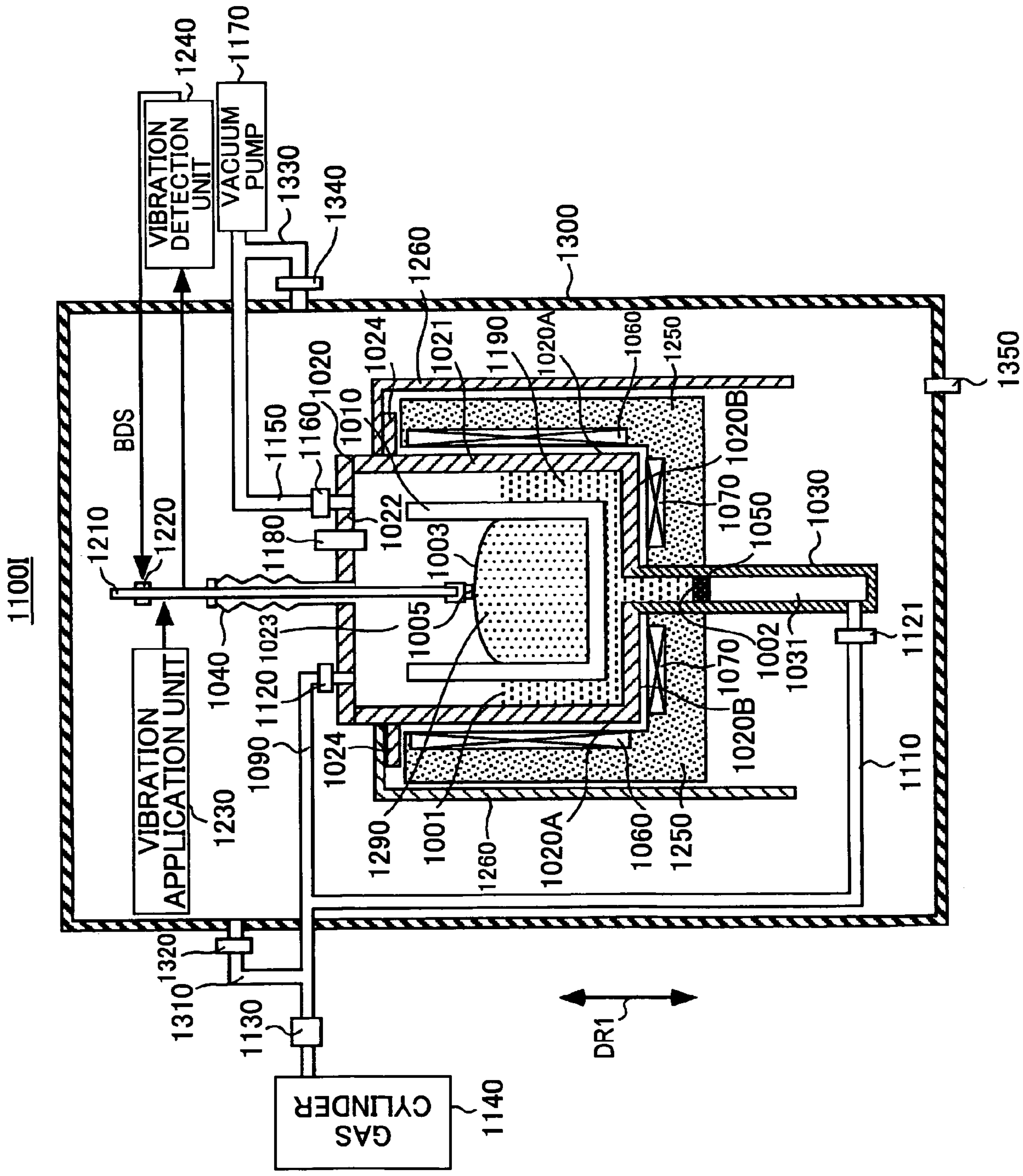
FIG. 42 is a schematic cross-sectional diagram showing the construction of a crystal growth apparatus according to Embodiment 6 of the present invention.

FIG. 42 is a schematic cross-sectional diagram showing a crystal growth apparatus according to Embodiment 6 of the present invention.

Referring to FIG. 42, the crystal growth apparatus 1100I of Embodiment 6 has a construction generally identical with the construction of the crystal growth apparatus 1100, except that a gas supply line 1210, valves 1320 and 1340, a evacuation line 1220 and a pressure sensor 1350 are added to the crystal growth apparatus 1100 shown in FIG. 22.

The outer reaction vessel 1200 accommodates therein the reaction vessel 1020, the support part 1024, the conduit 1030, the bellows 1040, the heaters 1060 and 1070, the gas supply lines 090 and 1110, the valves 1120, 1121 and 1160, the evacuation line 1150, the pressure sensor 1180, the support unit 1210, the up/down mechanism 1220, the filler 1250 and the metal member 1260.

The gas supply line 1310 has an end connected to the gas supply line 1090 and the other end connected to the outer reaction vessel 1300 via the valve 1320. The valve 1320 is connected to the gas supply line 1310 in the vicinity of the outer reaction vessel 1300.

The evacuation line 1330 has an end connected to the outer reaction vessel 1300 via the valve 1340 and the other end connected to the evacuation line 1150. The valve 1340 is connected to the evacuation line 1330 in the vicinity of the outer reaction vessel 1300. The pressure sensor 1350 is mounted to the outer reaction vessel 1300.

The gas supply line 1310 supplies the nitrogen gas supplied from the gas cylinder 1140 via the pressure regulator 1130 to the interior of the outer reaction vessel 1300 via the valve 1320. The valve 1320 supplies the nitrogen gas inside the gas supply line 1310 to the interior of the outer reaction vessel 1300 or interrupts the supply of the nitrogen gas to the interior of the outer reaction vessel 1300.

The evacuation line 1330 passes the gas inside the outer reaction vessel 1300 to the vacuum pump 1170. The valve 1340 connects the interior of the outer reaction vessel 1300 and the evacuation line 1330 spatially or disconnects the interior of the outer reaction vessel 1300 and the evacuation line 1330 spatially. The pressure sensor 1350 detects the pressure inside the outer reaction vessel 1300.

In the crystal growth apparatus 1100I, the pressure regulator 1130 supplies the nitrogen gas to the interior of the reaction vessel via the gas supply line 1090 and the valve 1120 and to the interior of the outer reaction vessel 1300 via the gas supply line 1310 and the valve 1320.

Further, the vacuum pump 1170 evacuates the interior of the reaction vessel 102 to a vacuum state via the evacuation line 1150 and the valve 1160 and further evacuates the interior of the outer reaction vessel 1300 to a vacuum state via the evacuation line 1330 and the valve 1340.

Figure 43:
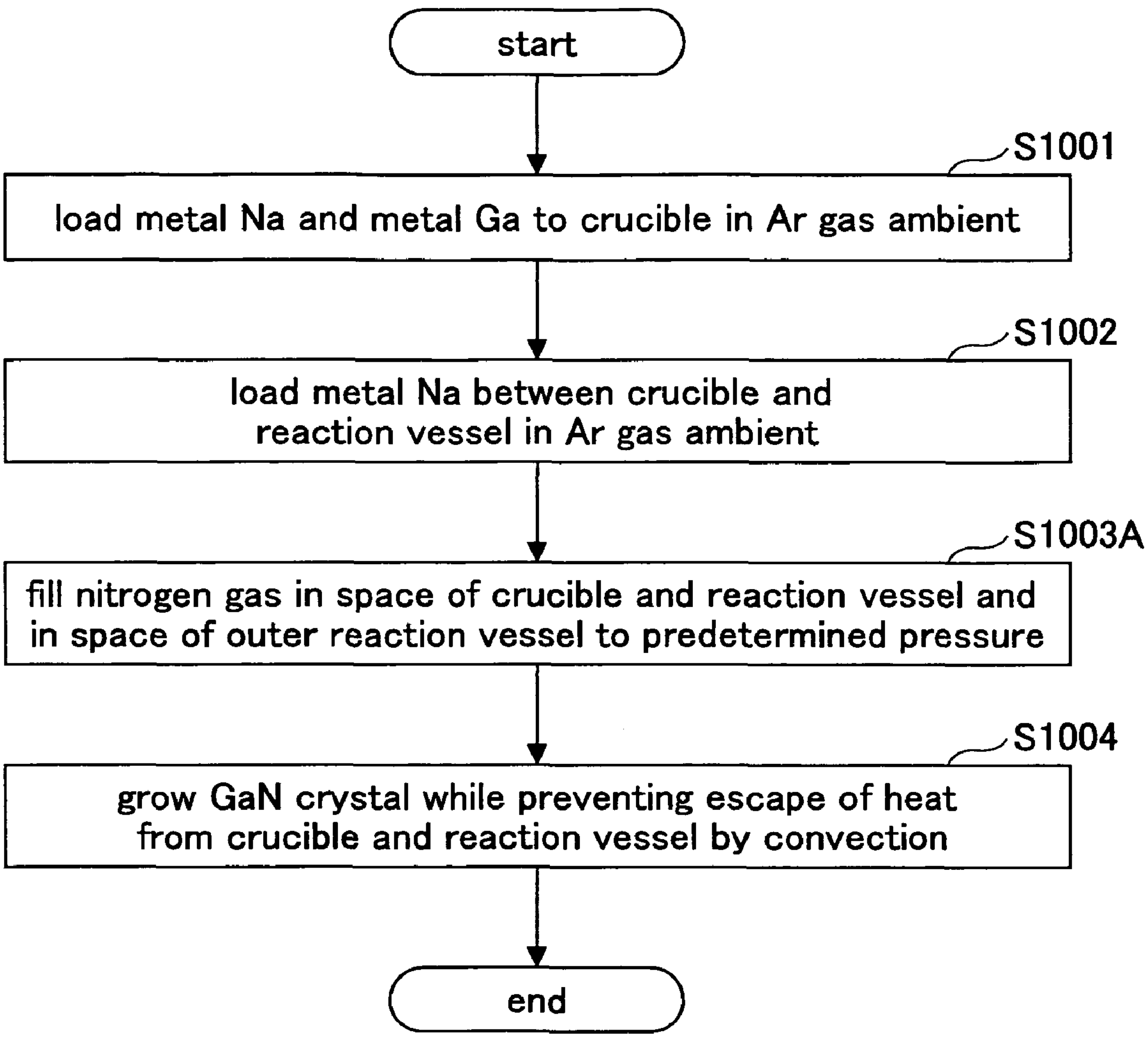
FIG. 43 is a flowchart explaining the manufacturing method of a GaN crystal according to Embodiment 4 of the present invention.

FIG. 43 is a flowchart explaining the manufacturing method of a GaN crystal according to Embodiment 6 of the present invention.

It should be noted that the flowchart of FIG. 43 is identical to the flowchart shown in FIG. 32 except that the step S1003 of the flowchart shown in FIG. 32 is replaced with a step S1003A.

Referring to FIG. 43, when the step S1002 is completed, the seed crystal 11005 is set above the metal Na and the metal Ga in the crucible 1010 in the Ar gas ambient. More specifically, the seed crystal 1005 is set above the metal Na and metal Ga in the crucible 1010 by fitting the seed crystal 1005 to the space 1214 formed at the end 12111 of the support unit 1210. Reference should be made to FIG. 25B.

Next, the crucible 1010 and the reaction vessel 1020 are set inside the outer reaction vessel 1300 in the state that the Ar gas is filled inside the crucible 1010 and the reaction vessel 1020. With this, the crucible 1010 and the reaction vessel 1020 are set in the crystal growth apparatus 1100.

Next, the valves 1160 and 1340 are opened and the Ar gas filled in the crucible 1010, the reaction vessel 1020 and the outer reaction vessel 1300 is evacuated by the vacuum pump 1170. After evacuating the interior of the crucible 1010 and the reaction vessel 1020 to a predetermined pressure (0.133 Pa or lower) by the vacuum pump 1170, the valve 1160 is closed and the valves 1120 and 1121 are opened. Thereby, the crucible 1010 and the reaction vessel 1020 are filled with the nitrogen gas from the gas cylinder 1140 via the gas supply lines 1090 and 1110. In this case, the nitrogen gas is supplied to the crucible 1010, the reaction vessel 1020 and further to the outer reaction vessel 1300 via the pressure regulator 1130 such that the pressure inside the crucible 1010, the reaction vessel 1020 and the outer reaction vessel 1300 has become about 0.1 MPa.

Further, when the pressures inside the reaction vessel 1020 and the outer reaction vessel 1300 as detected by the pressure sensors 1180 and 1350 have reached the pressure of about 0.1 MPa, the valves 1120 and 1121 are closed and the valves 1160 and 1340 are opened. With this the nitrogen gases filled in the crucible 1010, the reaction vessel 1020 and the outer reaction vessel 1300 are evacuated by the vacuum pump 1170. In this case, too, the interiors of the crucible 1010, the reaction vessel 1020 and the outer reaction vessel 1300 are evacuated to a predetermined pressure (0.133 Pa or less) by using the vacuum pump 1170.

Further, this vacuum evacuation of the crucible 1010, the reaction vessel 1020 and the outer reaction vessel 1300 and filling of the nitrogen to the crucible 1010, the reaction vessel 1020 and the outer reaction vessel 1300 are repeated several times.

Thereafter, the interiors of the crucible 1010, the reaction vessel 1020 and the outer reaction vessel 1300 are evacuated to a predetermined pressure by the vacuum pump 1170, and the valve 1160 and 1340 are closed. Further, the valves 1120 and 1121 are opened and the nitrogen gas is filled into the crucible 1010, the reaction vessel 1020 and the outer reaction vessel 1300 by the pressure regulator 1130 such that the pressure of the crucible 1010, the reaction vessel 1020 and the outer reaction vessel 1300 becomes a pressure of the range of 1.01-5.05 MPa.

Because the metal Na between the crucible 1010 and the reaction vessel 1020 is solid in this state, the nitrogen gas is supplied to the space 1023 inside the reaction vessel 1020 also from the space 1031 of the conduit 1030 via the stopper/inlet plug 1050. When the pressure of the space 1023 as detected by the pressure sensor 1180 has become 1.01-5.05 Pa, the valve 1120 is closed.

With this, growth of the GaN crystal is conducted while blocking the escaping of heat from the crucible 1010 and the reaction vessel 1020 by way of convection (step S1004). With this, a series of the steps are completed.

Thus, with the crystal growth apparatus 1100F of Embodiment 6, crystal growth of the GaN crystal is conducted in the state that the metal member 1260 is disposed in the nitrogen gas ambient pressurized to the range of 1.01-5.05 MPa.

In the case the metal member 1260 is not provided, the filler 1250 makes a contact with the nitrogen gas filled in the outer reaction vessel 1300 with the pressure of the range of 1.01-5.05 MPa, and thus, the heat of the crucible 1010 and the reaction vessel 1020 escapes easily by convection. It should be noted that thermal convection takes place more easily in the nitrogen gas of the pressure higher than the atmospheric pressure (=1.01-5.05 MPa) as compared with the nitrogen gas of the atmospheric pressure, and thus, the heat escapes easily from the crucible 101 and the reaction vessel 1020 by convection when the metal member 1260 is not provided.

With the crystal growth apparatus 1100I, however, the metal member 1260 is disposed in the nitrogen gas ambient filled with the pressure higher than the atmospheric pressure (=1.01-5.05 MPa), and thus, it becomes possible to block the escaping of heat from the crucible 101 and the reaction vessel 1020 by way of convection even under the situation in which the heat escapes easily from the crucible 101 and the reaction vessel 1020 by way of convection.

As a result, it becomes possible to blanket the crucible 1010 and the reaction vessel 1020 thermally even in the case the reaction vessel 1020 is disposed in the nitrogen gas ambient filled with the pressure higher than the atmospheric pressure, and it becomes possible to produce the GaN crystal stably.

It should be noted that the crystal growth apparatus of Embodiment 6 may be the one in which the filler 1250 is removed from the crystal growth apparatus 1100I shown in FIG. 42, or the one in which the metal member 1270 is added to the crystal growth apparatus 1101I as shown in the mode of FIG. 35, or alternatively the one in which the metal member 1270 is added to crystal growth apparatus 1101I and the filler 1250 is removed as shown in the mode of FIG. 36.

Further, the crystal growth apparatus of Embodiment 6 may be the one in which the metal member 1270 and the filler 1251 are added to the crystal growth apparatus 1100I acceding to the mode shown in FIG. 37 or the one in which the metal member 1270 and the filler 1251 are added to the crystal growth apparatus 1100I according to the mode shown in FIG. 37.

Further, the crystal growth apparatus of Embodiment 6 may be the one in which the metal members 1270 and 1280 are added to the crystal growth apparatus 1100I according to the mode shown in FIG. 38, or the one in which the filler 1250 is removed from the crystal growth apparatus 1100I added with the metal members 1270 and 1280 according to the mode shown in FIG. 38. Further, the crystal growth apparatus may be the one in which the metal members 1270 and 1280 and the filler 1251 are added to the crystal growth apparatus 1100I according to the mode shown in FIG. 40, or the one in which the filler 1250 is removed from the crystal growth apparatus 1100I added with the metal members 1270 and 1280 and the filler 1251 according to the mode shown in FIG. 40. Further, the crystal growth apparatus may be the one in which the metal members 1270 and 1280 and the fillers 1251 and 1252 are added to the crystal growth apparatus 1100I according to the mode shown in FIG. 41, or the one in which the filler 1250 is removed from the crystal growth apparatus 1100I added with the metal members 1270 and 1280 and the fillers 1251 and 1252 according to the mode shown in FIG. 41. Further, the crystal growth apparatus may be the one in which the filler 1251 is removed from the crystal growth apparatus 1100I added with the metal members 1270 and 1280 and the fillers 1251 and 1252 according to the mode shown in FIG. 41. Further, the crystal growth apparatus may be the one in which the fillers 1250 and 1251 are removed from the crystal growth apparatus 1100I added with the metal members 1270 and 1280 and the fillers 1251 and 1252 according to the mode shown in FIG. 41. The metal members 1270 and 1280 and the filler 1251 are added to the crystal growth apparatus 1100I according to the mode shown in FIG. 40

As a result, with the crystal growth apparatus of Embodiment 6, at least one of the metal members 1260, 1270 and 1280 and/or at least one of the fillers 1250-1252 are disposed so as to surround the reaction vessel 1020 in the nitrogen gas ambient of the pressure higher than the atmospheric pressure, and it becomes possible to effectively prevent the escaping of heat from the crucible 1010 and the reaction vessel 1020 by convection.

Otherwise, the present embodiment is identical to Embodiments 3-5.

Because any of the crystal growth apparatuses 1100, 1100A, 1100B, 1100C, 1100D, 1100E, 1100F, 1100G, 1100H and 1100I according to Embodiments 3-6 described above includes at least one metal member (metal member 1260 among the metal members 1260, 1270 and 1280), it is sufficient with the crystal growth apparatus of the present invention to include a shielding member to surround the reaction vessel 1020 and interrupt the gas flow in the direction away from the reaction vessel 1020. Preferably, the shielding member is disposed in the nitrogen gas ambient filled to a pressure higher than the atmospheric pressure.

While it has been described in the foregoing that the seed crystal 1005 is moved up or down depending on the relationship between the crystal growth rate of the GaN crystal and the lowering rate of the interface 1003 for maintaining contact of the seed crystal 1005 with the interface 1003, it is also possible to move the support unit 1210 up or down by the up/down mechanism 1220 so as to maintain the contact of the GaN crystal with the interface 1003, by taking into consideration the effect of rising of the interface 1003 caused by dipping of the GaN crystal grown from the seed crystal 1005 into the melt mixture 1290 and the effect of the lowering of the interface 1003 caused by the movement of the GaN crystal 6 upward from the melt mixture 1290.

In the case the temperature of the metal melt 1190 is equal to the temperature of the melt mixture 1290, the vapor pressure of the metal Na evaporated from the metal melt 1190 becomes higher than the vapor pressure of the metal Na evaporated from the melt mixture 1290. Thus, in such a case, the metal Na migrates from the metal melt 1190 to the melt mixture 1290 and there is caused rising of the interface 1003. Thus, in the event the temperature of the metal melt 1190 and the temperature of the melt mixture 1290 are set equal, it is possible to move the support unit 1210 up or down by the up/down mechanism 1220 such that the GaN crystal grown from the seed crystal 5 makes contact with the interface 1003 while taking into consideration of the effect of rising of the interface 1003 caused by the migration of the metal Na from the metal melt 1190 to the melt mixture 1290.

Further, with growth of the GaN crystal 6 grown from the seed crystal 1005, the metal Ga in the melt mixture 1290 is consumed while this consumption of the metal Ga invites lowering of the interface 1003. Thus, it is also possible to move the support unit 1210 up or down by the up/down mechanism 1220 such that the GaN crystal grown from the seed crystal 1005 makes contact with the interface 1003 while taking into consideration the amount of consumption of the metal Ga.

Further, while the present embodiment has been explained for the case in which the support unit 1210 is applied with vibration and the seed crystal 1005 or the GaN crystal 1006 is controlled to make a contact with the melt mixture 260 while detecting the vibration of the support unit 1210, the present embodiment is not limited to such a construction and it is also possible to cause the seed crystal 1005 or the GaN crystal 1006 to make a contact with the melt mixture 1290 by detecting the location of the vapor-liquid interface 1003. In this case, an end of a conductor wire is connected to the reaction vessel 1020 from the outside and the other end is dipped into the melt mixture 1290. Further, an electric current is caused to flow through the conductor wire in this state and location of the vapor-liquid interface 103 is detected in terms of the length of the conductor wire in the reaction vessel 1020 in which there has been noted a change of the current from Off to On.

Thus, when the other end of the conductor wire is dipped into the melt mixture 1290, there is caused conduction of the current through the crucible 1010, the metal melt 1190 and the reaction vessel 1020, while when the other end is not dipped into the melt mixture 1290, no current flows through the conductor wire.

Thus, it is possible to detect the location of the vapor-liquid interface 103 by the length of the conductor wire inserted into the reaction vessel 1020 for the case of causing the change of state of the electric current from Off to On. When the location of the vapor-liquid interface 103 is detected, the up/down mechanism 1220 lowers the seed crystal 1005 or the GaN crystal 1006 to the location of the detected vapor-liquid interface 1003.

Further, it is also possible to detect the location of the vapor-liquid interface 1003 by emitting a sound to the vapor-liquid interface and measuring the time for the sound to go and back to and from the vapor-liquid interface 1003.

Further, it is possible to insert a thermocouple into the crucible 1010 from the reaction vessel 1020 and detect the location of the vapor-liquid interface 1003 from the length of the thermocouple inserted into the reaction vessel 1020 at the moment when the detected temperature has been changed.

Further, the crystal growth temperature of the present invention may be the one in which the up/down mechanism 1220, the vibration application unit 1230 and the vibration detection unit 1240 are removed from the crystal growth apparatuses 1100 and 100A. Thus, the crystal growth apparatus of the present invention may be the one in which the function of moving the seed crystal 1005 up or down is removed from any of the crystal growth apparatuses 1100, 1100A, 1100B, 1100C, 1100D, 1100E, 1100F, 1100G, 1100H and 1100I.

Further, the crystal growth apparatus of the present invention may be the one in which the support unit 1210, the up/down mechanism 1220, the vibration application unit 1230 and the vibration detection unit 1240 are removed from any of the crystal growth apparatuses 1100, 1100A, 1110B, 1100C, 1100D, 1100E, 1100F, 1100G, 1100H and 1100I. Thus, the crystal growth apparatus of the present invention may be the one in which the function of supporting the seed crystal 1005 from above the crucible 1010 and the function of moving the seed crystal 1005 up or down are removed from any of the crystal growth apparatuses 1100, 1100A, 1100B, 1100C, 1100D, 1100E, 1100F, 1100G, 1100H and 1100I. In this case, the seed crystal 1005 is disposed at the bottom part of the crucible 1010.

Thus, the crystal growth apparatus of the present invention includes various variations while what is common is that the crystal growth apparatus of the present invention includes a member that prevents escaping of heat by causing convection. Thus, the crystal growth apparatus of the present invention generally comprises a crystal growth apparatus having a heat blanket function.

Further, the manufacturing method of the present invention may be the one that manufactures the GaN crystal while preventing the escaping of heat by way of convection.

Figure 44:
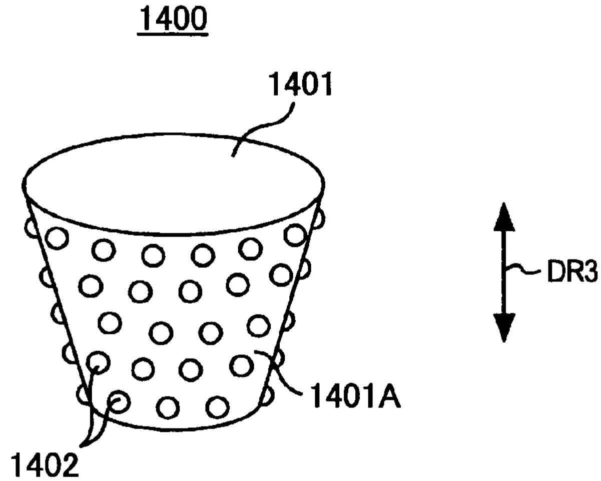
FIG. 44 is another oblique view diagram of the stopper/inlet plug according to the present invention.

FIG. 44 is another oblique view diagram of the stopper/inlet plug according to the present invention. Further, FIG. 45 is a cross-sectional diagram showing the method for mounting the stopper/inlet plug 1400 shown in FIG. 44.

Referring to FIG. 44, the stopper/inlet plug 1400 comprises a plug 1401 and a plurality of projections 1402. The plug 1401 is formed of a cylindrical body that changes the diameter in a length direction DR3. Each of the projections 1402 has a generally semi-spherical shape of the diameter of several ten microns. The projections 1402 are formed on an outer peripheral surface 1401A of the plug 1401 in a random pattern. Thereby, the separation between adjacent two projections 1402 is set to several ten microns.

Figure 45:
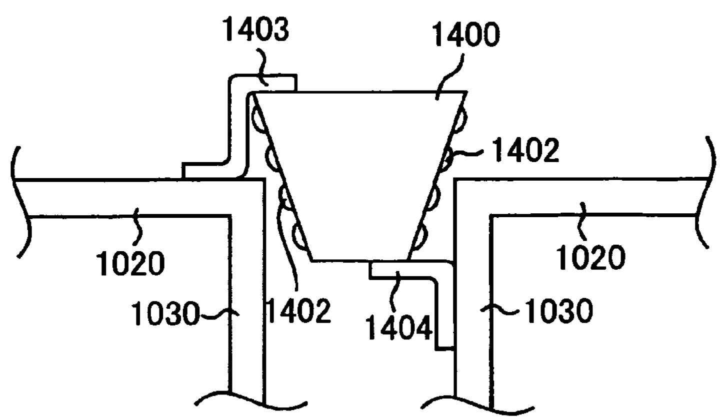
FIG. 45 is a cross-sectional diagram showing the method for mounting the stopper/inlet plug shown in FIG. 44.

Referring to FIG. 45, the stopper/inlet plug 1400 is fixed to a connection part of the reaction vessel 1020 and the conduit 1030 by support members 1403 and 1404. More specifically, the stopper/inlet plug 1400 is fixed by the support member 1403 having one end fixed upon the reaction vessel 1020 and by the support member 1404 having one end fixed upon an inner wall surface of the conduit 1030.

In the present case, the projections 1402 of the stopper/inlet plug 1400 may or may not contact with the reaction vessel 1020 or the conduit 1030.

In the event the stopper/inlet plug 1402 is fixed in the state in which the projections 1400 do not contact with the reaction vessel 1020 and the conduit 1030, the separation between the projections and the reaction vessel 1020 or the separation between the projections 1402 and the conduit 1030 is set such that the metal melt 1190 can be held by the surface tension, and the stopper/inlet plug 1400 is fixed in this state by the support members 1403 and 1404.

The metal Na held between the crucible 1010 and the reaction vessel 1020 takes a solid form before heating of the crucible 1010 and the reaction vessel 1020 is commenced, and thus, the nitrogen gas supplied from the gas cylinder 1140 can cause diffusion between the space 1023 inside the reaction vessel 1020 and the space 1031 inside the conduit 1030 through the stopper/inlet plug 1400.

When heating of the crucible 1010 and the reaction vessel 1020 is started and the temperature of the crucible 1010 and the reaction vessel 1020 has raised to 98° C. or higher, the metal Na held between the crucible 1010 and the reaction vessel 1020 undergoes melting to form the metal melt 1190, while the metal melt 190 functions to confined the nitrogen gas to the space 1023.

Further, the stopper/inlet plug 1400 holds the metal melt 1190 by the surface tension thereof such that the metal melt 1190 does not flow out from the interior of the reaction vessel 1120 to the space 1031 of the conduit 1030.

Further, with progress of the growth of the GaN crystal, the metal melt 1190 and the stopper/inlet plug 1400 confines the nitrogen gas and the metal Na vapor evaporated from the metal melt 1190 and the melt mixture 1290 into the space 1023. As a result, evaporation of the metal Na from the melt mixture 1290 is suppressed, and it becomes possible to stabilize the molar ratio of the metal Na and the metal Ga in the melt mixture 1290. Further, when there is caused a decrease of nitrogen gas in the space 1023 with progress of growth of the GaN crystal, the pressure P1 of the space 1023 becomes lower than the pressure P2 of the space 1031 inside the conduit 1030, and the stopper/inlet plug 1400 supplies the nitrogen gas in the space 1031 via the metal melt 1190 by causing to flow the nitrogen gas therethrough in the direction toward the reaction vessel 1020.

Thus, the stopper/inlet plug 1400 functions similarly to the stopper/inlet plug 150 explained before. Thus, the stopper/inlet plug 1400 is used in the crystal growth apparatuses 1100, 1100A, 11000B, 1100C, 1100C, 1100D, 1100 E and 1100E in place of the stopper/inlet plug 10050.

While it has been explained that the stopper/inlet plug 1400 has the projections 1402, it is also possible that the stopper/inlet plug 1400 does not have the projections 1402. In this case, the stopper/inlet plug 1401 is held by the support members such that the separation between the plug 1400 and the reaction vessel 1020 or the separation between the plug 401 and the conduit 1030 becomes several ten microns.

Further, it is also possible to set the separation between the stopper/inlet plug 1400 (including both of the cases in which the stopper/inlet plug 400 carries the projections 1402 and the case in which the stopper/inlet plug 1400 does not carry the projections 1402) and the reaction vessel 1020 and between the stopper/inlet plug 400 and the conduit 1030 according to the temperature of the stopper/inlet plug 400. In this case, the separation between the stopper/inlet plug 1400 and the reaction vessel 1020 or the separation between the stopper/inlet plug 1400 and the conduit 1030 is set relatively narrow when the temperature of the stopper/inlet plug 40 is relatively high. When the temperature of the stopper/inlet plug 40 is relatively low, on the other hand, the separation between the stopper/inlet plug 1400 and the reaction vessel 1020 or the separation between the stopper/inlet plug 1400 and the conduit 1030 is set relatively large.

It should be noted that the separation between the stopper/inlet plug 1400 and the reaction vessel 1020 or the separation between the stopper/inlet plug 1400 and the conduit 1030 that can hold the metal melt 1190 changes depending on the temperature of the stopper/inlet plug 400. This, with this embodiment, the separation between the stopper/inlet plug 1400 and the reaction vessel 1020 or the separation between the stopper/inlet plug 1400 and the conduit 1030 is changed in response to the temperature of the stopper/inlet plug 400 such that the metal melt 1190 is held securely by the surface tension.

Further, the temperature control of the stopper/inlet valve 1400 is achieved by the heater 1070. Thus, when the stopper/inlet plug 1400 is to be heated to a temperature higher than 150° C., the stopper/inlet plug 1400 is heated by the heater 1070.

In the case of using the stopper/inlet plug 1400, the gas cylinder 1140, the pressure regulator 1130, the gas supply lines 1090 and 1110, the conduit 1030, the stopper/inlet plug 1400 and the metal melt 1190 form together the "gas supplying unit".

Figure 46A:
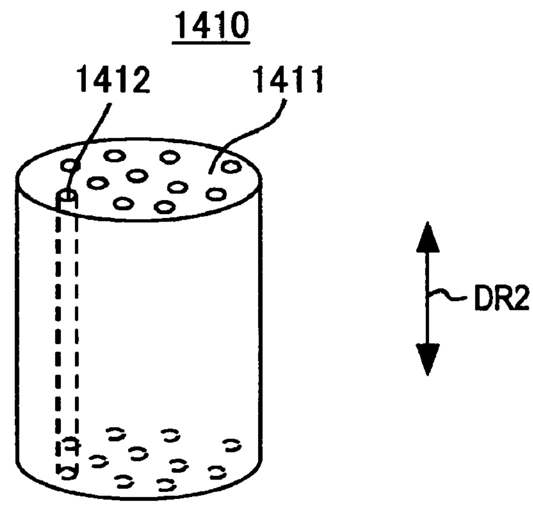
FIGS. 46A and 46B are further oblique view diagrams of the stopper/inlet plug according to the present invention.
Figure 46B:
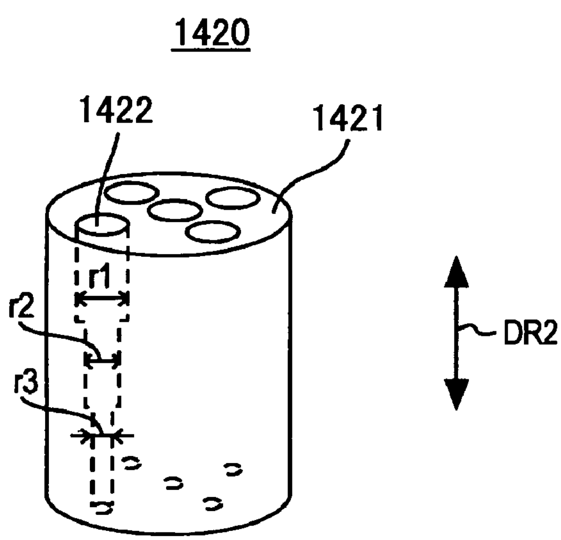

FIGS. 46A and 46B are further oblique view diagrams of the stopper/inlet plug according to the present embodiment.

Referring to FIG. 46A, the stopper/inlet plug 1410 comprises a plug 1412 formed with a plurality of penetrating holes 1411. The plurality of penetrating holes 1412 are formed in the length direction DR2 of the plug 1411. Further, each of the plural penetrating holes 1412 has a diameter of several ten microns (see FIG. 46A).

With the stopper/inlet plug 1410, it is sufficient that there is formed at least one penetrating hole 1412.

Further, the stopper/inlet plug 1420 comprises a plug 1422 formed with plural penetrating holes 1421. The plurality of penetrating holes 1422 are formed in the length direction DR2 of the plug 1421. Each of the penetrating holes 1422 have a diameter that changes stepwise from a diameter r1, r2 and r3 in the length direction DR2. Here, each of the diameters r1, r2 and r3 is determined in the range such as several microns to several ten microns in which the metal melt 1190 can be held by the surface tension Reference should be made to FIG. 46B. With the stopper/inlet plug 1420, it is sufficient that there is formed at least one penetrating hole 1422. Further, it is sufficient that the diameter of the penetrating hole 1422 is changed at least in two steps. Alternatively, the diameter of the penetrating hole 1422 may be changed continuously in the length direction DR2.

The stopper/inlet plug 1410 or 1420 is used in the crystal growth apparatuses 1100, 1100A, 1100B, 1100C, 1100C, 1100D, 1100 E and 1100F, 1100G, 1100H and 1100I in place of the stopper/inlet plug 1050.

In the case the stopper/inlet plug 1420 is used in any of the crystal growth apparatuses 1100, 1100A, 11000B, 1100C, 1100D, 1100D, 1100, 1100F, 1100G and 1100H in place of the stopper/inlet plug 1050, it becomes possible to hold the metal melt 1190 by the surface tension thereof by one of the plural diameters that are changed stepwise, and it becomes possible to manufacture a GaN crystal of large size without conducting precise temperature control of the stopper/inlet plug 1420.

In the case of using the stopper/inlet plug 1410 or 4120, the gas cylinder 1140, the pressure regulator 1130, the gas supply lines 1090 and 1110, the conduit 1030, the stopper/inlet plug 1410 or 1410 and the metal melt 1190 form together the "gas supplying unit".

Further, with the present invention, it is possible to use a porous plug or check valve in place of the stopper/inlet plug 1050. The porous plug may be the one formed of a sintered body of stainless steel powders. Such a porous plug has a structure in which there are formed a large number of pores of several ten microns. Thus, the porous plug can hold the metal melt 1190 by the surface tension thereof similarly to the stopper/inlet plug 1050 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P1 of the space 1031 and the pressure P2 of the space 1023 for allowing the nitrogen gas in the space 1031 to the space 1023 through the metal melt 1190 in the event the pressure P2 is higher than the pressure P1 and blocks the connection between the reaction vessel 1020 and the conduit 1030 by the self gravity when P1≧P2. Thus, this check valve can be used also in the high-temperature region.

Further, while it has been explained with Embodiments 3-6 that the crystal growth temperature is 800° C., the present embodiment is not limited to this specific crystal growth temperature. It is sufficient when the crystal growth temperature is equal to or higher than 600°. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the crucible 1010 in the ambient of Ar gas and the metal Na is loaded between the crucible 1010 and the reaction vessel 1020 in the ambient of Ar gas, it is also possible to load the metal Na and the metal Ga into the crucible 1010 and the metal Na between the crucible 1010 and the reaction vessel 1020 in the ambient of a gas other than the Ar gas, such as He, Ne, Kr, or the like, or in a nitrogen gas. Generally, it is sufficient that the metal Na and the metal Ga are loaded into the crucible 1010 and the metal Na is loaded between the crucible 1010 and the reaction vessel 1020 in the ambient of an inert gas or a nitrogen gas. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 1290 by mixing an alkali metal such as lithium (Li), potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing nitrogen as a constituent element such as sodium azide, ammonia, or the like. These compounds constitute the nitrogen source gas.

Further, place of Ga, it is also possible to use a group III metal such as boron (B), aluminum (Al), indium (In), or the like.

Thus, the crystal growth apparatus and method of the present invention is generally applicable to the manufacturing of a group III nitride crystal while using a melt mixture of an alkali metal or an alkali earth melt and a group III metal (including boron).

The group III nitride crystal manufactured with the crystal growth apparatus or method of the present invention may be used for fabrication of group III nitride semiconductor devices including light-emitting diodes, laser diodes, photodiodes, transistors, and the like.

Embodiment 7

Figure 47:
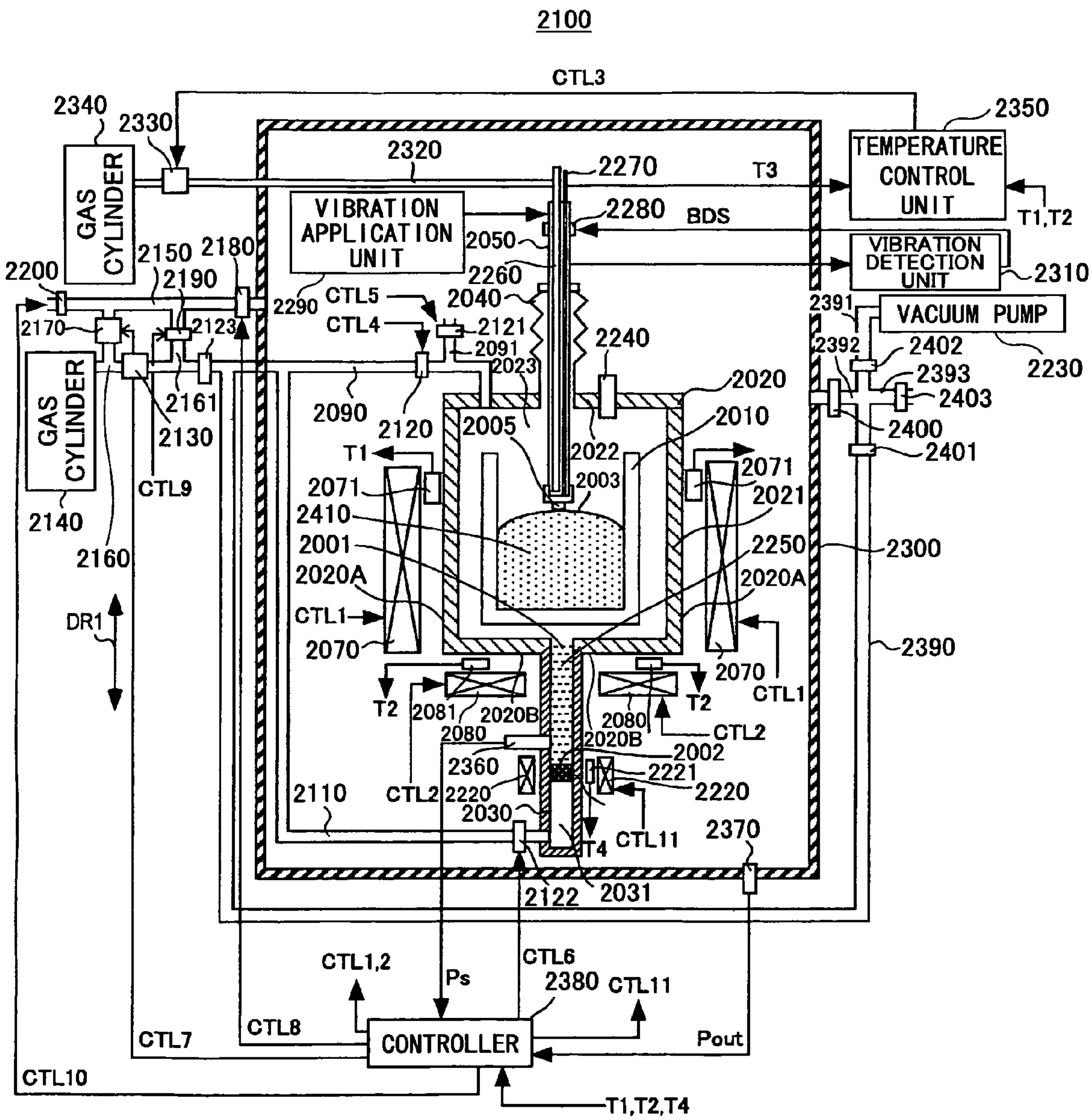
FIG. 47 is a schematic cross-sectional diagram showing the construction of a crystal growth apparatus according to Embodiment 7 of the present invention.

FIG. 47 is a schematic cross-sectional diagram showing the construction of a crystal growth apparatus according to Embodiment 7 of the present invention.

Referring to FIG. 47, a crystal growth apparatus 2100 according to Embodiment 7 of the present invention comprises: a crucible 2010; an inner reaction vessel 2020; conduits 2030 and 2260; a bellows 2040; a support unit 2050; a stopper/inlet plug 2060; heating units 2070, 2080 and 2220; temperature sensors 2071, 2081 and 2221; gas supply lines 2090, 2091, 2110, 2150, 2160, 2161 and 2320, valves 2120-2123, 2180, 2190, 2200, 2400-2403; pressure regulators 2130 and 2170; gas cylinders 2140 and 2340; evacuation lines 2390-2393; a vacuum pump 2230; pressure sensors 2240, 2360 and 2370; a metal melt 2250; a thermocouple 2270; an up/down mechanism 2280; a vibration applying unit 2290; an outer reaction vessel 2300; a vibration detection unit 2310; a flow meter 2330; a temperature control unit 2350; and a controller 2380.

The crucible 2010 has a generally cylindrical form and is formed of boron nitride (BN) or SUS316L stainless steel. The inner reaction vessel 2020 is disposed around the crucible 2010 with a predetermined separation from the crucible 2010. Further, the inner reaction vessel 2020 is formed of a main part 2021 and a lid 2022. Each of the main part 2021 and the lid 2022 is formed of SUS316L stainless steel, wherein a metal seal ring is provided between the main part 2021 and the lid 2022 for sealing. Thus, there occurs no leakage of the nitrogen gas and the metal Na vapor existing in the space 2023 inside the reaction vessel 2020 into the outer reaction vessel 2300 through the path between the main part 2021 and the lid 2022.

The conduit 2030 is connected to the inner reaction vessel 2020 at the underside of the crucible 2010 in terms of a gravitational direction DR1. The bellows 2040 is connected to the inner reaction vessel 2020 at the upper side of the crucible 2010 in terms of a gravitational direction DR1. The support substrate 2050 comprises a hollow cylindrical member and a part thereof is inserted into a space 2023 inside the inner reaction vessel 2020 via the bellows 2040.

The stopper/inlet plug 2060 may be formed of a metal, ceramic, or the like, for example, and is held inside the conduit 2030 at a location lower than the connection part of the inner reaction vessel 2020 and the conduit 2030.

The heating unit 2070 is disposed so as to surround the outer circumferential surface 2020A of the inner reaction vessel 2020. On the other hand, the heating unit 2080 is disposed so as to face a bottom surface 2020B of the inner reaction vessel 2020. The temperature sensors 2071 and 2081 are disposed in the close proximity of the heating units 2070 and 2080, respectively.

The gas supply line 2090 has an end connected to the inner reaction vessel 2020 via the valve 2120 and the other end connected to the gas cylinder 2140 via the pressure regulator 2130. The gas supply line 1091 has an end connected to the gas supply line 2090 while the other end of the gas supply line 2091 is opened. The gas supply line 2110 has an end connected to the conduit 2030 and the other end connected to the gas supply line 2090.

The valve 2120 is connected to the gas supply line 2090 in the vicinity of the inner reaction vessel 2020. The valve 2121 is mounted to the other end of the gas supply line 2091. The valve 2122 is connected to the gas supply line 2110 in the vicinity of the conduit 2030. The valve 2123 is mounted to the gas supply line 2090 in the vicinity of the connection part of the gas supply line 2290 and the gas supply line 2110.

The pressure regulator 2130 is connected to the gas supply line 2090 in the vicinity of the gas cylinder 2140. The gas cylinder 2140 is connected to the gas supply line 2090.

The gas supply line 2150 has an end connected to the outer reaction vessel 2300 via the valve 2180 while the other end of the gas supply line 2150 is opened. The gas supply line 2160 has an end connected to the gas supply line 2150 and the other end connected to the gas supply line 2090 between the pressure regulator 2130 and the gas cylinder 2140. The gas supply line 2161 has an end connected to the gas supply line 2150 at the region of higher pressure than in the valve 2180 and the other end connected to the gas supply line 2090 between the valve 2123 and the pressure regulator 2130.

The pressure regulator 2170 is connected to the gas supply line 2160. The valve 2180 is connected to the gas supply line 2150 in the vicinity of the outer reaction vessel 2300. The valve 2190 is mounted to the gas supply line 2161. The valve 2200 is mounted to the other end of the gas supply line 2150.

The heating unit is disposed so as to surround the stopper/inlet member 2060. The temperature sensor 2221 is disposed close to the heating unit 2220. The vacuum pump 2230 is connected to the evacuation line 2390. The pressure sensor 2240 is mounted to the inner reaction vessel 2020. The metal melt 2250 is formed of a metal sodium (metal Na) melt and is held inside the conduit 2030.

The conduit 2260 and the thermocouple 2270 are inserted into the interior of the support unit 2050. The up/down mechanism 2280 is mounted upon the support unit 2050 at the location above the bellows 2040. The inner reaction vessel 2300 includes therein the inner reaction vessel 2020, the conduit 2030, the bellows 2040, the heating units 2070 and 2080, the conduit 2260, the thermocouple 2270 and the up/down mechanism 2280. The gas supply line 2320 has an end connected to the conduit 2260 and the other end connected to the gas cylinder 2340 via the flow meter 2330. The flow meter 2330 is connected to the gas supply line 2320 in the vicinity of the gas cylinder 2340. The gas cylinder 2340 is connected to the gas supply line 2320.

The pressure sensor 2360 is mounted to the conduit 2030 in the vicinity of the stopper/inlet member 2060. The pressure sensor 2370 is mounted to the outer reaction vessel 2300.

The reaction vessel has an end connected to the gas supply line 2090 and the other end connected to the evacuation lines 2391-2393. The evacuation line 2391 has an end connected to the reaction vessel 2390, 2392 and 2393 and the other end connected to the vacuum pump 2230. The evacuation line 2392 has an end connected to the outer reaction vessel 2300 via the valve 2400 and the other end connected to the evacuation lines 2390, 2391 and 2393. The evacuation line 2393 has an end connected to the evacuation lines 2390-2393 while the other end of the evacuation line 2393 is opened.

The valve 2400 is connected to the evacuation line 2392 in the vicinity of the outer reaction vessel 2300. The valve 2401 is connected to the evacuation line 2390 in the vicinity of the connection part of the evacuation line 2390 to the evacuation lines 2391-2393. The valve 2402 is connected to the evacuation line 2391 in the vicinity of the connection part of the evacuation line 2391 to the evacuation lines 2391-2393. The valve 2403 2190 is mounted to the gas supply line 2393.

The crucible 2010 holds the melt mixture 2410 containing metal Na and metal gallium (metal Ga). The inner reaction vessel 2020 surrounds the crucible 2010. The conduit 2030 leads the nitrogen gas ($N_2$ gas) supplied from the gas cylinder 2140 via the gas supply lines 2090 and 2110 to the stopper/inlet plug 2060 and further holds the metal melt 2250.

The bellows 2040 holds the support unit 2050 and disconnects the interior of the inner reaction vessel 2020 from outside. Further, the bellows 2040 is capable of expanding and contracting in the gravitational direction DR1 with movement of the support unit 2050 in the gravitational direction DR1. The support unit 2050 supports a seed crystal 2005 of a GaN crystal at a first end thereof inserted into the inner reaction vessel 2020.

The stopper/inlet plug 2060 has a dimple structure on the outer peripheral surface such that there are formed apertures of the size of several ten microns between the inner wall of the conduit 2030 and the stopper/inlet plug 2060. Thus, the stopper/inlet plug 60 allows the nitrogen gas in the conduit 2030 to pass in the direction to the metal melt 2250 and supplies the nitrogen gas to the space 2023 via the metal melt 2250. Further, the stopper/inlet member 2060 holds the metal melt inside the conduit 2030 by the surface tension of the metal melt 2250.

The heating unit 2070 comprises a heater and a current source. Thus, the heating unit 2070 supplies a current from the current source to the heater in response to a control signal CTL1 from the temperature control unit 2380 and heats the crucible 2010 and the inner reaction vessel 2020 to a crystal growth temperature from the outer peripheral surface 2020A of the inner reaction vessel 2020. The temperature sensor 2071 detects a temperature T1 of the heater of the heating unit 2070 and outputs a temperature signal indicative of the detected temperature to the controller 2380.

The heating unit 2080 also comprises a heater and a current source. Thus, the heating unit 2080 supplies a current from the current source to the heater in response to a control signal CTL1 from the temperature control unit 2380 and heats the crucible 2010 and the inner reaction vessel 2020 to the crystal growth temperature from the outer peripheral surface 2020A of the inner reaction vessel 2020. The temperature sensor 2081 detects a temperature T2 of the heater of the heating unit 2080 and outputs a temperature signal indicative of the detected temperature T2 to the controller 2380.

The gas supply line 2090 supplies the nitrogen gas supplied from the gas cylinder 2140 via the pressure regulator 2130 to the interior of the inner reaction vessel 2020 via the valve 2120. The gas supply line 2110 supplies the nitrogen gas supplied from the gas cylinder 2140 via the gas supply line 2090, the pressure regulator 2130 and the valve 2123 to the interior of the conduit 2030 via the valve 2120.

The valve 2120 supplies the nitrogen gas inside the gas supply line 2090 to the interior of the inner reaction vessel 2020 or interrupts the supply of the nitrogen gas to the interior of the inner reaction vessel 2020 in response to a control signal CTL4 from the controller 2380. Further, the valve 2120 functions as the valve that causes the pressure of the space 2023 inside the inner reaction vessel 2020 to be generally equal to the pressure of the space 2031 inside the conduit 2030.

The valve 2121 releases the gas inside the inner reaction vessel 2020 to the outside and stops the release of the gas inside the inner reaction vessel 2020 in response to a control signal CTL5 from the controller 2380. The valve 2122 supplies the nitrogen gas inside the gas supply line 2110 to the interior of the space 2031 inside the conduit 2030 or interrupts the supply of the nitrogen gas to the interior of the space 2031 in response to a control signal CTL6 from the controller 2380.

The pressure regulator 2130 supplies the nitrogen gas from the gas cylinder 2140 to the gas supply lines 2090, 2110, 2161 and the evacuation line 2390 after setting the pressure to a predetermined pressure. The gas cylinder 2140 holds the nitrogen gas. The gas supply line 2150 supplies the nitrogen gas supplied from the gas cylinder 2140 via the pressure regulator 2170 to the interior of the outer reaction vessel 2300 via the valve 2180.

The gas supply line 2160 supplies the nitrogen gas from the gas cylinder to the gas supply line 2150 via the pressure regulator 2170. The gas supply line 2161 supplies and receives the nitrogen gas between the gas supply line 2090 and the gas supply line 2150 via the valve 2190.

The pressure regulator 2170 supplies the nitrogen gas from the gas cylinder 2140 to the gas supply lines 2150 after setting the pressure to a predetermined pressure. Further, the pressure regulator 2170 pressurizes the interior of the outer reaction vessel 2300 to a predetermined pressure in response to a control signal CTL7 from the controller 2380.

The valve 2180 supplies the nitrogen gas inside the gas supply line 2150 to the interior of the outer reaction vessel 2300 or interrupts the supply of the nitrogen gas to the interior of the outer reaction vessel 2020 in response to a control signal CTL8 from the controller 2380.

The valve 2190 connects or disconnects the gas supply line 1090 and the gas supply line 2150 in response to a control signal CTL9 form the controller 2380. Thus, the valve 2190 functions as a bypass valve that directly connects the gas supply line 2090, which supplies the nitrogen gas to the inner reaction vessel 2020, and the gas supply line 2150, which supplies the nitrogen gas to the outer reaction vessel 2300.

The valve 2200 releases the gas inside the outer reaction vessel 2300 to the outside and stops the release of the gas inside the outer reaction vessel 2300 in response to a control signal CTL10 from the controller 2380.

The heating unit 2220 comprises a heater and a current source. Further, the heating unit supplies a current from the current source to the heater in response to a control signal CTL11 from the control unit 2380 and heats the stopper/inlet member 2060 to a predetermined temperature. The temperature sensor 2221 detects a temperature T4 of the heater of the heating unit 2220 and outputs the detected temperature T4 to the controller 2380.

The vacuum pump 2230 evacuates the interior of the inner reaction vessel 2020 to a vacuum state via the evacuation lines 2390 and 2391 and the valves 2120, 2401 and 2402 and further evacuates the interior of the outer reaction vessel 2300 to a vacuum state via the evacuation lines 2391 and 2392 and the valves 2400 and 2402.

The pressure sensor 2240 detects the pressure inside the inner reaction vessel 2020 not heated by the heating unit 2070. The metal melt 2250 supplies the nitrogen gas introduced through the stopper/inlet plug 2060 into the space 2023.

The conduit 2260 cools the seed crystal 2005 by releasing the nitrogen gas supplied from the gas supply line 2320 into the support unit 2050 from the first end thereof. The thermocouple 2270 detects a temperature T3 of the seed crystal 2005 and outputs a temperature signal indicative of the detected temperature T3 to the temperature control unit 2350.

The up/down mechanism 2280 causes the support unit 2050 to move up or down in response to a vibration detection signal BDS from the vibration detection unit 2310 according to a method to be explained later, such that the seed crystal 2005 makes a contact with a vapor-liquid interface 2003 between the space 2023 and the melt mixture 2410.

The vibration application unit 2290 comprises a piezoelectric element, for example, and applies a vibration of predetermined frequency to the support unit 2050. The outer reaction vessel 20300 accommodates therein the inner reaction vessel 2020, the conduit 2030, the bellows 2040, the support unit 2050, the heating units 2070 and 2080, the conduit 2260, the thermocouple 2270 and the up/down mechanism 2280. The vibration detection unit 2310 comprises an acceleration pickup, for example, and detects the vibration of the support unit 2050 and outputs the vibration detection signal BDS indicative of the vibration of the support unit 2050 to the up/down mechanism 2280.

The gas supply line 2320 supplies a nitrogen gas supplied from the gas cylinder 2340 via the flow meter 2330 to the conduit 2260. The flow meter 2330 supplies the nitrogen gas supplied from the gas cylinder 2340 to the gas supply line 2320 with flow rate adjustment in response to a control signal CTL3 from the temperature control unit 2350. The gas cylinder 2340 holds the nitrogen gas.

The temperature control unit 2350 receives the temperatures T1, T2 and T3 from the temperature sensors 2071, 2081 and the thermocouple 2270 and produces the control signal CTL3 for cooling the seed crystal 2005 based on the received temperatures T1, T2 and T3.

The temperatures T1 and T2 of the heaters of the heating units 2070 and 2080 are generally deviated from the temperature of the melt mixture 2410 by a predetermined temperature difference $\alpha$, and thus, the heater temperatures T1 and T2 of the heating units 2070 and 2080 have the value of 800+$\alpha$° C. in the event the melt mixture 2410 has the temperature of 800° C. On the other hand, the temperature T3 of the seed crystal is equal to the temperature of the melt mixture 2410.

Thus, the temperature control unit 2350 produces the control signal STL3 for cooling the seed crystal 2005 when the temperatures T1 and T2 as measured by the temperature sensors 2071 and 2081 have reached the temperature of 800+$\alpha$° C. and the temperature T3 detected by the thermocouple 2270 has reached 800° C. Further, the temperature control unit 2350 provides the produced control signal CTL3 to the flow meter 2330.

The pressure sensor detects a hydrostatic pressure Ps of the metal melt 2250 for the state in which the crucible 2010 and the inner reaction vessel 2020 are heated to the crystal growth temperature and provides the detected hydrostatic pressure Ps to the controller 2380. The pressure sensor 2370 detects the pressure Pout inside the outer reaction vessel 2300 and provides the detected pressure Pout to the controller 2380.

Thus, the controller 2380 receives the hydrostatic pressure Ps from the pressure sensor 2360 and the pressure Pout from the pressure sensor 2370. The controller 2380 then detects the pressure Pin inside the inner reaction vessel 2020 based on the hydrostatic pressure Ps. More specifically, the hydrostatic pressure Ps of the metal melt 2250 increases relatively in proportion to the pressure Pin when the pressure Pin inside the space 2023 of the inner reaction vessel 2020 is increased relatively. Further, the hydrostatic pressure Ps of the metal melt 2250 decreases relatively in proportion to the pressure Pin when the pressure Pin inside the space 2023 of the inner reaction vessel 2020 is decreased relatively.

Thus, the hydrostatic pressure Ps is proportional to the pressure Pin inside the space 2023. Thus, the control unit 2380 holds a proportional constant of the hydrostatic pressure Ps and the pressure Pin converts the hydrostatic pressure Ps into the pressure Pin by applying the proportional coefficient to the hydrostatic pressure Ps.

Further, the controller 2380 calculates the absolute value of the pressure difference between the pressure Pin and the pressure Pout as |Pin−Pout|, and decides whether or not the calculated absolute value |Pin−Pout|is smaller than a predetermined value C. The predetermined value C may be set to 0.1 MPa, for example. It should be noted that this predetermined value C provides the threshold beyond which it is judged that the crystal growth apparatus 2100 is anomalous.

When the absolute value |Pin−Pout| is smaller than the predetermined value C, no control is made on the valves 3233, 3280 and 2200 by the control signals CTL6, CTL8 and CTL10, and the controller 2380 receives the hydrostatic pressure Ps and the pressure Pout continuously from the pressure sensors 2360 and 2370, respectively.

On the other hand, when the value |Pin−Pout| is equal to or larger than the predetermined value C, the controller 2380 judges whether or not the pressure Pin is higher than the pressure Pout.

In the event the pressure Pin is higher than the pressure Pout, the controller 2380 produces the control signal CTL6 for causing the valve 2122 to close, and the control signal CTL6 thus produced is provided to the valve 2122. Further, the controller 2380 produces the control signal CTL8 for opening the valve 2180 and the control signal CTL7 for pressurizing the interior of the outer reaction vessel 2300 such that the pressure Pout generally coincides with the pressure Pin. Further, the controller 2380 provides the control signals CTL8 and CTL7 thus produced to the valve 2180 and the pressure regulator 2170, respectively.

Further, the controller produces the control signal CTL8 for opening the valve 2180 and the control signal CTL10 for opening the valve 2200 when the pressure Pin is lower than the pressure Pout, and the control signals CTL8 and CTL10 thus produced are supplied respectively to the valves 2180 and 2200.

Further, when the temperatures T1 and T2 as measured by the temperature sensors 2071 and 2080 are lowered to the predetermined temperatures and have agreed generally with the temperature T4 reported by the temperature sensor 2221, the controller 2380 produces the control signal CTL5 for opening the valve 212 and supplies the same to the valve 2121.

The evacuation line 2390 causes the gas inside the inner reaction vessel 2020 supplied thereto through the gas supply line 2090 to the evacuation line 2391. The evacuation line 2391 passes the gas inside the evacuation line 2390 or 2392 to the vacuum pump 2230. The evacuation line 2392 passes the gas inside the outer reaction vessel 2300 to the evacuation line 2391. The evacuation line 2392 releases the gas inside the evacuation liens 2390, 2391 and 2392 to the outside.

The valve 2400 connects the interior of the outer reaction vessel 2300 and the evacuation line 2392 spatially or disconnects the interior of the outer reaction vessel 2300 and the evacuation line 2392 spatially. The valve 2401 supplies the gas inside the evacuation line 239 to the evacuation lines 2391-2393 and further stops the supply of the gas inside the evacuation line 2390 to the evacuation lines 2391-2393.

The valve 2402 supplies the gas inside the evacuation lines 2390 and 2392 to the vacuum pump 2230 and further stops the supply of the gas inside the evacuation lines 2390 and 2393 to the vacuum pump 2230. Further, the valve 2402 supplies the gas inside the evacuation line 2391 between the valve 2402 and the vacuum pump 2391 to the evacuation line 2392 and further stops the supply of the gas in the evacuation line 2391 between the valve 2402 and the vacuum pump 2230 to the evacuation line 2393.

The valve 2403 releases the gas inside the evacuation line 2393 to the outside and further stops the release of the gas in the evacuation line 2393 to the outside.

Figure 48:
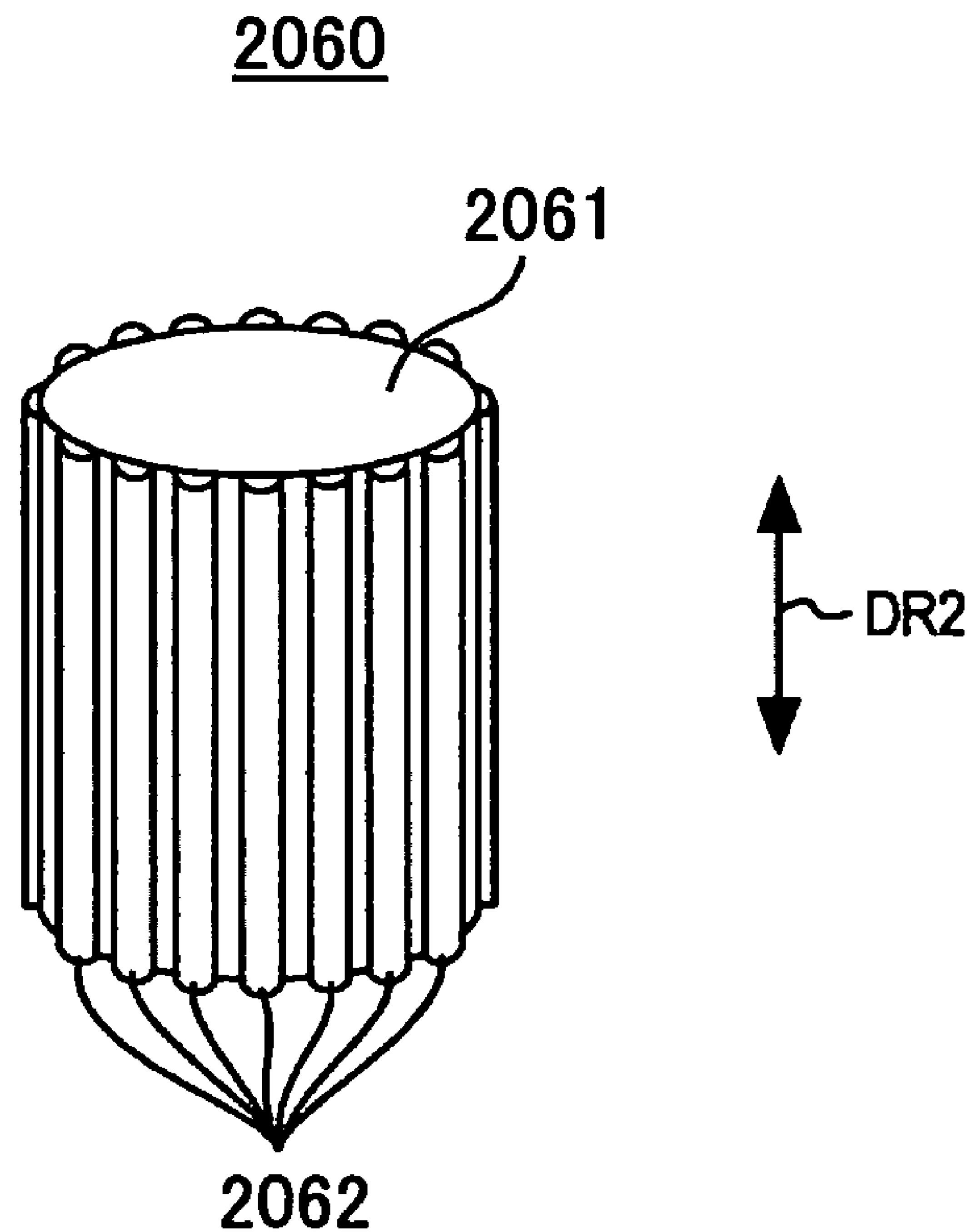
FIG. 48 is an oblique view diagram showing the construction of the stopper/inlet plug shown in FIG. 47.

FIG. 48 is an oblique view diagram showing the construction of the stopper/inlet member 2060 shown in FIG. 47.

Referring to FIG. 48, the stopper/inlet member 2060 includes a plug 2061 and projections 2062. The plug 2061 has a generally cylindrical form. Each of the projections 2062 has a generally semi-circular cross-sectional shape and the projections 2061 are formed on the outer peripheral surface of the plug 2061 so as to extend in a length direction DR2.

Figure 49:
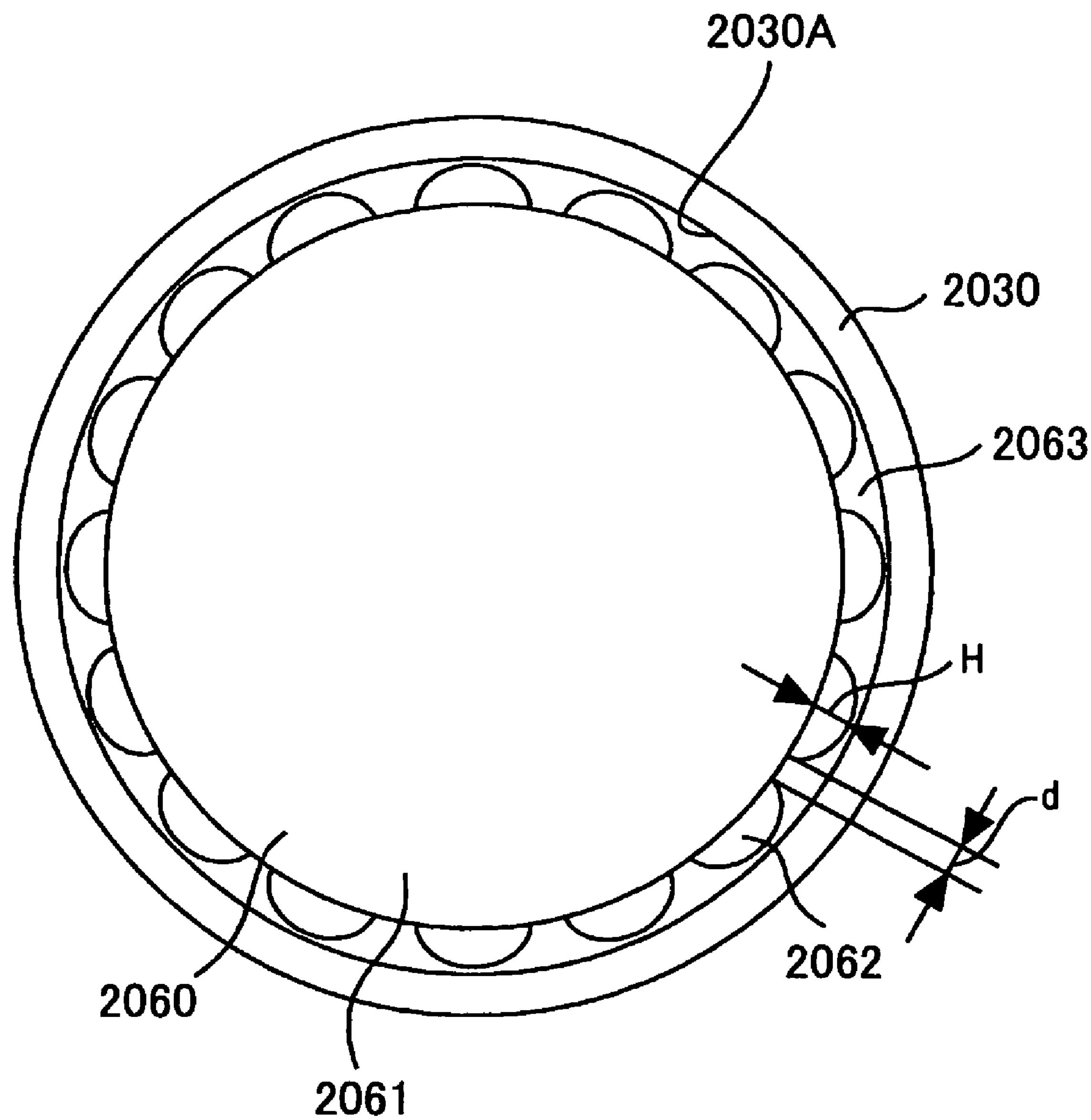
FIG. 49 is a plan view diagram showing the state of mounting the stopper/inlet plug to a conduit.

FIG. 49 is a plan view diagram showing the state of mounting the stopper/inlet member 2060 to the conduit 2030.

Referring to FIG. 49, the projections 2062 are formed with plural number in the circumferential direction of the plug 2061 with an interval d of several ten microns. Further, each projection 2062 has a height H of several ten microns. The plural projections 2062 of the stopper/inlet member 2060 make a contact with the inner wall surface 2030A of the conduit 2030. With this, the stopper/inlet member 2060 is in engagement with the inner wall 2030A of the conduit 2030.

Because the projections 2062 have a height H of several ten microns and are formed on the outer peripheral surface of the plug 2061 with the interval d of several ten microns, there are formed plural gaps 2063 between the stopper/inlet member 2060 and the inner wall 2030A of the conduit 2030 with a diameter of several ten microns in the state the stopper/inlet member 2060 is in engagement with the inner wall 2030A of the conduit 2030.

This gap 2063 allows the nitrogen gas to pass in the length direction DR2 of the plug 2061 and holds the metal melt 2250 at the same time by the surface tension of the metal melt 2250, and thus, the metal melt 250 is blocked from passing through the gap in the longitudinal direction DR2 of the plug 61.

Figure 50A:
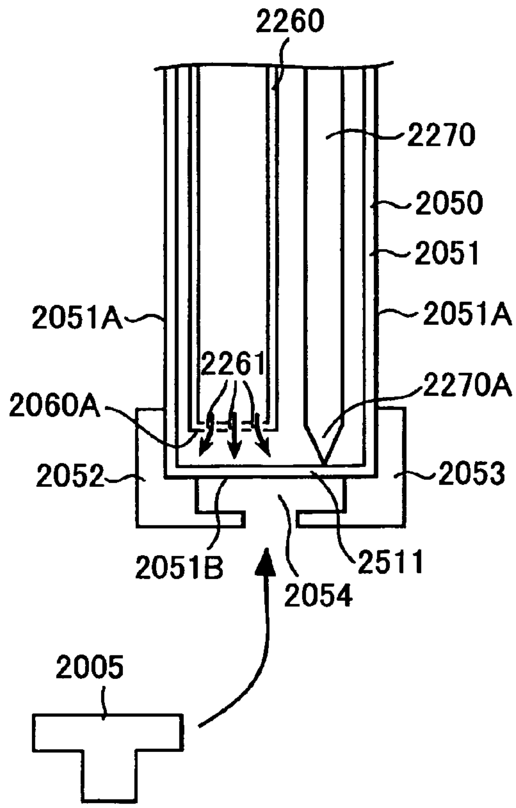
FIGS. 50A and 50B are enlarged diagrams showing the construction of the support unit, conduit and the thermocouple shown in FIG. 47.
Figure 50B:
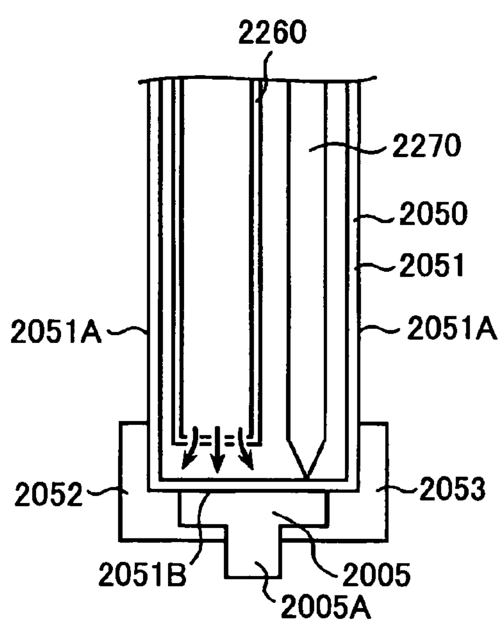

FIGS. 50A and 50B are enlarged diagrams of the support unit 2050, the conduit 2260 and the thermocouple 2270 shown in FIG. 47.

Referring to FIGS. 50A and 50B, the support unit 50 includes a cylindrical member 2051 and fixing members 2052 and 2053. The cylindrical member 2051 has a generally circular cross-sectional form. The fixing member 2052 has a generally L-shaped cross-sectional form and is fixed upon an outer peripheral surface 2051A and a bottom surface 2051B of the cylindrical member 2051 at the side of a first end 2511 of the cylindrical member 2051. Further, the fixing member 2053 has a generally L-shaped cross-sectional form and is fixed upon the outer peripheral surface 2051A and the bottom surface 2051B of the cylindrical member 2051 at the side of a first end 2511 of the cylindrical member 2051 in symmetry with the fixing member 2052. As a result, there is formed a space part 2054 in the region surrounded by the cylindrical member 2051 and the fixing members 2052 and 2053.

The conduit 2260 has a generally circular cross-sectional form and is disposed inside the cylindrical member 2051. In this case, the bottom surface 2260A of the conduit 2260 is disposed so as to face the bottom surface 2051B of the cylindrical member 2051. Further, plural apertures 2261 are formed on the bottom surface 2260A of the conduit 2260. Thus, the nitrogen gas supplied to the conduit 2260 hits the bottom surface 2051B of the cylindrical member 2051 via the plural apertures 2261.

The thermocouple 2270 is disposed inside the cylindrical member 2051 such that a first end 2270A thereof is adjacent to the bottom surface 2051B of the cylindrical member 2051. Reference should be made to FIG. 50A.

Further, the seed crystal 2005 has a shape that fits the space 2054 and is held by the support unit 2050 by being fitted into the space 2054. In the present case, the seed crystal 2005 makes a contact with the bottom surface 2051B of the cylindrical member 2051. Reference should be made to FIG. 50B.

Thus, a high thermal conductivity is secured between the seed crystal 2005 and the cylindrical member 2051. As a result, it becomes possible to detect the temperature of the seed crystal 2005 by the thermocouple 2270 and it becomes also possible to cool the seed crystal 2005 easily by the nitrogen gas directed to the bottom surface 2051B of the cylindrical member 2051 from the conduit 2260.

Figure 51:
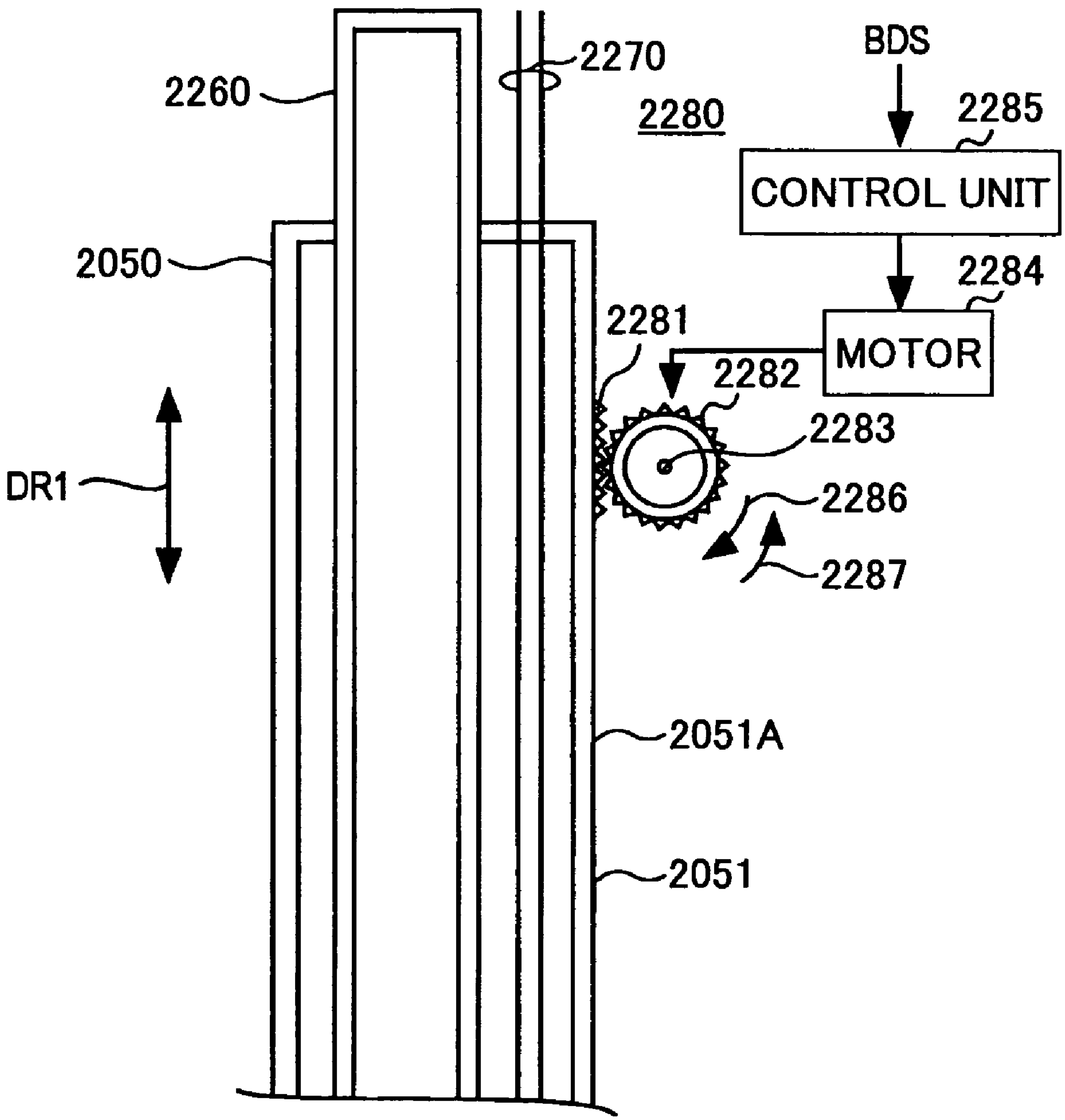
FIG. 51 is a schematic diagram showing the construction of the up/down mechanism shown in FIG. 47.

FIG. 51 is a schematic diagram showing the construction of the up/down mechanism 2280 shown in FIG. 47.

Referring to FIG. 51, the up/down mechanism 2280 comprises a toothed member 2281, a gear 2282, a shaft member 2283, a motor 2284 and a controller 2285.

The toothed member 2281 has a generally triangular cross-sectional shape and is fixed upon the outer peripheral surface 2051A of the cylindrical member 2051. The gear 2282 is fixed upon an end of the shaft member 2283 and meshes with the toothed member 2281. The shaft member 2283 has the foregoing end connected to the gear 2282 and the other end connected to a shaft (not shown) of the motor 2284.

The motor 2284 causes the gear 2282 to rotate in the direction of an arrow 2286 or an arrow 2227 in response to control from the control unit 2285. The control unit 2285 controls the motor 2282 based on the vibration detection signal BDS from the vibration detection unit 2310 and causes the gear 2284 to rotate in the direction of the arrow 2286 or 2287.

When the gear 2282 is rotated in the direction of the arrow 2286, the support unit 2050 moves in the upward direction in terms of the gravitational direction DR1, while when the gear is rotated in the direction of the arrow 2287, the support unit 2050 is moved downward in terms of the gravitational direction DR1.

Thus, rotation of the gear 2282 in the direction of the arrow 2286 or 2287 corresponds to a movement of the support unit 2050 up or down in terms of the gravitational direction DR1.

Figure 52:
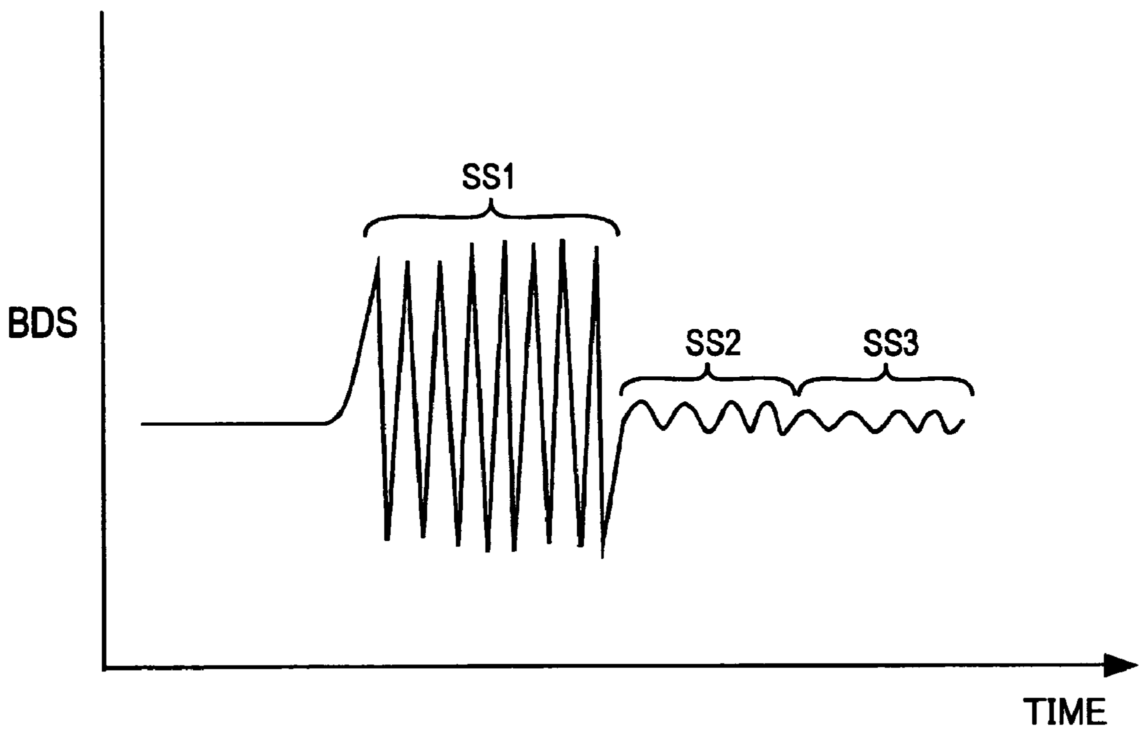
FIG. 52 is a timing chart showing the waveform of a vibration detection signal.

FIG. 52 is a timing chart of the vibration detection signal BDS.

Referring to FIG. 52, the vibration detection signal BDS detected by the vibration detection unit 2240 comprises a signal component SS1 in the case the seed crystal 2005 is not in contact with the melt mixture 2410, while in the case the seed crystal 2005 is in contact with the melt mixture 2410, the vibration detection signal BDS is formed of a signal component SS2. Further, in the case the seed crystal 2005 is dipped into the melt mixture 2410, the vibration detection signal BDS is formed of a signal component SS3.

In the event the seed crystal 2005 is not in contact with the melt mixture 2410, the seed crystal 2005 is vibrated vigorously by the vibration applied by the vibration application unit 2290 and the vibration detection signal BDS is formed of the signal component SS1 of relatively large amplitude. When the seed crystal 2005 is in contact with the melt mixture 2410, the seed crystal 2005 cannot vibration vigorously even when the vibration is applied from the vibration application unit 2290 because of viscosity of the melt mixture 2410, and thus, the vibration detection signal BDS is formed of the signal component SS2 of relatively small amplitude. Further, when the seed crystal 2005 is dipped into the melt mixture 2410, vibration of the seed crystal 2005 becomes more difficult because of the viscosity of the melt mixture 2410, and the vibration detection signal BDS is formed of the signal component SS3 of further smaller amplitude than the signal component SS2.

Referring to FIG. 51, again, the control unit 2285 detects, upon reception of the vibration detection signal from the vibration detection unit 2310, the signal component in the vibration detection signal BDS. Thus, when the detected signal component is the signal component SS1, the control unit 2285 controls the motor 2284 such that the support unit 2050 is lowered in the gravitational direction DR1, until the signal component SS2 is detected for the signal component of the vibration detection signal BDS.

More specifically, the control unit 2285 controls the motor 2282 such that the gear 2282 is rotated in the direction of the arrow 2287, and the motor 2284 causes the gear 2282 to rotate in the direction of the arrow 2287 in response to the control from the control unit 2285 via the shaft member 2283. With this, the support member 2050 moves in the downward direction in terms of the gravitational direction.

Further, the control unit 2285 controls the motor 2282 such that rotation of the gear 2284 is stopped when the signal component of the vibration detection signal BDS received from the vibration detection unit 2310 has changed from the signal component SS1 to the signal component SS2, and the motor 2284 stops the rotation of the gear 2282 in response to the control from the control unit 2285. With this, the support unit 2050 stops the movement thereof and the seed crystal 2005 is held at the vapor-liquid interface 2003.

On the other hand, the control unit 2285 controls the motor 2284, when received the vibration detection signal BDS formed of the signal component SS2 from the vibration detection unit 2310, such that the movement of the support unit 2050 is stopped.

Thus, the up/down mechanism 2280 moves the support unit 2050 in the gravitational direction DR1 based on the vibration detection signal BDS detected by the vibration detection unit 2310, such that the seed crystal 2005 is in contact with the melt mixture 2410.

Figure 53:
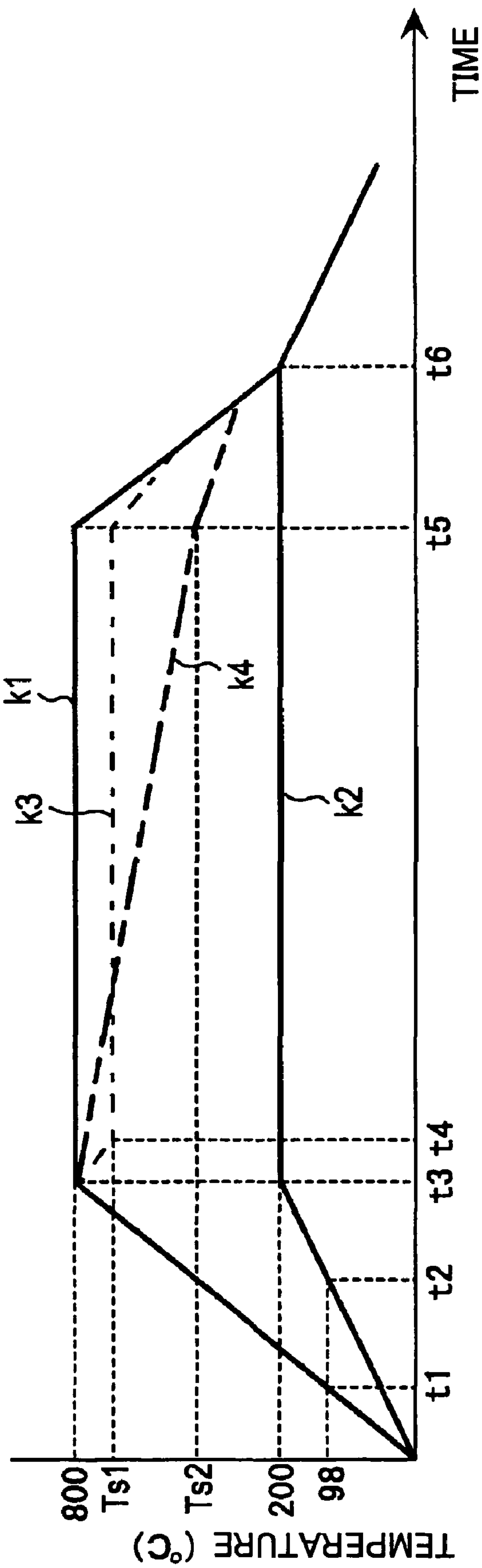
FIG. 53 is a timing chart showing the temperature of the reaction vessel and the outer reaction vessel.
Figure 54:
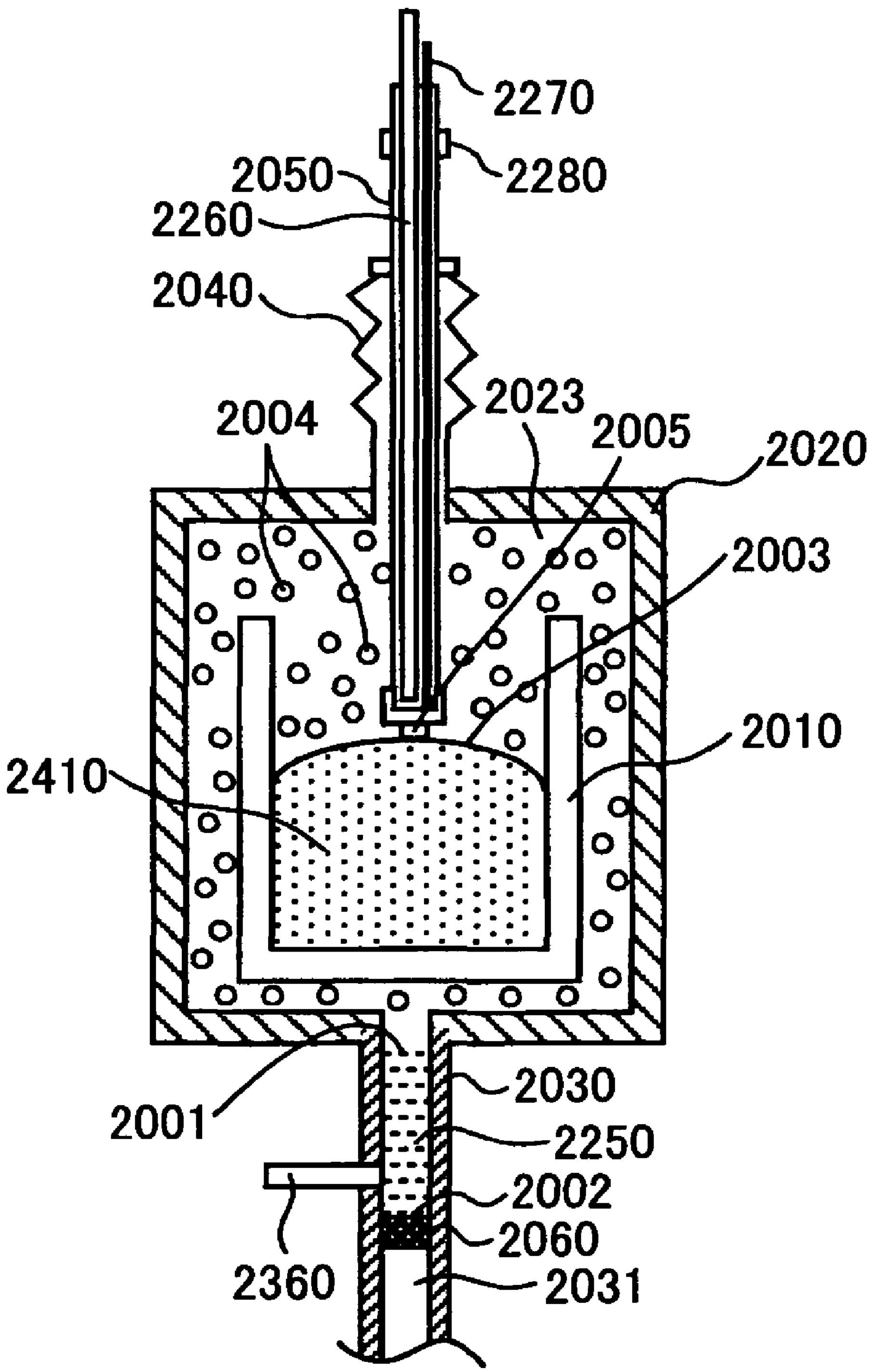
FIG. 54 is a schematic diagram showing the state inside the crucible and the inner reaction vessel during the interval between two timings t1 and t3 shown in FIG. 53.
Figure 55:
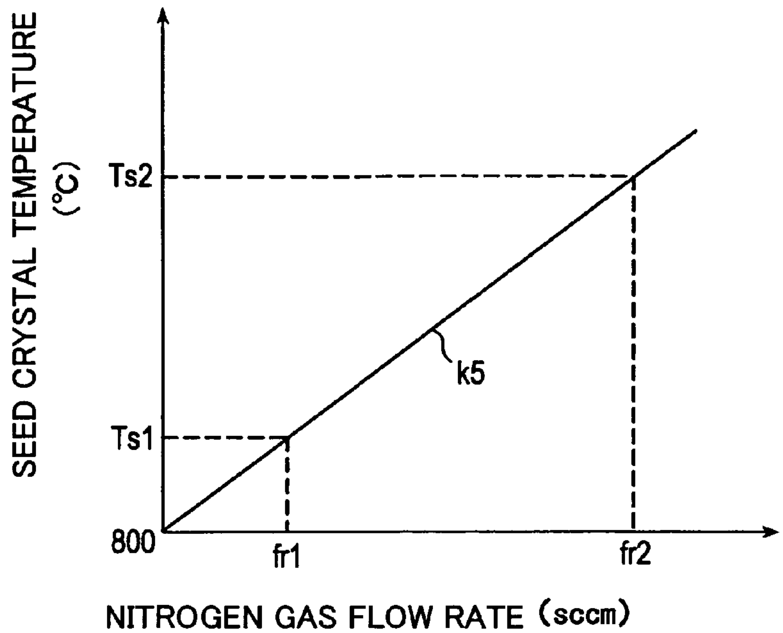
FIG. 55 is a diagram showing the relationship between the temperature of the seed crystal and the flow rate of the nitrogen gas.

FIG. 53 is a timing chart showing the temperature of the reaction vessel and the outer reaction vessel. Further, FIG. 54 is a schematic diagram showing the state inside the crucible 2010 and the inner reaction vessel 2020 during the interval between two timings t1 and t3 shown in FIG. 53. Further, FIG. 55 is a diagram showing the relationship between the temperature of the seed crystal 2005 and the flow rate of the nitrogen gas.

In FIG. 53, it should be noted that the curve k1 represents the temperature of the crucible 2010 and the inner reaction vessel 2020 while the curve k2 represents the temperature of the stopper/inlet member 2060. Further, the curves k3 and k4 show the temperature of the seed crystal 2005.

Referring to FIG. 53, the heating units 2070 and 2080 heat the crucible 2010 and the inner reaction vessel 2020 such that the temperature rises along the line k1 and is held at 800° C. When the heating units 2070 and 2080 start to heat the crucible 2010 and the inner reaction vessel 2020, the temperature of the crucible 2010 and the inner reaction vessel 2020 start to rise and reaches a temperature of 98° C. at the timing t1 and a temperate of 800° C. at the timing t2.

Further, the heating unit 2220 heats the inlet/stopper member 2060 such that the temperature thereof rises along the curve k2 and is held at 200° C. When the heating units 2220 and 2060 start to heat the stopper/inlet member 2060, the temperature of the stopper/inlet member 2060 starts to rise and reaches a temperature of 98° C. at the timing t1 and a temperate of 200° C. at the timing t3.

With this, the metal Na held in the conduit 2030 undergoes melting and the metal melt 2250 (=metal Na liquid) is formed. Further, the nitrogen gas 2004 inside the space 2023 cannot escape to the space 2031 inside the conduit 2030 through the metal melt 2250 (=metal Na melt) and the stopper/inlet member 2060, and the nitrogen gas 2004 is confined in the space 2023. Reference should be made to FIG. 54.

Further, during the interval from the timing t1 in which the temperature of the crucible 2010 and the inner reaction vessel 2020 reaches 98° C. to the timing t3 in which the temperature reaches 800° C., it should be noted that the up/down mechanism 2280 moves the support unit 2050 up or down according to the method explained above in response to the vibration detection signal BDS from the vibration detection unit 2310 and maintains the seed crystal 2005 in contact with the melt mixture 2410.

Further, when the temperature of the crucible 2010 and the inner reaction vessel 2020 reaches 800° C. and that the temperature of the stopper/inlet member 2060 reaches 200° C., the vapor pressure of the metal Na evaporated from the metal melt 2250 generally balances with the vapor pressure of the metal Na evaporated from the melt mixture 2410, and the nitrogen gas 2004 in the space 2023 is incorporated into the melt mixture 2410 via the metal Na inside the melt mixture 2410. In this case, it should be noted that the concentration of nitrogen or GaxNy (x, y are real numbers) in the melt mixture 2410 takes the maximum value in the vicinity of the vapor-liquid interface 2003 between the space 2023 and the melt mixture 2410, and thus, growth of the GaN crystal starts from the seed crystal 2005 in contact with the vapor-liquid interface 2003. Hereinafter, GaxNy will be designated as "group III nitride" and the concentration of GaxNy will be designated as "concentration of group III nitride". Further, in the present invention, it should be noted that "group III" means "group IIIB" as defined in a periodic table of IUPAC (International Union of Pure and Applied Chemistry).

In the case the nitrogen gas is not supplied to the conduit 2260, the temperature T3 of the seed crystal 2005 is 800° C. and equal to the temperature of the melt mixture 2410, while in the present invention, the seed crystal 2005 is cooled by supplying a nitrogen gas to the inside of the conduit 2260 for increasing the degree of supersaturation of nitrogen in the melt mixture 2410 in the vicinity of the seed crystal 2005. Thus, the temperature T3 of the seed crystal 2005 is set lower than the temperature of the melt mixture 2410.

More specifically, the temperature T3 of the seed crystal 2005 is set to a temperature Ts1 lower than 800° C. along the curve k3 after the timing t3. This temperature Ts1 may be the temperature of 790° C. Next, the method of setting the temperature T3 of the seed crystal 2005 to the temperature Ts1 will be explained.

When the temperature T1 and T2 as measured by the temperature sensors 2071 and 2081 have reached 800° C.+α and when the temperature T3 as measured by the thermocouple has reached 800° C., the temperature control unit 2350 produces a control signal CTL3 for causing to flow a nitrogen gas with an amount such that the temperature T3 of the seed crystal 2005 is set to the temperature Ts1, and supplies the control signal CTL3 to the flow meter 2330.

With this, the flow meter 2320 causes to flow a nitrogen gas from the gas cylinder 2340 to the conduit 2260 via the gas supply line 2320 in response to the control signal CTL3 with a flow rate determined such that the temperature T3 is set to the temperature Ts1. Thus, the temperature of the seed crystal 5 is lowered from 800° C. generally in proportion to the flow rate of the nitrogen gas, and the temperature T3 of the seed crystal 2005 is set to the temperature Ts1 when the flow rate of the nitrogen gas has reaches a flow rate value fr1 (sccm). Reference should be made to FIG. 55.

Thus, the flow meter 2330 causes the nitrogen gas to the conduit 2260 with the flow rate value fr1. The nitrogen gas thus supplied to the conduit 2260 hits the bottom surface 2051B of the cylindrical member 2051 via the plural apertures 2260 of the conduit 2261.

With this, the seed crystal 2005 is cooled via the bottom surface 2051B of the cylindrical member 2051 and the temperature T3 of the seed crystal 2005 is lowered to the temperature Ts1 with the timing t4. Thereafter, the seed crystal 5 is held at the temperature Ts1 until a timing t5.

Preferably, the temperature T3 of the seed crystal 2005 is controlled, after the timing t3, such that the temperature is lowered along the line k4. Thus, the temperature T3 of the seed crystal 2005 is lowered from 800° C. to the temperature Ts2 (<Ts1) during the interval from the timing t3 to the timing t5. In this case, the flow meter 330 increases the flow rate of the nitrogen gas supplied to the conduit 2260 from 0 to a flow rate value fr2 along a line k5 based on the control signal CTL3 from the temperature control unit 2350. When the flow rate of the nitrogen gas has become the flow rate value fr2, the temperature T3 of the seed crystal 205 is set to a temperature Ts2 lower than the temperature Ts1. The temperature Ts2 may be chosen to 750° C.

Thus, by increasing the temperature difference between the temperature of the melt mixture 2410 (=800° C.) and the temperature T3 of the seed crystal 2005 gradually, it becomes possible to maintain the state of supersaturation for nitrogen or the group III nitride in the melt mixture 2410 in the vicinity of the seed crystal 2005, and it becomes possible to continue the crystal growth of the GaN crystal. As a result, it becomes possible to increase the size of the GaN crystal.

Figure 56:
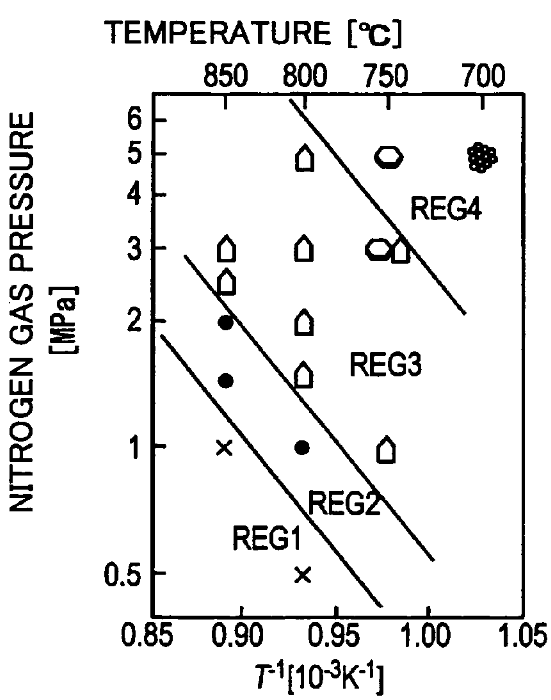
FIG. 56 is a diagram showing the relationship between the nitrogen gas pressure and the crystal growth temperature for the case of growing a GaN crystal.

In the case of growing a GaN crystal with the crystal growth apparatus 2100, a GaN crystal grown in the crystal growth apparatus 2100 without using the seed crystal 2005 is used for the seed crystal 2005. FIG. 56 is a diagram showing the relationship between the nitrogen gas pressure and the crystal growth temperature for the case of growing a GaN crystal. In FIG. 56, the horizontal axis represents the crystal growth temperature while the vertical axis represents the nitrogen gas pressure. In FIG. 56, it should be noted that the region REG1 is the region where dissolving of the GaN crystal takes place, while the region REG2 is the region where occurrence of nuclei is suppressed and growth of the GaN crystal takes place from the seed crystal, while the region REG3 is the region where there occurs numerous nucleation at the bottom surface and sidewall surface of the crucible 2010 in contact with the melt mixture 2410 and there are formed GaN crystals of plate-like form.

Thus, in the case of manufacturing the seed crystal 2005, GaN crystals are grown by using the nitrogen gas pressure and crystal growth temperature of the region REG3. In this case, numerous nuclei are formed on the bottom surface and sidewall surface of the crucible 2010 and columnar GaN crystals grown in the c-axis direction are obtained.

Further, the seed crystal 2005 is formed by slicing out the GaN crystal of the shape shown in FIGS. 50A and 50B from the numerous GaN crystals formed as a result of the crystal growth process. Thus, a projecting part 2005A of the seed crystal 2005 shown in FIG. 50B is formed of a GaN crystal grown in the c-axis direction (<0001> direction).

The seed crystal 2005 thus formed is fixed upon the support unit 2050 by fitting into the space 2054 of the support unit 2050.

When the crystal growth of the GaN crystal is over with the timing t5, the temperatures of the crucible 2010 and the inner reaction vessel 2020 are lowered from 800° C. along the curve k1, wherein the temperatures reach 200° C. with the timing t6. Thereafter, the crucible 2010 and the inner reaction vessel 2020 are cooled by a natural cooling process. Further, the stopper/inlet member 2060 is held at 200° C. along the curve k2 up to the timing t6, wherein the stopper/inlet member 2060 is subjected to a natural cooling process after the timing t6. Further, after the timing t5, it should be noted that the cooling of the seed crystal 2005 by the nitrogen gas is stopped after the timing t5, and the temperature of the seed crystal 2005 lowered along the curve k1 together with the crucible 2010 and the inner reaction vessel 2020.

Figure 57:
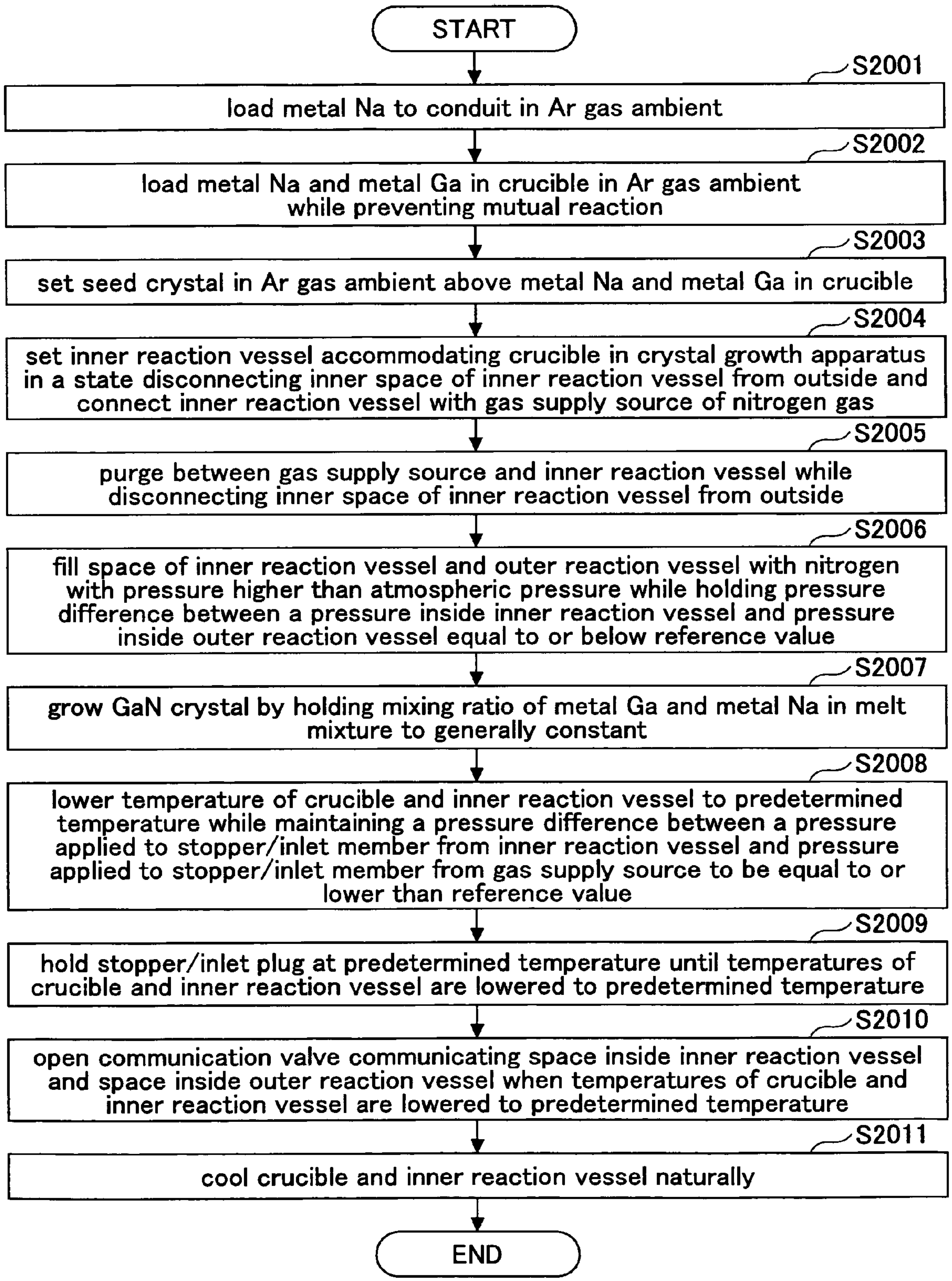
FIG. 57 is a flowchart explaining the manufacturing method of a GaN crystal according to Embodiment 7 of the present invention.

FIG. 57 is a flowchart explaining the manufacturing method of a GaN crystal according to Embodiment 7 of the present invention.

Referring to FIG. 57, the crucible 2010, the reaction vessel 2020 and the conduit 2030 are incorporated into a glove box filled with an Ar gas when a series of processes are started. In this state, it should be noted that the valves 2120-2122 are closed and the gas supply lines 2090 and 2110 are disconnected from the valves 2120 and 2122, respectively.

Further, metal Na is loaded into the conduit 2030 in the Ar gas ambient (step S2001), and the crucible 2010 is set in the inner reaction vessel 2020.

Thereafter, metal Na and metal Ga are loaded into the crucible 2010 while preventing the mutual reaction in an Ar gas ambient (step S2002). More specifically, the metal Na and the metal Ga are loaded into the crucible 2010 in the state that at least the metal Na is solidified. By loading the metal Na and the metal Ga into the crucible 2010 in the state that at least the metal Na is solidified, it becomes possible to load the metal Na and the metal Ga into the crucible 2010 while preventing the reaction forming an intermetallic compound between the metal Ga and the metal Na.

Thereby, the metal Na and the metal Ga are in a molar ratio of 5:5, for example, when the metal Na and the metal Ga are incorporated into the crucible 2010. Further, the Ar gas should be the one having a water content of 10 ppm or less and an oxygen content of 10 ppm or less (this applied throughout the present invention).

Further, the seed crystal 2005 is set in the ambient of the Ar gas at a location above the metal Na and the metal Ga in the crucible 2010. More specifically, the seed crystal 2005 is set above the metal Na and metal Ga in the crucible 2005 by fitting the seed crystal 2005 to the space 2054 formed at the end 2511 of the support unit 2051. Reference should be made to FIG. 50B.

Next, the crucible 2010 and the inner reaction vessel 2020 are filled with the Ar gas, and the inner reaction vessel 2020 accommodating therein the crucible 2101 is set in the outer reaction vessel 2300 in the state that the inner space of the inner reaction vessel 2020 is disconnected from the outside. With this, the crucible 2020 and the inner reaction vessel 20 are set to the crystal growth apparatus 2100 and the gas supply source of the nitrogen gas (gas cylinder 2140) is connected to the inner reaction vessel 2020 by connecting the gas supply lines 2090 and 2110 respectively to the valves 2120 and 2122 (step S2004).

Further, the interior of the gas supply lines 2090 and 2111 and the evacuation line 2390 are evacuated by the vacuum pump 2230 by opening the valves 2401 and 2402 while in the state the valves 2120, 2122, 2400 and 2403 are closed.

After evacuating the interior of the gas supply lines 2090 and 2110 and the evacuation line 2390 to a predetermined pressure (0.133 Pa or lower) by the vacuum pump 2230, the valves 2401 and 2402 are closed and the valves 2123 is opened. Thereby, the gas supply lines 2090 and 2110 and the evacuation line 2390 are filled with the nitrogen gas. In this case, the nitrogen gas is supplied to the gas supply lines 2090 and 2110 and further to the evacuation line 2390 via the pressure regulator 2130 such that the pressure inside the gas supply lines 2090 and 2110 and the evacuation line 2390 has become about 0.1 MPa.

Further, when the indicated pressure of the pressure regulator 2130 has become about 0.1 MPa, the valve 2123 is closed and the valves 2401 and 2402 are opened, and the nitrogen gas filled in the gas supply lines 2090 and 2110 and the evacuation line 2390 is evacuated by the vacuum pump 2230. In this case, too, the interiors of the gas supply lines 2090 and 2110 and the evacuation line 2390 are evacuated to a predetermined pressure (0.133 Pa or less) by using the vacuum pump 2230.

Further, this vacuum evacuation of the gas supply lines 2090 and 2110 and the evacuation line 2390 and filling of the nitrogen to the gas supply lines 2090 and 2110 and the evacuation line 2390 are repeated several times.

Thereafter, the interior of the gas supply line 2090 and 2110 and the interior of the evacuation line 2390 are evacuated to a predetermined pressure by using the vacuum pump 2230, and the valves 2401 and 2402 are closed. Further, the valve 2123 is opened and the nitrogen gas is filled into the gas supply lines 2090 and 2110 and into the evacuation line 2390 such that pressure of the gas supply lines 2090 and 2110 and the evacuation line 2390 is set to about 0.101 PMa by the pressure regulators 2130 and 2170. Thus, the part between the gas supply source (gas cylinder 2140) and the inner reaction vessel 2020 (=gas supply lines 2090 and 2110) is purged in the state that the inner space of the inner reaction vessel 2020 is disconnected from the outside.

Further, I the state the valves 2180, 2401 and 2403 are closed, the valves 2400 and 2402 are opened and the pressure inside the outer reaction vessel 2300 is evacuated by the vacuum pump 2230 to a predetermined pressure (0.133 Pa). Further, when the pressure Pout detected by the pressure sensor 2370 has become 0.133 Pa or lower, the valve 2400 is closed and the valve 2180 is opened. With this, the nitrogen gas is filled into the outer reaction vessel from the gas cylinder via the pressure regulator 2170, In the preset case, the nitrogen gas is supplied to the outer reaction vessel 2300 such that the pressure in the outer reaction vessel 2300 becomes about 0.1 MPa by the pressure regulator 2170.

Further, when the indicated pressure of the pressure regulator 2170 has become about 0.1 MPa, the valve 2180 is closed and the valves 2400 and 2402 are opened, and the nitrogen gas filled in the outer reaction vessel 2300 is evacuated by the vacuum pump 2230. In this case, too, the interior of the outer reaction vessel 2300 is evacuated to a predetermined pressure (0.133 Pa or less) by using the vacuum pump 2230.

Further, this vacuum evacuation of the outer reaction vessel 2300 and filling of the nitrogen to the outer reaction vessel 2300 are repeated several times.

Thereafter, the interior of the outer reaction vessel 2300 is evacuated to a predetermined pressure by the vacuum pump 2230 by closing the valve 2400 and opening the valve 2180, such that the nitrogen gas is filled into the gas supply lines 2150 and 2160 with the pressure of about 0.101 MPa for the interior of the gas supply lines 2150 and 2160 and the outer reaction vessel 2300.

When this is attained, the valves 2120 and 2122 are opened and the nitrogen gas is filled to the inner reaction vessel 2020 and the space inside the outer reaction vessel 2300 with a pressure higher than the atmospheric pressure (such as 0.505 MPa) while holding the pressure difference between the pressure of the inner reaction vessel 220 and the pressure of the outer reaction vessel 2300 to be equal to or smaller than a predetermined value Pstd1 (such as 0.101 MPa=1 atmosphere (withstand pressure of the bellows 2040)) (step S2006). In order to equalize the pressure of the inner reaction vessel 2020 and the pressure of the outer reaction vessel 2300, it is also possible to fill the space between the inner reaction vessel 2020 and the outer reaction vessel 2300 with the nitrogen gas with a pressure higher than the atmospheric pressure (such as 0.505 MPa).

Because metal Na in the conduit 2030 is a solid in this state, there are gaps through which the nitrogen gas can flow, and thus, the nitrogen gas is supplied to the space 2023 inside the inner reaction vessel 2020 also from the space 2031 of the conduit 2030 through the stopper/inlet member 2060.

Thereafter, the growth of the GaN crystal is conducted while maintaining the mixing ratio of the metal Na and the metal Ga in the metal mixture 2410 to generally constant (step S2007).

When the crystal growth of the GaN crystal has been completed, the crucible 2010 and the inner reaction vessel 2020 are lowered from 800° C. to a predetermined temperature (200° C.) along the curve k1 while maintaining the pressure difference between the pressure Prac applied to the stopper/inlet member 2060 from the side of the inner reaction vessel 2020 and the pressure Psur applied to the stopper/inlet member 2060 from the side of the gas supply source (gas cylinder 2140) to be equal to or smaller than a reference value Pstd2 (step S2008). Here, the reference value Pstd2 is set to a pressure difference between the pressures Prac and Psur in which there occurs no leakage of the metal melt 2250 into the space 2031 through the stopper/inlet member 2060. Further, during the interval in which the crucible 2010 and the 2020 are lowered to the predetermined temperature (200° C.), the temperature of the stopper/inlet member is held at the predetermined temperature (200° C.) (step S2009).

Thereafter, when the crucible 2020 and the inner reaction vessel 2020 are lowered to the predetermined temperature (200° C.), the communicating valve (=valve 2121) communicating the space inside the inner reaction vessel 2020 and the space of the outer reaction vessel 2300 is opened (step S2010). With this, the pressure inside the inner reaction vessel 2020 and the pressure inside the outer reaction vessel 2300 are equalized.

Further, the crucible 2010 and the inner reaction vessel 2020 are cooled naturally (step S2011), and the process is completed.

Figure 58:
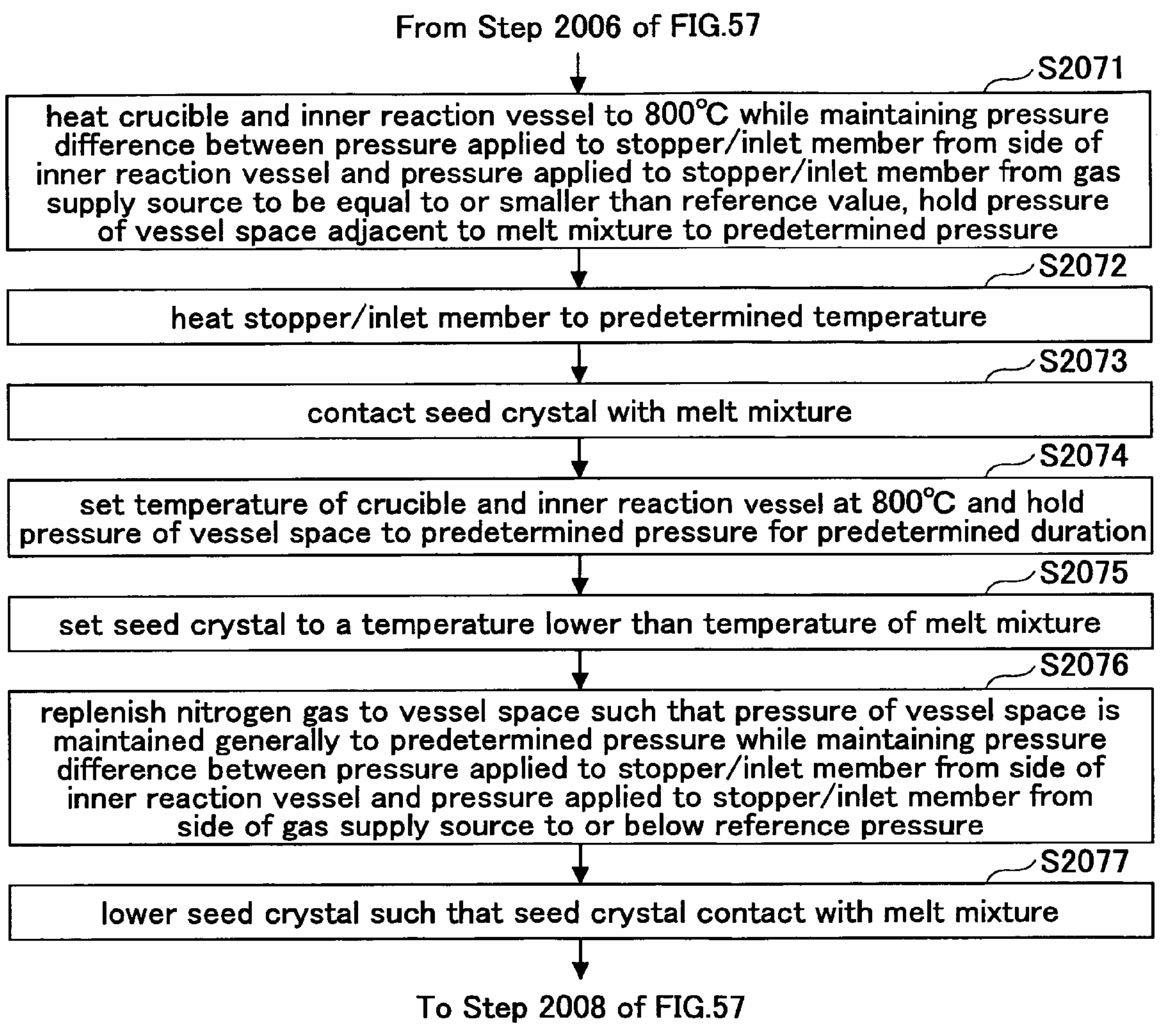
FIG. 58 is a flowchart explaining the detailed operation of the step S2004 in the flowchart shown in FIG. 57.

FIG. 58 is a flowchart explaining the detailed operation of the step S2007 in the flowchart shown in FIG. 57. When the step S2006 shown in FIG. 57 is over, the crucible 2010 and the inner reaction vessel 2020 are heated to 800° C. by the heating units 2070 and 2080 while holding the pressure difference between the pressure Prac applied to the stopper/inlet member 2060 from the side of the inner reaction vessel 2020 and the pressure Psur applied to the stopper/inlet member 2060 from the side of the gas supply source (gas cylinder 140) to be equal to or smaller than the reference value Pstd2, and the pressure of the vessel space (=space 2023) exposed to the melt mixture 2401 is set to a predetermined pressure (such as 1.01 MPa) (step S2071).

Further, the stopper/inlet member 2060 is heated to a predetermined temperature (200° C.) by the heating unit 2220 (step S2072). With this, the vapor pressure of the metal Na evaporated from the metal melt 2250 coincides generally with the vapor pressure of the metal Na evaporated from the melt mixture 2410, and the mixing ratio of the metal Na and metal Ga is maintained generally constant in the melt mixture 2410.

In this process of heating the stopper/inlet member 2060 to 200° C., the metal melt Na held inside the conduit 2030 undergoes melting in view of the melting temperature of metal Na of about 98° C., and the metal melt 2250 is formed. Thereby, two vapor-liquid interfaces 2001 and 2 are formed. Reference should be made to FIG. 47. The vapor-liquid interface 2001 is located at the interface between the metal melt 2250 and the space 2023 in the inner reaction vessel 2020, while the vapor-liquid interface 2002 is located at the interface between the metal melt 2250 and the stopper/inlet plug 2060.

Further, the vapor pressure of the metal melt 2250 (=metal Na melt) at the vapor-liquid interface 2002 at the moment the stopper/inlet member 2060 is heated to 200° C. is $1.8\times10^{-2}$ Pa, and thus, there occurs little evaporation of the metal melt 2250 (=metal Na melt) through the gaps 2063 of the stopper/inlet member 2060. As a result, there occurs little decrease of the metal melt 2250 (=metal Na melt).

Further, during the step in which the crucible 2010 and the inner reaction vessel 2020 are heated to 800° C., the metal Na and the metal Ga inside the crucible 2010 becomes a liquid, and the melt mixture 2410 of metal Na and metal Ga is formed in the crucible 2010. Next, the up/down mechanism 2280 causes the seed crystal 2005 to make a contact with the melt mixture 2410 (step S2073).

Further, when the temperature of the crucible 2010 and the inner reaction vessel 2020 is elevated to 800° C., the nitrogen gas in the space 2023 is incorporated into the melt mixture 2410 via the metal Na in the melt mixture 2410, and there starts the growth of GaN crystal from the seed crystal 2005.

Thereafter, the crucible 2010 and the inner reaction vessel 2020 are held at the temperature of 800° C. for a predetermined direction (several ten hours to several hundred hours) and the pressure of the vessel space (=space 2023) is maintained to a predetermined pressure (=1.01 MPa) (step S2074).

Further, with the method noted above, the temperature T3 of the seed crystal 2005 is set to a temperature Ts1 or Ts2 lower than the temperature (=800° C.) of the melt mixture 2410 (step S2075).

Further, with progress of the crystal growth of the GaN crystal, there occurs consumption of the nitrogen gas in the space 2023, while this leads to decrease of the nitrogen gas in the space 2023. Then the pressure P1 of the space 2023 becomes lower than the pressure P2 of the space 2031 inside the conduit 2030 (P1<P2), and there is formed a differential pressure between the space 2023 and the space 2031. Thus, the nitrogen gas in the space 2031 is supplied to the space 2023 consecutively via the stopper/inlet member 2060 and the metal melt 2250 (=metal Na melt). Thus, the nitrogen gas is replenished to he vessel space (=space 2023) such that the pressure inside the vessel space (=2003) is held generally at the predetermined pressure (1.01 MPa) while maintaining the pressure difference between the pressure Prac applied to the stopper/inlet member 2060 from the side of the inner reaction vessel 2020 and the pressure Psur applied to the stopper/inlet member 2060 from the side of the gas supply source (gas cylinder 2140) to be equal to or smaller than the reference value Pstd2 (step S2076).

Further, with progress of crystal growth of the GaN crystal, there occurs a decrease of the metal Ga in the melt mixture 2410, while this causes lowering of the vapor-liquid interface 2003 between the space 2023 and the melt mixture 2410. Thus, the seed crystal 2005 is lowered so as to make a contact with the melt mixture 2410 according to the method explained above (step S2077). Thereafter, the process proceeds to the step S2008 shown in FIG. 57.

As explained above, the manufacturing method of GaN crystal according to Embodiment 7 of the present invention fills a nitrogen gas to the space between the inner reaction vessel 2020 and the outer reaction vessel 2300 up to the pressure higher than the atmospheric pressure while maintaining the pressure difference between the pressure of the inner reaction vessel 2020 and the outer reaction vessel 2300 to be equal to or lower than the reference value Pstd1 (see step S2006).

Further, the crucible 2010 and the inner reaction vessel 2020 are heated to 800° C. by the heating units 2070 and 2080 while holding the pressure difference between the pressure Prac applied to the stopper/inlet member 2060 from the side of the inner reaction vessel 2020 and the pressure Psur applied to the stopper/inlet member 2060 from the side of the gas supply source (gas cylinder 2140) to be equal to or smaller than the reference value Pstd2, and the pressure of the vessel space (=space 2023) exposed to the melt mixture 2401 is set to a predetermined pressure (such as 1.01 MPa) (step S2071).

Further, the reference pressure Pstd1 is set to be any of the withstand pressure of the inner reaction vessel 2020 and the withstand pressure of the bellows 2020, whichever is the lowest, and the reference value Pstd2 is set to a pressure in which there occurs no leakage of the metal melt 2250 to the space 2031 through the gap 2063 between the stopper/inlet member 2060 and the conduit 2030.

Thus, in the interval in which the crucible 2010 and the inner reaction vessel 2020 are heated to 800° C. and the pressure inside the space 2023 is held to a predetermined pressure (=1.01 MPa), in other words, in the interval in which the crystal growth of the GaN crystal is in progress, there occurs no outflow of the nitrogen gas and metal Na vapor from the space 2023 to the space 2031 and the outer reaction vessel 2300 or inflow of gas from the space inside the outer reaction vessel 2300 to the space 2023, and the state of the inner reaction vessel 2020 is held in a stabilized state. As a result, it becomes possible to manufacture a GaN crystal stably.

Further, with the manufacturing method of the GaN crystal according to Embodiment 7, the stopper/inlet member 2060 is heated to a predetermined temperature (200° C.) when the crucible 2010 and the inner reaction vessel 2020 are heated to 800° C., and the mixing ratio of the metal Na and the metal Ga is maintained generally constant in the melt mixture 2410. Thus, it becomes possible to manufacture the GaN crystal stably.

Further, with the crystal growth method of Embodiment 7, the GaN crystal is grown in the state that the seed crystal 2005 is contacted to the melt mixture 2410. Thus, nucleation in the region other than the seed crystal 2005 is suppressed, and the growth of the GaN crystal occurs preferentially from the seed crystal 1005. As a result, it becomes possible to grow a GaN crystal of large size. This GaN crystal is a defect-free crystal having a columnar shape grown in the c-axis direction (<0001> direction).

Further, with the manufacturing method of the GaN crystal of Embodiment 7, the growth of the GaN crystal is made while setting the temperature T3 of the seed crystal 2005 to be lower than the crystal growth temperature (=800° C.). Thus, it becomes possible to increase the degree of supersaturation of nitrogen or the group III nitride in the melt mixture in the vicinity of the seed crystal 2005, and the GaN crystal is grown preferentially from the seed crystal 2005. Further, it becomes possible to increase to the growth rate of the GaN crystal.

Further, because the seed crystal 2005 is lowered by the up/down mechanism 2280 with growth of the GaN crystal such that contact of the seed crystal 2005 to the melt mixture 2410 is maintained, it becomes possible to maintain the state in which the growth of the GaN crystal occurs preferentially from the seed crystal 2005. As a result, it becomes possible to grow a GaN crystal of large size.

In the flowchart shown FIG. 58, explanation was made such that the seed crystal is contacted with the melt mixture 190 of the metal Na and the metal Ga when the crucible 2010 and the inner reaction vessel 2020 are heated to 800° C. (see steps S2071 and S2073), while the present embodiment is not limited to such an embodiment and it is also possible to hold the seed crystal 2005 inside the melt mixture 2410 containing the metal Na and the metal Ga in the step S2073 when the crucible 2010 and the reaction vessel 2020 are heated to 800° C. (see step S2071). Thus, when the crucible 2010 and the inner reaction vessel 2020 are heated to 800° C., it is possible to carry out the crystal growth of the GaN crystal from the seed crystal 2005 by dipping the seed crystal 2005 into the melt mixture 2410.

It should be noted that the operation for making the seed crystal 2005 to contact with the melt mixture 2410 comprises the step A for applying a vibration to the support unit 2050 by the vibration application unit 2290 and detecting the vibration detection signal BDS indicative of the vibration of the support unit 2050; and the step B of moving the support unit 2050 by the up/down mechanism 2280 such that the vibration detection signal changes to the state (component SS2 of the vibration detection signal BDS) corresponding to the situation where the seed crystal 5 has made contact with the melt mixture 2410.

Further, it should be noted that the operation for holding the seed crystal 1005 in the melt mixture 2410 comprises the step A for applying a vibration to the support unit 2050 by the vibration application unit 2290 and detecting the vibration detection signal BDS indicative of the vibration of the support unit 2050; and the step B of moving the support unit 2050 by the up/down mechanism 2280 such that the vibration detection signal changes to the state (component SS3 of the vibration detection signal BDS) corresponding to the situation where the seed crystal 2005 been dipped into the melt mixture 2410.

In the steps B and C, it should be noted. that the support unit 2050 is moved by the up/down mechanism 2280 because there is caused variation of location for the melt surface (=interface 2010) for the melt mixture 2410 formed in the crucible 2010 depending on the volume of the crucible 2010 and the total amount of the metal Na and the metal Ga loaded into the crucible 2003, as in the case of the seed crystal 2010 being dipped into the melt mixture 2410 at the moment when the melt mixture 2410 is formed in the crucible 2005 or the seed crystal 2005 being held in the space 2023, and thus there is a need of moving the seed crystal up or down in the gravitational direction DR1 in order that the seed crystal 2005 makes a contact with the melt mixture 2410 or the seed crystal 2005 is dipped into the melt mixture 2410.

Further, while explanation has been made with the step S2077 of the flowchart shown in FIG. 58 that the seed crystal 2005 is lowered such that the seed crystal 2005 makes a contact with the melt mixture 2410, it should be noted that the step S2077 of the present invention shown in the flowchart shown in FIG. 58 generally comprises a step D shown in FIG. 13, wherein the step D moves the support unit 2050 by the up/down mechanism 2280 such that the GAN crystal grown from the seed crystal 2005 makes a contact with the melt mixture 2410 during the growth of the GaN crystal.

It should be noted that, while there occurs lowering of the liquid surface (=interface 2003) of the melt mixture 2410 because of consumption of Ga in the melt mixture 2410 with progress of growth of the GaN crystal, there may be a case in which it is necessary to move the GaN crystal grown from seed crystal 2005 in the upward direction or it is necessary to move the GaN crystal grown from the seed crystal 2005 in the downward direction with progress of growth of the GaN crystal, depending on the relationship between the rate of lowering the liquid surface (=interface 2003) and the growth rate of the GaN crystal.

Thus, in the case the rate of lowering of the liquid surface (=interface 2003) is faster than the growth rate of the GaN crystal, the GaN crystal grown from the seed crystal 2005 is moved downward for maintaining the contact of the GaN crystal with the liquid surface (=interface 2003) of the melt mixture 2410. On the other hand, in the case the rate of lowering of the liquid surface (=interface 2003) is slower than the growth rate of the GaN crystal, the GaN crystal grown from the seed crystal 2005 is moved upward for maintaining the contact of the GaN crystal with the liquid surface (=interface 2003) of the melt mixture 2410.

Thus, in view of the need of moving the GaN crystal grown from the seed crystal 2005 up or down in the gravitational direction DR1 depending on the relationship between the lowering rate of the liquid surface (=interface 2003), the step D is defined as "moving the support unit 2050 by the up/down mechanism 2280".

Further, it should be noted that the operation for making the GaN crystal grown from the seed crystal 2005 to contact with the melt mixture 2410 comprises the step A and the step B noted above.

Further, while explanation has been made in the foregoing to apply vibration to the support unit 2050 and carry out control such that the seed crystal 2005 or the GaN crystal grown from the seed crystal 2005 makes a contact with the melt mixture 2410 while detecting the vibration of the support unit 2050, it is also possible to emit a sound to the vapor-liquid interface 2003 and detect the location of the vapor-liquid interface 2003 by measuring the time for the sound to go and back to and from the vapor-liquid interface 2003.

Further, it is possible to insert a thermocouple into the crucible 2010 from the inner reaction vessel 2020 and detect the location of the vapor-liquid interface 2003 from the length of the thermocouple inserted into the inner reaction vessel 2020 at the moment when the detected temperature has been changed.

Further, while it has been explained that the reference value Pstd2 is set to the pressure difference between the pressure Prac for the case where there occurs no outflow of the metal melt 2250 to the space 2031 via the stopper/inlet member 2060 and the pressure Psur, the reference value Pstd2 is generally set with the present invention to any of the smaller of the pressure difference between the pressure Prac for the case there occurs no outflow of the metal melt 2250 to the space 2031 via the stopper/inlet member 2060 and the pressure Psur, and the withstand pressure of the bellows 2040.

Embodiment 8

Figure 59:
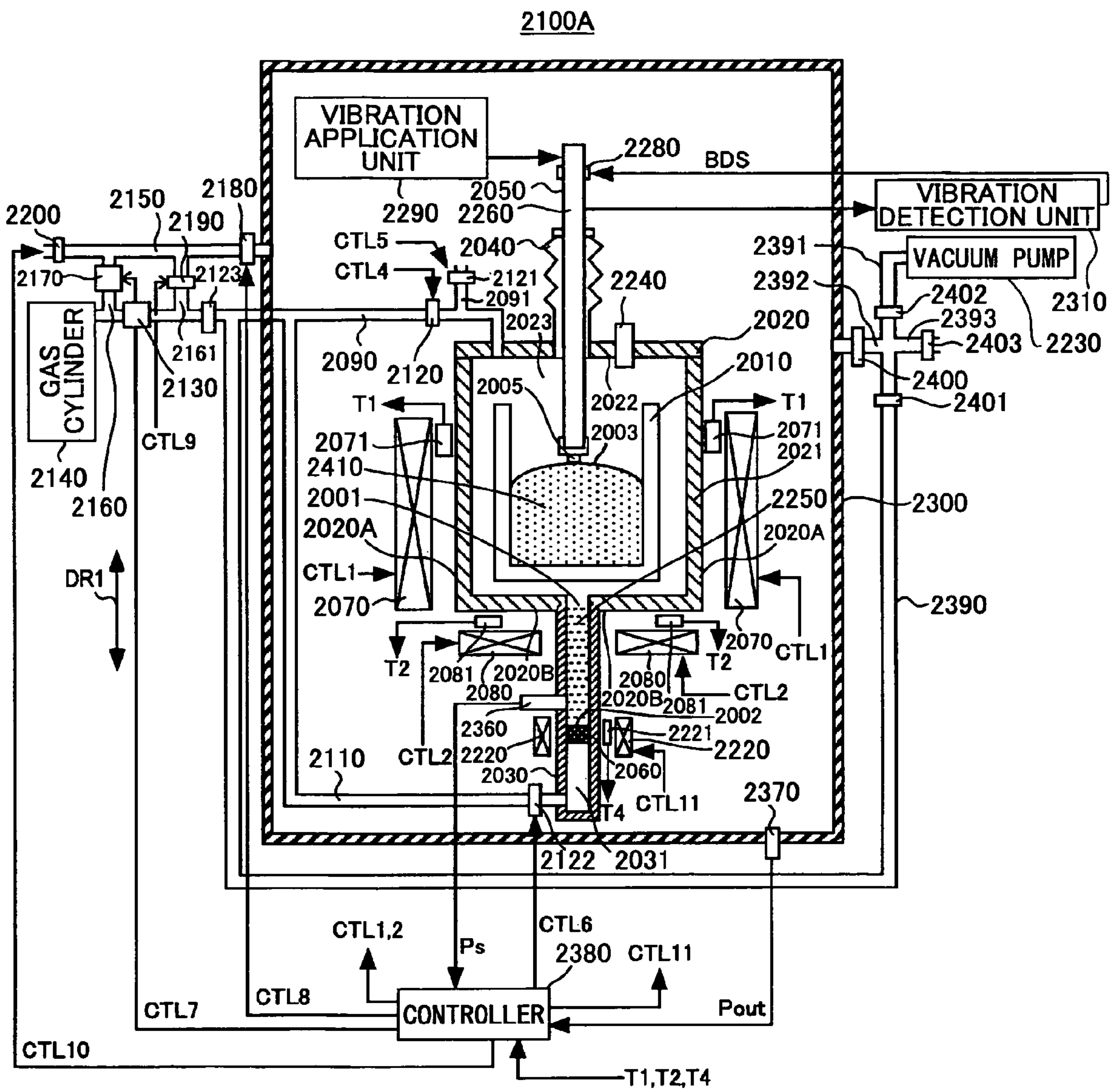
FIG. 59 is a schematic cross-sectional diagram showing the construction of a crystal growth apparatus according to Embodiment 8 of the present invention.

FIG. 59 is a schematic cross-sectional diagram showing the construction of a crystal growth apparatus according to Embodiment 8 of the present invention.

Referring to FIG. 59, the crystal growth apparatus 1100A of Embodiment 8 has a construction generally identical with the construction of the crystal growth apparatus 2100 shown in FIG. 47, except that a gas supply line 2260, the thermocouple 2270, the gas supply line 2320, the flow meter 2330, the gas cylinder 2340 and the temperature control unit 2350 are removed. Thus, the crystal growth apparatus 2100A is the one in which the function of cooling the seed crystal 2005 is removed from the crystal growth apparatus 2100.

Thus, with the crystal growth apparatus 2100A, crystal growth of the GaN crystal is achieved by setting the temperature of the seed crystal 2005 to a temperature equal to the temperature of the melt mixture 2410.

The crystal growth of the GaN crystal with the crystal growth apparatus 2100A is conducted according to the flowchart shown in FIG. 57. Thereby, it should be noted that the detailed operation of the step S2007 is conducted according to a flowchart different from the flowchart shown in FIG. 58.

Figure 60:
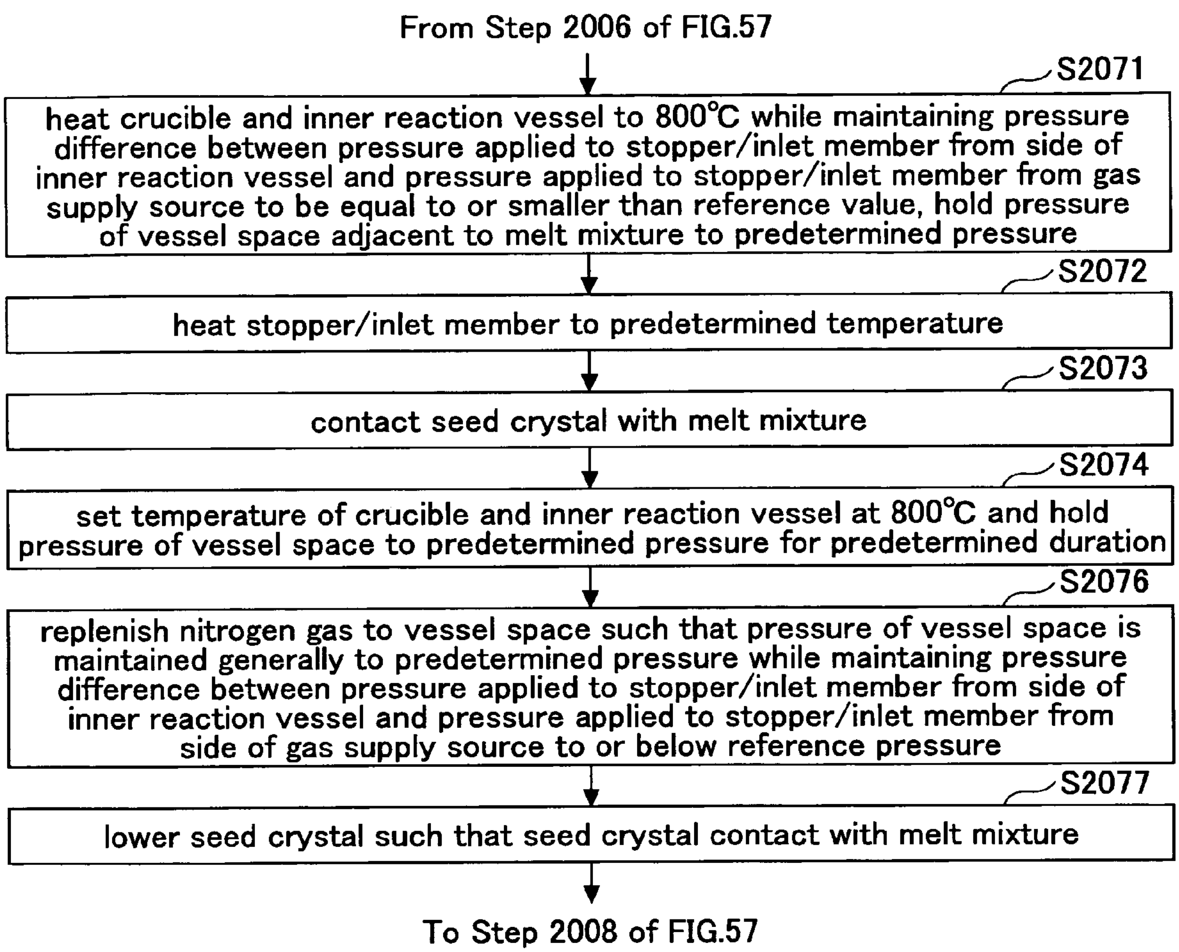
FIG. 60 is a flowchart explaining the detailed operation of the step S2007 in the flowchart shown in FIG. 57 according to Embodiment 8 of the present invention.

FIG. 60 is a flowchart explaining the detailed operation of the step S2007 in the flowchart shown in FIG. 57 according to Embodiment 8 of the present invention. It should be noted that the flowchart of FIG. 60 is equal to the flowchart shown in FIG. 58 except that the step S2075 of the flowchart shown in FIG. 58 is removed.

Thus, with the present embodiment, the growth of the GaN crystal is carried out by setting the temperature of the seed crystal 2005 to be generally equal to the temperature of the melt mixture 2410.

Thus, with Embodiment 8, the crystal growth of the GaN crystal is conducted by setting the temperature of the seed crystal 2005 to be generally equal to the temperature of the melt mixture 2410. Even in such a case, it should be noted that the growth of the GaN crystal can be achieved stably in view of the fact that the steps S2006, S2071 and S2072 are carried out.

Otherwise, the present embodiment is identical to Embodiment 7.

Embodiment 9

Figure 61:
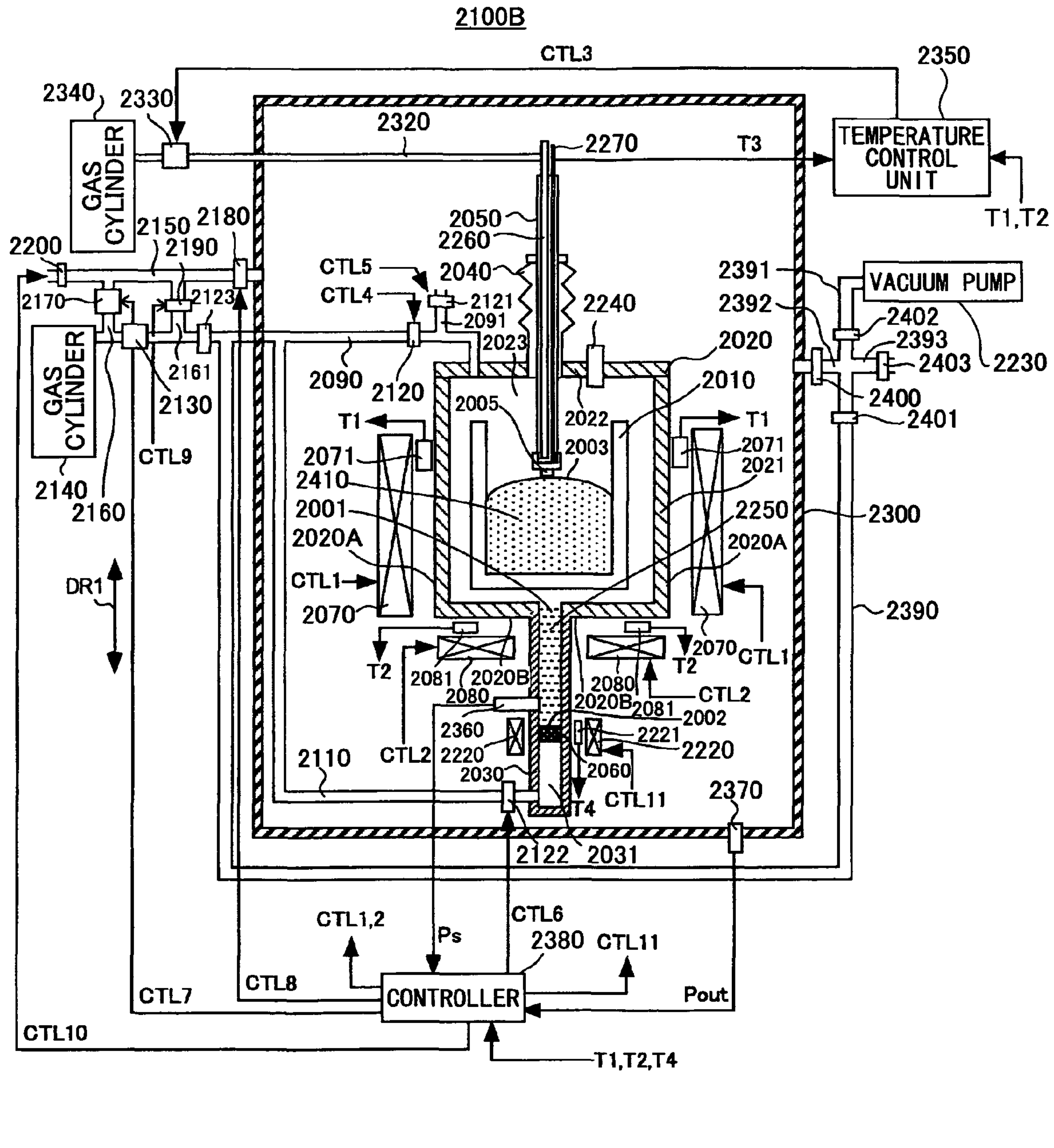
FIG. 61 is a schematic cross-sectional diagram showing the construction of a crystal growth apparatus according to Embodiment 9 of the present invention.

FIG. 61 is a schematic cross-sectional diagram showing the construction of a crystal growth apparatus according to Embodiment 9 of the present invention.

Referring to FIG. 61, the crystal growth apparatus 1100C has a construction generally identical with the construction of the crystal growth apparatus 2100 shown in FIG. 47, except that the up/down mechanism 2280, the vibration application unit 2290 and the vibration detection unit 2310 of the crystal growth apparatus 2100 shown in FIG. 47 are removed. Thus, the crystal growth apparatus 2100B is the one in which the function of moving the support unit 2050 up or down is removed from the crystal growth apparatus 2100.

Thus, with the crystal growth apparatus 2100B, the growth of the GaN crystal is conducted while holding the seed crystal at a fixed location.

The crystal growth of the GaN crystal with the crystal growth apparatus 2100B is conducted according to the flowchart shown in FIG. 57. Thereby, it should be noted that the detailed operation of the step S2007 is conducted according to a flowchart different from the flowchart shown in FIG. 58.

Figure 62:
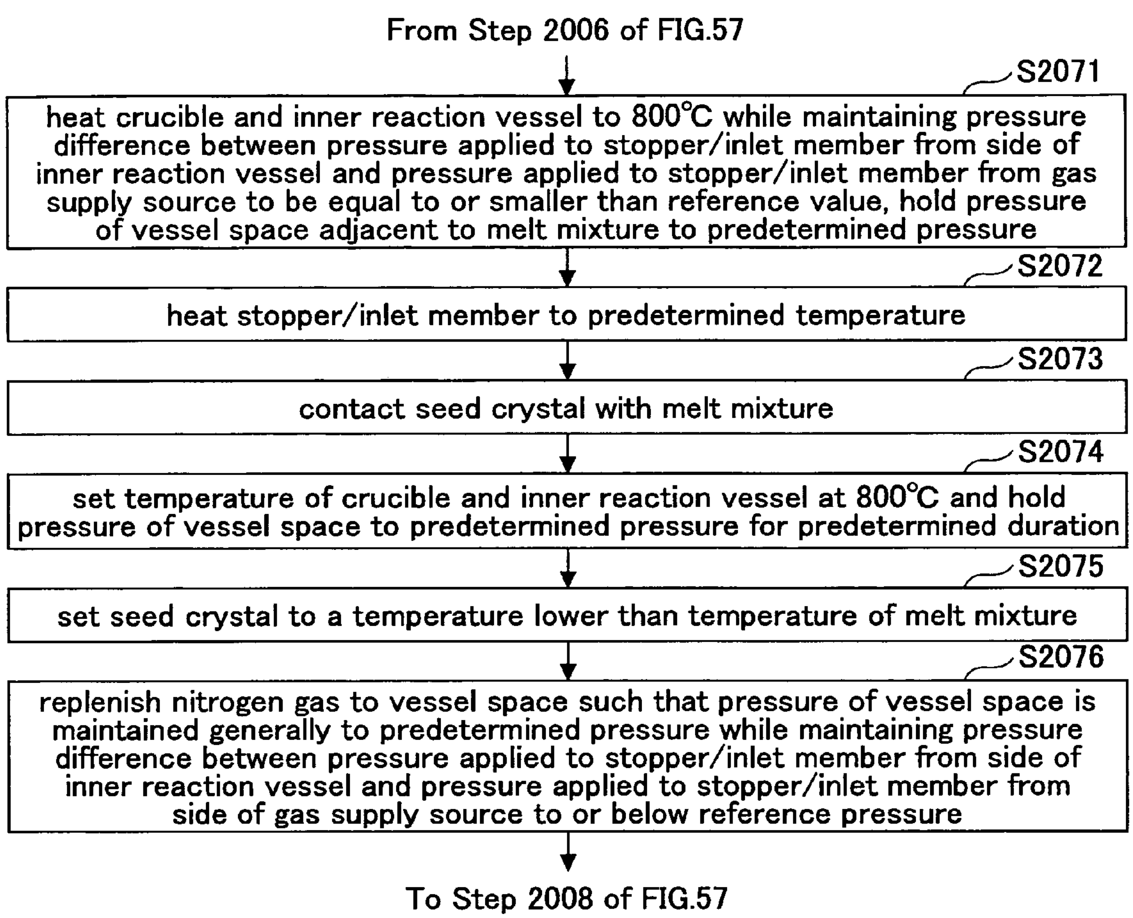
FIG. 62 is a flowchart explaining the detailed operation of the step S2007 in the flowchart shown in FIG. 57.

FIG. 62 is a flowchart explaining the detailed operation of the step S2007 in the flowchart shown in FIG. 57 according to Embodiment 9 of the present invention. It should be noted that the flowchart of FIG. 62 is identical to the flowchart shown in FIG. 58 except that the step S2077 of the flowchart shown in FIG. 58 is removed.

Thus, growth of the GaN crystal is conducted while holding the seed crystal 2005 at a fixed location. With the growth of the GaN crystal from the seed crystal 2005, it should be noted that there is caused consumption of the metal Ga in the melt mixture 2410, leading to lowering of the location of the interface 2003, while dipping of the GaN crystal grown from the seed crystal 2005 into the melt mixture 2410 causes a rising of the interface 2003. Thus, it is possible to carry out the crystal growth of the GaN crystal from the seed crystal 2005 continuously even in the case the seed crystal 2005 is held at the fixed location.

Thus, with Embodiment 9, the crystal growth of the GaN crystal is conducted by holding the seed crystal 2005 at the first location. Even in such a case, it should be noted that the growth of the GaN crystal can be achieved stably in view of the fact that the steps S2006, S2071 and S2072 are carried out.

Otherwise, the present embodiment is identical to Embodiment 7.

Embodiment 10

Figure 63:
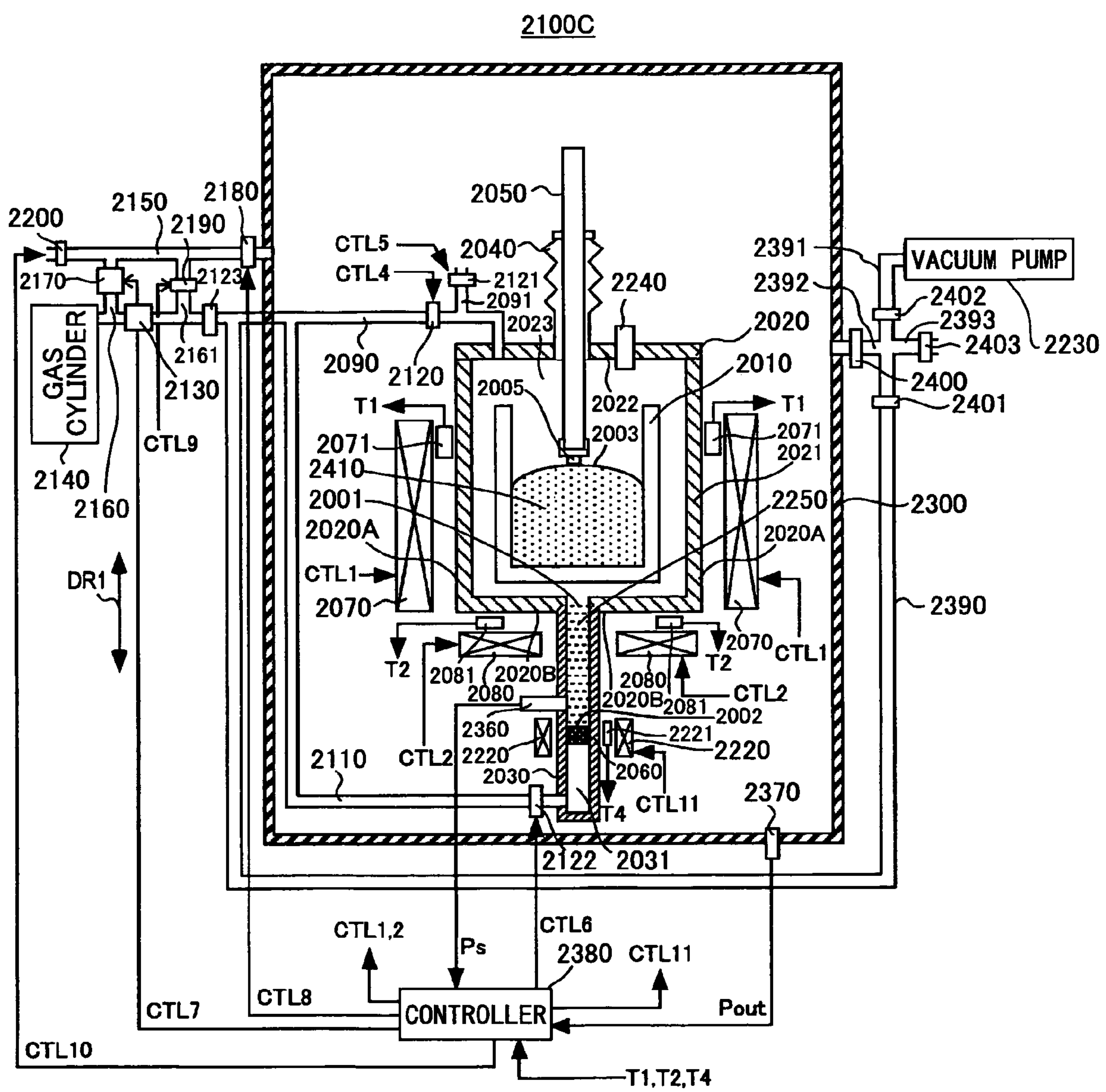
FIG. 63 is a schematic cross-sectional diagram showing the construction of a crystal growth apparatus according to Embodiment 10 of the present invention.

FIG. 63 is a schematic cross-sectional diagram showing the construction of a crystal growth apparatus according to Embodiment 10 of the present invention.

Referring to FIG. 63, the crystal growth apparatus 2100C of Embodiment 10 has a construction generally identical with the construction of the crystal growth apparatus 2100 shown in FIG. 47, except that the conduit 2260, the thermocouple 2270, the up/down mechanism 2280, the vibration application unit 2290, the vibration detection unit 2310, the gas supply line 2320, the flow meter 2330, the gas cylinder 2340 and the temperature control unit 2350 are removed.

Thus, the crystal growth apparatus 2100C corresponds to the one in which the function of moving the seed crystal 2005 up or down and the function of lowering the temperature of the seed crystal 2005 below the temperature of the melt mixture 2410 are removed from the crystal growth apparatus 2100.

Thus, with the crystal growth apparatus 2100C, the crystal growth of the GaN crystal is achieved from the seed crystal 2005 by using the temperature and the nitrogen gas pressure falling in the region REG2 of FIG. 56, by holding the seed crystal 2005 at the interface 2003 between the space 2023 and the melt mixture 2410 by the support unit 2050.

Figure 64:
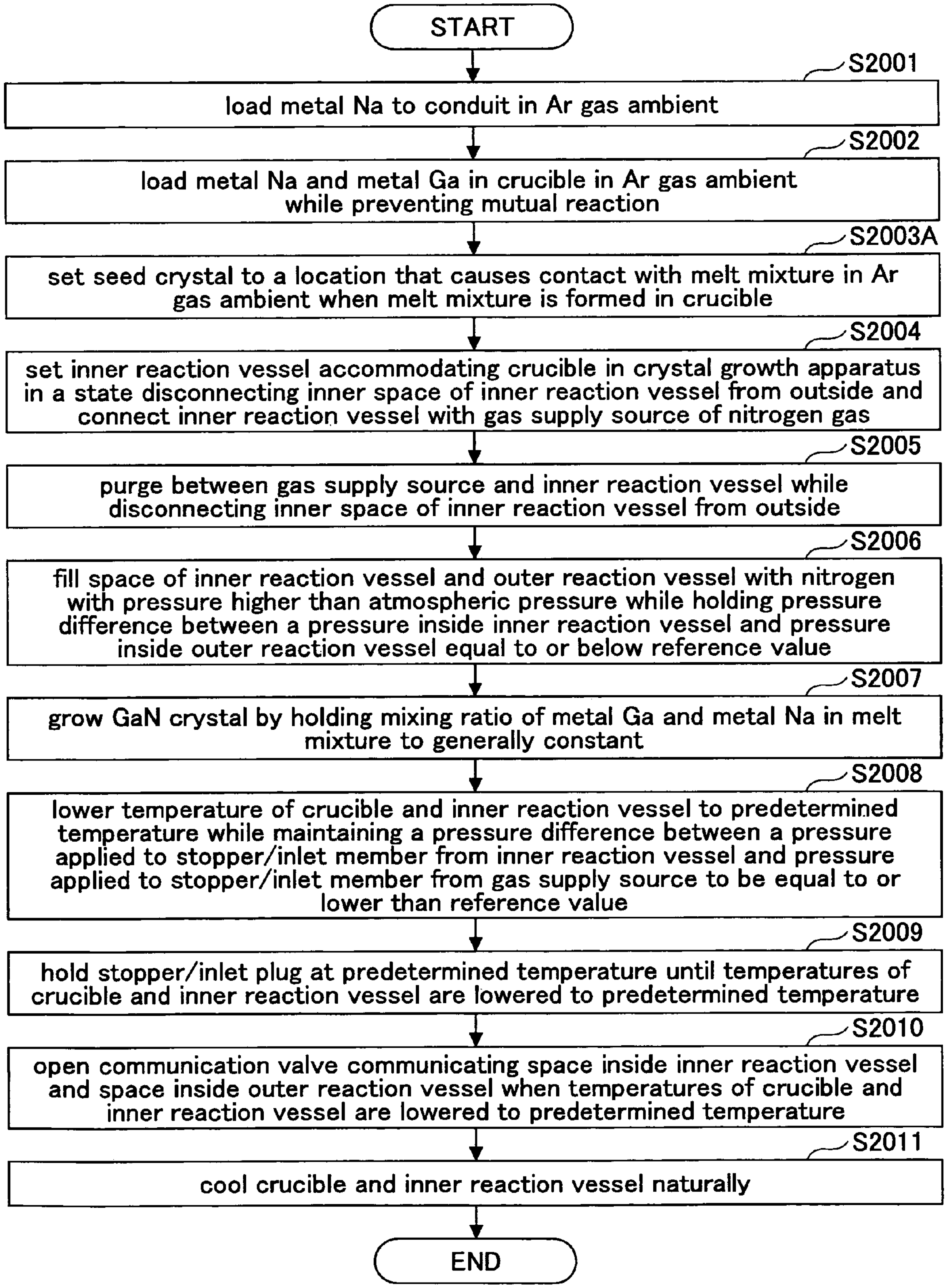
FIG. 64 is a flowchart explaining the manufacturing method of a GaN crystal according to Embodiment 10 of the present invention.

FIG. 64 is a flowchart explaining the manufacturing method of a GaN crystal according to Embodiment 10 of the present invention. It should be noted that the flowchart of FIG. 64 is identical to the flowchart shown in FIG. 57 except that the step S2003 of the flowchart shown in FIG. 57 is replaced with a step S2003A. Thereby, it should be noted that the detailed operation of the step S2007 shown in FIG. 64 is conducted according to a flowchart different from the flowchart shown in FIG. 58.

Thus, when the steps S2001 and S2002 are conducted consecutively, the seed crystal 2005 is set to a location where the seed crystal 2005 would make a contact with the melt mixture 2410 in the event the melt mixture 2410 is formed in the crucible 2010, in an Ar gas ambient (step S2003A).

Because the location of the interface 2003 is determined by the total amount of the metal Na and metal Ga, it is possible to locate the seed crystal 2005 to the location of the interface 2003 corresponding to the total amount of the metal Na and the metal Ga loaded into the crucible 1020 in the step 2020, when the location of the interface 2003 corresponding to the total amount of the metal Na and the metal Ga are measured in advance.

After the step S2003A, the steps S2004-S2011 noted above are conducted consecutively, and the manufacturing process of the GaN crystal is completed.

Figure 65:
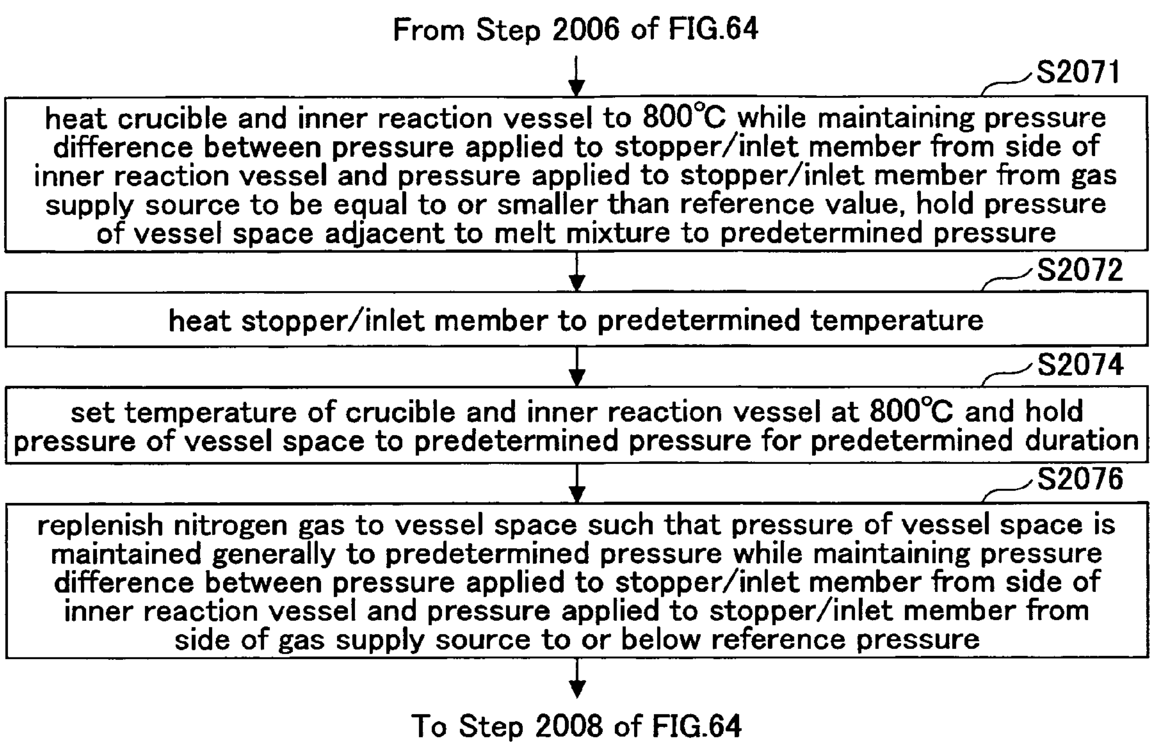
FIG. 65 is a flowchart explaining the detailed operation of the step S2007 in the flowchart shown in FIG. 64.

FIG. 65 is a flowchart explaining the detailed operation of the step S2007 in the flowchart shown in FIG. 64. It should be noted that the flowchart of FIG. 65 is identical to the flowchart shown in FIG. 58 except that the steps S2073, S2075 and S2077 of the flowchart shown in FIG. 58 are removed.

Referring to FIG. 65, the steps S2074 and S2076 are conducted after the steps S2071 and S2072 are conducted, and the crystal growth of the GaN crystal is achieved from the seed crystal 2005 by setting the seed crystal 2005 to the fixed location and by setting the temperature of the seed crystal 2005 to be equal to the temperature of the melt mixture 2410.

As explained before, the growth of the GaN crystal is conducted with Embodiment 4 under the condition in which the growth of the GaN crystal takes place from the seed crystal 2005 by setting the seed crystal 2005 at the fixed location and by setting the temperature of the seed crystal 2005 to be the temperature identical to the temperature of the melt mixture 2410. Thereby, the steps S2006, S2071 and S2072 are conducted similarly to Example 7 and it is possible to manufacture the GaN crystal stably.

Otherwise, the present embodiment is identical to Embodiment 7.

Embodiment 11

Figure 66:
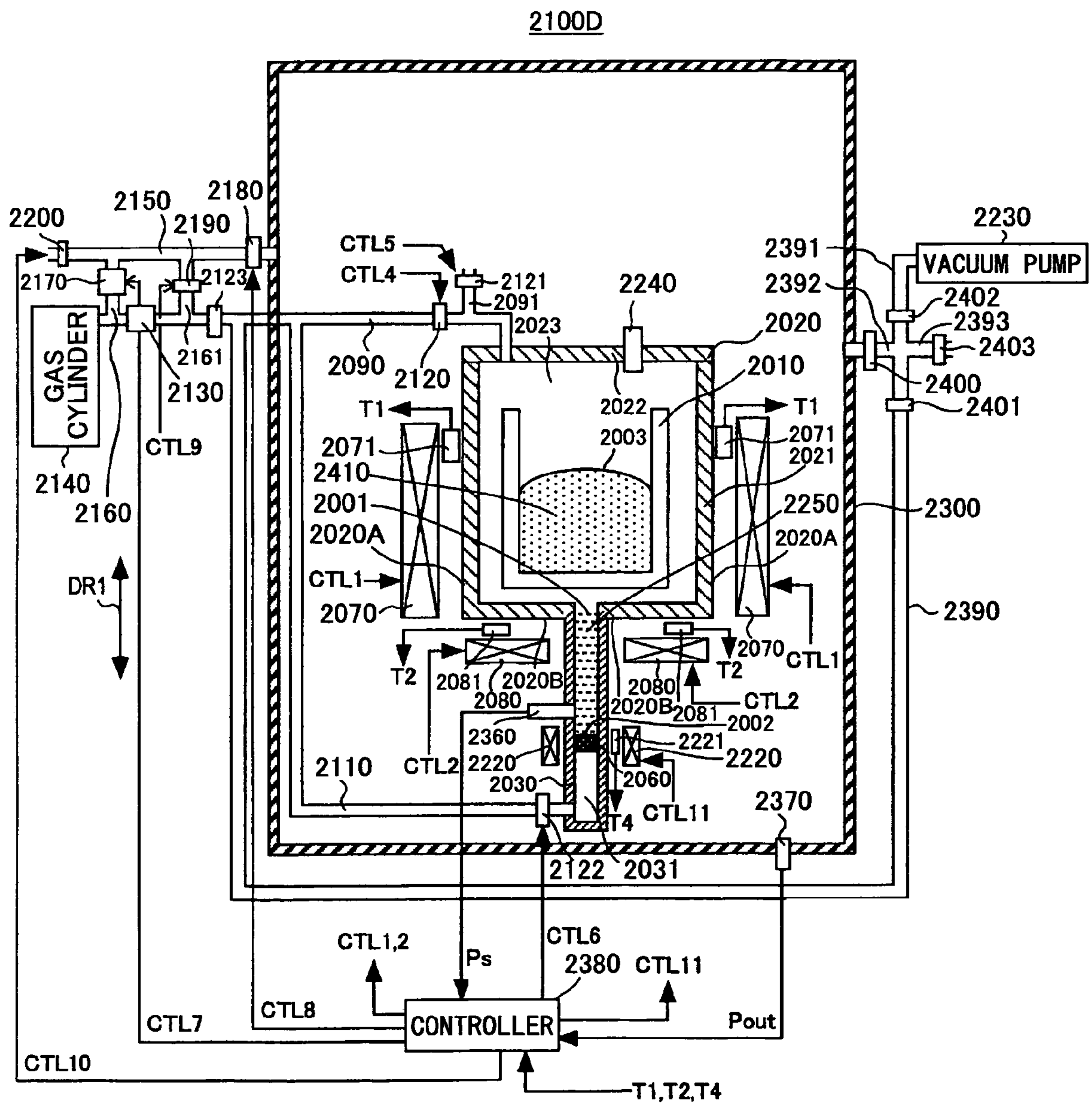
FIG. 66 is a schematic cross-sectional diagram showing the construction of a crystal growth apparatus according to Embodiment 11 of the present invention.

FIG. 66 is a schematic cross-sectional diagram showing the construction of a crystal growth apparatus according to Embodiment 11 of the present invention.

Referring to FIG. 66, the crystal growth apparatus 2100D of Embodiment 11 has a construction generally identical with the construction of the crystal growth apparatus 2100 shown in FIG. 47, except that the bellows 2040, the support unit 2050, the conduit 2260, the thermocouple 2270, the up/down mechanism 2280, the vibration application unit 2290, the vibration detection unit 2310, the gas supply line 2320, the flow meter 2330, the gas cylinder 2340 and the temperature control unit 2350 are removed.

Thus, the crystal growth apparatus 2100D is a crystal growth apparatus that conducts crystal growth of a GaN crystal without using a seed crystal 2005.

Thus, with the crystal growth apparatus 2100D, growth of the GaN crystal takes place on the inner wall surface and bottom surface of the crucible 2010. Thus, with the crystal growth apparatus 2100D, GaN crystals of a columnar shape or plate-like shape are grown by using the temperature and the nitrogen gas pressure in the region REG3 or REG4 shown in FIG. 56.

Figure 67:
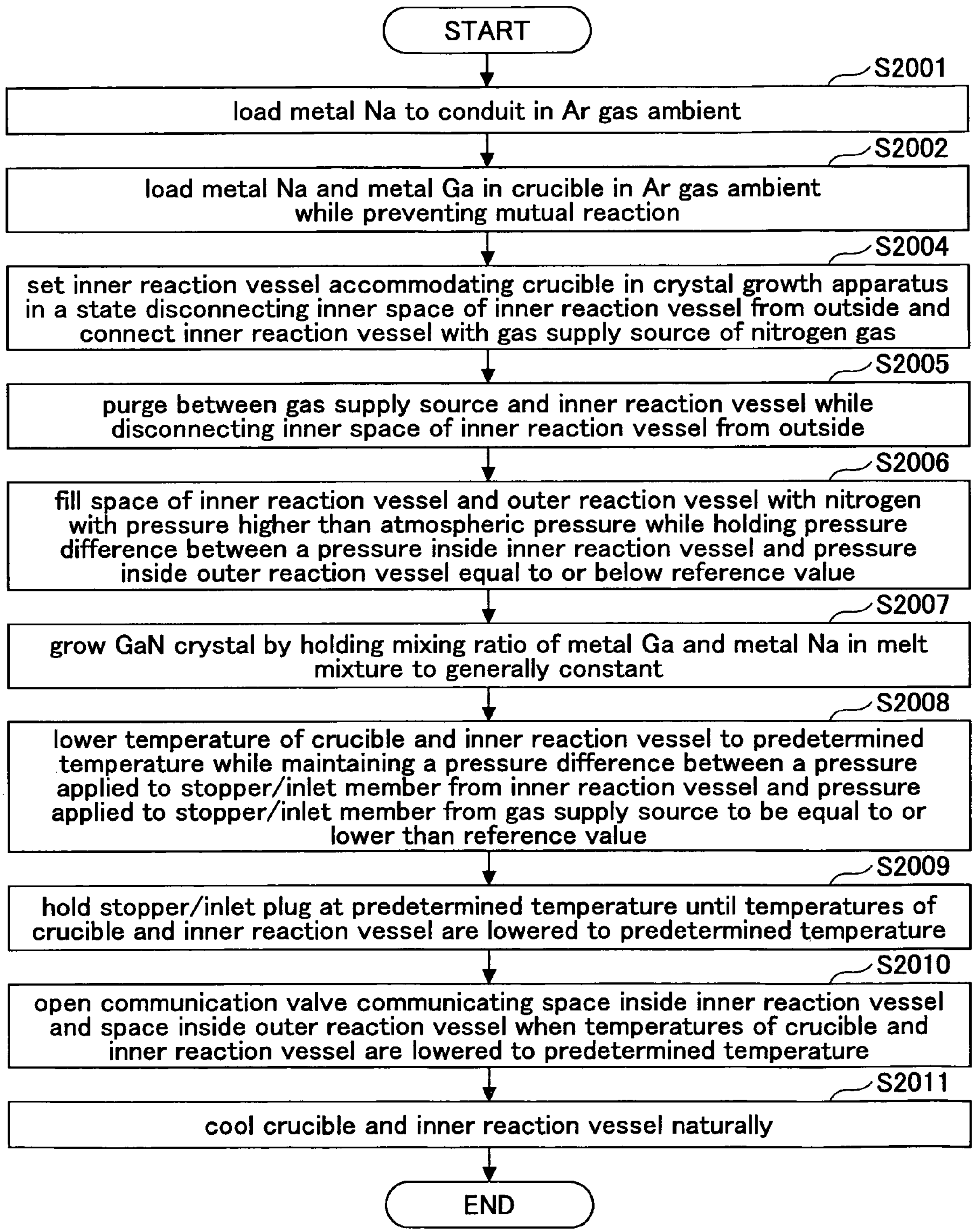
FIG. 67 is a flowchart explaining the manufacturing method of a GaN crystal according to Embodiment 11 of the present invention.

FIG. 67 is a flowchart explaining the manufacturing method of a GaN crystal according to Embodiment 11 of the present invention. It should be noted that the flowchart of FIG. 67 is identical to the flowchart shown in FIG. 57 except that the step S20003 of the flowchart shown in FIG. 57 is removed. Thereby, it should be noted that the detailed operation of the step S2007 shown in FIG. 67 is conducted according to a flowchart identical with the flowchart shown in FIG. 65.

After the steps S2001 and S2002 are conducted consecutively, the steps S2004-S2011 explained above are conducted consecutively, and with this, the process of manufacturing the GaN crystal is completed.

In the case the flowchart shown in FIG. 65 is conducted with Embodiment 11, the pressure of the vessel space (=space 2023) is set to 2.02 MPa (step S2071), for example, and the pressure thus set is maintained for a predetermined duration (step S2074). Thus, there is caused the growth of the GaN crystal by using the temperature and the nitrogen gas pressure in the region REG3 shown in FIG. 56. With this, a GaN crystal of columnar shape is formed.

In the case the flowchart shown in FIG. 65 is conducted with Embodiment 11, the pressure of the vessel space (=space 2023) is set to 5.02 MPa (step S2071), for example, the temperature inside the crucible 2010 and the inner reaction vessel 2020 are set to 750° C., and the pressure and the temperature thus set are maintained for a predetermined duration (step S2074). Thus, there is caused the growth of the GaN crystal by using the temperature and the nitrogen gas pressure in the region REG4 shown in FIG. 56. With this, a GaN crystal of plate-like shape is formed.

Thus, with Embodiment 11, the crystal growth of the GaN crystal is conducted under the condition in which the crystal growth of the GaN crystal takes place on the inner wall surface and bottom surface of the crucible 2010. Even in such a case, it should be noted that the growth of the GaN crystal can be achieved stably in view of the fact that the steps S2006, S2071 and S2072 are carried out.

Otherwise, the present embodiment is identical to Embodiment 7.

Embodiment 12

Figure 68:
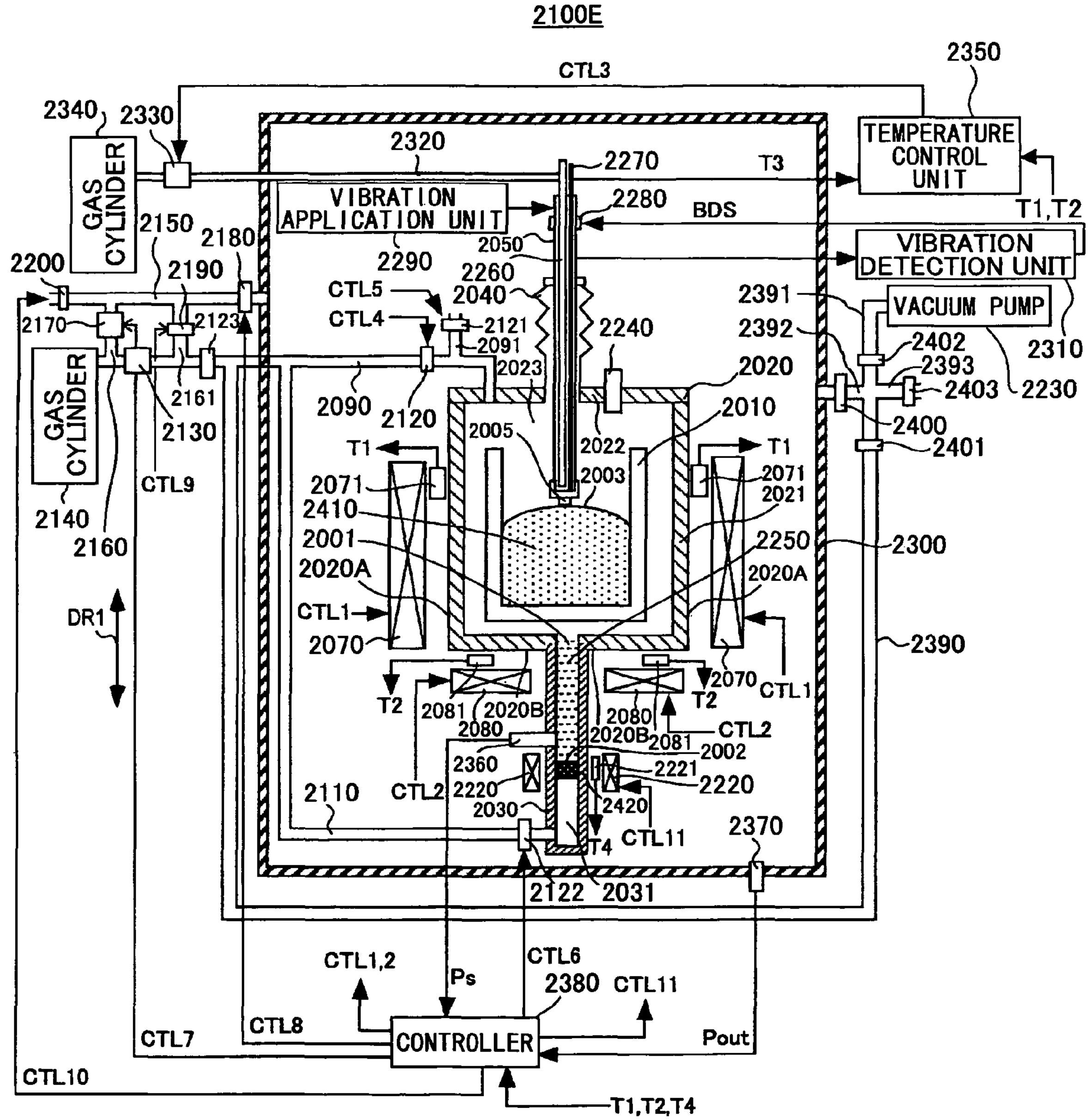
FIG. 68 is a schematic cross-sectional diagram showing the construction of a crystal growth apparatus according to Embodiment 12 of the present invention.

FIG. 68 is a schematic cross-sectional diagram showing the construction of a crystal growth apparatus according to Embodiment 12 of the present invention.

Referring to FIG. 68, the crystal growth apparatus 12100E has a construction identical with the construction of the crystal growth apparatus 2100 shown in FIG. 47, except that the stopper/inlet member 2060 of the crystal growth apparatus 2100 is replaced by a backflow prevention member 2420.

It should be noted that the backflow prevention member 2420 holds the metal melt 2250 inside the conduit 2030 by the surface tension of the metal melt 2250 similarly to the stopper/inlet member 2060 and supplies the nitrogen gas in the space 2031 in the conduit 2030 to the space 2023 via the metal melt 2250.

Figure 69A:
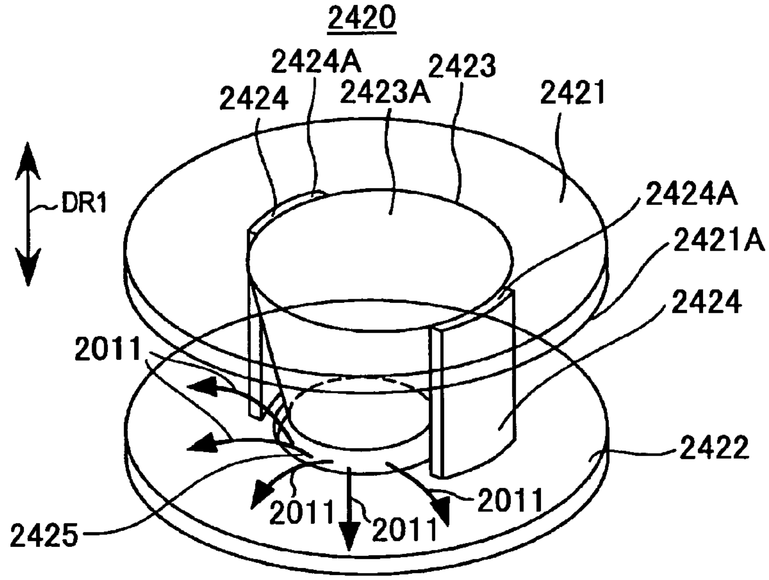
FIGS. 69A and 69B are enlarged diagrams showing the construction of the backflow prevention member shown in FIG. 68.
Figure 69B:
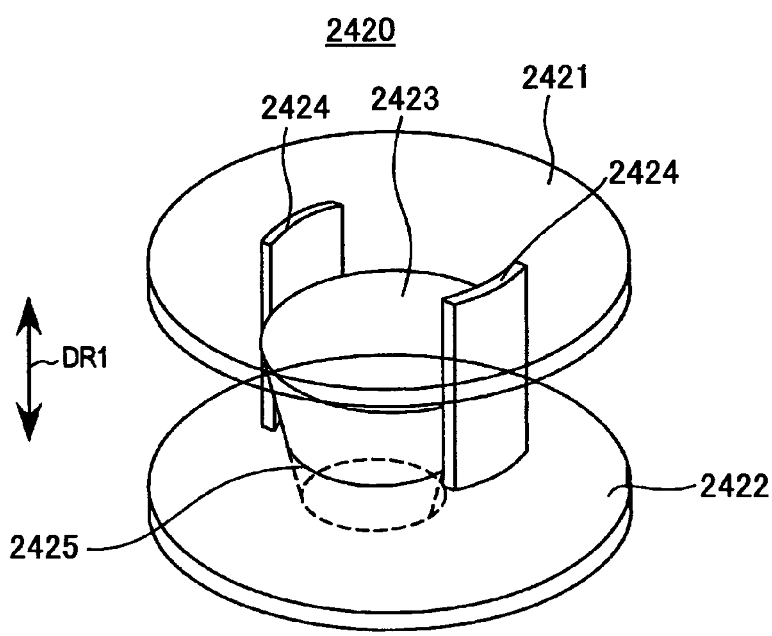

FIGS. 69A and 69B are enlarged diagrams showing the construction of the backflow prevention member shown in FIG. 68. FIG. 69A shows the state in which a check valve 2423 of the backflow prevention member 2420 has moved to the side of the inner reaction vessel 2020 while FIG. 69B shows the state in which the check valve 2423 has moved to the side of the conduit 2030.

Referring to FIG. 69A, the backflow prevention member 2420 comprises a top plate 2421, a bottom place 2422, a check valve 2423 and a pair of guides 2424. The top plate 2421 and the bottom plate 2422 have respective outer peripheral parts fixed in contact with an inner wall 2030A of the conduit 2030.

The bottom plate 2422 is formed with a penetrating hole 2425. The pair of guides 2424 are provided at both sides of the penetrating hole 2425. The check valve 2423 is placed between the top plate 2421 and the bottom plate 2422 so as to slide in the gravitational direction DR1 along the guides 2424. The guides 2424 have a top surface 2424A in contact with a bottom surface 2421A of the top plate 2421, and there is realized the state in which the penetrating hole 2425 is opened when the check valve 2423 has moved along the guides 2424 to a location where the top surface 2423A of the check valve 2423 makes a contact with the bottom surface 2421A of the top plate 2421.

Because the situation in which the check valve 2423 moves to the location where the top surface 2423A of the check valve 2423 makes a contact with the bottom surface 2421A of the top plate 2421 is caused in the case the pressure of the space 2031 in the conduit 2230 is higher than the pressure of the space 2023 inside the inner reaction vessel 2020, there is caused a diffusion of the nitrogen gas from the space 2031 of the conduit 2030 to the space 2023 in the inner reaction vessel 2020 in this state where the penetrating hole 2425 is opened. Thus, the metal Na vapor in the space 2023 of the inner reaction vessel is blocked by this flow of the nitrogen gas 2011 and the diffusion from the inner reaction vessel 2020 to the space 2031 in the conduit 2030 is suppressed.

On the other hand, when the pressure of the space 2023 in the inner reaction vessel 2020 becomes higher than the pressure of the space 2031 in the conduit 2030, the check valve 2423 moves toward the bottom place 2422 and there appears a state in which the penetrating hole 2425 is closed. Further, when the pressure of the space 2023 in the inner reaction vessel 2020 is generally equal to the pressure of the space 2031 in the conduit 2030, the check valve 2423 moves toward the bottom place 2422 by the gravity, and there appears a state in which the penetrating hole 2425 is closed (FIG. 69B).

Thus, the check valve moved between the location of closing the penetrating hole 2425 and the location of opening the penetrating hole in the gravitational direction DR1 by the pressure difference between the space 2023 of the inner reaction vessel 2020 and the space 2031 of the conduit 2030 and by the weight of itself.

Figure 70:
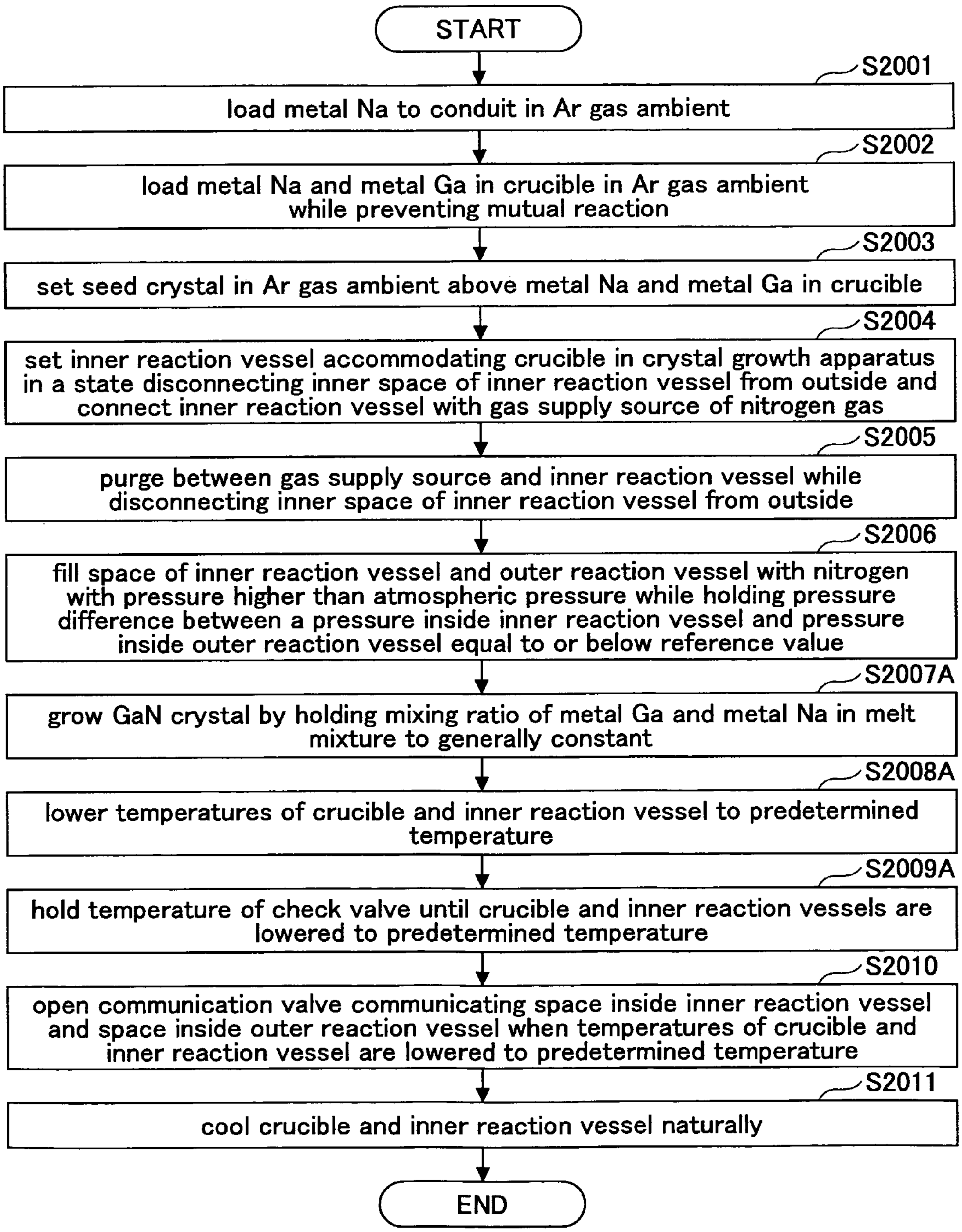
FIG. 70 is a flowchart explaining the manufacturing method of a GaN crystal according to Embodiment 12 of the present invention.

FIG. 70 is a flowchart explaining the manufacturing method of a GaN crystal according to Embodiment 12 of the present invention. It should be noted that the flowchart 70 shown in FIG. 70 is identical to the flowchart shown in FIG. 57 except that the steps S2007, S2008 and S2009 of the flowchart of FIG. 57 are replaced by the steps S2007A, S2008A and S2009A.

Referring to FIG. 70, when the steps S2001-S2006 explained above are conducted, there is caused a crystal growth of the GaN crystal while holding the mixing ration of the metal Na and the metal Ga in the melt mixture 2410 (step S2007A).

When the crystal growth of the GaN crystal is over, the temperatures of the crucible 2101 and the inner reaction vessel 2020 are lowered from 800° C. to a predetermined temperature (200° C.) along the curve k1 (step S2008A). In this case, there is no need of "maintaining the pressure difference between the pressure Prac applied to the check valve 2423 from the side of the inner reaction vessel 2020 and the pressure Psur applied to the check valve 2423 from the side of the gas supply source (gas cylinder 2140) to be equal to or lower than the reference value Pstd2" as in the case of the step S2008 shown in FIG. 57, and the crucible 2010 and the inner reaction vessel 2020 are cooled from 800° C. to the predetermined temperature (200° C.) without controlling the pressure difference between the pressures Prac and Psur to be equal to or smaller than the reference value Pstd2.

Thereafter, the temperature of the check valve 2423 is held at the predetermined temperature (200° C.) until the temperatures of the crucible 2010 and the inner reaction vessel 2020 are lowered to the predetermined temperature (200° C.)(step S2009A).

Further, the foregoing steps S2010 and S2011 are conducted consecutively, and with this, a series of operations are completed.

Figure 71:
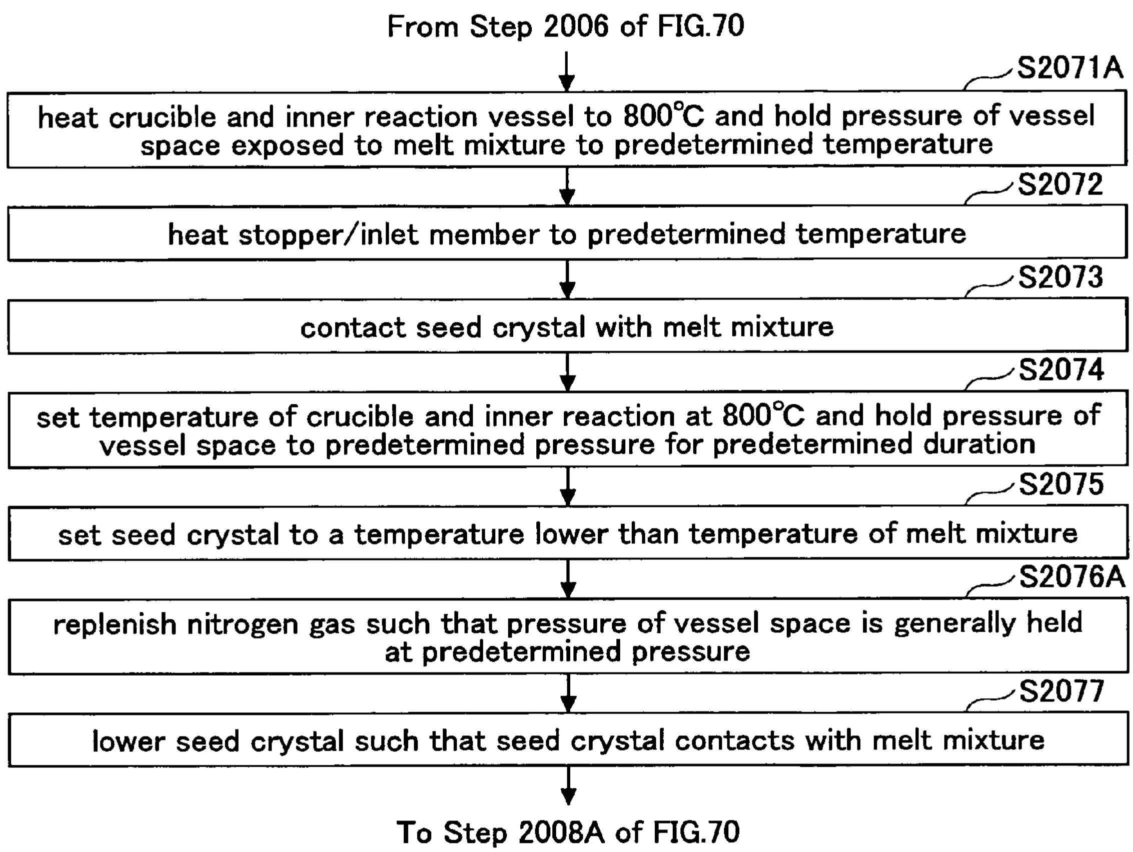
FIG. 71 is a flowchart explaining the detailed operation of the step S2007A in the flowchart shown in FIG. 70.

FIG. 71 is a flowchart explaining the detailed operation of the step S2007A in the flowchart shown in FIG. 70. It should be noted that the flowchart 71 shown in FIG. 70 is identical to the flowchart shown in FIG. 58 except that the steps S2071 and S2076 of the flowchart of FIG. 58 are replaced by the steps S2071A and S2076A.

Referring to FIG. 71, the crucible 2010 and the inner reaction vessel 2020 are heated to 800° C. by the heating units 2070 and 2080 when the step S2006 shown in FIG. 70 is completed, and the pressure of the vessel space exposed to the melt mixture 2410 (=space 2023) to a predetermined pressure (such as 1.01 MPa) (step S2071A).

In this case, there is no need of "maintaining the pressure difference between the pressure Prac applied to the check valve 2423 from the side of the inner reaction vessel 2020 and the pressure Psur applied to the check valve 2423 from the side of the gas supply source (gas cylinder 2140) to be equal to or lower than the reference value Pstd2" as in the case of the step S2071 shown in FIG. 58, and the crucible 2010 and the inner reaction vessel 2020 are heated to 800° C. without controlling the pressure difference between the pressures Prac and Psur to be equal to or smaller than the reference value Pstd2. Thus, the pressure of the vessel space (=space 2023) exposed to the melt mixture 2410 becomes the predetermined pressure (1.01 MPa, for example).

Then, the pressure P1 of the space 2023 becomes lower than the pressure P2 of the space 2031 inside the conduit 2030 (P1<P2) when the steps S2072-S2075 are conducted consecutively, and there is formed a differential pressure between the space 2023 and the space 2031. Thus, the nitrogen gas in the space 2031 is supplied to the space 2023 consecutively via the stopper/inlet member 2060 and the metal melt 2250 (=metal Na melt). Thus, the nitrogen gas is replenished to the vessel space (=space 2023) such that the pressure of the vessel space (=space 2023) ie held generally at the predetermined pressure (1.01 Moa) (step S2076A).

In this case, there is no need of "maintaining the pressure difference between the pressure Prac applied to the check valve 2423 from the side of the inner reaction vessel 2020 and the pressure Psur applied to the check valve 2423 from the side of the gas supply source (gas cylinder 2140) to be equal to or lower than the reference value Pstd2" as in the case of the step S2076 shown in FIG. 58, and the nitrogen gas is filled to the space 2023 from the space 2031 without controlling the pressure difference between the pressures Prac and Psur to be equal to or smaller than the reference value Pstd2.

Further, the foregoing step S2077 is conducted, and with this, the detailed operation of the step S2007 is completed.

With Embodiment 12, crystal growth of the GaN crystal is conducted in the state that the nitrogen gas is filled to the inner reaction vessel 2020 and the outer reaction vessel 2300 such that the pressure difference between the pressure inside the inner reaction vessel 1020 and the pressure inside the outer reaction vessel 2300 are held to be equal to or smaller than the reference pressure Pstd1, and thus, there occurs no outflow of the nitrogen gas or metal Na vapor from the space 2023 to the outside of the inner reaction vessel 2020. Further, there occurs no inflow of gas from to the space 2023 from outside of the inner reaction vessel 2020. As a result, it becomes possible to manufacture a GaN crystal stably.

It should be noted that the crystal growth apparatus of Embodiment 12 is the one in which the function of maintaining the temperature of the seed crystal 2005 to be lower than the temperature of the melt mixture 2410 is removed from the crystal growth apparatus 2100E, or may be the one in which the function of moving the support unit 2050 to move up or down is removed from the crystal growth apparatus 2100E. Further, the crystal growth apparatus of Embodiment 12 may be the one in which the function of maintaining the temperature of the seed crystal 2005 to be lower than the temperature of the melt mixture 2410 or the function of moving the support unit 2050 to move up or down are removed from the crystal growth apparatus 2100E. Further, the crystal growth apparatus may be the one in which the bellows 2040, the support unit 2050, the conduit 2260, the thermocouple 2270, the up/down mechanism 2280, the vibration application unit 2290, the vibration detection unit 2310, the gas supply line 2320, the flow meter 2330, the gas cylinder 2340 and the temperature control unit 2350 are removed from the crystal growth apparatus 2100E.

Thus, the crystal growth apparatus according to Embodiment 12 may be the one in which the crystal growth apparatus 2100E is modified similarly to the modification of the crystal growth apparatus 2100 to any of the crystal growth apparatuses 2100A, 2100B, 2100C and 2100D.

Figure 72:
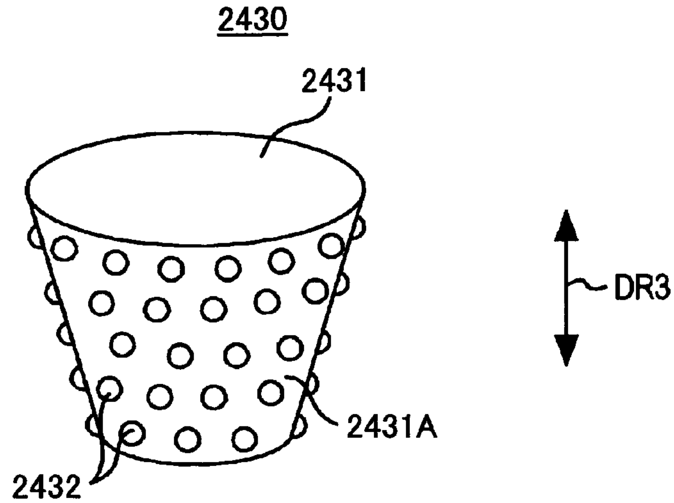
FIG. 72 is another oblique view diagram of the stopper/inlet plug according to the present invention.

FIG. 72 is another oblique view diagram of the stopper/inlet plug according to the present invention. Further, FIG. 73 is a cross-sectional diagram showing the method for mounting the stopper/inlet member 2430 shown in FIG. 72.

Referring to FIG. 72, the stopper/inlet member 2430 comprises a plug 2431 and a plurality of projections 2432. The plug 2431 is formed of a cylindrical body that changes the diameter in a length direction DR3. Each of the projections 432 has a generally semi-spherical shape of the diameter of several ten microns. The projections 2432 are formed on an outer peripheral surface 2431A of the plug 2431 in a random pattern. Thereby, the separation between adjacent two projections 2432 is set to several ten microns.

Figure 73:
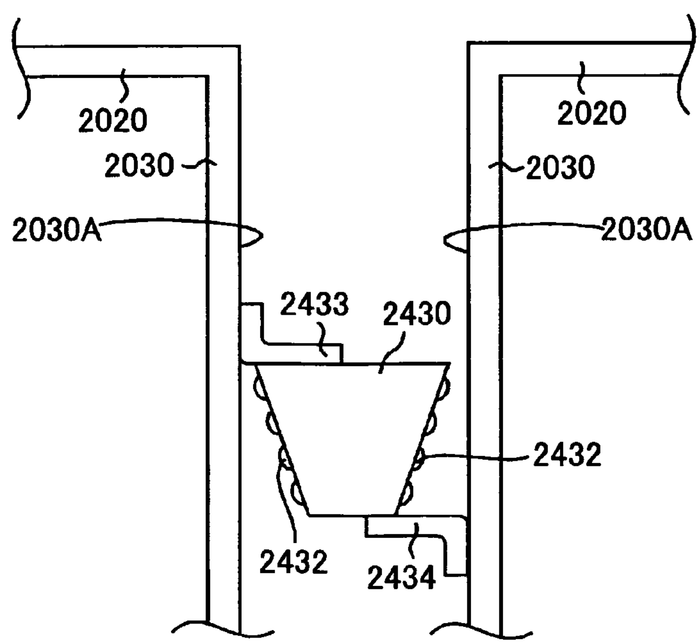
FIG. 73 is a cross-sectional diagram showing the method for mounting the stopper/inlet member shown in FIG. 72.

Referring to FIG. 73, the stopper/inlet member 2430 is field inside the conduit 2030 by the support members 2433 and 2434. More specifically, the stopper/inlet member 2430 is fixed by being held between the support member 2433 having one end fixed upon the inner wall 2030A of the conduit 2030 and the support member 2434 having one end fixed upon the inner wall surface 2030A of the conduit 2030.

In the present case, the projections 2430 of the stopper/inlet member 2430 may or may not contact with the inner wall 2030A of the conduit 2030.

In the event the stopper/inlet plug 2430 is fixed in the state that the projections 2432 do not contact with the inner wall 2030A of the reaction vessel 2030, the separation between the projections 2432 and inner wall 2030A of the conduit 2030 is set such that the metal melt 2250 can be held by the surface tension of the metal melt 2250, and the stopper/inlet plug 2430 is fixed in this state by the support members 2433 and 2434.

The metal Na held between the crucible 2030 and the reaction vessel 2020 takes a solid form before heating of the stopper/inlet member 2430 is commenced, and thus, the nitrogen gas supplied from the gas cylinder 2140 can cause diffusion between the space 2023 inside the inner reaction vessel 2020 and the space 2031 inside the conduit 2030 through the stopper/inlet plug 2430.

Further, the stopper/inlet member 2430 holds the metal melt 2250 by the surface tension thereof such that the metal melt 2250 does not flow out to the space 2031 inside the conduit 2030.

Further, the stopper/inlet plug 2430 holds the metal melt 2250 by the surface tension thereof such that the metal melt 2250 does not flow out to the space 2031 of the conduit 2030.

Further, with progress of the growth of the GaN crystal, the metal melt 2250 and the stopper/inlet plug 2430 confine the nitrogen gas and the metal Na vapor evaporated from the metal melt 2250 and the melt mixture 2410 into the space 2023.

As a result, diffusion of the metal Na to the outside of the inner reaction vessel 2020 is prevented, and it becomes possible to stabilize the mixing ratio of the metal Na and the metal Ga in the melt mixture 2410. Further, when there is caused a decrease of nitrogen gas in the space 2023 with progress of growth of the GaN crystal, the pressure P1 of the space 2023 becomes lower than the pressure P2 of the space 2031 inside the conduit 2030, and the stopper/inlet member 2430 supplies the nitrogen gas in the space 2031 to the space 2023 via the metal melt 2250 by causing to flow the nitrogen gas therethrough in the direction toward the reaction vessel 2020.

While it has been explained that the stopper/inlet member 2430 has the projections 2432, it is also possible that the stopper/inlet member 2430 does not have the projections 2432. In this case, the stopper/inlet member 2430 is held by the support members 2433 and 2434 such that the separation between the plug 2431 and inner wall 2030A of the conduit 2030 becomes several ten microns.

Further, it is also possible to set the separation between the stopper/inlet member 2430 (including both of the cases in which the stopper/inlet member 2432 carries the projections 2432 and the case in which the stopper/inlet member 2430 does not carry the projections 402) and the inner wall surface 2030A of the conduit 2030 is determined according to the temperature of the stopper/inlet plug 2430. In this case, the separation between the stopper/inlet member 2430 and the inner wall 2030A of the conduit 2030 is set relatively narrow when the temperature of the stopper/inlet plug 2430 is relatively high. When the temperature of the stopper/inlet member 2430 is relatively low, on the other hand, the separation between the stopper/inlet member 2430 and the inner wall 2030A of the conduit 2030 is set relatively large.

It should be noted that the separation between the stopper/inlet member 2430 and the inner wall 2030A of the conduit 2030 that can hold the metal melt 2250 by the surface tension changes depending on the temperature of the stopper/inlet member 2430. This, with this embodiment, the separation between the stopper/inlet plug 2430 and inner wall 2030A of the conduit 2030 is changed in response to the temperature of the stopper/inlet member 2430 such that the metal melt 2250 is held securely by the surface tension.

Figure 74A:
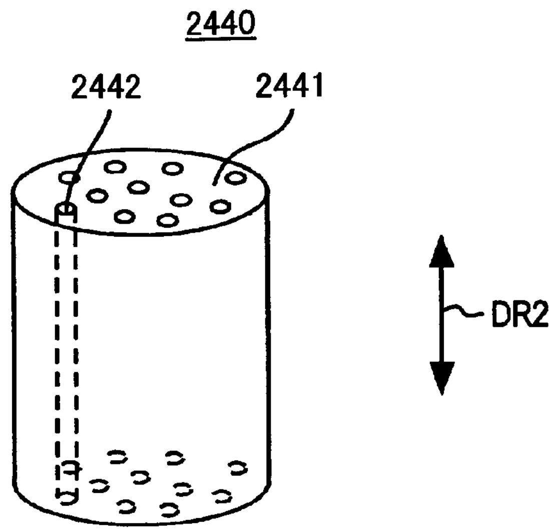
FIGS. 74A and 74B are further oblique view diagrams of the stopper/inlet member according to the present invention.
Figure 74B:
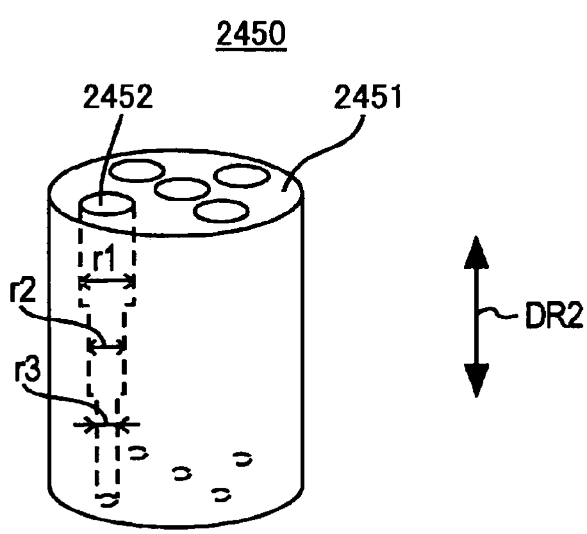

FIG. 74 is a further oblique view diagram of the stopper/inlet member according to the present invention.

Referring to FIG. 74, the stopper/inlet member 2440 comprises a plug 2441 formed with a plurality of penetrating holes 2442. The plurality of penetrating holes 2442 are formed in the length direction DR2 of the plug 2441. Further, each of the plural penetrating holes 2442 has a diameter of several ten microns (see FIG. 74A).

With the stopper/inlet member 2440, it is sufficient that there is formed at least one penetrating hole 2442.

Further, the stopper/inlet member 2450 comprises a plug 2451 formed with plural penetrating holes 2452. The plurality of penetrating holes 2452 are formed in the length direction DR2 of the plug 2451. Each of the penetrating holes 2452 have a diameter that changes stepwise from a diameter r1, r2 and r3 in the length direction DR2. Here, each of the diameters r1, r2 and r3 is determined in the range such as several microns to several ten microns in which the metal melt 2250 can be held by the surface tension Reference should be made to FIG. 74.

With the stopper/inlet member 2450, it is sufficient that there is formed at least one penetrating hole 2452. Further, it is sufficient that the diameter of the penetrating hole 2452 is changed at least in two steps. Alternatively, the diameter of the penetrating hole 2452 may be changed continuously in the length direction DR2.

It should be noted that the stopper/inlet plug 2430, 2440 or 2450 is used in any of the crystal growth apparatuses 2100, 2100A, 2100B, 2100C and 2100D in place of the stopper/inlet member 2060.

In the case the stopper/inlet plug 2450 is used in any of the crystal growth apparatuses 2100, 2100A, 2100B, 2100C and 2100D in place of the stopper/inlet plug 2060, it becomes possible to hold the metal melt 2250 by the surface tension thereof by one of the plural diameters that are changed stepwise, and it becomes possible to manufacture a GaN crystal of large size without conducting precise temperature control of the stopper/inlet plug 2450.

Further, with the present invention, it is possible to use a porous plug in place of the stopper/inlet plug 2060. The porous plug may be the one formed of a sintered body of stainless steel powders. Such a porous plug has a structure in which there are formed a large number of pores of several ten microns. Thus, the porous plug can hold the metal melt 2250 by the surface tension thereof similarly to the stopper/inlet plug 2060 explained before.

Figure 75A:
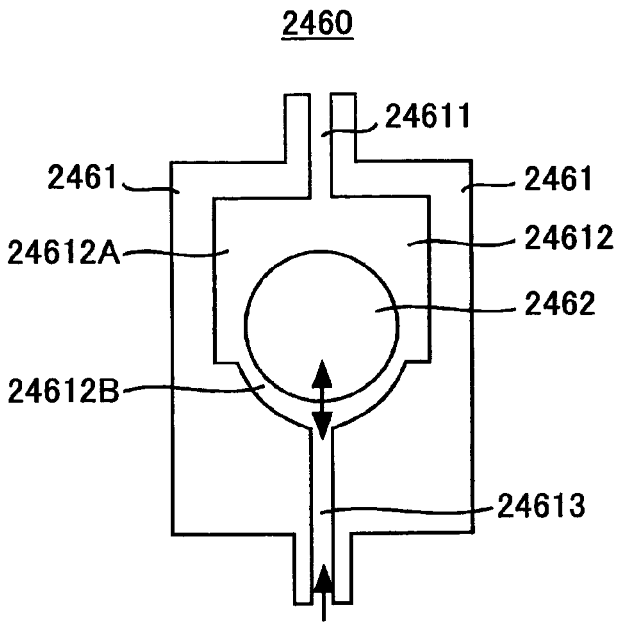
FIGS. 75A and 75B are other schematic cross-sectional diagrams of the backflow prevention member.
Figure 75B:
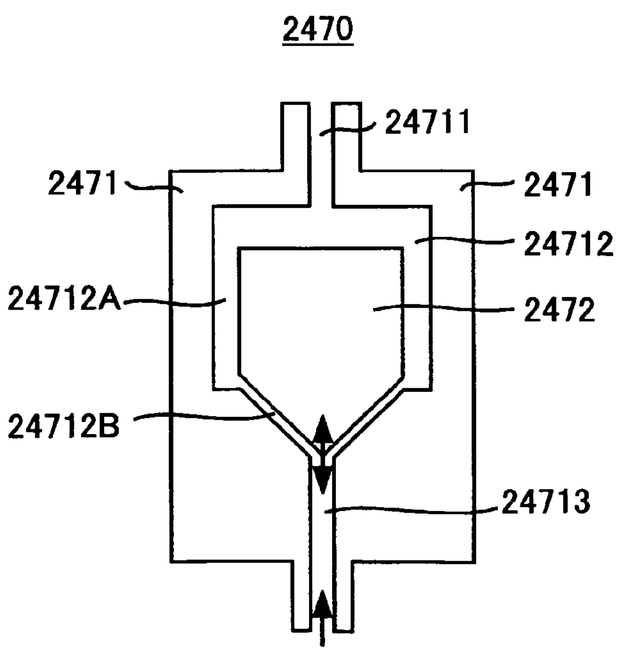

FIGS. 75A and 75B are other schematic cross-sectional diagrams of the backflow prevention member.

Referring to FIG. 75A, the backflow prevention member 2460 comprises a main part 2461 and a ball member 2462. The main member 2461 includes penetrating holes 24611 and 24613 and a cavity 24612.

The cavity 24612 comprises a polygonal part 24612A and a spherical part 24612B. The polygonal part 24612A has a generally square cross-sectional form while the spherical part 24612B has a semi-circular cross-sectional form.

The penetrating hole 24611 is provided between a first end of the main part 2461 and the square part 24612A of the cavity part 24612 while the penetrating hole 24613 is provided between the spherical part 24612B of the cavity 24612 and the other end of the main part 2461.

The ball member 2562 is formed of a spherical member having a diameter smaller than the polygonal part 24612 and is disposed inside the cavity 24612. Thus, the ball member 2462 moves up or down in the cavity 24612 by the differential pressure between the penetrating hole 24611 and the penetrating hole 24613 or by the self weight and engages with the spherical part 24612B when it has moved in the downward direction.

When the pressure of the penetrating hole 24613 is higher than the pressure inside the penetrating hole 24611, the ball member 2462 is moved in the upward direction by the differential pressure between the pressure of the penetrating hole 24611 and the penetrating hole 24613. In this case, the backflow prevention member 2460 causes the nitrogen gas flowed in through the penetrating hole 24613 to the penetrating hole 24611 through the cavity 24612.

Further, when the pressure inside the penetrating hole 24611 is higher than the pressure in the penetrating hole 24613, the ball member 2462 moves in the downward direction by the differential pressure between the pressure in the penetrating hole 24611 and the pressure in the penetrating hole 24613 and engages with the spherical part 24612B. When the pressure in the penetrating hole 24613 is generally equal to the pressure in the penetrating hole 24611, the ball member 2462 moves in the downward direction by the self weight and engages into the spherical member 24612B. In this case, the part between the cavity 24612 and the penetrating hole 24613 is closed by the ball member 2462 and the backflow prevention member 2460 blocks the passage of the metal Na vapor or the metal melt into the penetrating hole from the penetrating hole 24611 through the cavity 24612.

Referring to FIG. 75A, the backflow prevention member 2470 comprises a main part 2471 and a rod member 2472. The main member 2471 includes penetrating holes 24711 and 24713 and a cavity 24712. The cavity 24712 comprises polygonal parts 24712A and 24712B. The polygonal part 24712A has a generally square cross-sectional form while the polygonal part 24712B has a generally triangular cross-sectional form.

The penetrating hole 24711 is provided between a first end of the main part 2471 and the polygonal part 24712A of the cavity part 24712 while the penetrating hole 24713 is provided between the polygonal part 24712B of the cavity 24712 and the other end of the main part 2471.

The rod member 2472 has a pentagonal shape having a diameter smaller than the polygonal part 24712 and is disposed inside the cavity 24712. Thus, the rod member 2472 moves up or down in the cavity 24712 by the differential pressure between the penetrating hole 24711 and the penetrating hole 24713 or by the self weight and engages with the polygonal part 24712B when it has moved in the downward direction.

When the pressure of the penetrating hole 24713 is higher than the pressure inside the penetrating hole 24711, the rod member 2472 is moved in the upward direction by the differential pressure between the pressure of the penetrating hole 24711 and the penetrating hole 24713. In this case, the backflow prevention member 2470 causes the nitrogen gas flowed in through the penetrating hole 24713 to the penetrating hole 24712 through the cavity 24711.

Further, when the pressure inside the penetrating hole 24711 is higher than the pressure in the penetrating hole 24713, the rod member 2472 moves in the downward direction by the differential pressure between the pressure in the penetrating hole 24711 and the pressure in the penetrating hole 24713 and engages with the polygonal part 24712B. When the pressure in the penetrating hole 24713 is generally equal to the pressure in the penetrating hole 24711, the rod member 2472 moves in the downward direction by the self weight and engages with the polygonal member 24712B. In this case, the part between the cavity 24712 and the penetrating hole 24713 is closed by the polygonal member 24712B and the backflow preventing member 2470 blocks the passage of the metal Na vapor or the metal melt into the penetrating hole 24713 from the penetrating hole 24711 through the cavity 24712.

Because the backflow prevention members 2460 and 2470 do not use a spring mechanism, there occurs no damaging even at high temperatures used for the crystal growth, and highly reliable operation is guaranteed.

It should be noted that each of the backflow prevention members 2460 and 2470 shown in FIG. 75 are used for the crystal growth apparatus 2100E in place of the backflow prevention member 2420.

While explanation has been made heretofore that the pressure Pin of the inner reaction vessel 2020 is detected based on the hydrostatic pressure Ps of the melt mixture 2410 detected by the pressure sensor 2360, it should be noted that this reflects the situation that there exists no pressure sensor operable at high temperature and can be used for direct detection of the pressure Pin in the inner reaction vessel 2020 heated to the high temperature of 800° C. Because of this, and in view of the fact that the detected hydrostatic pressure Ps is proportional to the pressure Pin inside the space 2023, the present embodiment detects the hydrostatic pressure Ps of the melt mixture 2410 of the temperature of about 200° C. and uses the detected hydrostatic pressure Ps for the detection of the pressure Pin. This means that, when a pressure sensor capable of detecting the pressure Pin inside the space 2023 heated to about 800° C. directly is developed, it is possible to use such a pressure sensor and detect the pressure Pin inside the space 2023 directly.

Further, while it has been explained in the foregoing that the crystal growth temperature is 800° C., the present embodiment is not limited to this specific crystal growth temperature. It is sufficient when the crystal growth temperature is equal to or higher than 600°. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the crucible 2010 in the ambient of Ar gas and the metal Na is loaded between the crucible 2010 and the inner reaction vessel 2020 in the ambient of Ar gas, it is also possible to load the metal Na and the metal Ga into the crucible 2010 and the metal Na into the conduit 2030 in the ambient of a gas other than the Ar gas, such as He, Ne, Kr, or the like, or in a nitrogen gas. Generally, it is sufficient that the metal Na and the metal Ga are loaded into the crucible 2010 and the metal Na is loaded into the conduit 2003 in the ambient of an inert gas or a nitrogen gas. In this case, the inert gas or the nitrogen gas should have the water content of 10 ppm or less and the oxygen content of 10 ppm or less. Further, with the present embodiment, the bellows 2040 is included in the inner reaction vessel 2020. Thus, the bellows 2040 constitutes a part of the inner reaction vessel 2020.

Further, in place of the nitrogen gas, it is also possible to use a compound containing nitrogen as a constituent element such as sodium azide, ammonia, or the like. These compounds constitute the nitrogen source gas.

Embodiment 13

Figure 76:
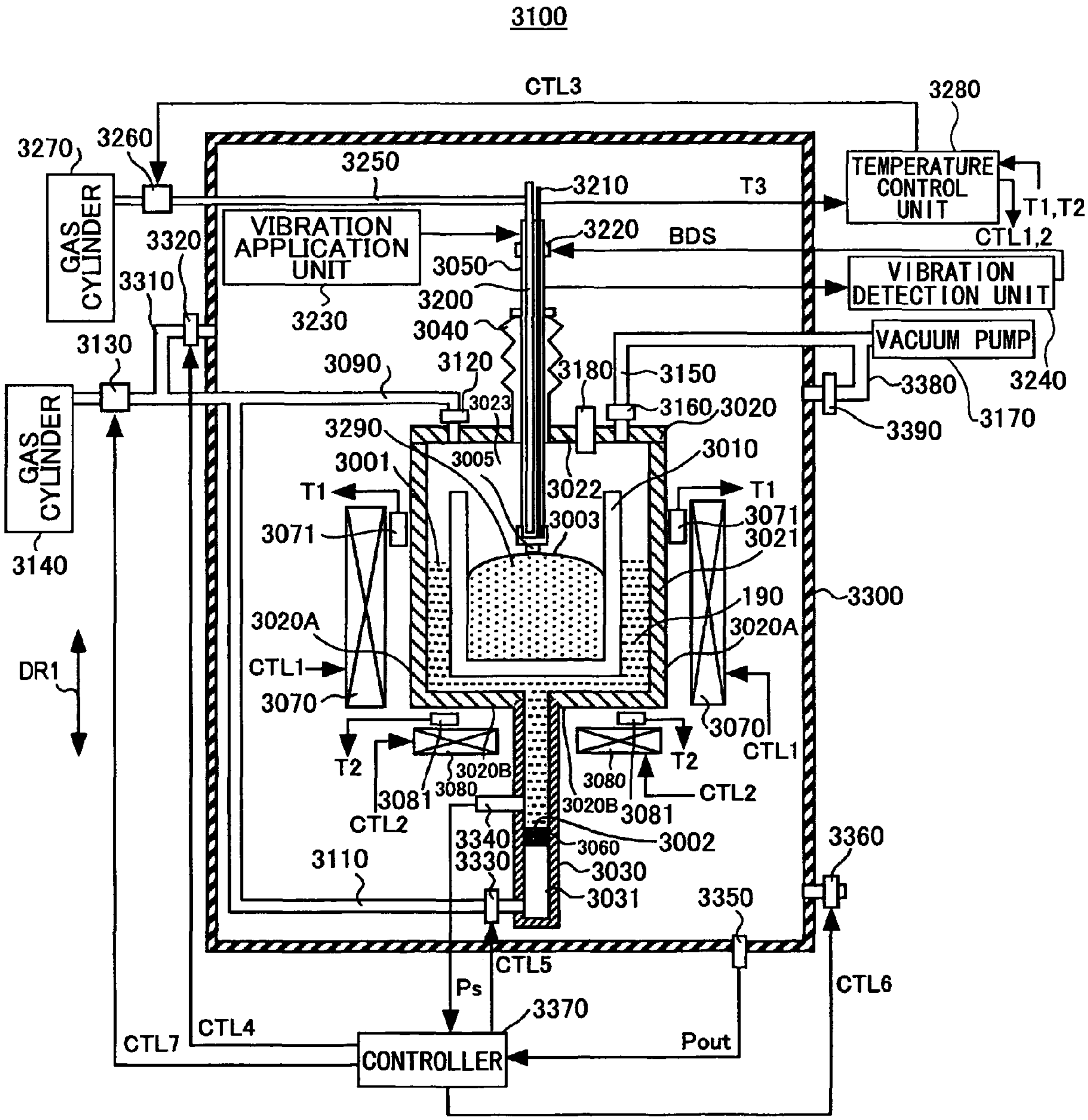
FIG. 76 is a schematic cross-sectional diagram showing the construction of a crystal growth apparatus according to Embodiment 13 of the present invention.

FIG. 76 is a schematic cross-sectional diagram showing the construction of a crystal growth apparatus according to Embodiment 13 of the present invention.

Referring to FIG. 76, a crystal growth apparatus 3100 according to Embodiment 13 of the present invention comprises: a crucible 3010; an inner reaction vessel 3020; conduits 3030 and 3200; a bellows 3040; a support unit 3050; a stopper/inlet plug 3060; heating units 3070 and 3080; temperature sensors 3071 and 3081; gas supply lines 3090, 3110, 3250 and 3310, valves 3120, 3160, 3320, 3330, 3360 and 3390; a pressure regulator 3130; gas cylinders 3140 and 3270; evacuation lines 3150 and 3330; a vacuum pump 3170; pressure sensors 3180, 3340 and 3350; a metal melt 3190; a thermocouple 3210; an up/down mechanism 3220; a vibration applying unit 3230; a vibration detection unit 3240; a flow meter 3260; and a temperature control unit 3280, an outer reaction vessel 3300, and a controller 3370.

The crucible 3010 has a generally cylindrical form and is formed of boron nitride (BN) or SUS316L stainless steel. The inner reaction vessel 3020 is disposed around the crucible 3010 with a predetermined separation from the crucible 3010. Further, the inner reaction vessel 3020 is formed of a main part 3021 and a lid 3022. Each of the main part 3021 and the lid 3022 is formed of SUS 316L stainless steel, wherein a metal seal ring is provided between the main part 3021 and the lid 3022 for sealing.

The conduit 3030 is connected to the inner reaction vessel 3020 at the underside of the crucible 3010 in terms of a gravitational direction DR1. The bellows 3040 is connected to the inner reaction vessel 3020 at the upper side of the crucible 3010 in terms of a gravitational direction DR1. The support substrate 3050 comprises a hollow cylindrical member and a part thereof is inserted into a space 3040 inside the inner reaction vessel 3020 via the bellows 3023.

The stopper/inlet plug 3060 may be formed of a metal, ceramic, or the like, for example, and is held inside the conduit 3020 at a location lower than the connection part of the inner reaction vessel 3030 and the conduit 3030.

The heating unit 3070 is disposed so as to surround the outer circumferential surface 3020A of the inner reaction vessel 3020. On the other hand, the heating unit 3080 is disposed so as to face a bottom surface 3020B of the inner reaction vessel 3020. The temperature sensors 3071 and 3081 are disposed in the close proximity of the heating units 3070 and 3080, respectively.

The gas supply line 3090 has an end connected to the inner reaction vessel 3020 via the valve 3120 and the other end connected to the gas cylinder 3130 via the pressure regulator 3140. The gas supply line 3110 has an end connected to the conduit 3030 and the other end connected to the gas supply line 3090.

The valve 3120 is connected to the gas supply line 3090 in the vicinity of the inner reaction vessel 3020. The pressure regulator 3130 is connected to the gas supply line 3090 in the vicinity of the gas cylinder 3140. The gas cylinder 3140 is connected to the gas supply line 3090.

The evacuation line 3150 has an end connected to the inner reaction vessel 3020 via the valve 3160 and the other end connected to the vacuum pump 3170. The valve 3160 is connected to the evacuation line 1150 in the vicinity of the inner reaction vessel 3020. The vacuum pump 3170 is connected to the evacuation line 3150.

The pressure sensor 3180 is mounted to the inner reaction vessel 3020. The metal melt 3190 comprises a melt of metal sodium (metal Na) and is held between the crucible 3010 and the inner reaction vessel 3020 and inside the conduit 3030.

The conduit 3200 and the thermocouple 3210 are inserted into the interior of the support unit 350. The up/down mechanism 3220 is mounted upon the support unit 3040 at the location above the bellows 3050. The gas supply line 3250 has an end connected to the conduit 3200 and the other end connected to the gas cylinder 3270 via the flow meter 3260. The flow meter 3260 is connected to the gas supply line 3250 in the vicinity of the gas cylinder 3270. The gas cylinder 3270 is connected to the gas supply line 3250.

Further, the outer reaction vessel 3300 is disposed so as to surround the conduit 3030, the bellows 3040, the support unit 3050 and the heating units 3070 and 3080. The gas supply line 3310 has an end connected to the outer reaction vessel 3300 via the valve 3320 and the other end connected to the gas supply line 3090.

The valve 3320 is connected to the gas supply line 3310 in the vicinity of the outer reaction vessel 3300. The valve 3330 is connected to the gas supply line 3110 in the vicinity of the conduit 3030. The pressure sensor 3340 is mounted to the conduit 3030 in the vicinity of the stopper/inlet member 3060. The pressure sensor 3350 is mounted to the outer reaction vessel 3300. The valve 3360 is mounted to the outer reaction vessel 3300.

The evacuation line 3380 has an end connected to the outer reaction vessel 3300 via the valve 3390 and the other end connected to the vacuum pump 3170. The valve 3390 is connected to the evacuation line 3380 in the vicinity of the outer reaction vessel 3300.

The crucible 3010 holds the melt mixture 3290 containing metal Na and metal gallium (metal Ga). The inner reaction vessel 3020 surrounds the crucible 3010. The conduit 3030 leads the nitrogen gas (N2 gas) supplied from the gas cylinder 3140 via the gas supply lines 3090 and 3110 to the stopper/inlet plug 3060.

The bellows 3040 holds the support unit 3050 and disconnects the interior of the inner reaction vessel 3020 from outside. Further, the bellows 3040 is capable of expanding and contracting in the gravitational direction DR1 with movement of the support unit 3050 in the gravitational direction DR1. The support unit 3050 supports a seed crystal 3020 of a GaN crystal at a first end thereof inserted into the inner reaction vessel 3005.

The stopper/inlet plug 3060 has a dimple structure on the outer peripheral surface such that there are formed apertures of the size of several ten microns between the inner wall of the conduit 3030 and the stopper/inlet plug 60. Thus, the stopper/inlet plug 60 allows the nitrogen gas in the conduit 3030 to pass in the direction to the metal melt 3190 and supplies the nitrogen gas to the space 3023 via the metal melt 3190. Further, the stopper/inlet plug 3060 holds the metal melt 3190 between the crucible 3010 and the inner reaction vessel 3020 and further inside the conduit 3030 by the surface tension of the metal melt 3190.

The heating unit 3070 comprises a heater and a current source. Thus, the heating unit 3070 supplies a current from the current source to the heater in response to a control signal CTL1 from the temperature control unit 3280 and heats the crucible 3020 and the inner reaction vessel 3020 to a crystal growth temperature from the outer peripheral surface 3020A of the inner reaction vessel 3010. The temperature sensor 3071 detects a temperature of the heater of the heating unit 3070 and outputs a detected temperature signal indicative of the detected temperature T1 to the temperature control unit 3280.

The heating unit 3080 also comprises a heater and a current source. Thus, the heating unit 3080 supplies a current from the current source to the heater in response to a control signal CTL2 from the temperature control unit 3280 and heats the crucible 3010 and the inner reaction vessel 3020 to the crystal growth temperature from the bottom surface 3020B of the inner reaction vessel 3020. The temperature sensor 3081 detects a temperature T2 of the heater of the heating unit 3080 and outputs a temperature signal indicative of the detected temperature T2 to the temperature control unit 3280.

The gas supply line 3090 supplies the nitrogen gas supplied from the gas cylinder 3140 via the pressure regulator 3130 to the interior of the inner reaction vessel 3020 via the valve 3120.

The gas supply line 3110 supplies a nitrogen gas supplied from the gas cylinder 3140 via the flow meter 3130 to the conduit 3030.

The valve 3120 supplies the nitrogen gas inside the gas supply line 3090 to the interior of the reaction vessel 3020 or interrupts the supply of the nitrogen gas to the interior of the reaction vessel 3020. The pressure regulator 3130 supplies the nitrogen gas from the gas cylinder 3140 to the gas supply lines 3090, 3110 and 3310 after setting the pressure to a predetermined pressure. Further, the pressure regulator 3130 pressurizes the interior of the outer reaction vessel 3300 to a predetermined pressure in response to a control signal CTL7 from the controller 3370.

The gas cylinder 3140 holds the nitrogen gas. The evacuation line 3150 passes the gas inside the inner reaction vessel 3020 to the vacuum pump 3170. The valve 3160 connects the interior of the inner reaction vessel 3020 and the evacuation line 3150 spatially or disconnects the interior of the inner reaction vessel 3020 and the evacuation line 3150 spatially. The vacuum pump 3170 evacuates the interior of the inner reaction vessel 3020 via the evacuation line 3150 and the valve 3160.

The pressure sensor 3180 detects the pressure inside the inner reaction vessel 3020 not heated by the heating unit 3070. The metal melt 3190 supplies the nitrogen gas introduced through the stopper/inlet plug 3060 into the space 3023.

The conduit 3200 cools the seed crystal 3005 by releasing the nitrogen gas supplied from the gas supply line 3250 into the support unit 3050 from the first end thereof. The thermocouple 3210 detects a temperature T3 of the seed crystal 3005 and outputs a temperature signal indicative of the detected temperature T3 to the temperature control unit 3280.

The up/down mechanism 3220 causes the support unit 3050 to move up or down in response to a vibration detection signal BDS from the vibration detection unit 3240 according to a method to be explained later, such that the seed crystal 3005 makes a contact with a vapor-liquid interface 3 between the space 3023 and the melt mixture 3290.

The vibration application unit 3230 comprises applies a vibration of predetermined frequency to the support unit 3050. The vibration detection unit 3240 detects the vibration of the support unit 3050 and outputs the vibration detection signal BDS to the up/down mechanism 3220.

The gas supply line 3250 supplies a nitrogen gas supplied from the gas cylinder 3270 via the flow meter 3260 to the conduit 3200. The flow meter 3260 supplies the nitrogen gas supplied from the gas cylinder 3270 to the gas supply line 3250 with flow rate adjustment in response to a control signal CTL3 from the temperature control unit 3280. The gas cylinder 3270 holds the nitrogen gas.

The temperature control unit 3280 receives the temperatures T1, T2 and T3 from the temperature sensors 3071, 3081 and the thermocouple 3210 and produces the control signal CTL1-CTL3 for cooling the seed crystal 1 based on the received temperatures T1, T2 and T3. Further, the temperature control unit 3280 outputs the produced signals CTL1 and CTL2 respectively to the heating units 3070 and 3080 and outputs the control signal CTL3 to the flow meter 3260.

Further, the outer reaction vessel 3300 is surrounds the inner reaction vessel 3020, the conduit 3030, the bellows 3040, the support unit 3050 and the heating units 3070 and 3080. The gas supply line 3310 supplies the nitrogen gas supplied from the gas cylinder 3140 via the pressure regulator 3130 to the interior of the outer reaction vessel 3300 via the valve 3320.

The valve 3320 supplies the nitrogen gas inside the gas supply line 3310 to the interior of the outer reaction vessel 3300 or interrupts the supply of the nitrogen gas to the interior of the outer reaction vessel 3300 in response to a control signal CTL4 from the controller 3370. The valve 3330 supplies the nitrogen gas inside the gas supply line 3110 to the interior of the conduit 3030 or interrupts the supply of the nitrogen gas to the interior of the conduit 3030 in response to a control signal CTL5 from the controller 3370.

The pressure sensor 3340 detects a hydrostatic pressure Ps of the metal melt 3190 for the state in which the inner reaction vessel 3020 is heated to the crystal growth temperature and provides the detected hydrostatic pressure Ps to the controller 3370. The pressure sensor 3350 detects the pressure Pout inside the outer reaction vessel 3300 and provides the detected pressure Pout to the controller 3370. The valve 3360 releases the gas inside the outer reaction vessel 3300 to the outside and stops the release of the gas inside the outer reaction vessel 3300 in response to a control signal CTL6 from the controller 3370.

Thus, the controller 3370 receives the hydrostatic pressure Ps from the pressure sensor 3340 and the pressure Pout from the pressure sensor 3350. The controller 3370 then detects the pressure Pin inside the inner reaction vessel 3020 based on the hydrostatic pressure Ps. More specifically, the hydrostatic pressure Ps of the metal melt 3190 increases relatively in proportion to the pressure Pin when the pressure Pin inside the space 3020 of the inner reaction vessel 3023 is increased relatively. Further, the hydrostatic pressure Ps of the metal melt 3190 decreases relatively in proportion to the pressure Pin when the pressure Pin inside the space 3020 of the inner reaction vessel 3023 is decreased relatively.

Thus, the hydrostatic pressure Ps is proportional to the pressure Pin inside the space 3023. Thus, the control unit 3370 holds a proportional constant of the hydrostatic pressure Ps and the pressure Pin converts the hydrostatic pressure Ps into the pressure Pin by applying the proportional coefficient to the hydrostatic pressure Ps.

Further, the controller 3370 calculates the absolute value of the pressure difference between the pressure Pin and the pressure Pout as |Pin−Pout|, and decides whether or not the calculated absolute value |Pin−Pout| is smaller than a predetermined value C. The predetermined value C may be set to 0.05 MPa, for example. It should be noted that this predetermined value C provides the threshold beyond which it is judged that the crystal growth apparatus 3100 is anomalous.

When the absolute value |Pin−Pout| is smaller than the predetermined value C, no control is made on the valves 3233, 3330 and 3360 by the control signals CTL4-CTL6, and the controller 3379 continuously receives the hydrostatic pressure Ps and the pressure Pout from the pressure sensors 3340 and 3350, respectively.

On the other hand, when the value |Pin−Pout| is equal to or larger than the predetermined value C, the controller judges whether or not the pressure Pin is higher than the pressure Pout. In the event the pressure Pin is higher than the pressure Pout, the controller 3370 produces the control signal CTL5 for causing the valve 3330 to close, and the control signal CTL5 thus produced is provided to the valve 3330. Further, the controller 3370 produces the control signal CTL4 for opening the valve 3320 and the control signal CTL7 for pressurizing the interior of the outer reaction vessel 3300 such that the pressure Pout generally coincides with the pressure Pin. Further, the controller 3370 provides the control signals CTL4 and CTL7 thus produced respectively to the valve 3320 and the pressure regulator 3130.

Further, the controller 3370 produces the control signal CTL4 for closing the valve 3320 and the control signal CTL6 for opening the valve 3360 when the pressure Pin is lower than the pressure Pout, and the control signals CTL4 and CTL6 thus produced are supplied respectively to the valves 3320 and 3360.

The evacuation line 3380 passes the gas inside the outer reaction vessel 3300 to the vacuum pump 3170. The valve 3390 connects the interior of the outer reaction vessel 3300 and the evacuation line 3380 spatially or disconnects the interior of the outer reaction vessel 3300 and the evacuation line 3380 spatially.

Figure 77:
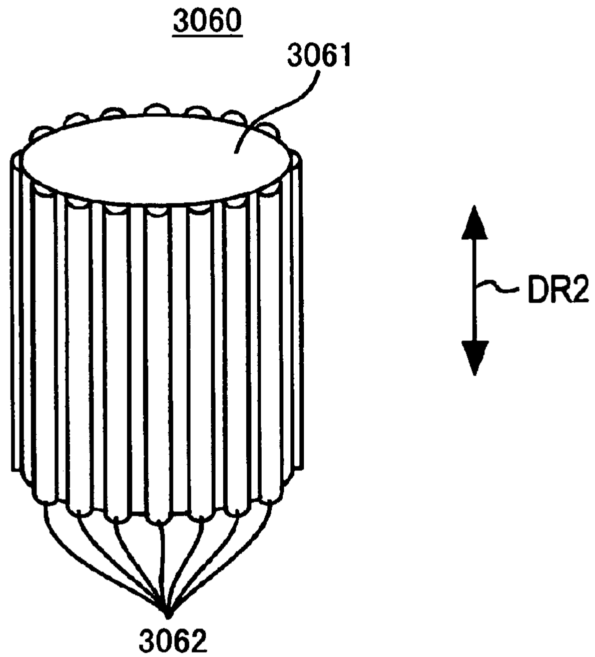
FIG. 77 is an oblique view diagram showing the construction of the stopper/inlet plug shown in FIG. 76.

FIG. 77 is an oblique view diagram showing the construction of the stopper/inlet plug 3060 shown in FIG. 76.

Referring to FIG. 77, the stopper/inlet plug 3060 includes a plug 3061 and projections 3062. The plug 3061 has a generally cylindrical form. Each of the projections 3062 has a generally semi-circular cross-sectional shape and the projections 3061 are formed on the outer peripheral surface of the plug 3061 so as to extend in a length direction DR2.

Figure 78:
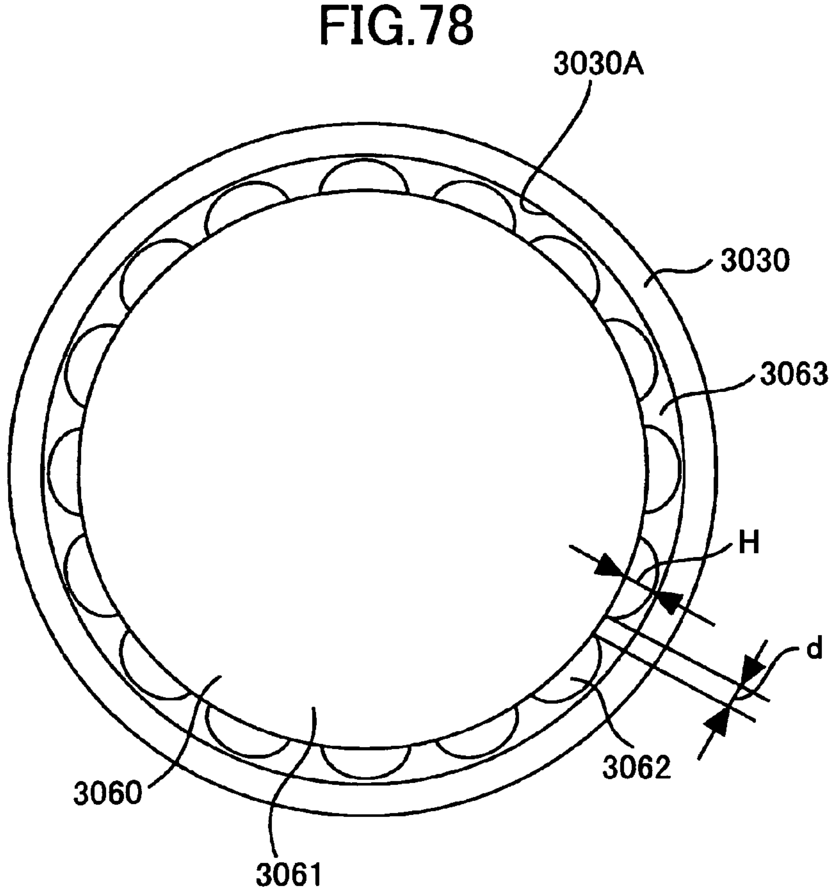
FIG. 78 is a plan view diagram showing the state of mounting the stopper/inlet plug to a conduit.

FIG. 78 is a plan view diagram showing the state of mounting the stopper/inlet plug 3060 to the conduit 3030.

Referring to FIG. 78, the projections 3062 are formed with plural number in the circumferential direction of the plug 3061 with an interval d of several ten microns. Further, each projection 3062 has a height H of several ten microns. The plural projections 3060 of the stopper/inlet plug 3062 make a contact with the inner wall surface 3030A of the conduit 3030. With this, the stopper/inlet plug 3060 is in engagement with the inner wall 3030A of the conduit 3030.

Because the projections 3062 have a height H of several ten microns and are formed on the outer peripheral surface of the plug 3061 with the interval d of several ten microns, there are formed plural gaps 3063 between the stopper/inlet plug 3060 and the inner wall 1030A of the conduit 3030 with a diameter of several ten microns in the state the stopper/inlet plug 3060 is in engagement with the inner wall 3030A of the conduit 3030.

This gap 3063 allows the nitrogen gas to pass in the length direction DR2 of the plug 3061 and holds the metal melt 3190 at the same time by the surface tension of the metal melt 3190, and thus, the metal melt 3190 is blocked from passing through the gap in the longitudinal direction DR2 of the plug 3061.

Figure 79A:
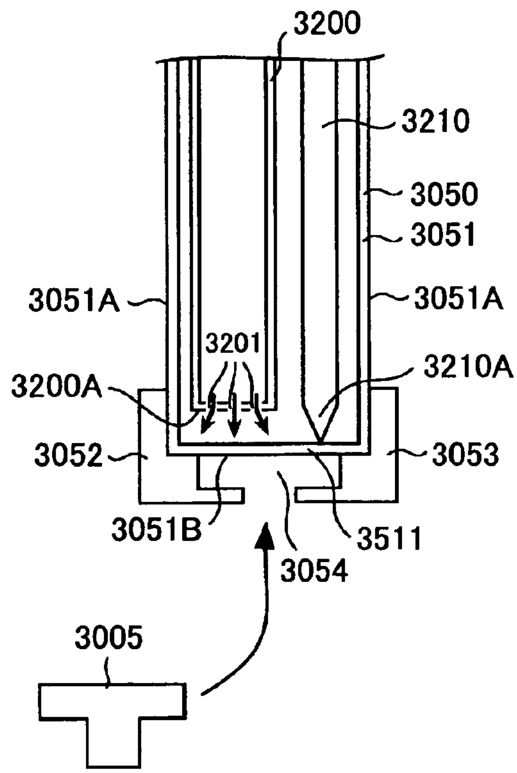
FIGS. 79A and 79B are enlarged diagrams showing the construction of the support unit, conduit and the thermocouple shown in FIG. 76.
Figure 79B:
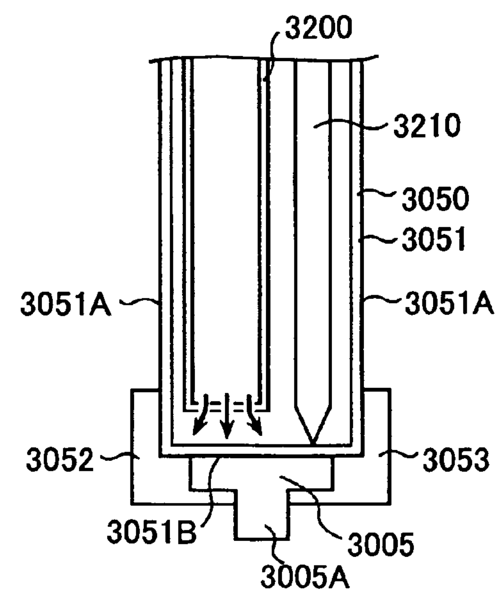

FIGS. 79A and 79B are enlarged diagrams of the support unit 3050, the conduit 3200 and the thermocouple 3210 shown in FIG. 76.

Referring to FIGS. 79A and 79B, the support unit 3050 includes a cylindrical member 3051 and fixing members 3052 and 3053. The cylindrical member 3051 has a generally circular cross-sectional form. The fixing member 3052 has a generally L-shaped cross-sectional form and is fixed upon an outer peripheral surface 3051A and a bottom surface 3051B of the cylindrical member 3051 at the side of a first end 3511 of the cylindrical member 3051. Further, the fixing member 3053 has a generally L-shaped cross-sectional form and is fixed upon the outer peripheral surface 3051A and the bottom surface 3051B of the cylindrical member 3051 at the side of a first end 3511 of the cylindrical member 3051 in symmetry with the fixing member 3052. As a result, there is formed a space part 3054 in the region surrounded by the cylindrical member 3051 and the fixing members 3052 and 3053.

The conduit 3200 has a generally circular cross-sectional form and is disposed inside the cylindrical member 3051. In this case, the bottom surface 3200A of the conduit 3200 is disposed so as to face the bottom surface 3051B of the cylindrical member 3051. Further, plural apertures 3201 are formed on the bottom surface 3260A of the conduit 3200. Thus, the nitrogen gas supplied to the conduit 3200 hits the bottom surface 3051B of the cylindrical member 3051 via the plural apertures 3201.

The thermocouple 3210 is disposed inside the cylindrical member 3051 such that a first end 3210A thereof is adjacent to the bottom surface 3051B of the cylindrical member 3051. Reference should be made to FIG. 79A.

Further, the seed crystal 3005 has a shape that fits the space 3054 and is held by the support unit 3050 by being fitted into the space 3054. In the present case, the seed crystal 3005 makes a contact with the bottom surface 3051B of the cylindrical member 3051. Reference should be made to FIG. 79B.

Thus, a high thermal conductivity is secured between the seed crystal 3005 and the cylindrical member 3051. As a result, it becomes possible to detect the temperature of the seed crystal 3005 by the thermocouple 3210 and it becomes also possible to cool the seed crystal 3005 easily by the nitrogen gas directed to the bottom surface 3051B of the cylindrical member 3051 from the conduit 3200.

Figure 80:
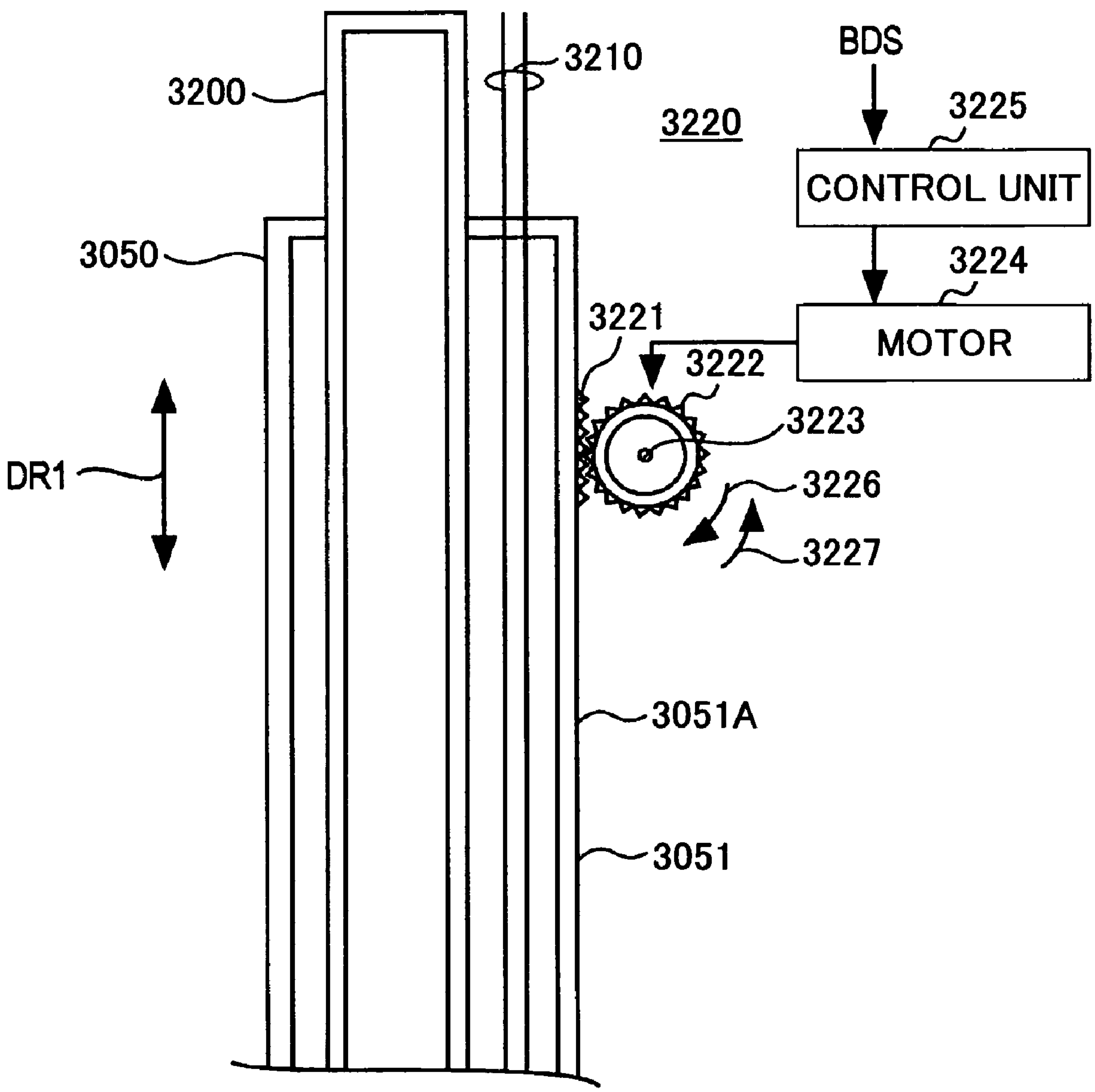
FIG. 80 is a schematic diagram showing the construction of the up/down mechanism shown in FIG. 76.

FIG. 80 is a schematic diagram showing the construction of the up/down mechanism 3220 shown in FIG. 76.

Referring to FIG. 80, the up/down mechanism 3220 comprises a toothed member 3221, a gear 3222, a shaft member 3223, a motor 3224 and a control unit 3225.

The toothed member 3221 has a generally triangular cross-sectional shape and is fixed upon the outer peripheral surface 3051A of the cylindrical member 3051. The gear 3222 is fixed upon an end of the shaft member 3223 and meshes with the toothed member 3221. The shaft member 3223 has the foregoing end connected to the gear 3222 and the other end connected to a shaft (not shown) of the motor 3224.

The motor 3224 causes the gear 3222 to rotate in the direction of an arrow 3222 or an arrow 3227 in response to control from the control unit 3225. The control unit 3225 controls the motor 3222 based on the vibration detection signal BDS from the vibration detection unit 3240 and causes the gear 3224 to rotate in the direction of the arrow 3226 or 3227.

When the gear 3222 is rotated in the direction of the arrow 3226, the support unit 3050 moves in the upward direction in terms of the gravitational direction DR1, while when the gear 3222 is rotated in the direction of the arrow 3227, the support unit 3050 is moved downward in terms of the gravitational direction DR1.

Thus, rotation of the gear 3222 in the direction of the arrow 3226 or 3227 corresponds to a movement of the support unit 3050 up or down in terms of the gravitational direction DR1.

Figure 81:
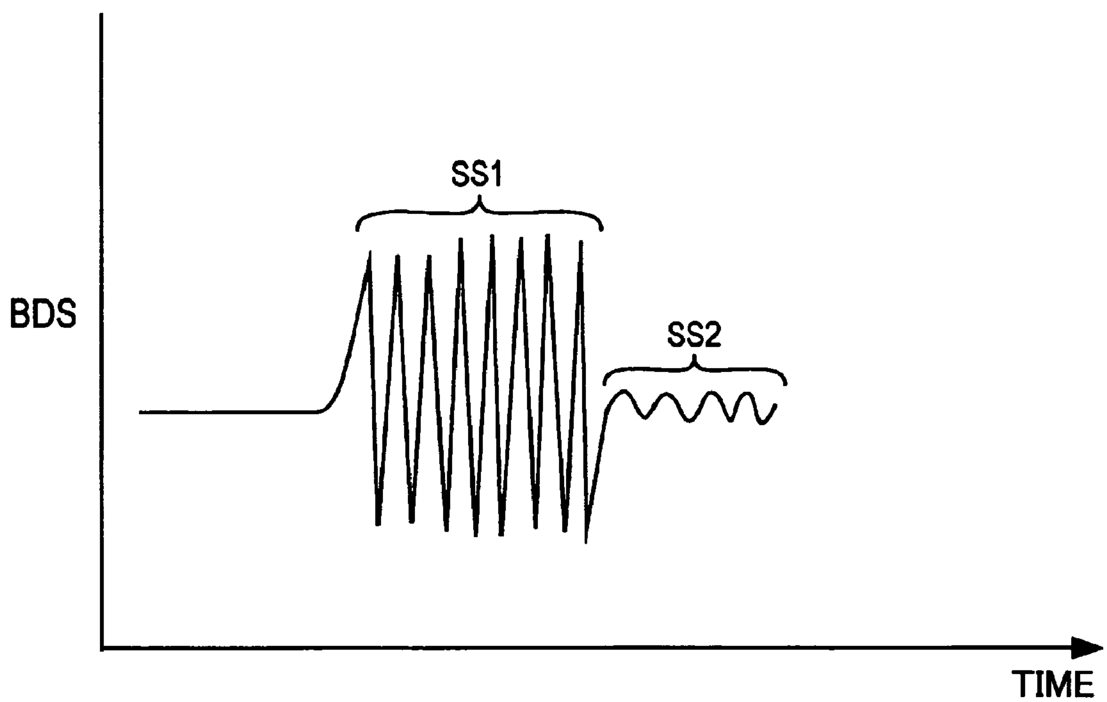
FIG. 81 is a timing chart showing the waveform of a vibration detection signal.

FIG. 81 is a timing chart of the vibration detection signal BDS.

Referring to FIG. 81, the vibration detection signal BDS detected by the vibration detection unit 3240 is formed of the signal component SS1 in the case the seed crystal 3005 is not in contact with the melt mixture 3290 while the vibration detection signal changes to the signal component SS2 when the seed crystal 3005 has made a contact with the melt mixture 3290.

In the event the seed crystal 3005 is not in contact with the melt mixture 3290, the seed crystal 3005 is vibrated vigorously by the vibration applied by the vibration application unit 3230 and the vibration detection signal BDS is formed of the signal component SS1 of relatively large amplitude. When the seed crystal 5 is in contact with the melt mixture 3290, the seed crystal 3005 cannot vibration vigorously even when the vibration is applied from the vibration application unit 3230 because of viscosity of the melt mixture 3290, and thus, the vibration detection signal BDS is formed of the signal component SS2 of relatively small amplitude.

Referring to FIG. 80, again, the control unit 3225 detects, upon reception of the vibration detection signal from the vibration detection unit 3240, the signal component in the vibration detection signal BDS. Thus, when the detected signal component is the signal component SS1, the control unit 3225 controls the motor 3224 such that the support unit 3050 is lowered in the gravitational direction DR1, until the signal component SS2 is detected for the signal component of the vibration detection signal BDS.

More specifically, the control unit 3225 controls the motor 3224 such that the gear 3222 is rotated in the direction of the arrow 3227, and the motor 3224 causes the gear 3222 in response to the control from the controller 3225 to rotate in the direction of the arrow 3227 via the shaft member 3223. With this, the support member 3050 moves in the downward direction in terms of the gravitational direction.

Further, the control unit 3225 controls the motor 3224 such that the rotation of the gear 3222 is stopped when the signal component of the vibration detection signal BDS received from the vibration detection unit 3240 has changed from the signal component SS1 to the signal component SS2, and the motor 3224 stops the rotation of the gear 3222 in response to the control from the control unit 3225. With this, the support unit 3050 stops the movement thereof and the seed crystal 3005 is held at the vapor-liquid interface 3003.

On the other hand, the control unit 3225 controls the motor 3224, when received the vibration detection signal BDS formed of the signal component SS2 from the vibration detection unit 3240, such that the movement of the support unit 3050 is stopped.

Thus, the up/down mechanism 3220 moves the support unit 3050 in the gravitational direction DR1 based on the vibration detection signal BDS detected by the vibration detection unit 3240, such that the seed crystal 3005 is in contact with the melt mixture 3290.

Figure 82:
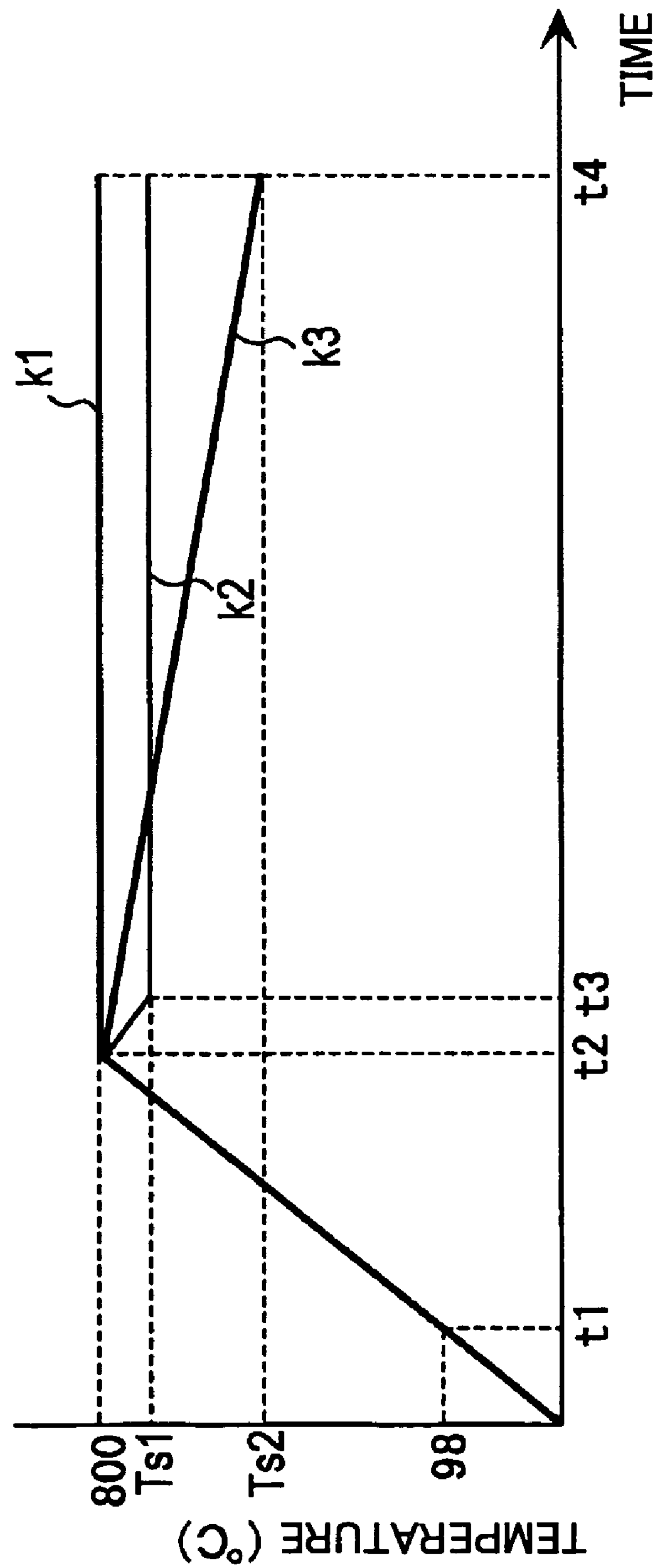
FIG. 82 is a timing chart showing the temperature of the crucible and the inner reaction vessel.
Figure 83:
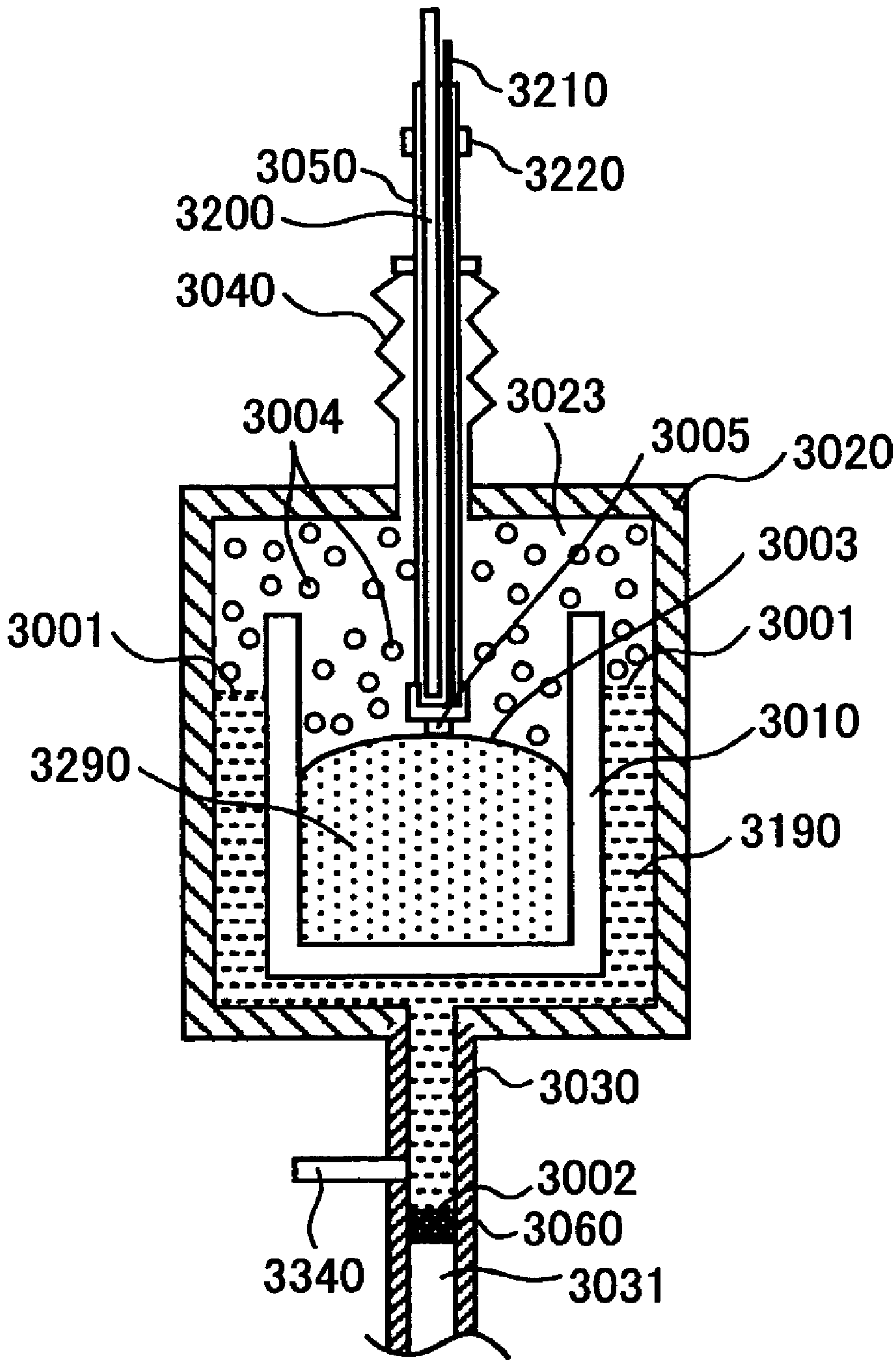
FIG. 83 is a schematic diagram showing the state inside the crucible and the inner reaction vessel during the interval between two timings t1 and t2 shown in FIG. 82.
Figure 84:
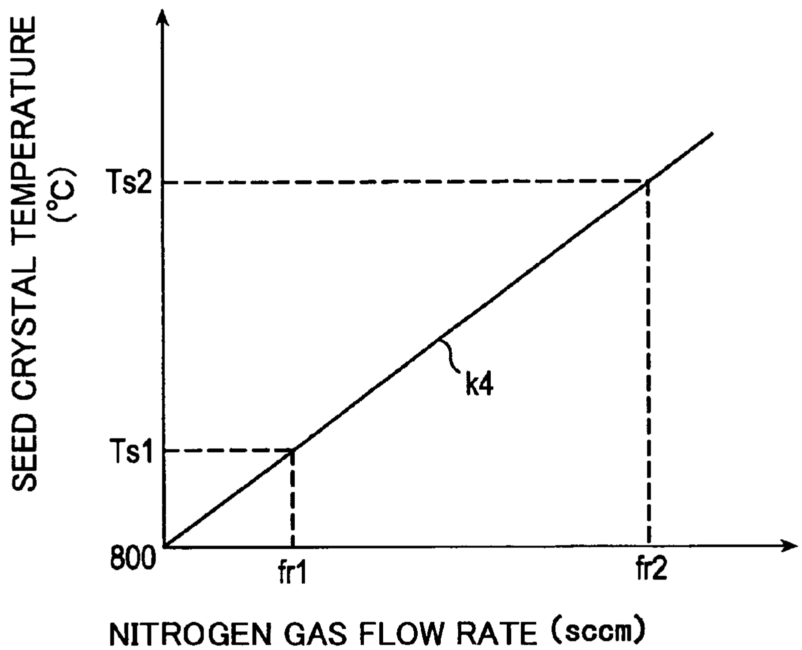
FIG. 84 is a diagram showing the relationship between the temperature of the seed crystal and the flow rate of the nitrogen gas.

FIG. 82 is a timing chart showing the temperature of the crucible 3010 and the inner reaction vessel 3020. Further, FIG. 83 is a schematic diagram showing the state inside the crucible 3010 and the inner reaction vessel 3020 during the interval between two timings t1 and t2 shown in FIG. 82. Further, FIG. 84 is a diagram showing the relationship between the temperature of the seed crystal 3005 and the flow rate of the nitrogen gas.

In FIG. 82, it should be noted that the line k1 represents the temperature of the crucible 3010 and the inner reaction vessel 3020 while the curve k2 and the line k3 represent the temperature of the seed crystal 3005.

Referring to FIG. 82, the heating units 3070 and 3080 heat the crucible 3010 and the inner reaction vessel 3020 such that the temperature rises along the line k1 and is held at 800° C. When the heating units 3070 and 3080 start to heat the crucible 3010 and the inner reaction vessel 3020, the temperature of the crucible 3010 and the inner reaction vessel 3020 start to rise and reaches a temperature of 98° C. at the timing t1 and a temperate of 800° C. at the timing t2.

With this, the metal Na held in the crucible 3010 and the inner reaction vessel 3020 undergoes melting and the metal melt 3190 (=metal Na liquid) is formed. Further, the nitrogen gas 3023 inside the space 3004 cannot escape to the space 3030 inside the conduit 3031 through the metal melt 3190 (=metal Na melt) and the stopper/inlet plug 3060, and the nitrogen gas 3023 is confined in the space 2023. Reference should be made to FIG. 83.

Further, during the interval from the timing t1 in which the temperature of the crucible 3010 and the inner reaction vessel 3020 reaches 98° C. to the timing t2 in which the temperature reaches 800° C., it should be noted that the up/down mechanism 3220 moves the support unit 3050 up or down according to the method explained above in response to the vibration detection signal BDS from the vibration detection unit 3240 and maintains the seed crystal 3005 in contact with the melt mixture 3290.

When the temperature of the crucible 3010 and the inner reaction vessel 3020 has reached 800° C., the nitrogen gas 3004 in the space 3023 is incorporated into the melt mixture 3290 via the metal Na. In this case, it should be noted that the concentration of nitrogen or GaxNy (x, y are real numbers) in the melt mixture 3290 takes the maximum value in the vicinity of the vapor-liquid interface 3003 between the space 3023 and the melt mixture 3290, and thus, growth of the GaN crystal starts from the seed crystal 3005 in contact with the vapor-liquid interface 3003. Hereinafter, GaxNy will be designated as "group III nitride" and the concentration of GaxNy will be designated as "concentration of group III nitride".

In the case the nitrogen gas is not supplied to the conduit 3200, the temperature T3 of the seed crystal 3005 is 800° C. and is equal to the temperature of the melt mixture 3290, while in Embodiment 13, the seed crystal 3005 is cooled by supplying a nitrogen gas to the inside of the conduit 3200 for increasing the degree of supersaturation of nitrogen in the melt mixture 2410 in the vicinity of the seed crystal 3005. Thus, the temperature T3 of the seed crystal 3005 is set lower than the temperature of the melt mixture 3290.

More specifically, the temperature T3 of the seed crystal 3005 is set to a temperature Ts1 lower than 800° C. along the curve k2 after the timing t2. This temperature Ts1 may be the temperature of 790° C. Next, the method of setting the temperature T3 of the seed crystal 3005 to the temperature Ts1 will be explained.

When the temperatures T1, T2 and T3 as measured by the temperature sensors 3071 and 3081 and the thermocouple 3210 have reached the temperature to set the temperature of the seed crystal 3005 and the melt mixture 3290 to 800° C., the temperature control unit 3280 produces a control signal CTL3 for causing to flow a nitrogen gas with an amount such that the temperature T3 of the seed crystal 3005 is set to the temperature Ts1, and supplies the control signal CTL3 to the flow meter 3260.

With this, the flow meter 3260 causes to flow a nitrogen gas from the gas cylinder 3270 to the conduit 3200 via the gas supply line 3250 in response to the control signal CTL3 with a flow rate determined such that the temperature T3 is set to the temperature Ts1. Thus, the temperature of the seed crystal 3005 is lowered from 800° C. generally in proportion to the flow rate of the nitrogen gas, and the temperature T3 of the seed crystal 3005 is set to the temperature Ts1 when the flow rate of the nitrogen gas has reaches a flow rate value fr1 (sccm). Reference should be made to FIG. 84.

Thus, the flow meter 3260 causes the nitrogen gas to the conduit 3200 with the flow rate value fr1. The nitrogen gas thus supplied to the conduit 3200 hits the bottom surface 3051B of the cylindrical member 3051 via the plural apertures 3201 of the conduit 3200.

With this, the seed crystal 3005 is cooled via the bottom surface 3051B of the cylindrical member 3051 and the temperature T3 of the seed crystal 3005 is lowered to the temperature Ts1 with the timing t3. Thereafter, the seed crystal 3005 is held at the temperature Ts1 until a timing t4.

Because the heater temperatures T1 and T2 of the heating units 3070 and 3080 have a predetermined temperature difference to the temperature of the melt mixture 3290, the temperature control unit 3280 controls the heating units 3070 and 3080, when the temperature T3 of the seed crystal 3005 starts to go down from 800° C., by using the control signals CTL1 and CTL2 such that the temperatures T1 and T2 as measured by the temperature sensors 3071 and 3081 become the temperatures in which the temperature of the melt mixture 3290 is set to 800° C.

With Embodiment 13, it is preferred that the temperature T3 of the seed crystal 3005 is controlled, after the timing t2, such that the temperature is lowered along the line k3. Thus, the temperature T3 of the seed crystal 3005 is lowered from 800° C. to the temperature Ts2 (<Ts1) during the interval from the timing t2 to the timing t4. In this case, the flow meter 3260 increases the flow rate of the nitrogen gas supplied to the conduit 3200 from 0 to a flow rate value fr2 along a line k4 based on the control signal CTL3 from the temperature control unit 3280. When the flow rate of the nitrogen gas has become the flow rate value fr2, the temperature T3 of the seed crystal 3005 is set to a temperature Ts2 lower than the temperature Ts1. The temperature Ts2 may be chosen to 750° C.

Thus, by increasing the temperature difference between the temperature of the melt mixture 3290 (=800° C.) and the temperature T3 of the seed crystal 3005 gradually, the degree of supersaturation for nitrogen or the group III nitride in the melt mixture 3290 increases gradually in the vicinity of the seed crystal 3005, and it becomes possible to increase the growth rate of the GaN crystal with crystal growth of the GaN crystal.

Figure 85:
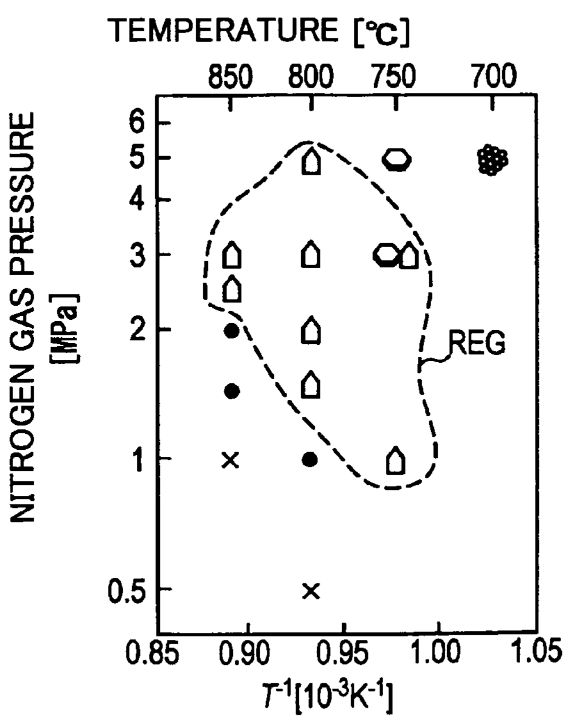
FIG. 85 is a diagram showing the relationship between the nitrogen gas pressure and the crystal growth temperature for the case of growing a GaN crystal.

In the case of growing a GaN crystal with the crystal growth apparatus 3100, a GaN crystal grown in the crystal growth apparatus 3100 without using the seed crystal 3005 is used for the seed crystal 3005. FIG. 85 is a diagram showing the relationship between the nitrogen gas pressure and the crystal growth temperature for the case of growing a GaN crystal. In FIG. 85, the horizontal axis represents the crystal growth temperature while the vertical axis represents the nitrogen gas pressure. In FIG. 85, it should be noted that a region REG represents a region in which there occurs extensive nucleation at the bottom surface and sidewall surface of the crucible 3010 contacting with the melt mixture 3290 held in the crucible 3010 and there are formed columnar GaN crystals grown in a c-axis direction (<0001> direction).

Thus, in the case of manufacturing the seed crystal 3005, GaN crystals are grown by using the nitrogen gas pressure and crystal growth temperature of the region REG. In this case, numerous nuclei are formed on the bottom surface and sidewall surface of the crucible 3010 and columnar GaN crystals grown in the c-axis direction are obtained.

Further, the seed crystal 3005 is formed by slicing out the GaN crystal of the shape shown in FIGS. 79A and 79B from the numerous GaN crystals formed as a result of the crystal growth process. Thus, a projecting part 3005A of the seed crystal 3005 shown in FIG. 79B is formed of a GaN crystal grown in the c-axis direction (<0001> direction).

The seed crystal 3005 thus formed is fixed upon the support unit 3050 by fitting into the space 3054 of the support unit 3050.

Figure 86:
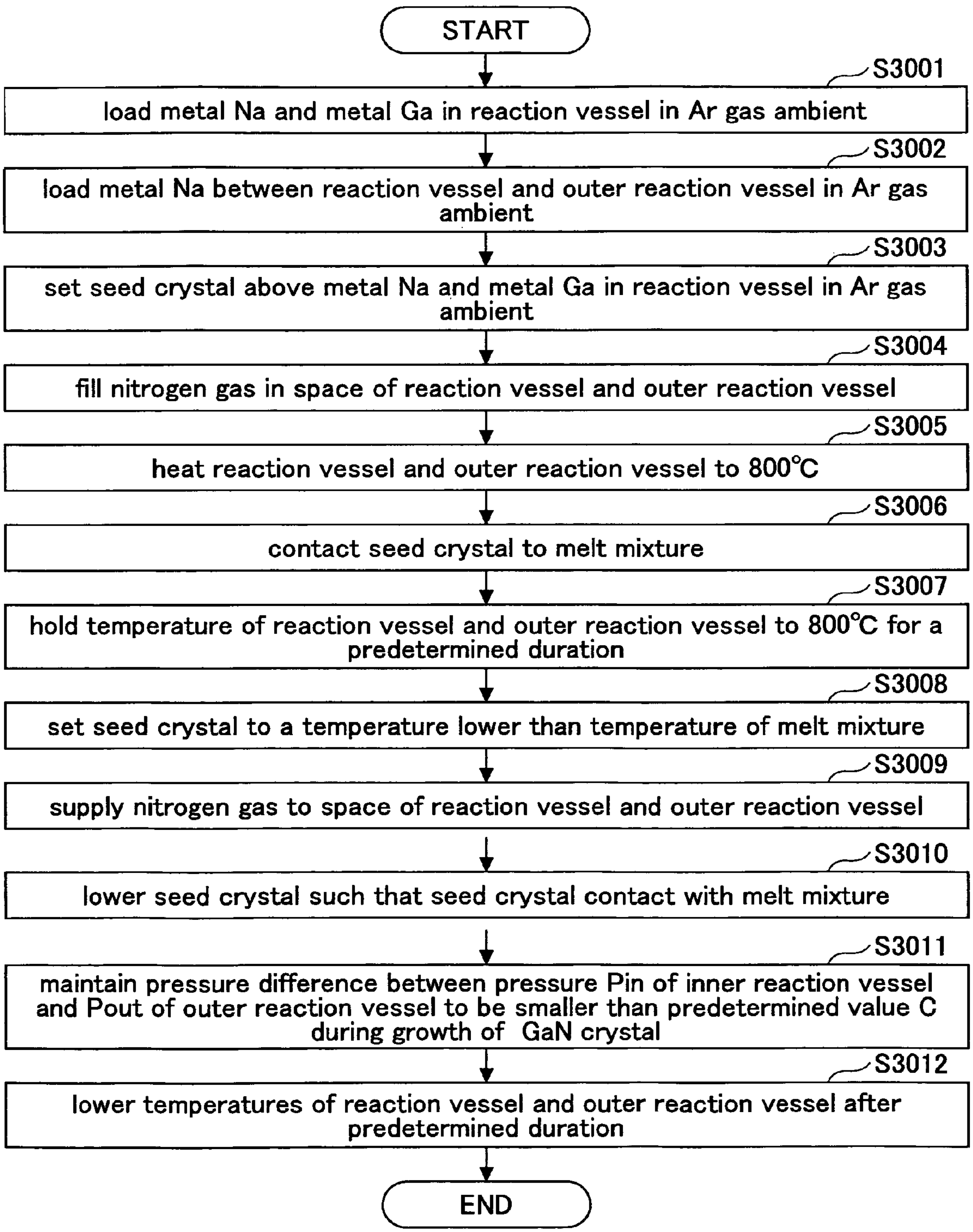
FIG. 86 is a flowchart explaining the manufacturing method of a GaN crystal according to Embodiment 13 of the present invention.

FIG. 86 is a flowchart explaining the manufacturing method of a GaN crystal according to Embodiment 13 of the present invention.

Referring to FIG. 86, the crucible 3010 and the inner reaction vessel 3020 are incorporated into a glove box filled with an Ar gas when a series of processes are started. Further, metal Na and metal Ga are loaded into the crucible 3010 in an Ar gas ambient (Step S3001). In the present case, the metal Na and the metal Ga are loaded into the crucible 3010 with a molar ratio of 5:5. The Ar gas should be the one having a water content of 10 ppm or less and an oxygen content of 10 ppm or less (this applied throughout the present invention).

Further, the metal Na is loaded between the crucible 3010 and the inner reaction vessel 3020 in the ambient of an Ar gas (step S3002). Further, the seed crystal 3005 is set in the ambient of the Ar gas at a location above the metal Na and the metal Ga in the crucible 3010 (step S3003). More specifically, the seed crystal 3005 is set above the metal Na and metal Ga in the crucible 3010 by fitting the seed crystal 3005 to the space 3054 formed at the end 3511 of the support unit 3050. Reference should be made to FIG. 79B.

Next, the crucible 3010 and the reaction vessel 3020 are set in the crystal growth apparatus 3100 in the state that the crucible 3010 and the reaction vessel 3020 are filled with the Ar gas.

Next, the valves 3160 and 3390 are opened and the Ar gas filled in the crucible 3010, the inner reaction vessel 3020 and the outer reaction vessel 3300 is evacuated by the vacuum pump 3170. After evacuating the interior of the crucible 3010, the inner reaction vessel 3020 and the outer reaction vessel 3300 to a predetermined pressure (0.133 Pa or lower) by the vacuum pump 3170, the valves 3160 and 3390 are closed and the valves 3120, 3320 and 3330 are opened. Thereby, the crucible 3010, the inner reaction vessel 3020 and the outer reaction vessel 3300 are filled with the nitrogen gas from the gas cylinder 3140 via the gas supply lines 3090, 3110 and 3310. In this case, the nitrogen gas is supplied to the crucible 3010, the inner reaction vessel 3020 and further to the outer reaction vessel 3300 via the pressure regulator 3130 such that the pressure inside the crucible 3010, the inner reaction vessel 3020 and the outer reaction vessel 3300 becomes about 0.1 MPa.

Further, when the pressure inside the inner reaction vessel 3020 as detected by the pressure sensor 3180 and the pressure inside the outer reaction vessel 3300 as detected by the pressure sensor 3350 has reached about 0.1 MPa, the valves 3120 and 3330 are closed and the valves 3160 and 3390 are opened. With this, the nitrogen gas filled in the crucible 3010, the inner reaction vessel 3020 and the outer reaction vessel 3300 is evacuated by the vacuum pump 3170. In this case, too, the interiors of the crucible 3010, the inner reaction vessel 3020 and the outer reaction vessel 3300 are evacuated to a predetermined pressure (0.133 Pa or less) by using the vacuum pump 3170.

Further, this vacuum evacuation of the crucible 3010, the inner reaction vessel 3020 and the outer reaction vessel 3300 and filling of the nitrogen to the crucible 3010, the inner reaction vessel 3020 and the outer reaction vessel 3300 are repeated several times.

Thereafter, the interiors of the crucible 3010, the inner reaction vessel 3020 and the outer reaction vessel 3300 are evacuated to a predetermined pressure by the vacuum pump 3170, and the valve 3160 and 3390 are closed. Further, the valves 3120, 3320 and 3330 are opened and the nitrogen gas is filled into the crucible 3010, the inner reaction vessel 3020 and the outer reaction vessel 3300 by the pressure regulator 3130 such that the pressure of the crucible 3010, the inner reaction vessel 3020 and the outer reaction vessel 3300 becomes a pressure of the range of 1.01-5.05 MPa (step S3004).

Because the metal Na between the crucible 3010 and the inner reaction vessel 3020 is solid in this state, the nitrogen gas is supplied to the space 3023 inside the inner reaction vessel 3020 also from the space 3031 of the conduit 3030 via the stopper/inlet plug 3060. When the pressure of the space 3023 as detected by the pressure sensor 3180 has become 1.01-5.05 Pa, the valve 3120 is closed.

Thereafter, the crucible 3010 and the inner the reaction vessel 3020 are heated to 800° C. by the heating units 3070 and 3080 (step S3005). In this process of heating the crucible 3010 and the inner reaction vessel 3020 to 800° C., the metal melt Na held between the crucible 3010 and the inner reaction vessel 3020 undergoes melting in view of the melting temperature of metal Na of about 98° C., and the metal melt 3190 is formed. Thereby, two vapor-liquid interfaces 3001 and 2 are formed. Reference should be made to FIG. 76. The vapor-liquid interface 3001 is located at the interface between the metal melt 3190 and the space 3023 in the inner reaction vessel 3020, while the vapor-liquid interface 3002 is located at the interface between the metal melt 3190 and the stopper/inlet plug 3060.

At the moment the temperature of the crucible 3010 and the inner reaction vessel 3020 is raised to 800° C., the temperature of the stopper/inlet plug 3060 becomes 150° C. This means that the vapor pressure of the metal melt 3190 (=metal Na melt) at the vapor-liquid interface 3002 is $7.6\times10^{-4}$Pa, and thus, there is caused little evaporation of the metal melt 3190 (=metal Na melt) through the gaps 3063 of the stopper/inlet plug 3060. As a result, there occurs little decrease of the metal melt 3190 (=metal Na melt).

Further, even when the temperature of the stopper/inlet plug 3060 is raised to 300° C. or 400° C., the vapor pressure of the metal melt 3190 (=metal Na melt) is only 1.8 Pa and 47.5 Pa, respectively, and decrease of the metal melt 3190 (=metal Na melt) by evaporation is almost ignorable with such a vapor pressure.

Thus, with the crystal growth apparatus 3100, the temperature of the stopper/inlet member 3060 is set to a temperature such that there occurs little decrease of the metal melt 3190 (=metal Na melt) by way of evaporation.

Further, during the step in which the crucible 3010 and the inner reaction vessel 3020 are heated to 800° C., the metal Na and the metal Ga inside the crucible 3010 becomes a liquid, and the melt mixture 3290 of metal Na and metal Ga are formed in the crucible 10. Next, the up/down mechanism 3220 causes the seed crystal 3005 to make a contact with the melt mixture 3290 (step S3073).

Further, when the temperature of the crucible 3010 and the inner reaction vessel 3020 is elevated to 800° C., the nitrogen gas in the space 3023 is incorporated into the melt mixture 3290 via the mediating, and there starts the growth of GaN crystal from the seed crystal 3005.

Thereafter, the temperature of the crucible 3010 and the inner reaction vessel 3020 is held at 800° C. for a predetermined duration (several ten hours to several hundred hours) (step S3007), and the temperature T3 of the seed crystal 3005 is set to the temperature Ts1 (or Ts1) lower than the temperature of the melt mixture 3290 (=800° C.) according to the method explained above.

Thus, with progress of growth of the GaN crystal, the nitrogen gas in the space 3023 is consumed and there is caused a decrease of the nitrogen gas in the space 3023. Then the pressure P1 of the space 3023 becomes lower than the pressure P2 of the space 3030 inside the conduit 3031 (P1<P2), and there is formed a differential pressure between the space 3023 and the space 3031. Thus, the nitrogen gas in the space 3031 is supplied to the space 3023 consecutively via the stopper/inlet plug 3060 and the metal melt 3190 (=metal Na melt) (step S3009).

Thereafter, the seed crystal 3005 is lowered so as to make a contact with the melt mixture 3290 according to the method explained above (step S3010). With this a GaN crystal of large size is grown.

Further, during the growth of the GaN crystal, the pressure difference between the pressure Pin inside the inner reaction vessel 3020 and the pressure Pout inside the outer reaction vessel 3300 is set to a value smaller than the predetermined value C (step S3011). After the predetermined time has elapsed, the temperatures of the crucible 3010 and the reaction vessel 3020 are lowered (step S3012), and manufacturing of the GaN crystal is completed.

Figure 87:
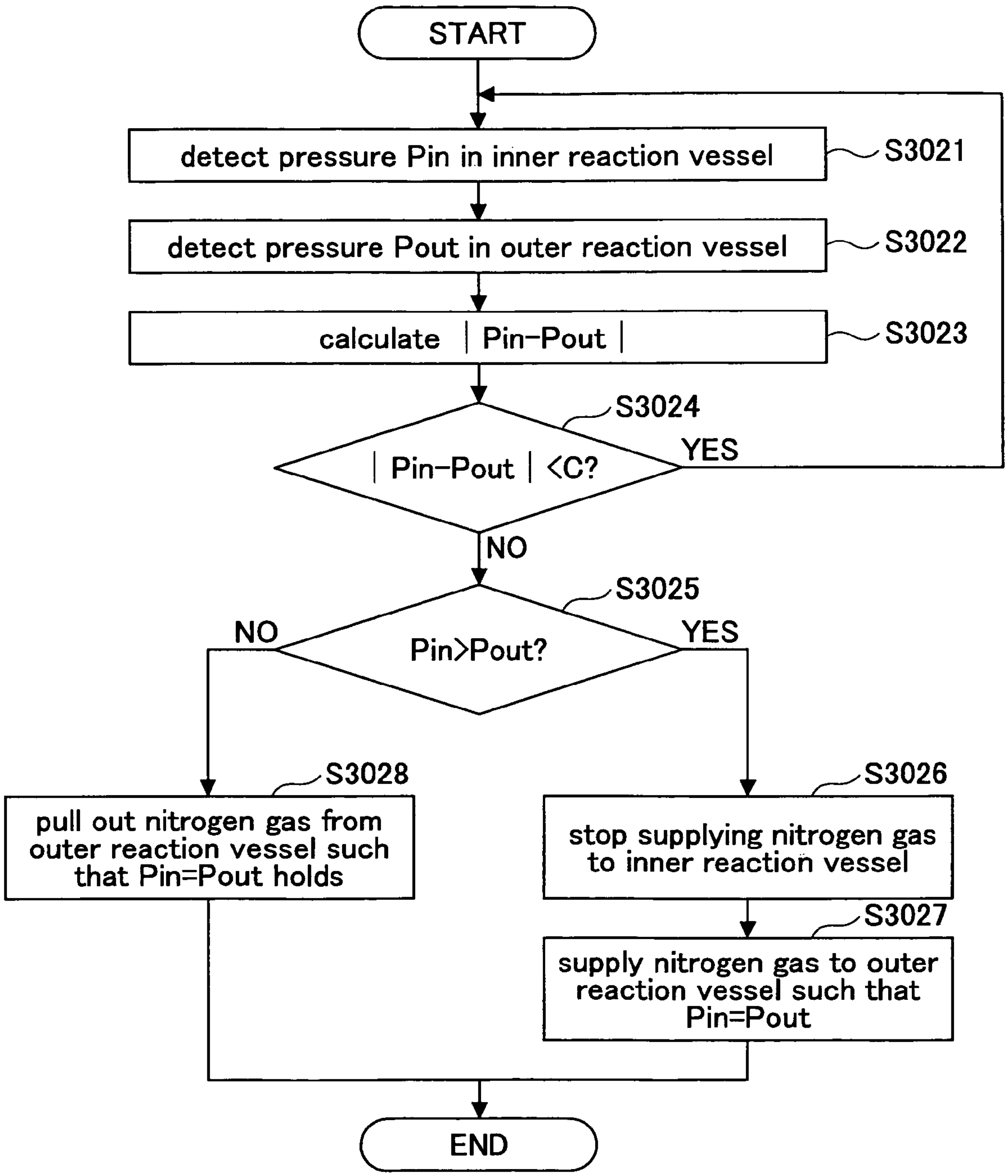
FIG. 87 is a flowchart explaining the detailed operation of the step S3011 in the flowchart shown in FIG. 86.

FIG. 87 is a flowchart explaining the detailed operation of the step S3011 in the flowchart shown in FIG. 86;

Referring to FIG. 87, the pressure sensor 3340 detects the hydrostatic pressure of the metal melt 3190 and outputs the detected hydrostatic pressure Ps to the controller 3370.

The controller 3370 converts the hydrostatic pressure Ps from the pressure sensor 3340 to the pressure Pin of the interior of the inner reaction vessel 3020 by applying a proportional constant. With this, the pressure Pin inside the inner reaction vessel 3020 is detected (step S3021).

Further, the pressure sensor 3350 detects the pressure Pout inside the outer reaction vessel 3300 and provides the detected pressure Pout to the controller 3370.

Further, the controller 3370 calculates the absolute value of the pressure difference between the pressure Pin and the pressure Pout as |Pin−Pout| based on the pressures Pin and Pout, and judges whether or not the calculated absolute value |Pin−Pout| is smaller than a predetermined value C (step S3024).

When the absolute value |Pin−Pout| is smaller than the predetermined value C, the steps S3021-S33024 are repeated.

On the other hand, when it is judged in the step S3024 that the absolute value |Pin−Pout| is equal to or larger than the predetermined value C, the controller judges whether or not the pressure Pin is higher than the pressure Pout (step S3025).

Further, when it is judged that the pressure Pin is higher than the pressure Pout, the controller 3370 produces the control signal CTL3005 for closing the valve 3330 and supplies the control signal CTL3005 to the valve 3330. The valve 3330 is closed in response to the control signal CTL5 from the controller 3370. With this, supply of the nitrogen gas to the inner reaction vessel 3020 is stopped (step S3026).

Thereafter, the controller 3370 produces the control signal CTL7 for pressurizing the interior of the outer reaction vessel 3300 to a pressure generally coincident to the pressure Pin and supplies the produced control signal CTL7 to the pressure regulator 3130. The pressure regulator 3130 then pressurizes the interior of the outer reaction vessel 3300 by the nitrogen gas in response to the control signal CTL7 from the controller 3370. With this, the nitrogen gas is supplied to the outer reaction vessel 3300 such that the pressure Pout generally coincides with the pressure Pin (step S3027).

On the other hand, in the step S3025, the controller 3370 produces the control signal CTL4 for closing the valve 3320 and the control signal CTL6 for opening the valve 3360 when the pressure Pin is judged to be lower than the pressure Pout, and the control signals CTL4 and CTL6 thus produced are supplied respectively to the valves 3320 and 3360.

Thus, the valve 3320 is closed in response to the control signal CTL4 from the controller 3370 while the valve 3360 is opened in response to the control signal CTL6 from the controller 3370. Thereafter, when the pressure Pout has become generally equal to the pressure Pin, the controller 3370 produces the control signal CTL6 for closing the valve S3360 and supplies the same to the valve 3360. The valve 3360 is then closed in response to the control signal CTL6 from the controller 3370. With this, the nitrogen gas in the outer reaction vessel 3300 is extracted such that the relationship Pin=Pout holds (step S3028).

After the steps S3027 and S3026, a series of operations is completed. In the steps S3021-S3028 it should be noted that the pressure Pin inside the inner reaction vessel 3020 is maintained.

Thus, as explained heretofore, the controller 3370 controls, in the event the absolute value |Pin−Pout| is larger than the predetermined value C, such that the pressure Pin generally coincides with the pressure Pout, irrespective of which of the pressure Pin and the pressure Pout is higher (see steps S3027 and S3028).

Further, the controller 3370 carries out the control such that the pressure Pin generally coincides with the pressure Pout by pressurizing or depressurizing the outer reaction vessel 3300 while maintaining the pressure Pin inside the inner reaction vessel 3020. It should be noted that the controller 3370 does not perform the operation of changing the state inside the inner reaction vessel 3020 such as supplying the nitrogen gas to the interior of the inner reaction vessel 3020 of extract the nitrogen gas from the inner reaction vessel 3020.

Thus, the controller 3370 carries out the operation such that the crystal growth of the GaN crystal in the inner reaction vessel 3020 is conducted continuously.

Thus, by using the crystal growth apparatus 3100, it is possible to grow the GaN crystal stably.

Further, with the crystal growth apparatus 3100, the GaN crystal is grown in the state that the seed crystal 3005 is contacted to the melt mixture 3290. Thus, nucleation in the region other than the seed crystal 3005 is suppressed, and the growth of the GaN crystal occurs preferentially from the seed crystal 3005. As a result, it becomes possible to grow a GaN crystal of large size. This GaN crystal is a defect-free crystal having a columnar shape grown in the c-axis direction (<0001> direction).

Further, with crystal growth apparatus 3100, the growth of the GaN crystal is made while setting the temperature T3 of the seed crystal 3005 to be lower than the crystal growth temperature (=800° C.). Thus, it becomes possible to increase the degree of supersaturation of nitrogen or the group III nitride in the melt mixture in the vicinity of the seed crystal 3005, and the GaN crystal is grown preferentially from the seed crystal 3005. Further, it becomes possible to increase to the growth rate of the GaN crystal.

Further, because the seed crystal 3005 is lowered by the up/down mechanism 3220 with growth of the GaN crystal such that contact of the seed crystal 3005 to the melt mixture 3290 is maintained, it becomes possible to maintain the state in which the growth of the GaN crystal occurs preferentially from the seed crystal 5. As a result, it becomes possible to grow a GaN crystal of large size.

Further, while it has been explained that the height H of the projection 362 of the stopper/inlet plug 3060 and the separation d between the projections 3062 are explained as several ten microns, it is possible that the height H of the projection 3062 and the separation d between the projections 3062 may be determined by the temperature of the stopper/inlet plug 3060. In this case, when the temperature of the stopper/inlet plug 3060 is relatively high, the height H of the projection 3062 is set relatively lower and the separation d between the projections 3062 is set relatively smaller. Further, when the temperature of the stopper/inlet plug 3060 is relatively low, the height H of the projection 3062 is set relatively high and the separation d between the projections 3062 is set relatively larger. Thus, in the case the temperature of the stopper/inlet plug 3060 is relatively high, the size of the gap 3063 between the stopper/inlet plug 3060 and the conduit 3030 is set relatively small, while in the case the temperature of the stopper/inlet plug 3060 is relatively high, the size of the gap 3063 between the stopper/inlet plug 60 and the conduit 3030 is set relatively larger.

It should be noted that the size of the cap 3063 is determined by the height H of the projection 3062 and the separation d between the projections 3062, while the size of the gap 3063 capable of holding the metal melt 3190 by the surface tension changes depending on the temperature of the stopper/inlet plug 3060. Thus, the height H of the projection 3062 and the separation d between the projections 3062 are changed depending on the temperature of the stopper/inlet plug 3060 and with this, the metal melt 3190 is held reliably by the surface tension.

The temperature control of the stopper/inlet valve 3060 is achieved by the heating unit 3080. Thus, when the stopper/inlet plug 3060 is to be heated to a temperature higher than 150° C., the stopper/inlet plug 3060 is heated by the heating unit 3080.

While the pressure Pin of the inner reaction vessel 3020 is detected based on the hydrostatic pressure Ps of the melt mixture 3190 detected by the pressure sensor 3340 with the crystal growth apparatus 3100, it should be noted that this reflects merely the situation that there exists no pressure sensor operable at high temperature and can be used for direct detection of the pressure Pin in the inner reaction vessel 3020 heated to the high temperature of 800° C. Because of this, and in view of the fact that the detected hydrostatic pressure Ps is proportional to the pressure Pin inside the space 3023, the present embodiment detects the hydrostatic pressure Ps of the metal melt 3190 of the temperature of about 150° C. and uses the detected hydrostatic pressure Ps for the detection of the pressure Pin. This means that, when a pressure sensor capable of detecting the pressure Pin inside the space 3023 heated to about 800° C. directly is developed, it is possible to use such a pressure sensor and detect the pressure Pin inside the space 3023 directly.

Further, with the present embodiment, the gas cylinder 3140, the gas supply lines 3130, the gas supply lines 3090 and 3110, the conduit 3030, the stopper/inlet plug 3060 and the metal melt 3190 constitute the "gas supply unit".

Further, the pressure regulator 3130, the gas cylinder 3140, the valves 3320 and 3360, the pressure sensors 3340 and 3350 and the controller 3370 constitute the "pressure sustaining unit".

Further, the stopper/inlet plug 3060 constitutes the "melt holding member".

Embodiment 14

Figure 88:
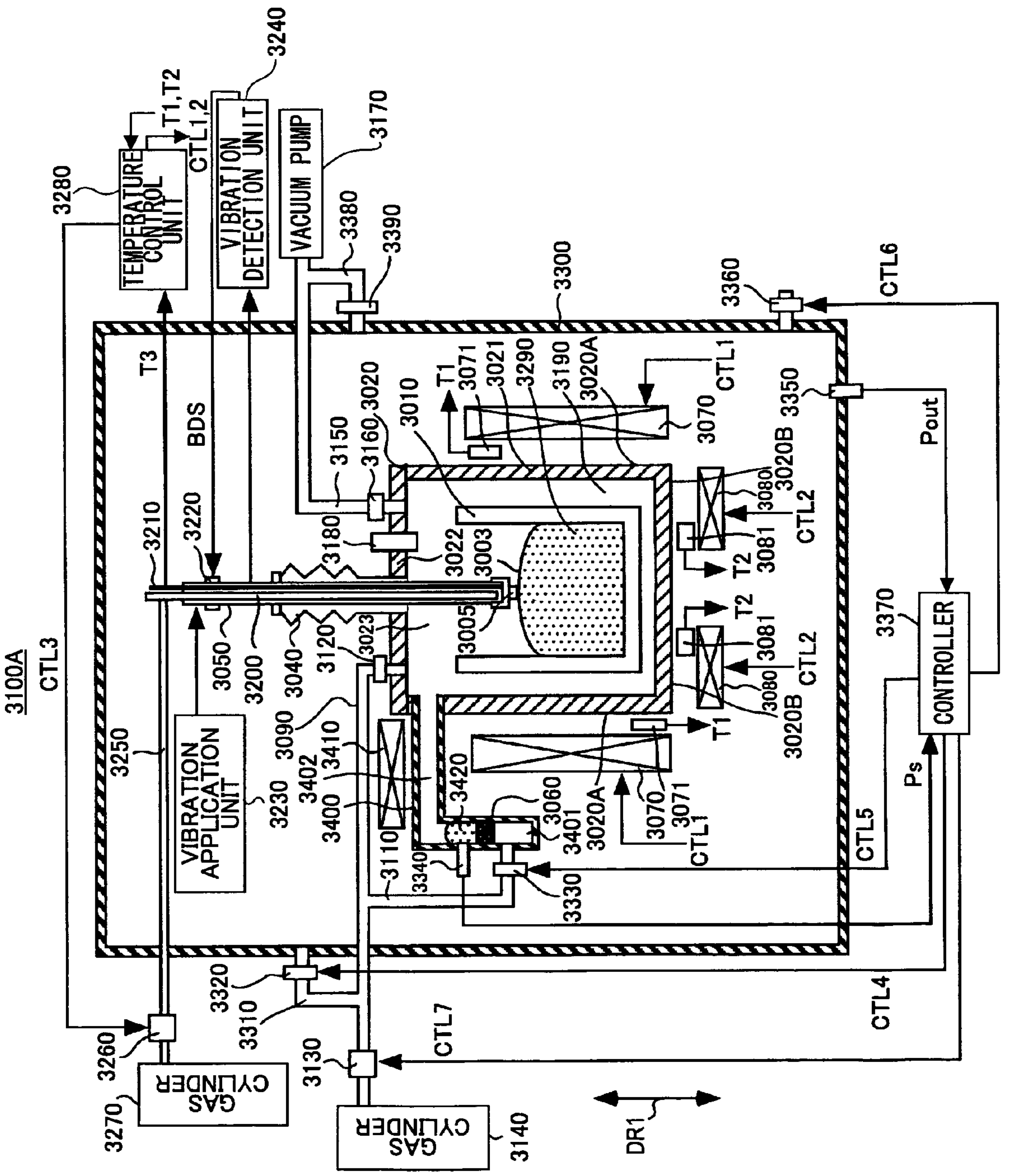
FIG. 88 is a schematic cross-sectional diagram showing the construction of a crystal growth apparatus according to Embodiment 14 of the present invention.

FIG. 88 is a schematic cross-sectional diagram showing the construction of a crystal growth apparatus according to Embodiment 14 of the present invention.

Referring to FIG. 88, the crystal growth apparatus 3100A of Embodiment 14 has a construction similar to that of the crystal growth apparatus 3100 except that the conduit 3030 of the crystal growth apparatus 3100 shown in FIG. 76 is changed to a conduits 3400, the metal melt 3190 is changed to a metal melt 3420, and a heating units 3410 is added.

The conduit 3400 has a generally L-shaped form and has an end connected to the inner reaction vessel 3020 and the other end connected to the gas supply line 3110. Further, the space 3402 of the conduit 3400 communicates with the space 3023 of the inner reaction vessel 3020. The heating unit 3410 is disposed so as to face the conduit 3400 and heats the conduit 3400 to the crystal growth temperature. The metal melt 3420 is held inside of a part of the conduit 3400 disposed in the gravitational direction DR1.

With the crystal growth apparatus 3100A, the stopper/inlet member 3060 is held inside of the part of the conduit 3400 disposed in the gravitational direction DR1. Further, the pressure sensor 3340 is mounted upon the conduit 3400 exposed to the metal melt 3420 wherein the pressure sensor 3340 detects the hydrostatic pressure Ps of the metal melt 3420 and provides the same to the controller 3370. Further, the gas supply line 3110 is connected to the space 3401 of the conduit 3400.

In the case of growing a GaN crystal by using the crystal growth apparatus 3100A, metal Na and metal Ga are loaded into the crucible 3010 in an Ar gas ambient by using a glove box, and the metal Na is loaded into the conduit 3400 in the Ar gas ambient. Further, the seed crystal 3005 is set above the metal Na and the metal Ga loaded to the crucible 3010 in the Ar gas ambient.

Thereafter, the crucible 3010, the inner reaction vessel 3020, the conduit 3400 and the outer reaction vessel 3300 are set in the crystal growth apparatus 3100A in the state that the conduit 3400 and the outer reaction vessel 3300 are filled with the Ar gas.

Next, the valves 3160 and 3390 are opened and the Ar gas filled in the crucible 3010, the inner reaction vessel 3020 and the outer reaction vessel 3300 is evacuated by the vacuum pump 3170. After evacuating the interior of the crucible 3010, the inner reaction vessel 3020 and the outer reaction vessel 3300 to a predetermined pressure (0.133 Pa or lower) by the vacuum pump 3170, the valves 3160 and 3390 are closed and the valves 3120, 3320 and 3330 are opened. Thereby, the crucible 3010, the inner reaction vessel 3020 and the outer reaction vessel 3300 are filled with the nitrogen gas from the gas cylinder 3140 via the gas supply lines 3090, 3110 and 3310. In this case, the nitrogen gas is supplied to the crucible 3010, the inner reaction vessel 3020 and further to the outer reaction vessel 3300 via the pressure regulator 3130 such that the pressure inside the crucible 3010, the inner reaction vessel 3020 and the outer reaction vessel 3300 becomes about 0.1 MPa.

Further, when the pressure inside the inner reaction vessel 3020 as detected by the pressure sensor 3180 and the pressure inside the outer reaction vessel 3300 as detected by the pressure sensor 3350 has reached about 0.1 MPa, the valves 3120 and 3330 are closed and the valves 3160 and 3390 are opened. With this, the nitrogen gas filled in the crucible 3010, the inner reaction vessel 3020 and the outer reaction vessel 3300 is evacuated by the vacuum pump 3170. In this case, too, the interiors of the crucible 3010, the inner reaction vessel 3020 and the outer reaction vessel 3300 are evacuated to a predetermined pressure (0.133 Pa or less) by using the vacuum pump 3170.

Further, this vacuum evacuation of the crucible 3010, the inner reaction vessel 3020 and the outer reaction vessel 3300 and filling of the nitrogen to the crucible 3010, the inner reaction vessel 3020 and the outer reaction vessel 3300 are repeated several times.

Thereafter, the interiors of the crucible 3010, the inner reaction vessel 3020 and the outer reaction vessel 3300 are evacuated to a predetermined pressure by the vacuum pump 3170, and the valve 3160 and 3390 are closed. Further, the valves 3120, 3320 and 3330 are opened and the nitrogen gas is filled into the crucible 3010, the inner reaction vessel 3020 and the outer reaction vessel 3300 by the pressure regulator 3130 such that the pressure of the crucible 3010, the inner reaction vessel 3020 and the outer reaction vessel 3300 becomes a pressure of the range of 1.01-5.05 MPa.

Because the metal Na in the conduit 3400 is solid in this state, the nitrogen gas is supplied to the space 3023 inside the inner reaction vessel 3020 also from the space 3031 of the conduit 3400 via the stopper/inlet plug 3060. When the pressure of the space 3023 as detected by the pressure sensor 3180 has become 1.01-5.05 Pa, the valve 3120 is closed.

Thereafter, the crucible 3010 and the inner reaction vessel 3020 are heated by the heating units 3070 and 3080 to 800° C., and the conduit 3400 is heated to 800° C. by using the heating unit 3410. In this process of heating the conduit 3400 to 800° C., the metal melt Na held inside the conduit 3400 undergoes melting in view of the melting temperature of metal Na of about 98° C., and the metal melt 3420 is formed. At the moment the temperature of the conduit 3400 is raised to 800° C., the temperature of the stopper/inlet plug 3060 becomes 150° C.

With this, the nitrogen gas inside the inner reaction vessel 3020 is confined in the spaces 3023 and 3402.

Thereafter, according to the step explained with reference to Embodiment 13, the GaN crystal is grown from the seed crystal 3005. Further, during the growth of the GaN crystal, the pressure difference between the pressure Pin inside the inner reaction vessel 3020 and the pressure Pout inside the outer reaction vessel 3300 is set to a value smaller than the predetermined value C. After the predetermined time has elapsed, the temperatures of the crucible 3010 and the inner reaction vessel 3020 are lowered, and manufacturing of the GaN crystal is completed.

Thus, by disposing the metal melt 3420 not between the crucible 3010 and the inner reaction vessel 3020 but in the conduit 3400 located outside the inner reaction vessel 3020 and further by detecting the hydrostatic pressure Ps of the melt 3420 thus disposed, it becomes possible to set the pressure difference between the pressure Pin of the interior of the inner reaction vessel 3020 and the pressure Pout inside the outer reaction vessel 3300 to be a value smaller than the predetermined value C.

Thus, with the present embodiment, it is sufficient for the pressure sensor 3340 to detect the hydrostatic pressure Ps of the metal melt disposed between the space 3023 exposed to the melt mixture 3290 and the outer space.

Manufacturing the GaN crystal using the crystal growth apparatus 3100G is conducted according to the flowchart shown in FIGS. 86 and 87.

Otherwise, the present embodiment is identical to Embodiment 13.

Figure 89:
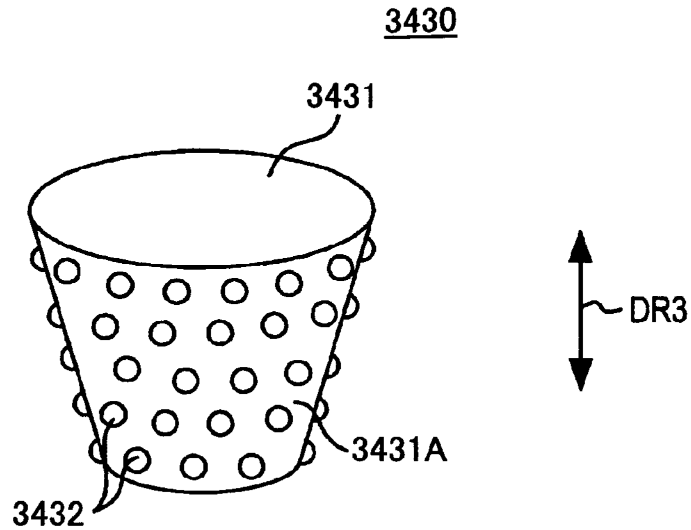
FIG. 89 is another oblique view diagram of the stopper/inlet plug according to the present invention.

FIG. 89 is another oblique view diagram of the stopper/inlet plug according to the present invention. Further, FIG. 90 is a cross-sectional diagram showing the method for mounting the stopper/inlet plug 3430 shown in FIG. 89.

Referring to FIG. 89, the stopper/inlet plug 3430 comprises a plug 3431 and a plurality of projections 3432. The plug 3431 is formed of a cylindrical body that changes the diameter in a length direction DR3. Each of the projections 3432 has a generally semispherical shape of the diameter of several ten microns. The projections 3432 are formed on an outer peripheral surface 3431A of the plug 3431 in a random pattern. Thereby, the separation between adjacent two projections 3432 is set to several ten microns.

Figure 90:
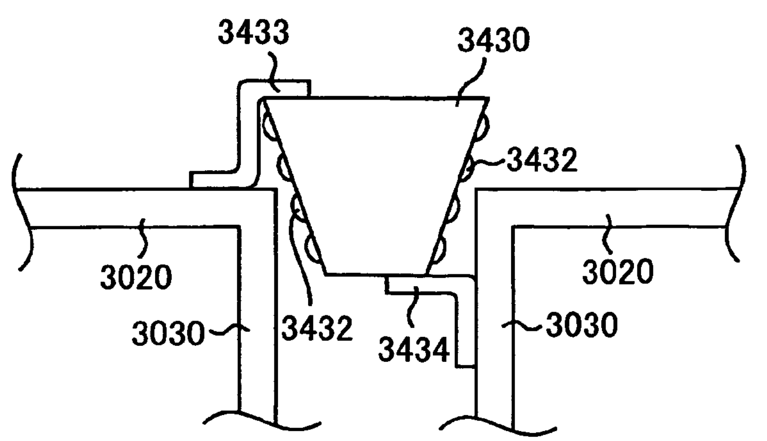
FIG. 90 is a cross-sectional diagram showing the method for mounting the stopper/inlet plug shown in FIG. 89.

Referring to FIG. 90, the stopper/inlet plug 3430 is fixed to a connection part of the reaction vessel 3020 and the conduit 3030 by support members 3433 and 3434. More specifically, the stopper/inlet plug 3430 is fixed by the support member 3433 having one end fixed upon the inner reaction vessel 3020 and by the support member 3434 having one end fixed upon an inner wall surface of the conduit 3030.

In the present case, the projections 3430 of the stopper/inlet plug 3432 may or may not contact with the inner reaction vessel 3020 or the conduit 3030. In the event the stopper/inlet plug 3432 is fixed in the state in which the projections 3430 do not contact with the inner reaction vessel 3020 and the conduit 3030, the separation between the projections 3432 and the reaction vessel 3020 or the separation between the projections 3432 and the conduit 3030 is set such that the metal melt 3190 can be held by the surface tension, and the stopper/inlet plug 3430 is fixed in this state by the support members 3433 and 3434.

The metal Na held between the crucible 3010 and the inner reaction vessel 3020 takes a solid form before heating of the crucible 3010 and the inner reaction vessel 3020 is commenced, and thus, the nitrogen gas supplied from the gas cylinder 3140 can cause diffusion between the space 3023 inside the inner reaction vessel 3020 and the space 3031 inside the conduit 3030 through the stopper/inlet plug 3430.

When heating of the crucible 3010 and the inner reaction vessel 3020 is started and the temperature of the crucible 3010 and the inner reaction vessel 3020 has raised to 98° C. or higher, the metal Na held between the crucible 3010 and the inner reaction vessel 3020 undergoes melting to form the metal melt 3190, while the metal melt 190 functions to confined the nitrogen gas to the space 3023.

Further, the stopper/inlet plug 3430 holds the metal melt 3190 by the surface tension thereof such that the metal melt 3190 does not flow out from the interior of the inner reaction vessel 3020 to the space 3030 of the conduit 3031.

Further, with progress of the growth of the GaN crystal, the metal melt 3190 and the stopper/inlet plug 3430 confines the nitrogen gas and the metal Na vapor evaporated from the metal melt 3190 and the melt mixture 3290 into the space 3023. As a result, evaporation of the metal Na from the melt mixture 3290 is suppressed, and it becomes possible to stabilize the molar ratio of the metal Na and the metal Ga in the melt mixture 3290. Further, when there is caused a decrease of nitrogen gas in the space 3023 with progress of growth of the GaN crystal, the pressure P1 of the space 3023 becomes lower than the pressure P2 of the space 3030 inside the conduit 3031, and the stopper/inlet plug 3430 supplies the nitrogen gas in the space 3023 via the metal melt 3190 by causing to flow the nitrogen gas therethrough in the direction toward the inner reaction vessel 3020.

Thus, the stopper/inlet plug 3430 functions similarly to the stopper/inlet plug 3060 explained before. The stopper/inlet plug 3430 can be used in the crystal growth apparatuses 3100 and 3100A in place of the stopper/inlet plug 3060.

While it has been explained that the stopper/inlet plug 3430 has the projections 3432, it is also possible that the stopper/inlet plug 3430 does not have the projections 3432. In this case, the stopper/inlet plug 3431 is held by the support members 3433 and 3434 such that the separation between the plug 3430 and the reaction vessel 3020 or the separation between the plug 3431 and the conduit 3030 becomes several ten microns.

Further, it is also possible to set the separation between the stopper/inlet plug 3430 (including both of the cases in which the stopper/inlet plug 3432 carries the projections 3432 and the case in which the stopper/inlet plug 3430 does not carry the projections 1402) and the inner reaction vessel 3020 and between the stopper/inlet plug 3430 and the conduit 3030 according to the temperature of the stopper/inlet plug 400. In this case, the separation between the stopper/inlet plug 3430 and the inner reaction vessel 3020 or the separation between the stopper/inlet plug 3430 and the conduit 3030 is set relatively narrow when the temperature of the stopper/inlet plug 3430 is relatively high. When the temperature of the stopper/inlet plug 3430 is relatively low, on the other hand, the separation between the stopper/inlet plug 3430 and the inner reaction vessel 3020 or the separation between the stopper/inlet plug 3430 and the conduit 3030 is set relatively large.

It should be noted that the separation between the stopper/inlet plug 3430 and the inner reaction vessel 3020 or the separation between the stopper/inlet plug 3430 and the conduit 3030 that can hold the metal melt 3190 changes depending on the temperature of the stopper/inlet plug 3430. This, with this embodiment, the separation between the stopper/inlet plug 3430 and the inner reaction vessel 3020 or the separation between the stopper/inlet plug 3430 and the conduit 3030 is changed in response to the temperature of the stopper/inlet plug 3430 such that the metal melt 3190 is held securely by the surface tension.

The temperature control of the stopper/inlet valve 3430 is achieved by the heating unit 3080. Thus, when the stopper/inlet plug 3430 is to be heated to a temperature higher than 150° C., the stopper/inlet plug 3430 is heated by the heating unit 3080.

In the case of using the stopper/inlet plug 3430, the gas cylinder 3140, the pressure regulator 3130, the gas supply lines 3090 and 3110, the conduit 3030, the stopper/inlet plug 3430 and the metal melt 3190 form together the "gas supplying unit".

Further, the stopper/inlet plug 3430 constitutes the "melt holding member".

Figure 91A:
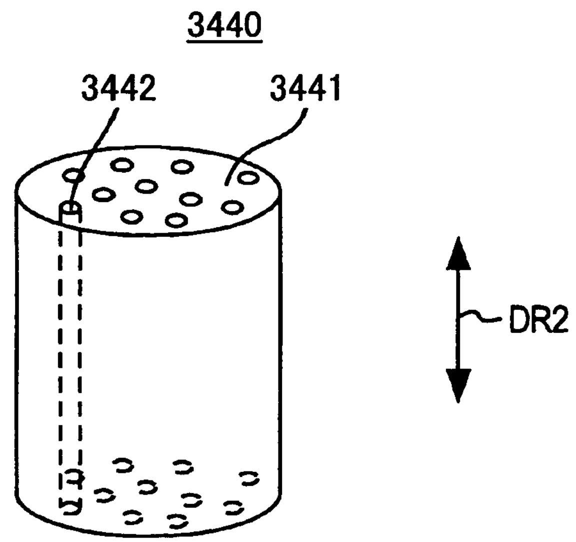
FIGS. 91A and 91B are further oblique view diagrams of the stopper/inlet plug according to the present invention.
Figure 91B:
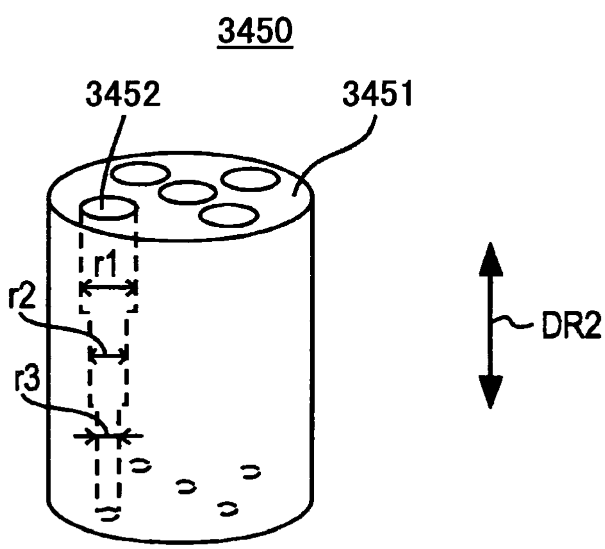

FIGS. 91A and 91B are further oblique view diagrams of the stopper/inlet plug according to the present embodiment.

Referring to FIG. 91A, the stopper/inlet plug 3440 comprises a plug 3441 formed with a plurality of penetrating holes 3442. The plurality of penetrating holes 3442 are formed in the length direction DR2 of the plug 3441. Further, each of the plural penetrating holes 3442 has a diameter of several ten microns (see FIG. 91A).

With the stopper/inlet plug 3440, it is sufficient that there is formed at least one penetrating hole 3442.

Further, the stopper/inlet plug 3450 comprises a plug 3452 formed with plural penetrating holes 3451. The plurality of penetrating holes 3452 are formed in the length direction DR2 of the plug 3451. Each of the penetrating holes 3452 have a diameter that changes stepwise from a diameter r1, r2 and r3 in the length direction DR2. Here, each of the diameters r1, r2 and r3 is determined in the range such as several microns to several ten microns in which the metal melt 3190 can be held by the surface tension Reference should be made to FIG. 91.

With the stopper/inlet plug 3450, it is sufficient that there is formed at least one penetrating hole 3452. Further, it is sufficient that the diameter of the penetrating hole 3452 is changed at least in two steps. Alternatively, the diameter of the penetrating hole 3452 may be changed continuously in the length direction DR2.

The stopper/inlet plug 3440 or 3450 can be used in the crystal growth apparatuses 3100 and 3100A in place of the stopper/inlet plug 3060.

In the case the stopper/inlet plug 3450 is used in the crystal growth apparatus 3100 or 3100A in place of the stopper/inlet plug 3060, it becomes possible to hold the metal melt 3190 by the surface tension thereof by one of the plural diameters that are changed stepwise, and it becomes possible to manufacture a GaN crystal of large size without conducting precise temperature control of the stopper/inlet plug 3450.

In the case of using the stopper/inlet plug 3440 or 3450, the gas cylinder 3140, the pressure regulator 3130, the gas supply lines 3090 and 3110, the conduit 3030, the stopper/inlet plug 3440 or 3450 and the metal melt 3190 form together the "gas supplying unit".

Further, the stopper/inlet plug 3440 constitutes the "melt holding member".

Further, with the present invention, it is possible to use a porous plug or check valve in place of the stopper/inlet plug 3060. The porous plug may be the one formed of a sintered body of stainless steel powders. Such a porous plug has a structure in which there are formed a large number of pores of several ten microns. Thus, the porous plug can hold the metal melt 3190 by the surface tension thereof similarly to the stopper/inlet plug 3060 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P1 of the space 3031 and the pressure P2 of the space 3023 for allowing the nitrogen gas in the space 3031 to the space 3023 through the metal melt 3190 in the event the pressure P2 is higher than the pressure P1 and blocks the connection between the reaction vessel 3020 and the conduit 3030 by the self gravity when P1≧P2. Thus, this check valve can be used also in the high-temperature region.

Further, while it has been explained with Embodiment 13 or 14 that the crystal growth temperature is 800° C., the present embodiment is not limited to this specific crystal growth temperature. It is sufficient when the crystal growth temperature is equal to or higher than 600° C. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, the crystal growth temperature of the present invention may be the one in which the up/down mechanism 3220, the vibration application unit 3230 and the vibration detection unit 3240 are removed from the crystal growth apparatuses 3100 and 3100A. In this case, the seed crystal 3005 is not moved up or down but is held by the support unit 3050 such that the seed crystal 3005 is contacted to or dipped into the melt mixture 3290 in the state the metal Na and the metal Ga loaded into the crucible 3010 is molten. Thus, the GaN crystal grows from the seed crystal 3005. As a result, it becomes possible to grow a GaN crystal of large size.

Further, it should be noted that the crystal growth apparatus of the present invention may be the one in which the thermocouple 3210, the conduit 3200, the gas supply line 3250, the flow meter 3260 and the gas cylinder 3270 are removed from the crystal growth apparatuses 3100 or 3100A explained above. In this case, the temperature T3 of the seed crystal 3005 is not controlled lower than the temperature of the melt mixture 3290, while there still occurs growth of the GaN crystal from the seed crystal 3005 because of the fact that the seed crystal 3005 is contacted to or dipped into the melt mixture 3290 by the support unit 3050. As a result, it becomes possible to grow a GaN crystal of large size.

Further, it should be noted that the crystal growth apparatus of the present invention may be the one in which the thermocouple 3210, the conduit 3200, the up/down mechanism 3220, the vibration application unit 3230, the vibration detection unit 3240, the gas supply line 3250, the flow meter 3260 and the gas cylinder 3270 are removed from the crystal growth apparatuses 3100 or 3100A explained above. In this case, the seed crystal 3005 is not moved up or down and the temperature T3 of the seed crystal 3005 is not controlled to be lower than the temperature of the melt mixture 3290. Even in such a case, the seed crystal 3005 is held in contact with or dipped into the melt mixture 3290 in the state the metal Na and the metal Ga loaded into the crucible 31010 have caused melting. Thus, the GaN crystal grows from the seed crystal 3005. As a result, it becomes possible to grow a GaN crystal of large size.

Further, with the present invention, it is possible to grow the GaN crystal without using the seed crystal 3005, by using the crystal growth apparatus in which the thermocouple 3210, the up/down mechanism 3220, the vibration application unit 3230, the vibration detection unit 3240, the gas supply line 3250, the flow meter 3260 and the gas cylinder 3270 are removed from the crystal growth apparatus 3100 or 3100A. In this case, growth of the GaN crystal occurs from the bottom surface and sidewall surface of the crucible 3010, while because the pressure difference between the pressure Pin inside the inner reaction vessel 3020 and the pressure Pout inside the outer reaction vessel 3300 is set to be smaller than the predetermined value C, it becomes possible to manufacture the GaN crystal stably.

Further, while it has been described in the foregoing that the crystal growth apparatuses 3100 and 3100A carries out the growth of the GaN crystal by setting the pressure difference |Pin−Pout| between the pressure Pin and the pressure Pout to be smaller than the predetermined value C above which it is judged that the crystal growth apparatus 3100 or 3100A is anomalous, the present embodiment is not limited to such a case, and the crystal growth apparatus of the present invention may be the one that carries out crystal growth of the GaN crystal by setting the pressure difference |Pin−Pout| to a suitable pressure difference where the space 3023 (=first vessel space) inside the inner reaction vessel 3020 is disconnected substantially from the space (=second vessel space) between the inner reaction vessel 3020 and the outer reaction vessel 3300. By setting the pressure difference |Pin−Pout| to such a suitable pressure difference, there occurs no mixing of impurities into the space 3023 inside the inner reaction vessel 3020 or there occurs no leakage of the nitrogen gas or metal Na vapor in the space 3023 to the space between the inner reaction vessel 3020 and the outer reaction vessel 3300, and thus, it becomes possible to carry out the crystal growth of the GaN crystal while maintaining the state of nitrogen gas, the metal Na vapor and the melt mixture 3290 in the inner reaction vessel 3020. As a result, it becomes possible to manufacture a GaN crystal stably.

Further, while explanation has been made in the foregoing that metal Na and metal Ga are loaded into the crucible 3020 in the ambient of Ar gas and the metal Na is loaded between the crucible 3010 and the inner reaction vessel 3020 in the ambient of Ar gas, it is also possible to load the metal Na and the metal Ga into the crucible 3010 and the metal Na between the crucible 3010 and the inner reaction vessel 3020 or in the conduit 3400 in the ambient of a gas other than the Ar gas, such as He, Ne, Kr, or the like, or in a nitrogen gas. Generally, the metal Na and the metal Ga are loaded into the crucible 3010 and the metal Na is loaded between the crucible 3010 and the inner reaction vessel 3020 or in the conduit 3400 in the inert gas ambient or nitrogen gas ambient. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 3290 by mixing an alkali metal such as lithium (Li), potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing nitrogen as a constituent element such as sodium azide, ammonia, or the like. These compounds constitute the nitrogen source gas.

Further, place of Ga, it is also possible to use a group III metal such as boron (B), aluminum (Al), indium (In), or the like.

Thus, the crystal growth apparatus and method of the present invention is generally applicable to the manufacturing of a group III nitride crystal while using a melt mixture of an alkali metal or an alkali earth melt and a group III metal (including boron).

The group III nitride crystal manufactured with the crystal growth apparatus or method of the present invention may be used for fabrication of group III nitride semiconductor devices including light-emitting diodes, laser diodes, photodiodes, transistors, and the like.

Embodiment 15

Figure 92:
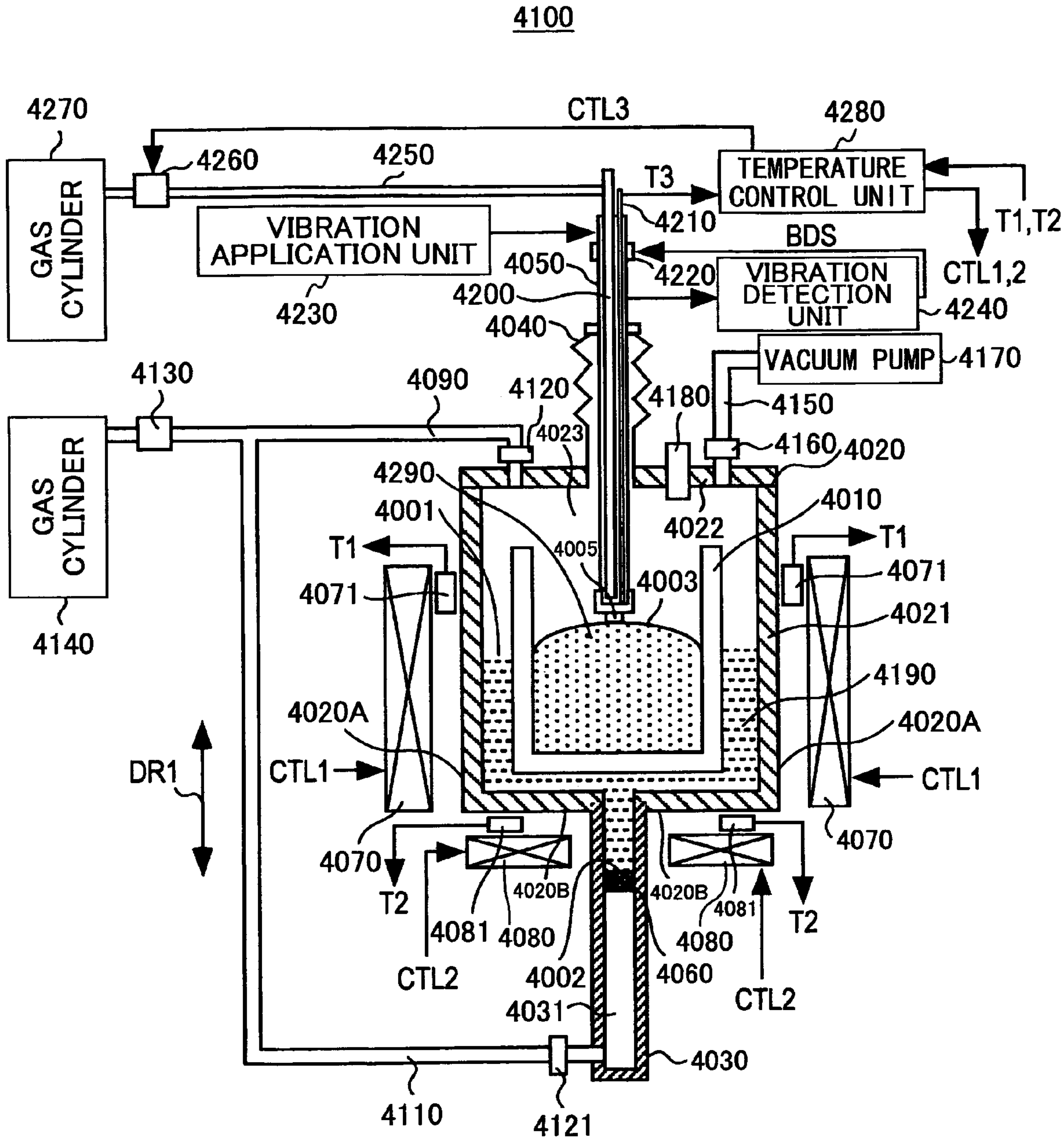
FIG. 92 is a schematic cross-sectional diagram showing the construction of a crystal growth apparatus according to Embodiment 15 of the present invention.

FIG. 92 is a schematic cross-sectional diagram showing the construction of a crystal growth apparatus according to Embodiment 15 of the present invention.

Referring to FIG. 92, a crystal growth apparatus 4100 according to Embodiment 15 of the present invention comprises: a reaction vessel 4010; an outer reaction vessel 4020; conduits 4030 and 4200; a bellows 4040; a support unit 4050; a stopper/inlet plug 4060; heating units 4070 and 4080; temperature sensors 4071 and 4081; gas supply lines 4090, 4110, 4250; valves 4120, 4121, 4160; a pressure regulator 4130; gas cylinders 4140 and 4270; an evacuation line 4150; a vacuum pump 4170; a pressure sensor 4180; a metal melt 4190; a thermocouple 4210; an up/down mechanism 4220; a vibration applying unit 4230; a vibration detection unit 4240; a flow meter 4260; and a temperature control unit 4280.

The reaction vessel 4010 has a generally cylindrical form and is formed of boron nitride (BN). The outer reaction vessel 4020 is disposed around the reaction vessel 4010 with a predetermined separation from the reaction vessel 4010. Further, the outer reaction vessel 4020 is formed of a main part 4021 and a lid 4022. Each of the main part 4021 and the lid 4022 is formed of SUS316L stainless steel, wherein a metal seal ring is provided between the main part 4021 and the lid 4022 for sealing.

The conduit 4030 is connected to the outer reaction vessel 4020 at the underside of the reaction vessel 4010 in terms of a gravitational direction DR1. The bellows 4040 is connected to the outer reaction vessel 4020 at the underside of the reaction vessel 4010 in terms of a gravitational direction DR1. The support substrate 4050 is inserted into a space 4023 inside the outer reaction vessel 4023 via the bellows 4040.

The stopper/inlet plug 4060 may be formed of a metal, ceramic, or the like, for example, and is held inside the conduit 4030 at a location lower than the connection part of the outer reaction vessel 4020 and the conduit 4030.

The heating unit 4070 is disposed so as to surround the outer circumferential surface 4020A of the outer reaction vessel 4020. On the other hand, the heating unit 4080 is disposed so as to face a bottom surface 4020B of the outer reaction vessel 4020. The temperature sensors 4071 and 4081 are disposed in the close proximity of the heating units 4070 and 4080, respectively.

The gas supply line 4090 has an end connected to the outer reaction vessel 4020 via the valve 4120 and the other end connected to the gas cylinder 4140 via the pressure regulator 4130. The gas supply line 4110 has an end connected to the conduit 4030 via the valve 4121 and the other end connected to the gas supply line 4090.

The valve 4120 is connected to the gas supply line 4090 in the vicinity of the outer reaction vessel 4020. The valve 4121 is connected to the gas supply line 4110 in the vicinity of the conduit 4030. The pressure regulator 4130 is connected to the gas supply line 4090 in the vicinity of the gas cylinder 4140. The gas cylinder 4140 is connected to the gas supply line 4090.

The evacuation line 4150 has an end connected to the outer reaction vessel 4020 via the valve 4160 and the other end connected to the vacuum pump 4170. The valve 4160 is connected to the evacuation line 4150 in the vicinity of the outer reaction vessel 4020. The vacuum pump 4170 is connected to the evacuation line 4150.

The pressure sensor 4180 is mounted to the outer reaction vessel 4020. The metal melt 4190 comprises a melt of metal sodium (metal Na) and is held between the reaction vessel 4010 and the outer reaction vessel 4020.

The conduit 4200 and the thermocouple 4210 are inserted into the interior of the support unit 4050. The up/down mechanism 4220 is mounted to the support unit 4050 disposed outside the outer reaction vessel 4020. The gas supply line 4250 has an end connected to the conduit 4200 and the other end connected to the gas cylinder 4270 via the flow meter 4260. The flow meter 4260 is connected to the gas supply line 4250 in the vicinity of the gas cylinder 4270. The gas cylinder 4270 is connected to the gas supply line 4250.

The reaction vessel 4010 holds the melt mixture 4290 containing metal Na and metal gallium (metal Ga). The outer reaction vessel 4020 surrounds the reaction vessel 4010. The conduit 4030 leads the nitrogen gas (N2 gas) supplied from the gas cylinder 140 via the gas supply lines 4090 and 4110 to the stopper/inlet plug 4060.

The bellows 4040 holds the support unit 4050 and disconnects the interior of the outer reaction vessel 4020 from outside. Further, the bellows 4040 is capable of expanding and contracting in the gravitational direction DR1 with movement of the support unit 4050 in the gravitational direction DR1. The support unit 4050 comprises a hollow cylindrical member and supports a seed crystal 4005 of a GaN crystal at a first end thereof inserted into the outer reaction vessel 4020.

The stopper/inlet plug 4060 has a dimple structure on the outer peripheral surface such that there are formed apertures of the size of several ten microns between the inner wall of the conduit 4030 and the stopper/inlet plug 60. Thus, the stopper/inlet plug 60 allows the nitrogen gas in the conduit 4030 to pass in the direction to the metal melt 4190 and supplies the nitrogen gas to the space 4023 via the metal melt 4190. Further, the stopper/inlet plug 4060 holds the metal melt 4190 between the reaction vessel 4010 and the outer reaction vessel 4020 by the surface tension caused by the apertures of the size of several ten microns.

The heating unit 4070 comprises a heater and a current source. Thus, the heating unit 4070 supplies a current from the current source to the heater in response to a control signal CTL1 from the temperature control unit 4280 and heats the reaction vessel 4010 and the outer reaction vessel 4020 to a crystal growth temperature from the outer peripheral surface 4020A of the outer reaction vessel 4020. The temperature sensor 4071 detects a temperature T1 of the heater of the heating unit 4070 and outputs a temperature signal indicative of the detected temperature T1 to the pressure regulator 4130 and to the temperature control unit 4280.

The heating unit 4080 also comprises a heater and a current source. Thus, the heating unit 4080 supplies a current from the current source to the heater in response to a, control signal CTL2 from the temperature control unit 4280 and heats the reaction vessel 4010 and the outer reaction vessel 4020 to a crystal growth temperature from the bottom surface 4020B of the outer reaction vessel 4020. The temperature sensor 4081 detects a temperature T2 of the heater of the heating unit 4080 and outputs a temperature signal indicative of the detected temperature T2 to the temperature control unit 4280.

The gas supply line 4090 supplies the nitrogen gas supplied from the gas cylinder 4140 via the pressure regulator 4130 to the interior of the outer reaction vessel 4020 via the valve 4120. The gas supply line 4110 supplies the nitrogen gas supplied from the gas cylinder 4140 via the pressure regulator 4130 to the interior of the conduit 4030 via the valve 4121.

The valve 4120 supplies the nitrogen gas inside the gas supply line 4090 to the interior of the outer reaction vessel 4020 or interrupts the supply of the nitrogen gas to the interior of the outer reaction vessel 4020. The valve 4121 supplies the nitrogen gas inside the gas supply line 4110 to the conduit 4030 or interrupts the supply of the nitrogen gas to the conduit 4030. The pressure regulator 4130 supplies the nitrogen gas from the gas cylinder 4140 to the gas supply lines 4090 and 4110 after setting the pressure to a predetermined pressure.

The gas cylinder 4140 holds the nitrogen gas. The evacuation line 4150 passes the gas inside the outer reaction vessel 4020 to the vacuum pump 4170. The valve 4160 connects the interior of the outer reaction vessel 4020 and the evacuation line 4150 spatially or disconnects the interior of the outer reaction vessel 4020 and the evacuation line 4150 spatially. The vacuum pump 4170 evacuates the interior of the outer reaction vessel 4020 via the evacuation line 4150 and the valve 4160. The pressure sensor 4180 detects the pressure inside the outer reaction vessel 4020. The metal melt 4190 supplies the nitrogen gas introduced through the stopper/inlet plug 4060 into the space 4023.

The conduit 4200 cools the seed crystal 4005 by releasing the nitrogen gas supplied from the gas supply line 4250 into the support unit 4050 from the first end thereof. The thermocouple 4210 detects a temperature T3 of the seed crystal 4005 and outputs a temperature signal indicative of the detected temperature T3 to the temperature control unit 4280.

The up/down mechanism 4220 causes the support unit 4050 to move up or down in response to a vibration detection signal BDS from the vibration detection unit 4240 according to a method to be explained later, such that the seed crystal 4005 is held at any of a vapor-liquid interface 4003 between the space 4023 and the melt mixture 4290, in the space 4023, or in the melt mixture 4290.

The vibration application unit 4230 comprises applies a vibration of predetermined frequency to the support unit 4050. The vibration detection unit 4240 detects the vibration of the support unit 4050 and outputs the vibration detection signal BDS to the up/down mechanism 4220.

The gas supply line 4250 supplies a nitrogen gas supplied from the gas cylinder 4270 via the flow meter 4260 to the conduit 4200. The flow meter 4260 supplies the nitrogen gas supplied from the gas cylinder 4270 to the gas supply line 4250 with flow rate adjustment in response to a control signal CTL3 from the temperature control unit 4280. The gas cylinder 4270 holds the nitrogen gas.

Figure 93:
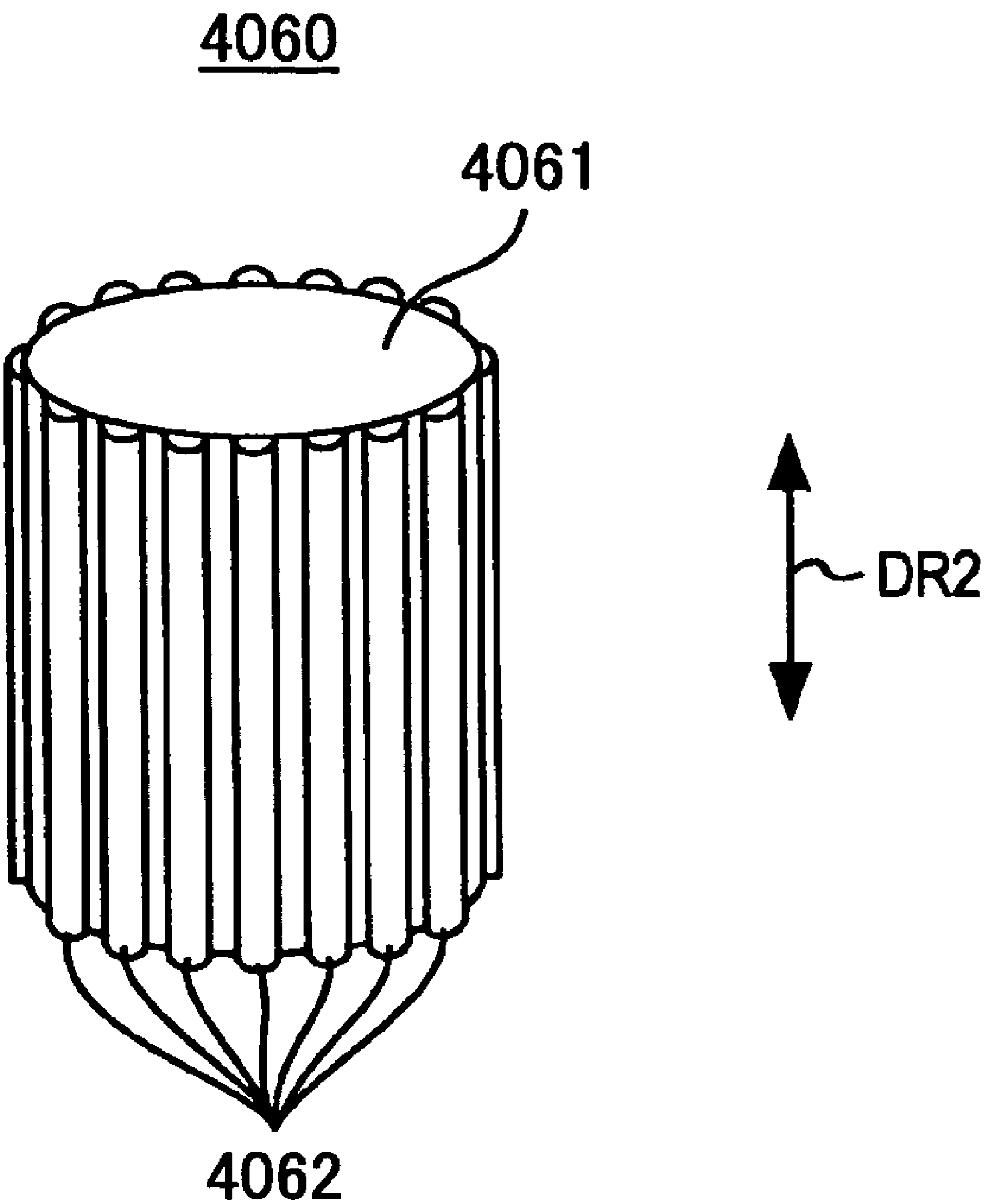
FIG. 93 is an oblique view diagram showing the construction of the stopper/inlet plug shown in FIG. 92.

FIG. 93 is an oblique view diagram showing the construction of the stopper/inlet plug 4060 shown in FIG. 92.

Referring to FIG. 93, the stopper/inlet plug 4060 includes a plug 4061 and projections 4062. The plug 4061 has a generally cylindrical form. Each of the projections 4062 has a generally semi-circular cross-sectional shape and the projections 4061 are formed on the outer peripheral surface of the plug 4061 so as to extend in a length direction DR2.

Figure 94:
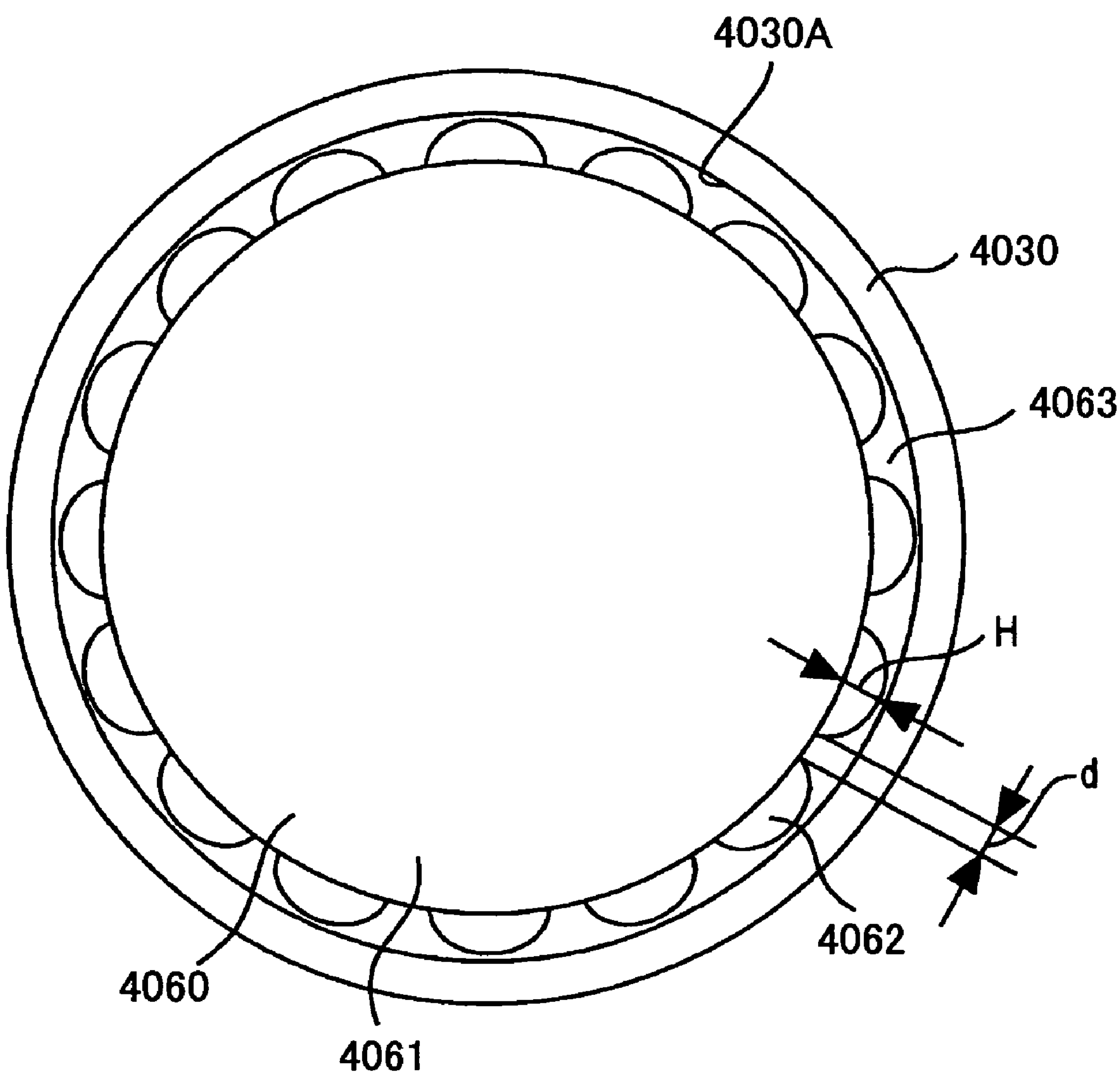
FIG. 94 is a plan view diagram showing the state of mounting the stopper/inlet plug to a conduit.

FIG. 94 is a plan view diagram showing the state of mounting the stopper/inlet plug 4060 to the conduit 4030.

Referring to FIG. 94, the projections 4062 are formed with plural number in the circumferential direction of the plug 4061 with an interval d of several ten microns. Further, each projection 4062 has a height H of several ten microns. The plural projections 4060 of the stopper/inlet plug 4062 make a contact with the inner wall surface 4030A of the conduit 4030. With this, the stopper/inlet plug 4060 is in engagement with the inner wall 4030A of the conduit 4030.

Because the projections 4062 have a height H of several ten microns and are formed on the outer peripheral surface of the plug 4061 with the interval d of several ten microns, there are formed plural gaps 4060 between the stopper/inlet plug 4060 and the inner wall 4030A of the conduit 4030 with a diameter of several ten microns in the state the stopper/inlet plug 4063 is in engagement with the inner wall 4030A of the conduit 4030.

This gap 4063 allows the nitrogen gas to pass in the length direction DR2 of the plug 4061 and holds the metal melt 4190 at the same time by the surface tension of the metal melt 4190, and thus, the metal melt 4190 is blocked from passing through the gap in the longitudinal direction DR2 of the plug 4061.

Figure 95A:
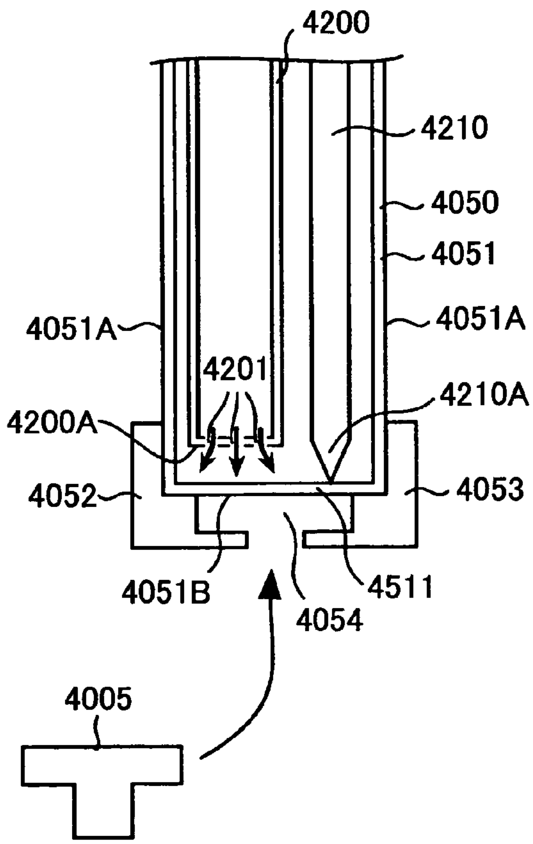
FIGS. 95A and 95B are enlarged diagrams showing the construction of the support unit, conduit and the thermocouple shown in FIG. 92.
Figure 95B:
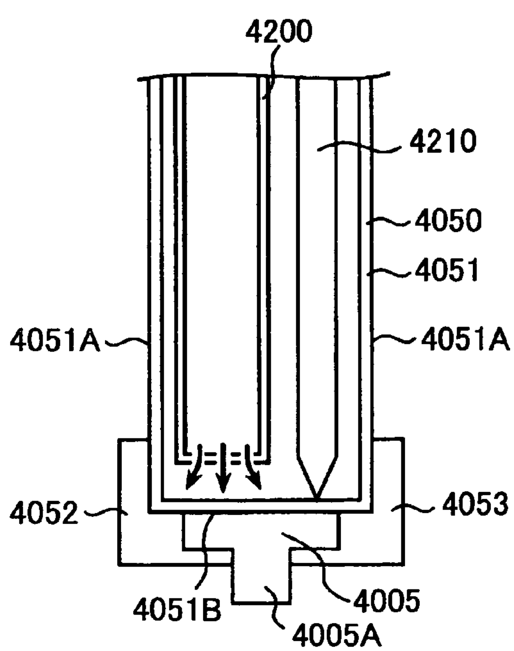

FIGS. 95A and 95B are enlarged diagrams of the support unit 4050, the conduit 4200 and the thermocouple 4210 shown in FIG. 92.

Referring to FIGS. 95A and 95B, the support unit 4050 includes a cylindrical member 4051 and fixing members 4052 and 4053. The cylindrical member 4051 has a generally circular cross-sectional form. The fixing member 4052 has a generally L-shaped cross-sectional form and is fixed upon an outer peripheral surface 4051A and a bottom surface 4051B of the cylindrical member 4051 at the side of a first end 4511 of the cylindrical member 4051. Further, the fixing member 4053 has a generally L-shaped cross-sectional form and is fixed upon the outer peripheral surface 4051A and the bottom surface 4051B of the cylindrical member 4051 at the side of a first end 4511 of the cylindrical member 4051 in symmetry with the fixing member 4052. As a result, there is formed a space part 4054 in the region surrounded by the cylindrical member 4051 and the fixing members 4052 and 4053.

The conduit 4200 has a generally circular cross-sectional form and is disposed inside the cylindrical member 4051. In this case, the bottom surface 4200A of the conduit 4200 is disposed so as to face the bottom surface 51B of the cylindrical member 4051. Further, plural apertures 4200 are formed on the bottom surface 200A of the conduit 200. Thus, the nitrogen gas supplied to the conduit 4200 hits the bottom surface 4051B of the cylindrical member 4051 via the plural apertures 4201.

The thermocouple 4210 is disposed inside the cylindrical member 4051 such that a first end 4270A thereof is adjacent to the bottom surface 4051B of the cylindrical member 4051. Reference should be made to FIG. 95A.

Further, the seed crystal 4005 has a shape that fits the space 4054 and is held by the support unit 4050 by being fitted into the space 4054. In the present case, the seed crystal 4005 makes a contact with the bottom surface 4051B of the cylindrical member 4051. Reference should be made to FIG. 95B.

Thus, a high thermal conductivity is secured between the seed crystal 4005 and the cylindrical member 4051. As a result, it becomes possible to detect the temperature of the seed crystal 4005 by the thermocouple 4210 and it becomes also possible to cool the seed crystal 4005 easily by the nitrogen gas directed to the bottom surface 4051B of the cylindrical member 4051 from the conduit 4200.

Figure 96:
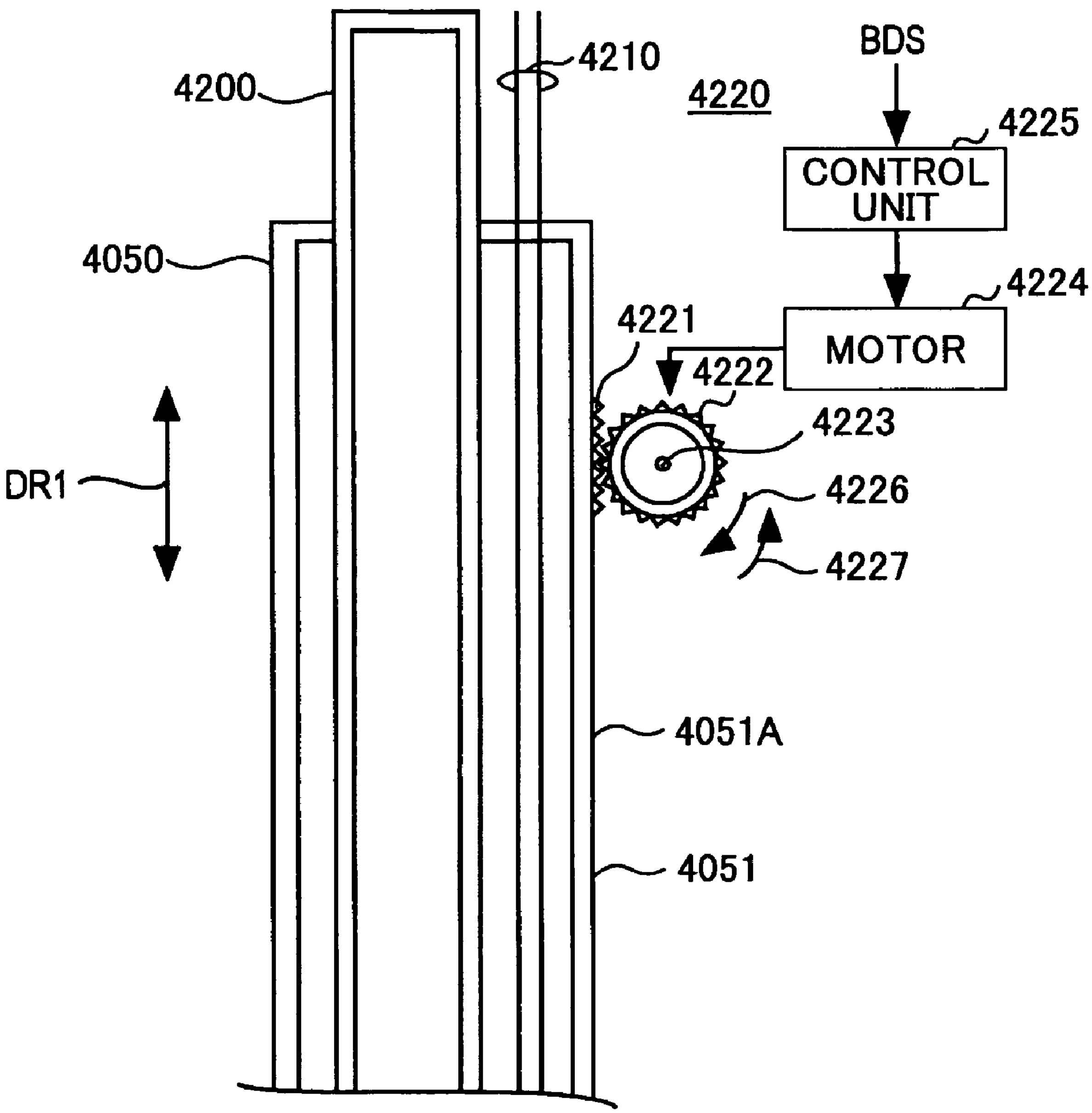
FIG. 96 is a schematic diagram showing the construction of the up/down mechanism shown in FIG. 92.

FIG. 96 is a schematic diagram showing the construction of the up/down mechanism 4220 shown in FIG. 92.

Referring to FIG. 96, the up/down mechanism 4220 comprises a toothed member 4221, a gear 4222, a shaft member 4223, a motor 4224 and a control unit 4225.

The toothed member 4221 has a generally triangular cross-sectional shape and is fixed upon the outer peripheral surface 4051A of the cylindrical member 4051. The gear 4222 is fixed upon an end of the shaft member 4223 and meshes with the toothed member 4221. The shaft member 4223 has the foregoing end connected to the gear 4222 and the other end connected to a shaft (not shown) of the motor 4224.

The motor 4224 causes the gear 4222 to rotate in the direction of an arrow 4225 or an arrow 227 in response to control from the control unit 4226. The control unit 4225 controls the motor 4222 based on the vibration detection signal BDS from the vibration detection unit 4240 and causes the gear 4224 to rotate in the direction of the arrow 4226 or 4227.

When the gear 4222 is rotated in the direction of the arrow 4226, the support unit 4050 moves in the upward direction in terms of the gravitational direction DR1, while when the gear 4222 is rotated in the direction of the arrow 4227, the support unit 4050 is moved downward in terms of the gravitational direction DR1.

Thus, rotation of the gear 4222 in the direction of the arrow 4222 or 4226 corresponds to a movement of the support unit 4050 up or down in terms of the gravitational direction DR1.

Figure 97:
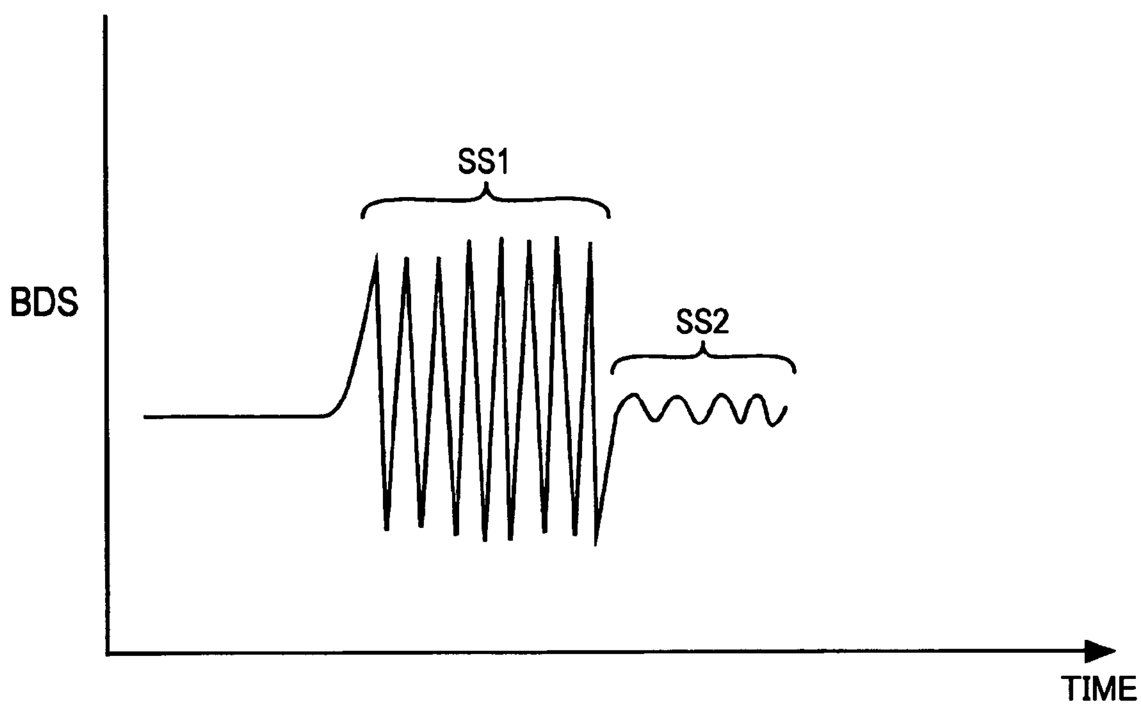
FIG. 97 is a timing chart showing the waveform of a vibration detection signal.

FIG. 97 is a timing chart of the vibration detection signal BDS.

Referring to FIG. 97, the vibration detection signal BDS detected by the vibration detection unit 4240 is formed of the signal component SS1 in the case the seed crystal 4005 is not in contact with the melt mixture 4290 while the vibration detection signal changes to the signal component SS2 when the seed crystal 4005 has made a contact with the melt mixture 4290.

In the event the seed crystal 4005 is not in contact with the melt mixture 4290, the seed crystal 4005 is vibrated vigorously by the vibration applied by the vibration application unit 4230 and the vibration detection signal BDS is formed of the signal component SS1 of relatively large amplitude. When the seed crystal 4005 is in contact with the melt mixture 4290, the seed crystal 4005 cannot vibration vigorously even when the vibration is applied from the vibration application unit 4230 because of viscosity of the melt mixture 4290, and thus, the vibration detection signal BDS is formed of the signal component SS2 of relatively small amplitude.

Referring to FIG. 96, again, the control unit 4225 detects, upon reception of the vibration detection signal from the vibration detection unit 4240, the signal component in the vibration detection signal BDS. Further, in the case the control unit 4225 holds the seed crystal in the space 4023, the motor 4224 is controlled so as to move the support unit 4050 in the gravitational direction DR101 until the signal component of the vibration detection signal BDS is changed to the signal component SS1.

Further, in the case the control unit 4225 holds the seed crystal at the vapor-phase interface 4003, the motor 4224 is controlled so as to move the support unit 4050 in the gravitational direction DR1 until the signal component of the vibration detection signal BDS is changed to the signal component SS2.

Further, in the case the control unit 4225 holds the seed crystal 4005 inside the melt mixture 4290, the motor 4224 is controlled so as to move the support unit 4050 in the gravitational direction DR1 such that the signal component of the vibraton detection signal BDS changes to the signal component SS2 and the amplitude of the signal component SS2 starts to decrease.

More specifically, the control unit 4225 controls the motor 4005 such that the gear 4222 is rotated in the direction of the arrow 4226 in the event the seed crystal 4005 is to be held in the space 4023, and the motor 4224 causes the gear 4222 to rotate in response to the control from the control unit 4225 in the direction of the arrow 4226 via the shaft member 4223. With this, the support member 4050 moves in the upward direction in terms of the gravitational direction DR1.

Thereafter, the control unit 4225 controls the motor 4222 such that rotation of the gear 4224 is stopped when the signal component of the vibration detection signal BDS received from the vibration detection unit 4240 has changed from the signal component SS2 to the signal component SS1, and the motor stops the rotation of the gear 4222 in response to the control from the control unit 4224. With this, the support unit 4050 stops movement in the upward direction and the seed crystal 4005 is held in the space 4023.

Further, the control unit 4225 controls the motor 4005 such that the gear 4222 is rotated in the direction of the arrow 4227 in the event the seed crystal 4005 is to be held at the vapor-liquid interface 4003, and the motor 4224 causes the gear 4222 to rotate in response to the control from the control unit 4225 in the direction of the arrow 4227 via the shaft member 4223. With this, the support member 4050 moves in the downward direction in terms of the gravitational direction.

Thereafter, the control unit 4225 controls the motor 4222 such that rotation of the gear 4222 is stopped when the signal component of the vibration detection signal BDS received from the vibration detection unit 4240 has changed from the signal component SS1 to the signal component SS2, and the motor stops the rotation of the gear 4222 in response to the control from the control unit 4224. With this, the support unit 4050 stops movement in the downward direction and the seed crystal 4005 is held at the vapor-liquid interface 4003.

Further, the control unit 4225 controls the motor 4224 such that the gear 4222 is rotated in the direction of the arrow 4227 in the event the seed crystal 4005 is to be held inside the melt mixture 4290, and the motor 4224 causes the gear 4222 to rotate in response to the control from the control unit 4225 in the direction of the arrow 4227 via the shaft member 4223. With this, the support member 4050 moves in the downward direction in terms of the gravitational direction.

Thereafter, the control unit 4225 controls the motor 4224 such that rotation of the gear 4222 is stopped when the signal component of the vibration detection signal BDS received from the vibration detection unit 4240 has changed from the signal component SS1 to the signal component SS2 and further the amplitude of the signal component SS2 has been decreased, and the motor 4224 stops the rotation of the gear 4222 in response to the control from the control unit 4224. With this, the support unit 4050 stops movement in the downward direction and the seed crystal 4005 is held in the melt mixture 4290.

Thus, the up/down mechanism 4220 moves the support unit 4050 up or down in the gravitational direction DR101 in response to the vibration detection signal BDS detected by the vibration detection unit 4240 such that the seed crystal 4005 is held in any of the space 4020, the vapor-liquid interface 4003 or the melt mixture 4290.

Figure 98:
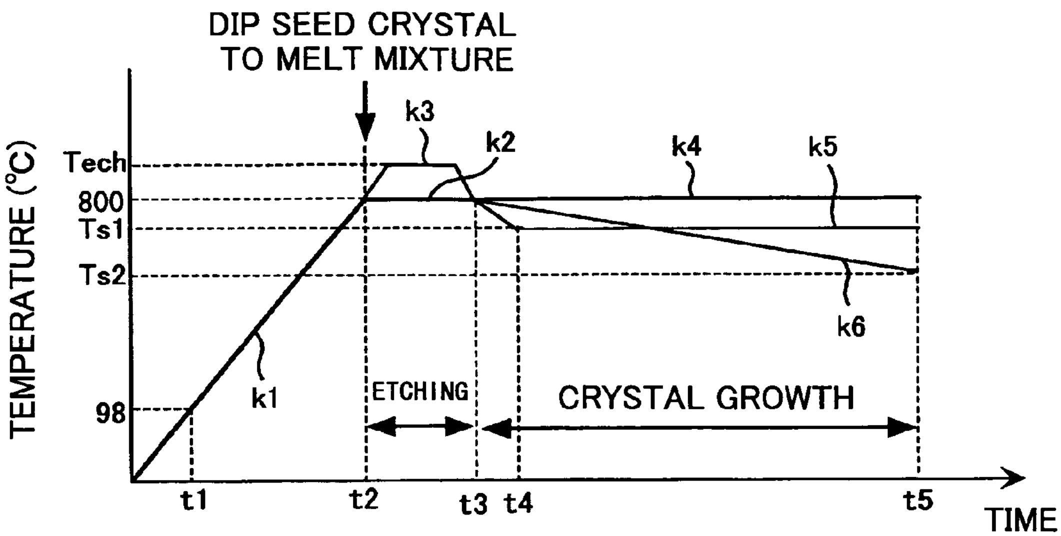
FIG. 98 is a timing chart showing the temperature of the reaction vessel and the outer action vessel.
Figure 99:
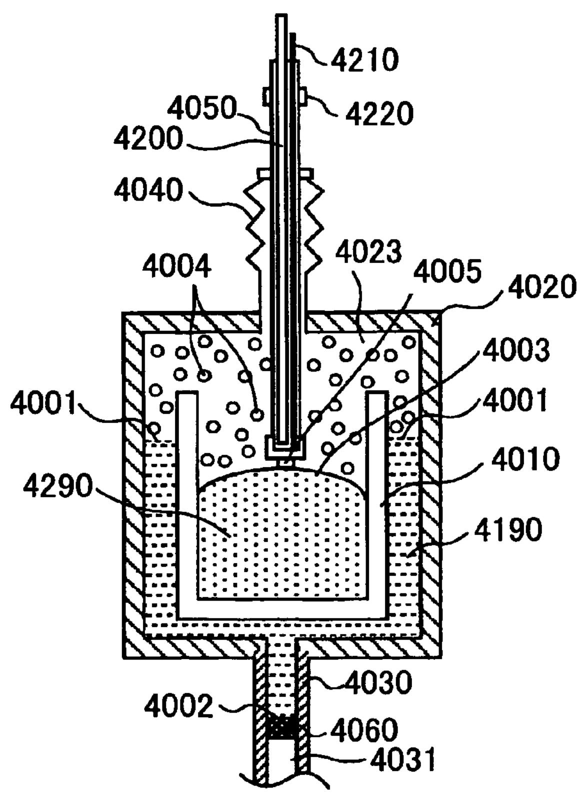
FIG. 99 is a schematic diagram showing the state inside the reaction vessel and the outer reaction vessel during the interval between two timings t1 and t2 shown in FIG. 98.
Figure 100:
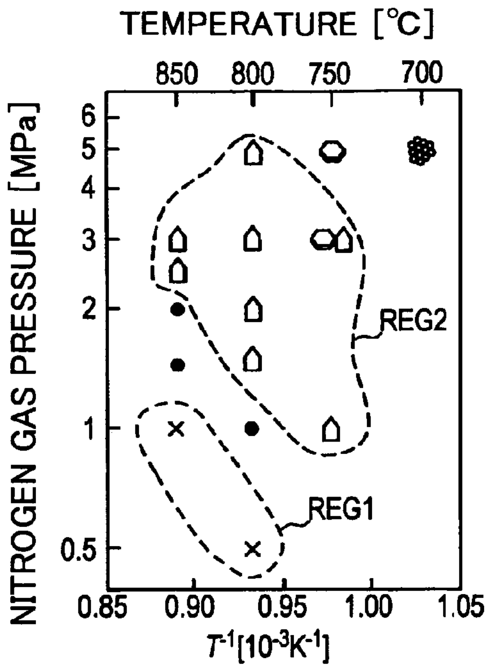
FIG. 100 is a diagram showing the relationship between the nitrogen gas pressure and the crystal growth temperature for the case of growing a GaN crystal.
Figure 101:
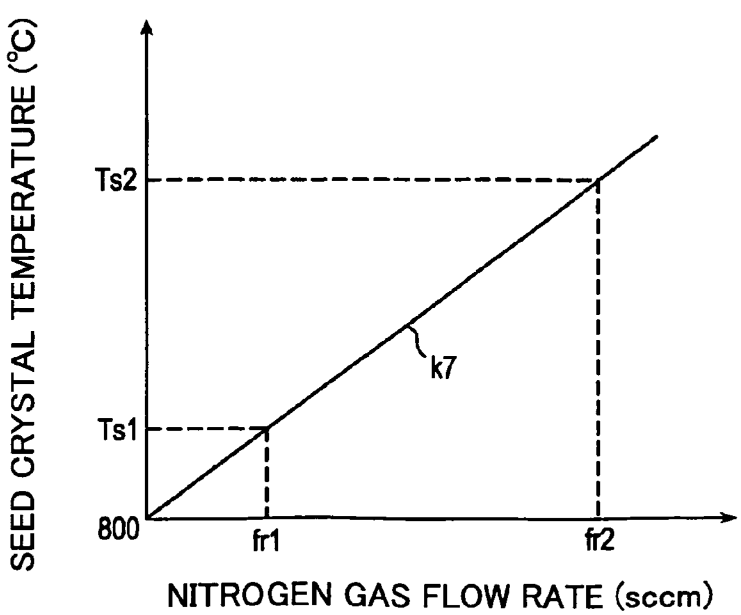
FIG. 101 is a diagram showing the relationship between the temperature of the seed crystal and the flow rate of the nitrogen gas.

FIG. 98 is a timing chart showing the temperature of the reaction vessel 4010 and the outer reaction vessel 4020. Further, FIG. 99 is a schematic diagram showing the state inside the inner 4010 and the outer reaction vessel 4020 during the interval between two timings t1 and t2 shown in FIG. 98. FIG. 100 is a diagram showing the relationship between the nitrogen gas pressure and the crystal growth temperature for the case of growing a GaN crystal. Further, FIG. 101 is a diagram showing the relationship between the temperature of the seed crystal 4005 and the flow rate of the nitrogen gas.

Referring to FIG. 98, the heating units 4070 and 4080 heat the reaction vessel 4010 and the outer reaction vessel 4020 such that the temperature rises along the lines k1, k2 and k3 and is held at 800° C. When the heating units 4070 and 4080 start to heat the reaction vessel 4010 and the outer reaction vessel 4020, the temperature of the reaction vessel 4010 and the outer reaction vessel 4020 start to rise and reaches a temperature of 98° C. at the timing t1 and a temperate of 800° C. at the timing t2. With this, the metal Na held in the reaction vessel 4010 and the outer reaction vessel 4020 undergoes melting and the metal melt 4190 (=metal Na liquid) is formed. Further, the nitrogen gas 4023 inside the space 4004 cannot escape to the space 4060 inside the conduit 4030 through the metal melt 4190 (=metal Na melt) and the stopper/inlet plug 4031, and the nitrogen gas 4023 is confined in the space 2023. Reference should be made to FIG. 99.

Further, during the interval from the timing t1 in which the temperature of the reaction vessel 4010 and the outer reaction vessel 4020 reaches 98° C. to the timing t2 in which the temperature of the reaction vessel 4010 and the outer reaction vessel 4020 reaches 800° C., it should be noted that the up/down mechanism 4220 moves the support unit 4050 up or down according to the method explained above in response to the vibration detection signal BDS from the vibration detection unit 4240 and dips the seed crystal 4005 in the melt mixture 4290.

Further, when the temperature T1 received from the temperature sensor 4071 has reached the temperature at which the temperatures of the reaction vessel 4010 and the outer reaction vessel 4020 are set to 800° C., the pressure regulator 4130 adjusts the nitrogen gas pressure supplied to the outer reaction vessel 4020 such that the nitrogen pressure in the space 4023 becomes the nitrogen pressure of the region REG1 shown in FIG. 100.

It should be noted that the region REG1 shown in FIG. 100 represents a region indicating the relationship between the nitrogen gas pressure and the temperature, wherein it should be noted that the region REG2 is a region of the nitrogen gas pressure and temperature in which GaN crystals of columnar shape grown in the c-axis direction (<0001> direction) are obtained.

The pressure regulator 4130 holds the nitrogen gas pressure in the space 4023 to the nitrogen gas pressure PNech in the region REG1 during the interval from the timing t2 to the timing t3. In this case, the pressure regulator 4130 holds the time length t3−t2 from the timing t2 to the timing t3, and when the nitrogen gas pressure in the space 4023 is adjusted to the nitrogen gas pressure $P_{Nech}$ with the timing t2, the pressure regulator 41320 measures the time length t3−t2 with a timer and holds the nitrogen gas pressure $P_{Nech}$ until the timer value reaches the time length t3−t2.

With this, the seed crystal 4005 undergoes etching by the melt mixture 4290 during the interval from the timing t2 to the timing t3.

Further, when the timer value has reached the time length t3−t2, the pressure regulator 4130 adjusts the nitrogen gas pressure in the space 4023 to a nitrogen gas pressure $P_{Ngrth}$ in the region REG2 shown in FIG. 100 at the timing t3, and holds the nitrogen gas pressure in the space 4023 to the nitrogen gas pressure $P_{Ngrth}$ after the timing t3.

With this, the nitrogen gas 4004 in the space 4023 is incorporated into the melt mixture 4290 via the mediating metal Na and growth of the GaN crystal is started. In this case, it should be noted that the concentration of nitrogen or GaxNy (x, y are real numbers) in the melt mixture 4290 takes the maximum value in the vicinity of the vapor-liquid interface 4003 between the space 4023 and the melt mixture 4290, and thus, growth of the GaN crystal starts from the seed crystal 4005 in contact with the vapor-liquid interface 4003. Hereinafter, GaxNy will be designated as "group III nitride" and the concentration of GaxNy will be designated as "concentration of group III nitride".

In the case the nitrogen gas is not supplied to the conduit 4200, the temperature T3 of the seed crystal 4005 is 800° C. and is equal to the temperature of the melt mixture 4290, while in Embodiment 15, the seed crystal 4005 is cooled by supplying a nitrogen gas to the inside of the conduit 4200 for increasing the degree of supersaturation of nitrogen in the melt mixture 4290 in the vicinity of the seed crystal 4005. Thus, the temperature T3 of the seed crystal 4005 is set lower than the temperature of the melt mixture 4290.

More specifically, the temperature of the seed crystal 4005 as represented by the temperature signal T3 is set to a temperature Ts1 lower than 800° C. along the curve k5 after the timing t3. This temperature Ts1 may be the temperature of 790° C. Next, the method of setting the temperature T3 of the seed crystal 4005 to the temperature Ts1 will be explained.

When the temperatures T1, T2 and T3 as measured by the temperature sensors 4071 and 4081 and the thermocouple 4210 have reached the temperature to set the temperature of the seed crystal 4005 and the melt mixture 4280 to 800° C., the temperature control unit 4280 produces a control signal CTL3 for causing to flow a nitrogen gas with an amount such that the temperature T3 of the seed crystal 4003 is set to the temperature Ts1, and supplies the control signal CTL3 to the flow meter 4260.

With this, the flow meter 4260 causes to flow a nitrogen gas from the gas cylinder 4270 to the conduit 4200 via the gas supply line 4250 in response to the control signal CTL3 with a flow rate determined such that the temperature T3 is set to the temperature Ts1. Thus, the temperature of the seed crystal 4005 is lowered from 800° C. generally in proportion to the flow rate of the nitrogen gas, and the temperature T3 of the seed crystal 4005 is set to the temperature Ts1 when the flow rate of the nitrogen gas has reaches a flow rate value fr1 (sccm). Reference should be made to FIG. 101.

Thus, the flow meter 4260 causes the nitrogen gas to the conduit 4200 with the flow rate value fr1. The nitrogen gas thus supplied to the conduit 4200 hits the bottom surface 4051B of the cylindrical member 4051 via the plural apertures 4201 of the conduit 4200.

With this, the seed crystal 4005 is cooled via the bottom surface 4051B of the cylindrical member 4051 and the temperature T3 of the seed crystal 4005 is lowered to the temperature Ts1 with the timing t4. Thereafter, the seed crystal 4005 is held at the temperature Ts1 until a timing t5.

Because the heater temperatures T1 and T2 of the heating units 4070 and 4080 have a predetermined temperature difference to the temperature of the melt mixture 4290, the temperature control unit 4280 controls the heating units 4071 and 4081, when the temperature T3 of the seed crystal 4005 starts to go down from 800° C., by using the control signals CTL1 and CTL2 such that the temperatures T1 and T2 as measured by the temperature sensors 4070 and 4080 become the temperatures in which the temperature of the melt mixture 4290 is set to 800° C.

With this, the GaN crystal is grown preferentially from the seed crystal 4005 in contact with the melt mixture 4290 during the interval from the timing t4 to the timing t5.

In Embodiment 15, it is also possible to set the temperature of the reaction vessel 4010 and the outer reaction vessel 4020 to a temperature Tech higher than the crystal growth temperature of 800° C. along the curve k3 from the timing t2 to the timing t3. This temperature Tech is included in the region REG1 shown in FIG. 100 and may take any temperature as long as it is a temperature higher than 800° C.

Preferably, the temperature T3 of the seed crystal 4005 is controlled, after the timing t3, such that the temperature is lowered along the line k6. Thus, the temperature T3 of the seed crystal 4005 is lowered from 800° C. to the temperature Ts2 (<Ts1) during the interval from the timing t3 to the timing t5. In this case, the flow meter 4260 increases the flow rate of the nitrogen gas supplied to the conduit 4200 from 0 to a flow rate value fr2 along a line k7 based on the control signal CTL3 from the temperature control unit 4280. When the flow rate of the nitrogen gas has become the flow rate value fr2, the temperature T3 of the seed crystal 4005 is set to a temperature Ts2 lower than the temperature Ts1. The temperature Ts2 may be chosen to 750° C.

Thus, by increasing the temperature difference between the temperature of the melt mixture 4290 (=800° C.) and the temperature T3 of the seed crystal 4005 gradually, the degree of supersaturation for nitrogen or the group III nitride in the melt mixture 4290 increases gradually in the vicinity of the seed crystal 4005, and it becomes possible to increase the growth rate of the GaN crystal with crystal growth of the GaN crystal.

In the case of growing a GaN crystal with the crystal growth apparatus 4100, a GaN crystal grown in the crystal growth apparatus 4100 without using the seed crystal 4005 is used for the seed crystal 4005. Thus, the GaN crystal is grown by using the nitrogen gas pressure and the crystal growth temperature in the region REG2 shown in FIG. 100 but without using the seed crystal 4005. In this case, GaN crystals of columnar shape grown in the c-axis direction are obtained on the bottom surface and sidewall surface of the reaction vessel 4010. Further, the seed crystal 4005 is formed by slicing out the GaN crystal of the shape shown in FIGS. 95A and 95B from the numerous GaN crystals formed as a result of the crystal growth process. Thus, a projecting part 4005A of the seed crystal 4005 shown in FIG. 95B is formed of a GaN crystal grown in the c-axis direction (<0001> direction).

The seed crystal 4005 thus formed is fixed upon the support unit 4050 by fitting into the space 4054 of the support unit 4050.

As noted above, Embodiment 15 has the feature of etching the seed crystal 4005 by dipping into the melt mixture 4290 and then carries out the growth of the GaN crystal by dipping the seed crystal 4005 into the melt mixture 4290. In this case, it is also possible to grow the GaN crystal from the seed crystal 4005 in the state the seed crystal 4005 is in the state still dipped in the melt mixture 4290, or the crystal growth of the GaN crystal may be carried out by moving the seed crystal 4005 after etching to the space 4023 from the melt mixture 4290 and again dipping the seed crystal 4290 into the melt mixture 4290

Further, Embodiment 15 has the feature of growing the GaN crystal in the state the nitrogen gas 4004 is confined in the space 4023 of the reaction vessel 4010 and the outer reaction vessel 4020 by the stopper/inlet plug 4060 and the metal melt 4190 (=metal Na melt).

Further, Embodiment 15 has the feature of growing the GaN crystal by setting the temperature T3 of the seed crystal 4005 to the temperature Ts1 or Ts2 lower than the temperature of the melt mixture 4290.

FIG. 102 is a schematic diagram showing the concept of etching of the seed crystal 4005 with Embodiment 15.

Figure 102A:
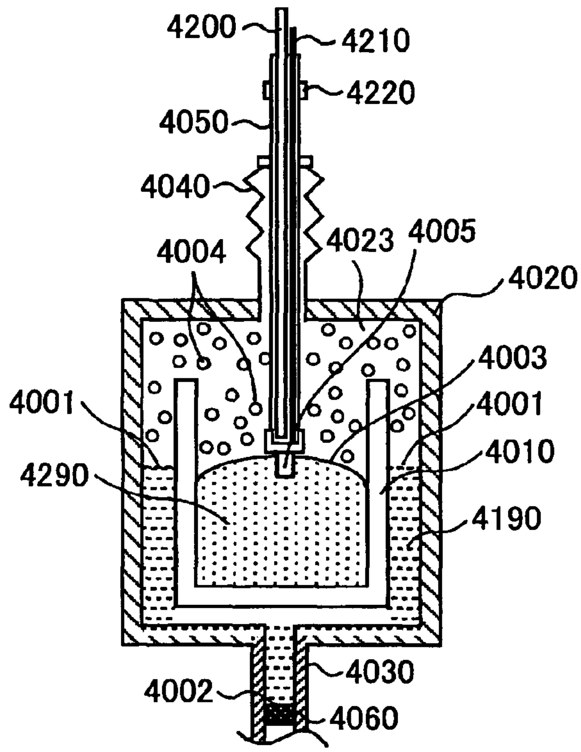
FIGS. 102A and 102B are schematic diagrams showing the concept of etching of seed crystal with Embodiment 15.
Figure 102B:
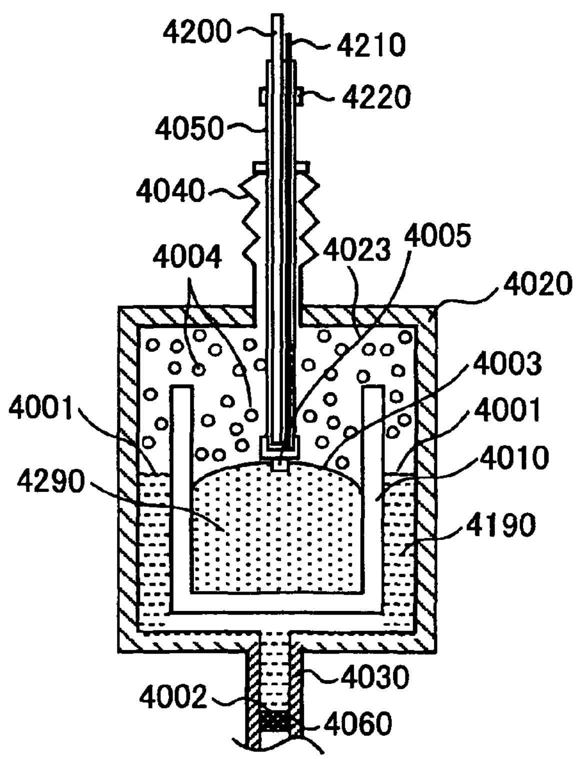

Referring to FIGS. 102A and 102B, the seed crystal 4005 is dipped into the melt mixture 4290 at the timing t2 and the nitrogen gas pressure in the space 4023 is set to the nitrogen gas pressure PNech and the temperature of the melt mixture 4290 is set to 800° C. (or temperature Tech). Reference should be made to FIG. 102A. With this, the seed crystal 4005 is etched by the melt mixture 4290. Further, with the timing t3, the seed crystal 4005 is etched and the length of the projection 4005A is shortened. Reference should be made to FIG. 102B.

With this, the seed crystal 4005 is etched by the melt mixture 4290.

Figure 103:
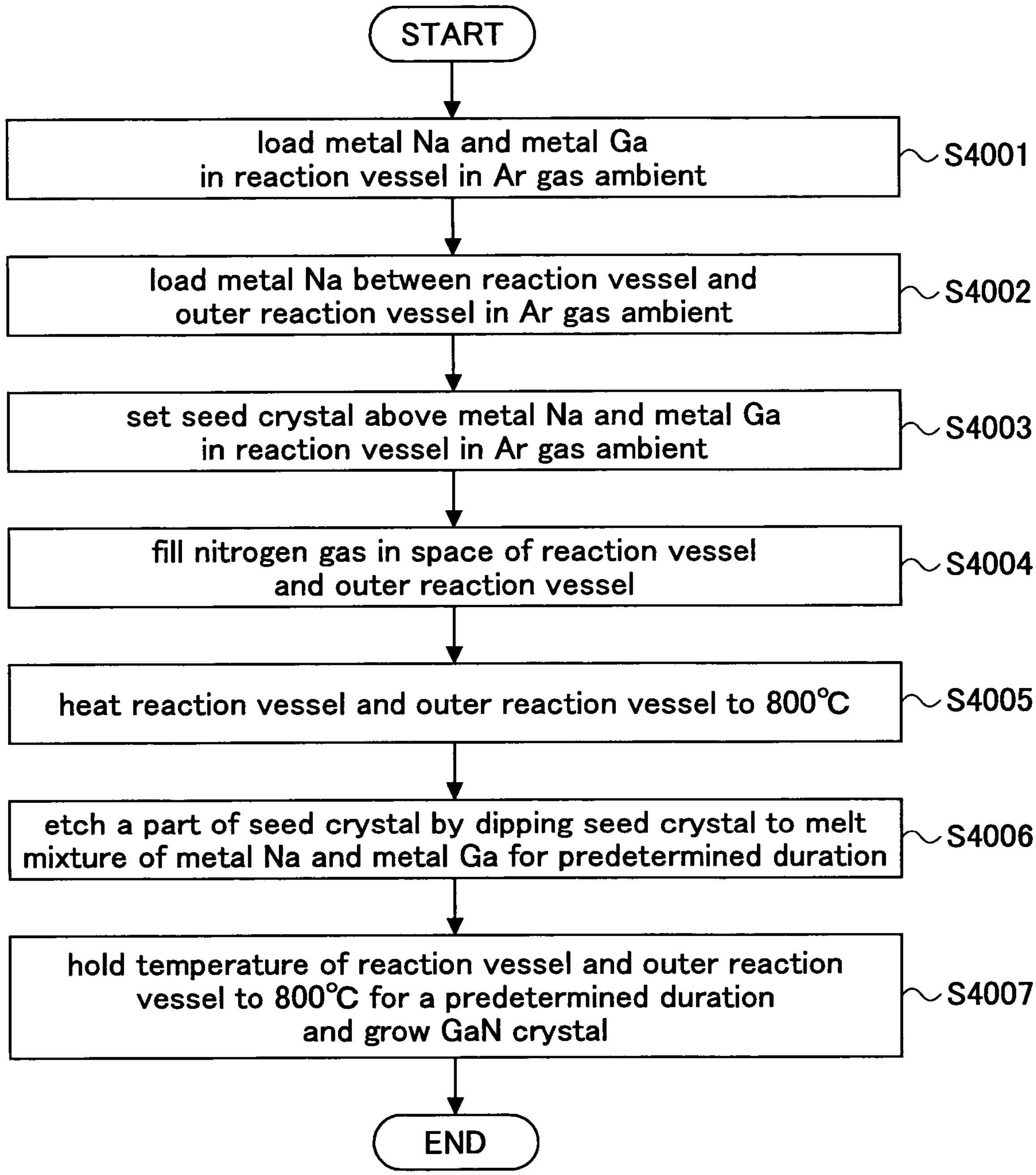
FIG. 103 is a flowchart explaining the manufacturing method of a GaN crystal according to Embodiment 15 of the present invention.

FIG. 103 is a flowchart explaining the manufacturing method of a GaN crystal according to Embodiment 15 of the present invention.

Referring to FIG. 103, the reaction vessel 4010 and the outer reaction vessel 4020 are incorporated into a glove box filled with an Ar gas when a series of processes are started. Further, metal Na and metal Ga are loaded into the reaction vessel 4010 in an Ar gas ambient (Step S4001). In the present case, the metal Na and the metal Ga are loaded into the reaction vessel 4010 with a molar ratio of 5:5. The Ar gas should be the one having a water content of 10 ppm or less and an oxygen content of 10 ppm or less (this applied throughout the present invention).

Further, the metal Na is loaded between the reaction vessel 4010 and the outer reaction vessel 4020 in the ambient of an Ar gas (step S4002). Further, the seed crystal 4005 is set in the ambient of the Ar gas at a location above the metal Na and the metal Ga in the reaction vessel 4010 (step S4003). More specifically, the seed crystal 4005 is set above the metal Na and metal Ga in the reaction vessel 4010 by fitting the seed crystal 4005 to the space 4054 formed at the end 4511 of the support unit 4050. Reference should be made to FIG. 95B. Further, the seed crystal is set above the metal Na and the metal Ga in the reaction vessel 4010.

Next, the reaction vessel 4010 and the outer reaction vessel 4020 are set in the crystal growth apparatus 4100 in the state that the reaction vessel 4010 and the outer reaction vessel 4020 are filled with the Ar gas.

Next, the valve 4160 is opened and the Ar gas filled in the reaction vessel 4010 and the outer reaction vessel 4020 is evacuated by the vacuum pump 4170. After evacuating the interior of the reaction vessel 4010 and the outer reaction vessel 4020 to a predetermined pressure (0.133 Pa or lower) by the vacuum pump 4170, the valve 4160 is closed and the valves 4120 and 4121 are opened. Thereby, the reaction vessel 4010 and the outer reaction vessel 4020 are filled with the nitrogen gas from the gas cylinder 4140 via the gas supply lines 4090 and 4110. In this case, the nitrogen gas is supplied to the reaction vessel 4010 and the outer reaction vessel 4020 via the pressure regulator 4130 such that the pressure inside the reaction vessel 4010 and the outer reaction vessel 4020 becomes about 0.1 MPa.

Further, when the pressure inside the outer reaction vessel 4020 as detected by the pressure sensor 4180 has reached about 0.1 MPa, the valves 4120 and 4121 are closed and the valve 4160 is opened. With this the nitrogen gas filled in the reaction vessel 4010 and the outer reaction vessel 4020 is evacuated by the vacuum pump 4170. In this case, too, the interior of the reaction vessel 4010 and the outer reaction vessel 4020 is evacuated to a predetermined pressure (0.133 Pa or less) by using the vacuum pump 4170.

Further, this vacuum evacuation of the reaction vessel 4010 and the outer reaction vessel 4020 and filling of the nitrogen to the reaction vessel 4010 and the outer reaction vessel 4020 are repeated several times.

Thereafter, the interior of the reaction vessel 4010 and the outer reaction vessel 4020 is evacuated to a predetermined pressure by the vacuum pump 4170, and the valve 4160 is closed. Further, the valves 4120 and 4121 are opened and the nitrogen gas is filled into the reaction vessel 4010 and the outer reaction vessel 4020 by the pressure regulator 4130 such that the pressure of the reaction vessel 4010 and the outer reaction vessel 4020 becomes the range of 1.01-5.05 MPa.

Because the metal Na between the reaction vessel 4010 and the outer reaction vessel 4020 is solid in this state, the nitrogen gas is supplied to the space 4030 inside the outer reaction vessel 4020 also from the space 4031 of the conduit 4030 via the stopper/inlet plug 4060. When the pressure of the space 4023 as detected by the pressure sensor 4180 has become 1.01-5.05 Pa, the valve 4120 is closed.

Thereafter, the reaction vessel 4010 and the outer reaction vessel 4020 are heated to 800° C. by the heating units 4070 and 4080 (step S4005). In this process of heating the reaction vessel 4010 and the outer reaction vessel 4020 to 800° C., the metal melt Na held between the reaction 4010 and the outer reaction vessel 4020 undergoes melting in view of the melting temperature of metal Na of about 98° C., and the metal melt 4190 is formed. Thereby, two vapor-liquid interfaces 1 and 2 are formed. Reference should be made to FIG. 92. The vapor-liquid interface 4002 is located at the interface between the metal melt 4190 and the space 4023 in the outer reaction vessel 4020, while the vapor-liquid interface 4002 is located at the interface between the metal melt 4190 and the stopper/inlet plug 4060.

At the moment the temperature of the reaction vessel 4010 and the outer reaction vessel 4020 is raised to 800° C., the temperature of the stopper/inlet plug 4060 becomes 150° C. This means that the vapor pressure of the metal melt 4190 (=metal Na melt) at the vapor-liquid interface 2 is $7.6\times10^{-4}$ Pa, and thus, there is caused little evaporation of the metal melt 4190 (=metal Na melt) through the gaps 4063 of the stopper/inlet plug 4060. As a result, there occurs little decrease of the metal melt 4190 (=metal Na melt).

Further, even when the temperature of the stopper/inlet plug 4060 is raised to 300° C. or 400° C., the vapor pressure of the metal melt 4190 (=metal Na melt) is only 1.8 Pa and 47.5 Pa, respectively, and decrease of the metal melt 4190 (=metal Na melt) by evaporation is almost ignorable with such a vapor pressure.

Thus, with the crystal growth apparatus 4100, the temperature of the stopper/inlet member 4060 is set to a temperature such that there occurs little decrease of the metal melt 4190 (=metal Na melt) by way of evaporation.

Further, during the process in which the reaction vessel 4010 and the outer reaction vessel 4020 are heated to 800° C., the metal Na and the metal Ga inside the reaction vessel 4010 becomes a liquid, and the melt mixture 4290 of metal Na and metal Ga is formed in the reaction vessel 4010.

Further, when the temperature of the reaction vessel 4010 and the outer reaction vessel 4020 has reached 800° C., a part of the seed crystal 4005 is etched by the melt mixture 4290 by dipping the seed crystal 4005 into the melt mixture 4290 for a predetermined duration (step S4006).

Thereafter, the GaN crystal is grown by holding the temperature of the reaction vessel 4010 and the outer reaction vessel 4020 at 800° C. for a predetermined duration (several ten hours to several hundred hours) (step S4007).

With this, a series of the steps are completed.

Figure 104:
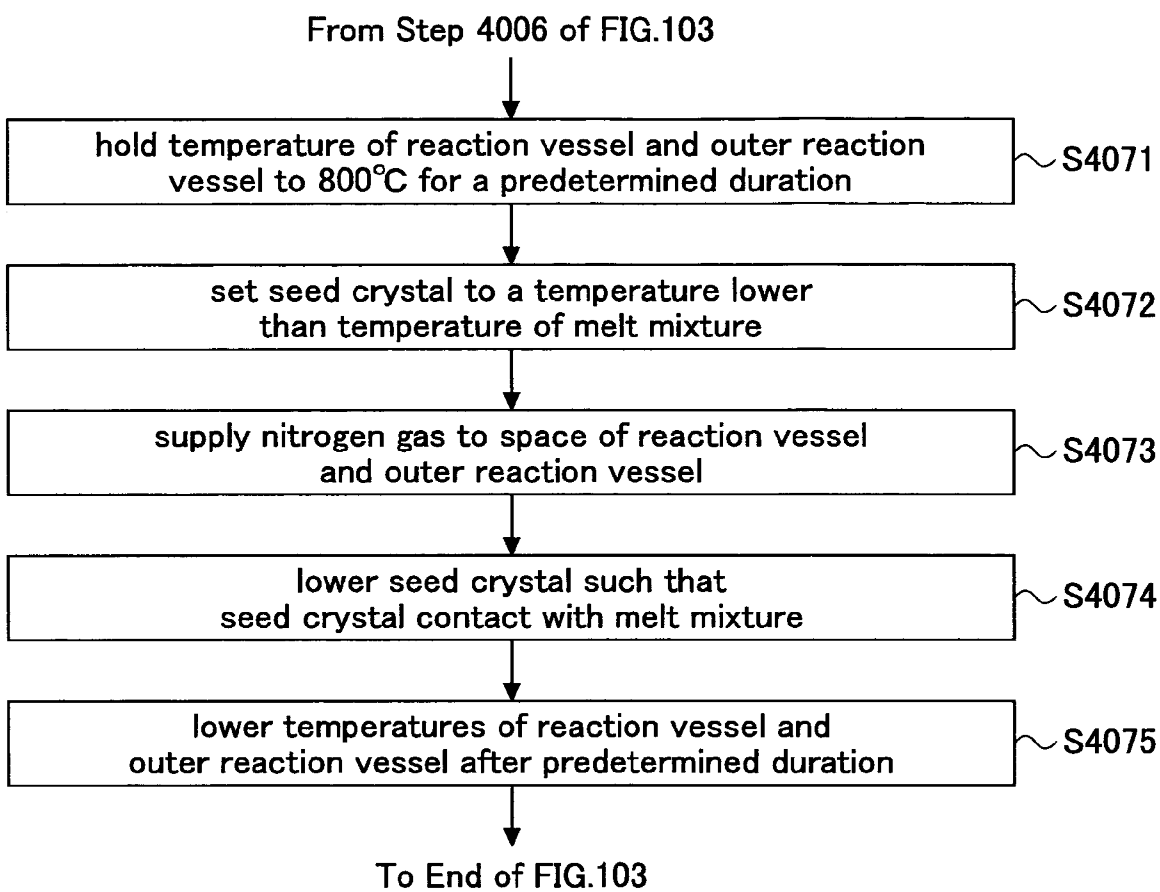
FIG. 104 is a flowchart explaining the detailed operation of the step S4007 in the flowchart shown in FIG. 103.

FIG. 104 is a flowchart for explaining the detailed operation of the step S4007 in the flowchart shown in FIG. 103.

Referring to FIG. 104, when the nitrogen gas pressure in the space 4023 is adjusted to the nitrogen gas pressure $P_{Ngrth}$ after the step S4006 shown in FIG. 103, the nitrogen gas in the space 4023 is incorporated into the melt mixture 4290 via the meditating metal Na, and there starts the growth of the GaN crystal from the seed crystal 4005.

Thereafter, the temperature of the reaction vessel 4010 and the outer reaction vessel 4020 is held at 800° C. for a predetermined duration (several ten hours to several hundred hours) (step S4071), and the temperature T3 of the seed crystal 4005 is set to the temperature Ts1 or Ts2 lower than the temperature of the melt mixture 4290 (=800° C.) according to the method explained above.

Thus, with progress of growth of the GaN crystal, the nitrogen gas in the space 4023 is consumed and there is caused a decrease of the nitrogen gas in the space 4023. Then the pressure P1 of the space 4023 becomes lower than the pressure P2 of the space 4030 inside the conduit 4031 (P1<P2), and there is formed a differential pressure between the space 4023 and the space 4031. Thus, the nitrogen gas in the space 4031 is supplied to the space 4023 consecutively via the stopper/inlet plug 4060 and the metal melt 4190 (=metal Na melt) (step S4073).

Thereafter, the seed crystal 4005 is lowered so as to make a contact with the melt mixture 4290 according to the method explained above (step S4074). With this a GaN crystal of large size is grown.

After the predetermined time has elapsed, the temperatures of the reaction vessel 4010 and the outer reaction vessel 4020 are lowered (step S4075), and manufacturing of the GaN crystal is completed.

Because of the GaN crystal is grown after etching a part of the seed crystal 4005 by dipping the seed crystal 4005 into the melt mixture 4290 of the metal Na and the metal Ga with the manufacturing method of the GaN crystal of the present embodiment, there occurs the growth of the GaN crystal preferentially from the seed crystal 4005 from which the impurities adhered t the surface of the seed crystal 4005 are removed. As a result, it becomes possible to grow a GaN crystal of large size. This GaN crystal is a defect-free crystal having a columnar shape grown in the c-axis direction (<0001> direction).

Further, with the manufacturing method of the GaN crystal of the present embodiment in which the growth of the GaN crystal is made while setting the temperature T3 of the seed crystal 4005 to be lower than the crystal growth temperature (=800° C.), it becomes possible to increase the degree of supersaturation of nitrogen in the melt mixture 4290 in the vicinity of the seed crystal 4005, and the GaN crystal is grown preferentially from the seed crystal 4005. Further, it becomes possible to increase to the growth rate of the GaN crystal.

Further, because the seed crystal 4005 is lowered by the up/down mechanism 4220 with growth of the GaN crystal such that contact of the seed crystal 4005 to the melt mixture 4290 is maintained, it becomes possible to maintain the state in which the growth of the GaN crystal occurs preferentially from the seed crystal 4005. As a result, it becomes possible to grow a GaN crystal of large size.

Further, with the manufacturing method of the GaN crystal according to the present embodiment, the heating unit 4070 heats the reaction vessel 4010 and the outer reaction vessel 4020 such that the temperature T4 at the vapor-liquid interface 4001 between the space 4023 in the outer reaction vessel 4020 and the metal melt 4190 or in the vicinity of the vapor-liquid interface 4001 generally coincides with the temperature T5 at the vapor-liquid interface 4003 between the space 4023 and the melt mixture 4290 or in the vicinity of the vapor-liquid interface 4003.

Thus, by setting the temperature T4 at the vapor-liquid interface 4001 or in the vicinity of the vapor-liquid interface 4001 to be generally coincident to the temperature T5 at the vapor-liquid interface 4003 or in the vicinity of the vapor-liquid interface 4003, there is formed an equilibrium state in the space 4023 between the metal Na vapor evaporated from the metal melt 4190 and the metal Na vapor evaporated from the melt mixture 4290, and it becomes possible to suppress the diffusion of the metal Na vapor in the vicinity of the vapor-liquid interface 4003 in the direction toward the vapor-liquid interface 4001. As a result, it becomes possible to stabilize the molar ratio between the metal Na and the metal Ga in the melt mixture 4290 by suppressing the evaporation of the metal Na from the metal melt 4290 positively, and it becomes possible to manufacture a GaN crystal of large size stably.

Further, with the manufacturing method of the GaN crystal of the present embodiment, it is also possible to heat the reaction vessel 4010 and the outer reaction vessel 4020 such that the temperature T4 becomes higher than the temperature T5. In this case, another heating unit is disposed between the reaction vessel 4010 and the outer reaction vessel 4020 and heating is made to the vapor-liquid interface 4003 or the region in the vicinity of the vapor-liquid interface 4003 to the temperature T5 by heating the reaction vessel 4010 by the heating unit thus disposed and further by heating the vapor-liquid interface 4001 or the region in the vicinity of the vapor-liquid interface 4001 to the temperature T4 by the heating unit 4070.

Thus, by setting the temperature T4 to a temperature higher than the temperature T5, the vapor pressure of the metal Na at the vapor-liquid interface 4001 becomes higher than the vapor pressure of the metal Na at the vapor-liquid interface 4003, and there occurs diffusion of the metal Na vapor from the region in the vicinity of the vapor-liquid interface 4001 to the region in the vicinity of the vapor-liquid interface 4003. As a result, the concentration of the metal Na vapor is increased in the vicinity of the vapor-liquid interface 4003, and it becomes possible to suppress the evaporation of the metal Na from the melt mixture 2490 further. As a result, the molar ratio between the metal Na and the metal ga in the melt mixture 4290 is stabilized and it becomes possible to manufacture a GaN crystal of large size.

Thus, with the crystal growth apparatus 4100, the manufacturing of the GaN crystal is carried out by setting the temperature T4 to be equal to or higher than the temperature T5.

Figure 105:
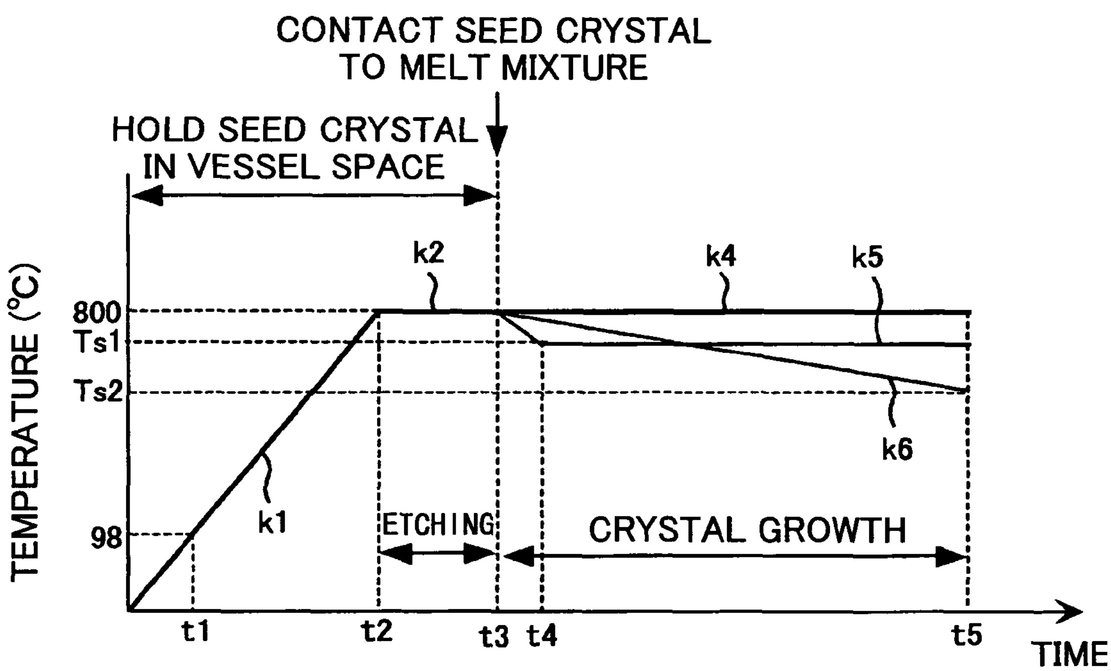
FIG. 105 is a timing chart showing the temperature of the reaction vessel and the outer reaction vessel.
Figure 106A:
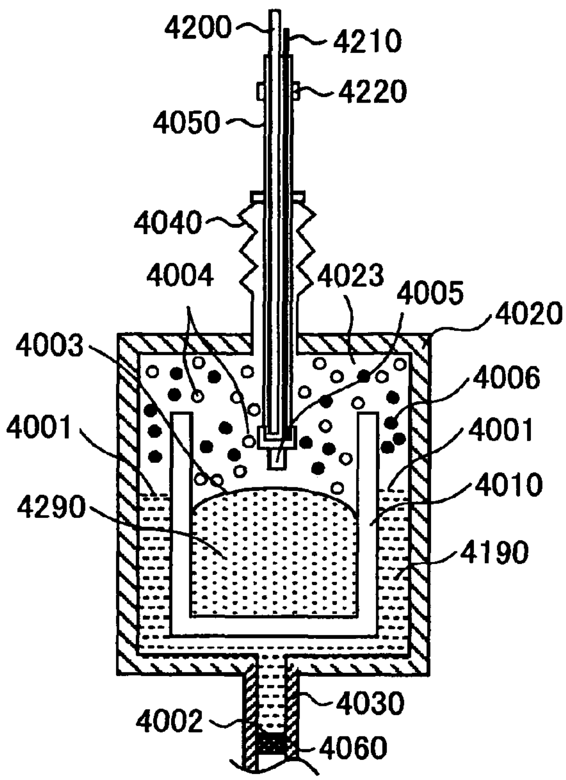
FIGS. 106A and 106B are schematic diagrams showing the concept of etching of seed crystal with Embodiment 15.
Figure 106B:
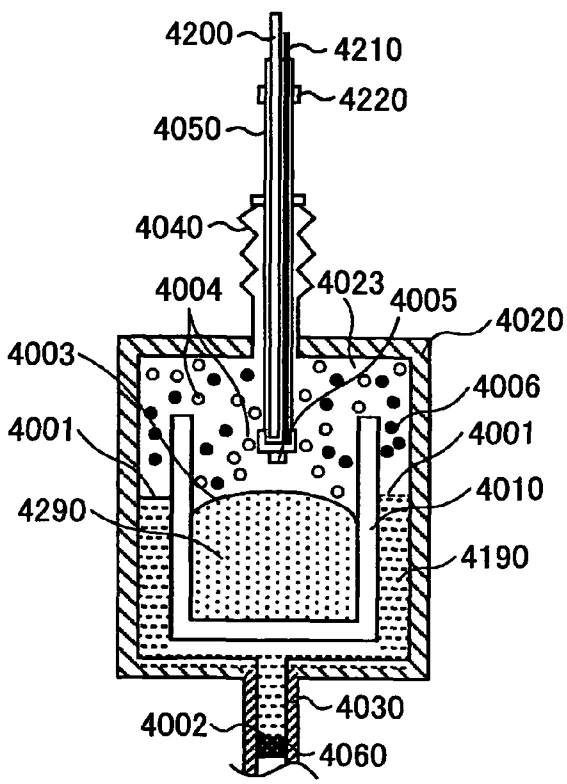

FIG. 105 is another timing chart showing the temperature of the reaction vessel 4010 and the outer reaction vessel 4020. FIGS. 106A and 106B are further schematic diagrams showing the concept of etching of the seed crystal 4005 with Embodiment 15.

Referring to FIG. 105, the heating units 4070 and 4080 heat the reaction vessel 4010 and the outer reaction vessel 4020 such that the temperature rises along the lines k1, k2 and k3 and is held at 800° C. When the heating units 4070 and 4080 start to heat the reaction vessel 4010 and the outer reaction vessel 4020, the temperature of the reaction vessel 4010 and the outer reaction vessel 4020 start to rise and reaches a temperature of 98° C. at the timing t1 and a temperate of 800° C. at the timing t2.

Further, the up/down mechanism 4220 moves the support unit 4050 up or down during the interval from the timing t1 to the timing t2 with the process explained before such that the seed crystal 4005 is held in the space 4023 (=vessel space). Thereafter, the up/down mechanism 4220 suppresses the up/down movement of the support unit 4050 such that the seed crystal 4005 is held in the space 4023 in the interval from the timing t2 to the timing t3. With this, the seed crystal 4005 is held in the space 4023 during the duration up to the timing t3.

At the timing t2, the temperature of the metal melt 4190 and the temperature of the melt mixture 4290 reach 800° C., and the metal Na 2006 evaporates from the metal melt 4190 and the melt mixture 4290 to the space 4023.

With this, the seed crystal 4005 undergoes etching by the metal Na 2006 in the space 4023 (reference should be made to FIGS. 106A and 106B).

Thus, with Embodiment 15, it is possible to configure such that the seed crystal 4005 is etched by the metal Na 4006 in the state held in the space 4023.

Further, upon completion of etching of the seed crystal 4005, the up/down mechanism 4220 moves the support unit 4050 in the downward direction with the timing t3 according to the process explained above such that the seed crystal 4005 makes a contact with the melt mixture 4290.

The explanation after the timing t3 is identical to the explanation after the timing t3 shown in FIG. 98.

Figure 107:
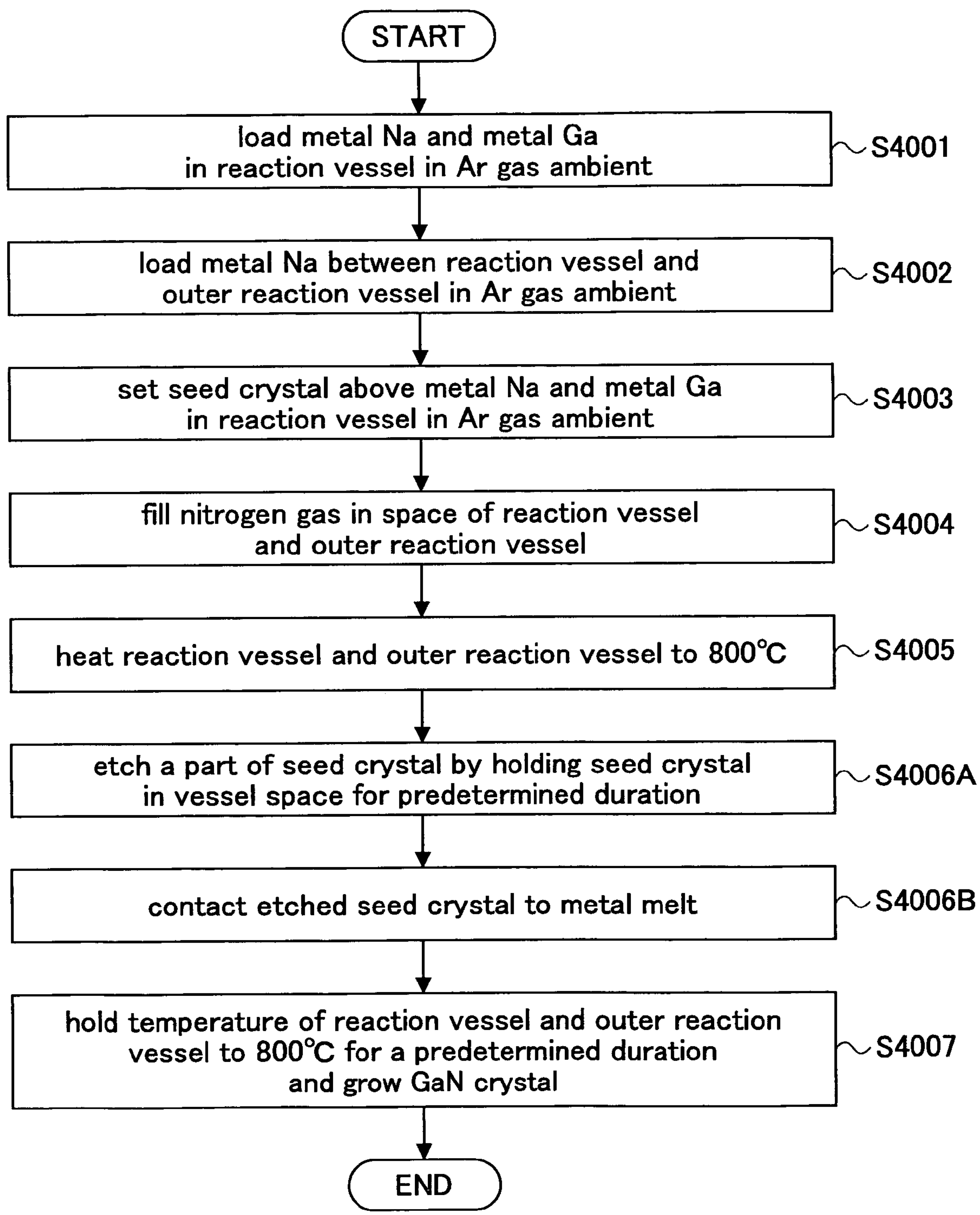
FIG. 107 is a flowchart explaining the manufacturing method of a GaN crystal according to Embodiment 15 of the present invention.

FIG. 107 is another flowchart explaining the manufacturing method of a GaN crystal according to Embodiment 15 of the present invention. It should be noted that the flowchart of FIG. 107 is identical to the flowchart shown in FIG. 103 except that the step S6006 of the flowchart shown in FIG. 103 is replaced with steps S4006A and S4006B.

Referring to FIG. 107, the up/down mechanism moves, after the step S4005, the up/down mechanism 4050 in the upward direction according to the process explained above such that the seed crystal 4005 is held in the space 4023 and suppresses the movement of the support unit 4050 in the upward direction until the timing t3 is reached. With this, the seed crystal 4005 is held in the space 4023 and a part of the seed crystal 4005 is etched by the metal Na 4006 (step S4006A).

Further, upon completion of etching of the seed crystal 4005, the up/down mechanism 4220 moves the support unit 4050 in the downward direction according to the process explained above such that the seed crystal 4005 makes a contact with the melt mixture 4290. With this, the etched seed crystal 4005 is contacted with the melt mixture (step S4006B). Thereafter, the foregoing step S4007 is carried out and manufacturing of the GaN crystal is completed.

Thus, with the crystal growth apparatus 4100 of Embodiment 15, it is also possible to etch the seed crystal 4005 in the state held in the space 4023 and conduct the crystal growth of the GaN crystal by making the etched seed crystal 4005 with the melt mixture 4290.

Figure 108:
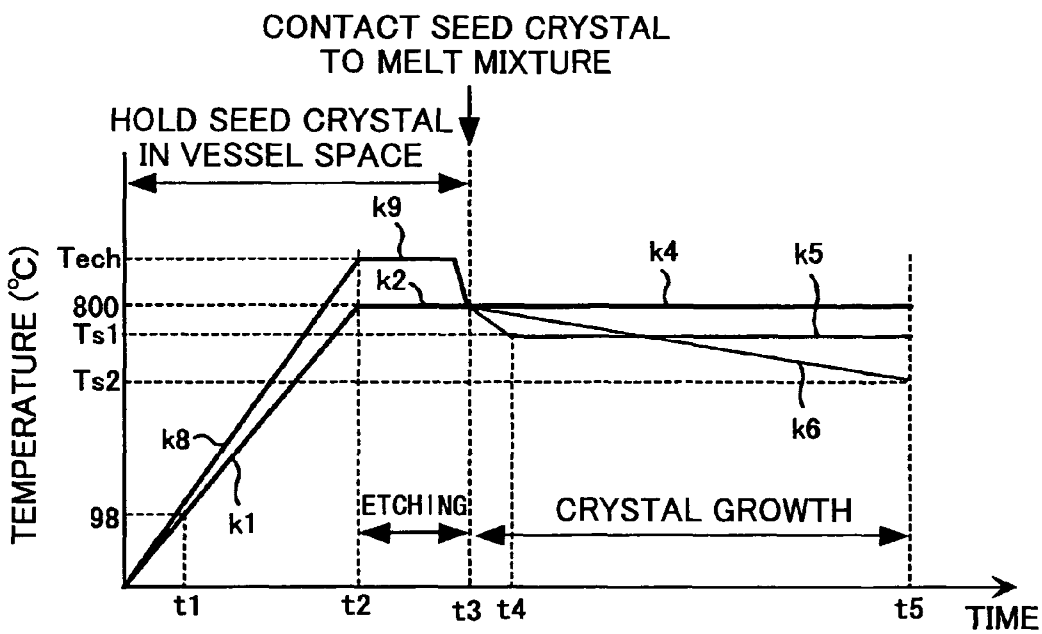
FIG. 108 is another timing chart showing the temperature of the reaction vessel and the outer reaction vessel.

FIG. 108 is another timing chart showing the temperature of the reaction vessel 4010 and the outer reaction vessel 4020.

Referring to FIG. 108, the heating units 4070 heats the reaction vessel 4010 and the outer reaction vessel 4020 such that the temperature rises along the lines k8, k4 and k9 and is held at the temperature Tech and then at the temperature 800° C. Further, the heating unit 4070 heats the reaction vessel 4010 and the outer reaction vessel 4020 such that the temperature thereof rises along the lines k1, k2 and k3 and is held at 800° C.

When the heating units 4070 and 4080 start to heat the reaction vessel 4010 and the outer reaction vessel 4020, the temperature of the reaction vessel 4010 and the outer reaction vessel 4020 start to rise and reaches a temperature of 98° C. at the timing t1 and a temperate of 800° C. or higher at the timing t2.

In this case, the metal melt 4190 in the vicinity of the vapor-liquid interface 4001 and the melt mixture 4290 in the vicinity of the vapor-liquid interface 4003 are heated to the temperature Tech higher than the crystal growth temperature of 800° C. at the timing t2.

Further, the up/down mechanism 4220 moves the support unit 4050 in the upward direction according to the process noted before during the timing t1 and the timing t2 such that the seed crystal 4005 is held in the space 4023 (=vessel space), and stops the up/down movement of the support unit 4050 during the interval from the timing t2 to the timing t3 such that the seed crystal 4005 is held in the space 4023. Further, the heating unit 4070 heats the reaction vessel 4010 and the outer reaction vessel 4020 to the temperature Tech during the interval from the timing t2 to the timing t3.

Thus, the seed crystal 4005 is etched by the metal Na vapor 4006 evaporated from the metal melt 4190 and the melt mixture 4290 into the space 4023 during the interval from the timing t2 to the timing t3 (see FIGS. 106A and 106B).

In this case, the melt mixture 4190 in the vicinity of the vapor-liquid interface 4001 and the melt mixture 4290 in the vicinity of the vapor-liquid interface 4003 are heated to the temperature Tech higher than the crystal growth temperature of 800° C., and thus, the vapor pressure of the metal Na 4006 in the space 4023 becomes higher than the case shown in FIG. 105. Thus, the seed crystal 4005 is etched with a rate larger than in the case shown in FIG. 105.

Further, when the etching of the seed crystal 4005 is completed, the up/down mechanism 4220 moves the support unit 4050 according to the process explained before such that the seed crystal 4005 makes a contact with the melt mixture 4290, and the heating unit 4070 heats the reaction vessel 4010 and the outer reaction vessel 4020 to 800° C. according to the line k4. As a result, the temperature of the reaction vessel 4010 and the outer reaction vessel 4020 becomes 800° C. at the timing t3, and the seed crystal 4005 is in the sate of making a contact with the metal mixture 4290.

Further, the explanation after the timing t3 is identical to the explanation after the timing t3 shown in FIG. 98.

Figure 109:
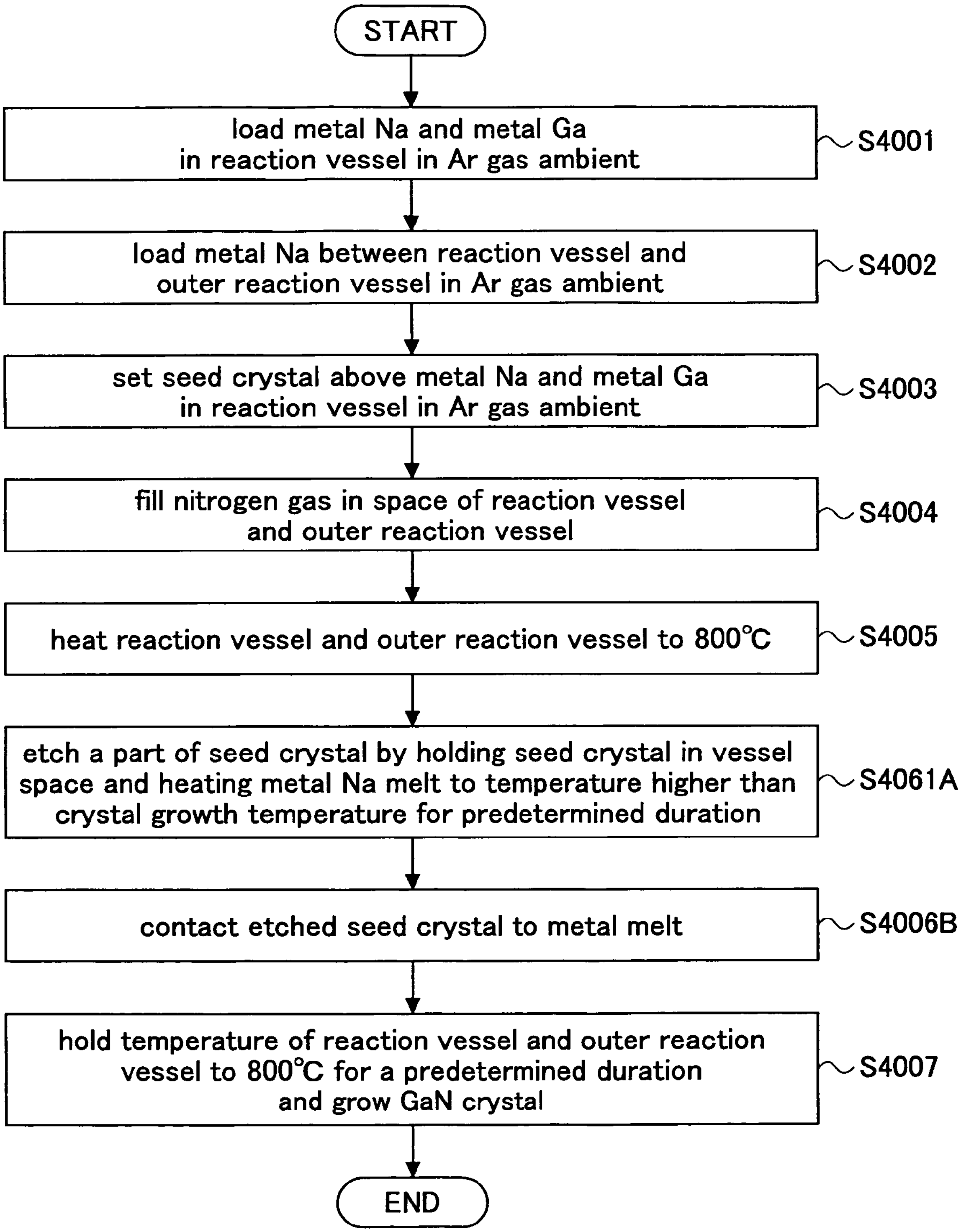
FIG. 109 is a flowchart explaining the manufacturing method of a GaN crystal according to Embodiment 15 of the present invention.

FIG. 109 is a still other flowchart explaining the manufacturing method of a GaN crystal according to Embodiment 15 of the present invention. It should be noted that the flowchart of FIG. 109 is identical to the flowchart shown in FIG. 107 except that the step S4006A of the flowchart shown in FIG. 107 is replaced with a step S4061A.

Referring to FIG. 109, the up/down mechanism moves, after the step S4005, the up/down mechanism 4050 in the upward direction according to the process explained above such that the seed crystal 4005 is held in the space 4023 and suppresses the movement of the support unit 4050 in the upward direction until the timing t3 is reached. Further, the heating unit 4070 heats the reaction vessel 4010 and the outer reaction vessel 4020 to the temperature Tech higher than the crystal growth temperature of 800° C. during the interval from the timing t2 to the timing t3. With this, the seed crystal 4005 is held in the space 4023 and a part of the seed crystal 4005 is etched by the temperature Tech higher than the crystal growth temperature (step S4061A). Thereafter, the foregoing steps S4006B and S4007 are carried out and manufacturing of the GaN crystal is completed.

Thus, with the crystal growth apparatus 4100 of Embodiment 15, it is also possible to etch the seed crystal 4005 in the state held in the space 4023 at the temperature higher than the crystal growth temperature and then cause the crystal growth of the GaN crystal by making the etched seed crystal 4005 to contact with the melt mixture 4290.

Thus, according to Embodiment 15, the GaN crystal is grown by etching the seed crystal 4005 in the state dipped into the melt mixture 4290 or in the state held in the space 4023 and by contacting the etched seed crystal with the melt mixture 4290, it becomes possible to achieve the crystal growth of the GaN crystal by removing the impurities adhered to the surface of the seed crystal, and it becomes possible to manufacture a high quality and large size GaN crystal continuously from the seed crystal 4005.

Further, while the present embodiment has been explained for the case in which the support unit 4050 is applied with vibration and the seed crystal 4005 or the GaN crystal 4003 is controlled to make a contact with the melt mixture 4290 while detecting the vibration of the support unit 4050, the present embodiment is not limited to such a construction and it is also possible to cause the seed crystal 4005 or the GaN crystal 1006 to make a contact with the melt mixture 4290 by detecting the location of the vapor-liquid interface 4003. In this case, an end of a conductor wire is connected to the outer reaction vessel 4020 from the outside and the other end is dipped into the melt mixture 4290. Further, an electric current is caused to flow through the conductor wire in this state and location of the vapor-liquid interface 4003 is detected in terms of the length of the conductor wire in the outer reaction vessel 4020 in which there has been noted a change of the current from Off to On.

Thus, when the other end of the conductor wire is dipped into the melt mixture 4290, there is caused conduction of the current through the melt mixture 4290, the reaction vessel 4010, the metal melt 4190 and the outer reaction vessel 4020, while when the other end is not dipped into the melt mixture 4290, no current flows through the conductor wire.

Thus, it is possible to detect the location of the vapor-liquid interface 4003 by the length of the conductor wire inserted into the outer reaction vessel 4020 for the case of causing the change of state of the electric current from Off to On. When the location of the vapor-liquid interface 4003 is detected, the up/down mechanism 4220 lowers the seed crystal 4005 or the GaN crystal to the location of the detected vapor-liquid interface 4003.

Further, it is also possible to detect the location of the vapor-liquid interface 4003 by emitting a sound to the vapor-liquid interface 4003 and measuring the time for the sound to go and back to and from the vapor-liquid interface 4003.

Further, it is possible to insert a thermocouple into the reaction vessel 4010 from the outer reaction vessel 4020 and detect the location of the vapor-liquid interface 4003 from the length of the thermocouple inserted into the outer reaction vessel 4020 at the moment when the detected temperature has been changed.

Further, while the temperature of the seed crystal 4005 has been set lower than the temperature of the metal melt 4290 by cooling the seed crystal 4005, it is also possible with the present embodiment to provide a heater in the conduit 4200 and control the temperature of the seed crystal 4005 by using this heater. In the case the reaction vessel 4010 and the outer reaction vessel 4020 are heated by the heating units 4070 and 4080, there are cases in which the temperature of the seed crystal does not rise similarly to the temperature of the melt mixture 4290. In such a case, the seed crystal 4005 is heated by the heater disposed in the conduit 4200 and the temperature of the seed crystal 4005 is controlled so as to change along the curve k5 or line k6 shown in FIGS. 98, 105 and 108.

Thus, with Embodiment 15, it is possible to control the heating units 4070 and 4080 and the heater in the conduit 4200 such that the difference between the temperature in the melt mixture 4290 and the temperature of the seed crystal 4005 becomes equal to the temperature difference between the line k1 an the curve k5 or the temperature difference between the line k1 and the line k6 shown in FIGS. 98, 105 and 108.

Further, while it has been explained that the height H of the projection 4062 of the stopper/inlet plug 4060 and the separation d between the projections 4062 are explained as several ten microns, it is possible that the height H of the projection 4062 and the separation d between the projections 4062 may be determined by the temperature of the stopper/inlet plug 4060. More specifically, when the temperature of the stopper/inlet plug 4060 is relatively high, the height H of the projection 4062 is set relatively higher and the separation d between the projections 4062 is set-relatively smaller. Further, when the temperature of the stopper/inlet plug 4060 is relatively low, the height H of the projection 4062 is set relatively lower and the separation d between the projections 4062 is set relatively larger. Thus, in the case the temperature of the stopper/inlet plug 4060 is relatively high, the size of the gap 4063 between the stopper/inlet plug 4060 and the conduit 4030 is set relatively small, while in the case the temperature of the stopper/inlet plug 4060 is relatively high, the size of the gap 4063 between the stopper/inlet plug 4060 and the conduit 4030 is set relatively larger.

It should be noted that the size of the cap 4063 is determined by the height H of the projection 4062 and the separation d between the projections 4062, while the size of the gap 4063 capable of holding the metal melt 4190 by the surface tension changes depending on the temperature of the stopper/inlet plug 4060. Thus, the height H of the projection 4062 and the separation d between the projections 4062 are changed depending on the temperature of the stopper/inlet plug 4060 and with this, the metal melt 4190 is held reliably by the surface tension.

The temperature control of the stopper/inlet valve 4060 is achieved by the heating unit 4080. Thus, when the stopper/inlet plug 4060 is to be heated to a temperature higher than 150° C., the stopper/inlet plug 4060 is heated by the heating unit 4080.

Further, with the present embodiment, the gas cylinder 4140, the pressure regulator 4130, the gas supply lines 4090 and 4110, the conduit 4030, the stopper/inlet plug 4060 and the metal melt 4190 constitute the "gas supply unit".

Further, the melt mixture 4290, the support unit 4050, the pressure regulator 4130 and the up/down mechanism 4220 constitute the "etching apparatus".

Further, the melt mixture 4190, the support unit 4050 and the up/down mechanism 4220 constitute the "etching apparatus".

Further, the melt mixture 4190, the support unit 4050, the heating unit 4070 and the up/down mechanism 4220 constitute the "etching apparatus".

Further, the gas cylinder 4270, the flow meter 4260, the gas supply line 4250, the conduit 4200 and the cylindrical member 4051 constitute the "cooling unit".

Further, the gas cylinder 4270, the flow meter 4260,-the gas supply line 4250, the conduit 4200 and the cylindrical member 4051 constitute the "temperature setting unit".

Further, the up/down mechanism 4220 constitutes the "moving unit".

Further, the heater set in the conduit 4200 constitutes the "temperature setting unit".

Embodiment 16

Figure 110:
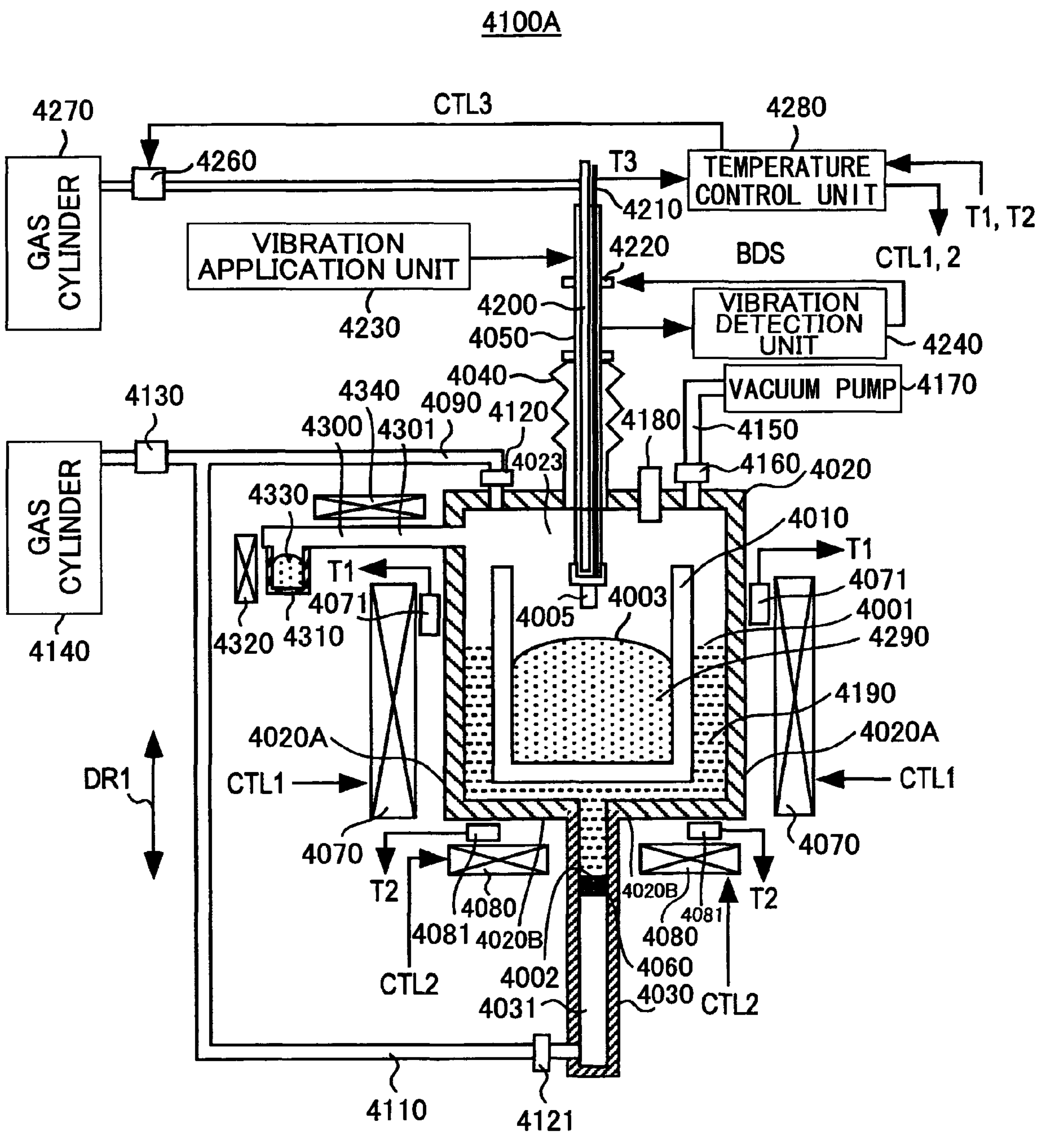
FIG. 110 is a schematic cross-sectional diagram showing the construction of a crystal growth apparatus according to Embodiment 16 of the present invention.

FIG. 110 is a schematic cross-sectional diagram showing the construction of a crystal growth apparatus according to Embodiment 16 of the present invention.

Referring to FIG. 110, the crystal growth apparatus 4100A has a construction generally identical with the construction of the crystal growth apparatus 4100 shown in FIG. 92, except that the a conduit 4300, an outer vessel 4310, heating units 4320 and 4349 and a metal melt 4330 are added to the crystal growth apparatus 4100 shown in FIG. 92.

Referring to FIG. 110, the conduit 4300 is connected such that an end thereof communicates with the space 4023 and the other hand is connected to the outer vessel 4310. The outer vessel 4310 is connected to an opening provided to the other end of the conduit 4300. The heating unit 4320 is disposed so as to face the outer vessel 4310. The heating unit 4340 is disposed so as to face the conduit 4300.

The outer vessel 4310 holds the metal melt 4330 of metal Na. The heating unit 4320 heats the outer vessel 4310 to a temperature Tech higher than the crystal growth temperature. The heating unit 4340 heats the conduit 4300 to a temperature Tech higher than the crystal growth temperature.

When the outer vessel 4310 is heated to the temperature Tech higher than the crystal growth temperature, there occurs evaporation of the metal Na from the metal melt 4330 held by the outer vessel 4310, while the metal Na causes diffusion through the space 4301 in the conduit 4300 and teaches the space 4023 of the outer reaction vessel 4020. Further, the metal Na reached the space 4023 causes etching in a part of the seed crystal 4005.

In this case, the conduit 4300 and the outer reaction vessel 4310 are heated to the temperature Tech higher than the crystal growth temperature, and thus, the vapor pressure of metal Na in the conduit 4300 is higher than the vapor pressure of metal Na in the space 4023. Thus, the metal Na evaporated from the metal melt 4330 tends to cause diffusion from the space 4023 into the space 4023 in the outer reaction vessel 4020.

In the case of growing the GaN crystal by using the crystal growth apparatus 4100A, the heating units 4070 and 4080 are heated to 800° C. according to the line k1 shown in FIG. 108, wherein the heating units 4070 and 4080 heat the reaction vessel 4010 and the outer reaction vessel 4020 along the lines k2 and k4 such that the reaction vessel 4010 and the outer reaction vessel 4020 are held at 800° C.

Further, the heating unit 4320 is heated to the temperature Tech higher than 800° C. along the line k8 shown in FIG. 108 while the heating unit 4320 heats the outer vessel 4310 along the line k4 such that the outer vessel 4310 is held at 800° C.

Further, the heating unit 4340 is heated to the temperature Tech higher than 800° C. along the line k8 shown in FIG. 108 while the heating unit 4340 heats the conduit 4300 along the line k4 such that the conduit 4300 is held at 800° C.

Thus, a part of the seed crystal 4005 is etched during the interval from the timing t2 to the timing t3 before commencement of crystal growth of the GaN crystal by the metal Na evaporated from the metal melt 4330 in the state that the seed crystal 4005 is held in the space 4023.

Further, when the etching of the seed crystal 4005 is over at the timing t3, the seed crystal 4005 thus etched is contacted with the melt mixture 4290 by the up/down mechanism 4220 and there occurs preferential growth of the GaN crystal from the seed crystal 4005.

Thus, by holding the metal melt 4330 different from the metal melt 4190 used for introducing the nitrogen gas into the space 4023 of the outer reaction vessel 4020, in the outer vessel 4310, heating the conduit 4300 and the outer vessel 4310 to the temperature Tech higher than the crystal growth temperature, and by causing diffusion of the metal Na evaporated from the metal melt 4330 into the space 4030 of the outer reaction vessel 4020, it becomes possible to carry out the etching of a part of the seed crystal 4005 by the metal Na while suppressing evaporation of the metal Na from the melt mixture 4290 used for the crystal growth of the GaN crystal.

As a result, it becomes possible to conduct crystal growth of the GaN crystal while holding the molar ratio of the metal Na and the metal Ga loaded to the reaction vessel 4010 to about 5:5, and it becomes possible to manufacture a high quality GaN crystal of large size.

In the case of growing the GaN crystal by using the crystal growth apparatus 4100A, the metal Na and the metal Ga are loaded into the reaction vessel 4010 in an Ar gas ambient while using the glove box, and the metal Na is loaded between the reaction vessel 4010 and the outer reaction nvessel 4020 in the Ar gas ambient. Further, the seed crystal 4005 is fixed upon the support unit 4050 in the Ar gas ambient.

Thereafter, the reaction vessel 4010, the outer reaction vessel 4020, the conduit 4300 and the outer reaction vessel 4310 are set in the crystal growth apparatus 4100A in the state the space 4023 of the outer reaction vessel 4020, the space 4301 of the conduit 4300 and the outer vessel 4310 are filled with the Ar gas.

Further, after opening the valve 4160 and evacuating the interior of the reaction vessel 4010 and the outer reaction vessel 4020 to a predetermined pressure (0.133Pa or lower) by the vacuum pump 4170, the valve 4160 is closed and the valves 4120 and 4121 are opened. Thereby, the reaction vessel 4010, the outer reaction vessel 4020, the conduit 4300 and the outer vessel 4310 are filled with the nitrogen gas from the gas cylinder 4140 via the gas supply line 4090. In this case, the nitrogen gas is supplied to the reaction vessel 4010, the outer reaction vessel 4020, the conduit 4300, and further to the outer vessel 4310 via the pressure regulator 4130 such that the pressure inside the reaction vessel 4010, the outer reaction vessel 4020, the conduit 4300 and the outer reaction 4310 becomes about 0.1 MPa.

Further, when the pressure inside the reaction vessel 4010, the outer reaction vessel 4020, the conduit 4300 and the outer vessel 4310 as detected by the pressure sensor 4180 has reached about 0.1 MPa, the valves 4120 and 4121 are closed and the valve 4160 is opened. With this the nitrogen gas filled in the reaction vessel 4010, the outer reaction vessel 4020, the conduit 4300 and the outer vessel 4310 is evacuated by the vacuum pump 4170. In this case, too, the interiors of the reaction vessel 4010, the outer reaction vessel 4020, the conduit 4300 and the outer vessel 4310 are evacuated to a predetermined pressure (0.133 Pa or less) by using the vacuum pump 4170.

Further, this vacuum evacuation of the reaction vessel 4010, the outer reaction vessel 4020, the conduit 4300 and the outer vessel 4310 and filling of the nitrogen to the reaction vessel 4010, the reaction vessel 4020, the conduit 4300 and the outer vessel 4310 are repeated several times.

Thereafter, the interior of the reaction vessel 4010, the outer reaction vessel 4020, the conduit 4300 and the outer vessel 4310 is evacuated to a predetermined pressure by the vacuum pump 4170, and the valve 4160 is closed. Further, the valves 4120 and 4121 are opened and the nitrogen gas is filled into the reaction vessel 4010, the outer reaction vessel 4020, the conduit 4300 and the outer vessel 4310 by the pressure regulator 4130 such that the pressure of the reaction vessel 4010, the outer reaction vessel 4020, the conduit 4300 and the outer vessel 4310 becomes the range of 1.01-5.05 MPa.

When the pressure as detected by the pressure sensor 4180 has become 1.01-5.05 Pa, the valve 4120 is closed.

When filling of the nitrogen gas into the reaction vessel 4010, the outer reaction vessel 4020, the conduit 4300 and the outer reaction vessel 4310 is completed, the reaction vessel 4010 and the outer reaction vessel 4020 are heated by the heating units 4070 and 4080 to 800° C., and the temperature of the reaction vessel 4010 and the outer reaction vessel 4020 is held at 800° C. thereafter for several ten hours to several hundred hours. Further, the outer vessel 4310 is heated to the temperature Tech higher than 800° C. by the heating unit 4320 along the line k8, the curve k9 and the line k4, and the temperature of the outer reaction vessel 4310 is held at 800° C. Further, the conduit 4300 is heated to the temperature Tech higher than 800° C. by the heating unit 4340 along the line k8, the curve k9 and the line k4, and the temperature of the outer reaction vessel 4300 is held at 800° C. thereafter.

With this, the metal Na and the metal Ga loaded into the reaction vessel 4010 undergoes melting with heating of the reaction vessel 4010 and the melt mixture 4290 is formed in the reaction vessel 4010. Further, the metal Na loaded between the reaction vessel 4010 and the outer reaction vessel 4020 undergoes melting and the metal melt 4190 is formed as a result. Further, the metal melt loaded into the outer vessel 4310 undergoes melting and the metal melt 4330 is formed.

The nitrogen gas existing in the outer reaction vessel 4020, the conduit 4300 and the outer reaction vessel 4310 cannot pass through the metal melt 4190 and is confined in the spaces 4023 and 4301.

Further, the up/down mechanism 4220 moves the support unit 5040 during the interval in which the outer vessel 4310 is heated to the temperature Tech, and the seed crystal 4005 is held in the space 4023. Further, when the outer vessel 4310 is heated to the temperature Tech, the seed crystal 4005 is etched by the metal Na evaporated from the metal melt 4330.

Further, upon completion of etching of the seed crystal 4005, the up/down mechanism 4220 moves the support unit 4050 up or down according to the process explained above such that the seed crystal 4005 makes a contact with the melt mixture 4290.

With this, there occurs preferential growth of the GaN crystal from the seed crystal 4005. Thereafter, as explained with reference to Embodiment 15, the nitrogen gas is introduced into the space 4023 via the stopper/inlet plug 4060 and the metal melt 4190, and there proceeds the growth of the GaN crystal.

As a result, it becomes possible to achieve crystal growth of a large GaN crystal similarly to the case of the crystal growth apparatus 4100 shown in FIG. 92.

Figure 111:
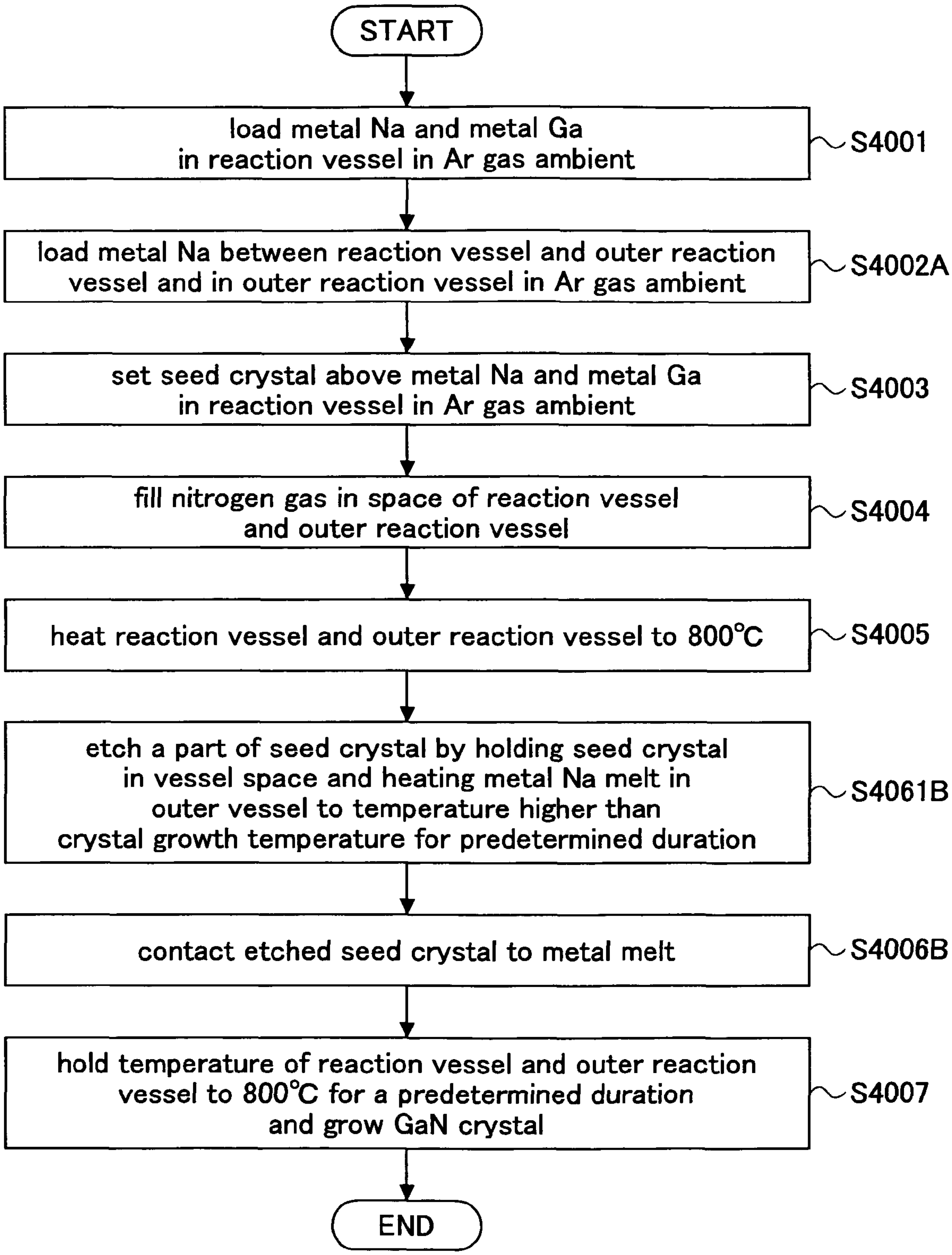
FIG. 111 is a flowchart explaining the manufacturing method of a GaN crystal according to Embodiment 16 of the present invention.

FIG. 111 is a flowchart explaining the manufacturing method of a GaN crystal according to Embodiment 16 of the present invention. It should be noted that the flowchart of FIG. 111 is identical to the flowchart shown in FIG. 109 except that the step S2061A of the flowchart shown in FIG. 109 is replaced with a step S2061B.

Referring to FIG. 111, the seed crystal 4005 is held in the space 4023 after the step S4005 according to the process explained before for a predetermined duration, and a part of the seed crystal 4005 is etched by heating the metal melt 4330 (metal Na melt) in the outer vessel 4310 to the temperature Tech higher than the crystal growth temperature (step S4061B)

Thereafter, the foregoing steps S4006B and S4007 are carried out and manufacturing of the GaN crystal is completed.

With Embodiment 16, it is also possible to hold the temperature of the conduit 4300 and the outer vessel 4310 at the temperature Tech during the interval from the timing t3 when the etching of the seed crystal 4005 is over to the timing t5 when the crystal growth of the GaN crystal is over (reference should be made to FIG. 108).

With this, it becomes possible to suppress the evaporation of the metal Na from the metal mixture 4290 as a result of the metal Na evaporated from the metal melt 4330 causing diffusion into the space 4023, and it becomes possible to maintain the molar ratio of about 5:5 between the metal Na and the metal Ga in the melt mixture 4290. As a result, it becomes possible to grow a GaN crystal of high quality and large size.

With Embodiment 16, it should be noted that the conduit 4300, the outer vessel 4310, the heating units 4320 and 4340 and the metal melt 4330 constitute the “etching unit”.

Otherwise, the present embodiment is identical to Embodiment 15.

Embodiment 17

Figure 112:
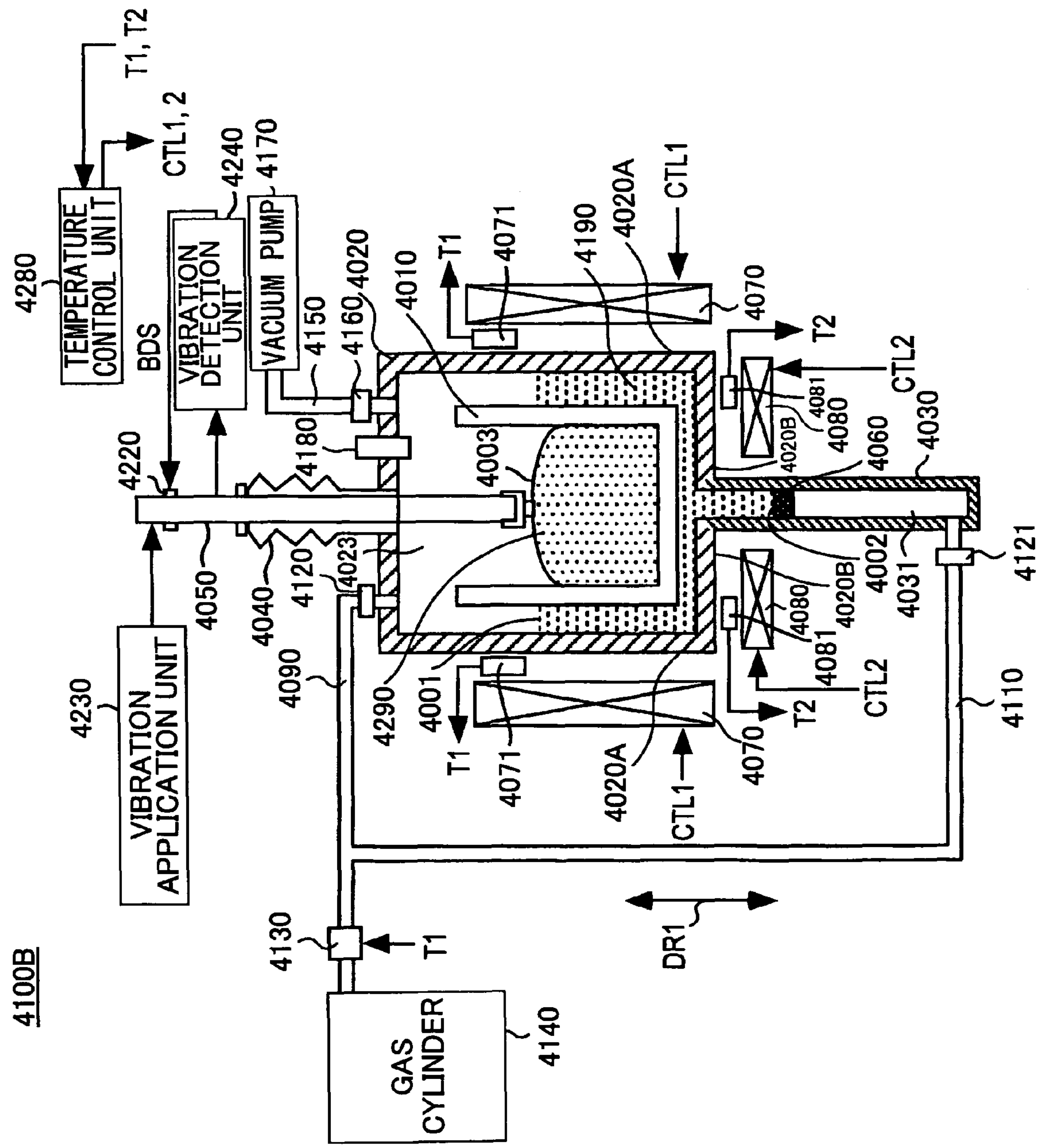
FIG. 112 is a schematic cross-sectional diagram showing the construction of a crystal growth apparatus according to Embodiment 17 of the present invention.

FIG. 112 is a schematic diagram showing the construction of a crystal growth apparatus according to Embodiment 17 of the present invention.

Referring to FIG. 112, the crystal growth apparatus 4100B of Embodiment 17 has a construction generally identical with the construction of the crystal growth apparatus 4100 shown in FIG. 92, except that the conduit 4200, the thermocouple 4210, the gas supply line 4250, the flow meter 4260 and the gas cylinder 4270 are removed.

With the crystal growth apparatus 4100B, the function of controlling the temperature of the seed crystal 4005 to a temperature lower than the temperature of the metal mixture 4290 after the reaction vessel 4010 and the outer reaction vessel 4020 are heated to the crystal growth temperature (=800° C.) is omitted, and thus, the temperature of the seed crystal 4005 is held at 800° C. during the crystal growth of the GaN crystal.

In the case of growing the GaN crystal by using the crystal growth apparatus 4100B, the metal Na and the metal Ga are loaded into the reaction vessel 4010 in an Ar gas ambient while using the glove box, and the metal Na is loaded between the reaction vessel 4010 and the outer reaction vessel 4020 in the Ar gas ambient. Further, the seed crystal 4005 is fixed upon the support unit 4050 in the Ar gas ambient.

Thereafter, the reaction vessel 4101 and the outer reaction vessel 4020 are set to the crystal growth apparatus 4100B in the state the space 4023 in the outer reaction vessel 4020 is filled with the Ar gas.

Further, after opening the valve 4160 and evacuating the interior of the reaction vessel 4010 and the outer reaction vessel 4020 to a predetermined pressure (0.133 Pa or lower) by the vacuum pump 4170 via the evacuation line 4150, the valve 4160 is closed and the valves 4120 and 4121 are opened. Thereby, the reaction vessel 4010 and the outer reaction vessel 4020 are filled with the nitrogen gas from the gas cylinder 4140 via the gas supply lines 4090 and 4110. In this case, the nitrogen gas is supplied to the reaction vessel 4010 and the outer reaction vessel 4020 via the pressure regulator 4130 such that the pressure inside the reaction vessel 4010 and the outer reaction vessel 4020 becomes about 0.1 MPa.

Further, when the pressure inside the reaction vessel 4010 and the outer reaction vessel 4020 as detected by the pressure sensor 4180 has reached about 0.1 MPa, the valves 4120 and 4121 are closed and the valve 4160 is opened. With this the nitrogen gas filling the reaction vessel 4010 and the outer reaction vessel 4020 is evacuated by the vacuum pump 4170. In this case, too, the interior of the reaction vessel 4010 and the outer reaction vessel 4020 is evacuated to a predetermined pressure (0.133 Pa or less) by using the vacuum pump 4170.

Further, this vacuum evacuation of the reaction vessel 4010 and the outer reaction vessel 4020 and filling of the nitrogen to the reaction vessel 4010 and the outer reaction vessel 4020 are repeated several times.

Thereafter, the interior of the reaction vessel 4010 and the outer reaction vessel 4020 is evacuated to a predetermined pressure by the vacuum pump 4170, and the valve 4160 is closed. Further, the valves 4120 and 4121 are opened and the nitrogen gas is filled into the reaction vessel 4010 and the outer reaction vessel 4020 by the pressure regulator 4130 such that the pressure of the reaction vessel 4010 and the outer reaction vessel 4020 becomes the range of 1.01-5.05 MPa.

When the pressure as detected by the pressure sensor 4180 has become 1.01-5.05 Pa, the valve 4120 is closed.

When filling of the nitrogen gas into the reaction vessel 4010 and the outer reaction vessel 4020 is completed, the reaction vessel 4010 and the outer reaction vessel 4020 are heated by the heating units 4070 and 4080 to 800° C., and the temperature of the reaction vessel 4010 and the outer reaction vessel 4020 is held at 800° C. thereafter for several ten hours to several hundred hours.

With this, the metal Na and the metal Ga loaded into the reaction vessel 4010 undergoes melting with heating of the reaction vessel 4010 and the melt mixture 4290 is formed in the reaction vessel 4010. Further, the metal Na loaded between the reaction vessel 4010 and the outer reaction vessel 4020 undergoes melting and the metal melt 4190 is formed as a result. As a result, the nitrogen gas existing in the space 4023 of the outer reaction vessel 4020 cannot pass through the metal melt 4190, and thus, the nitrogen gas is confined in the spaces 4023.

Further, the up/down mechanism 4220 moves the support unit 5040 during the interval in which the reaction vessel 4010 and the outer reaction vessel 4020 are heated to the temperature Tech, and the seed crystal 4005 is dipped into the melt mixture 4290.

Further, the pressure regulator 4130 controls the nitrogen gas pressure of the space 4023, when the reaction vessel 4010 and the outer reaction vessel 4020 are heated to 800° C., to the nitrogen gas pressure $P_{Nech}$. As a result, the seed crystal 4005 is etched by the melt mixture 4290.

When the etching of the seed crystal 4005 is over, the pressure regulator 4130 adjusts the nitrogen gas pressure of the space 4023 to the nitrogen gas pressure $P_{Ngrith}$.

With this, there occurs preferential growth of the GaN crystal from the seed crystal 4005. Thereafter, the nitrogen gas is introduced into the space 4023 via the stopper/inlet plug 4060 and the metal melt 4190 while holding the temperature of the seed crystal 4005 to the crystal growth temperature (=800° C.), and there proceeds the growth of the GaN crystal.

As a result, it becomes possible to achieve crystal growth of a large GaN crystal similarly to the case of the crystal growth apparatus 4100 shown in FIG. 92.

Figure 113:
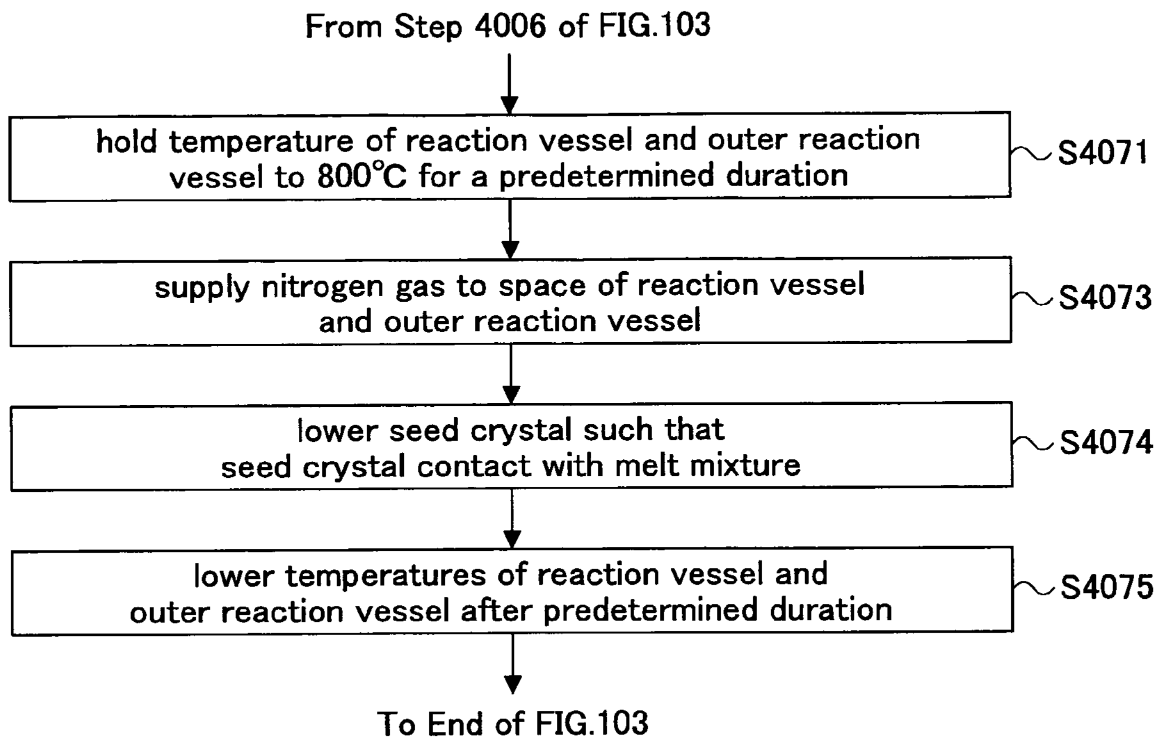
FIG. 113 is a flowchart explaining the detailed operation of the step S4007 in the flowchart of Embodiment 17 shown in FIG. 103.

FIG. 113 is a flowchart explaining the detailed operation of the step S4007 in the flowchart shown in FIG. 103 according to Embodiment 17 of the present invention. It should be noted that the flowchart of FIG. 113 is identical to the flowchart shown in FIG. 104 except that the step S4072 of the flowchart shown in FIG. 104 is removed.

Referring to FIG. 113, the steps S4073-4075 are conducted consecutively after the step S4071, and the manufacturing of the GaN crystal is completed. Thus, when the etching of the seed crystal 4005 is over, the manufacturing of the GaN crystal is conducted while holding the temperature of the seed crystal 4005 at the same temperature as the temperature of the melt mixture 4290.

Thus, it becomes possible to grow the GaN crystal continuously from the etched seed crystal 4005 without lowering the temperature of the seed crystal 4005 as compared with the temperature of the melt mixture 4290 during the growth of the GaN crystal, and it becomes possible to manufacture the GaN crystal of high quality and large size.

It should be noted that the crystal growth apparatus of Embodiment 17 may be the one in which the conduit 4200, the thermocouple 4210, the gas supply line 4250, the flow meter 4260 and the gas cylinder 4270 are removed fro the crystal growth apparatus 4100A shown in FIG. 110.

Otherwise, the present embodiment is identical to Embodiment 15.

Figure 114:
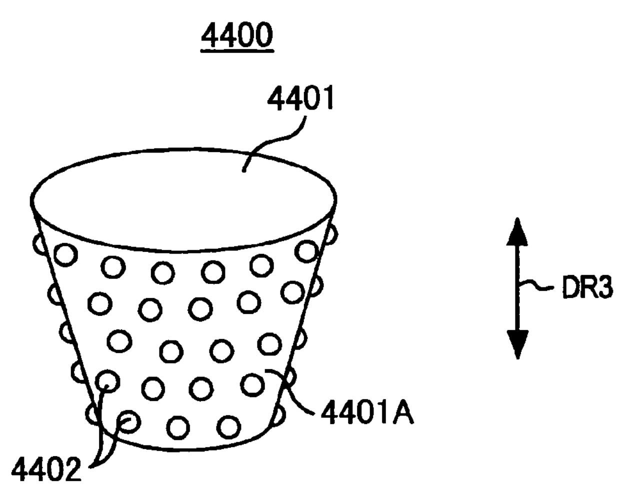
FIG. 114 is another oblique view diagram of the stopper/inlet plug according to the present invention.

FIG. 114 is another oblique view diagram of the stopper/inlet plug according to the present invention. Further, FIG. 115 is a cross-sectional diagram showing the method for mounting the stopper/inlet plug 4400 shown in FIG. 114.

Referring to FIG. 114, the stopper/inlet plug 4400 comprises a plug 4401 and a plurality of projections 4402. The plug 4401 is formed of a cylindrical body that changes the diameter in a length direction DR3. Each of the projections 4402 has a generally semispherical shape of the diameter of several ten microns. The projections 4402 are formed on an outer peripheral surface 4401A of the plug 4401 in a random pattern. Thereby, the separation between adjacent two projections 4402 is set to several ten microns.

Figure 115:
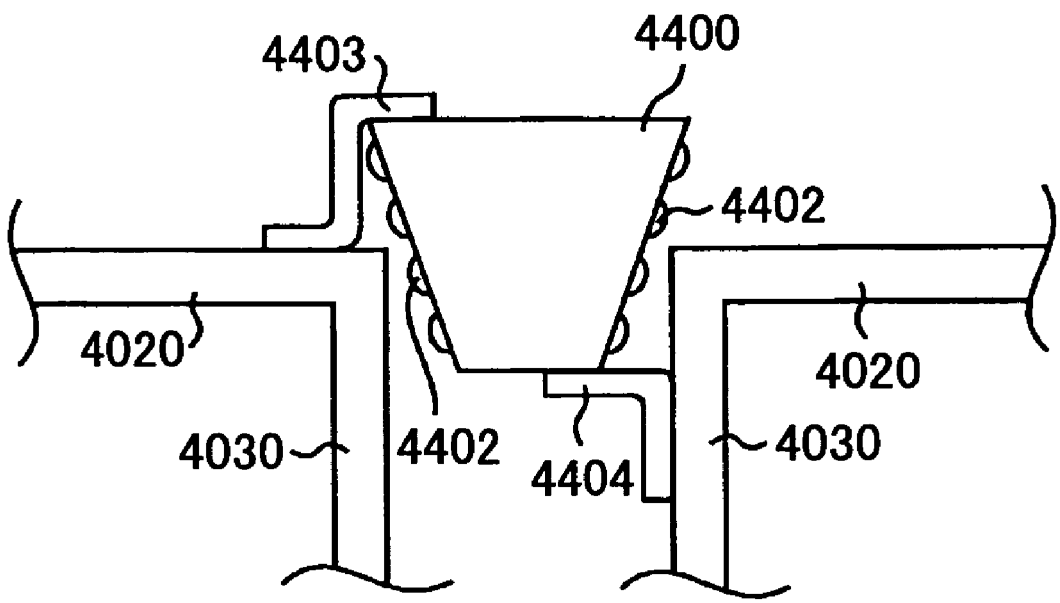
FIG. 115 is a cross-sectional diagram showing the method for mounting the stopper/inlet plug shown in FIG. 114.

Referring to FIG. 115, the stopper/inlet plug 4400 is fixed to a connection part of the outer reaction vessel 4020 and the conduit 4030 by support members 4403 and 4404. More specifically, the stopper/inlet plug 4400 is fixed by the support member 4403 having one end fixed upon the outer reaction vessel 4020 and by the support member 4404 having one end fixed upon an inner wall surface of the conduit 4030.

In the present case, the projections 4402 of the stopper/inlet plug 4400 may or may not contact with the outer reaction vessel 4020 or the conduit 4030. In the event the stopper/inlet plug 4402 is fixed in the state in which the projections 4402 do not contact with the outer reaction vessel 4020 and the conduit 4030, the separation between the projections 4402 and the reaction vessel 4020 or the separation between the projections 4402 and the conduit 4030 is set such that the metal melt 4170 can be held by the surface tension thereof, and the stopper/inlet plug 4400 is fixed in this state by the support members 4403 and 4404.

The metal Na held between the reaction vessel 4010 and the outer reaction vessel 4020 takes a solid form before heating of the reaction vessel 4010 and the outer reaction vessel 4020 is commenced, and thus, the nitrogen gas supplied from the gas cylinder 4140 can cause diffusion between the space 4023 inside the outer reaction vessel 4020 and the space 4031 inside the conduit 4030 through the stopper/inlet plug 4460.

When heating of the reaction vessel 4010 and the outer reaction vessel 4020 is started and the temperature of the reaction vessel 4010 and the outer reaction vessel 4020 has raised to 98° C. or higher, the metal Na held between the reaction vessel 4010 and the outer reaction vessel 4020 undergoes melting to form the metal melt 4190, while the metal melt 4190 functions to confined the nitrogen gas to the space 4023.

Further, the stopper/inlet plug 4400 holds the metal melt 4190 by the surface tension thereof such that the metal melt 4190 does not flow out from the interior of the outer reaction vessel 4020 to the space 4031 of the conduit 4030.

Further, with progress of the growth of the GaN crystal, the metal melt 4190 and the stopper/inlet plug 4400 confines the nitrogen gas and the metal Na vapor evaporated from the metal melt 4190 and the melt mixture 4290 into the space 4023. As a result, evaporation of the metal Na from the melt mixture 4290 is suppressed, and it becomes possible to stabilize the molar ratio of the metal Na and the metal Ga in the melt mixture 4290. Further, when there is caused a decrease of nitrogen gas in the space 4023 with progress of growth of the GaN crystal, the pressure P1 of the space 4023 becomes lower than the pressure P2 of the space 4031 inside the conduit 4030, and the stopper/inlet plug 4400 supplies the nitrogen gas in the space 4031 via the metal melt 4190 by causing to flow the nitrogen gas therethrough in the direction toward the outer reaction vessel 4020.

Thus, the stopper/inlet plug 4400 functions similarly to the stopper/inlet plug 4060 explained before. Thus, the stopper/inlet plug 4400 can be used in the crystal growth apparatuses 4100, 4100A and 4100B in place of the stopper/inlet plug 4060.

While it has been explained that the stopper/inlet plug 4400 has the projections 4402, it is also possible that the stopper/inlet plug 4400 does not have the projections 4402. In this case, the stopper/inlet plug 4400 is held by the support members such that the separation between the plug 4401 and the outer reaction vessel 4020 or the separation between the plug 4401 and the conduit 4030 becomes several ten microns.

Further, it is also possible to set the separation between the stopper/inlet plug 4400 (including both of the cases in which the stopper/inlet plug 4400 carries the projections 4402 and the case in which the stopper/inlet plug 4400 does not carry the projections 4402) and the outer reaction vessel 4020 and between the stopper/inlet plug 4400 and the conduit 4030 according to the temperature of the stopper/inlet plug 4400. In this case, the separation between the stopper/inlet plug 4400 and the reaction vessel 4020 or the separation between the stopper/inlet plug 4400 and the conduit 4030 is set relatively narrow when the temperature of the stopper/inlet plug 4400 is relatively high. When the temperature of the stopper/inlet plug 4400 is relatively low, on the other hand, the separation between the stopper/inlet plug 4400 and the reaction vessel 4020 or the separation between the stopper/inlet plug 4400 and the conduit 4030 is set relatively large.

It should be noted that the separation between the stopper/inlet plug 4400 and the reaction vessel 4020 or the separation between the stopper/inlet plug 4400 and the conduit 4030 that can hold the metal melt 4190 changes depending on the temperature of the stopper/inlet plug 4400. This, with this embodiment, the separation between the stopper/inlet plug 4400 and the reaction vessel 4020 or the separation between the stopper/inlet plug 4400 and the conduit 4030 is changed in response to the temperature of the stopper/inlet plug 4400 such that the metal melt 4190 is held securely by the surface tension.

The temperature control of the stopper/inlet valve 4400 is achieved by the heating unit 4080. Thus, when the stopper/inlet plug 4400 is to be heated to a temperature higher than 150° C., the stopper/inlet plug 4400 is heated by the heating unit 4080.

In the case of using the stopper/inlet plug 4400, the gas cylinder 4140, the pressure regulator 4130, the gas supply lines 4090 and 4110, the conduit 4030, the stopper/inlet plug 4400 and the metal melt 4190 form together the "gas supplying unit".

In the case of using the stopper/inlet plug 4400 with the crystal growth apparatus 4100 or 4100A, the gas cylinder 4140, the pressure regulator 4130, the gas supply lines 4090 and 4110, the conduit 4030, the stopper/inlet plug 4400 and the metal melt 4190 form together the "etching unit".

Figure 116A:
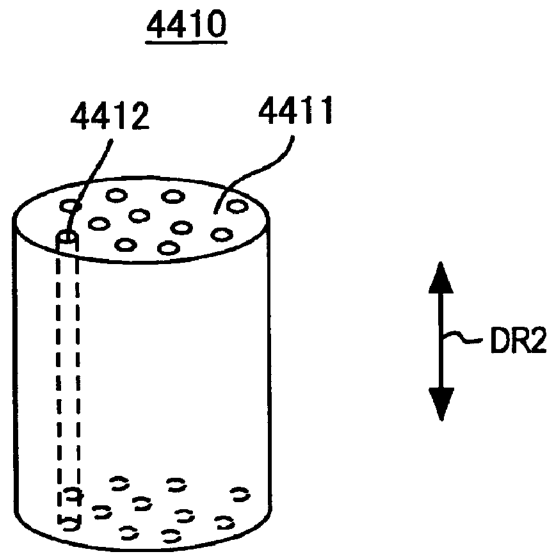
FIGS. 116A and 116B are further oblique view diagrams of the stopper/inlet plug according to the present invention.
Figure 116B:
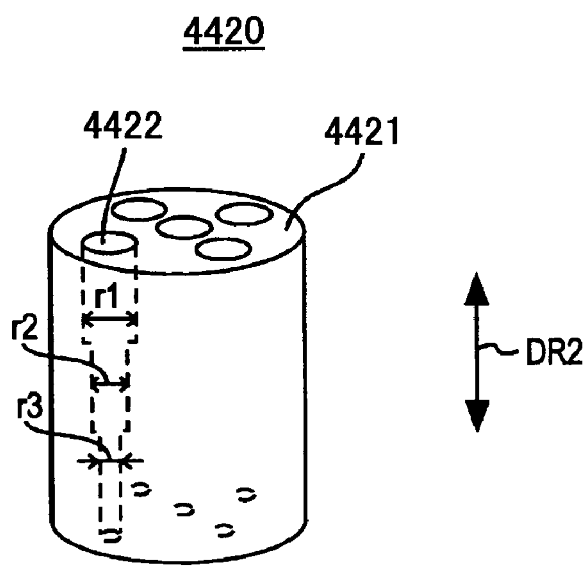

FIGS. 116A and 116B are further oblique view diagrams of the stopper/inlet plug according to lo the present embodiment.

Referring to FIG. 116A, the stopper/inlet plug 4410 comprises a plug 4411 formed with a plurality of penetrating holes 4412. The plurality of penetrating holes 4412 are formed in the length direction DR2 of the plug 411. Further, each of the plural penetrating holes 4412 has a diameter of several ten microns (see FIG. 116A).

With the stopper/inlet plug 4410, it is sufficient that there is formed at least one penetrating hole 4412.

Further, the stopper/inlet plug 4420 comprises a plug 4422 formed with plural penetrating holes 4421. The plurality of penetrating holes 4422 are formed in the length direction DR2 of the plug 4421. Each of the penetrating holes 4422 have a diameter that changes stepwise from a diameter r1, r2 and r3 in the length direction DR2. Here, each of the diameters r1, r2 and r3 is determined in the range such as several microns to several ten microns in which the metal melt 4190 can be held by the surface tension Reference should be made to FIG. 116.

With the stopper/inlet plug 4420, it is sufficient that there is formed at least one penetrating hole 4422. Further, it is sufficient that the diameter of the penetrating hole 4422 is changed at least in two steps. Alternatively, the diameter of the penetrating hole 4422 may be changed continuously in the length direction DR2.

The stopper/inlet plug 4410 or 4420 can be used in any of the crystal growth apparatuses 4100, 4100A and 4100B in place of the stopper/inlet plug 4060.

In the case the stopper/inlet plug 4420 is used in any of the crystal growth apparatus 4100, 4100A or 4100B in place of the stopper/inlet plug 4060, it becomes possible to hold the metal melt 4190 by the surface tension thereof by one of the plural diameters that are changed stepwise, and it becomes possible to manufacture a GaN crystal of large size without conducting precise temperature control of the stopper/inlet plug 4420.

In the case of using the stopper/inlet plug 4410 or 4420, the gas cylinder 4140, the pressure regulator 4130, the gas supply lines 4090 and 4110, the conduit 4030, the stopper/inlet plug 4410 or 4420 and the metal melt 4190 form together the "gas supplying unit".

In the case of using the stopper/inlet plug 4410 or 4420 with the crystal growth apparatus 4100 or 4100A, the gas cylinder 4140, the pressure regulator 4130, the gas supply lines 4090 and 4110, the conduit 4030, the stopper/inlet plug 4410 or 4420 and the metal melt 4190 form together the "etching unit".

Further, with the present invention, it is possible to use a porous plug or check valve in place of the stopper/inlet plug 4060. The porous plug may be the one formed of a sintered body of stainless steel powders. Such a porous plug has a structure in which there are formed a large number of pores of several ten microns. Thus, the porous plug can hold the metal melt 4190 by the surface tension thereof similarly to the stopper/inlet plug 4060 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P2 of the space 4031 and the pressure P1 of the space 4023 for allowing the nitrogen gas in the space 4031 to the space 4023 through the metal melt 4190 in the event the pressure P2 is higher than the pressure P1 and blocks the connection between the outer reaction vessel 4020 and the conduit 4030 by the self gravity when P1≧P2. Thus, this check valve can be used also in the high-temperature region.

Further, while it has been explained with Embodiment 17 that the crystal growth temperature is 800° C., the present embodiment is not limited to this specific crystal growth temperature. It is sufficient when the crystal growth temperature is equal to or higher than 600° C. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the reaction vessel 401 in the ambient of Ar gas and the metal Na is loaded between the reaction vessel 4010 and the outer reaction vessel 4020 in the ambient of Ar gas, it is also possible to load the metal Na and the metal Ga into the reaction vessel 4010 and the metal Na between the reaction vessel 4010 and the outer reaction vessel 4020 and in the outer vessel 4310 in the ambient of a gas other than the Ar gas, such as He, Ne, Kr, or the like, or in a nitrogen gas. Generally speaking, the metal Na and the metal Ga are loaded into the reaction vessel 4010 and the metal Na is loaded between the reaction vessel 4010 and the outer reaction vessel 4020 and in the outer reaction vessel 4310 in the ambient of the inert gas or nitrogen gas. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 4290 by mixing an alkali metal such as lithium (Li), potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing nitrogen as a constituent element such as sodium azide, ammonia, or the like. These compounds constitute the nitrogen source gas.

Further, place of Ga, it is also possible to use a group III metal such as boron (B), aluminum (Al), indium (In), or the like.

Thus, the crystal growth apparatus and method of the present invention is generally applicable to the manufacturing of a group III nitride crystal while using a melt mixture of an alkali metal or an alkali earth melt and a group III metal (including boron).

The group III nitride crystal manufactured with the crystal growth apparatus or method of the present invention may be used for fabrication of group III nitride semiconductor devices including light-emitting diodes, laser diodes, photodiodes, transistors, and the like.

Embodiment 18

Figure 117:
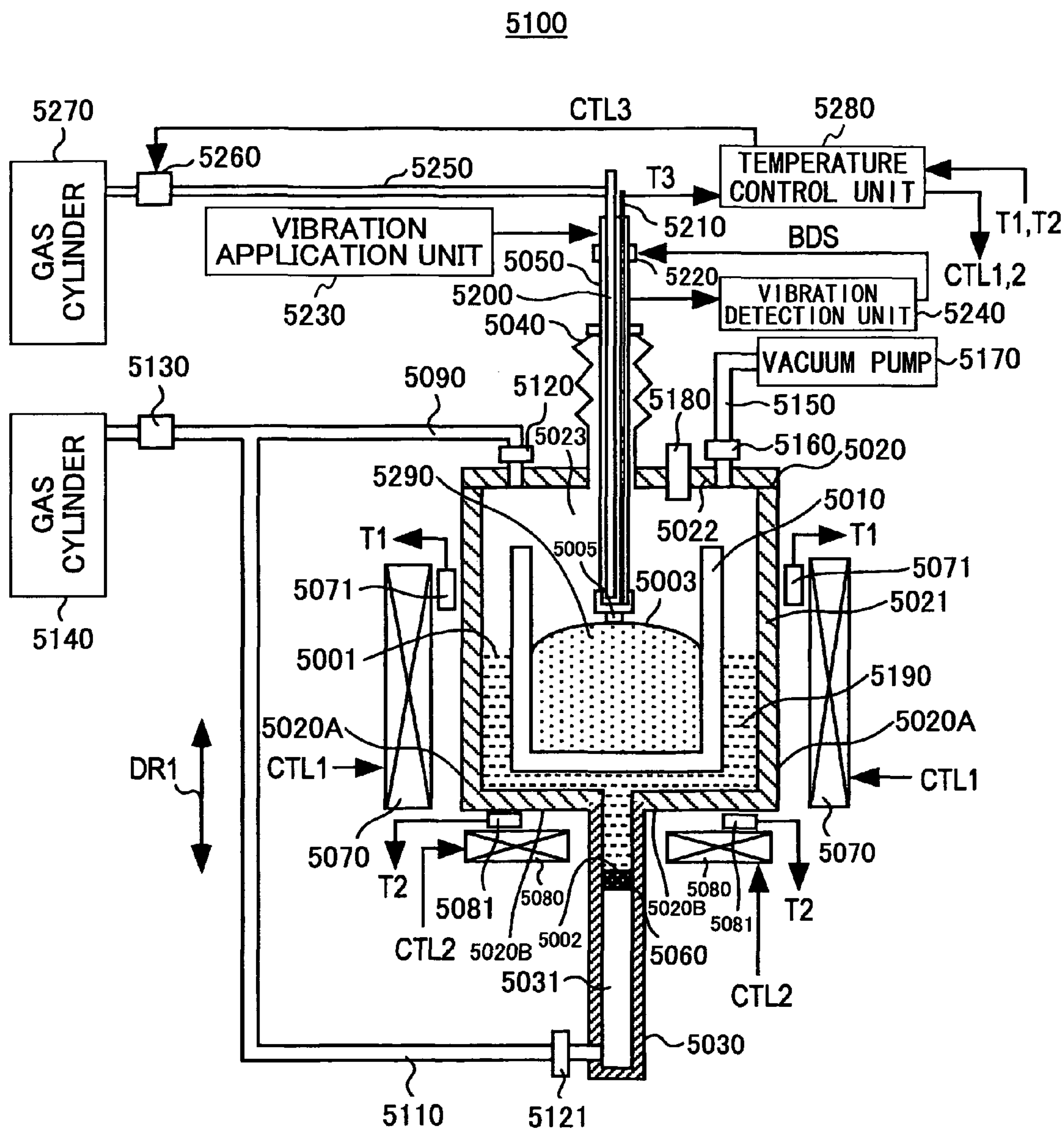
FIG. 117 is a schematic cross-sectional diagram showing the construction of a crystal growth apparatus according to Embodiment 18 of the present invention.

FIG. 117 is a schematic cross-sectional diagram showing the construction of a crystal growth apparatus according to Embodiment 18 of the present invention.

Referring to FIG. 117, a crystal growth apparatus 5100 according to Embodiment 18 of the present invention comprises: a reaction vessel 5010; an outer reaction vessel 5020; conduits 5030 and 5200; a bellows 5040; a support unit 5050; a stopper/inlet plug 5060; heating units 5070 and 5080; temperature sensors 5071 and 5081; gas supply lines 5090, 5110, 5250; valves 5129, 5121, 5160; a pressure regulator 5130; gas cylinders 5140 and 5270; an evacuation line 5150; a vacuum pump 5170; a pressure sensor 5180; a metal melt 5190; a thermocouple 5210; an up/down mechanism 5220; a vibration applying unit 5230; a vibration detection unit 5240; a flow meter 5260; and a temperature control unit 5280.

The reaction vessel 5010 has a generally cylindrical form and is formed of boron nitride (BN). The outer reaction vessel 5020 is disposed around the reaction vessel 5010 with a predetermined separation from the reaction vessel 5010. Further, the outer reaction vessel 5020 is formed of a main part 5021 and a lid 5022. Each of the main part 5021 and the lid 5022 is formed of SUS316L stainless steel, wherein a metal seal ring is provided between the main part 5021 and the lid 5022 for sealing. Thus, there occurs no leakage of a melt mixture 5290 to be described later to the outside.

The conduit 5030 is connected to the outer reaction vessel 5010 at the underside of the reaction vessel 4010 in terms of a gravitational direction DR1. The bellows 5040 is connected to the outer reaction vessel 5020 at a location above the reaction vessel 5010 in terms of a gravitational direction DR1. The support substrate 5050 comprises a hollow cylindrical member and a part thereof is inserted into a space 5023 inside the outer reaction vessel 5020 via the bellows 5040.

The stopper/inlet plug 5060 may be formed of a metal, ceramic, or the like, for example, and is held inside the conduit 5020 at a location lower than the connection part of the outer reaction vessel 5030 and the conduit 5030.

The heating unit 5070 is disposed so as to surround the outer circumferential surface 5020A of the outer reaction vessel 5020. On the other hand, the heating unit 5080 is disposed so as to face a bottom surface 5020B of the outer reaction vessel 5020. The temperature sensors 5071 and 5081 are disposed in the close proximity of the heating units 5070 and 5080, respectively.

The gas supply line 5090 has an end connected to the outer reaction vessel 5020 via the valve 5129 and the other end connected to the gas cylinder 5130 via the pressure regulator

5140. The gas supply line 5110 has an end connected to the conduit 5030 via the valve 5121 and the other end connected to the gas supply line 5090.

The valve 5129 is mounted to the gas supply line 5090 in the vicinity of the outer reaction vessel 5020. The valve 5121 is connected to the gas supply line 5110 in the vicinity of the conduit 5030. The pressure regulator 5130 is connected to the gas supply line 5090 in the vicinity of the gas cylinder 5140. The gas cylinder 5140 is connected to the gas supply line 5090.

The evacuation line 5150 has an end connected to the outer reaction vessel 5020 via the valve 5160 and the other end connected to the vacuum pump 5170. The valve 5160 is connected to the evacuation line 5150 in the vicinity of the outer reaction vessel 5020. The vacuum pump 5170 is connected to the evacuation line 5150.

The pressure sensor 5180 is mounted to the outer reaction vessel 5020. The metal melt 5190 comprises a melt of metal sodium (metal Na) and is held between the reaction vessel 5010 and outer the reaction vessel 5020 and inside the conduit 5030.

The conduit 5200 and the thermocouple 5210 are inserted into the interior of the support unit 5050. The up/down mechanism 5220 is mounted upon the support unit 5050 at the location above the bellows 5040. The gas supply line 5250 has an end connected to the conduit 5200 and the other end connected to the gas cylinder 5270 via the flow meter 5260. The flow meter 5260 is connected to the gas supply line 5250 in the vicinity of the gas cylinder 5270. The gas cylinder 5270 is connected to the gas supply line 5250.

The reaction vessel 5010 holds the melt mixture 5290 containing metal Na and metal gallium (metal Ga). The outer reaction vessel 5020 surrounds the reaction vessel 5010. The conduit 5030 leads the nitrogen gas ($N_2$ gas) supplied from the gas cylinder 5140 via the gas supply lines 5090 and 5110 to the stopper/inlet plug 5060.

The bellows 5040 holds the support unit 5050 and disconnects the interior of the outer reaction vessel 5020 from outside. Further, the bellows 5040 is capable of expanding and contracting in the gravitational direction DR1 with movement of the support unit 5050 in the gravitational direction DR1. The support unit 5050 supports a seed crystal 5005 of a GaN crystal at a first end thereof inserted into the outer reaction vessel 5020.

The stopper/inlet plug 5060 has a dimple structure on the outer peripheral surface such that there are formed apertures of the size of several ten microns between the inner wall of the conduit 5030 and the stopper/inlet plug 60. Thus, the stopper/inlet plug 60 allows the nitrogen gas in the conduit 5030 to pass in the direction to the metal melt 5190 and supplies the nitrogen gas to the space 5023 via the metal melt 5190. Further, the stopper/inlet plug 5060 holds the metal melt 5190 between the reaction vessel 5010 and the outer reaction vessel 5020 and further in the conduit 5030 by the surface tension caused by the apertures of the size of several ten microns.

The heating unit 5070 comprises a heater and a current source. Thus, the heating unit 5070 supplies a current from the current source to the heater in response to a control signal CTL1 from the temperature control unit 5280 and heats the reaction vessel 5010 and the outer reaction vessel 5020 to a crystal growth temperature from the outer peripheral surface 5020A of the outer reaction vessel 5020. The temperature sensor 5071 detects a temperature of the heater of the heating unit 5070 and outputs a detected temperature signal indicative of the detected temperature T1 to the temperature control unit 5280.

The heating unit 5080 also comprises a heater and a current source. Thus, the heating unit 5080 supplies a current from the current source to the heater in response to a control signal CTL2 from the temperature control unit 5280 and heats the reaction vessel 5010 and the outer reaction vessel 5020 to a crystal growth temperature from the bottom surface 5020B of the outer reaction vessel 5020. The temperature sensor 5081 detects a temperature T2 of the heater of the heating unit 5080 and outputs a temperature signal indicative of the detected temperature T2 to the temperature control unit 5280.

The gas supply line 5090 supplies the nitrogen gas supplied from the gas cylinder 5140 via the pressure regulator 5130 to the interior of the outer reaction vessel 5020 via the valve 5129.

The gas supply line 5110 supplies the nitrogen gas supplied from the gas cylinder 5140 via the pressure regulator 5130 to the interior of the conduit 5030 via the valve 5121.

The valve 5129 supplies the nitrogen gas inside the gas supply line 5090 to the interior of the outer reaction vessel 5020 or interrupts the supply of the nitrogen gas to the interior of the outer reaction vessel 5020. The valve 5121 supplies the nitrogen gas inside the gas supply line 5110 to the conduit 5030 or interrupts the supply of the nitrogen gas to the conduit 5030. The pressure regulator 5130 supplies the nitrogen gas from the gas cylinder 5140 to the gas supply lines 5090 and 5110 after setting the pressure to a predetermined pressure.

e gas cylinder 5140 holds the nitrogen gas. The evacuation line 5150 passes the gas inside the outer reaction vessel 5020 to the vacuum pump 5170. The valve 5160 connects the interior of the outer reaction vessel 5020 and the evacuation line 5150 spatially or disconnects the interior of the outer reaction vessel 5020 and the evacuation line 5150 spatially. The vacuum pump 5170 evacuates the interior of the outer reaction vessel 5020 via the evacuation line 5150 and the valve 5160.

The pressure sensor 5180 detects the pressure inside the outer reaction vessel 5020. The metal melt 5190 supplies the nitrogen gas introduced through the stopper/inlet plug 5060 into the space 5023.

The conduit 5200 cools the seed crystal 5005 by releasing the nitrogen gas supplied from the gas supply line 5250 into the support unit 5050 from the first end thereof. The thermocouple 5210 detects a temperature T3 of the seed crystal 5005 and outputs a temperature signal indicative of the detected temperature T3 to the temperature control unit 5280.

The up/down mechanism 5220 causes the support, unit 5050 to move up or down in response to a vibration detection signal BDS from the vibration detection unit 5240 according to a method to be explained later, such that the seed crystal 5005 makes a contact with a vapor-liquid interface 5003 between the space 5023 and the melt mixture 5290.

The vibration application unit 5230 comprises a piezoelectric element, for example, and applies a vibration of predetermined frequency to the support unit 5050. The vibration detection unit 5240 comprises an acceleration pickup, for example, and detects the vibration of the support unit 5050 and outputs the vibration detection signal BDS indicative of the vibration of the support unit 5050 to the up/down mechanism 5220.

The gas supply line 5250 supplies a nitrogen gas supplied from the gas cylinder 5270 via the flow meter 5260 to the conduit 5200. The flow meter 5260 supplies the nitrogen gas supplied from the gas cylinder 5270 to the gas supply line 5250 with flow rate adjustment in response to a control signal CTL3 from the temperature control unit 5280. The gas cylinder 5270 holds the nitrogen gas.

Figure 118:
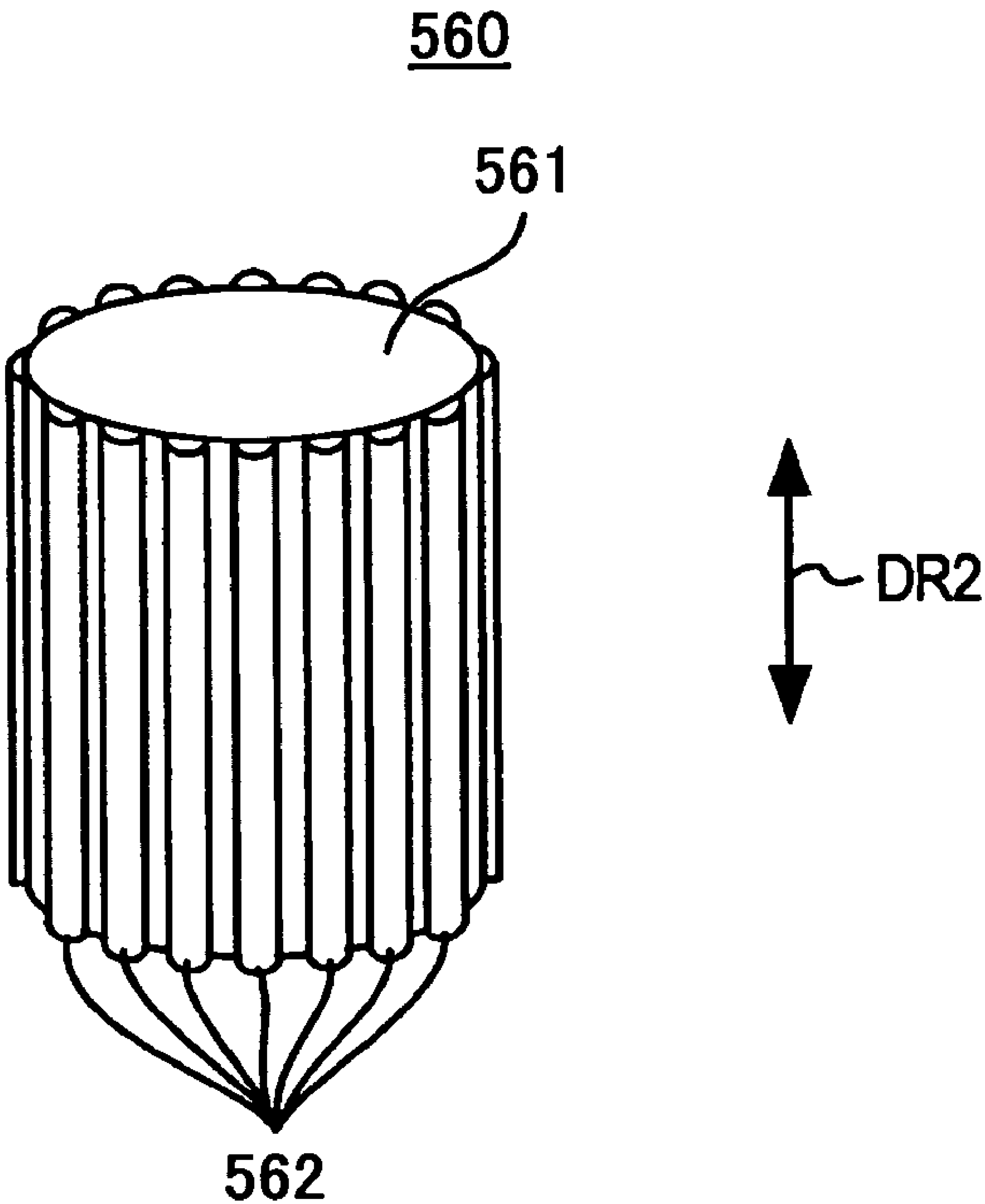
FIG. 118 is an oblique view diagram showing the construction of the stopper/inlet plug shown in FIG. 117.

FIG. 118 is an oblique view diagram showing the construction of the stopper/inlet plug 5060 shown in FIG. 117.

Referring to FIG. 118, the stopper/inlet plug 5060 includes a plug 5061 and projections 5062. The plug 5061 has a generally cylindrical form. Each of the projections 5062 has a generally semi-circular cross-sectional shape and the projections 5061 are formed on the outer peripheral surface of the plug 5061 so as to extend in a length direction DR2.

Figure 119:
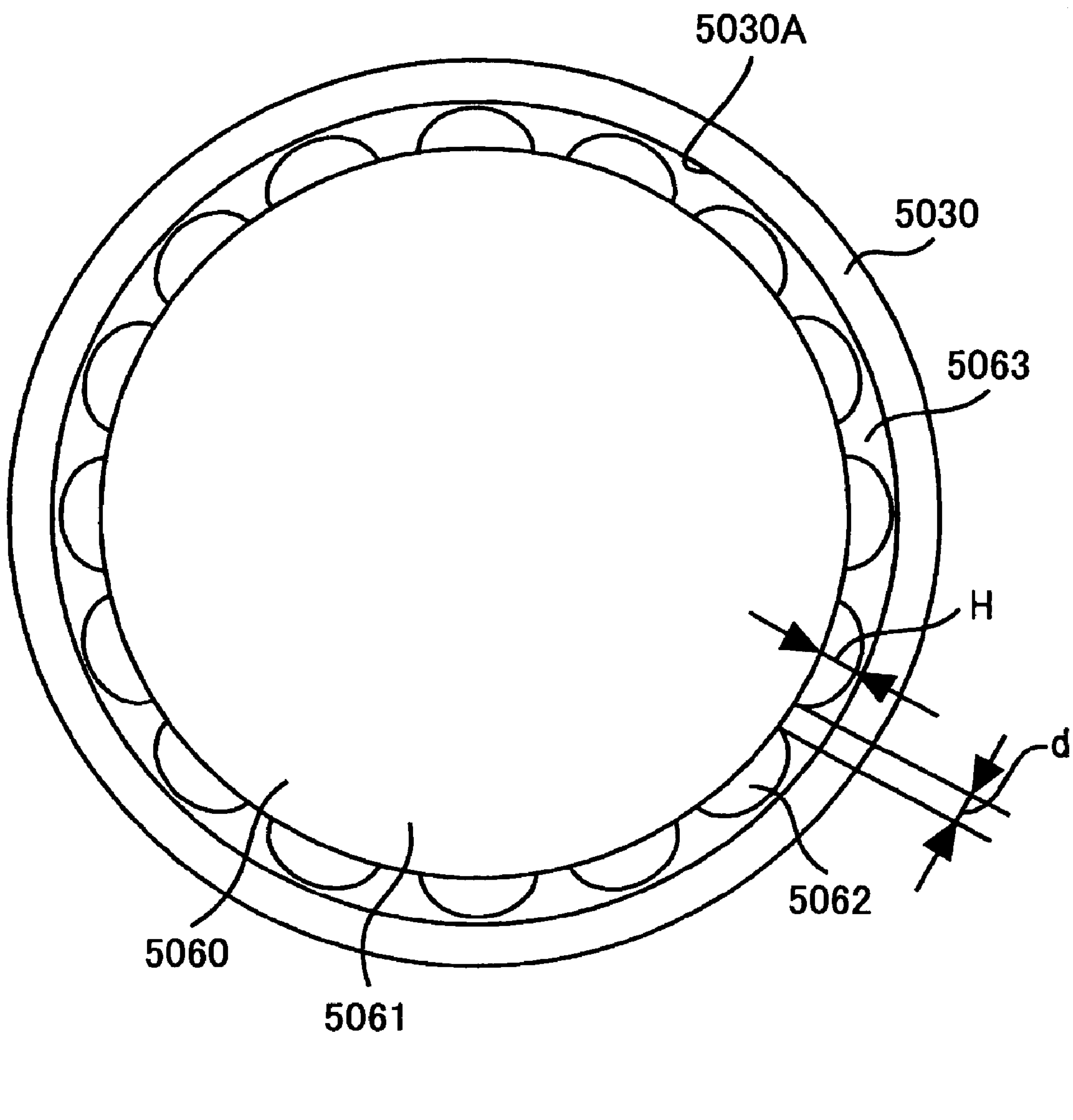
FIG. 119 is a plan view diagram showing the state of mounting the stopper/inlet plug to a conduit.

FIG. 119 is a plan view diagram showing the state of mounting the stopper/inlet plug 5060 to the conduit 5030.

Referring to FIG. 119, the projections 5062 are formed with plural number in the circumferential direction of the plug 5061 with an interval d of several ten microns. Further, each projection 5062 has a height H of several ten microns. The plural projections 5062 of the stopper/inlet plug 5060 make a contact with the inner wall surface 5030A of the conduit 5030. With this, the stopper/inlet plug 5060 is in engagement with the inner wall 5030A of the conduit 5030.

Because the projections 5062 have a height H of several ten microns and are formed on the outer peripheral surface of the plug 5061 with the interval d of several ten microns, there are formed plural gaps 5060 between the stopper/inlet plug 5060 and the inner wall 1030A of the conduit 5030 with a diameter of several ten microns in the state the stopper/inlet plug 5063 is in engagement with the inner wall 30A of the conduit 5030.

This gap 5063 allows the nitrogen gas to pass in the length direction DR2 of the plug 5061 and holds the metal melt 5190 at the same time by the surface tension of the metal melt 5190, and thus, the metal melt 5190 is blocked from passing through the gap in the longitudinal direction DR2 of the plug 5061.

Figure 120A:
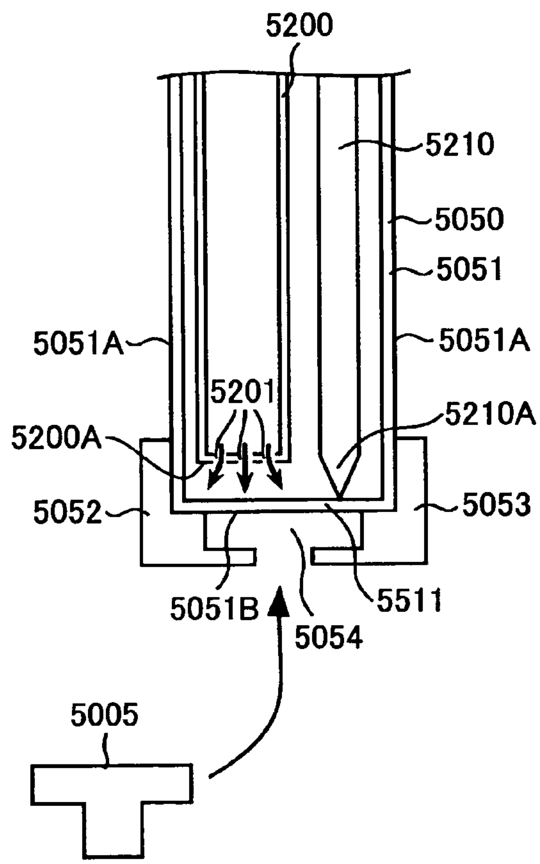
Figure 120B:
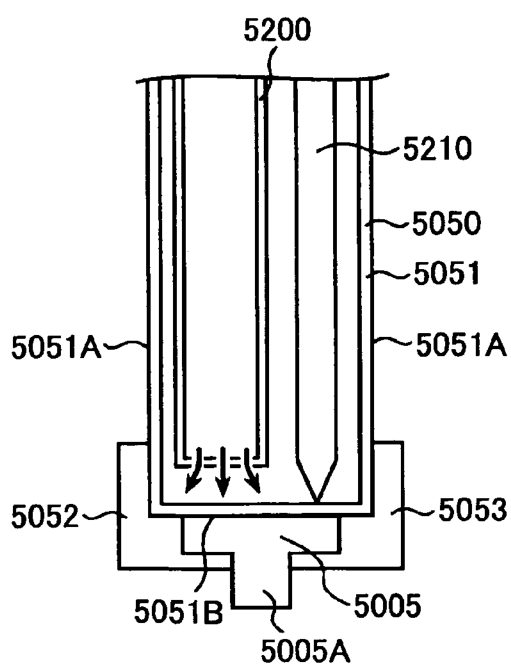

FIGS. 120A and 120B are enlarged diagrams of the support unit 5050, the conduit 5200 and the thermocouple 5210 shown in FIG. 117.

Referring to FIGS. 120A and 120B, the support unit 5050 includes a cylindrical member 5051 and fixing members 5052 and 5053. The cylindrical member 5051 has a generally circular cross-sectional form. The fixing member 5052 has a generally L-shaped cross-sectional form and is fixed upon an outer peripheral surface 5051A and a bottom surface 5051B of the cylindrical member 5051 at the side of a first end 5511 of the cylindrical member 5051. Further, the fixing member 5053 has a generally L-shaped cross-sectional form and is fixed upon the outer peripheral surface 5051A and the bottom surface 5051B of the cylindrical member 5051 at the side of a first end 5511 of the cylindrical member 5051 in symmetry with the fixing member 5052. As a result, there is formed a space part 5054 in the region surrounded by the cylindrical member 5051 and the fixing members 5052 and 5053.

The conduit 5200 has a generally circular cross-sectional form and is disposed inside the cylindrical member 5051. In this case, the bottom surface 5200A of the conduit 5200 is disposed so as to face the bottom surface 5051B of the cylindrical member 5051. Further, plural apertures 5200A are formed on the bottom surface 5260A of the conduit 5200. Thus, the nitrogen gas supplied to the conduit 5200 hits the bottom surface 5051B of the cylindrical member 5051 via the plural apertures 5201.

The thermocouple 5210 is disposed inside the cylindrical member 5051 such that a first end 5210A thereof is adjacent to the bottom surface 5051B of the cylindrical member 5051. Reference should be made to FIG. 120A.

Further, the seed crystal 5005 has a shape that fits the space 5054 and is held by the support unit 5050 by being fitted into the space 5054. In the present case, the seed crystal 5005 makes a contact with the bottom surface 5051B of the cylindrical member 5051. Reference should be made to FIG. 120B.

Thus, a high thermal conductivity is secured between the seed crystal 5005 and the cylindrical member 5051. As a result, it becomes possible to detect the temperature of the seed crystal 5005 by the thermocouple 5210 and it becomes also possible to cool the seed crystal 5005 easily by the nitrogen gas directed to the bottom surface 5051B of the cylindrical member 5051 from the conduit 5200.

Figure 121:
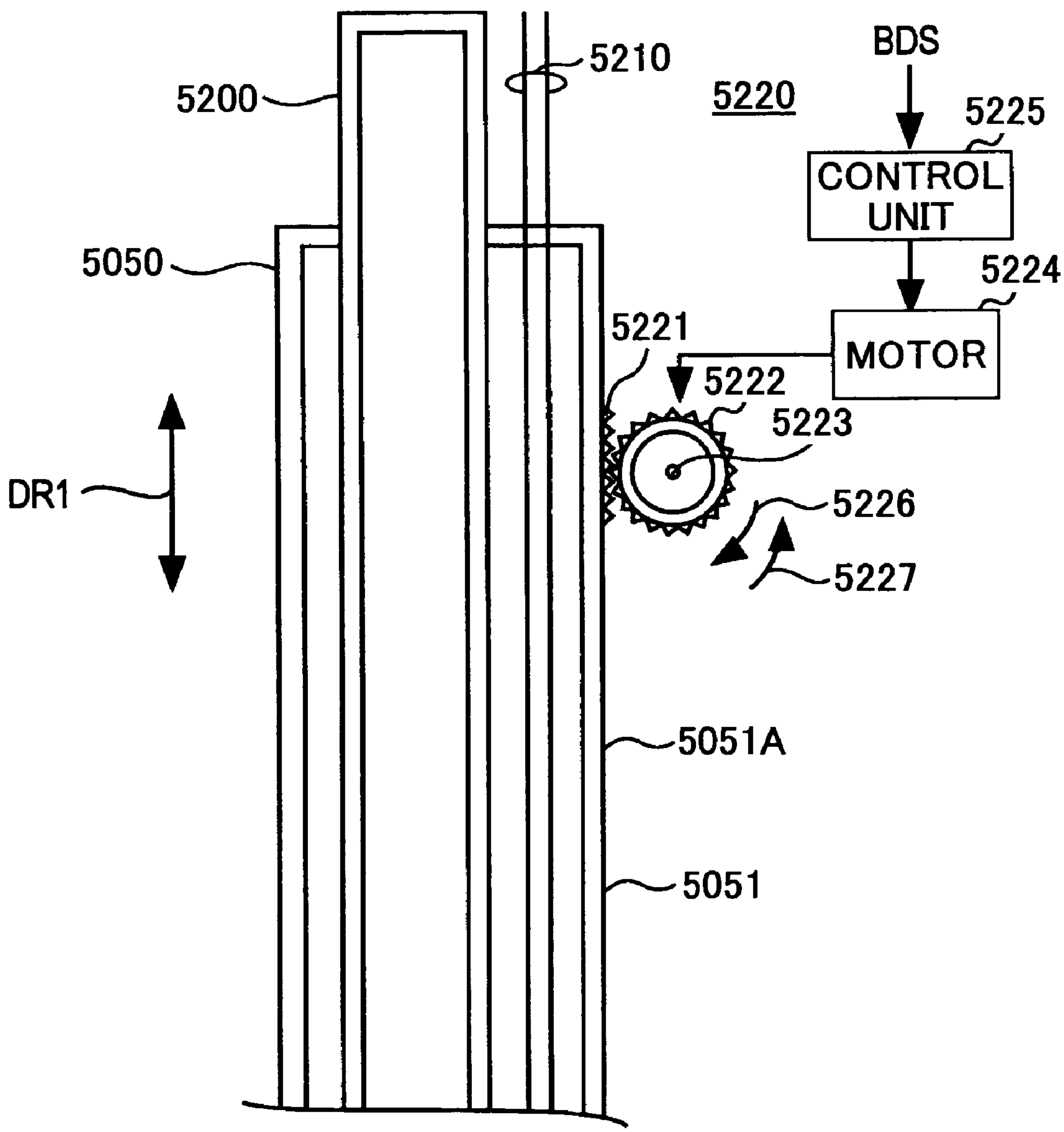

FIG. 121 is a schematic diagram showing the construction of the up/down mechanism 5220 shown in FIG. 117.

Referring to FIG. 121, the up/down mechanism 5220 comprises a toothed member 5221, a gear 5222, a shaft member 5223, a motor 5224 and a control unit 5225.

The toothed member 5221 has a generally triangular cross-sectional shape and is fixed upon the outer peripheral surface 5051A of the cylindrical member 5051. The gear 5222 is fixed upon an end of the shaft member 5223 and meshes with the toothed member 5221. The shaft member 5223 has the foregoing end connected to the gear 5222 and the other end connected to a shaft (not shown) of the motor 5224.

The motor 5224 causes the gear 5222 to rotate in the direction of an arrow 5227 or an arrow 5227 in response to control from the control unit 5225. The control unit 5225 controls the motor 5222 based on the vibration detection signal BDS from the vibration detection unit 5240 and causes the gear 5224 to rotate in the direction of the arrow 5226 or 5227.

When the gear 5222 is rotated in the direction of the arrow 5226, the support unit 5050 moves in the upward direction in terms of the gravitational direction DR1, while when the gear 5222 is rotated in the direction of the arrow 5227, the support unit 5050 is moved downward in terms of the gravitational direction DR1.

Thus, rotation of the gear 5222 in the direction of the arrow 5226 or 5227 corresponds to a movement of the support unit 5050 up or down in terms of the gravitational direction DR1.

Figure 122:
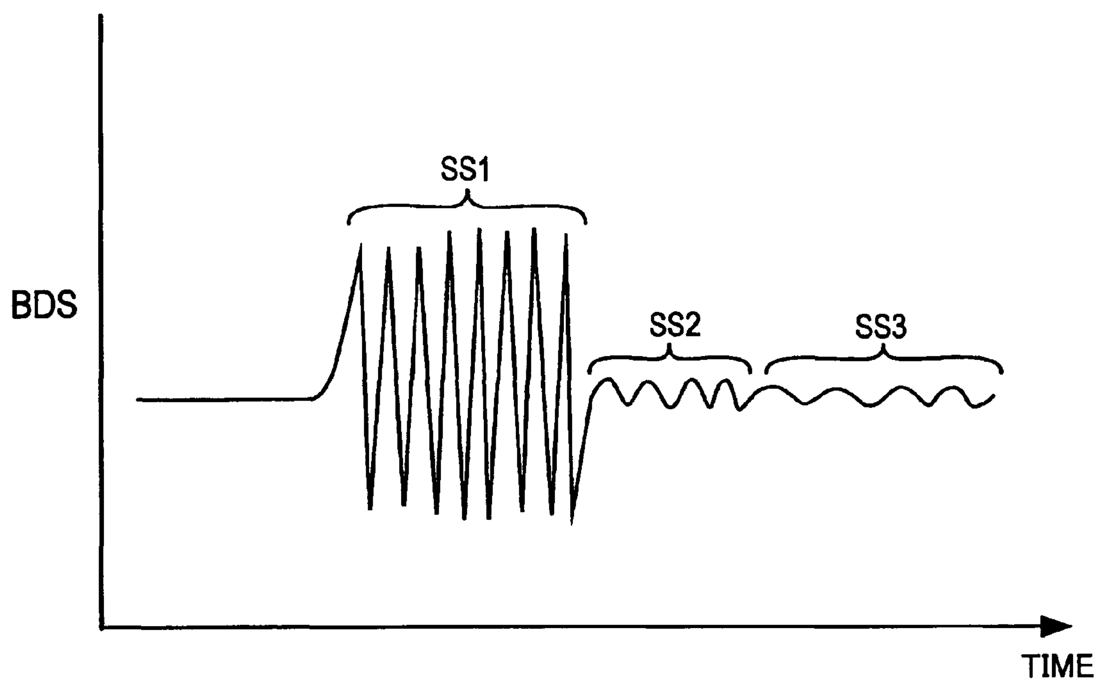

FIG. 122 is a timing chart of the vibration detection signal BDS.

Referring to FIG. 122, the vibration detection signal BDS detected by the vibration detection unit 5240 is formed of the signal component SS1 in the case the seed crystal 5005 is not in contact with the melt mixture 5290 while the vibration detection signal changes to the signal component SS2 when the seed crystal 5005 has made a contact with the melt mixture 5290.

In the event the seed crystal 5005 is not in contact with the melt mixture 5290, the seed crystal 5005 is vibrated vigorously by the vibration applied by the vibration application unit 5230 and the vibration detection signal BDS is formed of the signal component SS1 of relatively large amplitude. When the seed crystal 5005 is in contact with the melt mixture 5290, the seed crystal 5005 cannot vibration vigorously even when the vibration is applied from the vibration application unit 5230 because of viscosity of the melt mixture 5290, and thus, the vibration detection signal BDS is formed of the signal component SS2 of relatively small amplitude.

Referring to FIG. 121, again, the control unit 5225 detects, upon reception of the vibration detection signal from the vibration detection unit 5240, the signal component in the vibration detection signal BDS. Thus, when the detected signal component is the signal component SS1, the control unit 5225 controls the motor 5224 such that the support unit 5050 is lowered in the gravitational direction DR1, until the signal component SS2 is detected for the signal component of the vibration detection signal BDS.

More specifically, the control unit 5225 controls the motor 5222 such that the gear 5222 is rotated in the direction of the arrow 5227, and the motor 5224 causes the gear 5222 in response to the control from the control unit 5225 to rotate in the direction of the arrow 5227 via the shaft member 5223. With this, the support member 5050 moves in the downward direction in terms of the gravitational direction.

Further, the control unit 5225 controls the motor 5222 such that the rotation of the gear 5222 is stopped when the signal component of the vibration detection signal BDS received from the vibration detection unit 5240 has changed from the signal component SS1 to the signal component SS2, and the motor 5224 stops the rotation of the gear 5222 in response to the control from the control unit 5225. With this, the support unit 5050 stops the movement thereof and the seed crystal 5005 is held at the vapor-liquid interface 5003.

On the other hand, the control unit 5225 controls the motor 5224, when received the vibration detecting signal BDS formed of the signal component SS2 from the vibration detecting unit 5240, such that the movement of the support unit 5050 is stopped. In this case, the seed crystal 5005 is already in contact with the melt mixture 5290.

Thus, the up/down mechanism 5220 moves the support unit 5050 in the gravitational direction DR1 based on the vibration detection signal BDS detected by the vibration detection unit 5240, such that the seed crystal 5005 is in contact with the melt mixture 5290.

Figure 123:
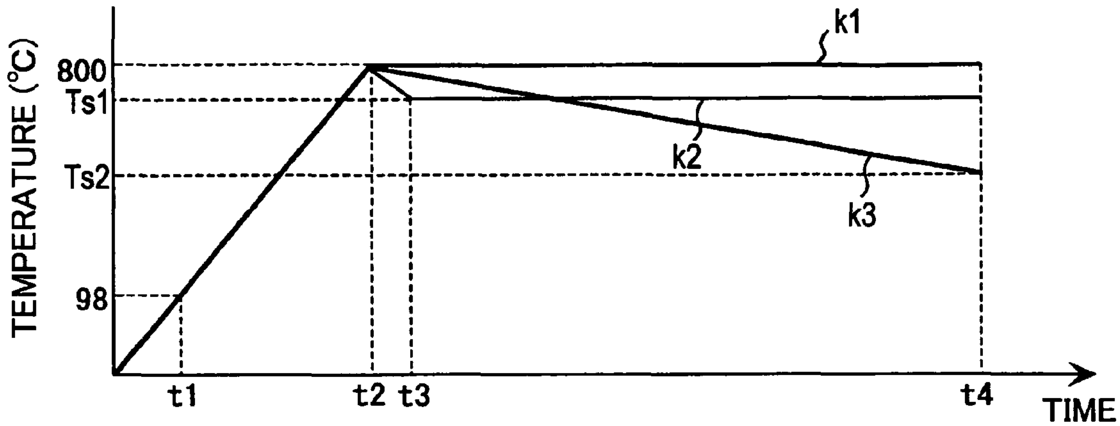
Figure 124:
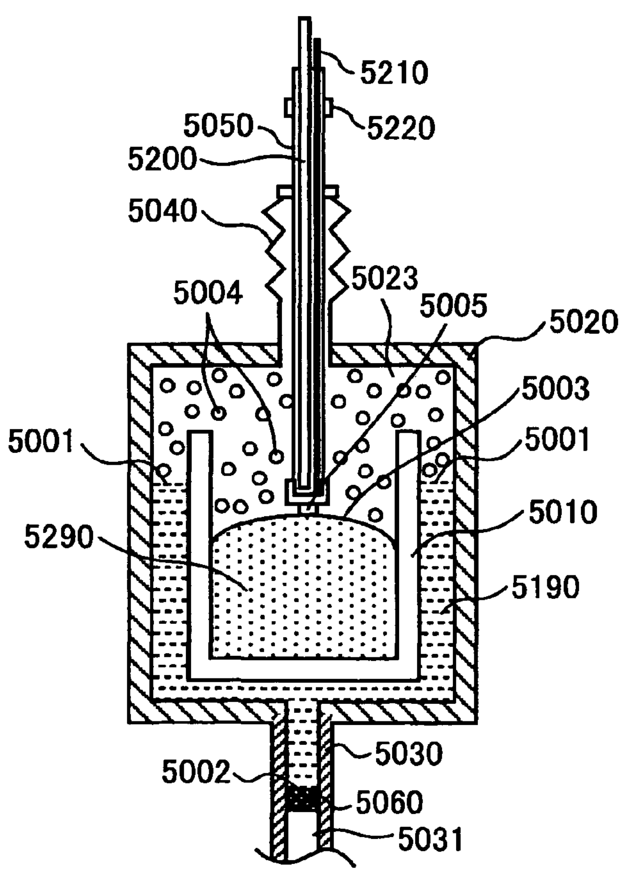
Figure 125:
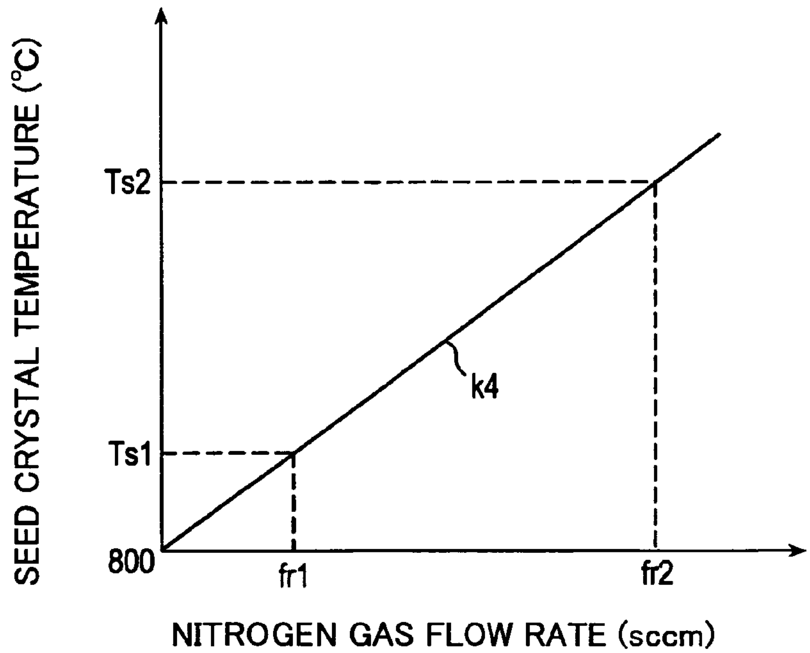

FIG. 123 is a timing chart showing the temperature of the reaction vessel 5010 and the outer reaction vessel 5020. Further, FIG. 124 is a schematic diagram showing the state inside the inner 5010 and the outer reaction vessel 5020 during the interval between two timings t1 and t2 shown in FIG. 123. Further, FIG. 125 is a diagram showing the relationship between the temperature of the seed crystal 5005 and the flow rate of the nitrogen gas.

In FIG. 123, it should be noted that the line k1 represents the temperature of the reaction vessel 5010 and the outer reaction vessel 5020 while the curve k2 and the line k3 represent the temperature of the seed crystal 5005.

Referring to FIG. 123, the heating units 5070 and 5080 heats the reaction vessel 5010 and the outer reaction vessel 5020 such that the temperature rises along the line k1 and is held at 800° C. When the heating units 5070 and 5080 start to heat the reaction vessel 5010 and the outer reaction vessel 5020, the temperature of the reaction vessel 5010 and the outer reaction vessel 5020 start to rise and reaches a temperature of 98° C. at the timing t1 and a temperate of 800° C. at the timing t2.

With this, the metal Na held in the reaction vessel 5010 and the outer reaction vessel 5020 undergoes melting and the metal melt 5190 (=metal Na liquid) is formed. Further, the nitrogen gas 5023 inside the space 5004 cannot escape to the space 5060 inside the conduit 5030 through the metal melt 5190 (=metal Na melt) and the stopper/inlet plug 5031, and the nitrogen gas 5023 is confined in the space 2023. Reference should be made to FIG. 124.

Further, during the interval from the timing t1 in which the temperature of the reaction vessel 5010 and the outer reaction vessel 5020 reaches 98° C. to the timing t2 in which the temperature of the reaction vessel 5010 and the outer reaction vessel 5020 reaches 800° C., it should be noted that the up/down mechanism 5220 moves the support unit 5050 up or down according to the method explained above in response to the vibration detection signal BDS from the vibration detection unit 5240 and maintains the seed crystal 5005 in contact with the melt mixture 5290.

When the temperature of the reaction vessel 5010 and the outer reaction vessel 5020 has reached 800° C., the nitrogen gas 5004 in the space 5023 is incorporated into the melt mixture 5290 via the meditating metal Na. In this case, it should be noted that the concentration of nitrogen or GaxNy (x, y are real numbers) in the melt mixture 5290 takes the maximum value in the vicinity of the vapor-liquid interface 5003 between the space 5023 and the melt mixture 5290, and thus, growth of the GaN crystal starts from the seed crystal 5005 in contact with the vapor-liquid interface 5003. Hereinafter, GaxNy will be designated as "group III nitride" and the concentration of GaxNy will be designated as "concentration of group III nitride".

In the case the nitrogen gas is not supplied to the conduit 5200, the temperature T3 of the seed crystal 5005 is 800° C. and is equal to the temperature of the melt mixture 5290, while in Embodiment 18, the seed crystal 5005 is cooled by supplying a nitrogen gas to the inside of the conduit 5200 for increasing the degree of supersaturation of nitrogen in the melt mixture 4290 in the vicinity of the seed crystal 5005. Thus, the temperature T3 of the seed crystal 5005 is set lower than the temperature of the melt mixture 5290.

More specifically, the temperature T3 of the seed crystal 5005 is set to a temperature Ts1 lower than 800° C. along the curve k2 after the timing t2. This temperature Ts1 may be the temperature of 790° C., for example. Next, the method of setting the temperature T3 of the seed crystal 5005 to the temperature Ts1 will be explained.

The temperature of the melt mixture 5290 is equal to the temperature of the reaction vessel 5010 and the outer reaction vessel 5020. On the other hand, the heater temperatures T1 and T2 of the heating units 5070 and 5080 have a predetermined temperature difference with regard to the temperature of the reaction vessel 5010 and the outer reaction vessel 5020, and thus, the heater temperatures T1 and T2 becomes 800+α° C. when the temperature of the reaction vessel 5010 and the outer reaction vessel 5020 is set to 800° C. Thus, when the temperatures T1, T2 and T3 as measured by the temperature sensors 5071 have reached 800+α° C., the temperature control unit 5280 produces a control signal CTL3 for causing to flow a nitrogen gas with an amount such that the temperature T3 of the seed crystal 5005 is set to the temperature Ts1, and supplies the control signal CTL3 to the flow meter 5260.

With this, the flow meter 5260 causes to flow a nitrogen gas from the gas cylinder 5270 to the conduit 5200 via the gas supply line 5250 in response to the control signal CTL3 with a flow rate determined such that the temperature T3 is set to the temperature Ts1. Thus, the temperature of the seed crystal 5005 is lowered from 800° C. generally in proportion to the flow rate of the nitrogen gas, and the temperature T3 of the seed crystal 5005 is set to the temperature Ts1 when the flow rate of the nitrogen gas has reaches a flow rate value fr1 (sccm). Reference should be made to FIG. 125.

Thus, the flow meter 5260 causes the nitrogen gas to the conduit 5200 with the flow rate value fr1. The nitrogen gas thus supplied to the conduit 5200 hits the bottom surface 5051B of the cylindrical member 5051 via the plural apertures 5201 of the conduit 5200.

With this, the seed crystal 5005 is cooled via the bottom surface 5051B of the cylindrical member 5051 and the temperature T3 of the seed crystal 5005 is lowered to the temperature Ts1 with the timing t3. Thereafter, the seed crystal 5005 is held at the temperature Ts1 until a timing t4.

Because the heater temperatures T1 and T2 of the heating units 5070 and 5080 have a predetermined temperature difference to the temperature of the melt mixture 5290, the temperature control unit 5280 controls the heating units 5071 and 5081, when the temperature T3 of the seed crystal 5005 starts to go down from 800° C., by using the control signals CTL1 and CTL2 such that the temperatures T1 and T2 as measured by the temperature sensors 5070 and 5080 become the temperatures in which the temperature of the melt mixture 5290 is set to 800° C.

With Embodiment 18, it is preferred that the temperature T3 of the seed crystal 5005 is controlled, after the timing t2, such that the temperature is lowered along the line k3. Thus, the temperature T3 of the seed crystal 5005 is lowered from 800° C. to the temperature Ts2 (<Ts1) during the interval from the timing t2 to the timing t4. In this case, the flow meter 5260 increases the flow rate of the nitrogen gas supplied to the conduit 5200 from 0to a flow rate value fr2 along a line k4 based on the control signal CTL3 from the temperature control unit 5280. When the flow rate of the nitrogen gas has become the flow rate value fr2, the temperature T3 of the seed crystal 5005 is set to a temperature Ts2 lower than the temperature Ts1. The temperature Ts2 may be chosen to 750° C.

There are two reasons to increase the difference between the temperature of the melt mixture 5290 (=800° C.) and the temperature T3 of the seed crystal 5005.

The first reason is that it becomes difficult to set the temperature of the GaN crystal grown from the seed crystal 5005 below the temperature of the melt mixture 5290 because there occurs adhesion of GaN crystal on the seed crystal 5005 with progress of crystal growth of the GaN crystal, unless the unless the temperature of the seed crystal 5005 is lowered gradually.

The second reason is that Ga in the melt mixture 5290 is consumed with progress of crystal growth of the GaN crystal and there occurs increase of a parameter γ defined as γ=Na/(Na+Ga). Thereby, the nitrogen concentration or the concentration of the group III nitride in the melt mixture 5290 becomes lower than a supersaturation concentration. Thus, unless the temperature of the seed crystal 5005 is lowered gradually, it becomes difficult to maintain the melt mixture 5290 in the supersaturation state with regard to the nitrogen concentration or the concentration of the group III nitride.

Thus, by lowering the temperature of the seed crystal 5005 gradually with progress of growth of the GaN crystal, the state of supersaturation is maintained with regard to nitrogen or group III nitride in the melt mixture 5290 at least in the vicinity of the seed crystal 5005, and it becomes possible to maintain the growth rate of the GaN crystal. As a result, it becomes possible to increase the size of the GaN crystal.

As described above, Embodiment 18 has the feature of growing the GaN crystal by contacting the seed crystal 5005 with the vapor-liquid interface 5003 (the part of the melt mixture 5290 where the nitrogen concentration or the group III nitride concentration is the highest).

Further, Embodiment 18 has the feature of growing the GaN crystal in the state the nitrogen gas 5004 is confined in the space 5023 of the reaction vessel 5010 and the outer reaction vessel 5020 by the stopper/inlet plug 5060 and the metal melt 5190 (=metal Na melt).

Further, Embodiment 18 has the feature of growing the GaN crystal by setting the temperature T3 of the seed crystal 5005 to the temperature lower than the temperature of the melt mixture 5290.

Figure 126:
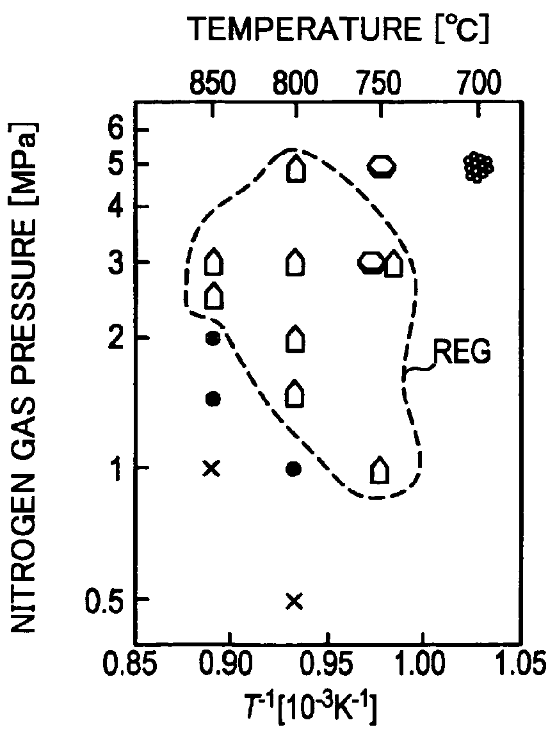

In the case of growing a GaN crystal with the crystal growth apparatus 5100, a GaN crystal grown in the crystal growth apparatus 5100 without using the seed crystal 5005 is used for the seed crystal 5005. FIG. 126 is a diagram showing the relationship between the nitrogen gas pressure and the crystal growth temperature for the case of growing a GaN crystal. In FIG. 126, the horizontal axis represents the crystal growth temperature while the vertical axis represents the nitrogen gas pressure. In FIG. 126, it should be noted that a region REG represents a region in which a columnar GaN crystal grown in a c-axis direction (<0001> direction) is obtained at the bottom surface and sidewall surface of the reaction vessel 5010 exposed to the melt mixture 5290.

Thus, in the case of manufacturing the seed crystal 5005, GaN crystals are grown by using the nitrogen gas pressure and crystal growth temperature of the region REG. In this case, numerous nuclei are formed on the bottom surface and sidewall surface of the reaction vessel 5010 and columnar GaN crystals grown in the c-axis direction are obtained.

Further, the seed crystal 5005 is formed by slicing out the GaN crystal of the shape shown in FIGS. 120A and 120B from the numerous GaN crystals formed as a result of the crystal growth process. Thus, a projecting part 5005A of the seed crystal 5005 shown in FIG. 120B is formed of a GaN crystal grown in the c-axis direction (<0001> direction).

The seed crystal 5005 thus formed is fixed upon the support unit 5050 by fitting into the space 5054 of the support unit 5050.

Figure 127:
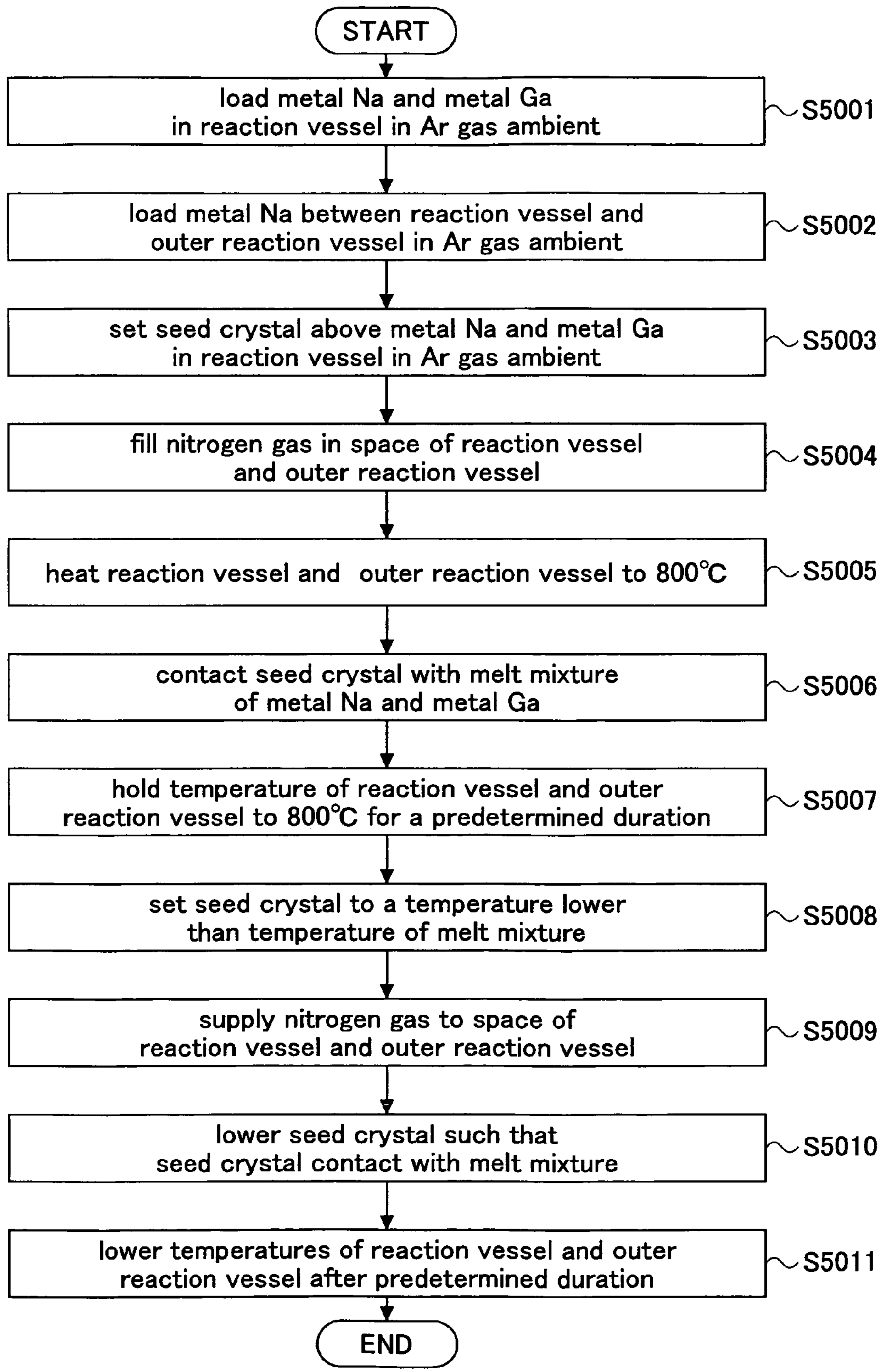

FIG. 127 is a flowchart explaining the manufacturing method of a GaN crystal according to Embodiment 18 of the present invention.

Referring to FIG. 127, the reaction vessel 5010 and the outer reaction vessel 5020 are incorporated into a glove box filled with an Ar gas when a series of processes are started. Further, metal Na and metal Ga are loaded into the reaction vessel 5010 in an Ar gas ambient (Step S5001). In the present case, the metal Na and the metal Ga are loaded into the reaction vessel 5010 with the amount corresponding to a molar ratio of 5:5. The Ar gas should be the one having a water content of 10 ppm or less and an oxygen content of 10 ppm or less (this applied throughout the present invention).

Further, the metal Na is loaded between the reaction vessel 5010 and the outer reaction vessel 5020 in the ambient of an Ar gas (step S5002). Further, the seed crystal 5005 is set in the ambient of the Ar gas at a location above the metal Na and the metal Ga in the reaction vessel 5010 (step S5003). More specifically, the seed crystal 5005 is set above the metal Na and metal Ga in the reaction vessel 5050 by fitting the seed crystal 5005 to the space 5054 formed at the end 5511 of the support unit 5010. Reference should be made to FIG. 120B. Further, the seed crystal 5005 is set above the metal Na and the metal Ga in the reaction vessel 5010.

Next, the reaction vessel 5010 and the outer reaction vessel 5020 are set in the crystal growth apparatus 5100 in the state that the reaction vessel 5010 and the outer reaction vessel 5020 are filled with the Ar gas.

Next, the valve 5160 is opened and the Ar gas filled in the reaction vessel 5010 and the outer reaction vessel 5020 is evacuated by the vacuum pump 5170. After evacuating the interior of the reaction vessel 5010 and the outer reaction vessel 5020 to a predetermined pressure (0.133 Pa or lower) by the vacuum pump 5170, the valve 5160 is closed and the valves 5129 and 5121 are opened. Thereby, the reaction vessel 5010 and the outer reaction vessel 5020 are filled with the nitrogen gas from the gas cylinder 5140 via the gas supply lines 5090 and 5110. In this case, the nitrogen gas is supplied to the reaction vessel 5010 and the outer reaction vessel 5020 via the pressure regulator 5130 such that the pressure inside the reaction vessel 5010 and the outer reaction vessel 5020 becomes about 0.1 MPa.

Further, when the pressure inside the outer reaction vessel 5020 as detected by the pressure sensor 5180 has reached about 0.1 MPa, the valves 5129 and 5121 are closed and the valve 5160 is opened. With this the nitrogen gas filled in the reaction vessel 5010 and the outer reaction vessel 5020 is evacuated by the vacuum pump 5170. In this case, too, the interior of the reaction vessel 5010 and the outer reaction vessel 5020 is evacuated to a predetermined pressure (0.133 Pa or less) by using the vacuum pump 5170.

Further, this vacuum evacuation of the reaction vessel 5010 and the outer reaction vessel 5020 and filling of the nitrogen to the reaction vessel 5010 and the outer reaction vessel 5020 are repeated several times.

Thereafter, the interior of the reaction vessel 5010 and the outer reaction vessel 5020 is evacuated to a predetermined pressure by the vacuum pump 5170, and the valve 5160 is closed. Further, the valves 5129 and 5121 are opened and the nitrogen gas is filled into the reaction vessel 5010 and the outer reaction vessel 5020 by the pressure regulator 5130 such that the pressure of the reaction vessel 5010 and the outer reaction vessel 5020 becomes the range of 1.01-5.05 MPa (step 5004).

Because the metal Na between the reaction vessel 5010 and the outer reaction vessel 5020 is solid in this state, the nitrogen gas is supplied to the space 5060 inside the outer reaction vessel 5030 also from the space 5031 of the conduit 5020 via the stopper/inlet plug 5023. When the pressure of the space 5023 as detected by the pressure sensor 5180 has become 1.01-5.05 Pa, the valve 5129 is closed.

Thereafter, the reaction vessel 5010 and the outer reaction vessel 5020 are heated to 800° C. by the heating units 5070 and 5080 (step S5005). In this process of heating the reaction vessel 5010 and the outer reaction vessel 5020 to 800° C., the metal melt Na held between the reaction 5010 and the outer reaction vessel 5020 undergoes melting in view of the melting temperature of metal Na of about 98° C., and the metal melt 5190 is formed. Thereby, two vapor-liquid interfaces 1 and 2 are formed. Reference should be made to FIG. 117. The vapor-liquid interface 5001 is located at the interface between the metal melt 5190 and the space 5023 in the outer reaction vessel 5020, while the vapor-liquid interface 5002 is located at the interface between the metal melt 5190 and the stopper/inlet plug 5060.

At the moment the temperature of the reaction vessel 5010 and the outer reaction vessel 5020 is raised to 800° C., the temperature of the stopper/inlet plug 5060 becomes 150° C. This means that the vapor pressure of the metal melt 5190 (=metal Na melt) at the vapor-liquid interface 5002 is $7.6\times10^{-4}$ Pa, and thus, there is caused little evaporation of the metal melt 5190 (=metal Na melt) through the gaps 5063 of the stopper/inlet plug 5060. As a result, there occurs little decrease of the metal melt 5190 (=metal Na melt).

Further, even when the temperature of the stopper/inlet plug 5060 is raised to 300° C. or 400° C., the vapor pressure of the metal melt 5190 (=metal Na melt) is only 1.8 Pa and 47.5 Pa, respectively, and decrease of the metal melt 5190 (=metal Na melt) by evaporation is almost ignorable with such a vapor pressure.

Thus, with the crystal growth apparatus 5100, the temperature of the stopper/inlet member 5060 is set to a temperature such that there occurs little decrease of the metal melt 5190 (=metal Na melt) by way of evaporation.

Further, during the step in which the inner reaction vessel 5010 and the outer reaction vessel 5020 are heated to 800° C., the metal Na and the metal Ga inside the reaction vessel 5010 becomes a liquid, and the melt mixture 5290 of metal Na and metal Ga is formed in the reaction vessel 5010. Next, the up/down mechanism 5220 causes the seed crystal 5005 to make a contact with the melt mixture 5290 (step S5006).

Further, when the temperature of the crucible 5010 and the outer reaction vessel 5020 is elevated to 800° C., the nitrogen gas in the space 5023 is incorporated into the melt mixture 5290 via the mediating metal Na, and there starts the growth of GaN crystal from the seed crystal 5005.

Thereafter, the temperatures of the reaction vessel 5010 and the outer reaction vessel 5020 are held at 800° C. for a predetermined duration (several ten hours to several hundred hours) (step S5007), and the temperature T3 of the seed crystal 5005 is set to the temperature Ts1 (or Ts1) lower than the temperature of the melt mixture 5290 (=800° C.) according to the method explained above (step S5008).

Thus, with progress of growth of the GaN crystal, the nitrogen gas in the space 5023 is consumed and there is caused a decrease of the nitrogen gas in the space 5023. Then the pressure P1 of the space 5023 becomes lower than the pressure P2 of the space 5031 inside the conduit 5030 (P1<P2), and there is formed a differential pressure between the space 5023 and the space 5031. Thus, the nitrogen gas in the space 5031 is supplied to the space 5023 consecutively via the stopper/inlet plug 5060 and the metal melt 5190 (=metal Na melt) (step S5009).

Thereafter, the seed crystal 5005 is lowered so as to make a contact with the melt mixture 5290 according to the method explained above (step S5010). With this a GaN crystal of large size is grown.

After the predetermined time has elapsed, the temperatures of the reaction vessel 5010 and the outer reaction vessel 5020 are lowered (step S5011), and manufacturing of the GaN crystal is completed.

In the flowchart shown FIG. 127, explanation was made such that the seed crystal is contacted with the melt mixture 190 of the metal Na and the metal Ga when the crucible 5010 and the outer reaction vessel 5020 are heated to 800° C. (see steps S5005 and S5006), while the present embodiment is not limited to such an embodiment and it is also possible to hold the seed crystal 5005 inside the melt mixture 5290 containing the metal Na and the metal Ga in the step S5006 when the crucible 5010 and the reaction vessel 5020 are heated to 800° C. in the step S5006. Thus, when the reaction vessel 5010 and the outer reaction vessel 5020 are heated to 800° C., it is possible to carry out the crystal growth of the GaN crystal from the seed crystal 5005 by dipping the seed crystal 5005 into the melt mixture 5290.

It should be noted that the operation for making the seed crystal 5005 to contact with the melt mixture 5290 comprises the step A for applying a vibration to the support unit 5050 by the vibration application unit 5230 and detecting the vibration detection signal BDS indicative of the vibration of the support unit 5050; and the step B of moving the support unit 5050 by the up/down mechanism 5220 such that the vibration detection signal changes to the state (component SS2 of the vibration detection signal BDS) corresponding to the situation where the seed crystal 5005 has made contact with the melt mixture 5290.

Further, it should be noted that the operation for holding the seed crystal 5005 in the melt mixture 5290 comprises the step A for applying a vibration to the support unit 5050 by the vibration application unit 5230 and detecting the vibration detection signal BDS indicative of the vibration of the support unit 5050; and the step B of moving the support unit 5050 by the up/down mechanism 5220 such that the vibration detection signal changes to the state (component SS3 of the vibration detection signal BDS) corresponding to the situation where the seed crystal 5005 been dipped into the melt mixture 5290.

In the steps B and C, it should be noted that the support unit 5050 is moved by the up/down mechanism 5220 because there is caused variation of location for the melt surface (=interface 5003) for the melt mixture 5290 formed in the crucible 5010 depending on the volume of the crucible 5010 and the total amount of the metal Na and the metal Ga loaded into the crucible 5010, as in the case of the seed crystal 5005 being dipped into the melt mixture 5290 at the moment when the melt mixture 5290 is formed in the crucible 5010 or the seed crystal 5005 being held in the space 5023, and thus there is a need of moving the seed crystal up or down in the gravitational direction DR1 in order that the seed crystal 5005 makes a contact with the melt mixture 5290 or the seed crystal 5005 is dipped into the melt mixture 5290.

Further, while explanation has been made with the step S5010 of the flowchart shown in FIG. 127 that the seed crystal 5005 is lowered such that the seed crystal 5005 makes a contact with the melt mixture 5290, it should be noted that the step S5010 of the present embodiment shown in the flowchart shown in FIG. 127 generally comprises a step D of moving the support unit 5050 by the up/down mechanism 5220 such that the GAN crystal grown from the seed crystal 5005 makes a contact with the melt mixture 5290 during the growth of the GaN crystal.

It should be noted that, while there occurs lowering of the liquid surface (=interface 5003) of the melt mixture 5290 because of consumption of Ga in the melt mixture 5290 with progress of growth of the GaN crystal, there may be a case in which it is necessary to move the GaN crystal grown from seed crystal 5005 in the upward direction or it is necessary to move the GaN crystal grown from the seed crystal 5005 in the downward direction with progress of growth of the GaN crystal, depending on the relationship between the rate of lowering the liquid surface (=interface 5003) and the growth rate of the GaN crystal.

Thus, in the case the rate of lowering of the liquid surface (=interface 5003) is faster than the growth rate of the GaN crystal, the GaN crystal grown from the seed crystal 5005 is moved downward for maintaining the contact of the GaN crystal with the liquid surface (=interface 5003) of the melt mixture 5290. On the other hand, in the case the rate of lowering of the liquid surface (=interface 5003) is slower than the growth rate of the GaN crystal, the GaN crystal grown from the seed crystal 5005 is moved upward for maintaining the contact of the GaN crystal with the liquid surface (=interface 5003) of the melt mixture 5290.

Thus, in view of the need of moving the GaN crystal grown from the seed crystal 5005 up or down in the gravitational direction DR1 depending on the relationship between the lowering rate of the liquid surface (=interface 5003), the step D is defined as "moving the support unit 5050 by the up/down mechanism 5220".

Further, it should be noted that the operation for making the GaN crystal grown from the seed crystal 5005 to contact with the melt mixture 5290 comprises the step A and the step B noted above.

As noted before, the manufacturing method of GaN crystal of the present embodiment grows the GaN crystal by contacting the seed crystal 5005 to the part of the melt mixture 5290 of the metal Na and the metal Ga where the nitrogen concentration or the concentration of the group III nitride is the highest, and as a result, nucleation in the part other than the seed crystal 5005 is suppressed and the GaN crystal grows preferentially from the seed crystal 5005. As a result, it becomes possible to grow a GaN crystal of large size. This GaN crystal is a defect-free crystal having a columnar shape grown in the c-axis direction (<0001> direction).

Further, with the manufacturing method of the GaN crystal of the present embodiment in which the growth of the GaN crystal is made while setting the temperature T3 of the seed crystal 5005 to be lower than the crystal growth temperature (=800° C.), it becomes possible to increase the degree of supersaturation of nitrogen in the melt mixture 5290 in the vicinity of the seed crystal 5005, and the GaN crystal is grown preferentially from the seed crystal 5005. Further, it becomes possible to increase to the growth rate of the GaN crystal.

Further, because the seed crystal 5005 is lowered by the up/down mechanism 5220 with growth of the GaN crystal such that contact of the seed crystal 5005 to the melt mixture 5290 is maintained, it becomes possible to maintain the state in which the is growth of the GaN crystal occurs preferentially from the seed crystal 5005. As a result, it becomes possible to grow a GaN crystal of large size.

Figure 128:
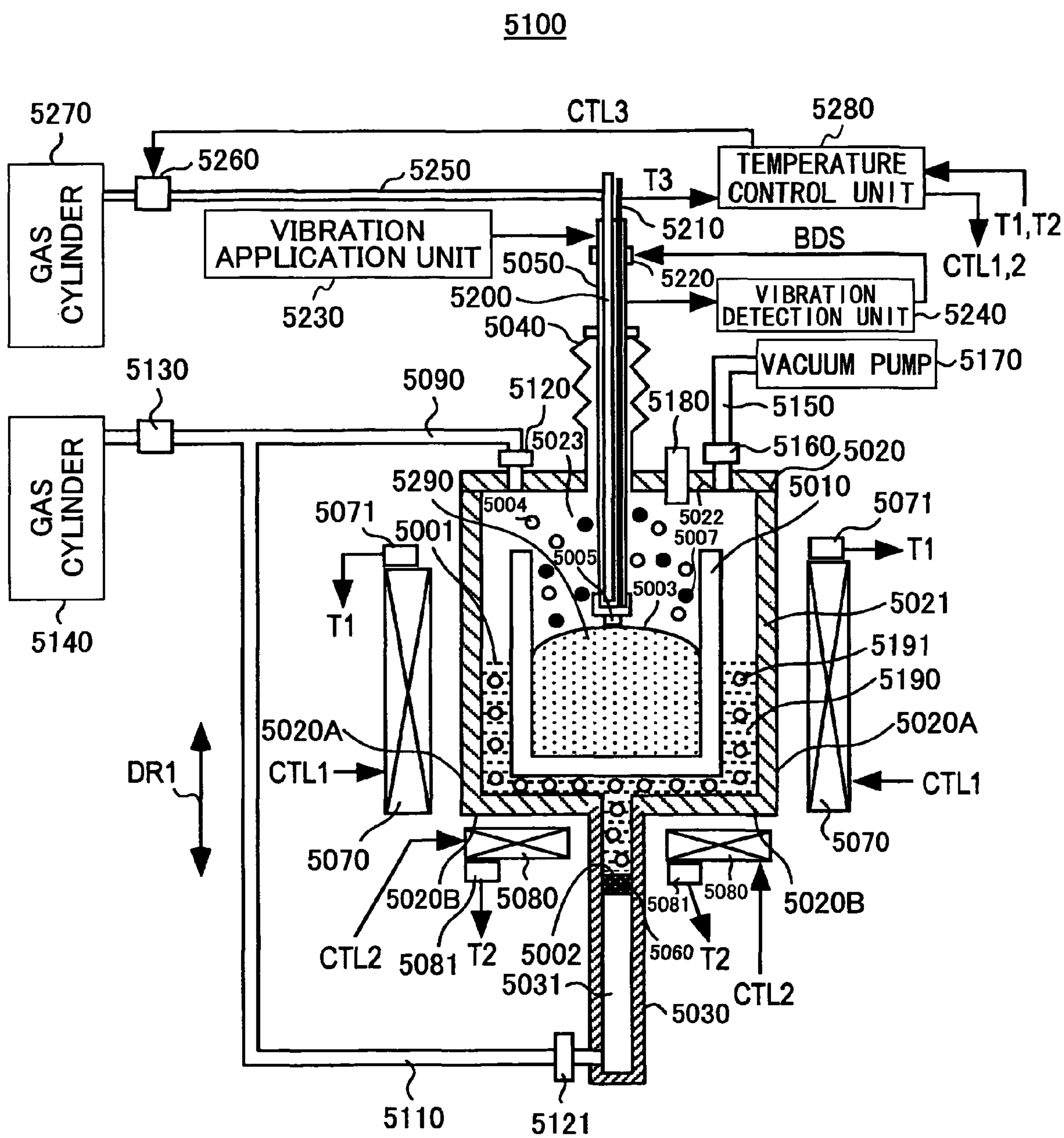

FIG. 128 is a schematic diagram showing the state inside the reaction vessel 5009 and the outer reaction vessel 5020 in the step S5009 shown in FIG. 127.

Referring to FIG. 128, the temperatures of the reaction vessel 5010 and the outer reaction vessel 5020 are held at 800° C. during the interval from the timing t2 to the timing t4, and growth of the GaN crystal proceeds in the melt mixture 5290. Further, with progress of growth of the GaN crystal, there occurs evaporation of metal Na from the metal melt 5190 and the melt mixture 5290, and thus, there exist a mixture of the nitrogen gas 5004 and the metal Na vapor 7 in the space 5023.

Further, with consumption of the nitrogen gas 5004, the pressure P1 of the space 5023 is lowered than the pressure P2 of the space 5031 inside the conduit 5030.

Then the nitrogen gas is supplied from the space 5031 of the conduit 5030 to the metal melt 5190 via the stopper/inlet plug 5060 and moves through the metal melt 190 in the form of bubbles 5190. Thus, the nitrogen gas is supplied to the space 5023 through the vapor-liquid interface 1. Now, when the pressure P1 of the space 5023 becomes generally equal to the pressure P2 inside the space 5031, the supply of the nitrogen gas from the space 5031 of the conduit 5030 to the reaction vessel 5010 and the outer reaction vessel 5020 via the stopper/inlet plug 5060 and the metal melt 5190 is stopped.

Thus, the stopper/inlet plug 5060 holds the metal melt 5190 (=metal Na melt) between the reaction vessel 5010 and the outer reaction vessel 5020 and also inside the conduit 5030 by the surface tension of the metal melt 5190 and further supplies the nitrogen gas from the space 5031 to the reaction vessel 5010 and the outer reaction vessel 5020. Thus, the stopper/inlet plug 5060 is formed of a structure that blocks passage of the metal melt 5190 therethrough.

Further, the crystal growth apparatus 5100 has the feature of growing the GaN crystal in the state in which the metal Na vapor 5007 is confined in the space 5023. In the state the metal Na vapor 5007 is confined in the space 5023, further evaporation of the metal Na from the melt mixture 5290 is suppressed once the evaporation of the metal Na from the metal melt 5190 and the evaporation of the metal Na from the melt mixture 5290 are balanced. Thus, with the foregoing feature, it becomes possible to suppress the change of ratio of the metal Na and the metal Ga in the melt mixture caused by admixing of the metal Na evaporated from the metal melt 5190 into the melt mixture 5290 and migration of the metal Na evaporated from the melt mixture 5290 to the side of the metal melt 5190, and it become possible to grow a high-quality GaN crystal.

Further, the crystal growth apparatus 5100 has the feature of growing the GaN crystal by setting the temperature T3 of the seed crystal 5005 to the temperature lower than the temperatures of the reaction vessel 5010 and the outer reaction vessel 5020.

With this feature, it becomes possible to grow the GaN crystal from the seed crystal 5005 by increasing the degree of supersaturation of nitrogen or the group III nitride in the melt mixture in the vicinity of the seed crystal 5005. Thus, it becomes possible to control such that the GaN crystal grows only from the seed crystal 5005 by suppressing nucleation in the sites other than the seed crystal 5005. As a result, it becomes possible to grow a GaN crystal of large size.

Further, with the crystal growth apparatus 5100, the temperature T4 of the vapor-liquid interface 5001 between the space 5023 inside the outer reaction vessel 5023 and the metal liquid 5190 or of the temperature near the vapor-liquid interface 5003, and the temperature T5 of the vapor-liquid interface 5003 between the space 5023 and the melt mixture 5290 or of the temperature near the vapor-liquid interface 5003, are set to the respective temperatures such that the vapor pressure of the metal Na evaporated from the metal melt 5190 is generally identical with the vapor pressure of the metal Na evaporated from the melt mixture 5290.

When these two temperatures are identical, the vapor pressure of the metal Na evaporated from the metal melt 5190 becomes higher than the vapor pressure of the metal Na evaporated from the melt mixture 5290, and thus, the temperature T4 is set to be lower than the temperature T5 such that the vapor pressure of the metal Na evaporated from the metal melt 5190 becomes generally identical with the vapor pressure of the metal Na evaporated from the melt mixture 5290 in the space 5023. As a result, it becomes possible to suppress the change ratio of the metal Na and the metal Ga in the melt mixture 5290 caused by the migration of the metal Na from the metal melt 5190 to the melt mixture 5290 or by the migration of the metal Na from the melt mixture 5290 to the metal melt 5190, and it becomes possible to manufacture a GaN crystal of large size stably.

Figure 129:
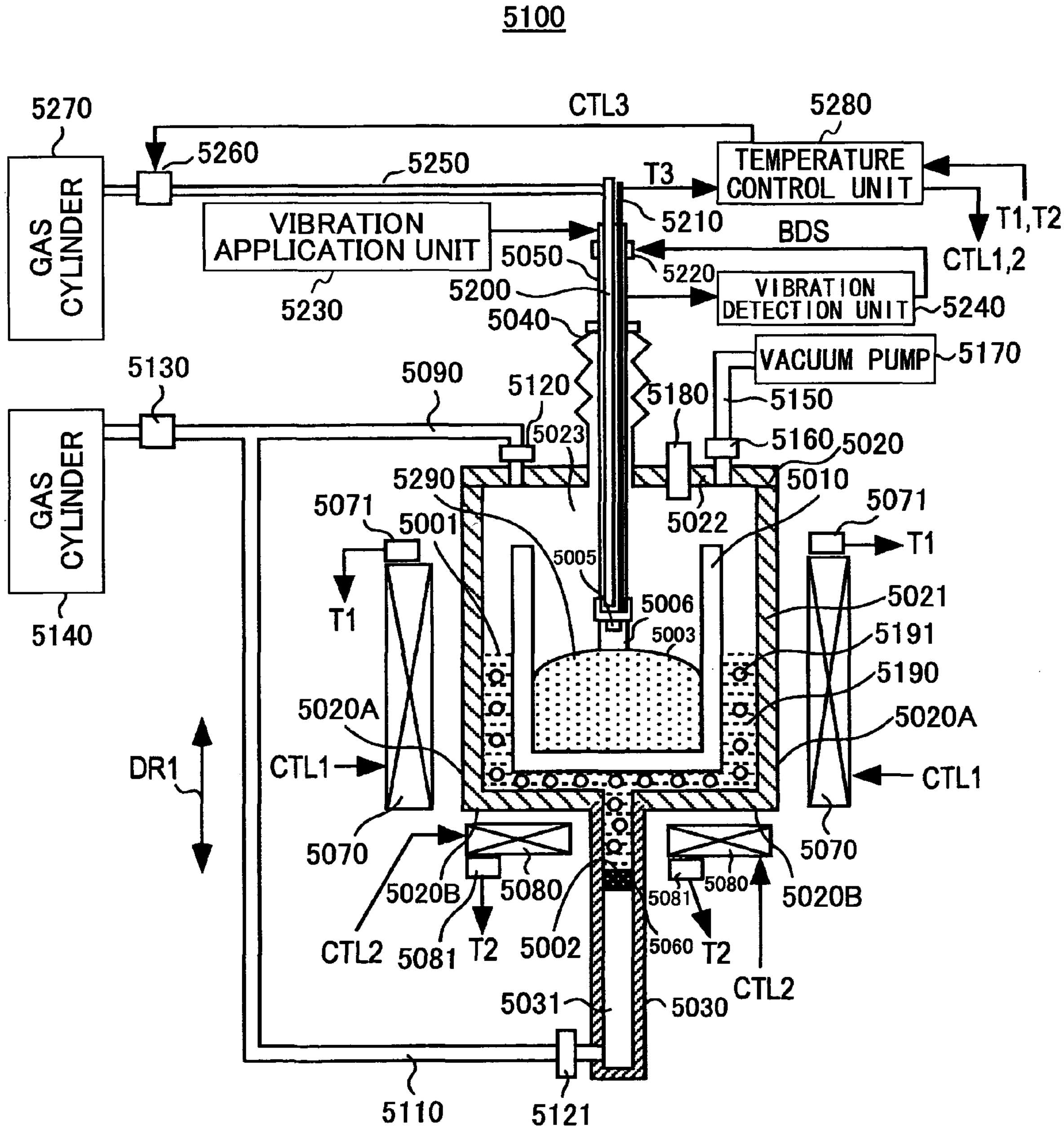

FIG. 129 is a schematic diagram showing the state inside the reaction vessel 5010 and the outer reaction vessel 5020 in the step S5010 shown in FIG. 127. It can be seen that there is caused lowering of the vapor-liquid interface 5003 with progress of the growth of the GaN crystal and the GaN crystal 5006 grown from the seed crystal 5005 separates from the melt mixture 5290.

When this occurs, the vibration detection signal BDS becomes solely from the component SS2 (see FIG. 122), and thus, the up/down mechanism 5220 lowers the support unit 5050 in response to the vibration detection signal BDS such that the GaN crystal 5006 makes a contact with the melt mixture 5290 according to the process explained above. Thereby, the GaN crystal contacts with the metal mixture 5290 again, and there occurs the preferential growth the GaN crystal 6.

Thus, with Embodiment 18, the seed crystal 5005 or the GaN crystal 6 grown from the seed crystal 5005 is made contact with the melt mixture 5290 constantly during the growth of the GaN crystal.

With this, it becomes possible to grow a GaN crystal of large size.

Further, while the present embodiment has been explained for the case in which the support unit 5050 is applied with vibration and the seed crystal 5005 or the GaN crystal 5006 is controlled to make a contact with the melt mixture 5290 while detecting the vibration of the support unit 5050, the present embodiment is not limited to such a construction and it is also possible to cause the seed crystal 5005 or the GaN crystal 5006 to make a contact with the melt mixture 5290 by detecting the location of the vapor-liquid interface 5003. In this case, an end of a conductor wire is connected to the outer reaction vessel 5020 from the outside and the other end is dipped into the melt mixture 5290. Further, an electric current is caused to flow through the conductor wire in this state and location of the vapor-liquid interface 5003 is detected in terms of the length of the conductor wire in the outer reaction vessel 5020 in which there has been noted a change of the current from Off to On.

Thus, when the other end of the conductor wire is dipped into the melt mixture 5290, there is caused conduction of the current through the melt mixture 5290, the reaction vessel 5010, the metal melt 5190 and the outer reaction vessel 5020, while when the other end is not dipped into the melt mixture 5290, no current flows through the conductor wire.

Thus, it is possible to detect the location of the vapor-liquid interface 5020 by the length of the conductor wire inserted into the outer reaction vessel 5003 for the case of causing the change of state of the electric current from Off to On. When the location of the vapor-liquid interface 5003 is detected, the up/down mechanism 5220 lowers the seed crystal 5005 or the GaN crystal 6 to the location of the detected vapor-liquid interface 5003.

Further, it is also possible to detect the location of the vapor-liquid interface 5003 by emitting a sound to the vapor-liquid interface 5003 and measuring the time for the sound to go and back to and from the vapor-liquid interface 5003.

Further, it is possible to insert a thermocouple into the reaction vessel 5020 from the outer reaction vessel 5010 and detect the location of the vapor-liquid interface 5020 from the length of the thermocouple inserted into the outer reaction vessel 5003 at the moment when the detected temperature has been changed.

Further, while the temperature of the seed crystal 5005 has been set lower than the temperature of the metal melt 5290 by cooling the seed crystal 5005, it is also possible with the present embodiment to provide a heater in the conduit 5200 and control the temperature of the seed crystal 5005 by using this heater. In the case the reaction vessel 5010 and the outer reaction vessel 5020 are heated by the heating units 5070 and 5080, there are cases in which the temperature of the seed crystal 5005 does not rise similarly to the temperature of the melt mixture 5290. In such a case, the seed crystal 5005 is heated by the heater disposed in the conduit 5200 and the temperature of the seed crystal 5005 is controlled so as to change along the curve k2 or line k3 shown in FIGS. 123.

Thus, with Embodiment 18, it is possible to control the heating units 5070 and 5080 and the heater in the conduit 5200 such that the difference between the temperature of the melt mixture 5290 and the temperature of the seed crystal 5005 becomes equal to the temperature difference between the line k1 an the curve k2 or the temperature difference between the line k1 and the line k3 shown in FIGS. 123.

Further, while it has been explained that the height H of the projection 5062 of the stopper/inlet plug 5060 and the separation d between the projections 5062 are explained as several ten microns, it is possible that the height H of the projection 5062 and the separation d between the projections 5062 may be determined by the temperature of the stopper/inlet plug 5060. More specifically, when the temperature of the stopper/inlet plug 5060 is relatively high, the height H of the projection 5062 is set relatively higher and the separation d between the projections 5062 is set relatively smaller. Further, when the temperature of the stopper/inlet plug 5060 is relatively low, the height H of the projection 5062 is set relatively lower and the separation d between the projections 5062 is set relatively larger. Thus, in the case the temperature of the stopper/inlet plug 5060 is relatively high, the size of the gap 5063 between the stopper/inlet plug 5060 and the conduit 5030 is set relatively small, while in the case the temperature of the stopper/inlet plug 5060 is relatively high, the size of the gap 5063 between the stopper/inlet plug 5060 and the conduit 5030 is set relatively larger.

It should be noted that the size of the cap 5062 is determined by the height H of the projection 5062 and the separation d between the projections 5063, while the size of the gap 5063 capable of holding the metal melt 5190 by the surface tension changes depending on the temperature of the stopper/inlet plug 5060. Thus, the height H of the projection 5062 and the separation d between the projections 5062 are changed depending on the temperature of the stopper/inlet plug 5060 and with this, the metal melt 5190 is held reliably by the surface tension.

The temperature control of the stopper/inlet valve 5060 is achieved by the heating unit 5080. Thus, when the stopper/inlet plug 5060 is to be heated to a temperature higher than 150° C., the stopper/inlet plug 5060 is heated by the heating unit 5080.

Further, with the present embodiment, the gas cylinder 5140, the pressure regulator 5130, the gas supply lines 5090 and 5110, the conduit 5030, the stopper/inlet plug 5060 and the metal melt 5190 constitute the "gas supply unit".

Further, the gas cylinder 5270, the flow meter 5260, the gas supply line 5250, the conduit 5200 and the cylindrical member 5051 constitute the "temperature measuring unit" or "cooling unit".

Further, the heater set in the conduit 5200 constitutes the "temperature setting unit".

Embodiment 19

Figure 130:
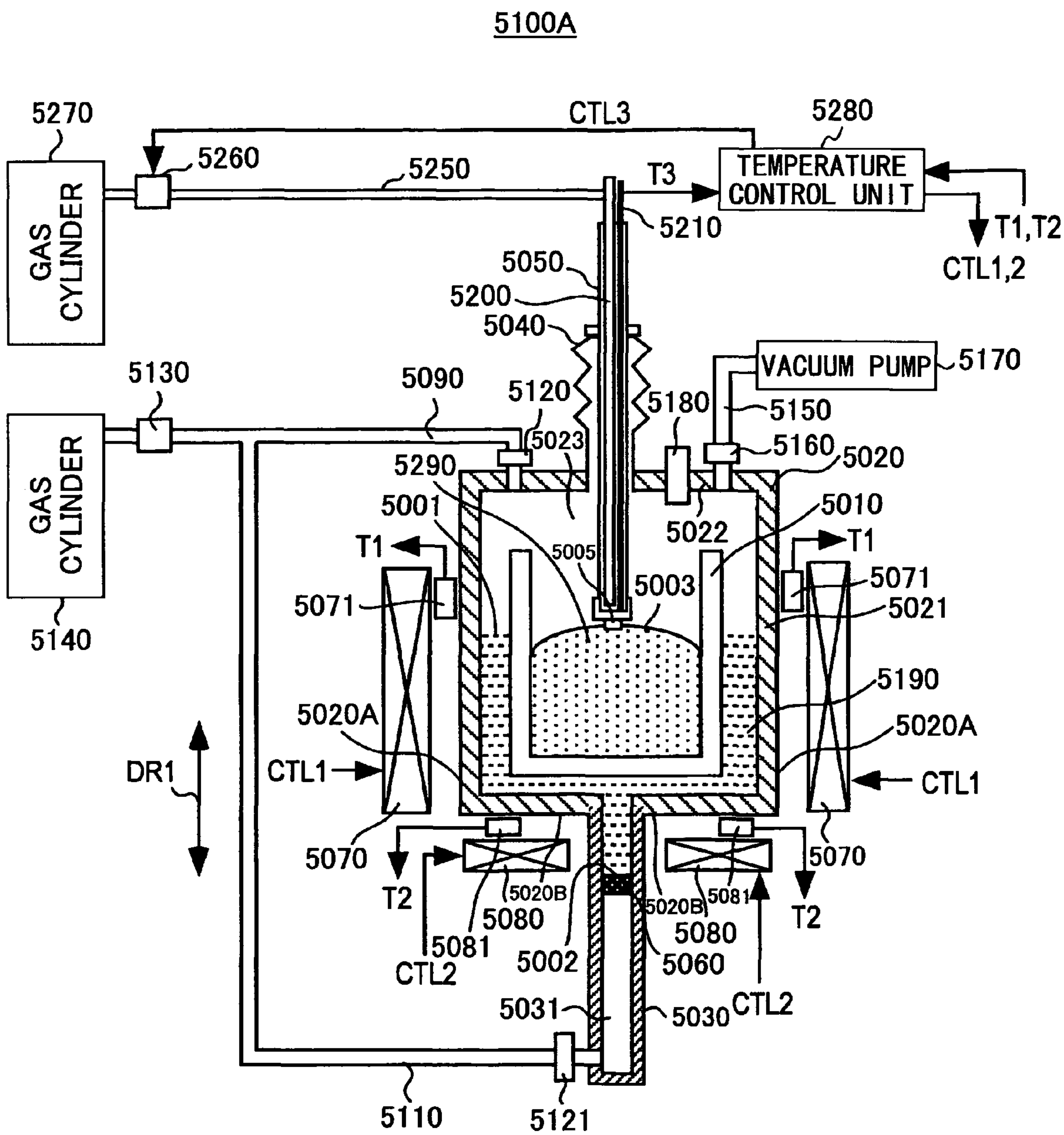

FIG. 130 is a schematic cross-sectional diagram showing a crystal growth apparatus according to Embodiment 19 of the present invention.

Referring to FIG. 130, the crystal growth apparatus 5100A of Embodiment 19 has a construction generally identical with the construction of the crystal growth apparatus 5100 shown in FIG. 117, except that the up/down mechanism 5220, the vibration application unit 5230 and the vibration detection unit 5240 are removed.

With the crystal growth apparatus 5100A, there is provided no function of moving the support unit 5050 up or down in the gravitational direction DR1, and the seed crystal 5005 is supported by the support unit 5050 so as to be dipped in the melt mixture 5290.

In the case of growing the GaN crystal by using the crystal growth apparatus 5100A, the metal Na and the metal Ga are loaded into the reaction vessel 5010 in an Ar gas ambient while using the glove box, and the metal Na is loaded between the reaction vessel 5010 and the outer reaction vessel 5020 in the Ar gas ambient. Further, the seed crystal 5005 is fixed upon the support unit 5050 in the Ar gas ambient.

In this case, the support unit 5050 is moved up or down in the glove box for determining the location of the seed crystal 5005 such that the seed crystal 5005 is dipped into the melt mixture when the metal Na and the metal Ga undergo melting in the reaction vessel 5010 and the melt mixture 5290 is formed in the reaction vessel 5010.

Thereafter, the reaction vessel 5010 and the outer reaction vessel 5020 are set to the crystal growth apparatus 5100A in the state the space 5023 in the outer reaction vessel 5020 is filled with the Ar gas.

Further, after opening the valve 5160 and evacuating the interiors of the reaction vessel 5010 and the outer reaction vessel 5020 to a predetermined pressure (0.133 Pa or lower) by the vacuum pump 5170 via the evacuation line 5150, the valve 5160 is closed and the valves 5129 and 5121 are opened. Thereby, the reaction vessel 5010 and the outer reaction vessel 5020 are filled with the nitrogen gas from the gas cylinder 5140 via the gas supply lines 5090. In this case, the nitrogen gas is supplied to the reaction vessel 5010 and the outer reaction vessel 5020 via the pressure regulator 5130 such that the pressure inside the reaction vessel 5010 and the outer reaction vessel 5020 becomes about 0.1 MPa.

Further, when the pressure inside the reaction vessel 5010 and the outer reaction vessel 5020 as detected by the pressure sensor 5180 has reached about 0.1 MPa, the valves 5129 and 5121 are closed and the valve 5160 is opened. With this the nitrogen gas filling the reaction vessel 5010 and the outer reaction vessel 5020 is evacuated by the vacuum pump 5170. In this case, too, the interior of the reaction vessel 5010 and the outer reaction vessel 5020 is evacuated to a predetermined pressure (0.133 Pa or less) by using the vacuum pump 5170.

Further, this vacuum evacuation of the reaction vessel 5010 and the outer reaction vessel 5020 and filling of the nitrogen to the reaction vessel 5010 and the outer reaction vessel 5020 are repeated several times.

Thereafter, the interior of the reaction vessel 5010 and the outer reaction vessel 5020 is evacuated to a predetermined pressure by the vacuum pump 5170, and the valve 5160 is closed. Further, the valves 5129 and 5121 are opened and the nitrogen gas is filled into the reaction vessel 5010 and the outer reaction vessel 5020 by the pressure regulator 5130 such that the pressure of the reaction vessel 5010 and the outer reaction vessel 5020 becomes the range of 1.01-5.05 MPa.

When the pressure as detected by the pressure sensor 5180 has become 1.01-5.05 Pa, the valve 5129 is closed.

When filling of the nitrogen gas into the reaction vessel 5010 and the outer reaction vessel 5020 is completed, the reaction vessel 5010 and the outer reaction vessel 5020 are heated by the heating units 5070 and 5080 to 800° C., and the temperature of the reaction vessel 5010 and the outer reaction vessel 5020 is held at 800° C. thereafter for several ten hours to several hundred hours.

Further, when the reaction vessel 5010 and the outer reaction vessel 5020 are heated to 800° C., the temperature of the seed crystal 5005 is controlled according to the process explained above along the curve k2 or the line k3 (see FIG. 123).

With this, the metal Na and the metal Ga loaded into the reaction vessel 5010 undergoes melting with heating of the reaction vessel 5010 and the melt mixture 5290 is formed in the reaction vessel 5010. Further, the metal Na loaded between the reaction vessel 5010 and the outer reaction vessel 5020 undergoes melting and the metal melt 5190 is formed as a result. As a result, the nitrogen gas existing in the space 5020 of the outer reaction vessel 5023 cannot pass through the metal melt 5190, and thus, the nitrogen gas is confined in the spaces 5023.

Then, the GaN grows preferentially from the seed crystal 5005 dipped into the melt mixture 5290. Thereafter, as explained with reference to Embodiment 18, the nitrogen gas is introduced into the space 5023 via the stopper/inlet plug 5060 and the metal melt 5190, and there proceeds the growth of the GaN crystal.

As a result, it becomes possible to achieve crystal growth of a large GaN crystal similarly to the case of the crystal growth apparatus 5100 shown in FIG. 117.

Figure 131:
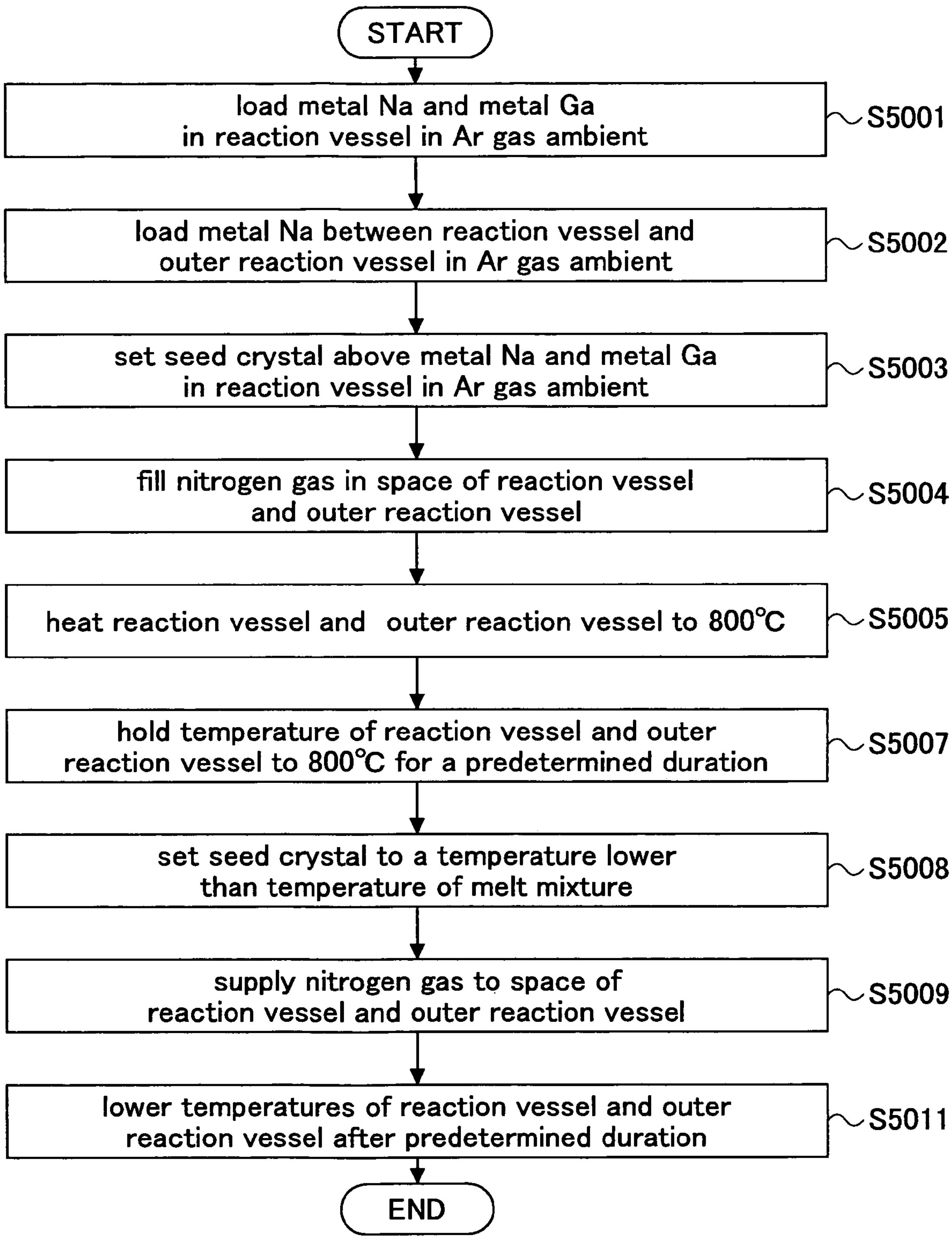

FIG. 131 is a flowchart explaining the manufacturing method of a GaN crystal according to Embodiment 19 of the present invention. It should be noted that the flowchart of FIG. 131 is identical to the flowchart shown in FIG. 127 except that the step S5006 of the flowchart shown in FIG. 127 is removed.

Thus, it becomes possible to achieve the growth of the GaN crystal preferentially from the seed crystal 5005 while suppressing nucleation in the part other than the seed crystal without moving the seed crystal 5005 up or down in the gravitational direction, and it becomes possible to manufacture a large size GaN crystal.

Otherwise, the present embodiment is identical to Embodiment 18.

Embodiment 20

FIG. 132 is a schematic cross-sectional diagram showing a crystal growth apparatus according to Embodiment 10 of the present invention.

Referring to FIG. 132, the crystal growth apparatus 5100B of Embodiment 20 has a construction generally identical with the construction of the crystal growth apparatus 5100 shown in FIG. 117, except that the conduit 5200, the thermocouple 5210, the gas supply line 5250, the flow meter 5260 and the gas cylinder 5270 are removed.

With the crystal growth apparatus 5100B, the function of controlling the temperature of the seed crystal 5005 to a temperature lower than the temperature of the metal mixture 5290 after the reaction vessel 5010 and the outer reaction vessel 5020 are heated to the crystal growth temperature (=800° C.) is omitted, and thus, the temperature of the seed crystal 5005 is held at 800° C. during the crystal growth of the GaN crystal.

In the case of growing the GaN crystal by using the crystal growth apparatus 5100B, the metal Na and the metal Ga are loaded into the reaction vessel 5010 in an Ar gas ambient while using the glove box, and the metal Na is loaded between the reaction vessel 5010 and the outer reaction vessel 5020 in the Ar gas ambient. Further, the seed crystal 50005 is fixed upon the support unit 5050 in the Ar gas ambient.

Thereafter, the reaction vessel 5100 and the outer reaction vessel 5020 are set to the crystal growth apparatus 5100B in the state the space 5023 in the outer reaction vessel 5020 is filled with the Ar gas.

Further, after opening the valve 5160 and evacuating the interiors of the reaction vessel 5010 and the outer reaction vessel 5020 to a predetermined pressure (0.133 Pa or lower) by the vacuum pump 5170 via the evacuation line 5150, the valve 5160 is closed and the valves 5129 and 5121 are opened. Thereby, the reaction vessel 5010 and the outer reaction vessel 5020 are filled with the nitrogen gas from the gas cylinder 5140 via the gas supply lines 5090. In this case, the nitrogen gas is supplied to the reaction vessel 5010 and the outer reaction vessel 5020 via the pressure regulator 5130 such that the pressure inside the reaction vessel 5010 and the outer reaction vessel 5020 becomes about 0.1 MPa.

Further, when the pressure inside the reaction vessel 5010 and the outer reaction vessel 5020 as detected by the pressure sensor 5180 has reached about 0.1 MPa, the valves 5129 and 5121 are closed and the valve 5160 is opened. With this the nitrogen gas filling the reaction vessel 5010 and the outer reaction vessel 5020 is evacuated by the vacuum pump 5170. In this case, too, the interior of the reaction vessel 5010 and the outer reaction vessel 5020 is evacuated to a predetermined pressure (0.133 Pa or less) by using the vacuum pump 5170.

Further, this vacuum evacuation of the reaction vessel 5010 and the outer reaction vessel 5020 and filling of the nitrogen to the reaction vessel 5010 and the outer reaction vessel 5020 are repeated several times.

Thereafter, the interior of the reaction vessel 5010 and the outer reaction vessel 5020 is evacuated to a predetermined pressure by the vacuum pump 5170, and the valve 5160 is closed. Further, the valves 5129 and 5121 are opened and the nitrogen gas is filled into the reaction vessel 5010 and the outer reaction vessel 5020 by the pressure regulator 5130 such that the pressure of the reaction vessel 5010 and the outer reaction vessel 5020 becomes the range of 1.01-5.05 MPa.

When the pressure as detected by the pressure sensor 5180 has become 1.01-5.05 Pa, the valve 5129 is closed.

When filling of the nitrogen gas into the reaction vessel 5010 and the outer reaction vessel 5020 is completed, the reaction vessel 5010 and the outer reaction vessel 5020 are heated by the heating units 5070 and 5080 to 800° C., and the temperature of the reaction vessel 5010 and the outer reaction vessel 5020 is held at 800° C. thereafter for several ten hours to several hundred hours.

With this, the metal Na and the metal Ga loaded into the reaction vessel 5010 undergoes melting with heating of the reaction vessel 5010 and the melt mixture 5290 is formed in the reaction vessel 5010. Further, the metal Na loaded between the reaction vessel 5010 and the outer reaction vessel 5020 undergoes melting and the metal melt 5190 is formed as a result. As a result, the nitrogen gas existing in the space 5020 of the outer reaction vessel 5023 cannot pass through the metal melt 5190, and thus, the nitrogen gas is confined in the spaces 5023.

Further, the up/down mechanism 5220 moves the support unit 5050 during the interval in which the reaction vessel 5010 and the outer reaction vessel 5020 are heated to the temperature of 800° C., and the seed crystal 5005 is contacted with the melt mixture 5290.

Then, the GaN grows preferentially from the seed crystal 5005 contacted with the melt mixture 5003. Thereafter, as explained with reference to Embodiment 18, the nitrogen gas is introduced into the space 5023 via the stopper/inlet plug 5060 and the metal melt 5190, and there proceeds the growth of the GaN crystal.

As a result, it becomes possible to achieve crystal growth of a large GaN crystal similarly to the case of the crystal growth apparatus 5100 shown in FIG. 117.

FIG. 133 is a flowchart explaining the manufacturing method of a GaN crystal according to Embodiment 20 of the present invention. It should be noted that the flowchart of FIG. 133 is identical to the flowchart shown in FIG. 127 except that the step S5008 of the flowchart shown in FIG. 127 is removed.

Thus, it becomes possible to achieve the growth of the GaN crystal preferentially from the seed crystal 5005 while suppressing nucleation in the part other than the seed crystal without setting the temperature of the seed crystal 5005 to be lower than the temperature of the melt mixture 5290, and it becomes possible to manufacture a large size GaN crystal.

Otherwise, the present embodiment is identical to Embodiment 18.

Embodiment 21

FIG. 134 is a schematic cross-sectional diagram showing a crystal growth apparatus according to Embodiment 21 of the present invention.

Referring to FIG. 134, the crystal growth apparatus 5100C of Embodiment 21 has a construction generally identical with the construction of the crystal growth apparatus 5100 shown in FIG. 117, except that the bellows temperature sensors 5071 and 5081, the conduit 5200, the thermocouple 5210, the up/down mechanism 5220, the vibration application unit 5230, the vibration detection unit 5240, the gas supply line 5250, the flow meter 5260, the gas cylinder 5270 and the temperature control unit 5280 are removed.

With the crystal growth apparatus 5100C, there is provided no function of moving the support unit 5050 up or down in the gravitational direction DR1, and the seed crystal 5005 is supported by the support unit 5050 so as to be dipped in the melt mixture 5290.

With the crystal growth apparatus 5100C, the function of controlling the temperature of the seed crystal 5005 to a temperature lower than the temperature of the metal mixture 5290 after the reaction vessel 5010 and the outer reaction vessel 5020 are heated to the crystal growth temperature (=800° C.) is omitted, and thus, the temperature of the seed crystal 5005 is held at 800° C. during the crystal growth of the GaN crystal.

In the case of growing the GaN crystal by using the crystal growth apparatus 5100C, the metal Na and the metal Ga are loaded into the reaction vessel 5010 in an Ar gas ambient while using the glove box, and the metal Na is loaded between the reaction vessel 5010 and the outer reaction nvessel 5020 in the Ar gas ambient. Further, the seed crystal 5005 is fixed upon the support unit 5050 in the Ar gas ambient.

In this case, the support unit 5050 is moved up or down in the glove box for determining the location of the seed crystal 5005 such that the seed crystal 5005 is dipped into the melt mixture when the metal Na and the metal Ga undergo melting in the reaction vessel 5010 and the melt mixture 5290 is formed in the reaction vessel 5010.

Thereafter, the reaction vessel 5010 and the outer reaction vessel 5020 are set to the crystal growth apparatus 5100C in the state the space 5023 in the outer reaction vessel 5020 is filled with the Ar gas.

Further, after opening the valve 5160 and evacuating the interiors of the reaction vessel 5010 and the outer reaction vessel 5020 to a predetermined pressure (0.133 Pa or lower) by the vacuum pump 5170 via the evacuation line 5150, the valve 5160 is closed and the valves 5129 and 5121 are opened. Thereby, the reaction vessel 5010 and the outer reaction vessel 5020 are filled with the nitrogen gas from the gas cylinder 5140 via the gas supply lines 5090. In this case, the nitrogen gas is supplied to the reaction vessel 5010 and the outer reaction vessel 5020 via the pressure regulator 5130 such that the pressure inside the reaction vessel 5010 and the outer reaction vessel 5020 becomes about 0.1 MPa.

Further, when the pressure inside the reaction vessel 5010 and the outer reaction vessel 5020 as detected by the pressure sensor 5180 has reached about 0.1 MPa, the valves 5129 and 5121 are closed and the valve 5160 is opened. With this the nitrogen gas filling the reaction vessel 5010 and the outer reaction vessel 5020 is evacuated by the vacuum pump 5170. In this case, too, the interior of the reaction vessel 5010 and the outer reaction vessel 5020 is evacuated to a predetermined pressure (0.133 Pa or less) by using the vacuum pump 5170.

Further, this vacuum evacuation of the reaction vessel 5010 and the outer reaction vessel 5020 and filling of the nitrogen to the reaction vessel 5010 and the outer reaction vessel 5020 are repeated several times.

Thereafter, the interior of the reaction vessel 5010 and the outer reaction vessel 5020 is evacuated to a predetermined pressure by the vacuum pump 5170, and the valve 5160 is closed. Further, the valves 5129 and 5121 are opened and the nitrogen gas is filled into the reaction vessel 5010 and the outer reaction vessel 5020 by the pressure regulator 5130 such that the pressure of the reaction vessel 5010 and the outer reaction vessel 5020 becomes the range of 1.01-5.05 MPa.

When the pressure as detected by the pressure sensor 5180 has become 1.01-5.05 Pa, the valve 5129 is closed.

When filling of the nitrogen gas into the reaction vessel 5010 and the outer reaction vessel 5020 is completed, the reaction vessel 5010 and the outer reaction vessel 5020 are heated by the heating units 5070 and 5080 to 800° C., and the temperature of the reaction vessel 5010 and the outer reaction vessel 5020 is held at 800° C. thereafter for several ten hours to several hundred hours.

With this, the metal Na and the metal Ga loaded into the reaction vessel 5010 undergoes melting with heating of the reaction vessel 5010 and the melt mixture 5290 is formed in the reaction vessel 5010. Further, the metal Na loaded between the reaction vessel 5010 and the outer reaction vessel 5020 undergoes melting and the metal melt 5190 is formed as a result. As a result, the nitrogen gas existing in the space 5020 of the outer reaction vessel 5023 cannot pass through the metal melt 5190, and thus, the nitrogen gas is confined in the spaces 5023.

Further, when the melt mixture 5290 is formed in the reaction vessel 5010, the seed crystal 5005 is dipped into the melt mixture 5290.

With this, there occurs preferential growth of the GaN crystal from the seed crystal 5005. Thereafter, as explained with reference to Embodiment 18, the nitrogen gas is introduced into the space 5023 via the stopper/inlet plug 5060 and the metal melt 5190, and there proceeds the growth of the GaN crystal.

As a result, it becomes possible to achieve crystal growth of a large GaN crystal similarly to the case of the crystal growth apparatus 5100 shown in FIG. 117.

FIG. 135 is a flowchart explaining the manufacturing method of a GaN crystal according to Embodiment 21 of the present invention. It should be noted that the flowchart of FIG. 135 is identical to the flowchart shown in FIG. 127 except that the steps S5006, S5008 and S5010 of the flowchart shown in FIG. 127 are removed.

Thus, it becomes possible to achieve the growth of the GaN crystal preferentially from the seed crystal 5005 while suppressing nucleation in the part other than the seed crystal 2005 without moving the seed crystal 5005 up or down in the gravitational direction and without setting the temperature of the seed crystal 5005 to be lower than the temperature of the melt mixture 5290, and it becomes possible to manufacture a large size GaN crystal.

Otherwise, the present embodiment is identical to Embodiment 18.

Embodiment 22

FIG. 136 is a schematic diagram showing the construction of a crystal growth apparatus according to Embodiment 22 of the present invention.

Referring to FIG. 136, the crystal growth apparatus 5100C of Embodiment 22 has a construction similar to that of the crystal growth apparatus 5100 shown in FIG. 117 except that the up/down mechanism 5220 is replaced by an up/down mechanism 5220A, the temperature control unit 5280 is replaced with a temperature control unit 5280A, and a cylindrical member 5300, a thermocouple 5310, a concentration detection unit 5320 and an integrating flow meter 5330 are added.

The cylindrical member 5300 is formed of SUS316L stainless steel and a part thereof is inserted into the space 5023 inside the outer reaction vessel 5020 via the bellows 5040. The thermocouple 5310 is inserted into the interior of the cylindrical member 5300. The up/down mechanism 5220A is mounted upon the support unit 5050 and the cylindrical member 5300 at the location above the bellows 5040. The integrating flow meter 5330 is mounted inside the gas supply line 5110.

FIG. 137 is an enlarged diagram showing a part of the cylindrical member 5300 and the thermocouple 5310 shown in FIG. 136.

Referring to FIG. 137, the thermocouple 5310 has an end 5311 inserted into the cylindrical member 5300 so as to make a contact with an inner surface of an end 5301 of the cylindrical member 5300.

Referring to FIG. 136 again, the up/down mechanism 5220 moves the support unit 5050 in the gravitational direction DR1 according to the process to be explained later based on a vibration detection signal BDS1 from the vibration detection unit 5240 and a moving signal MST from the concentration detection unit 5320. Further, the up/down mechanism 5220A moves the cylindrical member 5300 up or down in the gravitational direction based on a vibration detection signal BDS2 from the vibration detection unit 5240 such that the end 5301 of the cylindrical member 5300 makes a contact with the melt mixture 5290. Further, the up/down mechanism 5220A detects a location PLq of the interface 5300 of the melt mixture 5290 and outputs the detected location PLq to the temperature control unit 5280.

The temperature of the melt mixture 5290 is equal to the temperature of the reaction vessel 5010 and the outer reaction vessel 5020. On the other hand, the heater temperatures T1 and T2 of the heating units 5070 and 5080 have a predetermined temperature difference with regard to the temperature of the reaction vessel 5010 and the outer reaction vessel 5020, and thus, the heater temperatures T1 and T2 becomes 800+α° C. when the temperature of the reaction vessel 5010 and the outer reaction vessel 5020 is set to 800° C. Thus, the temperature control unit 5280A produces a stop signal STPH for stopping the eating when the temperatures T1 and T2 as detected by the temperature sensors 5071 and 5081 have reached 800+α° C. and the location PLq from the up/down mechanism 5220A has become almost constant and supplies the stop signal STPH to the heating units 5070 and 5080. Otherwise, the temperature control unit 5280A functions similarly to the temperature control unit 5280.

The thermocouple 5310 detects a temperature T4 of the melt mixture 5290 in the vicinity of the interface 5003 and outputs a temperature signal indicative of the detected temperature T4 to the concentration detection unit 5320. As shown in FIG. 137, an end 5311 of the thermocouple 5310 is contacted with the end 5301 of the cylindrical member 5300 and the other and 5301 of the cylindrical member is contacted to the melt mixture 5290. Thus, the thermocouple 5310 can detect the temperature T4 of the melt mixture 5290 in the vicinity of the interface 5003.

The concentration detection unit 5320 receives the temperature T4 from the thermocouple 5310 and receives an integral flow rte SFT from the integrating flow meter 5330. Further, the concentration detection unit 5320 judges whether or not the nitrogen concentration or the group III nitride concentration in the melt mixture 5290 has reached the supersaturation state, and when the supersaturation state is attained, the concentration detection unit 5320 produces the moving signal MST and supplies the same to the up/down mechanism 5220A. When the nitrogen concentration or the concentration of the group III nitride is not in supersaturation state in the melt mixture 5290, the concentration detection unit 5320 does not provide any output to the up/down mechanism 5220A.

The integrating flow meter 5330 detects the integrated flow rate SFR of the nitrogen gas supplied from the gas cylinder 5140 to the conduit 5030 and supplies the detected integrated flow rate SFR to the concentration detection unit 5320.

In the crystal growth apparatus 5100D, the vibration detection unit 5230 applies vibration to the support unit 5050 and the cylindrical member 5300 while the vibration detection unit 5240 detects the vibration detection signal BDS1 indicative of the vibration of the support unit 5050 and the vibration detection signal BDS2 indicative of the vibration of the cylindrical member 5300 and supplies the detected vibration detection signals BDS1 and BDS2 to the up/down mechanism 5220A. It should be noted that each of the vibration detection signals BDS1 and BDS1 has the components identical to those of the vibration detection signal BDS shown in FIG. 122.

FIG. 138 is a schematic diagram showing the construction of the up/down mechanism 5220A shown in FIG. 136.

Referring to FIG. 138, the up/down mechanism 5220A has a construction similar to that of the up/down mechanism 5220 except that the control unit 5225 of the up/down mechanism 5220 shown in FIG. 121 is replaced with the control unit 5235 and a toothed part 5231, a gear 5232, a motor 5234 and a rotation number detection unit 5236 are added.

The toothed member 5231 has a generally triangular cross-sectional shape and is fixed upon the outer peripheral surface 5300A of the cylindrical member 5300. The gear 5232 is fixed upon an end of the shaft member 5233 and meshes with the toothed member 5231. The shaft member 5233 has the foregoing end connected to the gear 5232 and the other end connected to a shaft (not shown) of the motor 5234.

The motor 5234 causes the gear 5235 to rotate in the direction of an arrow 5232 or an arrow 527 in response to control from the control unit 5237.

Until the moving signal MST is supplied from the concentration detection unit 5320, the control unit 5232 continues producing the control signal STL4 and supplies the same to the motor 5224 such that the seed crystal 5005 is moved to the space 5023 based on the vibration detection signal BDS1 from the vibration detection unit 5240 and such that the gear 5222 is rotated in the direction of the arrow 5226 or 5227 for dipping the seed crystal 5005 into the melt mixture 5290. Further, when the seed crystal 5005 has moved to the space 5023 or dipped into the melt mixture 5290, the control unit 5235 produces a stop signal STP1 for stopping the rotation of the gear 5222 and supplies the same to the motor 5224.

As noted above, when the gear 5222 is rotated in the direction of the arrow 5226, the support unit 5050 is moved in the upward direction, and thus, in the case of moving the seed crystal 5005 to the space 5023, the control unit 5235 produces the control signal STL 41 (a kind of control signal CTL4) for rotating the gear 5222 in the direction of the arrow 5226 and supplies the same to the motor 5224. Further, when the gear 5222 is rotated in the direction of the arrow 5227, the support unit 5050 is moved in the downward direction, and thus, in the case of dipping the seed crystal 5005 into the melt mixture 5290, the control unit 5235 produces the control signal CTL 42 (a kind of control signal CTL4) for rotating the gear 5222 in the direction of the arrow 5227 and supplies the same to the motor 5224.

More specifically, in the case the control unit 5235 moves the seed crystal 5005 to the space 5023, the signal component of the vibration detection signal BDS1 is detected and the control signal CTL41 is produced and supplied to the motor 5224 until the detected signal component changes to the signal component SS1 (see FIG. 122). Further, in the case the control unit 5235 dips the seed crystal 5005 to the melt mixture 5290, the signal component of the vibration detection signal BDS1 is detected and the control signal CTL42 is produced and supplied to the motor 5224 until the detected signal component changes to the signal component SS3 (see FIG. 122).

When the moving signal MST from the concentration detection unit 5320 is received, the control unit 5235 produces a control signal CTL 5 for causing the gear 5222 to rotate in the direction of the arrow 5226 or 5227 such that the seed crystal 5005 makes a contact with the melt mixture 5290 based on the vibration detection signal BDS1 and supplies the same to the motor 5224. Further, when the seed crystal 5005 has made contact with the melt mixture 5290, the control unit 5235 produces the stop signal STP1 and supplies the same to the motor 5224.

In the case of moving the seed crystal 5005 held in the space 5023 to cause a contact with the melt mixture 5290, the control unit 5235 produces a control signal CTL51 (a kind of control signal CTL5) for causing the gear 5222 to rotate in the direction of the arrows 5227 and supplies the same to the motor 5224. In the case of moving the seed crystal 5005 held in the melt mixture 5023 to cause a contact with the melt mixture 5290, the control unit 5235 produces a control signal CTL52 (a kind of control signal CTL5) for causing the gear 5222 to rotate in the direction of the arrows 5226 and supplies the same to the motor 5224.

More specifically, in the case the control unit 5235 moves the seed crystal 5005 held in the space 5023 to make a contact with the melt mixture 5290, the control unit 5235 detects the signal component of the vibration detection signal BDS1 and produces the control signal CTL51 and supplies the same to the motor 5224 until the detected signal component changes from the signal component SS1 to the signal component SS2 (see FIG. 122). Further, in the case the control unit 5235 moves the seed crystal 5005 held in the melt mixture 5290 to make a contact with the melt mixture 5290, the control unit 5235 detects the signal component of the vibration detection signal BDS1 and produces the control signal CTL51 and supplies the same to the motor 5224 until the detected signal component changes from the signal component SS3 to the signal component SS2 (see FIG. 122).

When the vibration detection signal BDS2 is received from the vibration detection unit 5240, the control unit 5235 produces, based on the vibration detection signal BDS2, the control signal CTL6 for causing the gear 5322 to rotate in the direction of the arrow 5237 or 5238 such that the end 5301 of the cylindrical member 5300 makes a contact with the melt mixture 5290 and supplies the same to the motor 5234. Further, when the end 5301 of the cylindrical member 5300 has made a contact with the melt mixture 5290, the control unit 5235 produces a stop signal STP2 for stopping the rotation of the gear 5232 and supplies the same to the motor 5234.

More specifically, the control unit 5235 detects the signal component of the vibration detection signal BDS2 and produces the control signal STL6 and supplied the same to the motor 5234 until the detected signal component changes to the signal component SS2 (see FIG. 122). When the signal component of the vibration detection signal BDS2 has changed to the signal component SS2, the stop signal STP2 is produced and supplied to the motor 5234.

In the case the end 5301 of the cylindrical member 5300 is located in the space 5023 at the moment when the melt mixture 5290 is formed in the reaction vessel 5010, the vibration detection signal BDS2 is formed of the signal component SS1, and thus, the control unit 5235 produces a control signal CTL61 (a kind of control signal CTL6) for lowering the cylindrical member 5300 in response to the signal component SS1 of the vibration detection signal BDS2 and supplies the same to the motor 5234.

In the case the end 5301 of the cylindrical member 5300 is located in the melt mixture 5290 at the moment when the melt mixture 5290 is formed in the reaction vessel 5010, the vibration detection signal BDS2 is formed of the signal component SS3, and thus, the control unit 5235 produces a control signal CTL62 (a kind of control signal CTL6) for lifting up the cylindrical member 5300 in response to the signal component SS3 of the vibration detection signal BDS2 and supplies the same to the motor 5234.

Further, the control unit 5235 detects the location PLq of the interface 5300 of the melt mixture 5290 based upon the rotation number Nr of the rotation number detection unit 5236 and outputs the detected location PLq to the temperature control unit 5280A.

More specifically, the control unit 5235 detects the location PLa based on the rotation number Nr according to the process below. Because the cylindrical member 5300 is lowered by the gear 5232, the shaft member 5233 and the motor 5234 such that the end 5301 is in contact with the melt mixture 5290, the distance that the end 5301 of the cylindrical member 5300 (=interface 5003) has lowered is proportional to the rotation number Nr representing the number of rotation of the gear 5232 in the direction of the arrow 5238.

Hereinafter, the location of the end 5301 of the cylindrical member 5300 at the moment the growth of the GaN crystal has been started (=interface 5003) is designated as a location PLq0 and the distance that the end 5301 of the cylindrical member 5300 has fallen is designated as a distance L. In this case, the locations PL1 and PLq0 are defined as the distance as measured from the bottom surface of the reaction vessel 5010.

Then, the location PLq of the end 5301 of the cylindrical member 5300 (=interface 5003) in the case the growth of the GaN crystal has proceeded is determined by the equation below.

$$PLq=PLq0-L \tag{12}$$

Further, because the distance L is proportional to the rotational number Nr of the gear 5232 in the direction of the arrow, the distance L is written as $L=\alpha\times Nr$, where $\alpha$ is a proportional constant.

As a result, the location PLq is determined by the equation below.

$$PLq=PLq0-\alpha\times Nr \tag{13}$$

The location PLq0 of the interface 5003 for the case the melt mixture 5290 is formed in the reaction vessel 5010 is determined by the amount of the metal Na and the amount of the metal Ga loaded into the reaction vessel 5010, and the location PLq0 of the interface is generally constant as long as the amount of the metal Na and the metal Ga loaded into the reaction vessel 5010 is constant.

Thus, the control unit holds the proportional constant $\alpha$ and the location PLq0 and calculates the location PLq according to Equation (13) when the rotation number Nr is provided from the rotation number detection unit 5236.

Further, in the case the amount of the metal Na and the amount of the metal Ga are changed, the control unit 5235 can also calculate the location PLq of the interface 5003 after the growth of the GaN crystal has been started, by being provided with the location PLq0 corresponding to the changed amount into the control unit 5235.

Further, it is also possible that the control unit determines the location PLq0 according to the process below.

When there occurs formation of the melt mixture 5290 in the reaction vessel 5010, the end 5301 of the cylindrical member 5300 is moved up or down so as to maintain the contact with the melt mixture 5290, and thus, the location P0 of the end 5301 of the cylindrical member 5300 for the case the metal Na and the metal Ga are loaded into the reaction vessel 5010 in the glove box is stored in the control unit 5235 in advance. This location P0 is always constant irrespective of the amount of the metal Na and the metal Ga and is defined as the distance as measured from the bottom surface of the reaction vessel 5010.

Thus, when the melt mixture 5290 is formed in the reaction vessel 5010 and the end 5301 of the cylindrical member 5300 is dipped into the melt mixture 5290, the cylindrical member 5300 is moved in the upward direction such that the end 5301 makes a contact with the melt mixture 5290. Thus, the gear 5232 is rotated for a predetermined number of times in the direction of the arrow 5237 such that the end 5301 of the cylindrical member 5300 makes a contact with the melt mixture 5290.

Further, in the case the end 5301 of the cylindrical member 5300 is held in the space 5023 when the melt mixture 5290 is formed in the reaction vessel 5010, the cylindrical member 5300 is moved in lo the downward direction such that the end 5301 thereof makes a contact with the melt mixture 5290. Thus, the gear 5232 is rotated for a predetermined number of times in the direction of the arrow 5238 such that the end 5301 of the cylindrical member 5300 makes a contact with the melt mixture 5290.

Thus, the rotation number detection unit 5236 detects the rotation number Nrr of the gear 5232 for moving the cylindrical member 5300 up or down for achieving the contact for the end 5301 of the cylindrical member 5300 with the melt mixture 5290 and provides the same to the control unit 5235, while the control unit 5235 detects the location PLq0 of the interface 5003 according to the equation below, wherein it should be noted that the control unit 5235 is constructed so as to hold the proportional constant β between the moving distance of the cylindrical member 5300 for moving the cylindrical member 5300 such that the end 5301 of the cylindrical member 5300 makes a contact with the melt mixture 5290 and the rotation number Nrr.

$$PLq0=P0+\beta\, Nrr \quad (3)$$

Here, it should be noted that the rotation number Nrr takes a positive value when the gear 5232 is rotated in the direction of the arrow 5237 and a negative value when the gear 5232 is rotated in the direction of the arrow 5238.

Thus, by adopting the construction for the control unit 5235 to determine the location PLq0 of the interface 5003 for the case the melt mixture 5290 is formed in the reaction vessel 5010 based on the rotation number Nrr of the gear 5232, it becomes possible for the control unit 5235 to detect the location PLq of the interface 5003 after the crystal growth process of the GaN crystal has been started, whatever the amount of the metal Na and the metal Ga loaded into the reaction vessel 5010 in the glove box has been changed.

The motor 5224 rotates the gear 5222 in the direction of the arrow 5226 in response to the control signal CTL41 from the control unit 5235 and causes the gear 5222 to rotate in the direction of the arrow 5227 in response to the control signal CTL42 from the control unit 5235. Further, the motor 5224 stops the rotation of the gear 5222 in response to the stop signal STP1 from the control unit 5235.

Further, the motor 5224 rotates the gear 5222 in the direction of the arrow 5227 in response to the control signal CTL51 from the control unit 5235 and causes the gear 5222 to rotate in the direction of the arrow 5226 in response to the control signal cTL 52 from the control unit 5235.

The motor 5234 rotates the gear 5232 in the direction of the arrow 5238 in response to the control signal CTL61 from the control unit 5235 and causes the gear 5232 to rotate in the direction of the arrow 5227 in response to the control signal CTL62 from the control unit 5235. Further, the motor 5234 stops the rotation of the gear 5232 in response to the stop signal STP2 from the control unit 5235.

The rotation number detection unit 5236 detects the rotation number Nr of the gear 5232 and provides the detected rotation number Nr to the control unit 5235. More specifically, the rotation number detection unit 236 comprises a laser beam source, a detection part detecting the intensity of the laser beam emitted from the laser beam source, and an operation part for calculating the rotation numbers Nr and Nrr based on the optical intensity detected by the detection part.

Thus, the laser beam source irradiates the laser beam to the toothed part of the gear 5232. The detection part is disposed at the location opposite to the laser beam source across the toothed part. Thus, the laser beam emitted from the laser beam source is interrupted or not interrupted by the toothed part of the gear 5232, and the detection part detects the optical intensity that changes the amplitude periodically. The operation part converts the optical intensity from the detection part to a digital signal and detects the rotation number Nr or Nrr by counting the number of the H (logic-high) level or L (logic-low) level of the digital signal thus converted.

Further, it is possible to discriminate in which direction of the arrow 5237 and the arrow 5238 the gear 5232 is rotating, by checking whether the polarity of the optical intensity digital sigal changes from the L level to the H level or from the H level to the L level.

FIGS. 139A and 139B are diagrams for explaining the method for detecting a nitrogen concentration or concentration of the group III nitride in the melt mixture 5290. FIG. 139A is a diagram showing the relationship between the temperature of the melt mixture 5290 and the solubility of nitrogen or the group III nitride in the melt mixture 5290 (saturated concentration), while FIG. 139B is a diagram showing the relationship between the integrated nitrogen flow rate and the concentration of nitrogen or the group III nitride in the melt mixture 5290.

In FIG. 139A, it should be noted that the horizontal axis represents the temperature of the melt mixture 5290 while the vertical axis represents the solubility of nitrogen or the group III nitride in the melt mixture 5290. In FIG. 139B, the horizontal axis represents the concentration of nitrogen or the group III nitride in the melt mixture 5290 while the vertical axis represents the integrated nitrogen flow rate.

Referring to FIG. 139A, the curve k5 represents the relationship between the solubility of nitrogen or the group III nitride and the temperature of the metal mixture 5290. in the low temperature region of the melt mixture 5290, it can be seen that the solubility of nitrogen or the group III nitride increases gradually with temperature rise of the melt mixture 5290, while in the high temperature region of the melt mixture 5290, the solubility increases sharply with increase of the temperature.

Referring to FIG. 139B, the line k6 represents the relationship between the integrated nitrogen flow rate and the concentration of nitrogen or the group III nitride. It can be seen that the integrated nitrogen flow rate increases with increase of concentration of nitrogen or the group III nitride. From FIG. 139A, it is possible to read the solubility of nitrogen or the group III nitride at a temperature, and from FIG. 139B, it is possible to read the integrated flow rate for setting the concentration of nitrogen or the group III nitride in the melt mixture 5290 to be equal to the solubility limit.

When the temperature of the melt mixture 5290 is elevated to 800° C., the solubility Nsol of nitrogen or the group III nitride for the case in which the temperature Tlq is 800βC is determined by the curve k5. Further, when the solubility Nsol is determined, the integrated nitrogen flow rate SFRst for the case the concentration of nitrogen or the group III nitride reaches the solubility in the melt mixture 5290 is determined from the line k6.

Thus, upon reception of the temperature T4 of the melt mixture 5290 from the thermocouple 5310, the temperature detection unit 5320 detects the solubility Nsol of nitrogen or the group III nitride corresponding to the received temperature T4 by referring to the curve k5, and the integrated nitrogen flow rate SFRst corresponding to the detected solubility Nsol of nitrogen or the group III nitride is detected by referring to the line k6. Further, when the integrated flow rate SFR of nitrogen is provided from the integrating flow meter 5330, the concentration detection unit judges whether or not the received integrated flow rate SFT exceeds the integrated nitrogen flow rate SFRst, and if the integrated flow rate SFT exceeds the integrated nitrogen flow rate SFRst, the concentration detection unit 5320 produces a moving signal MST and supplies the same to the up/down mechanism 5220A.

When the integrated flow rate SFR is larger than the integrated nitrogen flow rate SFRst, this means that nitrogen or the group III nitride is in a supersaturated state in the melt mixture 5290, while in the vase the integrated flow rate SFR is equal to or smaller than the integrated nitrogen flow rate SFRst, this means that nitrogen or the group III nitride in the melt mixture 5290 is contained in the melt mixture 5290 with a concentration lower than in the supersaturated state. Thus, the judgment as to whether or not the integrated flow rate SFR is equal to or larger than the integrated nitrogen flow rate SFRst corresponds to the detection of concentration of nitrogen or the group III nitride in the melt mixture 5290.

Thus, the nitrogen concentration unit 5320 detects, based on the temperature T4 of the melt mixture 5290, the integrated nitrogen flow rate SFRst for the case nitrogen or the group III nitride is contained in the melt mixture 5290 with the solubility limit Nsol at the temperature T4, and detects the nitrogen concentration or the concentration of the group III nitride in the melt mixture 5290 based on the detected integrated nitrogen flow rate SFRst and the integrated flow rate SFR of nitrogen. Further, the concentration detection unit 5320 produces the moving signal MST when the nitrogen concentration or the concentration of the group III nitride in the melt mixture 5290 has reached the supersaturated state and provides the moving signal MST to the up/down mechanism 5220A.

FIG. 140 is a timing chart showing the temperature of the reaction vessel 5010 and the outer reaction vessel 5020; the nitrogen concentration or the concentration of the group III nitride in the melt mixture 5290; and the location of the interface 5003 (=melt surface level) of the melt mixture 5290.

Referring to FIG. 140, the temperatures of the reaction vessel 5010 and the outer reaction vessel 5020 are elevated along the lines k7, k8 and k9. Thereby, it should be noted that the metal Na and the metal Ga in the reaction vessel 5010 forms the melt mixture 5290 after the timing t1 in which the temperature of the reaction vessel 5010 is elevated to 98° C. Further, after the timing t2, the temperature of the melt mixture 5290 is held at 800° C.

Further, the nitrogen concentration and the concentration of the group III nitride in the melt mixture 5290 is increased gradually after the timing t1, wherein the solubility limit Nsol is exceeded with the timing t8 after the timing t2 in which the reaction vessel 5010 and the outer reaction vessel 5020 are heated to 800° C. (see line k12). This means that nitrogen or the group III nitride in the melt mixture 5290 takes a supersaturated state.

Further, the melt surface level (=location PLq) of the melt mixture 5290 increases gradually after the timing t1 and reaches the melt surface level (=location PLq0) by the timing t2.

Thus, the seed crystal 5005 is made contact with the melt mixture 5290 with the timing t5, at which timing the nitrogen or the group III nitride in the melt mixture 5290 is in the supersaturated state. Thus, the growth of the GaN crystal is started from the seed crystal 5005 after the timing t5.

When the growth of the GaN crystal from the seed crystal 5005 is started, the temperature T3 of the seed crystal 5005 is controlled after the timing t5 along the curve k10 (the same curve k2 shown in FIG. 123) or the line k11 (the same line k3 shown in FIG. 123), such that the temperature T3 is lower than the temperature of the melt mixture 5290 (line k9). Thus, the temperature T3 of the seed crystal 5005 is set to a temperature lower than the temperature of the melt mixture 5290 with progress of the crystallization of the GaN crystal similarly to Embodiment 18.

Further, with decrease of the nitrogen concentration or concentration of the group III nitride in the melt mixture 5290 caused as a result of the nitrogen in the space 5023 being incorporated into the melt mixture 5290, the nitrogen gas in the conduit 5030 is introduced into the melt 5023 from the space 5031 via the stopper/inlet plug 5060 and the metal melt 5190, and thus, the concentration of nitrogen or the group III nitride in the melt mixture 5290 goes up or down in the vicinity of the solubility limit Nsol (see curve k13).

Further, because the melt surface level (=location PLq) of the melt mixture 5290 decreases gradually after the timing t5 where the crystal growth of the GaN crystal has been started as a result of decrease of Ga occurring gradually in the melt mixture 5290. When the Ga in the melt mixture 5290 is depleted, the saturation value PLqst is reached.

Further, when the melt level (=location PLq) of the melt mixture 5290 has reached the saturation value PLqst, heating of the reaction vessel 5010 and the outer reaction vessel 5020 is stopped and growth of the GaN crystal is stopped.

Thus, when the location PLq received from the control unit 5235 of the up/down mechanism 5220A has reached the saturation value PLqst (when the locatoi PLq becomes generally constant), the temperature control unit 5280A produces a stop signal STPH and supplies the same to the heating units 5070 and 5080.

FIGS. 141A and 141B are diagrams showing the state of the seed crystal in the interval from a timing t1 to a timing t5 shown in FIG. 14.

Referring to FIG. 141, the seed crystal 5005 is held in the space 5023 during the interval from the timing t1 to the timing t5 (see FIG. 141A), while when the timing t5 is reached, the seed crystal 5005 is contacted with the melt mixture 5290 (see FIG. 141B).

FIGS. 142A and 142B are further diagram showing the state of the seed crystal 5005 in the interval from the timing t1 to the timing t5 shown in FIG. 140.

Referring to FIGS. 142A and 142B, the seed crystal 5005 is held in the space 5023 during the interval from the timing t1 to the timing t5 (see FIG. 142A), while when the timing t5 is reached, the seed crystal 5005 is contacted with the melt mixture 5290 (see FIG. 142B).

During the interval until the crystal growth of the GaN crystal is started with the timing t5, and in the case the seed crystal 5005 is dipped into the melt mixture 5290, the seed crystal 5005 is dipped into the melt mixture 5290 at the timing t1 where the melt mixture 5290 is formed in the reaction vessel 5010, while when the timing t2 where the melt mixture 5290 is heated to 800° C. is passed, the seed crystal 5005 is contacted to the vapor-liquid interface 5003 of the melt mixture 5290 until the timing t5 is reached.

In this way, the seed crystal 5005 fits with the melt mixture 5290 (melt formed of metal Na and metal Ga) by dipping the seed crystal 5005 into the melt mixture 5290 until to the timing t5 where the nitrogen or the group III nitride in the melt mixture 5290 becomes a supersaturated state, and it becomes possible to start the growth of the GaN crystal from the seed crystal 5005 smoothly.

With Embodiment 22, it should be noted that the seed crystal 5005 is held by the support unit 5050 so as to make a contact with the melt mixture e5290 at the timing t5 by any of the method shown in FIGS. 141A and 141B or 142A and 142B.

FIG. 143 is a flowchart explaining the manufacturing method of a GaN crystal according to Embodiment 22 of the present invention. It should be noted that the flowchart shown in FIG. 143 is identical to the flowchart shown in FIG. 127 except that steps S5021 and 5022 are added between the steps S5005 and S5006 and steps S5023 and S5024 are added between the steps S5010 and S5011.

Referring to FIG. 143, the concentration detection unit 5320 detects the nitrogen concentration or the concentration of the group III nitride in the melt mixture 5290 after the step S5005 based on the temperature T4 from the thermocouple 5310 and the integrated flow rate SFR from the integrating flow meter 5330 according to the process explained before (step S5021), and it is judged whether or not the nitrogen concentration or the group III nitride concentration has reached the supersaturated state (step S5022).

Further, when the nitrogen concentration or the concentration of the group III nitride in the melt mixture 5290 has reached the supersaturation state, the seed crystal 5005 is made contact with the melt mixture 5290 of the metal Na and the metal Ga. In this case, the seed crystal is contacted with the melt mixture 5290 by the process explained in any of FIGS. 141A and 141B or FIGS. 142A and 142B.

Thereafter, the steps S5007-S5010 explained above are conducted, wherein the control unit 5235 of the up/down mechanism 5220A detects the surface level of the melt mixture 5290 (=location PLq of the interface 5003) based on the rotation number Nr from the rotation number detection unit 5236 (step S5023), and supplies the detected surface level (=location PLq of the interface 5003) to the temperature control unit 5280A.

Further, the temperature control unit 5280A judges whether or not the surface level of the melt mixture 5290 (=location PLq of the interface 5003) as received from the control unit 5235 of the up/down mechanism 5220 has saturated or not (step S5024), while when it is judged that the surface level of the melt mixture 4290 (=location PLq of the interface 5003) has saturated, the temperature control unit 5280A produces the stop signal STPH and supplies the same to the heating units 5070 and 5080.

In response to the stop signal STPH from the temperature control unit 5280A, the heating units 5070 and 5080 stop the heating of the reaction vessel 5010 and the outer reaction vessel 5020, and the temperatures of the reaction vessel 5010 and the outer reaction vessel 5020 are lowered (step S5011).

With this, manufacturing of the GaN crystal according to Embodiment 22 is over.

Thus, Embodiment 22 has the feature of causing the seed crystal 5005 to make a contact with the melt mixture 5290 for causing the crystal growth of the GaN crystal after the nitrogen concentration or the concentration of the group III nitride in the melt mixture 5290 has reached the supersaturation state.

As a result of this feature, it becomes possible to contact the seed crystal 5005 to the melt mixture 5290 in which the nitrogen or the group III nitride are in the supersaturated state, and it becomes possible to achieve smooth crystal growth of the GaN crystal from the seed crystal 5005.

In order to detect that the nitrogen or the group III nitride is in the supersaturated state in the melt mixture 5290, the present embodiment detects the temperature T4 of the melt mixture 5290 in the vicinity of the interface 5003 between the space 5023 and the melt mixture 5290.

Further, in order to detect the end point of crystal growth of the GaN crystal, the location PLq of the interface 5003 is detected. With this, it becomes possible to detect the timing in which the Ga in the melt mixture 5290 is depleted accurately, and it becomes possible to manufacture the GaN crystal efficiently.

In Embodiment 22, it should be noted that the up/down mechanism 5220A, the vibration application unit 5230 and the vibration detection unit 5240 constitute the "moving unit".

Further, the up/down mechanism 5220A constitutes the "moving unit".

In Embodiment, it is possible to add the cylindrical member 5300, the thermocouple 5310, the concentration detection unit 5320 and the integrating flow meter 5330 to the crystal growth apparatus 5100B shown in FIG. 132 in place of the up/down mechanism 5220 and the temperature control unit 5280. In this case, the steps S5021 and S5022 explained above are added between the step S5005 and S5006 and the steps S5023 and S5024 are added between the steps S5010 and steps S5011 of the flowchart shown in FIG. 133.

While it has been described in Embodiments 18 through 22 that the seed crystal 5005 is moved up or down depending on the relationship between the crystal growth rate of the GaN crystal and the lowering rate of the interface 5003 for maintaining contact of the seed crystal 5005 with the interface 5003, it is also possible to move the support unit 5210 up or down by the up/down mechanism 5220 so as to maintain the contact of the GaN crystal 5006 with the interface 5003, by taking into consideration the effect of rising of the interface 5003 caused by dipping of the GaN crystal 5006 grown from the seed crystal 5005 into the melt mixture 5290 and the effect of the lowering of the interface 5003 caused by the movement of the GaN crystal 5006 upward from the melt mixture 5290.

In the case the temperature of the metal melt 5190 is equal to the temperature of the melt mixture 5290, the vapor-pressure of the metal Na evaporated from the metal melt 5190 becomes higher than the vapor pressure of the metal Na evaporated from the melt mixture 5290. Thus, in such a case, the metal Na migrates from the metal melt 5190 to the melt mixture 5290 and there is caused rising of the interface 5003. Thus, in the event the temperature of the metal melt 5190 and the temperature of the melt mixture 5290 are set equal, it is possible to move the support unit 5210 up or down by the up/down mechanism 5220 such that the GaN crystal 5006 grown from the seed crystal 5005 makes contact with the interface 5003 while taking into consideration of the effect of rising of the interface 5003 caused by the migration of the metal Na from the metal melt 5190 to the melt mixture 5290.

Further, with growth of the GaN crystal 5006, the metal Ga in the melt mixture 5290 is consumed while this consumption of the metal Ga invites lowering of the interface 5003. Thus, it is also possible to move the support unit 5210 up or down by the up/down mechanism 5220 such that the GaN crystal 5006 makes contact with the interface 5003 while taking into consideration the amount of consumption of the metal Ga.

Otherwise, the present embodiment is identical to Embodiment 18.

FIG. 144 is another oblique view diagram of the stopper/inlet plug according to the present invention. Further, FIG. 145 is a cross-sectional diagram showing the method for mounting the stopper/inlet plug 5400 shown in FIG. 144.

Referring to FIG. 144, the stopper/inlet plug 5400 comprises a plug 5401 and a plurality of projections 5402. The plug 5401 is formed of a cylindrical body that changes the diameter in a length direction DR3. Each of the projections 5402 has a generally semispherical shape of the diameter of several ten microns. The projections 5402 are formed on an outer peripheral surface 5401A of the plug 5401 in a random pattern. Thereby, the separation between adjacent two projections 5402 is set to several ten microns.

Referring to FIG. 145, the stopper/inlet plug 5400 is fixed to a connection part of the outer reaction vessel 5020 and the conduit 5030 by support members 5403 and 5404. More specifically, the stopper/inlet plug 5400 is fixed by the support member 5403 having one end fixed upon the outer reaction vessel 5020 and by the support member 5404 having one end fixed upon an inner wall surface of the conduit 5030.

In the present case, the projections 5400 of the stopper/inlet plug 5402 may or may not contact with the outer reaction vessel 5020 or the conduit 5030. In the event the stopper/inlet plug 5402 is fixed in the state in which the projections 5400 do not contact with the outer reaction vessel 5020 and the conduit 5030, the separation between the projections 5402 and the reaction vessel 5020 or the separation between the projections 5400 and the conduit 5030 is set such that the metal melt 5190 can be held by the surface tension thereof, and the stopper/inlet plug 5403 is fixed in this state by the support members 5404 and 4404.

The metal Na held between the reaction vessel 5010 and the outer reaction vessel 5020 takes a solid form before heating of the reaction vessel 5010 and the outer reaction vessel 5020 is commenced, and thus, the nitrogen gas supplied from the gas cylinder 5140 can cause diffusion between the space 5020 inside the outer reaction vessel 5023 and the space 5030 inside the conduit 5031 through the stopper/inlet plug 5400.

When heating of the reaction vessel 5010 and the outer reaction vessel 5020 is started and the temperature of the reaction vessel 5010 and the outer reaction vessel 5020 has raised to 98° C. or higher, the metal Na held between the reaction vessel 5010 and the outer reaction vessel 5020 undergoes melting to form the metal melt 5190, while the metal melt 4190 functions to confined the nitrogen gas to the space 5023.

Further, the stopper/inlet plug 5400 holds the metal melt 5190 by the surface tension thereof such that the metal melt 5190 does not flow out from the interior of the outer reaction vessel 5020 to the space 5031 of the conduit 5030.

Further, with progress of the growth of the GaN crystal, the metal melt 5190 and the stopper/inlet plug 5400 confines the nitrogen gas and the metal Na vapor evaporated from the metal melt 5190 and the melt mixture 5290 into the space 5023. As a result, evaporation of the metal Na from the melt mixture 5290 is suppressed, and it becomes possible to stabilize the molar ratio of the metal Na and the metal Ga in the melt mixture 5290. Further, when there is caused a decrease of nitrogen gas in the space 5023 with progress of growth of the GaN crystal, the pressure P1 of the space 5023 becomes lower than the pressure P2 of the space 5030 inside the conduit 5031, and the stopper/inlet plug 5400 supplies the nitrogen gas in the space 5031 via the metal melt 5190 by causing to flow the nitrogen gas therethrough in the direction toward the outer reaction vessel 5020.

Thus, the stopper/inlet plug 5400 functions similarly to the stopper/inlet plug 5060 explained before. Thus, the stopper/inlet plug 5400 can be used in the crystal growth apparatuses 5060, 5100A, 5100B, 5100C and 5100D in place of the stopper/inlet plug 5100.

While it has been explained that the stopper/inlet plug 5400 has the projections 5402, it is also possible that the stopper/inlet plug 5400 does not have the projections 5402. In this case, the stopper/inlet plug 5401 is held by the support members such that the separation between the plug 5400 and the outer reaction vessel 5020 or the separation between the plug 4401 and the conduit 5030 becomes several ten microns.

Further, it is also possible to set the separation between the stopper/inlet plug 5400 (including both of the cases in which the stopper/inlet plug 5402 carries the projections 5402 and the case in which the stopper/inlet plug 5400 does not carry the projections 4402) and the outer reaction vessel 5020 and between the stopper/inlet plug 4400 and the conduit 5030 according to the temperature of the stopper/inlet plug 4400. In this case, the separation between the stopper/inlet plug 5400 and the reaction vessel 5020 or the separation between the stopper/inlet plug 5400 and the conduit 5030 is set relatively narrow when the temperature of the stopper/inlet plug 4400 is relatively high. When the temperature of the stopper/inlet plug 5400 is relatively low, on the other hand, the separation between the stopper/inlet plug 5400 and the reaction vessel 5020 or the separation between the stopper/inlet plug 4400 and the conduit 5030 is set relatively large.

It should be noted that the separation between the stopper/inlet plug 5400 and the reaction vessel 5020 or the separation between the stopper/inlet plug 5400 and the conduit 5030 that can hold the metal melt 5190 changes depending on the temperature of the stopper/inlet plug 4400. This, with this embodiment, the separation between the stopper/inlet plug 5400 and the reaction vessel 5020 or the separation between the stopper/inlet plug 5400 and the conduit 5030 is changed in response to the temperature of the stopper/inlet plug 4400 such that the metal melt 5190 is held securely by the surface tension.

The temperature control of the stopper/inlet valve 5400 is achieved by the heating unit 5080. Thus, when the stopper/inlet plug 5400 is to be heated to a temperature higher than 150° C., the stopper/inlet plug 5400 is heated by the heating unit 5080.

In the case of using the stopper/inlet plug 5400, the gas cylinder 5140, the pressure regulator 5130, the gas supply lines 5090 and 5110, the conduit 5030, the stopper/inlet plug 5400 and the metal melt 5190 form together the "gas supplying unit".

FIGS. 146A and 146B are further oblique view diagrams of the stopper/inlet plug according to the present embodiment.

Referring to FIG. 146A, the stopper/inlet plug 5410 comprises a plug 5412 formed with a plurality of penetrating holes 5411. The plurality of penetrating holes 5412 are formed in the length direction DR2 of the plug 5411. Further, each of the plural penetrating holes 5412 has a diameter of several ten microns (see FIG. 146A).

With the stopper/inlet plug 5410, it is sufficient that there is formed at least one penetrating hole 5412.

Further, the stopper/inlet plug 5420 comprises a plug 5422 formed with plural penetrating holes 5421. The plurality of penetrating holes 5422 are formed in the length direction DR2 of the plug 5421. Each of the penetrating holes 5422 have a diameter that changes stepwise from a diameter r1, r2 and r3 in the length direction DR2. Here, each of the diameters r1, r2 and r3 is determined in the range such as several microns to several ten microns in which the metal melt 5190 can be held by the surface tension Reference should be made to FIG. 146.

With the stopper/inlet plug 420, it is sufficient that there is formed at least one penetrating hole 422. Further, it is sufficient that the diameter of the penetrating hole 422 is changed at least in two steps. Alternatively, the diameter of the penetrating hole 422 may be changed continuously in the length direction DR2.

The stopper/inlet plug 5410 or 5420 can be used in any of the crystal growth apparatuses 5100, 5100A, 5100B, 5100C and 5100D in place of the stopper/inlet plug 5060.

In the case the stopper/inlet plug 5420 is used in any of the crystal growth apparatuses 5100, 5100A, 5100B, 5100C and 5100D in place of the stopper/inlet plug 5060, it becomes possible to hold the metal melt 5190 by the surface tension thereof by one of the plural diameters that are changed stepwise, and it becomes possible to manufacture a GaN crystal of large size without conducting precise temperature control of the stopper/inlet plug 5420.

In the case of using the stopper/inlet plug 5410 or 5420, the gas cylinder 5140, the pressure regulator 5130, the gas supply lines 5090 and 110, the conduit 5030, the stopper/inlet plug 5410 or 5420 and the metal melt 5190 form together the "gas supplying unit".

Further, with the present invention, it is possible to use a porous plug or check valve in place of the stopper/inlet plug 5060. The porous plug may be the one formed of a sintered body of stainless steel powders. Such a porous plug has a structure in which there are formed a large number of pores of several ten microns. Thus, the porous plug can hold the metal melt 5190 by the surface tension thereof similarly to the stopper/inlet plug 5060 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P2 of the space 5031 and the pressure P1 of the space 5023 for allowing the nitrogen gas in the space 5031 to the space 5023 through the metal melt 5190 in the event the pressure P2 is higher than the pressure P1 and blocks the connection between the outer reaction vessel 5020 and the conduit 5030 by the self gravity when P1≧P2. Thus, this check valve can be used also in the high-temperature region.

Further, while it has been explained with Embodiments 18-22 that the crystal growth temperature is 800° C., the present embodiment is not limited to this specific crystal growth temperature. It is sufficient when the crystal growth temperature is equal to or higher than 600° C. Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the reaction vessel 5010 in the ambient of Ar gas and the metal Na is loaded between the reaction vessel 5010 and the outer reaction vessel 5020 in the ambient of Ar gas, it is also possible to load the metal Na and the metal Ga into the reaction vessel 5010 and the metal Na between the reaction vessel 5010 and the outer reaction vessel 20 in the ambient of a gas other than the Ar gas, such as He, Ne, Kr, or the like, or in a nitrogen gas. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 5290 by mixing an alkali metal such as lithium (Li), potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing nitrogen as a constituent element such as sodium azide, ammonia, or the like. These compounds constitute the nitrogen source gas.

Further, place of Ga, it is also possible to use a group III metal such as boron (B), aluminum (Al), indium (In), or the like.

Thus, the crystal growth apparatus and method of the present invention is generally applicable to the manufacturing of a group III nitride crystal while using a melt mixture of an alkali metal or an alkali earth melt and a group III metal (including boron).

The group III nitride crystal manufactured with the crystal growth apparatus or method of the present invention may be used for fabrication of group III nitride semiconductor devices including light-emitting diodes, laser diodes, photodiodes, transistors, and the like.

Further, it should be noted that the embodiments explained above are provided merely for the purpose of showing examples and should not be interpreted that the present invention is limited to such specific embodiments.

The present invention is not limited to the embodiments described heretofore, but various variations and modifications may be made without departing from the scope of the invention as set forth in patent claims.

It should be noted that the present invention is applicable to the crystal growth apparatus for growing a group III nitride crystal of large crystal size. Further, the present invention is applicable to the crystal growth method for growing a group III nitride crystal of large crystal size.

The present invention is based on the Japanese priority applications 2005-300446, 2005-300550, 2005-335108, 2005-335170 2005-335430, and 2005-360174 filed respectively on Oct. 14, 2005, Oct. 14, 2006, Nov. 21, 2005, Nov. 21, 2005, Nov. 21, 2005, and Dec. 14, 2005, which are incorporated herein as reference.

What is claimed is:

1. A method for manufacturing a group III nitride crystal by using a crystal growth apparatus, said crystal growth apparatus comprising a crucible holding a melt mixture containing an alkali metal and a group III metal and a reaction vessel surrounding said crucible, said method comprising:

a first step of loading said alkali metal and said group III metal into said crucible in an inert gas ambient or a nitrogen gas ambient;

a second step of loading said alkali metal into a vessel space exposed to said melt mixture between said vessel space and an outside of said reaction vessel with an amount such that said alkali metal can exist between said vessel space and said outside in said inert gas ambient or nitrogen gas ambient at a temperature equal to or higher than a melting temperature of said alkali melt;

a third step of filling said vessel space with a nitrogen source gas;

a fourth step of heating said crucible and said reaction vessel to a crystal growth temperature;

a fifth step of holding said crucible and said reaction vessel at said crystal growth temperature for a predetermined duration; and a sixth step of supplying said nitrogen source gas to said vessel space such that a pressure inside said vessel space is maintained to a predetermined pressure;

wherein said second step is conducted so as to load said alkali metal between said crucible and said reaction vessel in said inert gas ambient or said nitrogen gas ambient with an amount such that said alkali metal can exist between said crucible and said reaction vessel at a temperature equal to or higher than said melting temperature of said alkali metal, wherein there is formed a first interface between said alkali metal melt, existing between said crucible and said reaction vessel, and the vessel space, and there is formed a second interface between said melt mixture and said vessel space, wherein said second step is conducted to load said alkali metal between said crucible and said reaction vessel with an amount such that said first interface generally coincides with said second interface at a temperature equal to or higher than said melting temperature of said alkali metal.

2. A method for manufacturing a group III nitride crystal by using a crystal growth apparatus, said crystal growth apparatus comprising:

a crucible holding a melt mixture containing an alkali metal and a group III metal;

a reaction vessel accommodating said crucible therein;

a first heater provided so as to face a sidewall of said reaction vessel;

a second heater disposed so as to face a bottom surface of said reaction vessel; and a shielding member disposed at least around said first heater for shielding a gas flow in a direction away from said reaction vessel, said method comprising:

a first step of loading said alkali metal and said group III metal into said crucible in an inert gas ambient or a nitrogen gas ambient;

a second step of filling a vessel space exposed to said melt mixture in said crucible with a nitrogen source gas; and a third step of growing a group III nitride crystal by thermally blanketing said crucible and said reaction vessel by said shielding member.

3. The method as claimed in claim 2, wherein said third step grows said group III nitride crystal while preventing escaping of heat from said crucible and said reaction vessel by convection.

4. The method as claimed in claim 3, wherein said third step comprises: a first sub-step of heating said crucible and said reaction vessel to a crystal growth temperature by said first and second heaters; a second sub-step of holding said crucible and said reaction vessel at said crystal growth temperature; and a third sub-step of supplying said nitrogen source gas into said reaction vessel such that a pressure inside said reaction vessel is maintained at a predetermined pressure.

5. The method as claimed in claim 4, wherein said shielding member comprises a first shielding member disposed so as to face said first heater, and a second shielding member covering a lid part of said reaction vessel disposed above said crucible and said first shielding member.

6. The crystal growth apparatus as claimed in claim 5, wherein said shielding member further includes a third shielding member surrounding said second shielding member.

7. The method as claimed in claim 4, wherein said crystal growth apparatus further comprises a bellows connected to a lid part disposed above said crucible and a support unit having an end inserted into said vessel space via said bellows, said support unit supporting a seed crystal on said end, said shielding member comprises a first shielding member disposed so as to face said first heater and a second shielding member covering said lid part of said reaction vessel except for a connection part of said lid part and said bellows and a second shielding member disposed around said first shielding member, wherein said method further comprises a fourth step of holding said seed crystal at an interface between said vessel space and said melt mixture or inside said melt mixture.

8. The crystal growth apparatus as claimed in claim 7, wherein said crystal growth apparatus further includes a third shielding member surrounding said bellows and said second shielding member.

9. The method as claimed in claim 5, wherein said crystal growth apparatus further comprising a filler provided at lease between said first heater and said first shielding member.

10. The crystal growth apparatus as claimed in claim 4, further comprising an outer reaction vessel accommodating said reaction vessel and said heat shielding member therein, said shielding member is disposed in a space between said reaction vessel and said outer reaction vessel.

11. A method for manufacturing a GaN crystal by using a crystal growth apparatus, said crystal growth apparatus comprising a crucible holding a melt mixture containing metal Na and metal Ga, an inner reaction vessel surrounding said crucible, and an outer reaction vessel surrounding said inner reaction vessel, said method comprising:

a first step of loading said metal Na and said metal Ga into said crucible in an inert gas ambient or a nitrogen gas ambient while preventing reaction between said metal Na and said metal Ga;

a second step of setting said inner reaction vessel accommodating therein said crucible in said crystal growth apparatus while disconnecting an inner space of said reaction vessel from an outside and connecting said inner reaction vessel to a gas supply source of a nitrogen source gas;

a third step of purging a part between said gas supply source and said inner reaction vessel while disconnecting said inner space of said reaction vessel from said outside;

a fourth step of filling said inner reaction vessel and said outer reaction vessel with said nitrogen source gas while maintaining a pressure difference between a first pressure inside said inner reaction vessel and a second pressure inside said outer reaction vessel within a first reference value; and a fifth step of growing said GaN crystal while maintaining a mixing ratio of said metal Na and said metal Ga in said melt mixture generally constant.

12. The crystal growth apparatus as claimed in claim 11, wherein said fourth step fills said nitrogen source gas to said inner reaction vessel and said outer reaction vessel while holding said first pressure and said second pressure generally constant.

13. The method as claimed in claim 11, wherein said crystal growth apparatus further comprises a conduit having an end connected to said inner reaction vessel and another end connected to said gas supply source, a metal Na melt held in said conduit, and a stopper/inlet member disposed in said conduit, said stopper/inlet member at least holding said metal Na melt in said conduit and supplies said nitrogen source gas supplied from said gas supply source to a vessel space exposed to said melt mixture via said metal Na melt, wherein said method further comprises a sixth step of loading said metal Na into said conduit in said inert gas ambient or said nitrogen gas ambient, and wherein said second through fifth steps are conducted after said first and sixth steps.

14. The method as claimed in claim 13, wherein said fifth step comprises a first sub-step of heating said crucible and said inner reaction vessel to said crystal growth temperature while maintaining a pressure difference between a third pressure applied to said stopper/inlet member from a side of said inner reaction vessel and a fourth pressure applied to said stopper/inlet member from a side of said gas supply source, to be equal to or lower than a second reference value, said first sub-step further setting a pressure of said vessel space to a crystal growth pressure; and a second sub-step of holding said crystal growth temperature and said crystal growth pressure.

15. The method as claimed in claim 14, wherein said fifth step further comprises a third sub-step of replenishing said nitrogen source gas to said vessel space via said stopper/inlet member and said metal Na melt such that a pressure inside said vessel space is maintained generally at said crystal growth temperature while maintaining a pressure difference between said third pressure and said fourth pressure to be equal to or lower than said second reference value.

16. The method as claimed in claim 14, wherein said second reference value is any of smaller of a withstand pressure of said inner reaction vessel and a withstand pressure of said stopper/inlet member.

17. The method as claimed in claim 11, wherein said crystal growth apparatus further comprises a conduit having an end connected to said inner reaction vessel and another end connected to said gas supply source, a metal Na melt held in said conduit, and a check valve disposed in said conduit, said check valve at least holding said metal Na melt in said conduit and supplies said nitrogen source gas supplied from said gas supply source to a vessel space exposed to said melt mixture via said metal Na melt, wherein said method further comprises a sixth step of loading said metal Na into said conduit in said inert gas ambient or said nitrogen gas ambient, and wherein said second through fifth steps are conducted after said first and sixth steps.

18. The method as claimed in claim 17, wherein said fifth step further comprises: a first sub-step of heating said crucible and said inner reaction vessel to a crystal growth temperature and setting a pressure of said vessel space to a crystal growth pressure; and a second sub-step of maintaining said crystal growth temperature and said crystal growth pressure.

19. The method as claimed in claim 18, wherein said third step further comprises a third sub-step of replenishing said nitrogen source gas to said vessel space via said check valve and said metal Na melt such that a pressure of said vessel space is maintained as said crystal growth pressure.

20. The method as claimed in claim 14, wherein said fifth step further comprises a fourth sub-step of setting a temperature of said stopper/inlet member or said check valve such that a first vapor pressure of metal Na evaporating from said metal Na melt coincides generally with a second vapor pressure of metal Na evaporating from said melt mixture.

21. The method as claimed in claim 14, wherein said fifth step further comprises a fifth sub-step of contacting a seed crystal of said GaN crystal with an interface between said melt mixture and said vessel space or dipping into said melt mixture after said first and second sub-steps.

22. The method as claimed in claim 21, wherein said fifth step further comprises a sixth sub-step of setting a temperature of said seed crystal to a temperature lower than a temperature of said melt mixture.

23. The method as claimed in claim 22, wherein said sixth sub-step is conducted so as to increase a temperature difference between a temperature of said melt mixture and a temperature of said seed crystal with progress of crystal growth of said GaN crystal from said seed crystal.

24. The method as claimed in claim 14, wherein there is further provided a seventh step after said fifth step of lowering a temperature of said crucible and said inner reaction vessel to a predetermined temperature while maintaining a pressure difference between said third pressure and said fourth pressure to be equal to or lower than said second reference value.

25. The method as claimed in claim 24, wherein there is further provided an eighth step of holding a temperature of said stopper/inlet member or said check valve to said predetermined temperature during an interval in which said temperature of said crucible and said inner reaction vessel are lowered from said crystal growth temperature to said predetermined temperature.

26. The method as claimed in claim 24, wherein said crystal growth apparatus further comprises a communication valve communicating said vessel space with a space inside said outer reaction vessel, said method further comprises a ninth step of opening said communication valve when lowering said temperature of said crucible and said inner reaction vessel and when said temperature of said crucible and said inner reaction vessel has reached said predetermined temperature.

27. The method as claimed in claim 26, further comprising a tenth step, after said ninth step, of cooling said crucible and said inner reaction vessel naturally.

28. The method as claimed in claim 27, wherein said tenth step further cools said stopper/inlet member or said check valve naturally.

29. A method for manufacturing a group III nitride crystal by using a crystal growth apparatus, said crystal growth apparatus comprising an inner reaction vessel holding a melt mixture containing an alkali metal and a group III metal and an outer reaction vessel surrounding said inner reaction vessel, said method comprising:

a first step of loading said alkali metal and said group III metal into said inner reaction vessel in an inert gas ambient or a nitrogen gas ambient;

a second step of filling a first vessel space exposed to said melt mixture in said inner reaction vessel with a nitrogen source gas;

a third step of heating said inner reaction vessel to a crystal growth temperature;

a fourth step of holding said inner reaction vessel at said crystal growth temperature for a predetermined duration; and a fifth step of holding a pressure difference between a first pressure inside said inner reaction vessel and a second pressure inside said outer reaction vessel to a suitable pressure difference at a time when said inner reaction vessel has been heated to said crystal growth temperature, wherein said suitable pressure difference is a pressure difference that causes substantial disconnection of said first vessel space from a second vessel space formed between said inner reaction vessel and said outer reaction vessel when said inner reaction vessel has been heated to said crystal growth temperature, said fifth step holding said pressure difference to be equal to or smaller than a predetermined value above which it is judged that said crystal growth apparatus is in an anomalous state, said fifth step comprising a first sub-step of detecting said first and second pressures and a second sub-step of adjusting said second pressure based on said detected first and second pressures such that said pressure difference takes a value smaller than the predetermined value.

30. The method as claimed in claim 29, wherein said second sub-step comprises: a step of calculating said pressure difference from said detected first and second pressures; a step of increasing said second pressure when said calculated pressure difference is larger than said predetermined value and when said first pressure is higher than said second pressure, such that said pressure difference becomes smaller than said predetermined value; and a step of decreasing said second pressure when said calculated pressure difference is larger than said predetermined value and when said first pressure is lower than said second pressure, such that said pressure difference becomes smaller than said predetermined value.

31. The method as claimed in claim 29, wherein said fifth step further comprises a third sub-step for maintaining said detected first pressure.

32. The method as claimed in claim 29, wherein said crystal growth apparatus further comprises crucible disposed inside said inner reaction vessel for holding a metal melt and a melt holding member for holding a metal melt between said first vessel space and an outer space, said first sub-step detects a hydrostatic pressure of said metal melt and detects said first pressure as a pressure of said first vessel space based on said detected hydrostatic pressure.

33. The method as claimed in claim 32, further comprising a conduit connected to said inner reaction vessel, said melt holding member being disposed in a temperature region where there occurs no substantial evaporation of said metal melt in said conduit, said melt holding member holding said metal melt between said crucible and said inner reaction vessel and in said conduit by a surface tension of said metal melt, wherein said first sub-step detects said hydrostatic pressure of said metal melt held in the vicinity of said melt holding member.

34. The method as claimed in claim 33, wherein said melt holding member comprises a porous member.

35. The method as claimed in claim 32, wherein said metal melt is difference from said melt mixture.

36. The method as claimed in claim 35, wherein said metal melt comprises an alkali metal melt dissolving therein an alkali metal.

37. A method for manufacturing a group III nitride crystal by using a crystal growth apparatus, said crystal growth apparatus comprising a reaction vessel holding a melt mixture containing an alkali metal and a group III metal, said method comprising:

a first step of loading said alkali metal and said group III metal into said reaction vessel in an inert gas ambient or a nitrogen gas ambient;

a second step of setting a seed crystal of a group III nitride crystal above said alkali metal and said group III metal in said reaction vessel;

a third step of filling said vessel space of said reaction vessel with a nitrogen source gas;

a fourth step of heating said reaction vessel to a crystal growth temperature;

a fifth step of etching said seed crystal;

a sixth step of supporting said etched seed crystal at an interface between said vessel space and said melt mixture or in said melt mixture;

a seventh step of holding said reaction vessel at said crystal growth temperature for a predetermined duration; and an eighth step of supplying said nitrogen source gas to said vessel space such that a pressure inside said vessel space is maintained to a predetermined pressure.

38. The method as claimed in claim 37, wherein said fifth step etches said seed crystal by dipping said seed crystal into said melt mixture.

39. The method as claimed in claim 38, wherein said fifth step carries out etching of said seed crystal by setting a gas pressure of said nitrogen source gas in said vessel space and a temperature of said melt mixture to a value where dissolving of said seed crystal takes place.

40. The method as claimed in claim 37, wherein said fifth step etches said seed crystal by a metal melt different from said melt mixture.

41. The method as claimed in claim 40, wherein said fifth step etches said seed crystal by an alkali metal melt.

42. The method as claimed in claim 40, wherein said crystal growth apparatus further comprises an outer vessel connected to said vessel space and holding said metal melt, said method further comprising a first sub-step of holding said seed crystal in said vessel space and a second sub-step of heating said outer vessel such that a vapor pressure of said metal melt becomes higher than a vapor pressure of said alkali melt in said vessel space.

43. The method as claimed in claim 42, wherein said second sub-step heats said outer vessel to a temperature higher than said crystal growth temperature.

44. A method for manufacturing a group III nitride crystal by using a crystal growth apparatus, said crystal growth apparatus comprising a reaction vessel holding a melt mixture containing an alkali metal and a group III metal, said method comprising:

a first step of loading said alkali metal and said group III metal into said reaction vessel in an inert gas ambient or a nitrogen gas ambient;

a second step of setting a seed crystal of a group III nitride crystal above said alkali metal and said group III metal in said reaction vessel;

a third step of filling said vessel space of said reaction vessel with a nitrogen source gas;

a fourth step of heating said reaction vessel to a crystal growth temperature;

a fifth step of holding said reaction vessel at said crystal growth temperature for a predetermined duration; and a sixth step of holding said seed crystal in said melt mixture;

a seventh step of supplying said nitrogen source gas to said reaction vessel such that a pressure inside said vessel space is maintained to a predetermined pressure; and an eighth step of setting a temperature of said seed crystal to a temperature lower than a temperature of said melt mixture.

45. A method for manufacturing a group III nitride crystal by using a crystal growth apparatus, said crystal growth apparatus comprising a reaction vessel holding a melt mixture containing an alkali metal and a group III metal, said method comprising:

a first step of loading said alkali metal and said group III metal into said reaction vessel in an inert gas ambient or a nitrogen gas ambient;

a second step of setting a seed crystal of a group III nitride crystal above said alkali metal and said group III metal in said reaction vessel;

a third step of filling said vessel space of said reaction vessel with a nitrogen source gas;

a fourth step of heating said reaction vessel to a crystal growth temperature;

a fifth step of holding said reaction vessel at said crystal growth temperature for a predetermined duration; and a sixth step of holding said seed crystal at an interface between said vessel space and said melt mixture;

a seventh step of supplying said nitrogen source gas to said reaction vessel such that a pressure inside said vessel space is maintained to a predetermined pressure; and an eighth step of setting a temperature of said seed crystal to a temperature lower than a temperature of said melt mixture.

46. The method as claimed in claim 44, wherein said eighth step sets said temperature of said seed crystal to be lower than said temperature of said melt mixture by cooling said seed crystal.

47. The method as claimed in claim 46, wherein said support unit comprises a cylindrical member having a closed end, on which said seed crystal is fixed, and wherein said eight step sets said temperature of said seed crystal to a temperature lower than said temperature of said melt mixture by causing to flow a cooling gas into said cylindrical member.

48. The method as claimed in claim 47, wherein said eight step sets the temperature of said seed crystal to a temperature lower than said temperature of said melt mixture by increasing a flow rate of said cooling gas caused to flow in said cylindrical member with growth of said group III nitride crystal.

* * * * *